US012790355B2

(12) United States Patent
Jradi et al.

(10) Patent No.: US 12,790,355 B2
(45) Date of Patent: Nov. 10, 2026

(54) ORGANIC ELECTROLUMINESCENT MATERIALS AND DEVICES

(71) Applicant: UNIVERSAL DISPLAY CORPORATION, Ewing, NJ (US)

(72) Inventors: Fadi M. Jradi, Abington, PA (US); Peter Wolohan, Princeton Junction, NJ (US); Elena Sheina, Langhorne, PA (US); Nicholas J. Thompson, New Hope, PA (US)

(73) Assignee: Universal Display Corporation, Ewing, NJ (US)

(*) Notice: Subject to any disclaimer, the term of this patent is extended or adjusted under 35 U.S.C. 154(b) by 315 days.

(21) Appl. No.: 18/533,194

(22) Filed: Dec. 8, 2023

(65) Prior Publication Data

US 2024/0254147 A1 Aug. 1, 2024

Related U.S. Application Data

(60) Provisional application No. 63/476,404, filed on Dec. 21, 2022.

(51) Int. Cl.
*C07F 5/02* (2006.01)
*C07B 59/00* (2006.01)
(Continued)

(52) U.S. Cl.
CPC ............ *C07F 5/027* (2013.01); *C07B 59/004* (2013.01); *C09K 11/02* (2013.01); *H10K 50/12* (2023.02);
(Continued)

(58) Field of Classification Search
CPC .... C07F 5/027; C07F 15/0086; C07F 7/0812; C07F 7/0814; C07B 59/004;
(Continued)

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | | |
|---|---|---|---|
| CN | 1696137 | A | 11/2005 |
| CN | 102702075 | A | 10/2012 |

(Continued)

OTHER PUBLICATIONS

Ming Yan, et al., Tetrahedron 2015, 71, 1425-30 and Atzrodt et al., Angew. Chem. Int. Ed. (Reviews) 2007, 46, 7744-65.

(Continued)

*Primary Examiner* — Douglas W Owens
(74) *Attorney, Agent, or Firm* — LNK Law, PLLC

(57) ABSTRACT

Provided are compounds which comprise at least a first structure comprising five rings which are fused together and contain one of the group consisting of B, Al, Ga, PO, and N as the central atom/group, and a second structure comprising a 5-membered nitrogen-containing ring to which two 6-membered rings are fused. Also provided are formulations comprising these compounds. Further provided are organic light emitting devices (OLEDs) and related consumer products that utilize these compounds.

20 Claims, 2 Drawing Sheets

(51) Int. Cl.

| | |
|---|---|
| ***C09K 11/02*** | (2006.01) |
| ***H10K 50/12*** | (2023.01) |
| ***H10K 85/40*** | (2023.01) |
| ***H10K 85/60*** | (2023.01) |
| ***H10K 101/20*** | (2023.01) |

(52) U.S. Cl.
CPC ........... *H10K 85/40* (2023.02); *H10K 85/622* (2023.02); *H10K 85/654* (2023.02); *H10K 85/6572* (2023.02); *H10K 85/6574* (2023.02); *H10K 85/6576* (2023.02); *H10K 85/658* (2023.02); *C07B 2200/05* (2013.01); *H10K 2101/20* (2023.02)

(58) Field of Classification Search
CPC ..... C07B 2200/05; C09K 11/02; C09K 11/06; H10K 50/12; H10K 85/40; H10K 85/622; H10K 85/654; H10K 85/6572; H10K 85/6574; H10K 85/6576; H10K 2101/20; H10K 2101/10; H10K 50/11; H10K 85/346; H10K 85/657; H10K 50/165; H10K 85/615
See application file for complete search history.

(56) References Cited

U.S. PATENT DOCUMENTS

| | | | |
|---|---|---|---|
| 5,247,190 | A | 9/1993 | Friend et al. |
| 5,639,914 | A | 6/1997 | Tomiyama et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,413,656 | B1 | 7/2002 | Thompson |
| 6,468,819 | B1 | 10/2002 | Kim et al. |
| 6,517,957 | B1 | 2/2003 | Senoo et al. |
| 6,653,654 | B1 | 11/2003 | Che |
| 6,656,612 | B2 | 12/2003 | Okada et al. |
| 6,670,645 | B2 | 12/2003 | Grushin et al. |
| 6,687,266 | B1 | 2/2004 | Ma et al. |
| 6,699,599 | B2 | 3/2004 | Li et al. |
| 6,835,469 | B2 | 12/2004 | Kwong et al. |
| 6,916,554 | B2 | 7/2005 | Ma et al. |
| 6,921,915 | B2 | 7/2005 | Takiguchi et al. |
| 7,154,114 | B2 | 12/2006 | Brooks et al. |
| 7,279,704 | B2 | 10/2007 | Walters et al. |
| 7,332,232 | B2 | 2/2008 | Ma et al. |
| 7,345,301 | B2 | 3/2008 | Gerhard et al. |
| 7,378,162 | B2 | 5/2008 | Jeong et al. |
| 7,431,968 | B1 | 10/2008 | Shtein et al. |
| 7,534,505 | B2 | 5/2009 | Lin et al. |
| 7,605,277 | B2 | 10/2009 | Kai et al. |
| 7,675,228 | B2 | 3/2010 | Ionkin et al. |
| 7,728,137 | B2 | 6/2010 | Stössel et al. |
| 7,740,957 | B2 | 6/2010 | Kim et al. |
| 7,749,615 | B2 | 7/2010 | Fukumatsu et al. |
| 7,759,489 | B2 | 7/2010 | Watanabe et al. |
| 7,846,763 | B2 | 12/2010 | Bold et al. |
| 7,951,947 | B2 | 5/2011 | Igarashi et al. |
| 7,968,146 | B2 | 6/2011 | Wagner et al. |
| 7,993,760 | B2 | 8/2011 | Komori et al. |
| 8,044,222 | B2 | 10/2011 | Yabunouchi et al. |
| 8,062,769 | B2 | 11/2011 | Kai et al. |
| 8,067,099 | B2 | 11/2011 | Watanabe et al. |
| 8,129,083 | B2 | 3/2012 | Yabunouchi et al. |
| 8,222,637 | B2 | 7/2012 | Kawamura et al. |
| 8,231,983 | B2 | 7/2012 | Sugita et al. |
| 8,258,297 | B2 | 9/2012 | Molt et al. |
| 8,263,770 | B2 | 9/2012 | Mat-Suo et al. |
| 8,288,013 | B2 | 10/2012 | Morishita |
| 8,372,527 | B2 | 2/2013 | Morishita et al. |
| 8,373,159 | B2 | 2/2013 | Langer et al. |
| 8,383,828 | B2 | 2/2013 | Molt et al. |
| 8,415,031 | B2 | 4/2013 | Xia et al. |
| 8,557,400 | B2 | 10/2013 | Xia et al. |
| 8,574,725 | B2 | 11/2013 | Nishimura et al. |
| 8,592,586 | B2 | 11/2013 | Molt et al. |
| 8,597,798 | B2 | 12/2013 | Parham et al. |
| 8,608,986 | B2 | 12/2013 | Akino et al. |
| 8,614,010 | B2 | 12/2013 | Yabunouchi |
| 8,703,304 | B2 | 4/2014 | Yabunouchi et al. |
| 8,759,819 | B2 | 6/2014 | Nishimura et al. |
| 8,871,361 | B2 | 10/2014 | Xia et al. |
| 9,093,652 | B2 | 7/2015 | Jung et al. |
| 9,169,282 | B2 | 10/2015 | Stoessel et al. |
| 9,181,289 | B2 | 11/2015 | Stoessel et al. |
| 9,196,842 | B2 | 11/2015 | Kato et al. |
| 9,296,944 | B2 | 3/2016 | Toshihiro et al. |
| 9,466,803 | B1 | 10/2016 | Park et al. |
| 9,472,762 | B2 | 10/2016 | Murer et al. |
| 9,490,432 | B2 | 11/2016 | Zeika et al. |
| 9,564,595 | B2 | 2/2017 | Kato et al. |
| 9,595,681 | B2 | 3/2017 | Mujica-Fernaud et al. |
| 9,604,972 | B2 | 3/2017 | Yoshida et al. |
| 9,634,255 | B2 | 4/2017 | Kato et al. |
| 9,799,835 | B2 | 10/2017 | Kim et al. |
| 9,837,622 | B2 | 12/2017 | Stoessel et al. |
| 9,882,142 | B2 | 1/2018 | Mujica-Fernaud et al. |
| 9,882,149 | B2 | 1/2018 | Kim et al. |
| 9,978,975 | B2 | 5/2018 | Kambe et al. |
| 10,008,672 | B2 | 6/2018 | Stoessel et al. |
| 10,103,340 | B2 | 10/2018 | Stoessel et al. |
| 10,347,850 | B2 | 7/2019 | Ono et al. |
| 10,385,263 | B2 | 8/2019 | Fuchs et al. |
| 10,522,768 | B2 | 12/2019 | Egen et al. |
| 2001/0019782 | A1 | 9/2001 | Igarashi et al. |
| 2002/0034656 | A1 | 3/2002 | Thompson et al. |
| 2002/0158242 | A1 | 10/2002 | Son et al. |
| 2003/0068526 | A1 | 4/2003 | Kamatani et al. |
| 2003/0072964 | A1 | 4/2003 | Kwong et al. |
| 2003/0138657 | A1 | 7/2003 | Li et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0174116 | A1 | 9/2004 | Lu et al. |
| 2005/0123751 | A1 | 6/2005 | Tsutsui et al. |
| 2005/0123788 | A1 | 6/2005 | Huo et al. |
| 2005/0123791 | A1 | 6/2005 | Deaton et al. |
| 2005/0139810 | A1 | 6/2005 | Kuehl et al. |
| 2005/0238919 | A1 | 10/2005 | Ogasawara |
| 2005/0244673 | A1 | 11/2005 | Satoh et al. |
| 2005/0260449 | A1 | 11/2005 | Walters et al. |
| 2006/0008670 | A1 | 1/2006 | Lin et al. |
| 2006/0065890 | A1 | 3/2006 | Stossel et al. |
| 2006/0127696 | A1 | 6/2006 | Stossel et al. |
| 2006/0134459 | A1 | 6/2006 | Huo et al. |
| 2006/0134462 | A1 | 6/2006 | Yeh et al. |
| 2006/0182993 | A1 | 8/2006 | Ogata et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0280965 | A1 | 12/2006 | Kwong et al. |
| 2007/0018155 | A1 | 1/2007 | Bae et al. |
| 2007/0034863 | A1 | 2/2007 | Fortte et al. |
| 2007/0087321 | A1 | 4/2007 | Pribenszky et al. |
| 2007/0103060 | A1 | 5/2007 | Itoh et al. |
| 2007/0104977 | A1 | 5/2007 | Arakane et al. |
| 2007/0104979 | A1 | 5/2007 | Kim et al. |
| 2007/0104980 | A1 | 5/2007 | Kim et al. |
| 2007/0111026 | A1 | 5/2007 | Deaton et al. |
| 2007/0138437 | A1 | 6/2007 | Haga et al. |
| 2007/0145888 | A1 | 6/2007 | Yabonouchi et al. |
| 2007/0160905 | A1 | 7/2007 | Morishita et al. |
| 2007/0181874 | A1 | 8/2007 | Prakash et al. |
| 2007/0190359 | A1 | 8/2007 | Knowles et al. |

(56) References Cited

U.S. PATENT DOCUMENTS

2007/0224450 A1 9/2007 Kim et al.
2007/0231600 A1 10/2007 Kamatani et al.
2007/0252140 A1 11/2007 Limmert et al.
2007/0278936 A1 12/2007 Herron et al.
2007/0278938 A1 12/2007 Yabunouchi et al.
2008/0005851 A1 1/2008 Perez-Prat Vinuesa et al.
2008/0014464 A1 1/2008 Kawamura et al.
2008/0018237 A1 1/2008 Yamamoto et al.
2008/0020237 A1 1/2008 Ren et al.
2008/0091025 A1 4/2008 Morishita et al.
2008/0106190 A1 5/2008 Yabunouchi et al.
2008/0107919 A1 5/2008 Hwang et al.
2008/0124572 A1 5/2008 Mizuki et al.
2008/0145707 A1 6/2008 Yabunouchi et al.
2008/0161567 A1 7/2008 Stoessel et al.
2008/0210930 A1 9/2008 Kamatani et al.
2008/0220265 A1 9/2008 Xia et al.
2008/0233410 A1 9/2008 Mashima et al.
2008/0233434 A1 9/2008 Kawamura et al.
2008/0261076 A1 10/2008 Kwong et al.
2008/0297033 A1 12/2008 Knowles et al.
2008/0303417 A1 12/2008 Yabunouchi et al.
2009/0017330 A1 1/2009 Toshihiro et al.
2009/0030202 A1 1/2009 Toshihiro et al.
2009/0039776 A1 2/2009 Yamada et al.
2009/0066235 A1 3/2009 Yabunouchi et al.
2009/0085476 A1 4/2009 Park et al.
2009/0091253 A1 4/2009 Yasukawa et al.
2009/0101870 A1 4/2009 Prakash et al.
2009/0104472 A1 4/2009 Je et al.
2009/0108737 A1 4/2009 Kwong et al.
2009/0115316 A1 5/2009 Zheng et al.
2009/0115320 A1 5/2009 Kawamura et al.
2009/0115322 A1 5/2009 Walters et al.
2009/0140637 A1 6/2009 Hosokawa et al.
2009/0167161 A1 7/2009 Yabunouchi et al.
2009/0167162 A1 7/2009 Chun et al.
2009/0167167 A1 7/2009 Aoyama et al.
2009/0179554 A1 7/2009 Kuma et al.
2009/0179555 A1 7/2009 Kim et al.
2009/0218940 A1 9/2009 Okajima et al.
2009/0302743 A1 12/2009 Kato et al.
2009/0309488 A1 12/2009 Kato et al.
2010/0012931 A1 1/2010 Kato et al.
2010/0084966 A1 4/2010 Shinya et al.
2010/0090591 A1 4/2010 Alleyne et al.
2010/0102716 A1 4/2010 Kim et al.
2010/0105902 A1 4/2010 Inoue et al.
2010/0108990 A1 5/2010 Hosokawa et al.
2010/0148663 A1 6/2010 Tsai et al.
2010/0187984 A1 7/2010 Chun et al.
2010/0219397 A1 9/2010 Watanabe et al.
2010/0244004 A1 9/2010 Xia et al.
2010/0270916 A1 10/2010 Xia et al.
2010/0288362 A1 11/2010 Hatwar et al.
2010/0295032 A1 11/2010 Kwong et al.
2011/0007385 A1 1/2011 Yamanashi et al.
2011/0037057 A1 2/2011 LeCloux et al.
2011/0057559 A1 3/2011 Xia et al.
2011/0108822 A1 5/2011 Parham et al.
2011/0156017 A1 6/2011 Lee et al.
2011/0163302 A1 7/2011 Lin et al.
2011/0204333 A1 8/2011 Xia et al.
2011/0210320 A1 9/2011 Shin et al.
2011/0215710 A1 9/2011 Xia et al.
2011/0227049 A1 9/2011 Xia et al.
2011/0240968 A1 10/2011 Kim et al.
2011/0278551 A1 11/2011 Yabunouchi et al.
2011/0285275 A1 11/2011 Huang et al.
2012/0075273 A1 3/2012 Shigemoto et al.
2012/0126221 A1 5/2012 Tetsu et al.
2012/0146012 A1 6/2012 Limmert et al.
2012/0193612 A1 8/2012 Chun et al.
2012/0205642 A1 8/2012 Yokoyama et al.
2012/0205645 A1 8/2012 Fuchs et al.
2012/0214993 A1 8/2012 Aihara et al.
2012/0292601 A1 11/2012 Kottas et al.
2012/0319091 A1 12/2012 Tomoki et al.
2013/0009543 A1 1/2013 Hiroshi et al.
2013/0033172 A1 2/2013 Huang et al.
2013/0105787 A1 5/2013 Daisaku et al.
2013/0146848 A1 6/2013 Ma et al.
2013/0165653 A1 6/2013 Inoue et al.
2013/0175519 A1 7/2013 Naoki et al.
2013/0181190 A1 7/2013 Ma et al.
2013/0241401 A1 9/2013 Kwong et al.
2013/0248830 A1 9/2013 Welsh et al.
2013/0334521 A1 12/2013 Lee et al.
2014/0001446 A1 1/2014 Mizuki et al.
2014/0014925 A1 1/2014 Jung et al.
2014/0014927 A1 1/2014 Kim et al.
2014/0034914 A1 2/2014 Takada et al.
2014/0103305 A1 4/2014 Ma et al.
2014/0117329 A1 5/2014 Lee et al.
2014/0183503 A1 7/2014 Hiroshi et al.
2014/0183517 A1 7/2014 Huh et al.
2014/0191225 A1 7/2014 Inoue et al.
2014/0225088 A1 8/2014 Hwang et al.
2014/0246656 A1 9/2014 Inoue et al.
2014/0284580 A1 9/2014 Balaganesan et al.
2015/0060804 A1 3/2015 Kanitz et al.
2015/0123047 A1 5/2015 Maltenberger et al.
2015/0171348 A1 6/2015 Stoessel et al.
2015/0221874 A1 8/2015 Kim et al.
2015/0228899 A1 8/2015 Tomoki et al.
2015/0263294 A1 9/2015 Kim et al.
2015/0280136 A1 10/2015 Ryu et al.
2016/0163995 A1 6/2016 Kang et al.
2017/0263869 A1 9/2017 Tada et al.
2018/0013075 A1* 1/2018 Wolohan .............. C07D 311/82
2019/0081248 A1 3/2019 Lin et al.
2021/0288259 A1 9/2021 Jeon et al.
2023/0337516 A1* 10/2023 Shih ...................... C07B 59/004
2023/0363276 A1* 11/2023 Fleetham ............... H10K 85/40
2024/0246999 A1* 7/2024 Wolohan .............. C07D 517/22

FOREIGN PATENT DOCUMENTS

CN 103508940 A 1/2014
CN 103694277 A 4/2014
DE 102012005215 B3 4/2013
EP 0650955 A1 5/1995
EP 1238981 A2 9/2002
EP 1239526 A2 9/2002
EP 1244155 A2 9/2002
EP 01602648 A1 12/2005
EP 1617493 A2 1/2006
EP 1624500 A1 2/2006
EP 1642951 A2 4/2006
EP 1647554 A2 4/2006
EP 1698613 A1 9/2006
EP 1725079 A1 11/2006
EP 01734038 A1 12/2006
EP 1806334 A1 7/2007
EP 1841834 A1 10/2007
EP 1930964 A1 6/2008
EP 01956007 A1 8/2008
EP 1961743 A 8/2008
EP 1968131 A1 9/2008
EP 1972613 A1 9/2008
EP 1997799 A1 12/2008
EP 2011790 A1 1/2009
EP 2020694 A1 2/2009
EP 2034538 A1 3/2009
EP 1841834 B1 5/2009
EP 2055700 A1 5/2009
EP 2055701 A1 5/2009
EP 2062907 A2 5/2009
EP 2085382 A1 8/2009
EP 2660300 A2 11/2013
EP 2684932 A1 1/2014
EP 2730583 A1 5/2014
EP 2757608 A1 7/2014
JP 2004022334 A 1/2004

(56) References Cited

FOREIGN PATENT DOCUMENTS

| | | | |
|---|---|---|---|
| JP | 2005112765 | A | 4/2005 |
| JP | 2005149918 | A | 6/2005 |
| JP | 2005268199 | A | 9/2005 |
| JP | 2007073529 | A | 3/2007 |
| JP | 2007091719 | A | 4/2007 |
| JP | 2007254297 | A | 10/2007 |
| JP | 2008021687 | A | 1/2008 |
| JP | 4478555 | B2 | 3/2010 |
| JP | 2012074444 | A | 4/2012 |
| JP | 2013110263 | A | 6/2013 |
| JP | 2014009196 | A | 1/2014 |
| KR | 0117693 | | 4/1998 |
| KR | 20100079458 | A | 7/2010 |
| KR | 20110077173 | A | 7/2011 |
| KR | 20110088898 | A | 8/2011 |
| KR | 20120032054 | A | 4/2012 |
| KR | 20120088644 | A | 8/2012 |
| KR | 20120129733 | A | 11/2012 |
| KR | 20130043460 | A | 4/2013 |
| KR | 20130077473 | A | 7/2013 |
| KR | 20130108183 | | 10/2013 |
| KR | 20130115564 | A | 10/2013 |
| TW | 201139402 | A | 1/2011 |
| TW | 201329200 | A1 | 7/2013 |
| TW | 201332980 | A | 8/2013 |
| WO | 2001039234 | A2 | 5/2001 |
| WO | 2002015645 | A1 | 2/2002 |
| WO | 2003040257 | A1 | 5/2003 |
| WO | 2003060956 | A1 | 7/2003 |
| WO | 2004093207 | A2 | 10/2004 |
| WO | 2005014551 | A1 | 2/2005 |
| WO | 2005019373 | A2 | 3/2005 |
| WO | 2005075451 | A1 | 8/2005 |
| WO | 2005089025 | A1 | 9/2005 |
| WO | 2006056418 | A2 | 6/2006 |
| WO | 2006072002 | A2 | 7/2006 |
| WO | 2006081780 | A1 | 8/2006 |
| WO | 2006081973 | A1 | 8/2006 |
| WO | 2006095951 | A1 | 9/2006 |
| WO | 2006114966 | A1 | 11/2006 |
| WO | 2006121811 | A1 | 11/2006 |
| WO | 2007018067 | A1 | 2/2007 |
| WO | 2007063754 | A1 | 6/2007 |
| WO | 2007108362 | A1 | 9/2007 |
| WO | 2007111263 | A1 | 10/2007 |
| WO | 2007115970 | A1 | 10/2007 |
| WO | 2007115981 | A1 | 10/2007 |
| WO | 2007125714 | A1 | 11/2007 |
| WO | 2008023550 | A1 | 2/2008 |
| WO | 2008023759 | A1 | 2/2008 |
| WO | 2008035571 | A1 | 3/2008 |
| WO | 2008054584 | A1 | 5/2008 |
| WO | 2008056746 | A1 | 5/2008 |
| WO | 2008057394 | A1 | 5/2008 |
| WO | 2008078800 | A1 | 7/2008 |
| WO | 2008096609 | A1 | 8/2008 |
| WO | 2008101842 | A | 8/2008 |
| WO | 2009000673 | A2 | 12/2008 |
| WO | 2009003455 | A1 | 1/2009 |
| WO | 2009003898 | A1 | 1/2009 |
| WO | 2009008277 | A1 | 1/2009 |
| WO | 2009011327 | A1 | 1/2009 |
| WO | 2009021126 | A2 | 2/2009 |
| WO | 2009050281 | A1 | 4/2009 |
| WO | 2009063833 | A1 | 5/2009 |
| WO | 2009066778 | A1 | 5/2009 |
| WO | 2009066779 | A1 | 5/2009 |
| WO | 2009086028 | A2 | 7/2009 |
| WO | 2009100991 | A1 | 8/2009 |
| WO | 2009145016 | A1 | 12/2009 |
| WO | 2009148269 | A1 | 12/2009 |
| WO | 2010011390 | A2 | 1/2010 |
| WO | 2010028151 | A1 | 3/2010 |
| WO | 2010054731 | A1 | 5/2010 |
| WO | 2010056066 | A1 | 5/2010 |
| WO | 2010061824 | A1 | 6/2010 |
| WO | 2010067894 | A1 | 6/2010 |
| WO | 2010072300 | A1 | 7/2010 |
| WO | 2010086089 | A1 | 8/2010 |
| WO | 2010107244 | A2 | 9/2010 |
| WO | 2010118029 | A1 | 10/2010 |
| WO | 2011044988 | A1 | 4/2011 |
| WO | 2011051404 | A1 | 5/2011 |
| WO | 2011074770 | A1 | 6/2011 |
| WO | 2011074770 | A2 | 6/2011 |
| WO | 2011075644 | A2 | 6/2011 |
| WO | 2011081423 | A2 | 7/2011 |
| WO | 2011081431 | A2 | 7/2011 |
| WO | 2011086863 | A1 | 7/2011 |
| WO | 2011105373 | A1 | 9/2011 |
| WO | 2011107491 | A1 | 9/2011 |
| WO | 2012020327 | A1 | 2/2012 |
| WO | 2012128298 | A1 | 9/2012 |
| WO | 2012133644 | A1 | 10/2012 |
| WO | 2012133649 | A1 | 10/2012 |
| WO | 2012163471 | A1 | 12/2012 |
| WO | 2012177006 | A2 | 12/2012 |
| WO | 2013018530 | A1 | 2/2013 |
| WO | 2013024872 | A1 | 2/2013 |
| WO | 2013035275 | A1 | 3/2013 |
| WO | 2013039073 | A1 | 3/2013 |
| WO | 2013079217 | A1 | 6/2013 |
| WO | 2013081315 | A1 | 6/2013 |
| WO | 2013087142 | A1 | 6/2013 |
| WO | 2013094620 | A1 | 6/2013 |
| WO | 2013107487 | A1 | 7/2013 |
| WO | 2013118812 | A1 | 8/2013 |
| WO | 2013120577 | A1 | 8/2013 |
| WO | 2013145667 | A1 | 10/2013 |
| WO | 2013157367 | A1 | 10/2013 |
| WO | 2013174471 | A1 | 11/2013 |
| WO | 2013175747 | A1 | 11/2013 |
| WO | 2013180376 | A1 | 12/2013 |
| WO | 2013191404 | A1 | 12/2013 |
| WO | 2014002873 | A1 | 1/2014 |
| WO | 2014007565 | A1 | 1/2014 |
| WO | 2014008982 | A1 | 1/2014 |
| WO | 2014009310 | A1 | 1/2014 |
| WO | 2014015935 | A2 | 1/2014 |
| WO | 2014015937 | A1 | 1/2014 |
| WO | 2014023377 | A2 | 2/2014 |
| WO | 2014024131 | A1 | 2/2014 |
| WO | 2014030872 | A2 | 2/2014 |
| WO | 2014030921 | A1 | 2/2014 |
| WO | 2014031977 | A1 | 2/2014 |
| WO | 2014034791 | A1 | 3/2014 |
| WO | 2014038456 | A1 | 3/2014 |
| WO | 2014104499 | A1 | 7/2014 |
| WO | 2014104514 | A1 | 7/2014 |
| WO | 2014104535 | A1 | 7/2014 |
| WO | 2014112450 | A1 | 7/2014 |
| WO | 2014142472 | A1 | 9/2014 |
| WO | 2014157018 | A1 | 10/2014 |

OTHER PUBLICATIONS

Baldo et al., "Highly Efficient Phosphorescent Emission from Organic Electroluminescent Devices," Nature, vol. 395, 151-154, 1998.

Baldo et al., "Very high-efficiency green organic light-emitting devices based on electrophosphorescence," Appl. Phys. Lett., vol. 75, No. 3, 4-6 (1999).

Atzrodt et al., Angew. Chem. Int. Ed. (Reviews) 2007, 46, 7744-65.

Fink, R.; Heischkel, Y.; Thelakkat, M.; Schmidt, H.-W. Chem. Mater. 1998, 10, 3620-3625.

Pommerehne, J.; Vestweber, H.; Guss, W.; Mahrt, R. F.; Bassler, H.; Porsch, M.; Daub, J. Adv. Mater. 1995, 7, 551.

Hong et al., Chem. Mater. 2016, 28, 5791-98, 5792-93.

Tavasli et al., J. Mater. Chem. 2012, 22, 6419-29, 6422.

Morello, G.R., J. Mol. Model. 2017, 23:174.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 63/476,404, filed on Dec. 21, 2022, the entire contents of which are incorporated herein by reference.

FIELD

The present disclosure generally relates to organometallic compounds and formulations and their various uses including as hosts or emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light.

In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound comprising at least one $W^1$, one $W^2$, and one $W^3$;

wherein $W^1$ is a structure of Formula I:

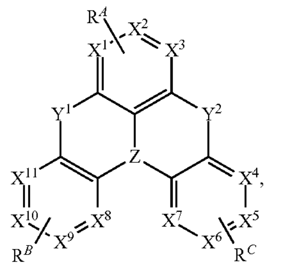

wherein $X^1$-$X^{11}$ are each independently C or N;

wherein $Y^1$ and $Y^2$ are each independently selected from the group consisting of BR, BRR', NR, PR, P(O)R, O, S, Se, C=O, C=S, C=Se, C=NR, C=CRR', S=O, $SO_2$, CR, CRR', SiRR', and GeRR';

wherein Z is selected from the group consisting of B, Al, Ga, PO, and N;

wherein $W^2$ is a structure of Formula II:

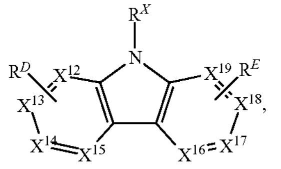

wherein $X^{12}$-$X^{19}$ are each independently C or N;

wherein $W^3$ is a structure of Formula III or Formula IV:

Formula III

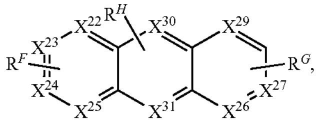

wherein $X^{22}$-$X^{31}$ are each independently C or N;

Formula IV

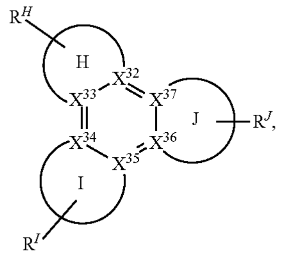

wherein $X^{32}$-$X^{37}$ are each independently C or N;

wherein $R^A$, $R^B$, $R^C$, $R^D$, $R^E$, $R^F$, $R^G$, $R^H$, $R^I$, $R^J$, and $R^K$ each independently represent mono to the maximum amount of substitution, or no substitution;

wherein each R, R', $R^A$, $R^B$, $R^C$, $R^D$, $R^E$, $R^F$, $R^G$, $R^H$, $R^I$, $R^J$, $R^K$, and $R^X$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein moieties I, J and K are each independently a monocyclic or fused polycyclic ring system comprised of one or more 5-membered or 6-membered carbocyclic or heterocyclic rings;

wherein any two substituents may be joined or fused to form a ring; and wherein in at least one $W^2$, no two or more $R^D$ or no two or more $R^E$ substituents are joined to form a ring;

wherein at least one $W^2$ does not have R joined to $R^D$ or $R^E$ to form a ring.

In another aspect, the present disclosure provides a formulation of the compound as described herein.

In yet another aspect, the present disclosure provides an OLED having an organic layer comprising the compound as described herein.

In yet another aspect, the present disclosure provides a consumer product comprising an OLED with an organic layer comprising the compound as described herein.

DETAILED DESCRIPTION

A. Terminology

Figure 1:
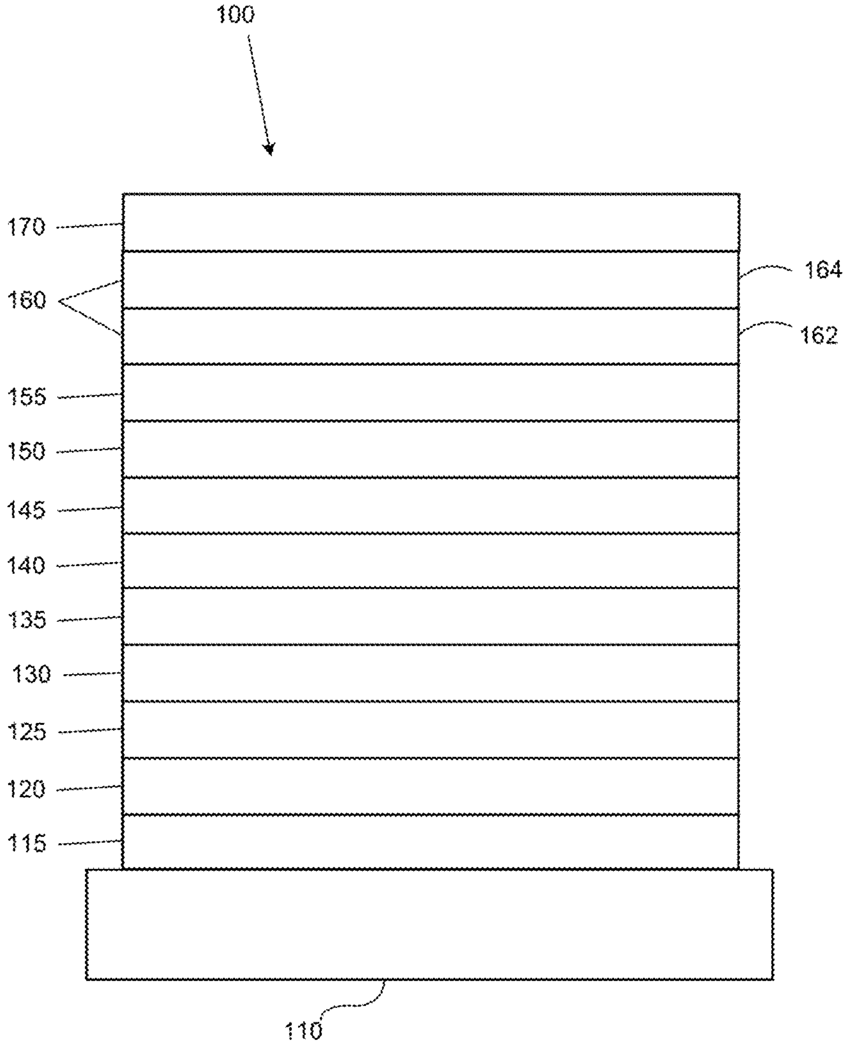
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The terms "selenyl" refers to a $—SeR_s$ radical.

The term "sulfinyl" refers to a $—S(O)—R_s$, radical.

The term "sulfonyl" refers to a $—SO_2—R_s$ radical.

The term "phosphino" refers to a $—P(R_s)_2$ radical, wherein each $R_s$ can be same or different.

The term "silyl" refers to a $—Si(R_s)_3$ radical, wherein each $R_s$ can be same or different.

The term "germyl" refers to a $—Ge(R_s)_3$ radical, wherein each $R_s$ can be same or different.

The term "boryl" refers to a $—B(R_s)_2$ radical or its Lewis adduct $—B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, selenyl, sulfinyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof.

In some instances, the more preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The Compounds of the Present Disclosure

In one aspect, the present disclosure provides a compound comprising at least one $W^1$, one $W^2$, and one $W^3$;

wherein $W^1$ is a structure of Formula I:

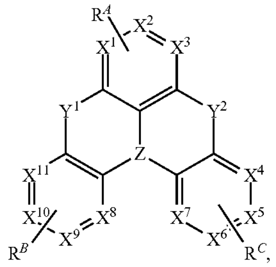

wherein $X^1$-$X^{11}$ are each independently C or N;

wherein $Y^1$ and $Y^2$ are each independently selected from the group consisting of BR, BRR', NR, PR, P(O)R, O, S, Se, C═O, C═S, C═Se, C═NR, C═CRR', S═O, $SO_2$, CR, CRR', SiRR', and GeRR';

wherein Z is selected from the group consisting of B, Al, Ga, PO, and N;

wherein $W^2$ is a structure of Formula II:

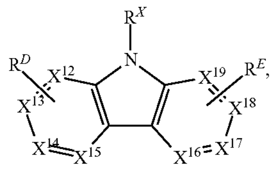

wherein $X^{12}$-$X^{19}$ are each independently C or N;

wherein $W^3$ is a structure of Formula III or Formula IV:

Formula III

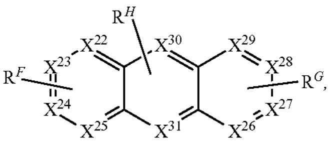

wherein $X^{22}$-$X^{31}$ are each independently C or N;

Formula IV

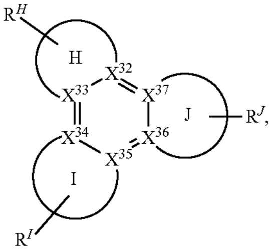

wherein $X^{32}$-$X^{37}$ are each independently C or N;

wherein $R^A$, $R^B$, $R^C$, $R^D$, $R^E$, $R^F$, $R^G$, $R^H$, $R^I$, $R^J$, and $R^K$ each independently represent mono to the maximum amount of substitution, or no substitution;

wherein each R, R', $R^A$, $R^B$, $R^C$, $R^D$, $R^E$, $R^F$, $R^G$, $R^H$, $R^I$, $R^J$, $R^K$, and $R^X$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein moieties I, J and K are each independently a monocyclic or fused polycyclic ring system comprised of one or more 5-membered or 6-membered carbocyclic or heterocyclic rings;

wherein any two substituents may be joined or fused to form a ring; and wherein in at least one $W^2$, no two or more $R^D$ or no two or more $R^E$ substituents are joined to form a ring;

wherein at least one $W^2$ does not have R joined to $R^D$ or $R^E$ to form a ring.

In some embodiments, the compound does not comprise one of the following structures:

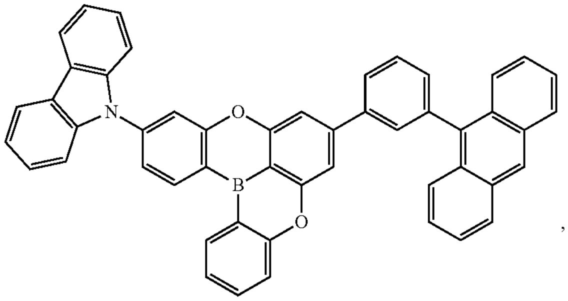

,

-continued

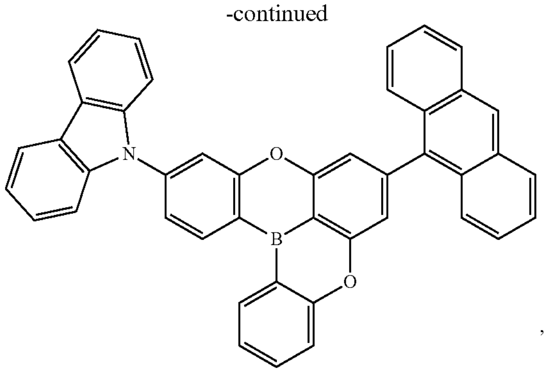

,

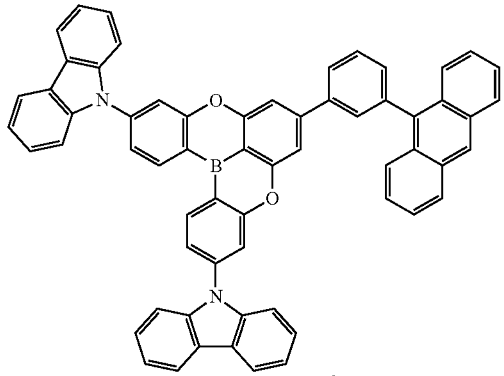

, or

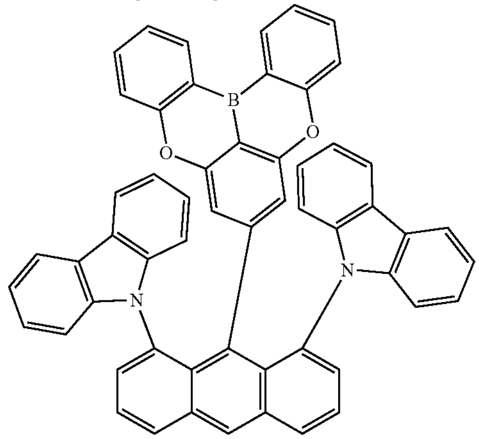

.

In some embodiments, each R, $R^A$, $R^B$, $R^C$, $R^D$, $R^E$, $R^F$, $R^G$, $R^H$, $R^I$, $R^J$, and $R^K$ is independently a hydrogen or a substituent selected from the group consisting of deuterium, fluorine, alkyl, cycloalkyl, heteroalkyl, alkoxy, aryloxy, amino, silyl, boryl, germyl, alkenyl, cycloalkenyl, heteroalkenyl, aryl, heteroaryl, nitrile, isonitrile, sulfanyl, and combinations thereof.

In some embodiments, at least eight of $X^1$-$X^{11}$ are C.

In some embodiments, at least ten of $X^1$-$X^{11}$ are C.

In some embodiments, at least one of $X^1$-$X^{11}$ is N.

In some embodiments, exactly one of $X^1$-$X^{11}$ is N.

In some embodiments, all of $X^1$-$X^{11}$ are C.

In some embodiments, one of $X^1$-$X^3$ is N. In some embodiments, one of $X^4$-$X^7$ is N. In some embodiments, one of $X^8$-$X^{11}$ is N.

In some embodiments, Z is B.

In some embodiments, Z is Al.

In some embodiments, Z is N.

In some embodiments, at least one of $Y^1$ and $Y^2$ is O.

In some embodiments, at least one of $Y^1$ and $Y^2$ is S.

In some embodiments, at least one of $Y^1$ and $Y^2$ is Se.

In some embodiments, both of $Y^1$ and $Y^2$ are O.

In some embodiments, Z is B and both of $Y^1$ and $Y^2$ are O.

In some embodiments, at least six of $X^{12}$-$X^{19}$ are C.

In some embodiments, at least seven of $X^{12}$-$X^{19}$ are C.

In some embodiments, at least one of $X^{12}$-$X^{19}$ is N.

In some embodiments, exactly one of $X^{12}$-$X^{19}$ is N.

In some embodiments, one of $X^{12}$-$X^{15}$ is N. In some embodiments, one of $X^{16}$-$X^{19}$ is N.

In some embodiments, all of $X^{12}$-$X^{19}$ are C.

In some embodiments, the compound comprises at least one $W^3$ which has a structure of Formula III.

In some embodiments, the compound comprises at least one $W^3$ which has a structure of Formula III, and wherein at least eight of $X^{22}$-$X^{31}$ are C.

In some embodiments, the compound comprises at least one $W^3$ which has a structure of Formula III, and wherein at least nine of $X^{22}$-$X^{31}$ are C.

In some embodiments, the compound comprises at least one $W^3$ which has a structure of Formula III, and wherein at least one of $X^{22}$-$X^{31}$ is N.

In some embodiments, the compound comprises at least one $W^3$ which has a structure of Formula III, and wherein exactly one of $X^{22}$-$X^{31}$ is N.

In some embodiments, the compound comprises at least one $W^3$ which has a structure of Formula III, and wherein all of $X^{22}$-$X^{31}$ are C In some embodiments, one of $X^{22}$-$X^{25}$ is N. In some embodiments, one of $X^{26}$-$X^{29}$ is N. In some embodiments, one of $X^{30}$-$X^{31}$ is N. In some embodiments, both of $X^{30}$ and $X^{31}$ are N.

In some embodiments, the compound comprises at least one $W^3$ which has a structure of Formula IV.

In some embodiments, the compound comprises at least one $W^3$ which has a structure of Formula IV, and wherein at least five of $X^{32}$-$X^{36}$ are C.

In some embodiments, the compound comprises at least one $W^3$ which has a structure of Formula IV, and wherein at least one of $X^2$-$X^{36}$ is N.

In some embodiments, the compound comprises at least one $W^3$ which has a structure of Formula IV, and wherein exactly one of $X^{32}$-$X^{36}$ is N.

In some embodiments, the compound comprises at least one $W^3$ which has a structure of Formula IV, and wherein all of $X^{32}$-$X^{36}$ are C.

In some embodiments, the compound comprises at least one $W^3$ which has a structure of Formula IV, and wherein at least one of moieties I, J, and K comprises a 6-membered ring.

In some embodiments, the compound comprises at least one $W^3$ which has a structure of Formula IV, and wherein at least one of moieties I, J, and K comprises a 6-membered aromatic ring.

In some embodiments, the compound comprises at least one $W^3$ which has a structure of Formula IV, and wherein at least one of moieties I, J, and K comprises a 6-membered aromatic carbocyclic ring.

In some embodiments, the compound comprises at least one $W^3$ which has a structure of Formula IV, and wherein at least two of moieties I, J, and K comprise a 6-membered ring.

In some embodiments, the compound comprises at least one $W^3$ which has a structure of Formula IV, and wherein at least two of moieties I, J, and K comprise a 6-membered aromatic ring.

In some embodiments, the compound comprises at least one $W^3$ which has a structure of Formula IV, and wherein at least two of moieties I, J, and K comprise a 6-membered aromatic carbocyclic ring.

In some embodiments, the compound comprises at least one $W^3$ which has a structure of Formula IV, and wherein all of moieties I, J, and K comprise a 6-membered ring.

In some embodiments, the compound comprises at least one $W^3$ which has a structure of Formula IV, and wherein all of moieties I, J, and K comprise a 6-membered aromatic ring.

In some embodiments, the compound comprises at least one $W^3$ which has a structure of Formula IV, and wherein all of moieties I, J, and K comprise a 6-membered aromatic carbocyclic ring.

In some embodiments, the compound comprises at least one $W^3$ which has a structure of Formula IV, and wherein at least one of moieties I, J, and K comprises a 5-membered ring.

In some embodiments, the compound comprises at least one $W^3$ which has a structure of Formula IV, and wherein at least one of moieties I, J, and K comprises a 5-membered aromatic ring.

In some embodiments, the compound comprises at least one $W^3$ which has a structure of Formula IV, and wherein at least one of moieties I, J, and K comprises a 5-membered aromatic heterocyclic ring.

In some embodiments, the compound comprises at least one $W^3$ which has a structure of Formula IV, and wherein all of moieties I, J, and K are 6-membered aromatic carbocyclic rings.

In some embodiments, each of moieties I, J, and K is independently selected from the group consisting of benzene, pyridine, pyrimidine, pyridazine, pyrazine, triazine, imidazole, pyrazole, pyrrole, oxazole, furan, thiophene, thiazole, triazole, naphthalene, quinoline, isoquinoline, quinazoline, benzofuran, aza-benzofuran, benzoxazole, aza-benzoxazole, benzothiophene, aza-benzothiophene, benzothiazole, aza-benzothiazole, benzoselenophene, aza-benzoselenophene, indene, aza-indene, indole, aza-indole, benzimidazole, aza-benzimidazole, carbazole, aza-carbazole, dibenzofuran, aza-dibenzofuran, dibenzothiophene, aza-dibenzothiophene, quinoxaline, phthalazine, phenanthrene, phenanthridine, fluorene, and aza-fluorene. In some embodiments, the aza variant includes one N on a benzo ring.

In some embodiments, the compound comprises at least two carbazole groups.

In some embodiments, a structure of Formula II is directly attached to $X^2$.

In some embodiments, a structure of Formula III is directly attached to $X^2$.

In some embodiments, a structure of Formula III is directly attached to $X^{14}$ or $X^{17}$.

In some embodiments a structure of Formula IV is directly attached to $X^{14}$ or $X^{17}$.

In some embodiments, a structure of Formula II is directly attached to $X^{14}$ or $X^{17}$.

In some embodiments, a structure of Formula II is directly attached to $X^{24}$ or $X^{27}$.

In some embodiments, a structure of Formula III or IV is directly attached to $X^{30}$ or $X^{31}$.

In some embodiments, the compound comprises a structure of Formula III and a structure of Formula IV.

In some embodiments, the compound is selected from the group consisting of:
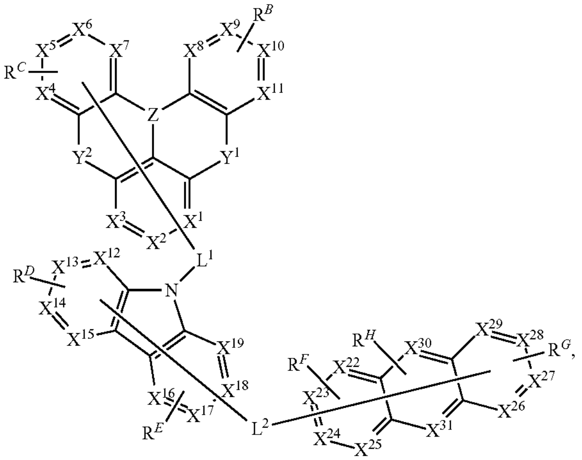
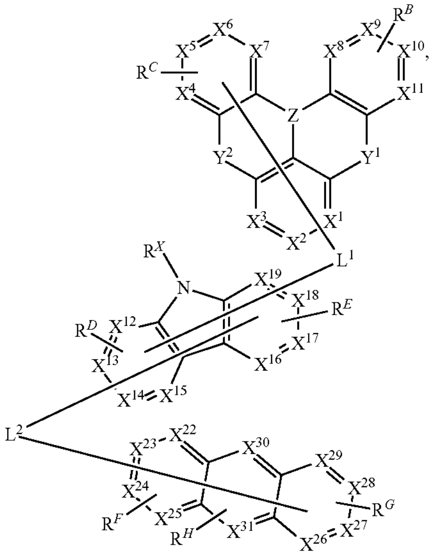
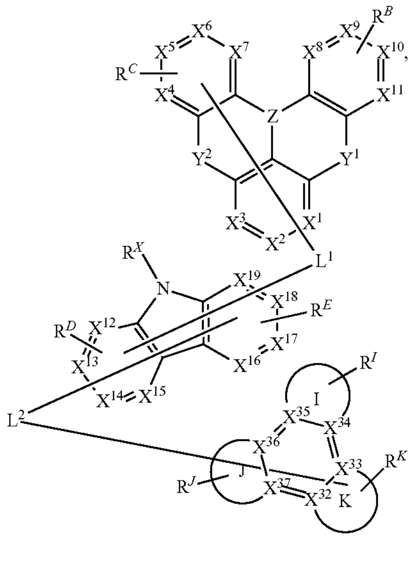
-continued
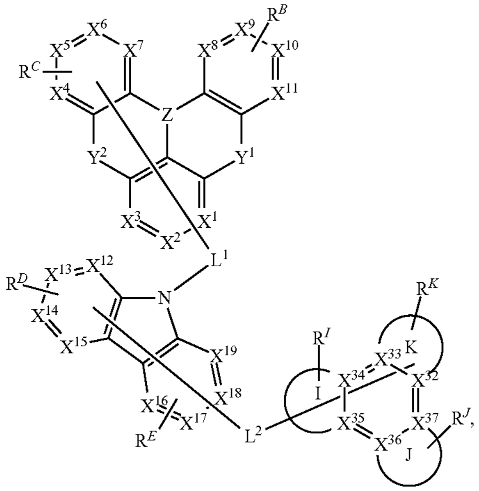
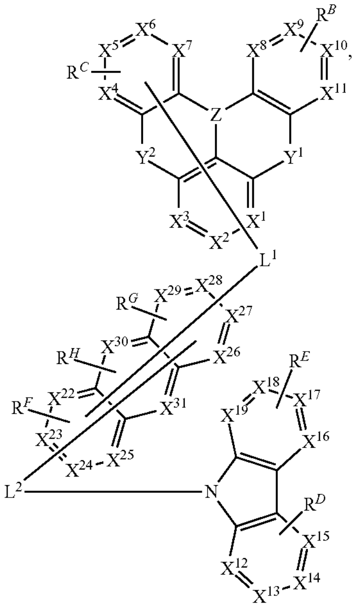
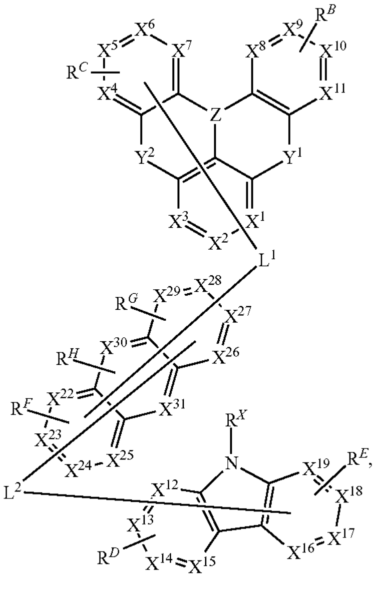

-continued
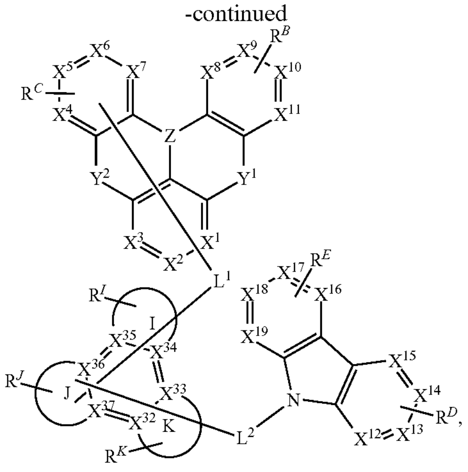
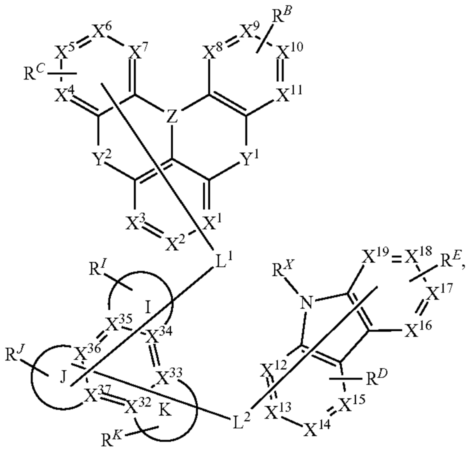
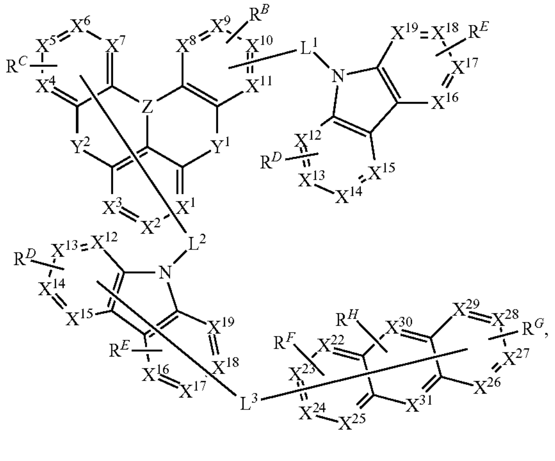
-continued
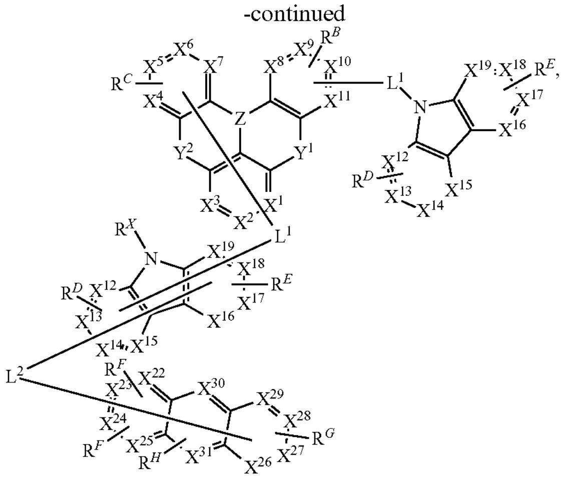
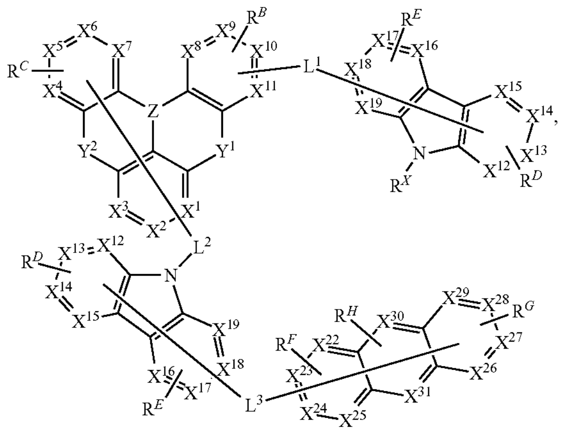
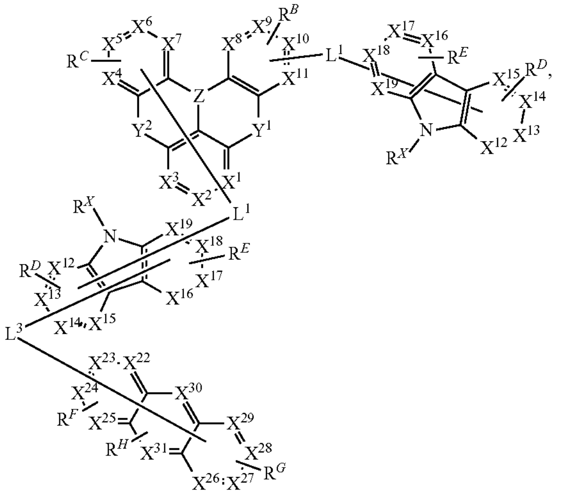

-continued
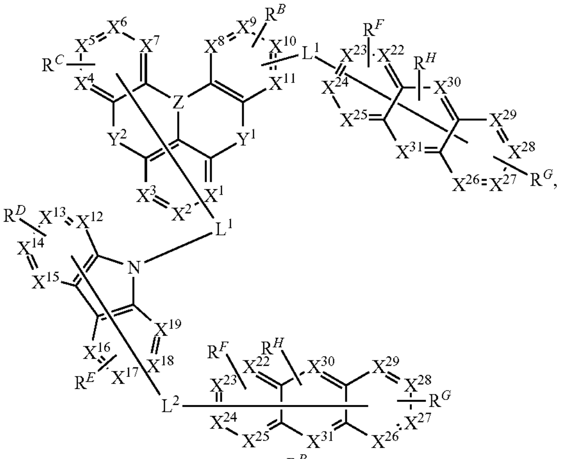
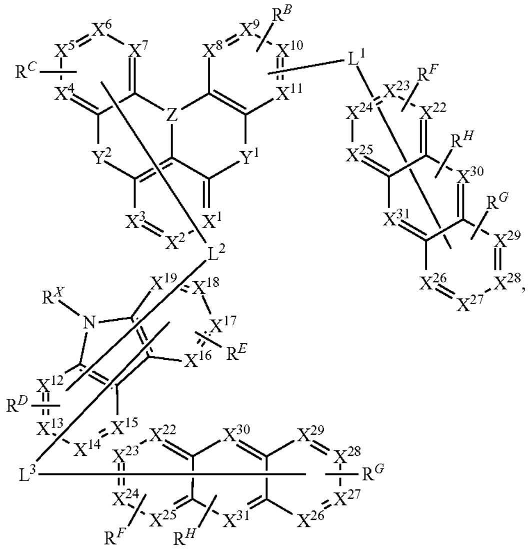
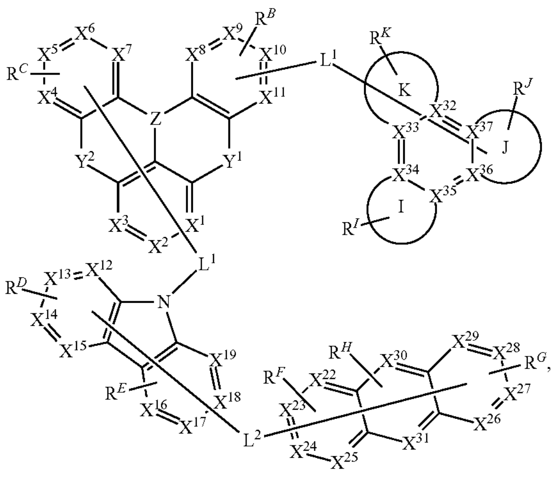
-continued
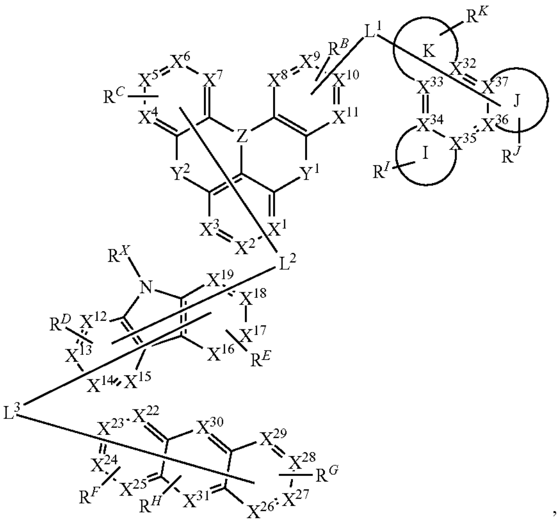
,
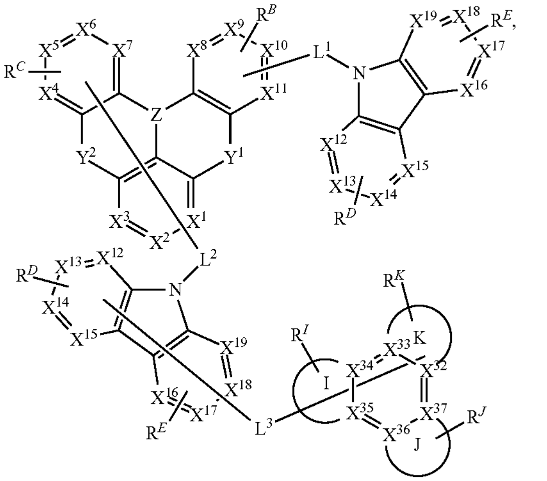
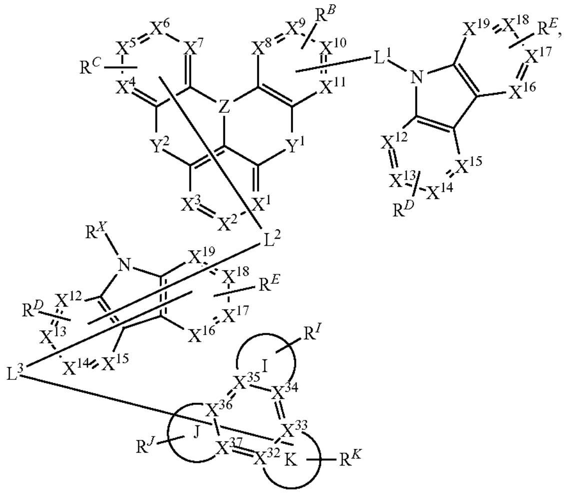

-continued
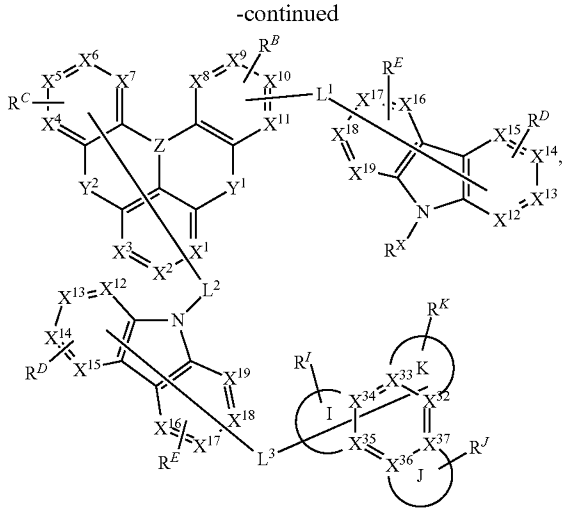
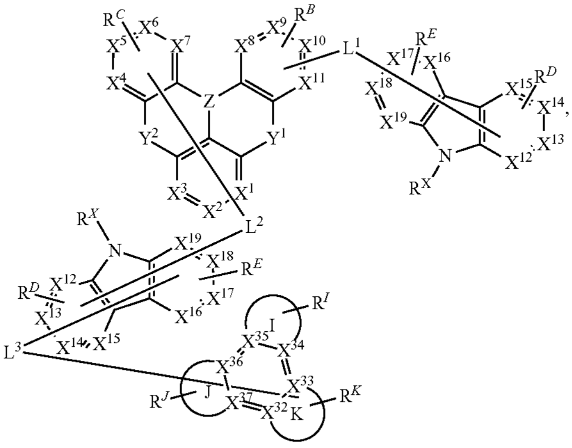
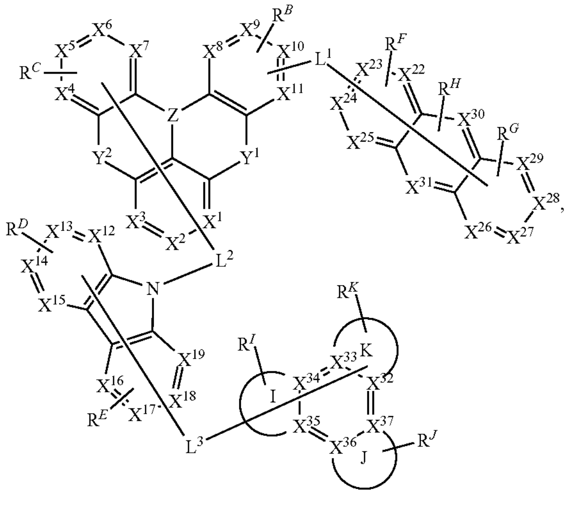
-continued
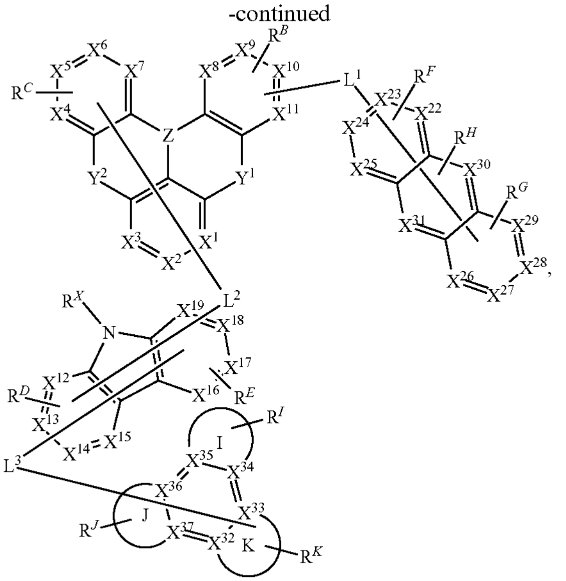
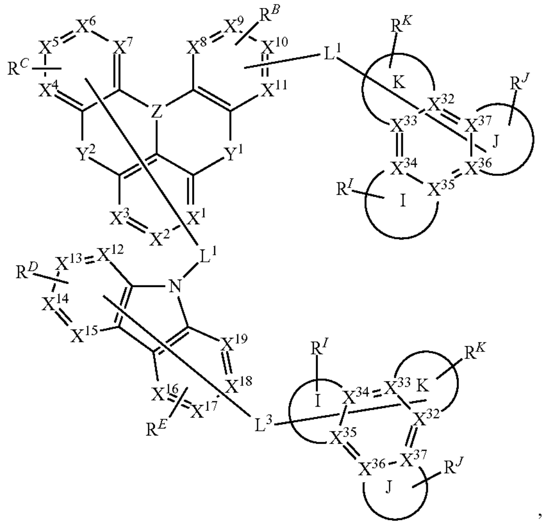
,
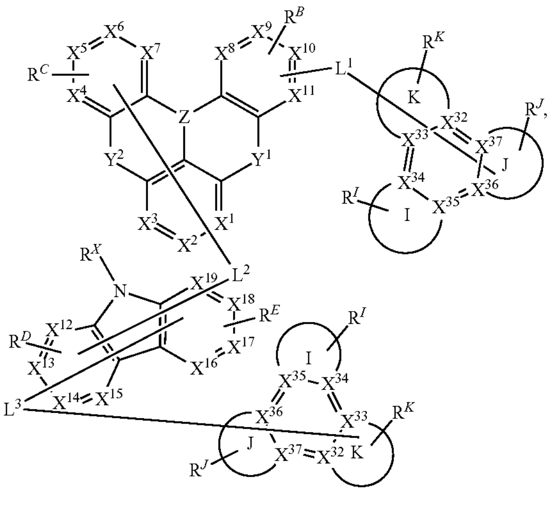

-continued
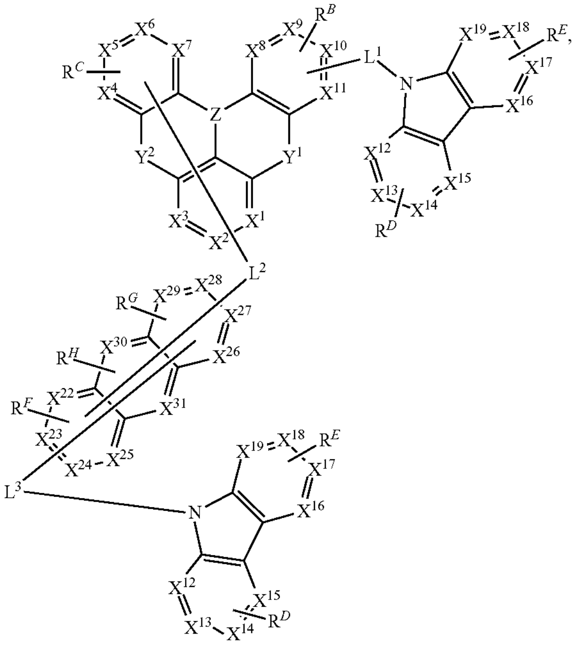
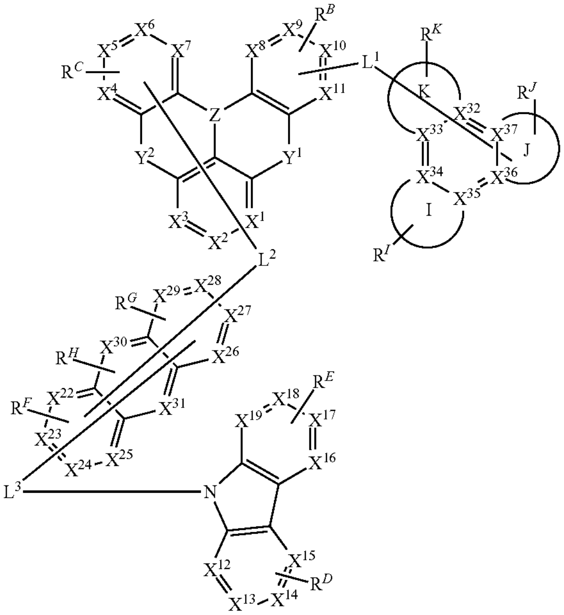
,
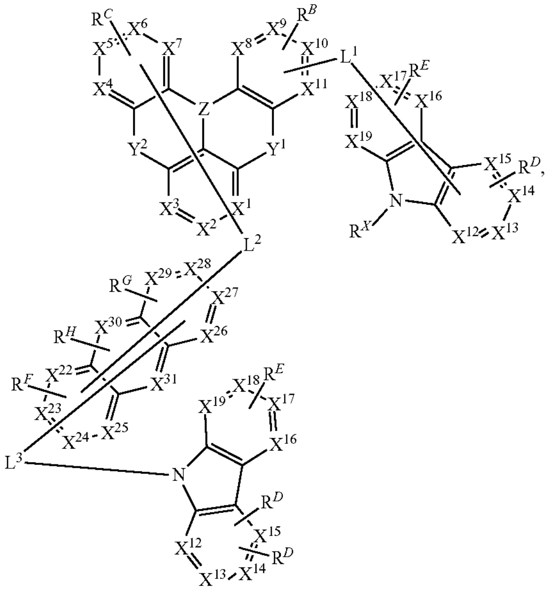
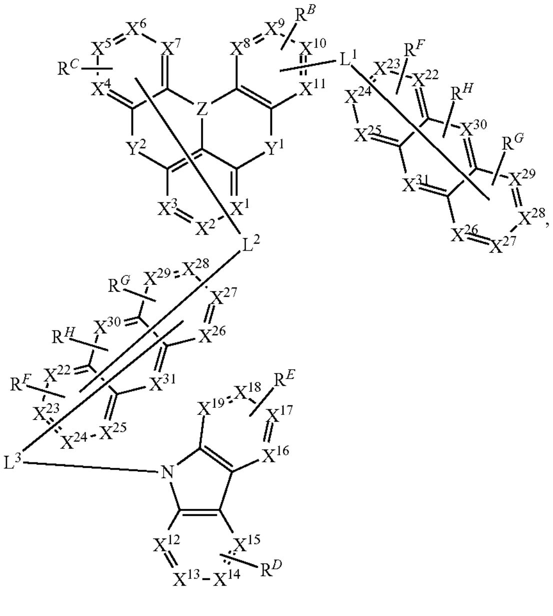

-continued
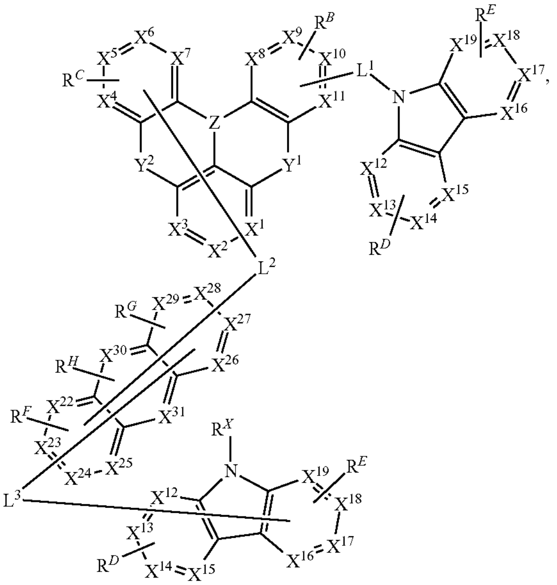
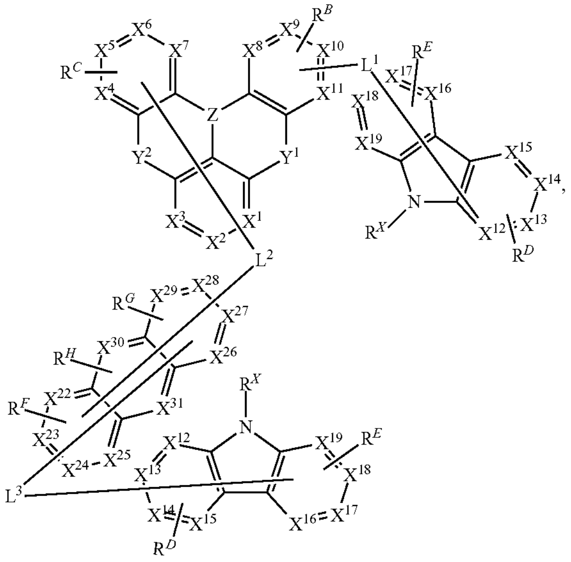
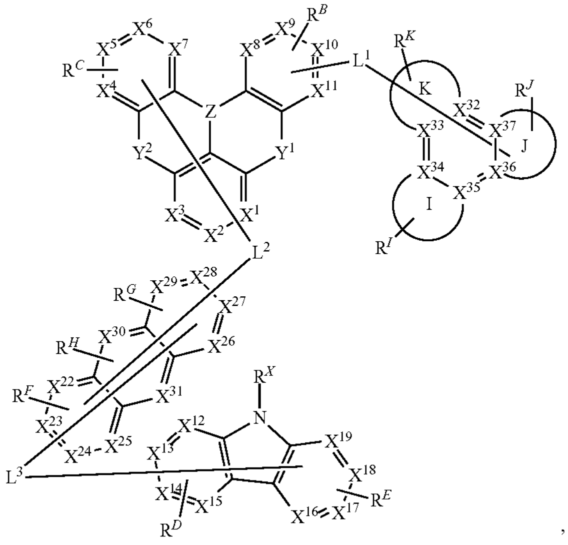
,
-continued
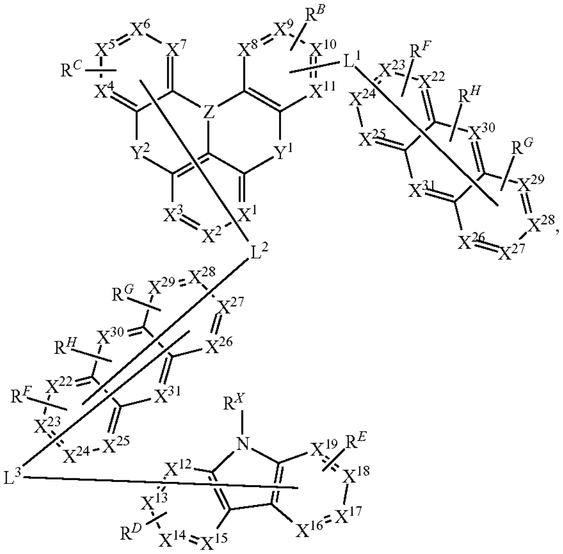
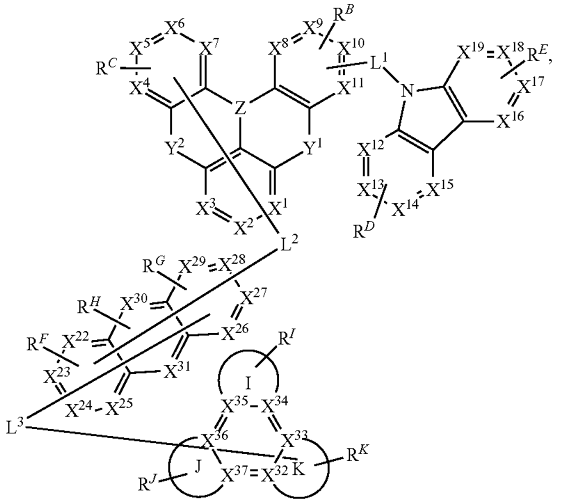
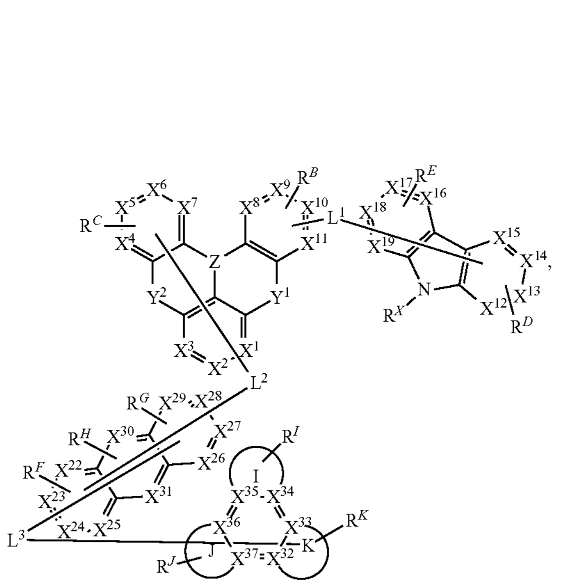

-continued
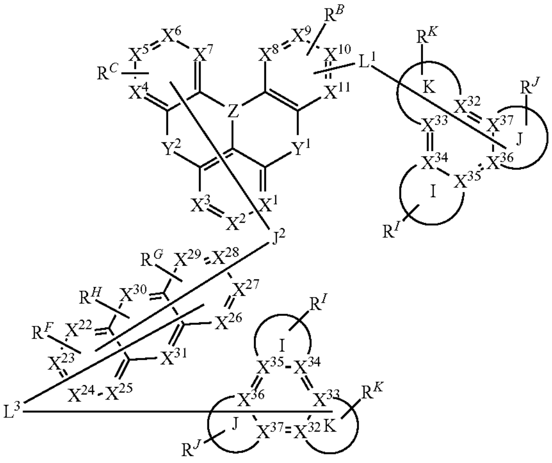
,
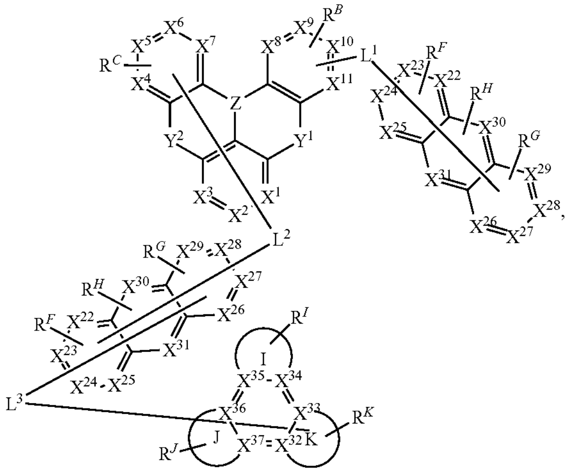
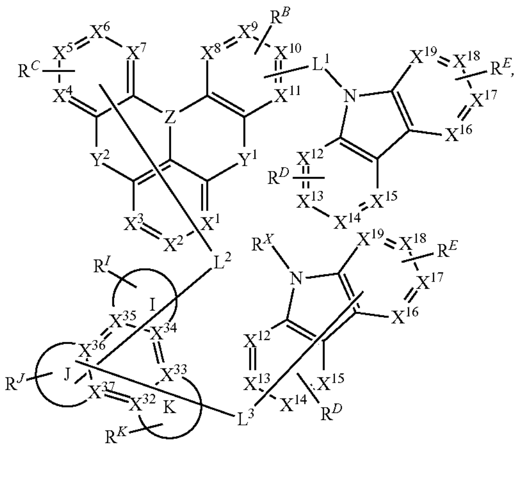
-continued
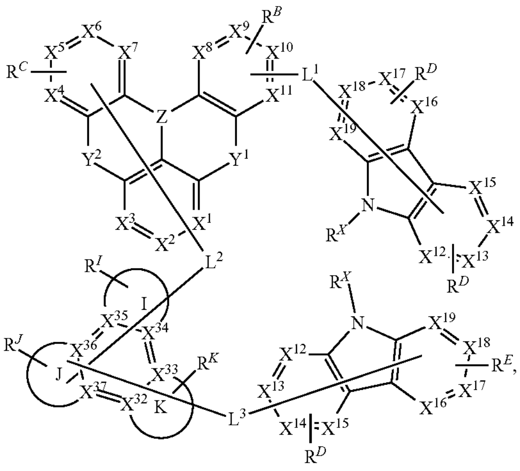
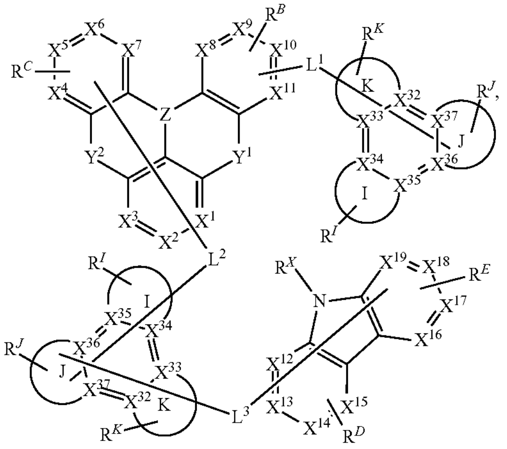
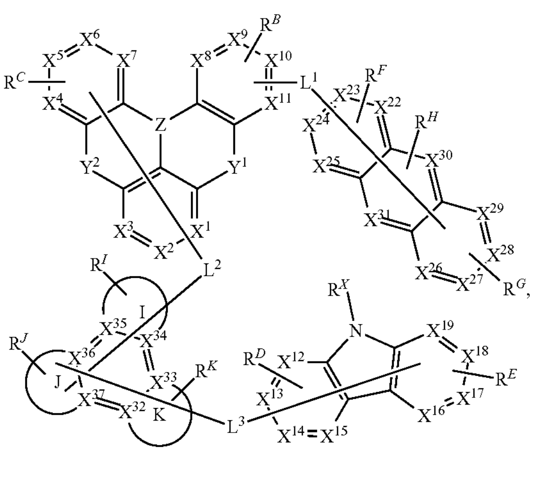

-continued
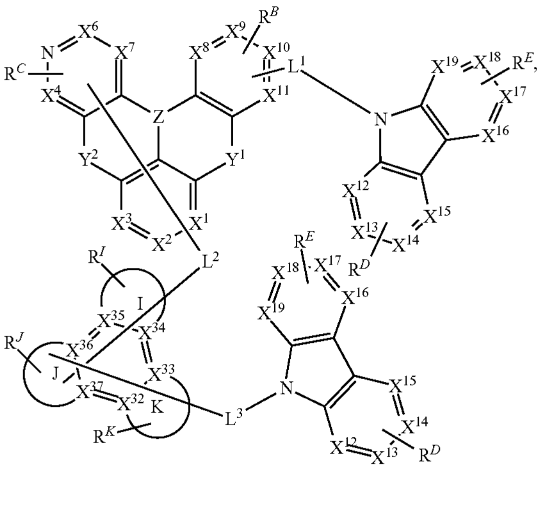
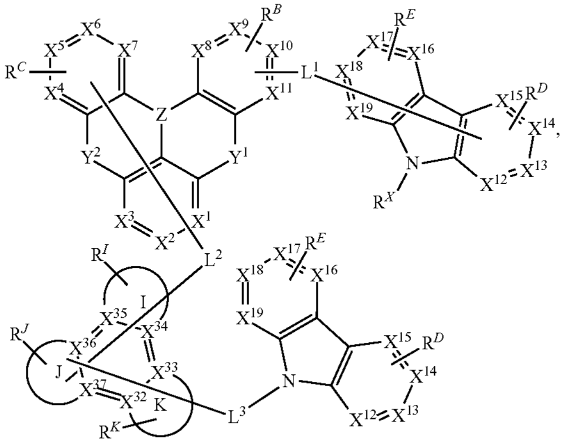
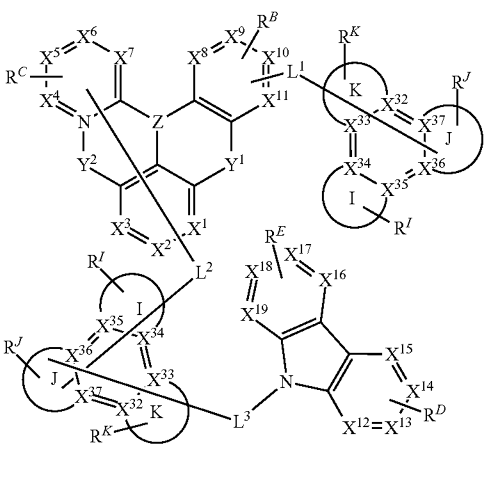
,
-continued
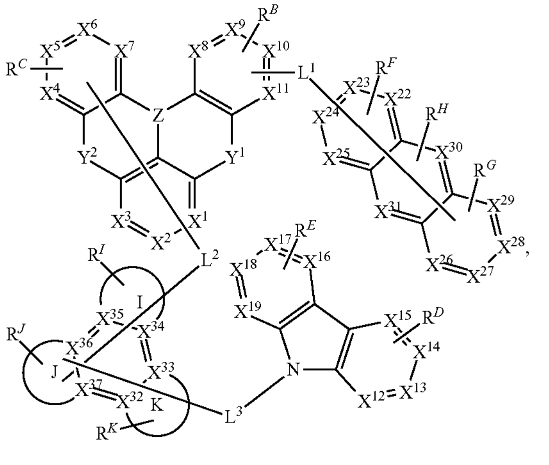
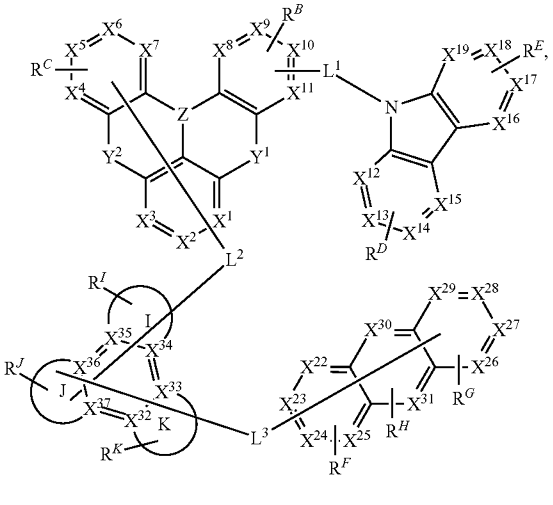
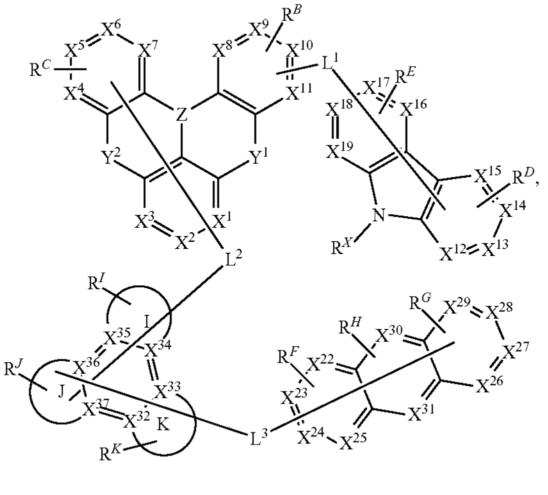

-continued

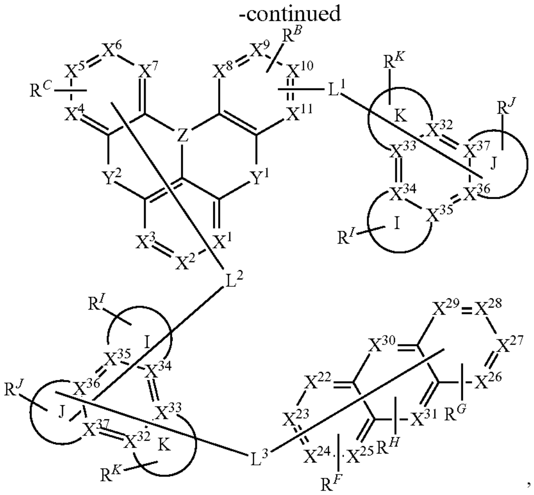

, and

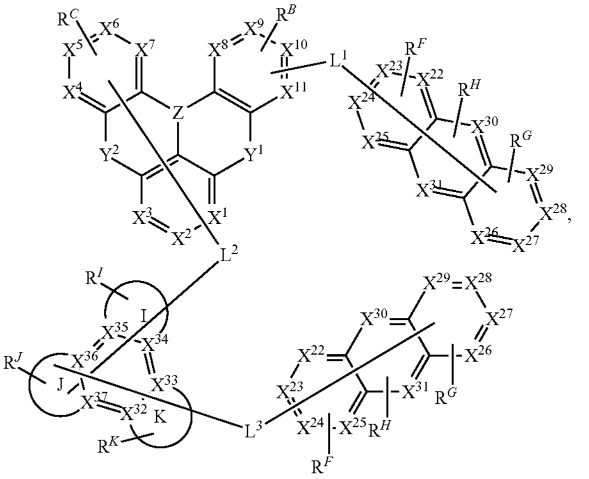

wherein each of $L^1$, $L^2$, and $L^3$ is independently selected from the group consisting of a direct bond, BR, BRR', NR, PR, P(O)R, O, S, Se, C=O, C=S, C=Se, C=NR, C=CRR', S=O, $SO_2$, CR, CRR', SiRR', and GeRR';

the remaining variables are the same as previously defined; and any two substituents can be joined or fused to form a ring.

It should be understood that for those structures of the above list where a structure comprises two or more Formulae I, two or more Formulae II, two or more Formulae III, or two or more Formulae IV, the variables in the two or more Formulae are independent from each other. For example, if a structure has two

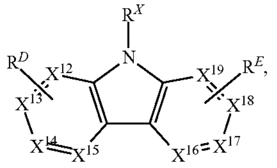

and each one has an $X^{12}$, and the two $X^{12}$ can be the same or different, and the same rule applies throughout unless explicitly stipulated otherwise.

In some embodiments, the compound is selected from the group consisting of:

| Compound | Structure of compound |
|---|---|
| Compound 1-(RL)(RM)(RN)(RO), wherein Compound 1-(R1)(R1)(R1)(R1) to Compound 1-(R141)(R141)(R141)(R141), have the structure | 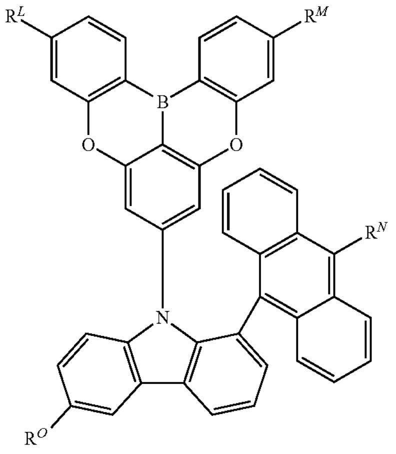 |

-continued
| Compound | Structure of compound |
| --- | --- |
| Compound 2-(RL)(RM)(RN)(RO), wherein Compound 2-(R1)(R1)(R1)(R1) to Compound 2-(R141)(R141)(R141)(R141), have the structure | 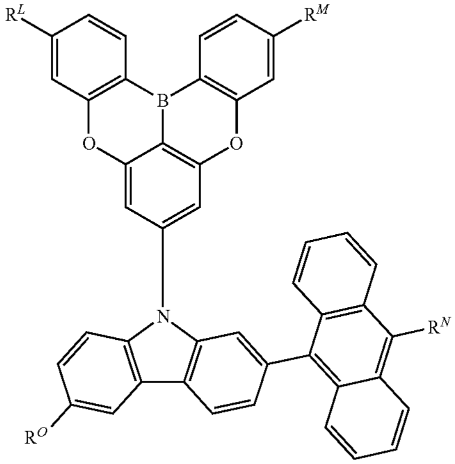 |
| Compound 3-(RL)(RM)(RN)(RO), wherein Compound 3-(R1)(R1)(R1)(R1) to Compound 3-(R141)(R141)(R141)(R141), have the structure | 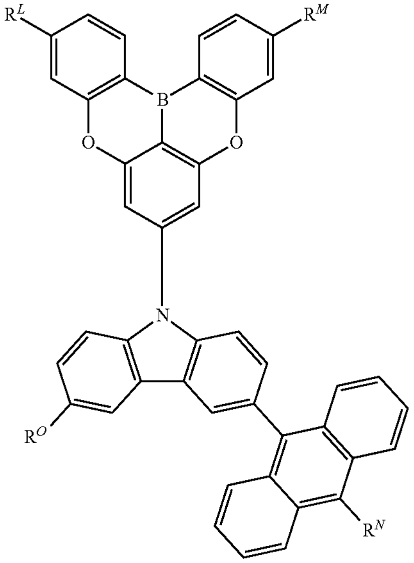 |
| Compound 4-(RL)(RM)(RN)(RO), wherein Compound 4-(R1)(R1)(R1)(R1) to Compound 4-(R141)(R141)(R141)(R141), have the structure | 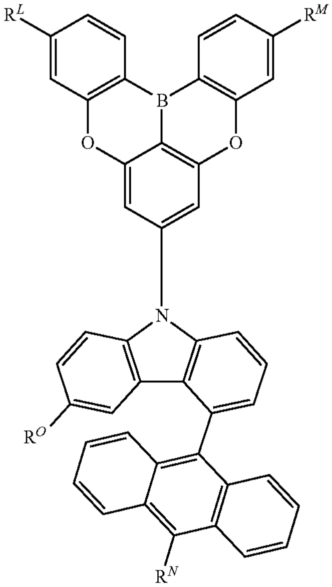 |

-continued
| Compound | Structure of compound |
|---|---|
| Compound 5-(RL)(RM)(RN)(RO), wherein Compound 5-(R1)(R1)(R1)(R1) to Compound 5-(R141)(R141)(R141)(R141), have the structure | 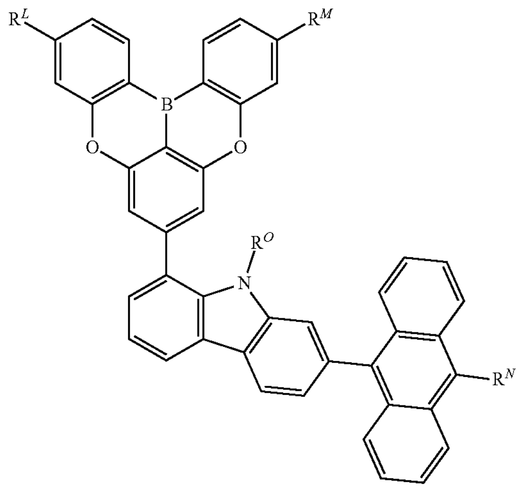 |
| Compound 6-(RL)(RM)(RN)(RO), wherein Compound 6-(R1)(R1)(R1)(R1) to Compound 6-(R141)(R141)(R141)(R141), have the structure | 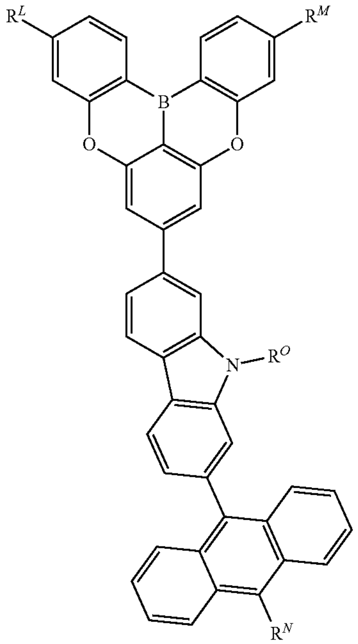 |
| Compound 7-(RL)(RM)(RN)(RO), wherein Compound 7-(R1)(R1)(R1)(R1) to Compound 7-(R141)(R141)(R141)(R141), have the structure | 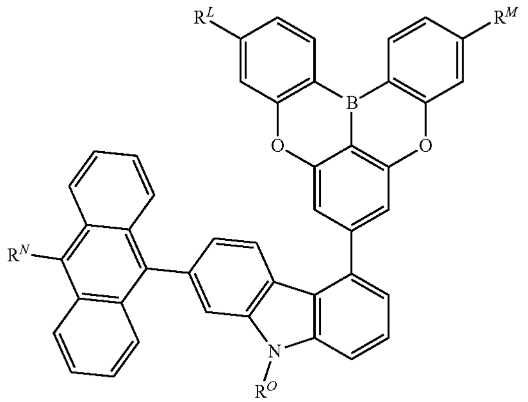 |

-continued
| Compound | Structure of compound |
| --- | --- |
| Compound 8-(RL)(RM)(RN)(RO), wherein Compound 8-(R1)(R1)(R1)(R1) to Compound 8-(R141)(R141)(R141)(R141), have the structure | 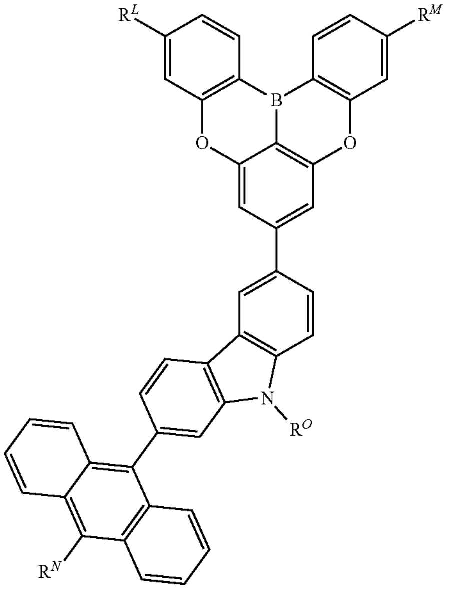 |
| Compound 9-(RL)(RM)(RN)(RO), wherein Compound 9-(R1)(R1)(R1)(R1) to Compound 9-(R141)(R141)(R141)(R141), have the structure | 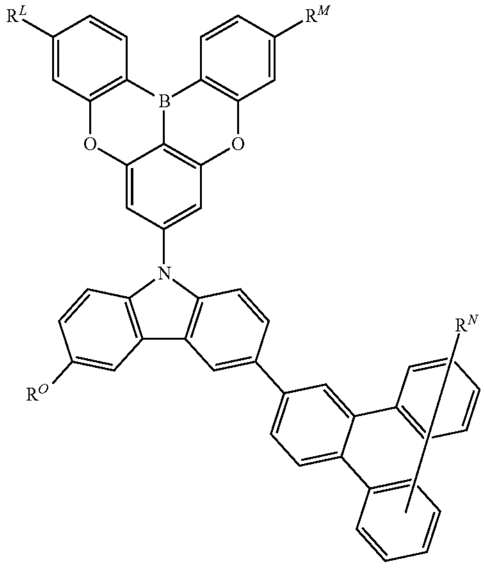 |

-continued
| Compound | Structure of compound |
|---|---|
| Compound 10-(RL)(RM)(RN)(RO), wherein Compound 10-(R1)(R1)(R1)(R1) to Compound 10-(R141)(R141)(R141)(R141), have the structure | 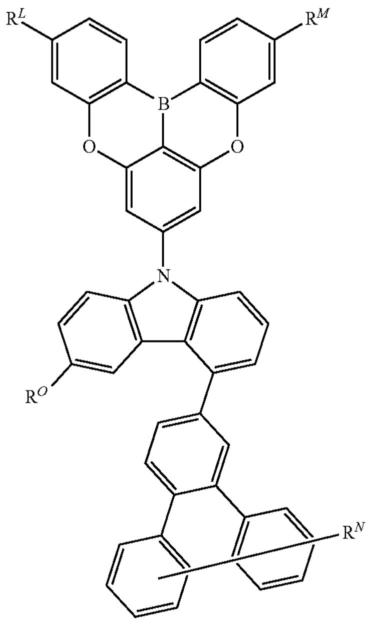 |
| Compound 11-(RL)(RM)(RN)(RO), wherein Compound 11-(R1)(R1)(R1)(R1) to Compound 11-(R141)(R141)(R141)(R141), have the structure | 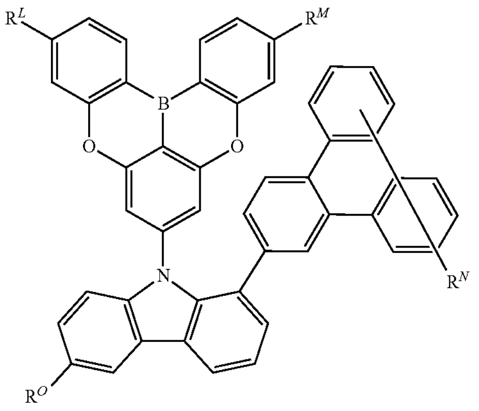 |
| Compound 12-(RL)(RM)(RN)(RO), wherein Compound 12-(R1)(R1)(R1)(R1) to Compound 12-(R141)(R141)(R141)(R141), have the structure | 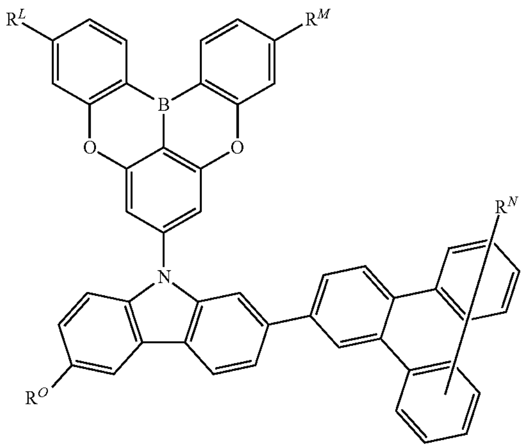 |

-continued
| Compound | Structure of compound |
| --- | --- |
| Compound 13-(RL)(RM)(RN)(RO), wherein Compound 13-(R1)(R1)(R1)(R1) to Compound 13-(R141)(R141)(R141)(R141), have the structure | 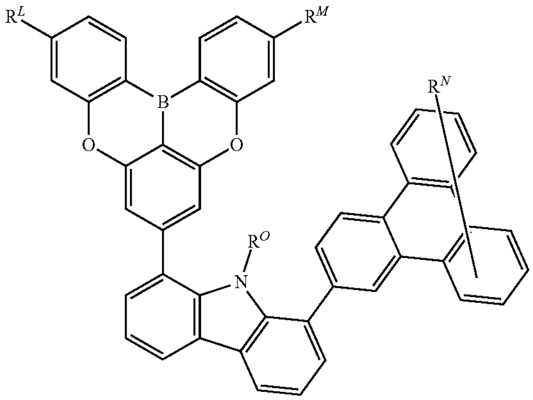 |
| Compound 14-(RL)(RM)(RN)(RO), wherein Compound 14-(R1)(R1)(R1)(R1) to Compound 14-(R141)(R141)(R141)(R141), have the structure | 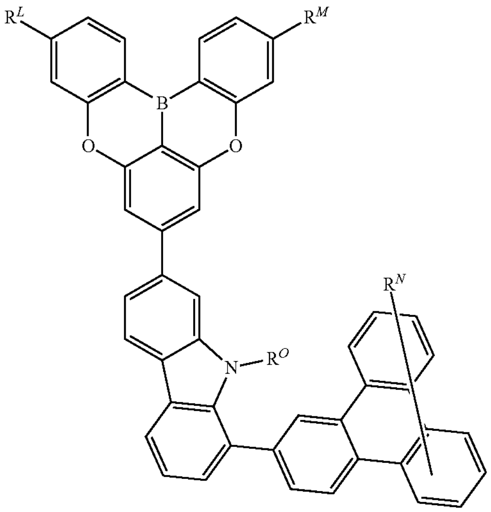 |
| Compound 15-(RL)(RM)(RN)(RO), wherein Compound 15-(R1)(R1)(R1)(R1) to Compound 15-(R141)(R141)(R141)(R141), have the structure | 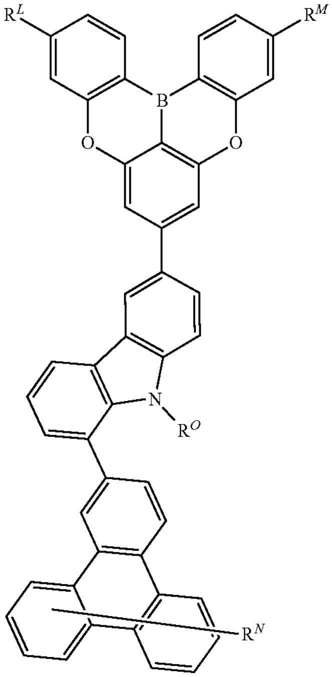 |

-continued
| Compound | Structure of compound |
| --- | --- |
| Compound 16-(RL)(RM)(RN)(RO), wherein Compound 16-(R1)(R1)(R1)(R1) to Compound 16-(R141)(R141)(R141)(R141), have the structure | 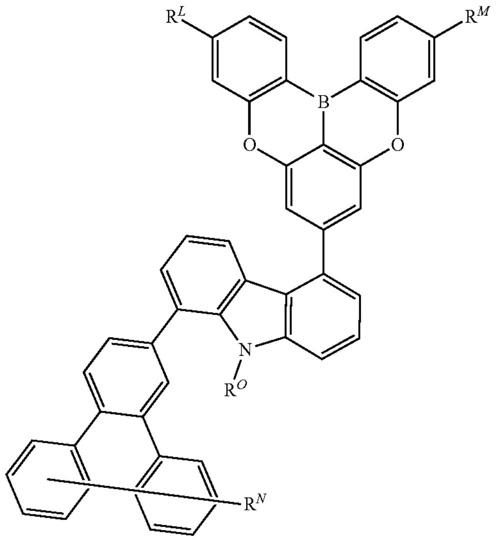 |
| Compound 17-(RL)(RM)(RN)(RO), wherein Compound 17-(R1)(R1)(R1)(R1) to Compound 17-(R141)(R141)(R141)(R141), have the structure | 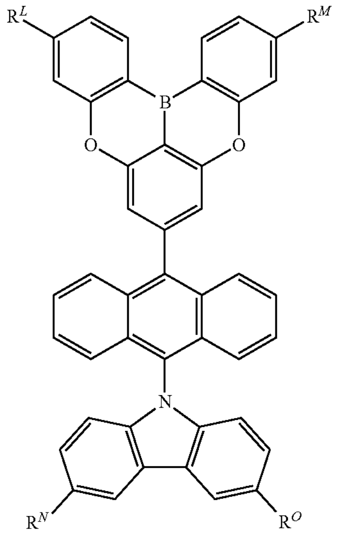 |
| Compound 18-(RL)(RM)(RN)(RO), wherein Compound 18-(R1)(R1)(R1)(R1) to Compound 18-(R141)(R141)(R141)(R141), have the structure | 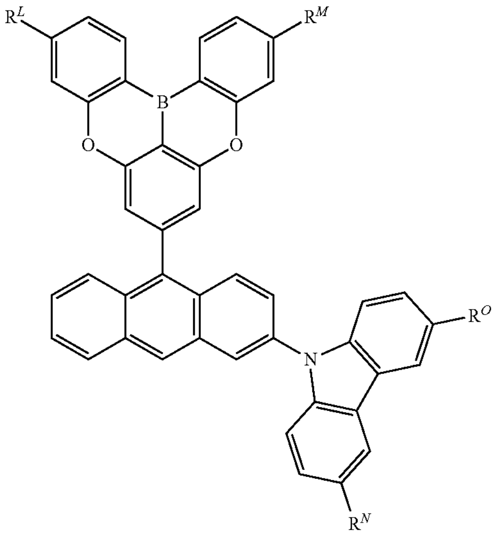 |

-continued
| Compound | Structure of compound |
|---|---|
| Compound 19-(RL)(RM)(RN)(RO), wherein Compound 19-(R1)(R1)(R1)(R1) to Compound 19-(R141)(R141)(R141)(R141), have the structure | 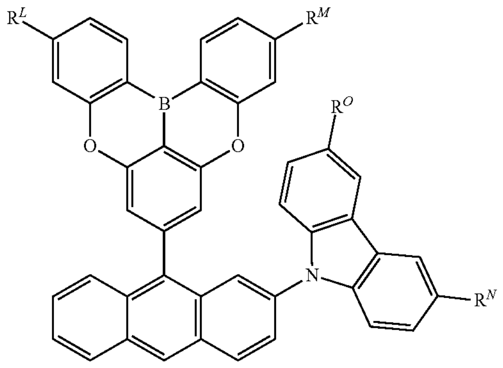 |
| Compound 20-(RL)(RM)(RN)(RO), wherein Compound 20-(R1)(R1)(R1)(R1) to Compound 20-(R141)(R141)(R141)(R141), have the structure | 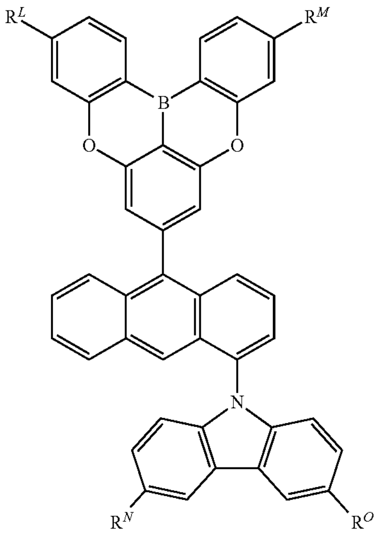 |
| Compound 21-(RL)(RM)(RN)(RO), wherein Compound 21-(R1)(R1)(R1)(R1) to Compound 21-(R141)(R141)(R141)(R141), have the structure | 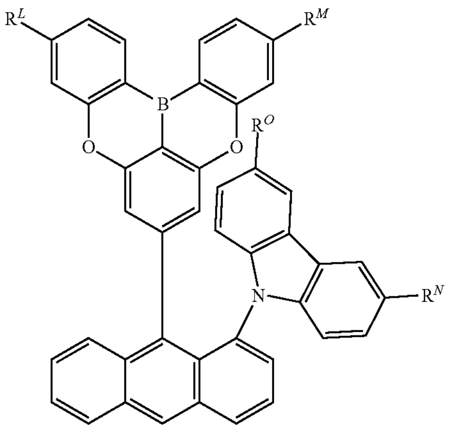 |

-continued
| Compound | Structure of compound |
| --- | --- |
| Compound 22-(RL)(RM)(RN)(RO), wherein Compound 22-(R1)(R1)(R1)(R1) to Compound 22-(R141)(R141)(R141)(R141), have the structure | 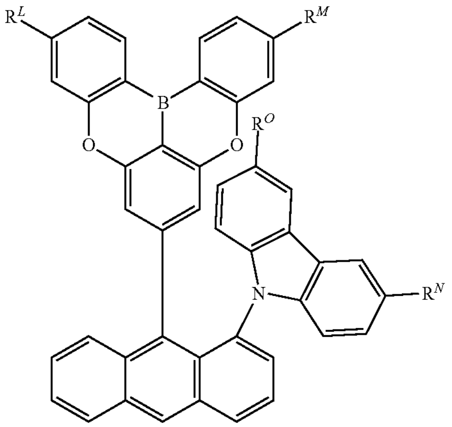 |
| Compound 23-(RL)(RM)(RN)(RO), wherein Compound 23-(R1)(R1)(R1)(R1) to Compound 23-(R141)(R141)(R141)(R141), have the structure | 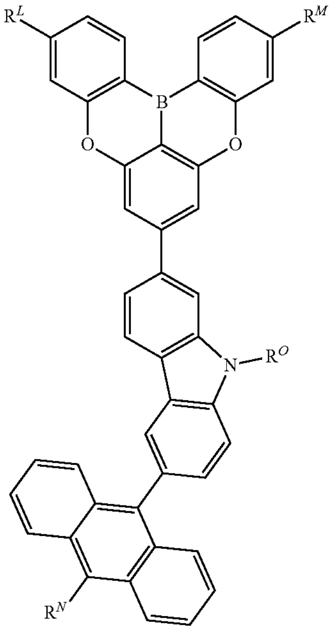 |
| Compound 24-(RL)(RM)(RN)(RO), wherein Compound 24-(R1)(R1)(R1)(R1) to Compound 24-(R141)(R141)(R141)(R141), have the structure | 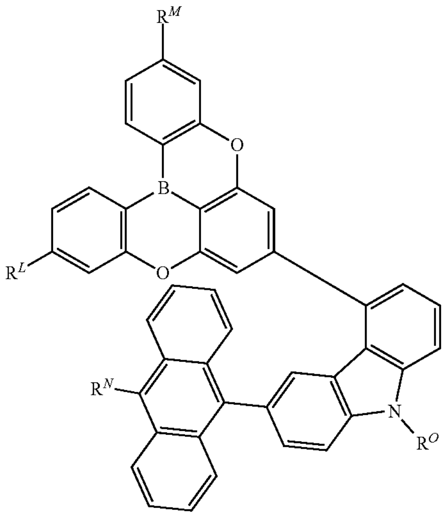 |

-continued
| Compound | Structure of compound |
|---|---|
| Compound 25-(RL)(RM)(RN)(RO), wherein Compound 25-(R1)(R1)(R1)(R1) to Compound 25-(R141)(R141)(R141)(R141), have the structure | 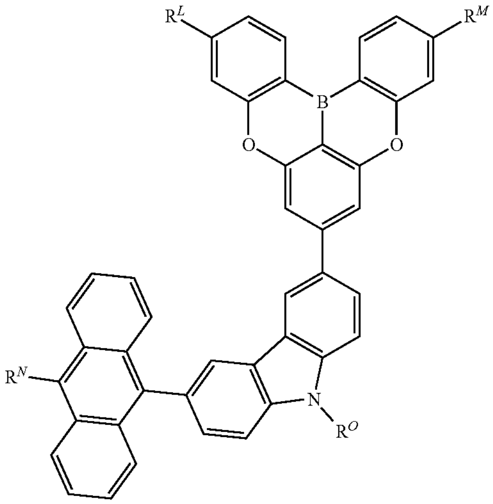 |
| Compound 26-(RL)(RM)(RN)(RO), wherein Compound 26-(R1)(R1)(R1)(R1) to Compound 26-(R141)(R141)(R141)(R141), have the structure | 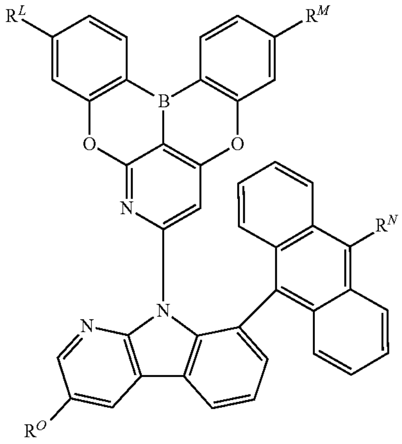 |
| Compound 27-(RL)(RM)(RN)(RO), wherein Compound 27-(R1)(R1)(R1)(R1) to Compound 27-(R141)(R141)(R141)(R141), have the structure | 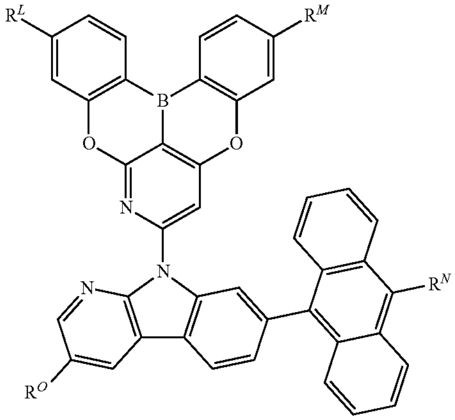 |

-continued
| Compound | Structure of compound |
| --- | --- |
| Compound 28-(RL)(RM)(RN)(RO), wherein Compound 28-(R1)(R1)(R1)(R1) to Compound 28-(R141)(R141)(R141)(R141), have the structure | 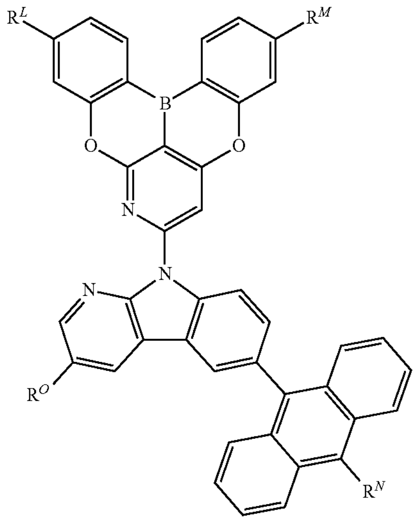 |
| Compound 29-(RL)(RM)(RN)(RO), wherein Compound 29-(R1)(R1)(R1)(R1) to Compound 29-(R141)(R141)(R141)(R141), have the structure | 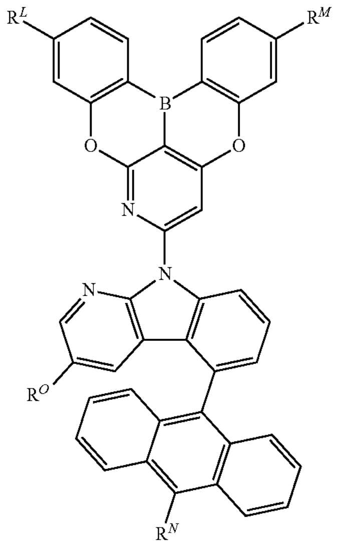 |
| Compound 30-(RL)(RM)(RN)(RO), wherein Compound 30-(R1)(R1)(R1)(R1) to Compound 30-(R141)(R141)(R141)(R141), have the structure | 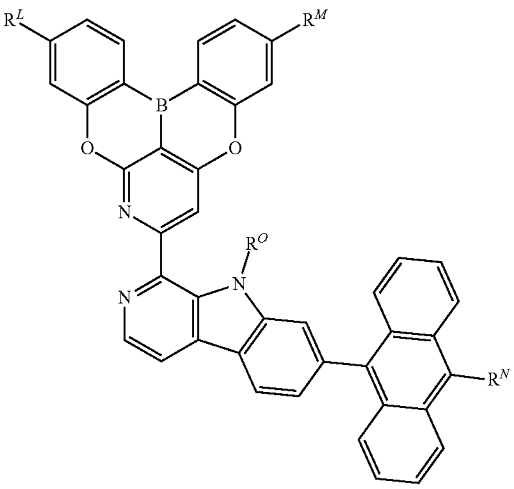 |

-continued
| Compound | Structure of compound |
|---|---|
| Compound 31-(RL)(RM)(RN)(RO), wherein Compound 31-(R1)(R1)(R1)(R1) to Compound 31-(R141)(R141)(R141)(R141), have the structure | 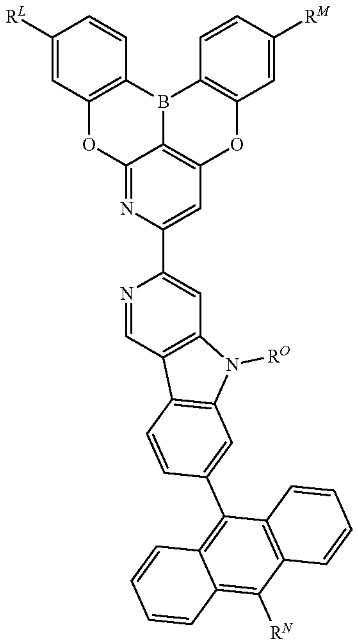 |
| Compound 32-(RL)(RM)(RN)(RO), wherein Compound 32-(R1)(R1)(R1)(R1) to Compound 32-(R141)(R141)(R141)(R141), have the structure | 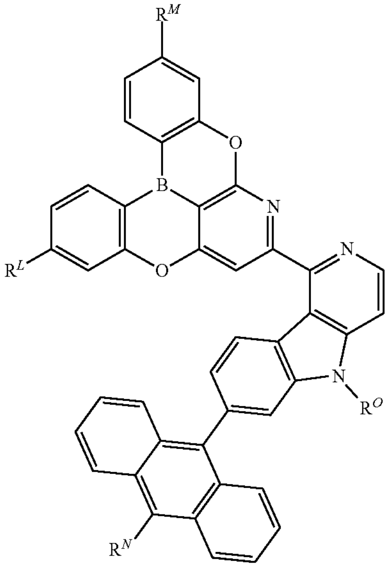 |

-continued
| Compound | Structure of compound |
| --- | --- |
| Compound 33-(RL)(RM)(RN)(RO), wherein Compound 33-(R1)(R1)(R1)(R1) to Compound 33-(R141)(R141)(R141)(R141), have the structure | 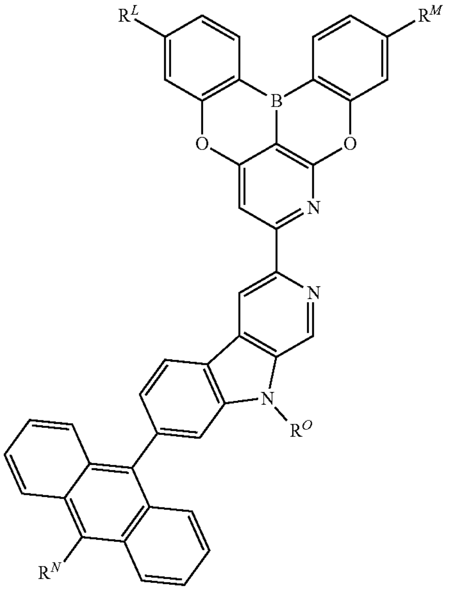 |
| Compound 34-(RL)(RM)(RN)(RO), wherein Compound 34-(R1)(R1)(R1)(R1) to Compound 34-(R141)(R141)(R141)(R141), have the structure | 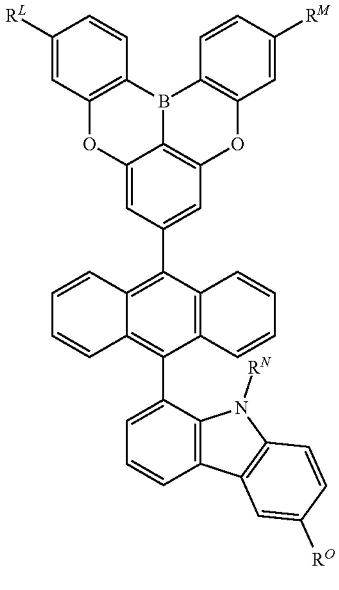 |

-continued
| Compound | Structure of compound |
|---|---|
| Compound 35-(RL)(RM)(RN)(RO), wherein Compound 35-(R1)(R1)(R1)(R1) to Compound 35-(R141)(R141)(R141)(R141), have the structure | 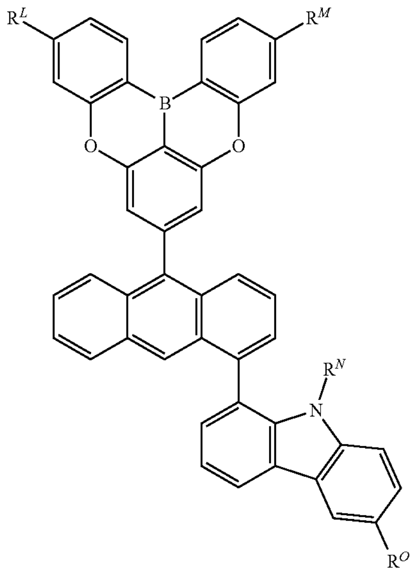 |
| Compound 36-(RL)(RM)(RN)(RO), wherein Compound 36-(R1)(R1)(R1)(R1) to Compound 36-(R141)(R141)(R141)(R141), have the structure | 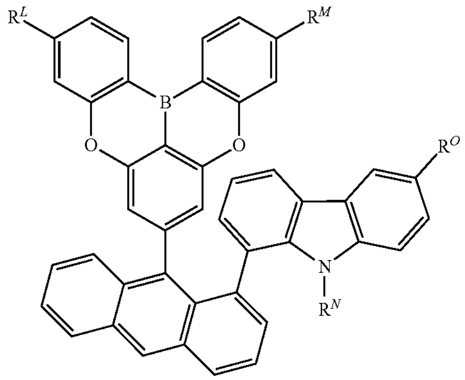 |
| Compound 37-(RL)(RM)(RN)(RO), wherein Compound 37-(R1)(R1)(R1)(R1) to Compound 37-(R141)(R141)(R141)(R141), have the structure | 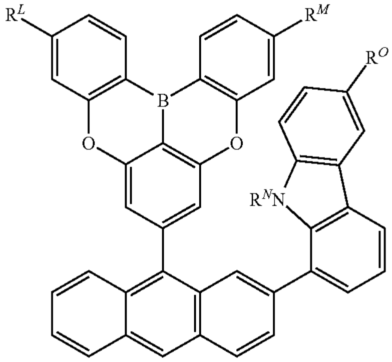 |

-continued
| Compound | Structure of compound |
| --- | --- |
| Compound 38-(RL)(RM)(RN)(RO), wherein Compound 38-(R1)(R1)(R1)(R1) to Compound 38-(R141)(R141)(R141)(R141), have the structure | 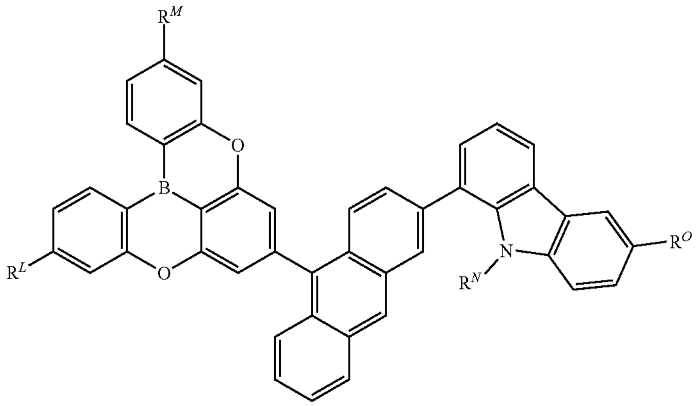 |
| Compound 39-(RL)(RM)(RN)(RO), wherein Compound 39-(R1)(R1)(R1)(R1) to Compound 39-(R141)(R141)(R141)(R141), have the structure | 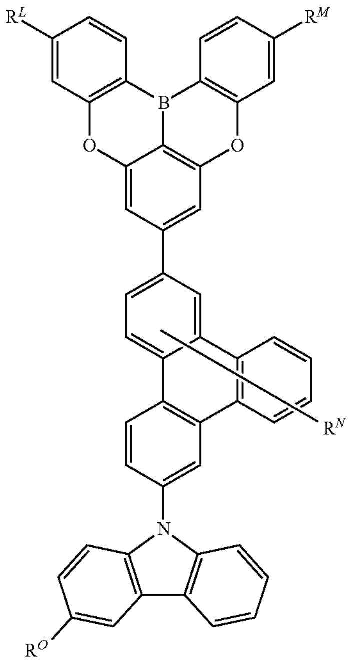 |

-continued
| Compound | Structure of compound |
| --- | --- |
| Compound 40-(RL)(RM)(RN)(RO), wherein Compound 40-(R1)(R1)(R1)(R1) to Compound 40-(R141)(R141)(R141)(R141), have the structure | 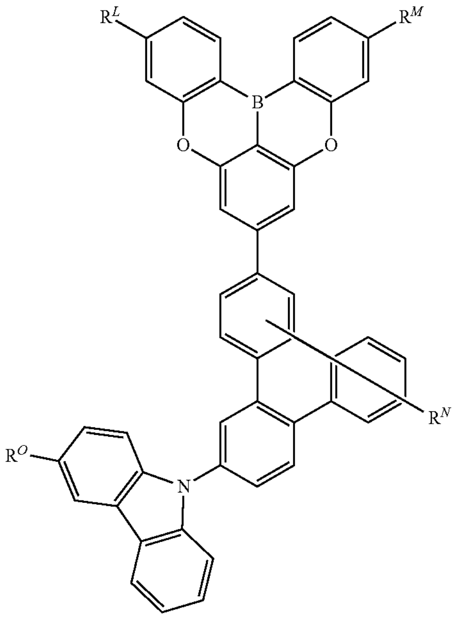 |
| Compound 41-(RL)(RM)(RN)(RO), wherein Compound 41-(R1)(R1)(R1)(R1) to Compound 41-(R141)(R141)(R141)(R141), have the structure | 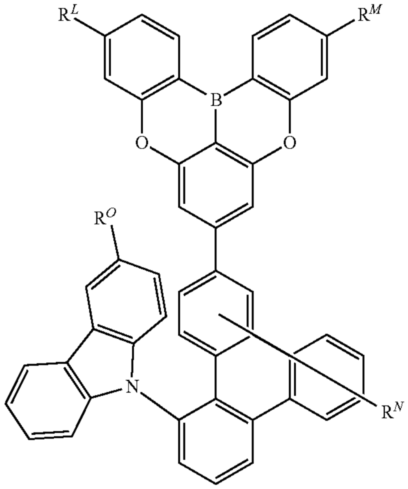 |

-continued
| Compound | Structure of compound |
| --- | --- |
| Compound 42-(RL)(RM)(RN)(RO), wherein Compound 42-(R1)(R1)(R1)(R1) to Compound 42-(R141)(R141)(R141)(R141), have the structure | 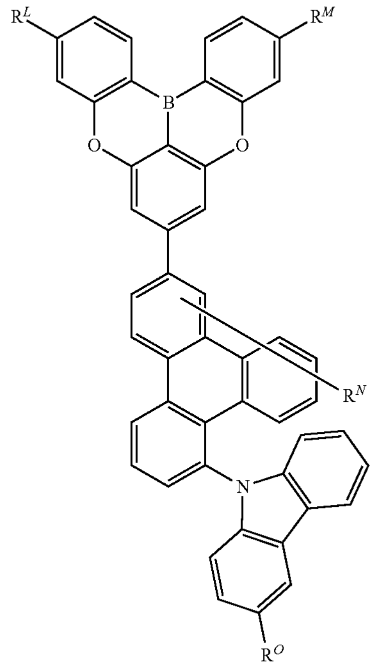 |
| Compound 43-(RL)(RM)(RN)(RO), wherein Compound 43-(R1)(R1)(R1)(R1) to Compound 43-(R141)(R141)(R141)(R141), have the structure | 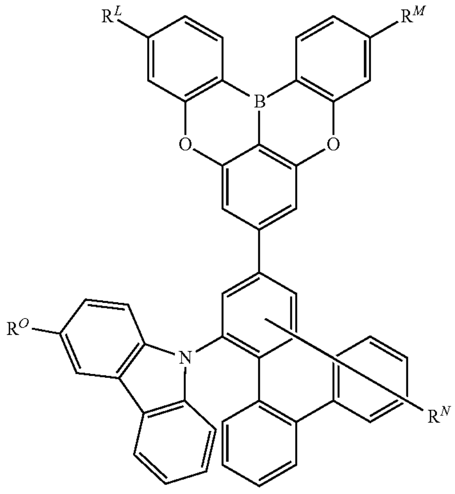 |

-continued
| Compound | Structure of compound |
| --- | --- |
| Compound 44-(RL)(RM)(RN)(RO), wherein Compound 44-(R1)(R1)(R1)(R1) to Compound 44-(R141)(R141)(R141)(R141), have the structure | 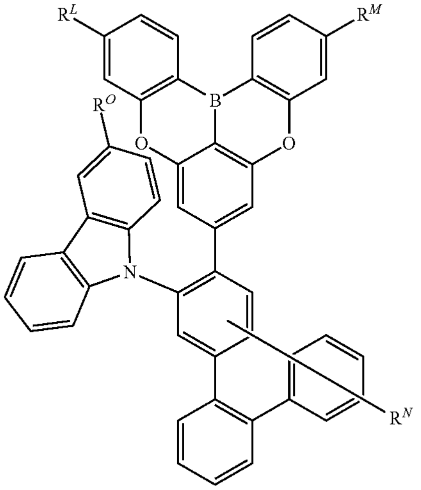 |
| Compound 45-(RL)(RM)(RN)(RO), wherein Compound 45-(R1)(R1)(R1)(R1) to Compound 45-(R141)(R141)(R141)(R141), have the structure | 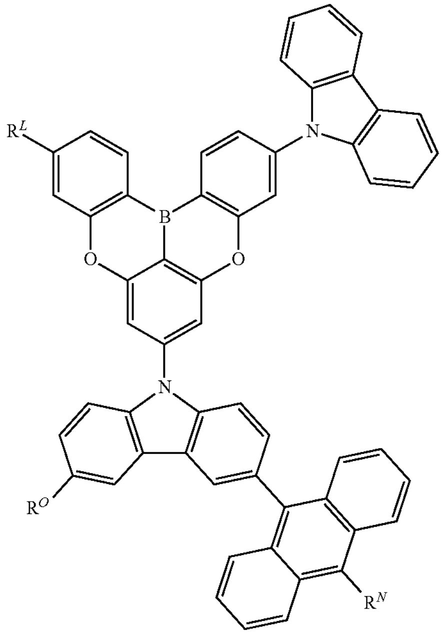 |

-continued
| Compound | Structure of compound |
|---|---|
| Compound 46-(RL)(RM)(RN)(RO), wherein Compound 46-(R1)(R1)(R1)(R1) to Compound 46-(R141)(R141)(R141)(R141), have the structure | 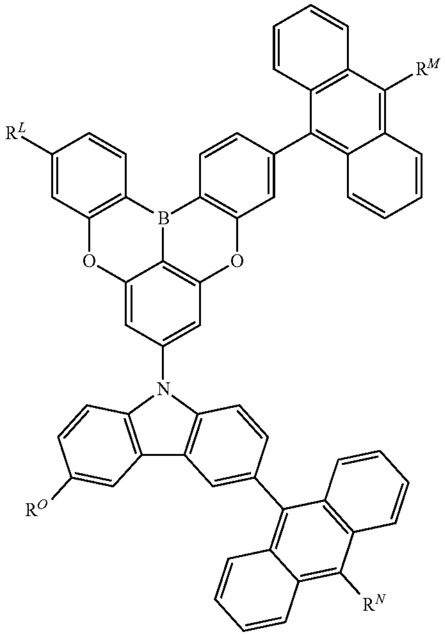 |
| Compound 47-(RL)(RM)(RN)(RO), wherein Compound 47-(R1)(R1)(R1)(R1) to Compound 47-(R141)(R141)(R141)(R141), have the structure | 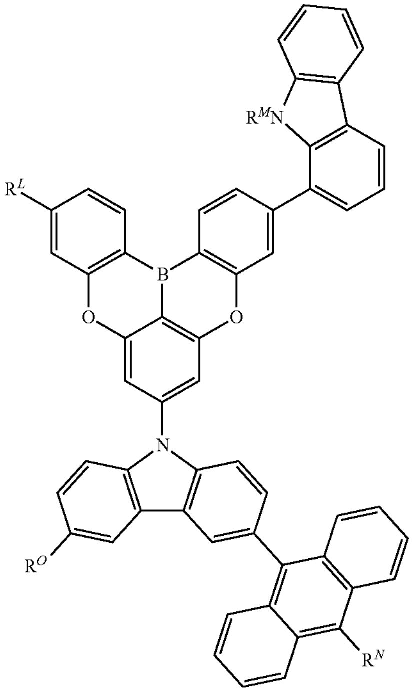 |

-continued
| Compound | Structure of compound |
|---|---|
| Compound 48-(RL)(RM)(RN)(RO), wherein Compound 48-(R1)(R1)(R1)(R1) to Compound 48-(R141)(R141)(R141)(R141), have the structure | 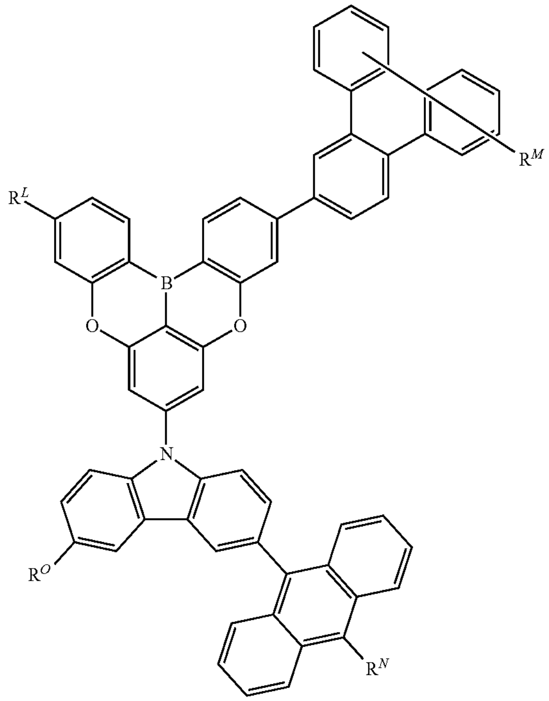 |
| Compound 49-(RL)(RM)(RN)(RO), wherein Compound 49-(R1)(R1)(R1)(R1) to Compound 49-(R141)(R141)(R141)(R141), have the structure | 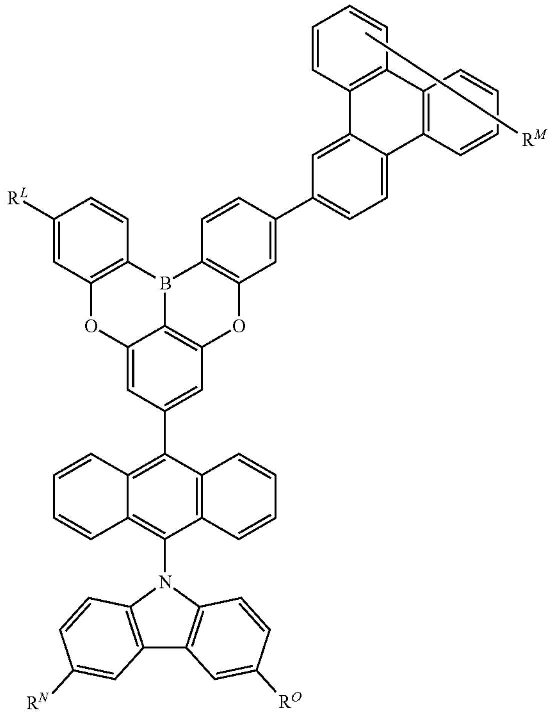 |

-continued
| Compound | Structure of compound |
| --- | --- |
| Compound 50-(RL)(RM)(RN)(RO), wherein Compound 50-(R1)(R1)(R1)(R1) to Compound 50-(R141)(R141)(R141)(R141), have the structure | 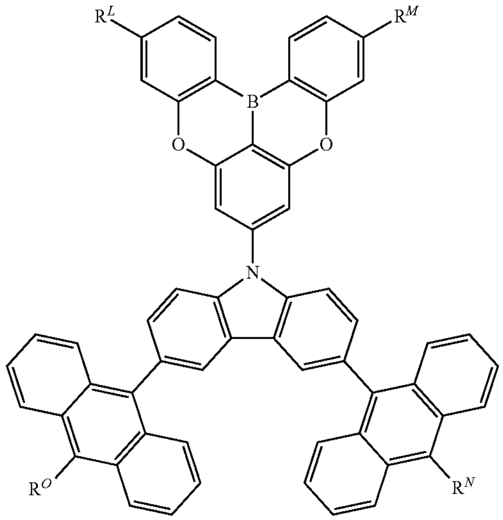 |
| Compound 51-(RL)(RM)(RN)(RO), wherein Compound 51-(R1)(R1)(R1)(R1) to Compound 51-(R141)(R141)(R141)(R141), have the structure | 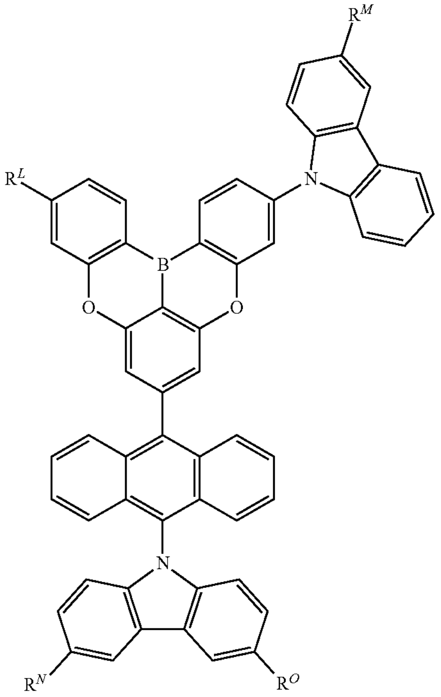 |

-continued
| Compound | Structure of compound |
|---|---|
| Compound 52-(RL)(RM)(RN)(RO), wherein Compound 52-(R1)(R1)(R1)(R1) to Compound 52-(R141)(R141)(R141)(R141), have the structure | 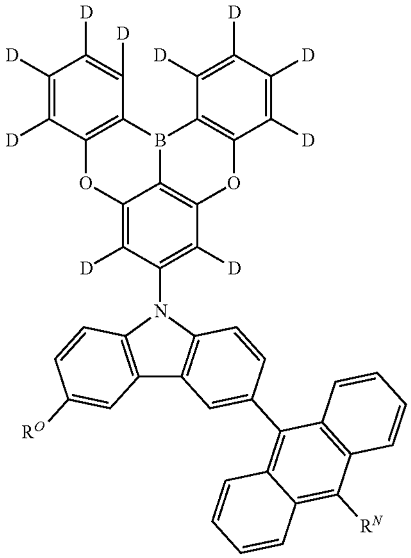 |
| Compound 53-(RL)(RM)(RN)(RO), wherein Compound 53-(R1)(R1)(R1)(R1) to Compound 53-(R141)(R141)(R141)(R141), have the structure | 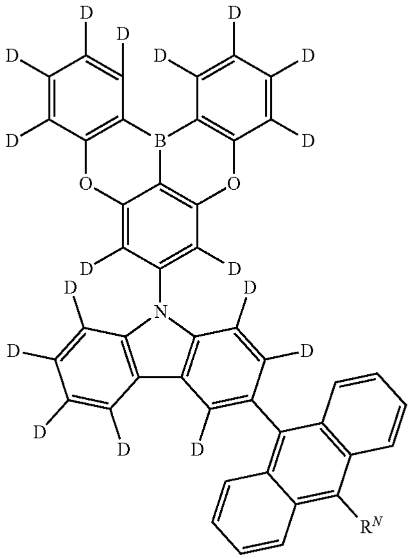 |

-continued
| Compound | Structure of compound |
| --- | --- |
| Compound 54-(RL)(RM)(RN)(RO), wherein Compound 54-(R1)(R1)(R1)(R1) to Compound 54-(R141)(R141)(R141)(R141), have the structure | 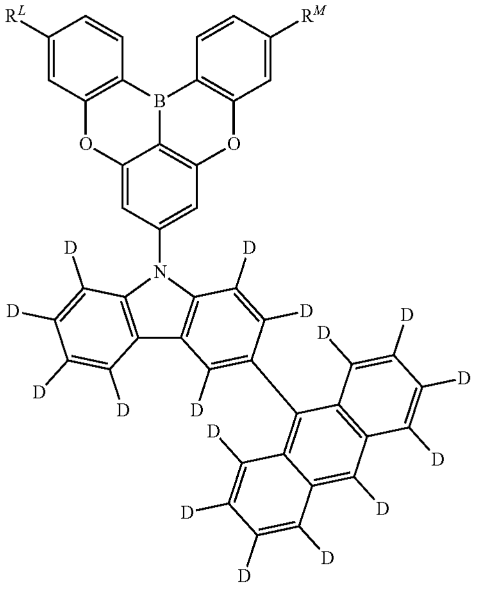 |
| Compound 55-(RL)(RM)(RN)(RO), wherein Compound 55-(R1)(R1)(R1)(R1) to Compound 55-(R141)(R141)(R141)(R141), have the structure | 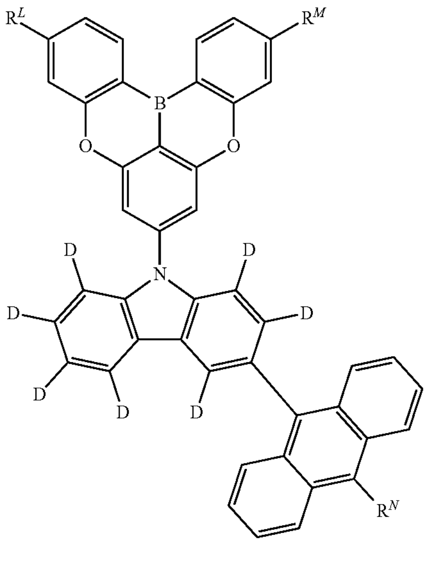 |

-continued
| Compound | Structure of compound |
|---|---|
| Compound 56-(RL)(RM)(RN)(RO), wherein Compound 56-(R1)(R1)(R1)(R1) to Compound 56-(R141)(R141)(R141)(R141), have the structure | 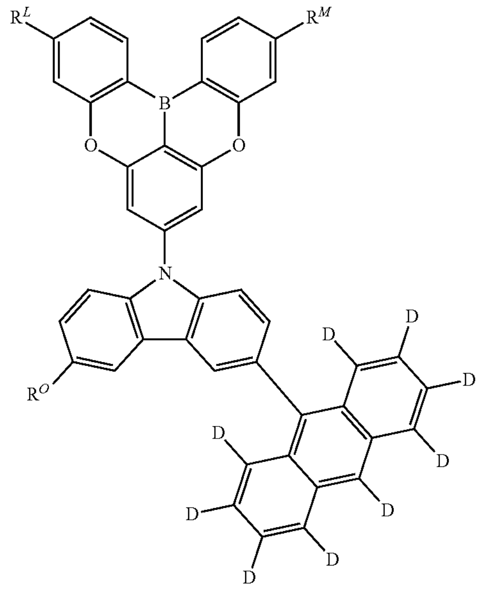 |
| Compound 57-(RL)(RM)(RN)(RO), wherein Compound 57-(R1)(R1)(R1)(R1) to Compound 57-(R141)(R141)(R141)(R141), have the structure | 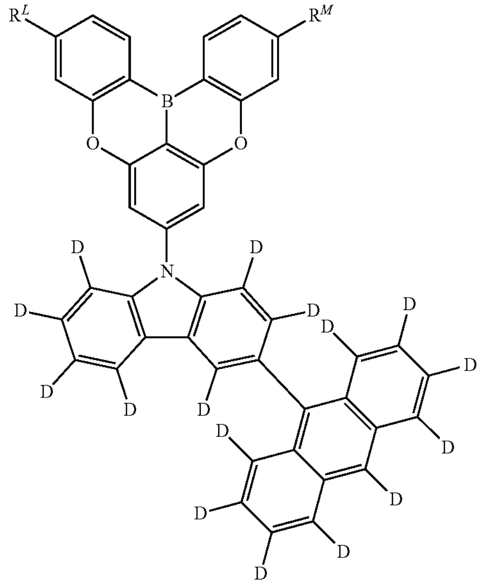 |

-continued
| Compound | Structure of compound |
| --- | --- |
| Compound 58-(RL)(RM)(RN)(RO), wherein Compound 58-(R1)(R1)(R1)(R1) to Compound 58-(R141)(R141)(R141)(R141), have the structure | 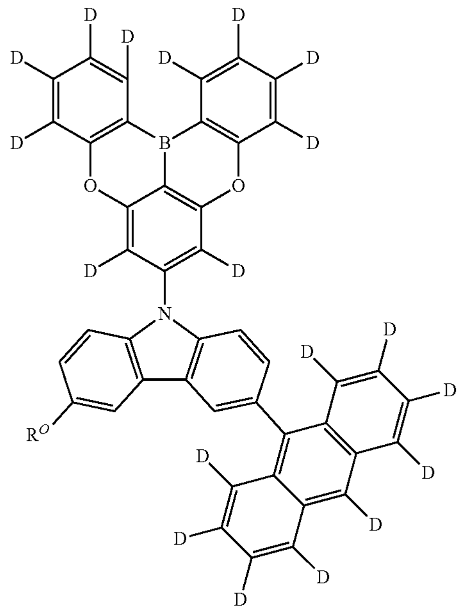 |
| Compound 59-(RL)(RM)(RN)(RO), wherein Compound 59-(R1)(R1)(R1)(R1) to Compound 59-(R141)(R141)(R141)(R141), have the structure | 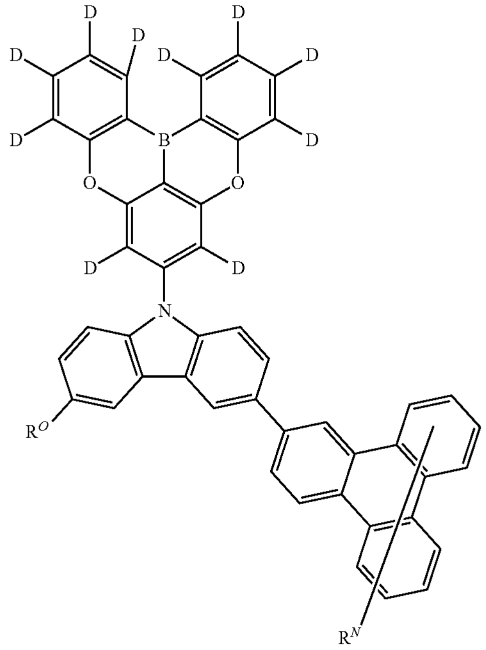 |

-continued
| Compound | Structure of compound |
| --- | --- |
| Compound 60-(RL)(RM)(RN)(RO), wherein Compound 60-(R1)(R1)(R1)(R1) to Compound 60-(R141)(R141)(R141)(R141), have the structure | 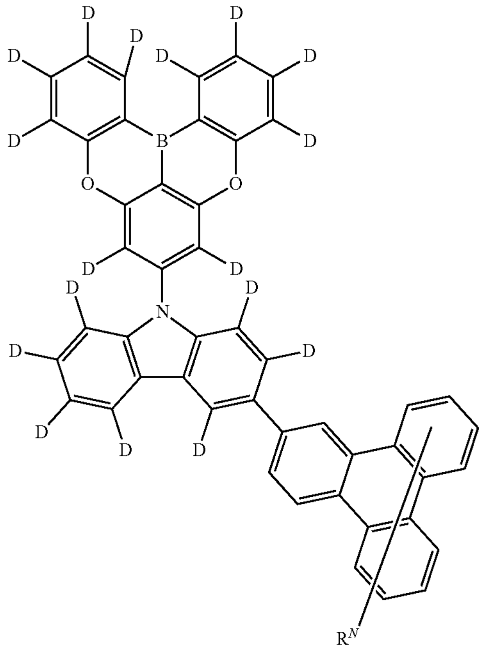 |
| Compound 61-(RL)(RM)(RN)(RO), wherein Compound 61-(R1)(R1)(R1)(R1) to Compound 61-(R141)(R141)(R141)(R141), have the structure | 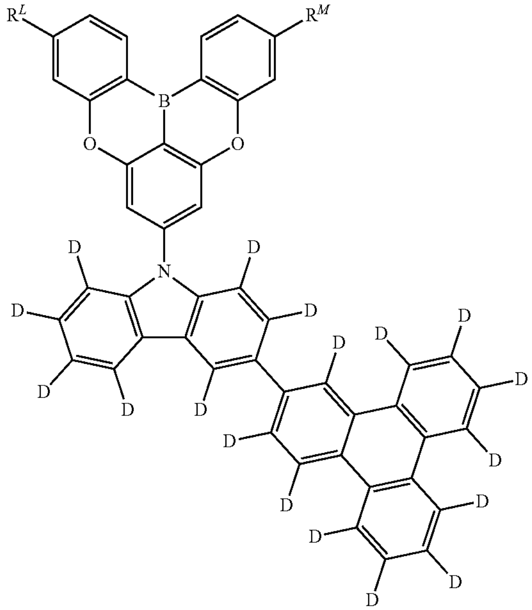 |

-continued
| Compound | Structure of compound |
|---|---|
| Compound 62-(RL)(RM)(RN)(RO), wherein Compound 62-(R1)(R1)(R1)(R1) to Compound 62-(R141)(R141)(R141)(R141), have the structure | 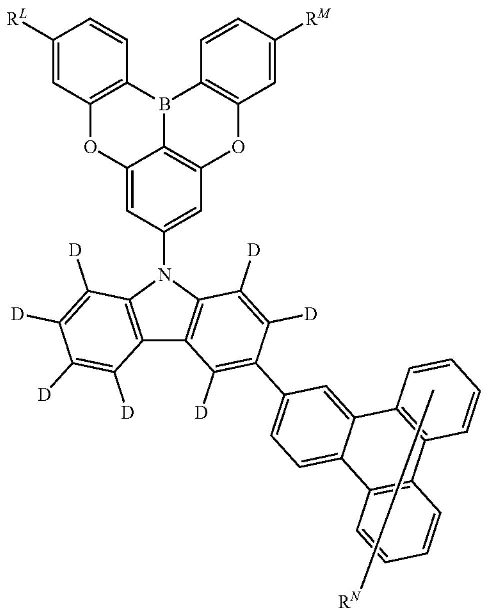 |
| Compound 63-(RL)(RM)(RN)(RO), wherein Compound 63-(R1)(R1)(R1)(R1) to Compound 63-(R141)(R141)(R141)(R141), have the structure | 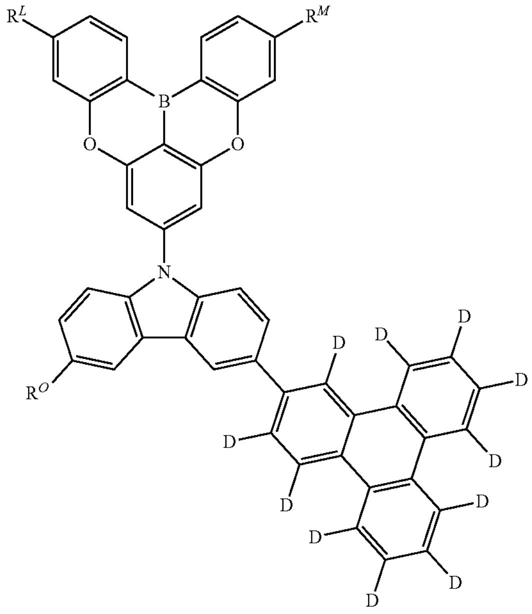 |

-continued
| Compound | Structure of compound |
| --- | --- |
| Compound 66-(RL)(RM)(RN)(RO), wherein Compound 66-(R1)(R1)(R1)(R1) to Compound 66-(R141)(R141)(R141)(R141), have the structure | 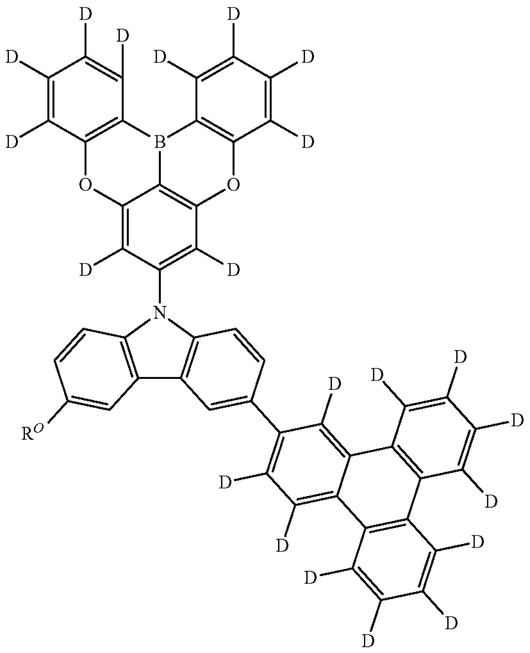 |
| Compound 65-(RL)(RM)(RN)(RO), wherein Compound 65-(R1)(R1)(R1)(R1) to Compound 65-(R141)(R141)(R141)(R141), have the structure | 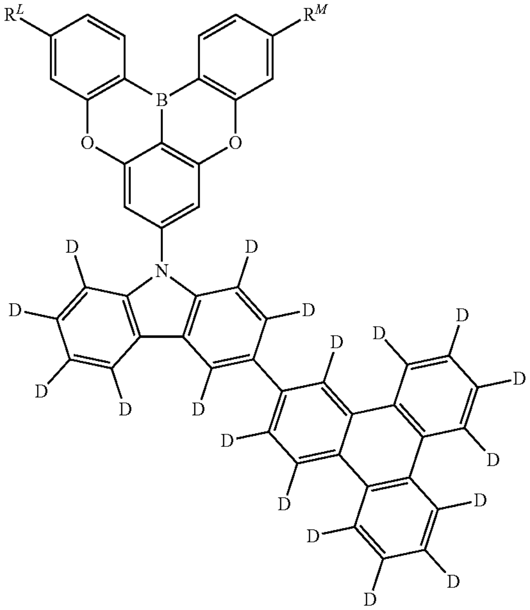 |

wherein i, j, k, and l are each independently an integer from 1 to 141, and,
wherein R1 to R141 are defined in the following LIST:
| | Structure |
|---|---|
| R1 | 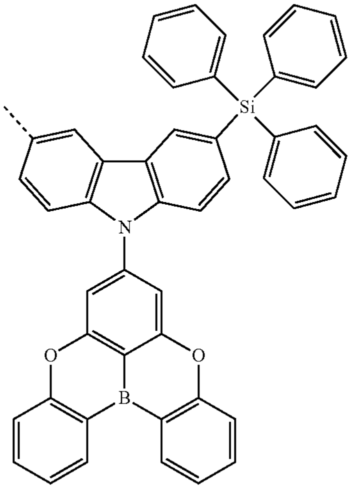 |
| R2 | 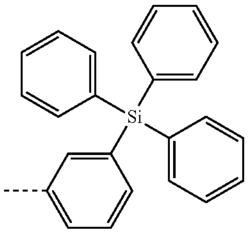 |
| R3 | 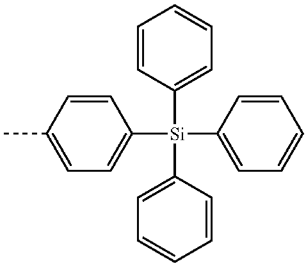 |
| R4 | 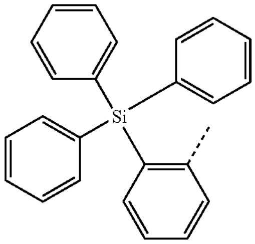 |
| R5 | 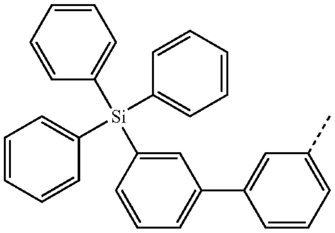 |
-continued
| | Structure |
|---|---|
| R6 | 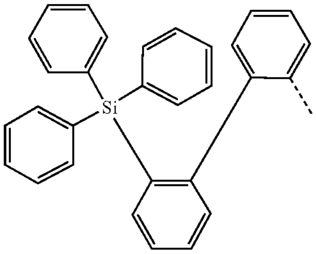 |
| R7 | 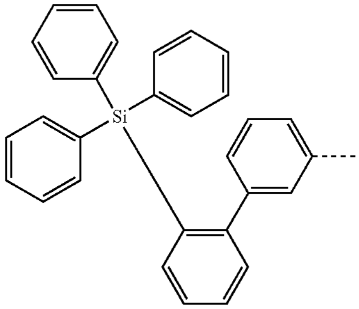 |
| R8 | 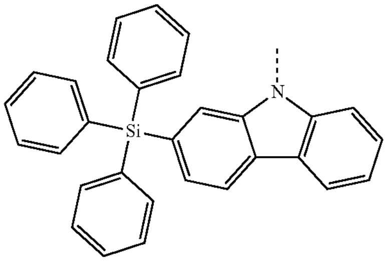 |
| R9 | 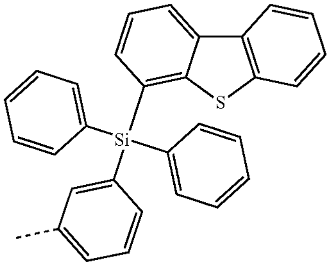 |
| R10 | 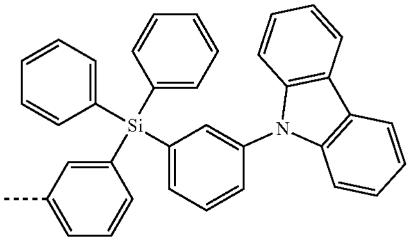 |

-continued
| Structure |
|---|
R11
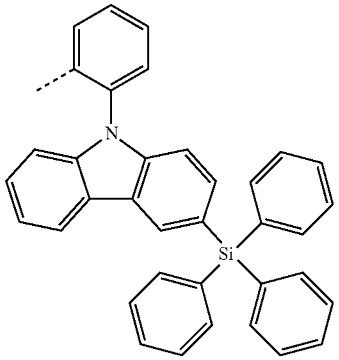
R12
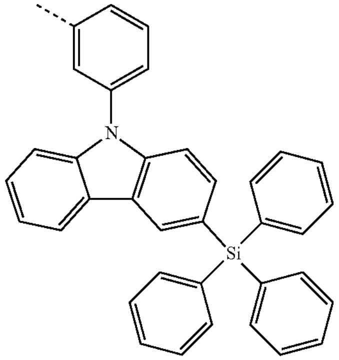
R13
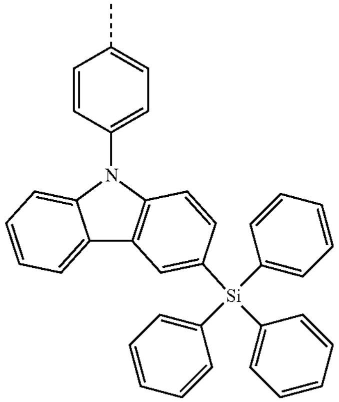
R14
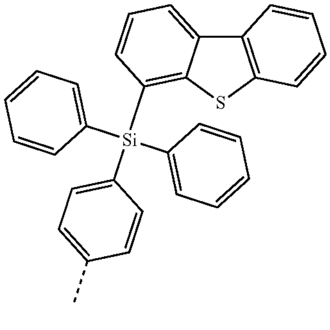
-continued
| Structure |
|---|
R15
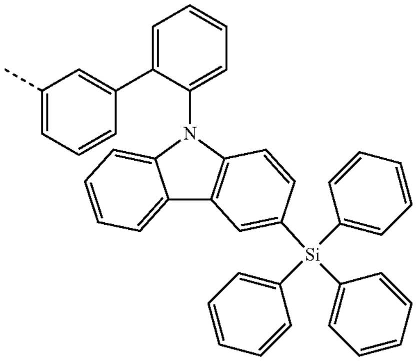
R16
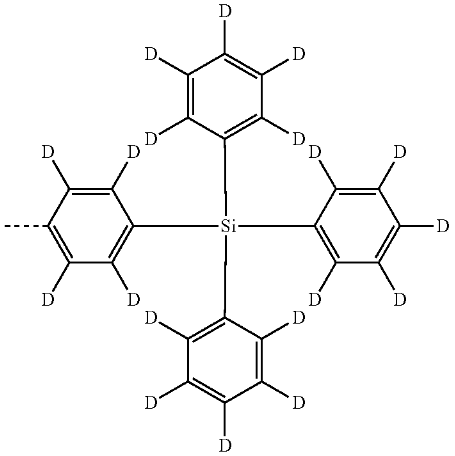
R17
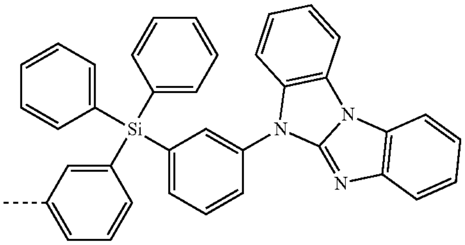
R18
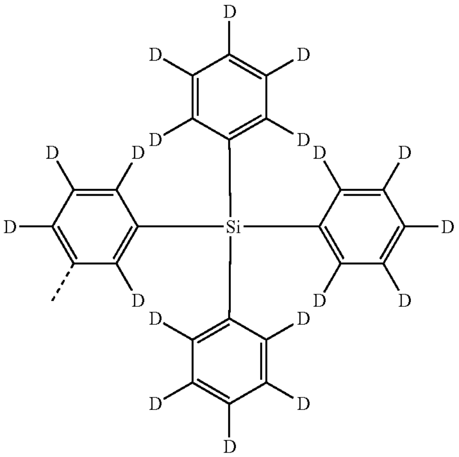

-continued
| Structure |
|---|
| R19 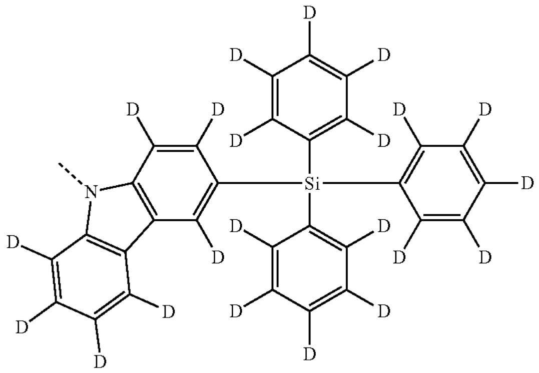 |
| R20 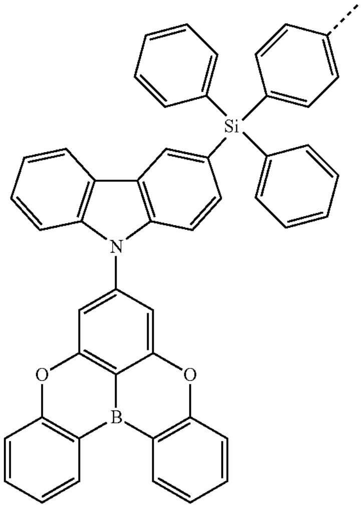 |
| R21 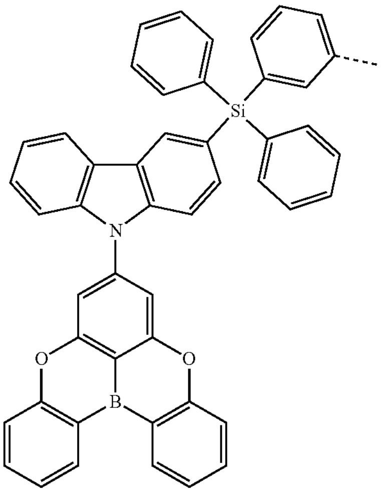 |
-continued
| Structure |
|---|
| R22 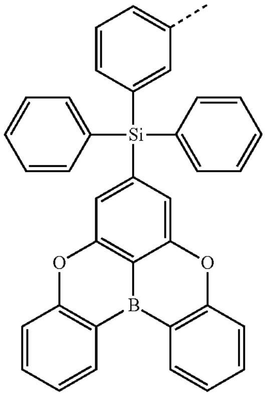 |
| R23 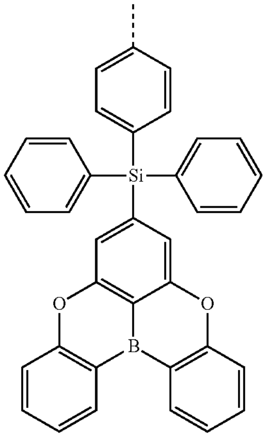 |
| R24 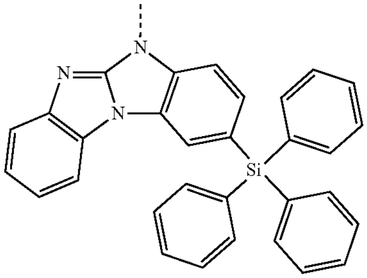 |
| R25 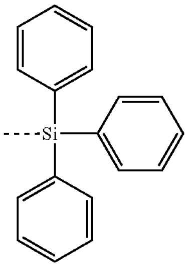 |

-continued
| | Structure |
|---|---|
| R26 | 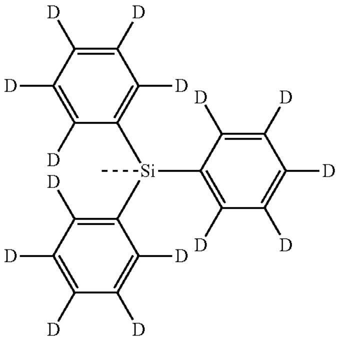 |
| R27 | 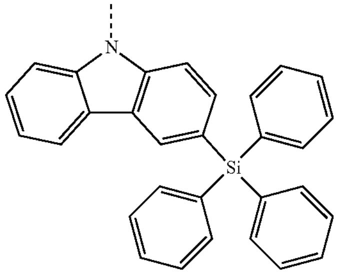 |
| R28 | 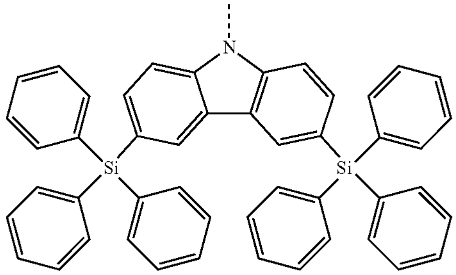 |
| R29 | 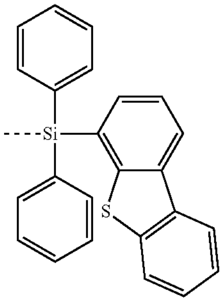 |
| R30 | 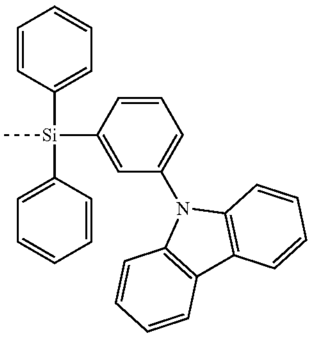 |
-continued
| | Structure |
|---|---|
| R31 | 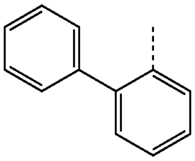 |
| R32 | 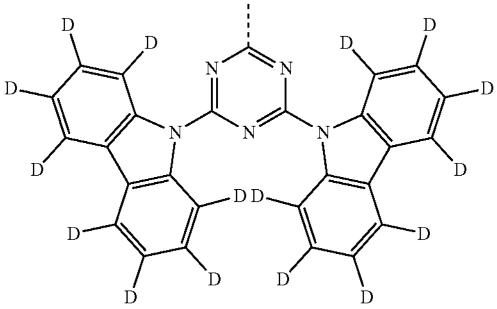 |
| R33 | 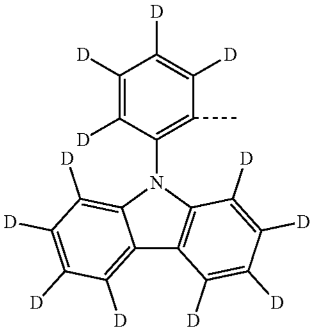 |
| R34 | 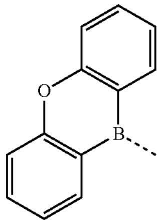 |
| R35 | 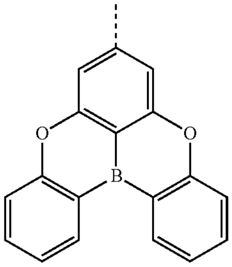 |
| R36 | 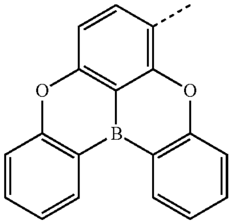 |

| Structure |
|---|
R37
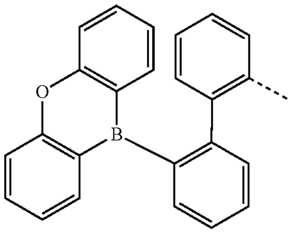
R38
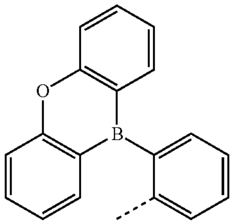
R39
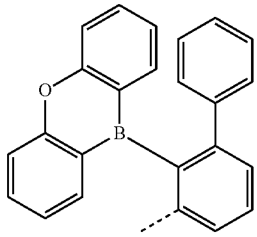
R40
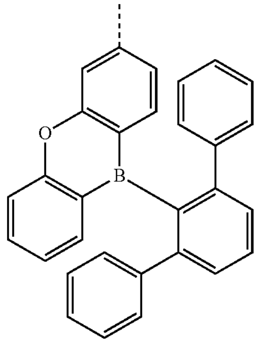
R41
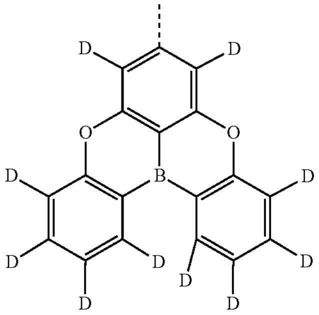
| Structure |
|---|
R42
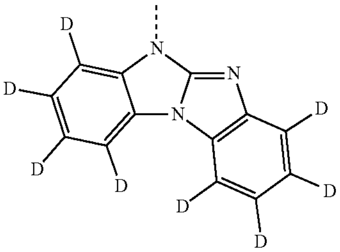
R43
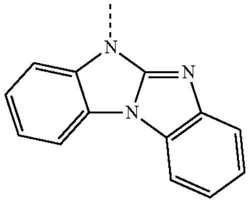
R44
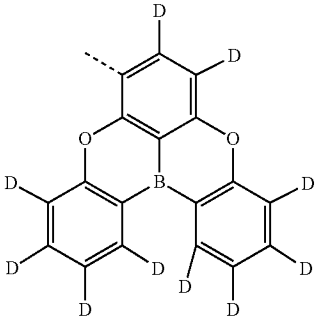
R45
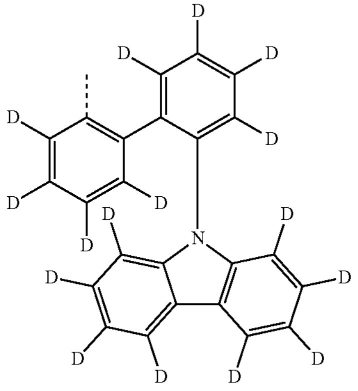
R46
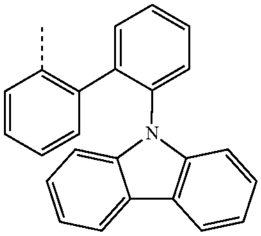

-continued
| Structure |
|---|
| R47 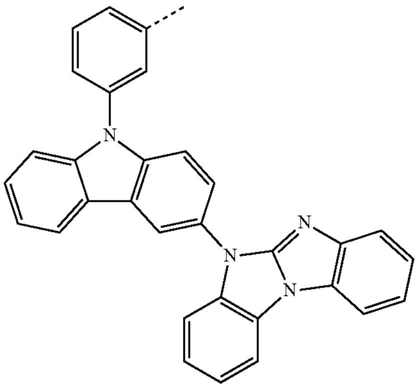 |
| R48 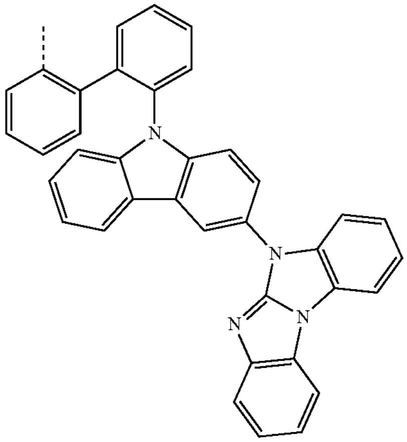 |
| R49 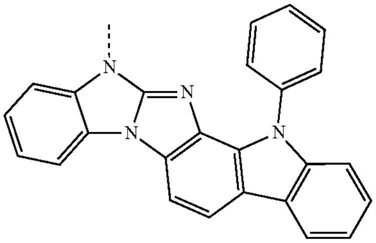 |
| R50 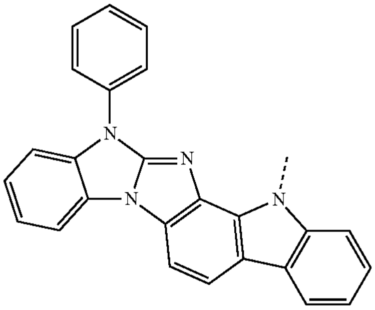 |
-continued
| Structure |
|---|
| R51 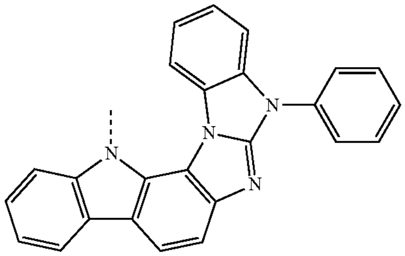 |
| R52 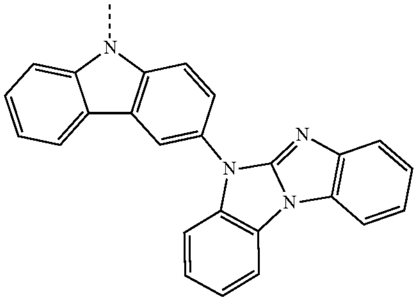 |
| R53 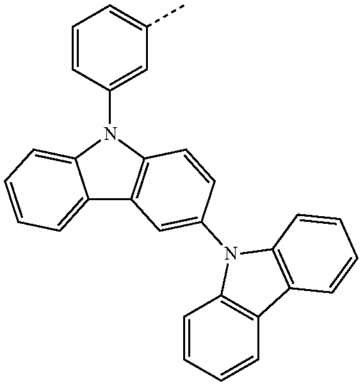 |
| R54 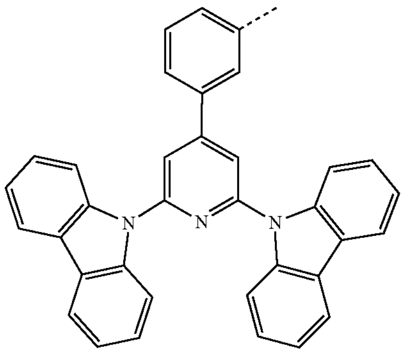 |

-continued
| Structure |
|---|
R55
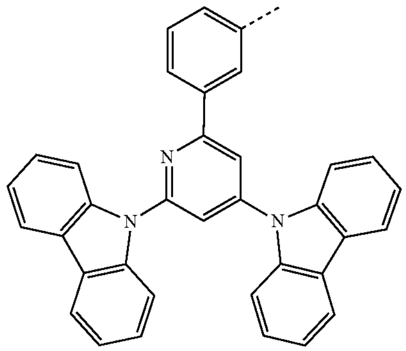
R56
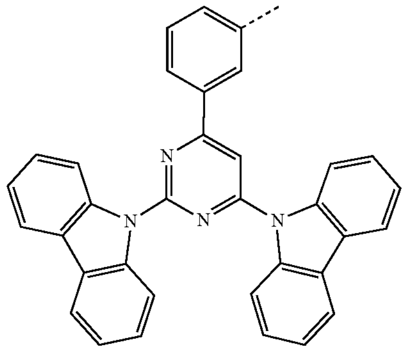
R57
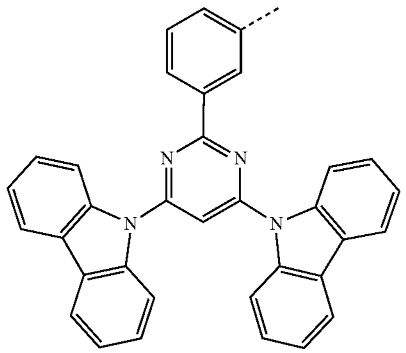
R58
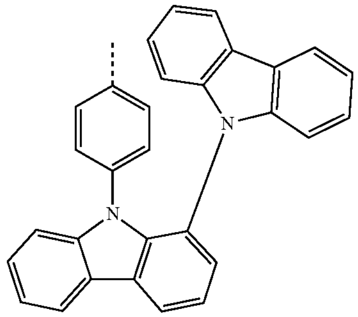
-continued
| Structure |
|---|
R59
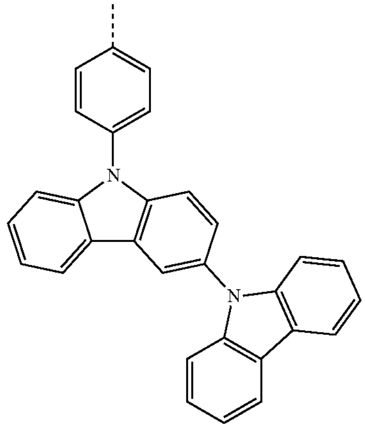
R60
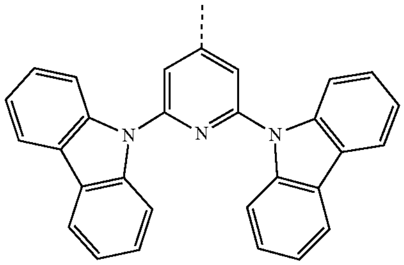
R61
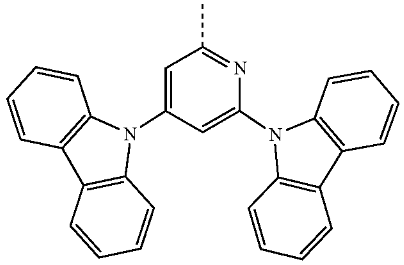
R62
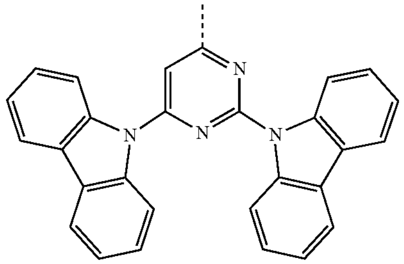
R63
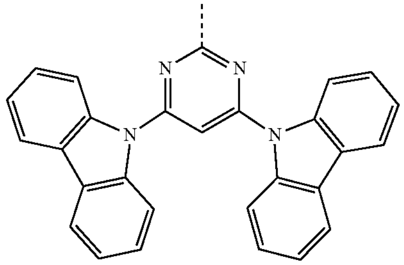

-continued
| Structure |
|---|
| R64 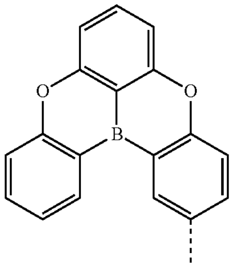 |
| R65 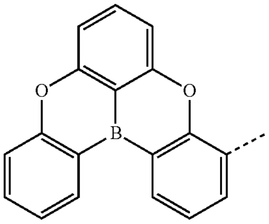 |
| R66 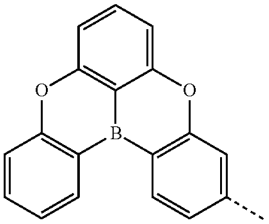 |
| R67 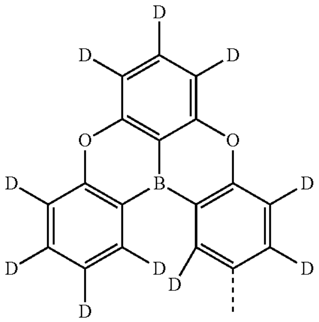 |
| R68 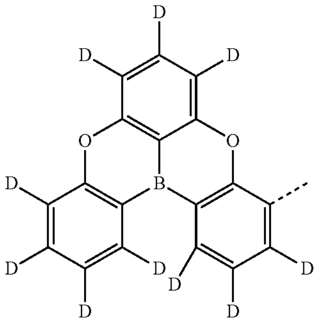 |
-continued
| Structure |
|---|
| R69 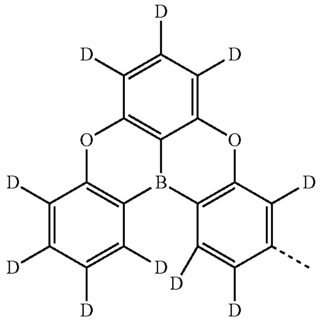 |
| R70 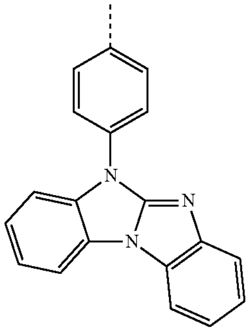 |
| R71 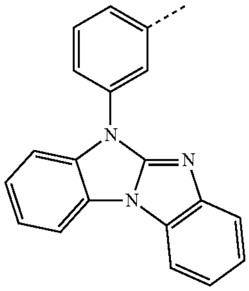 |
| R72 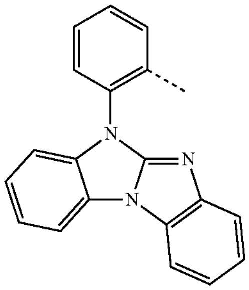 |
| R73 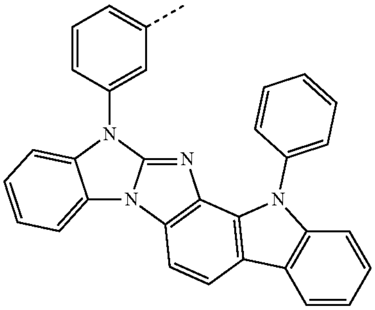 |

-continued
| Structure | |
|---|---|
| R74 | 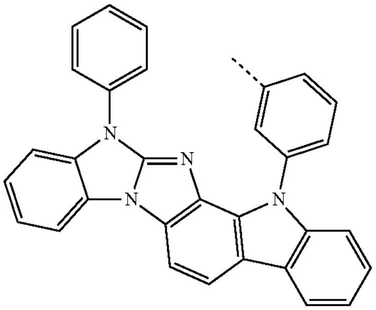 |
| R75 | 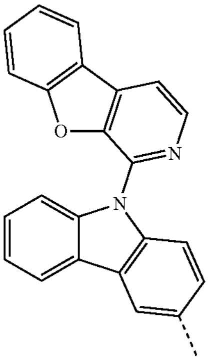 |
| R76 | 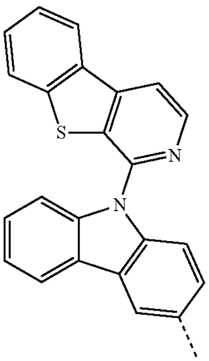 |
| R77 | 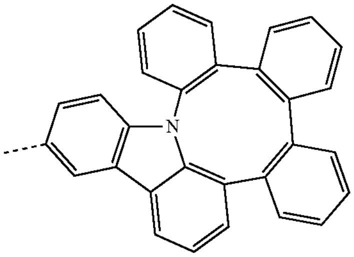 |
-continued
| Structure | |
|---|---|
| R78 | 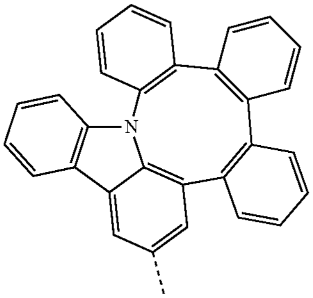 |
| R79 | 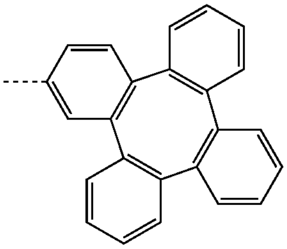 |
| R80 | 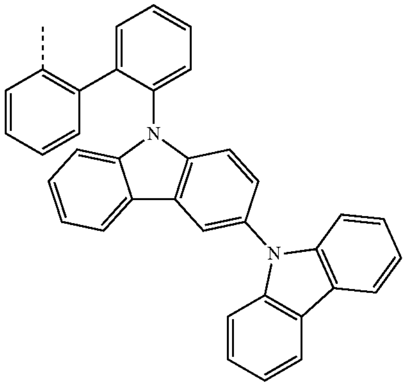 |
| R81 | 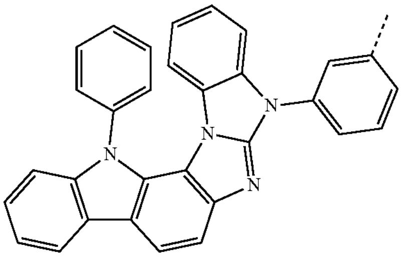 |
| R82 | 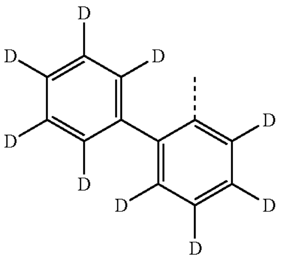 |

-continued
| Structure |
|---|
| R83 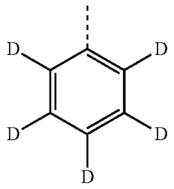 |
| R84 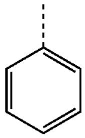 |
| R85 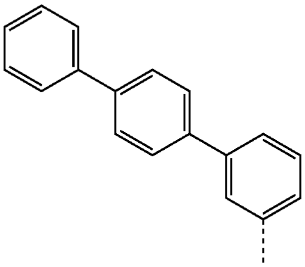 |
| R86 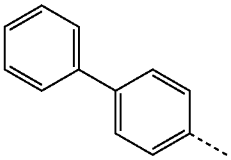 |
| R87 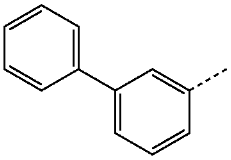 |
| R88 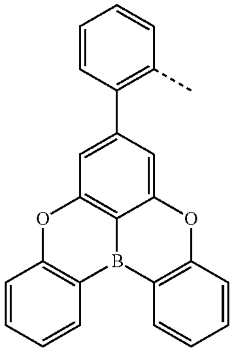 |
-continued
| Structure |
|---|
| R89 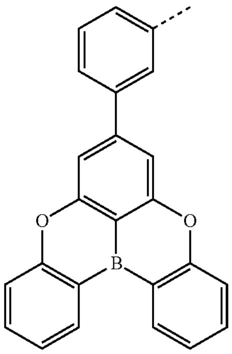 |
| R90 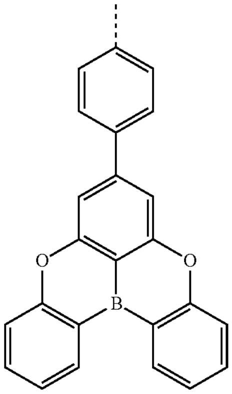 |
| R91 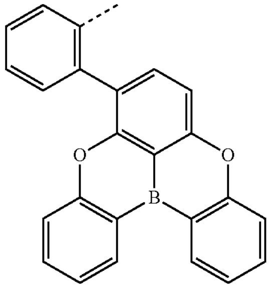 |
| R92 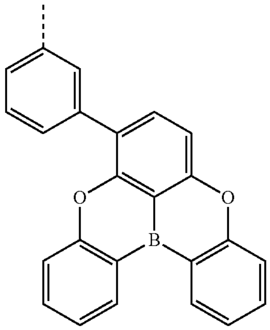 |

-continued
| Structure |
|---|
R93
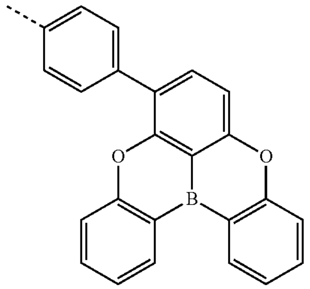
R94
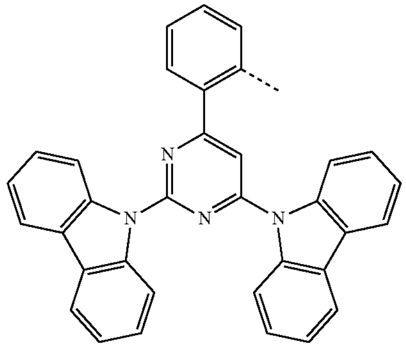
R95
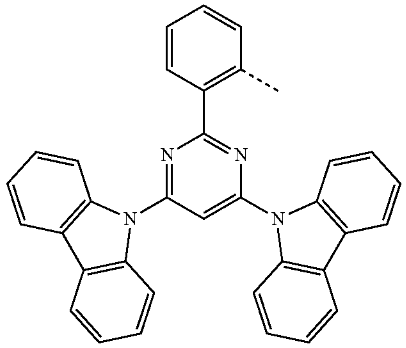
R96
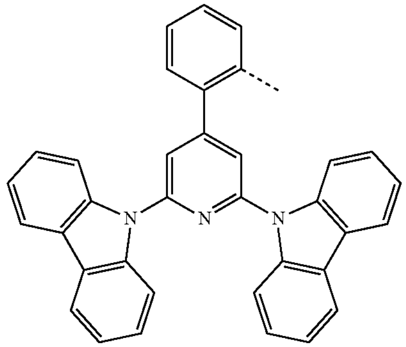
R97
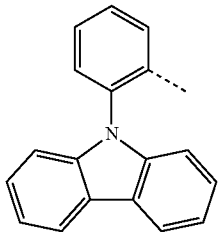
-continued
| Structure |
|---|
R98
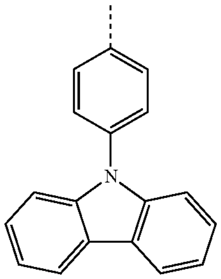
R99
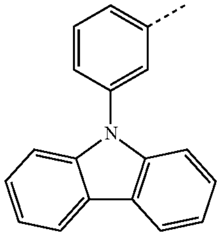
R100
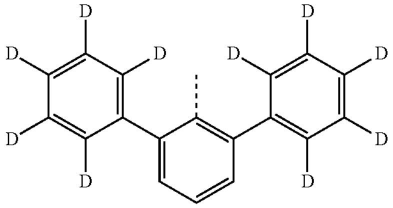
R101
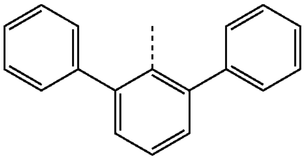
R102
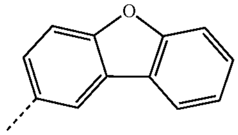
R103
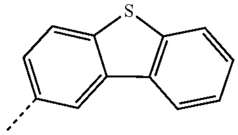
R104
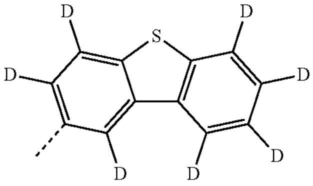
R105
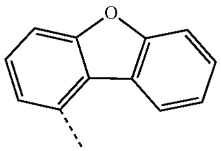

-continued
| Structure | |
|---|---|
| R106 | 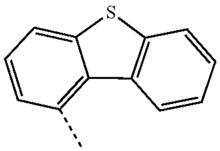 |
| R107 | 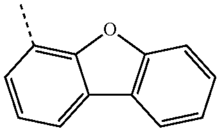 |
| R108 | 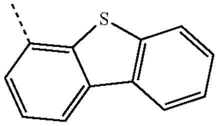 |
| R109 | 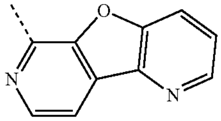 |
| R110 | 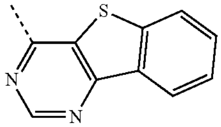 |
| R111 | 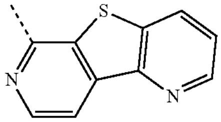 |
| R112 | 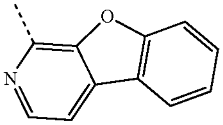 |
| R113 | 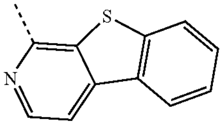 |
| R114 | 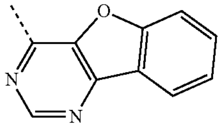 |
| R115 | 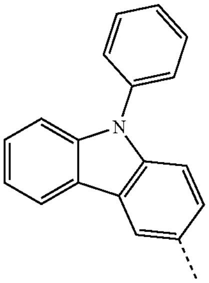 |
-continued
| Structure | |
|---|---|
| R116 | 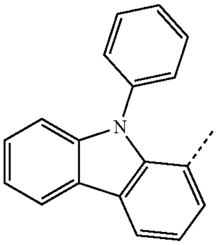 |
| R117 | 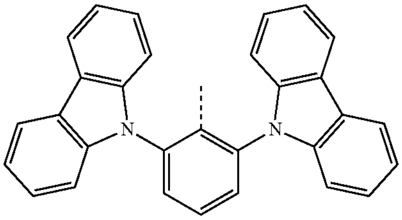 |
| R118 | 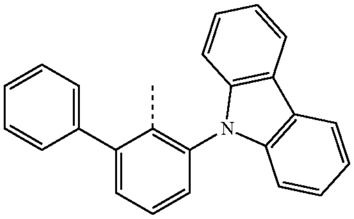 |
| R119 | 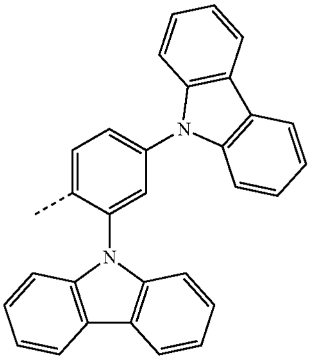 |
| R120 | 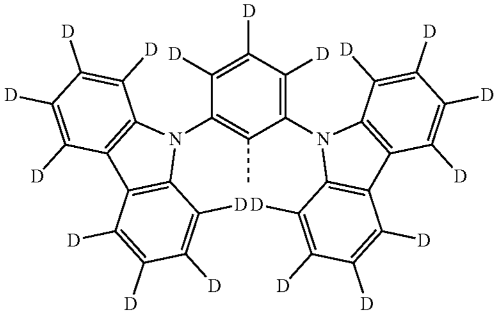 |

| Structure |
|---|
| R121 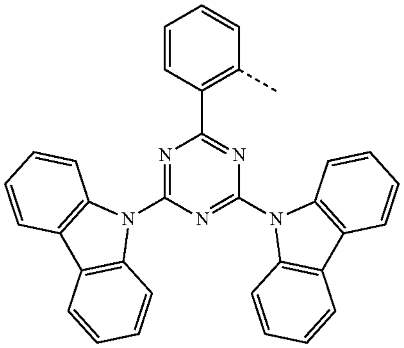 |
| R122 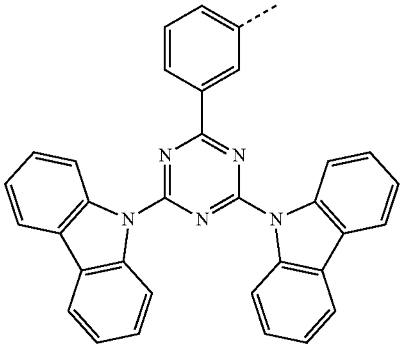 |
| R123 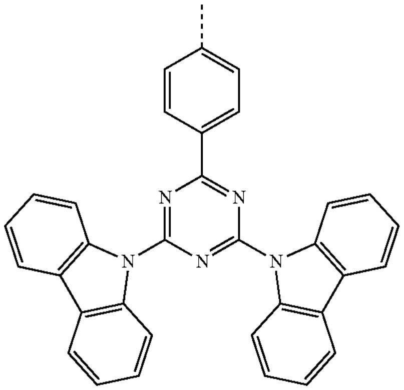 |
| R124 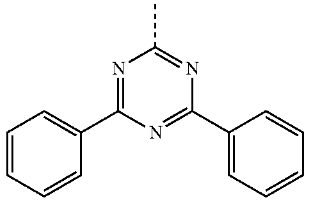 |
| R125 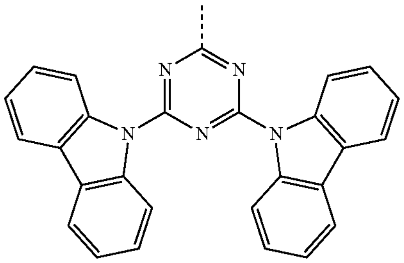 |
| Structure |
|---|
| R126 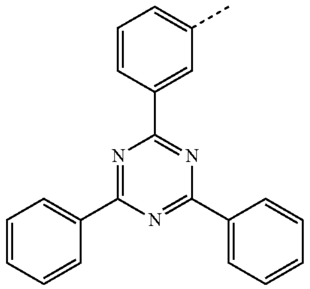 |
| R127 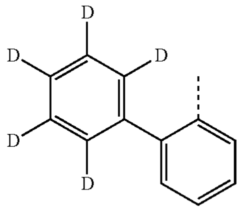 |
| R128 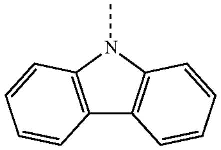 |
| R129 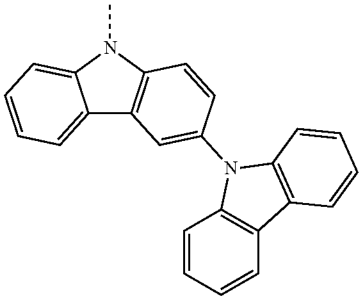 |
| R130 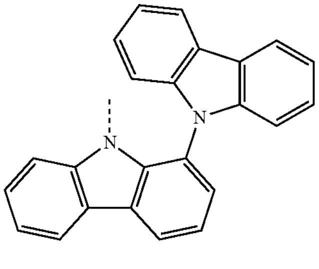 |
| R131 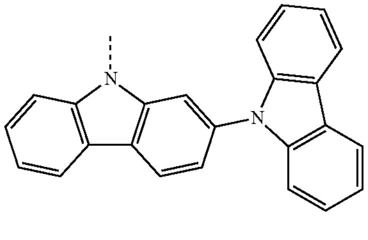 |

-continued
| | Structure |
|---|---|
| R132 | 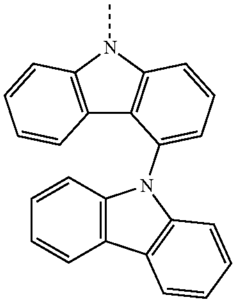 |
| R133 | 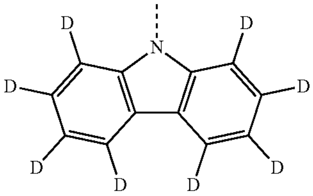 |
| R134 | 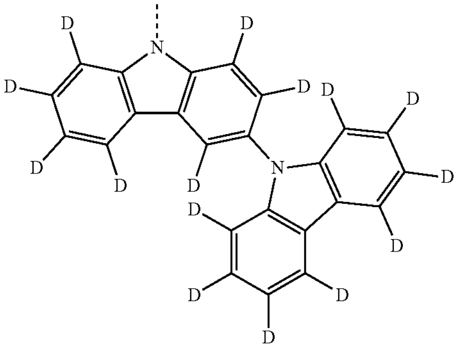 |
| R135 | 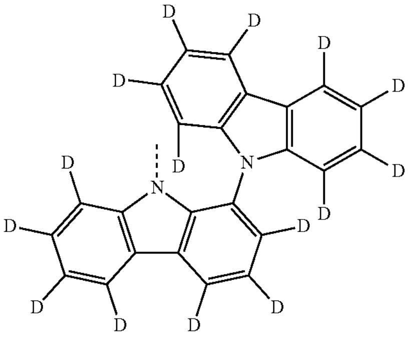 |
| R136 | 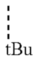 |
| R137 | 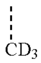 |
| R138 |  |
| R139 | 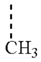 |
-continued
| | Structure |
|---|---|
| R140 |  |
| R141 | 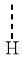 |
In some embodiments, the compound is selected from the group consisting of:
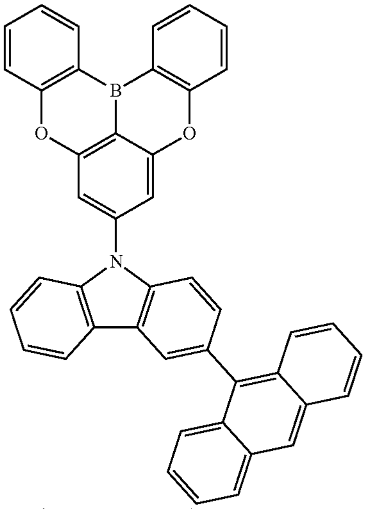
,
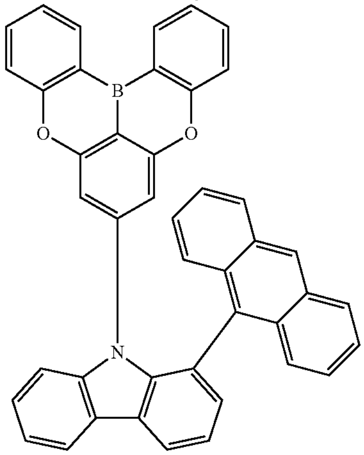
,
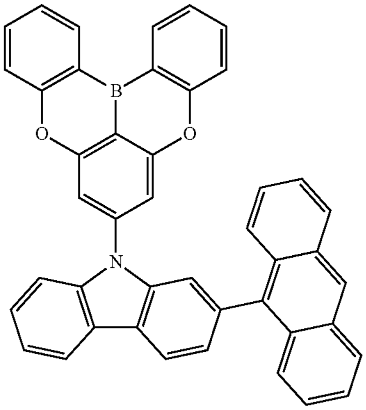
, -continued
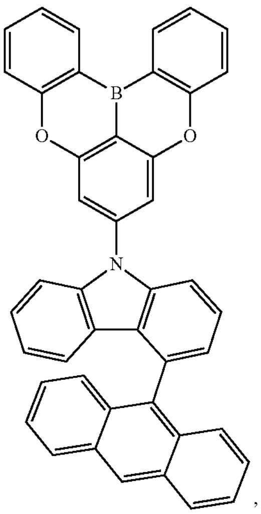
,
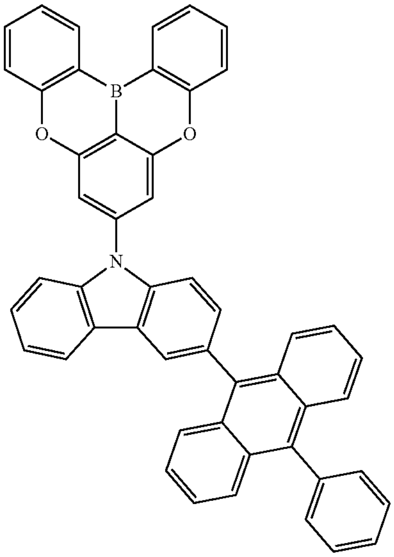
,
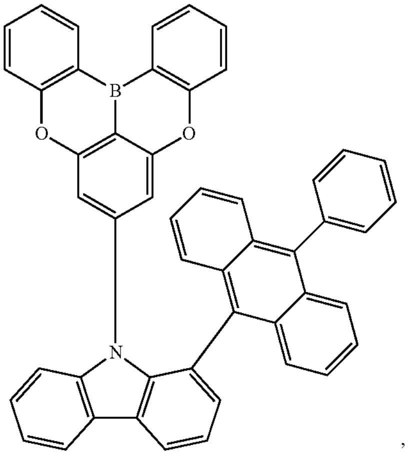
,
-continued
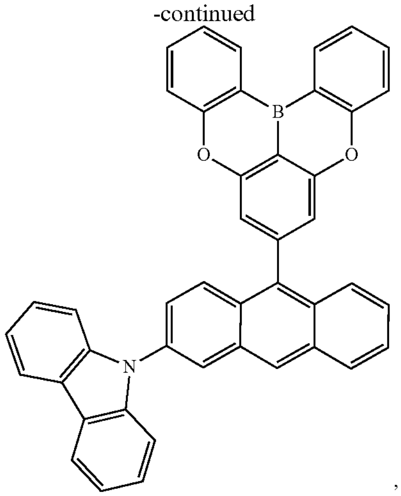
,
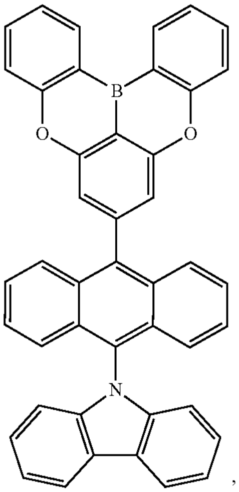
,
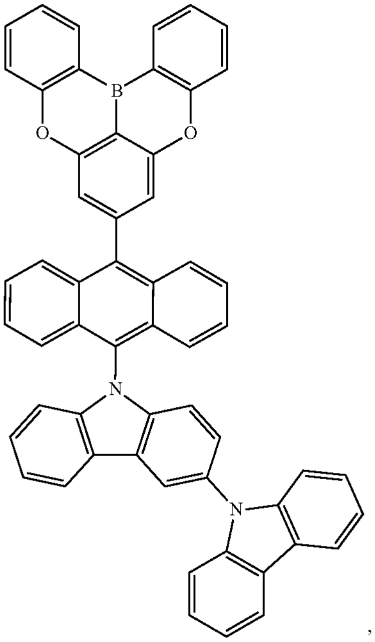
, -continued
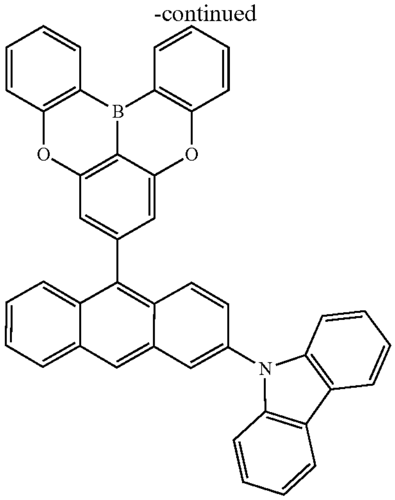
,
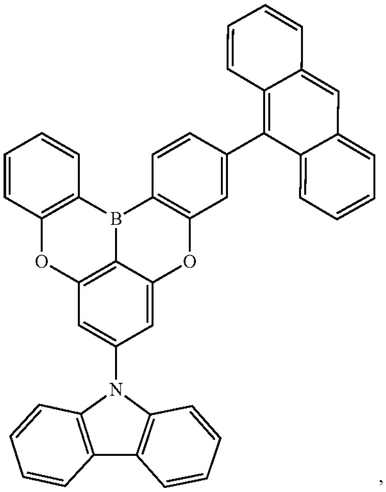
,
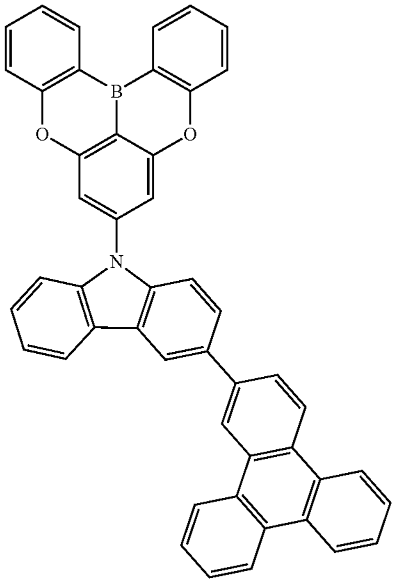
,
-continued
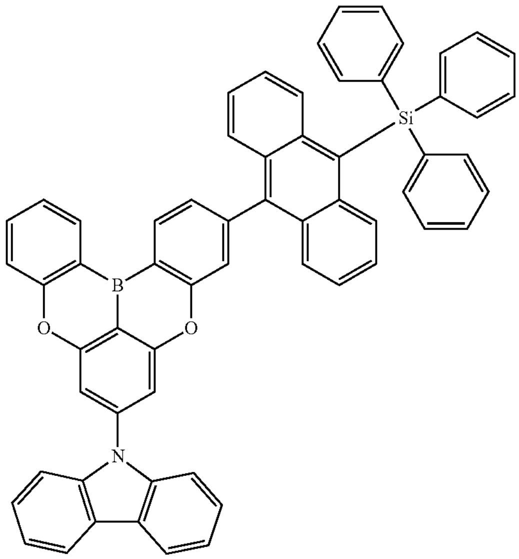
,
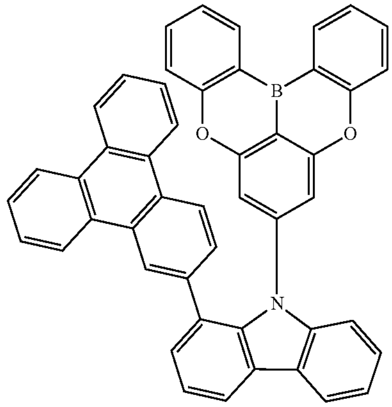
,
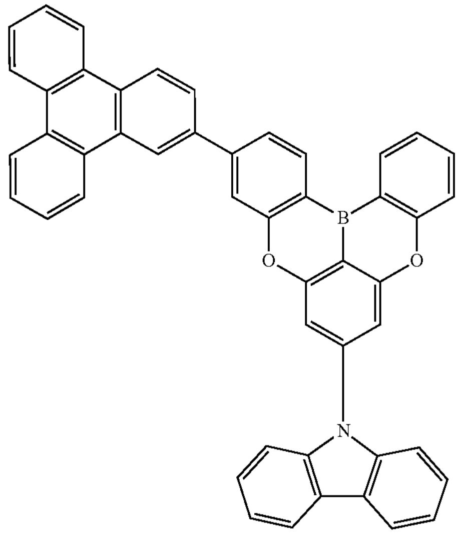
, -continued
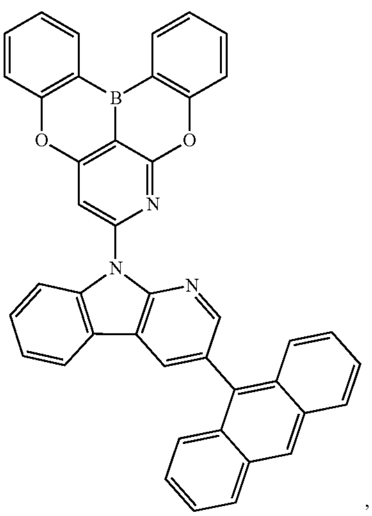
,
-continued
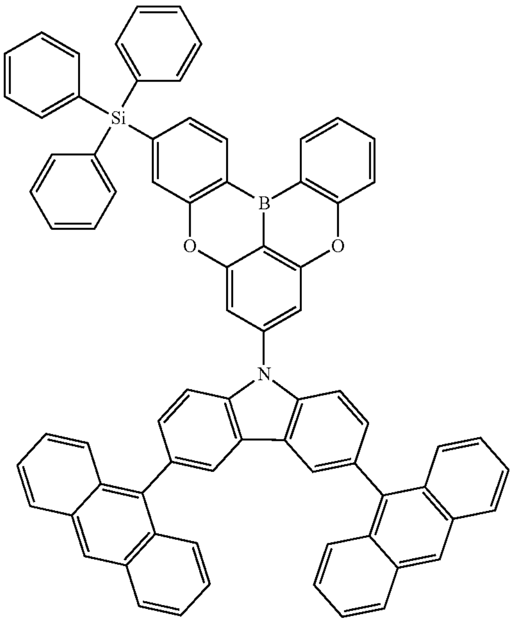
,
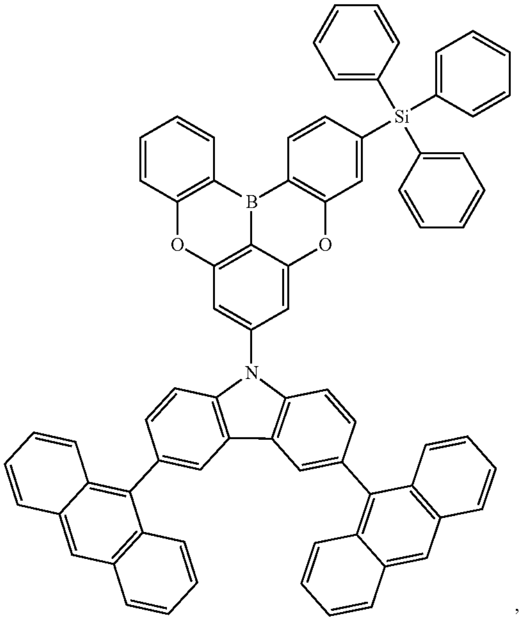
,
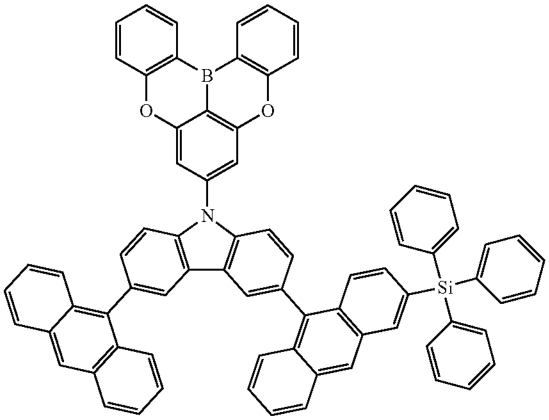
,
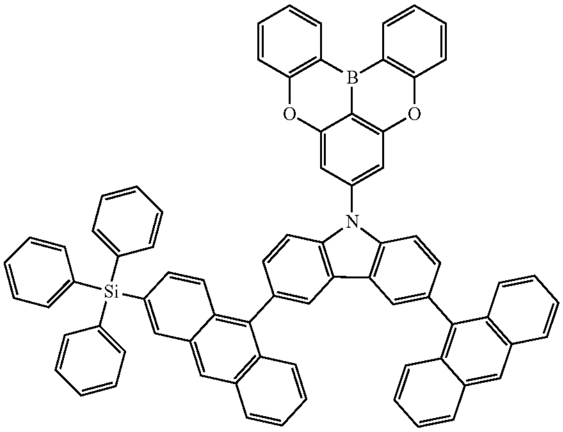
, -continued
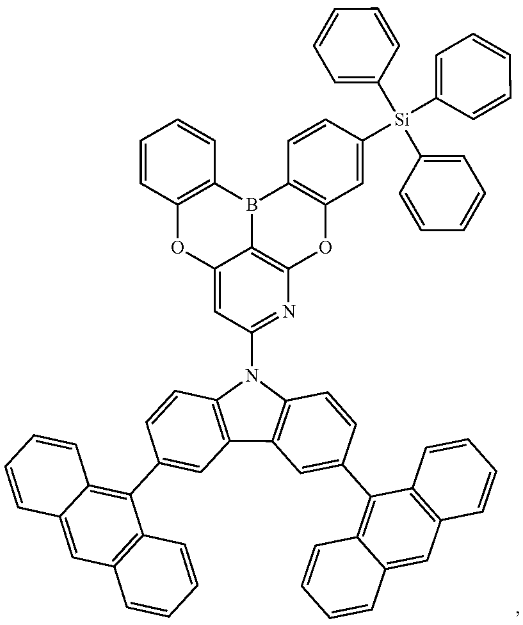
,
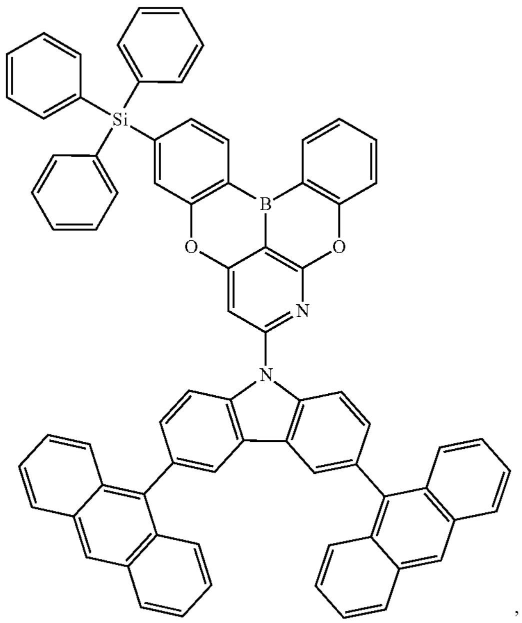
,
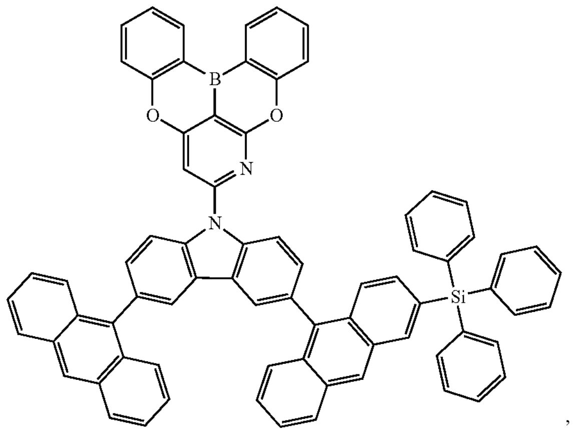
,
-continued
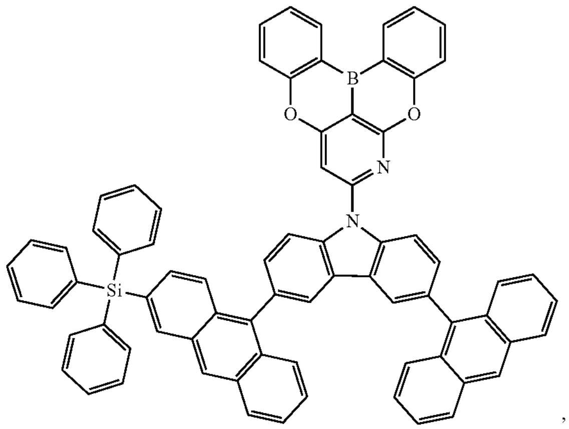
,
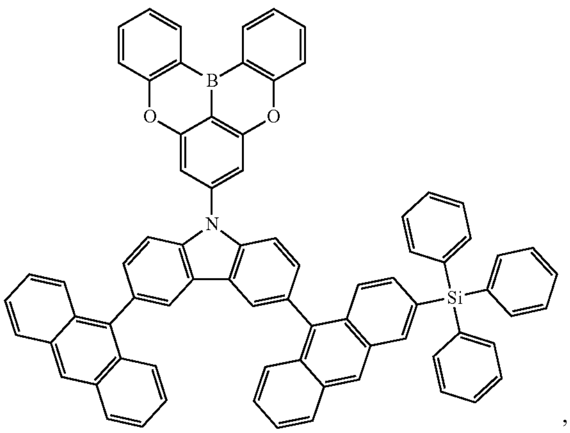
,
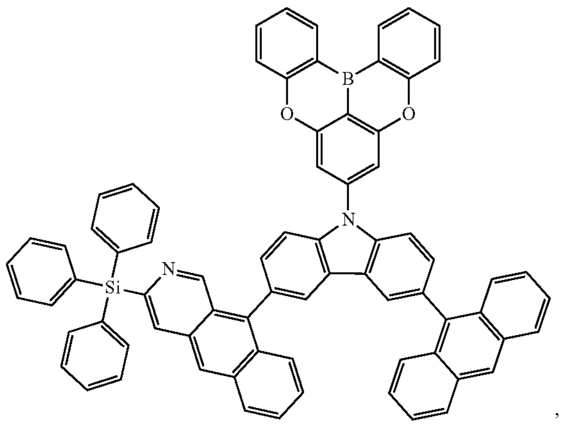
,
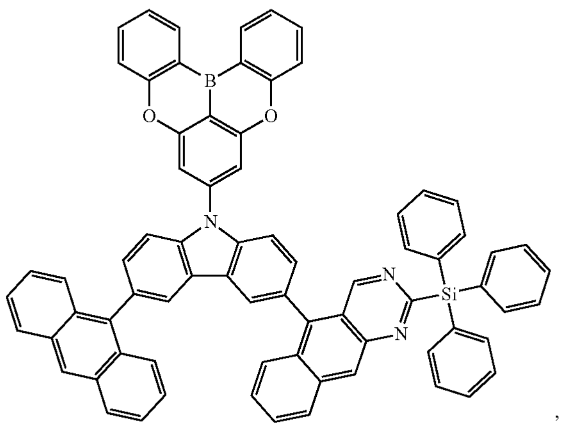
, -continued
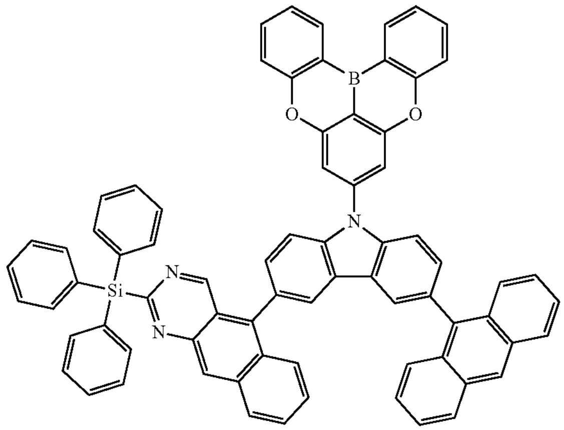
,
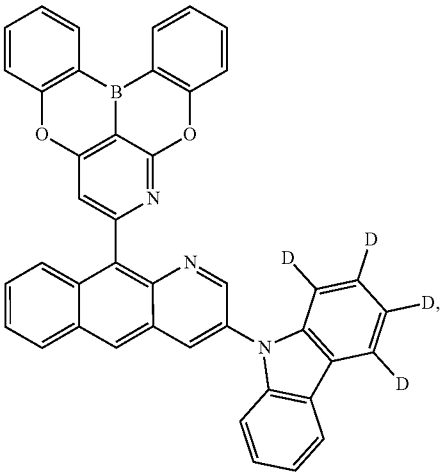
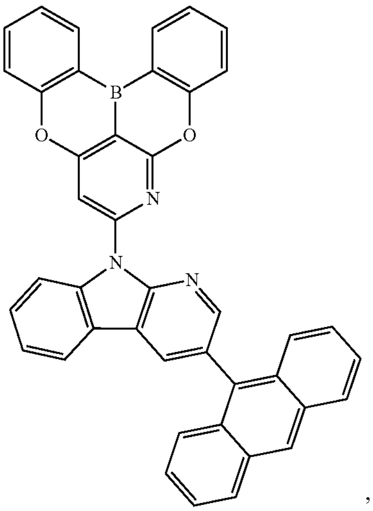
,
-continued
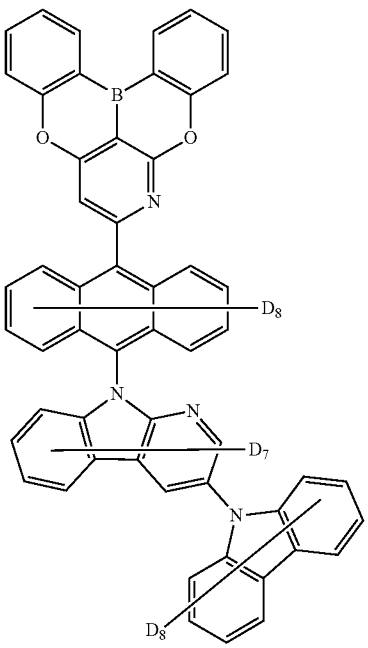
,
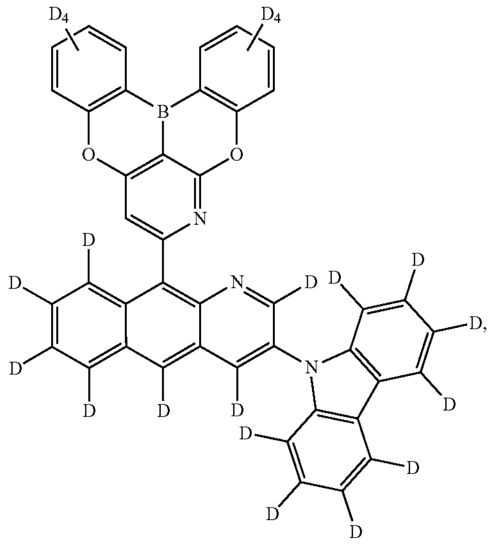
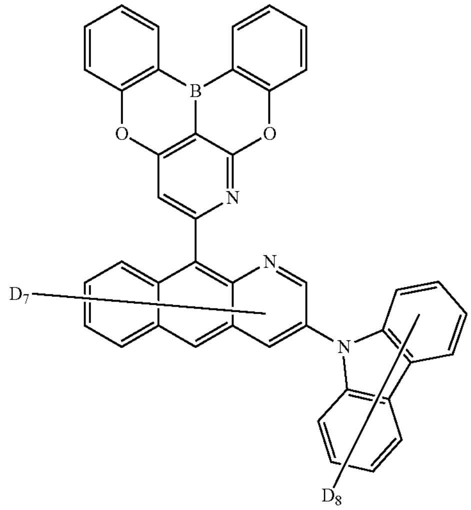
, -continued
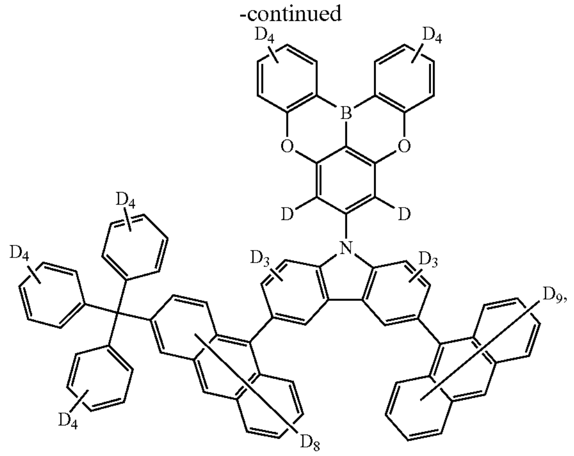
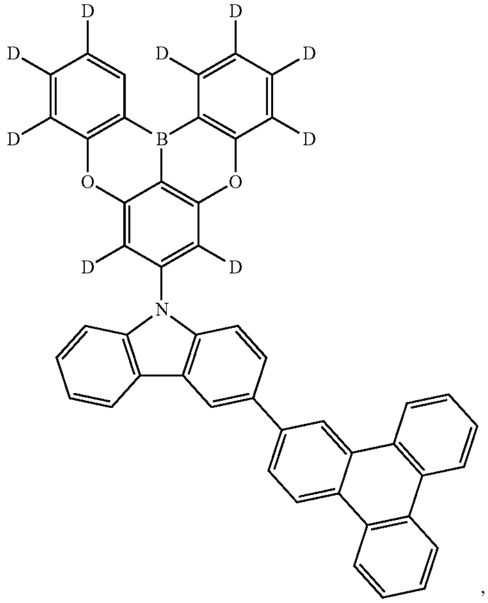
,
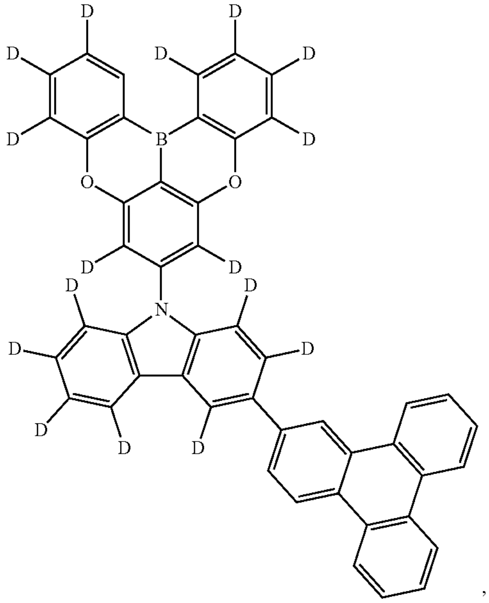
,
-continued
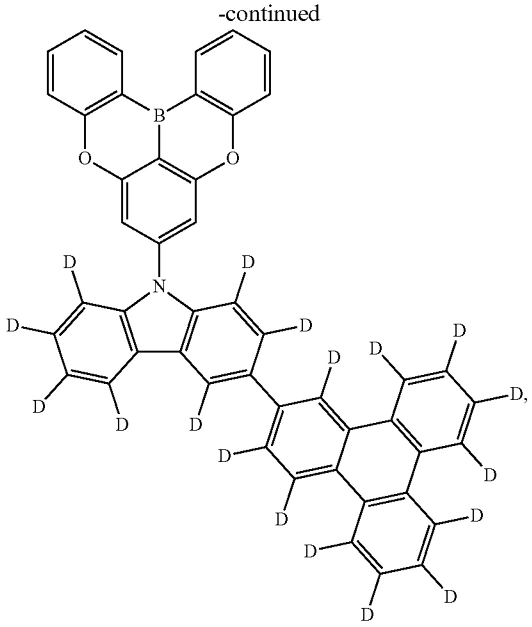
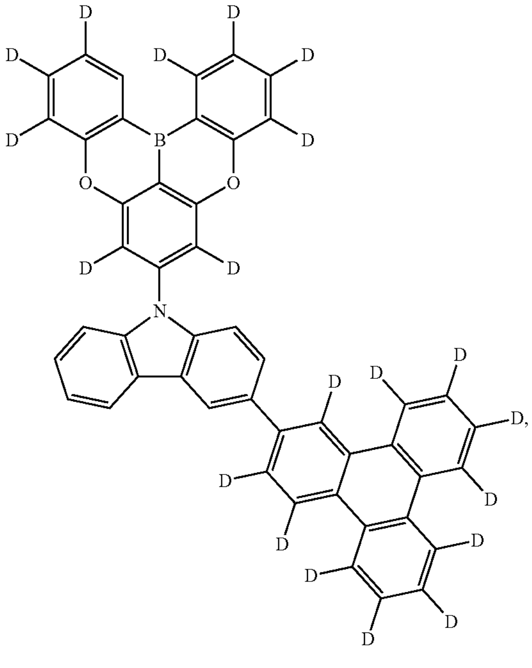

-continued
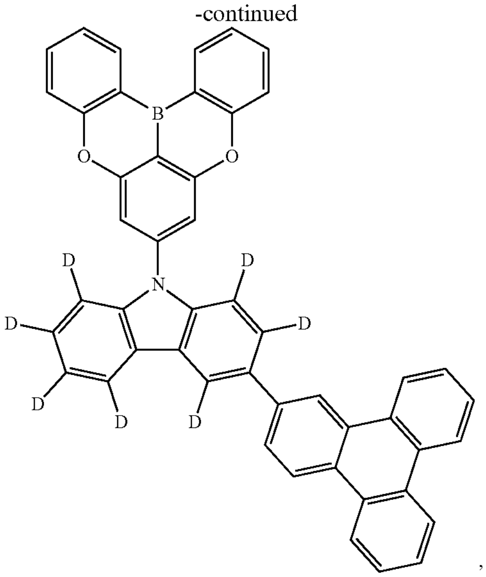
,
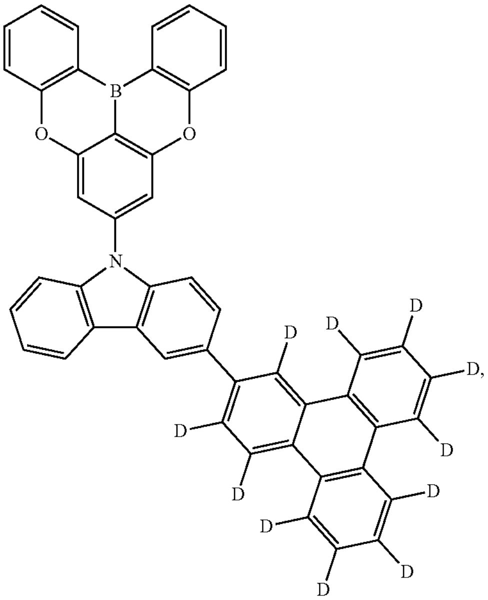
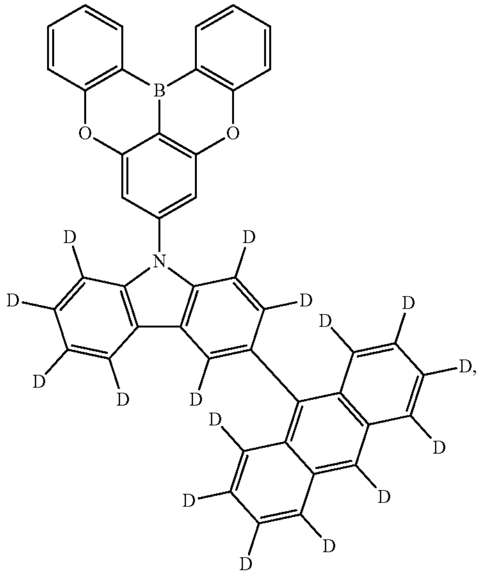
-continued
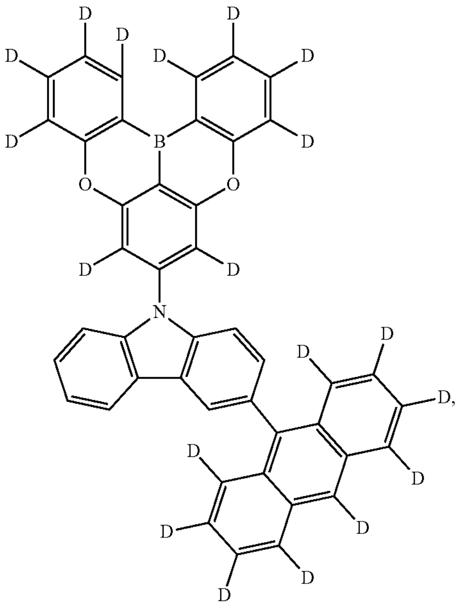
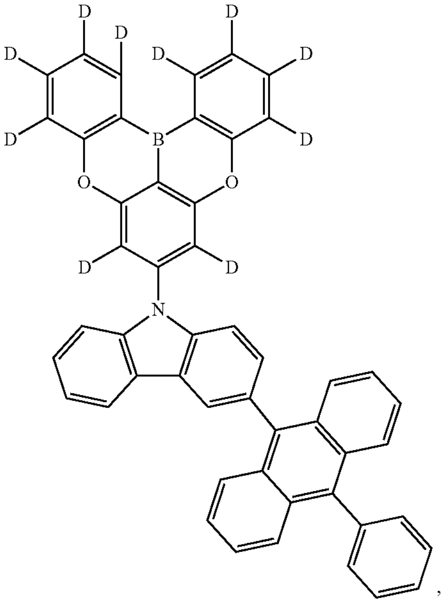
, -continued

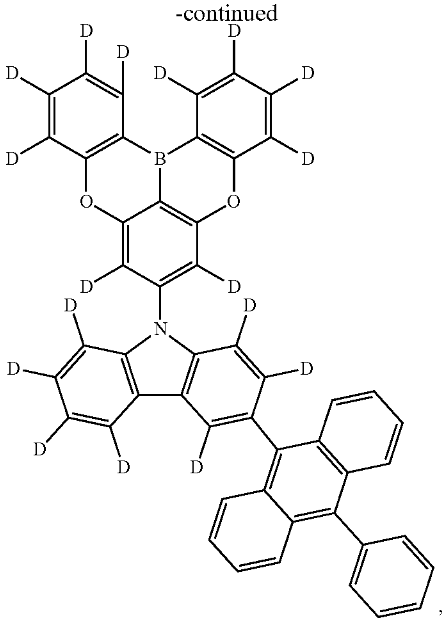

,

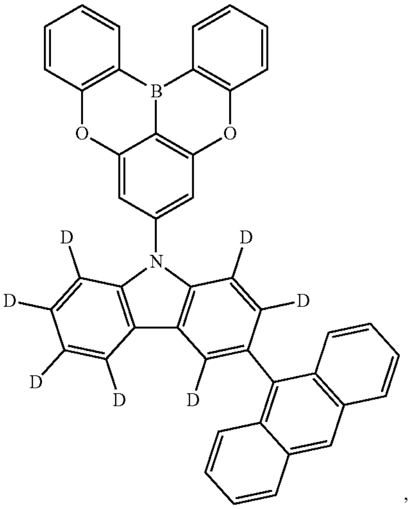

, and

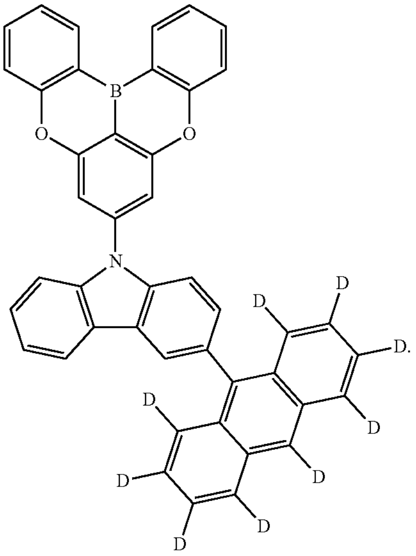

In some embodiments, when $W^3$ is a structure of Formula IV, each of moiety I, Moiety J, and moiety K is independently a polycyclic fused ring structure. In some embodiments, when $W^3$ is a structure of Formula IV, each of moiety I, Moiety J, and moiety K is independently a polycyclic fused ring structure comprising at least three fused rings. In some embodiments, the polycyclic fused ring structure has two 6-membered rings and one 5-membered ring. In some such embodiments, the 5-membered ring is fused to the ring coordinated to metal M and the second 6-membered ring is fused to the 5-membered ring. In some embodiments, when $W^3$ is a structure of Formula IV, each of moiety I, Moiety J, and moiety K is independently selected from the group consisting of dibenzofuran, dibenzothiophene, dibenzoselenophene, and aza-variants thereof. In some such embodiments, when $W^3$ is a structure of Formula IV, each of moiety I, Moiety J, and moiety K can independently be further substituted at the ortho- or meta-position of the O, S, or Se atom by a substituent selected from the group consisting of deuterium, fluorine, nitrile, alkyl, cycloalkyl, aryl, heteroaryl, and combinations thereof. In some such embodiments, the aza-variants contain exactly one N atom at the 6-position (ortho to the O, S, or Se) with a substituent at the 7-position (meta to the O, S, or Se).

In some embodiments, when $W^3$ is a structure of Formula IV, each of moiety I, Moiety J, and moiety K is independently a polycyclic fused ring structure comprising at least four fused rings. In some embodiments, the polycyclic fused ring structure comprises three 6-membered rings and one 5-membered ring. In some such embodiments, the 5-membered ring is fused to the ring coordinated to metal M, the second 6-membered ring is fused to the 5-membered ring, and the third 6-membered ring is fused to the second 6-membered ring. In some such embodiments, the third 6-membered ring is further substituted by a substituent selected from the group consisting of deuterium, fluorine, nitrile, alkyl, cycloalkyl, aryl, heteroaryl, and combinations thereof.

In some embodiments, when $W^3$ is a structure of Formula IV, each of moiety I, Moiety J, and moiety K is independently a polycyclic fused ring structure comprising at least five fused rings. In some embodiments, the polycyclic fused ring structure comprises four 6-membered rings and one 5-membered ring or three 6-membered rings and two 5-membered rings. In some embodiments comprising two 5-membered rings, the 5-membered rings are fused together. In some embodiments comprising two 5-membered rings, the 5-membered rings are separated by at least one 6-membered ring. In some embodiments with one 5-membered ring, the 5-membered ring is fused to the ring coordinated to metal M, the second 6-membered ring is fused to the 5-membered ring, the third 6-membered ring is fused to the second 6-membered ring, and the fourth 6-membered ring is fused to the third 6-membered ring.

In some embodiments, when $W^3$ is a structure of Formula IV, each moiety I, Moiety J, and moiety K is independently an aza version of the polycyclic fused rings described above. In some such embodiments, when $W^3$ is a structure of Formula IV, each moiety I, Moiety J, and moiety K independently contains exactly one aza N atom. In some such embodiments, when $W^3$ is a structure of Formula IV, each moiety I, Moiety J, and moiety K contains exactly two aza N atoms, which can be in one ring, or in two different rings. In some such embodiments, the ring having aza N atom is separated by at least two other rings from the metal M atom. In some such embodiments, the ring having aza N atom is separated by at least three other rings from the metal M atom. In some such embodiments, each of the ortho position of the aza N atom is substituted.

In some embodiments, the compound of Formula I described herein can be at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated. As used herein, percent deuteration has its ordinary meaning and includes the percent of possible hydrogen atoms (e.g., positions that are hydrogen, deuterium, or halogen) that are replaced by deuterium atoms).

C. The OLEDs and the Devices of the Present Disclosure

In another aspect, the present disclosure also provides an OLED device comprising a first organic layer that contains a compound as disclosed in the above compounds section of the present disclosure.

In some embodiments, the compound may be a host, and the first organic layer may be an emissive layer that comprises a phosphorescent or fluorescent emitter. Phosphorescence generally refers to emission of a photon with a change in electron spin, i.e., the initial and final states of the emission have different multiplicity, such as from T1 to S0 state. Ir and Pt complexes currently widely used in the OLED belong to phosphorescent emitters. In some embodiments, if an exciplex formation involves a triplet emitter, such exciplex can also emit phosphorescent light. On the other hand, fluorescent emitters generally refer to emission of a photon without a change in electron spin, such as from S1 to S0 state. Fluorescent emitters can be delayed fluorescent or non-delayed fluorescent emitters. Depending on the spin state, fluorescent emitter can be a singlet emitter or a doublet emitter, or other multiplet emitter. It is believed that the internal quantum efficiency (IQE) of fluorescent OLEDs can exceed the 25% spin statistics limit through delayed fluorescence. There are two types of delayed fluorescence, i.e. P-type and E-type delayed fluorescence. P-type delayed fluorescence is generated from triplet-triplet annihilation (TTA). On the other hand, E-type delayed fluorescence does not rely on the collision of two triplets, but rather on the thermal population between the triplet states and the singlet excited states. Thermal energy can activate the transition from the triplet state back to the singlet state. This type of delayed fluorescence is also known as thermally activated delayed fluorescence (TADF). E-type delayed fluorescence characteristics can be found in an exciplex system or in a single compound. Without being bound by theory, it is believed that TADF requires a compound or an exciplex having a small singlet-triplet energy gap (ΔES-T) less than or equal to 300, 250, 200, 150, 100, or 50 meV. There are two major types of TADF emitters, one is called donor-acceptor type TADF, the other one is called multiple resonance (MR) TADF. Often, donor-acceptor single compounds are constructed by connecting an electron donor moiety such as amino- or carbazole-derivatives and an electron acceptor moiety such as N-containing six-membered aromatic ring. Donor-acceptor exciplex can be formed between a hole transporting compound and an electron transporting compound. The examples for MR-TADF include a highly conjugated boron-containing compounds. In some embodiments, the reverse intersystem crossing time from T1 to S1 of the delayed fluorescent emission at 293K is less than or equal to 10 microseconds. In some embodiments, such time can be greater than 10 microseconds and less than 100 microseconds.

In some embodiments, the compound is a host, and the organic layer is an emissive layer that comprises a phosphorescent material.

In some embodiments, the emissive dopant can be a phosphorescent or fluorescent material.

In some embodiments, the non-emissive dopant can also be a phosphorescent or fluorescent material.

In some embodiments, the OLED may comprise an additional compound selected from the group consisting of a fluorescence material, a delayed fluorescence material, a phosphorescent material, and combination thereof.

In some embodiments, the phosphorescent material is an emitter which emits light within the OLED. In some embodiments, the phosphorescent material does not emit light within the OLED. In some embodiments, the phosphorescent material energy transfers its excited state to another material within the OLED. In some embodiments, the phosphorescent material participates in charge transport within the OLED. In some embodiments, the phosphorescent material is a sensitizer, and the OLED further comprises an acceptor.

In some embodiments, the fluorescence material or the delayed fluorescence material is an emitter which emits light within the OLED. In some embodiments, the fluorescence material or the delayed fluorescence material does not emit light within the OLED. In some embodiments, the fluorescence material or the delayed fluorescence material energy transfers its excited state to another material within the OLED. In some embodiments, the fluorescence material or the delayed fluorescence material participates in charge transport within the OLED. In some embodiments, the fluorescence material or the delayed fluorescence material is a sensitizer, and the OLED further comprises an acceptor.

In some embodiments, the compound may be an acceptor, and the OLED may further comprise a sensitizer selected from the group consisting of a delayed fluorescence material, a phosphorescent material, and combination thereof.

In some embodiments, the compound may be a fluorescent emitter, a delayed fluorescence material, or a component of an exciplex that is a fluorescent emitter or a delayed fluorescence material.

In some embodiments, the compound is a host and the OLED comprises an acceptor that is an emitter and a sensitizer selected from the group consisting of a delayed fluorescence material, a phosphorescent material, and combination thereof; wherein the sensitizer transfers energy to the acceptor.

In some embodiments, where the compound is a host, the compound can be an electron transporting host.

In some of these embodiments, the compound has a LUMO less than −2.4 eV. In some of these embodiments, the compound has a LUMO less than −2.5 eV. In some of these embodiments, the compound has a LUMO less than −2.6 eV. In some of these embodiments, the compound has a LUMO less than −2.7 eV.

In some embodiments, the phosphorescent material can be a metal coordination complex having a metal-carbon bond, a metal-nitrogen bond, or a metal-oxygen bond. In some embodiments, the metal is selected from the group consisting of Ir, Rh, Re, Ru, Os, Zn, Pt, Pd, Au, Ag, and Cu. In some embodiments, the metal is Ir. In some embodiments, the metal is Pt. In some embodiments, the sensitizer compound has the formula of $M(L^1)_x(L^2)_y(L^3)_z$;

wherein $L^1$, $L^2$, and $L^3$ can be the same or different;

wherein x is 1, 2, or 3;

wherein y is 0, 1, or 2;

wherein z is 0, 1, or 2;

wherein x+y+z is the oxidation state of the metal M;
wherein $L^1$ is selected from the group consisting of the structures of LIGAND LIST:
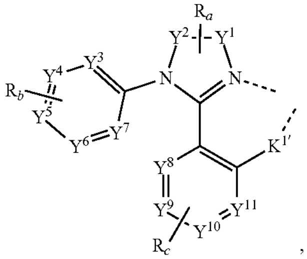
,
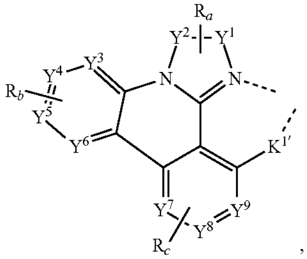
,
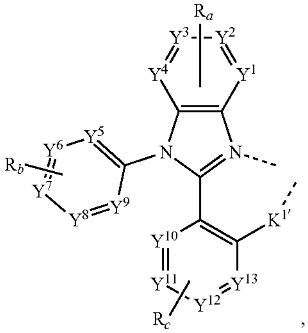
,
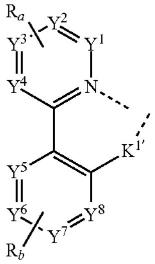
,
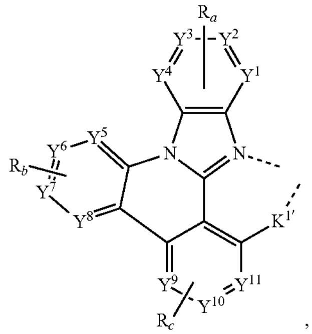
,
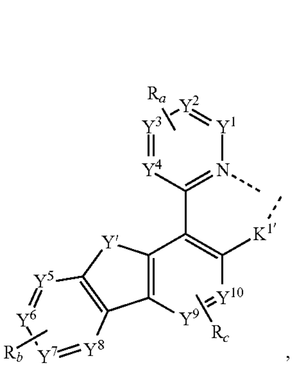
,
-continued
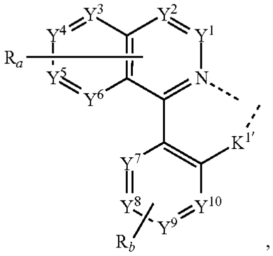
,
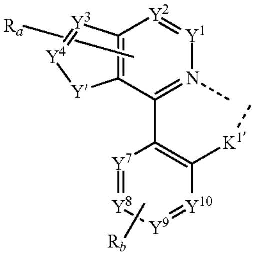
,
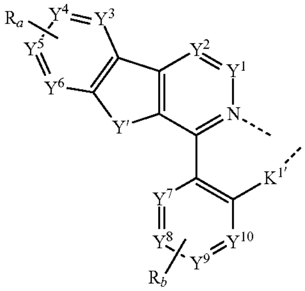
,
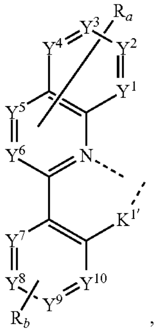
,
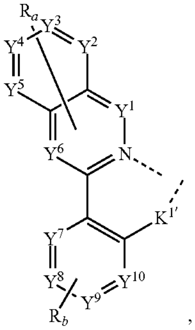
,
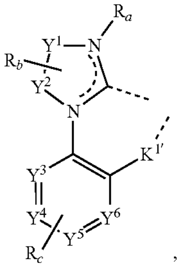
,
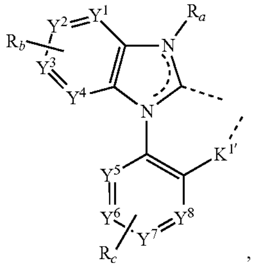
,
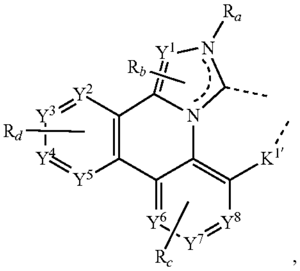
,
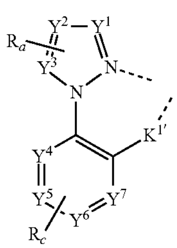
,
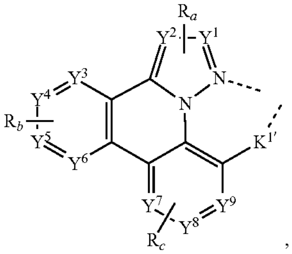
, -continued
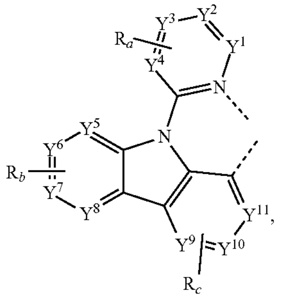
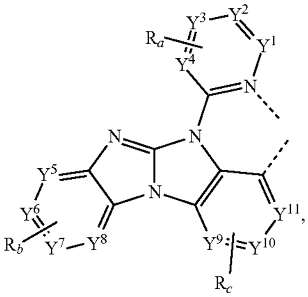
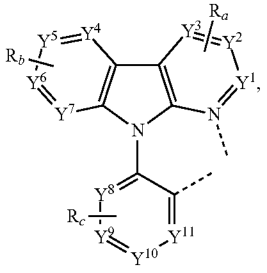
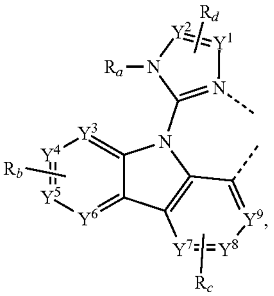
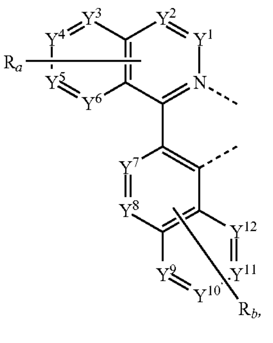
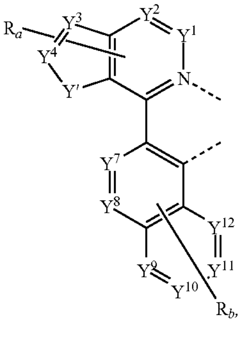
-continued
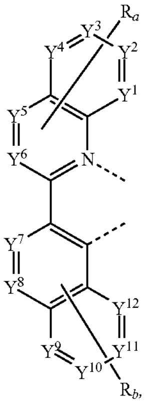
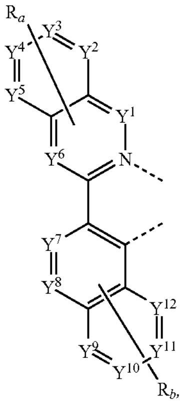
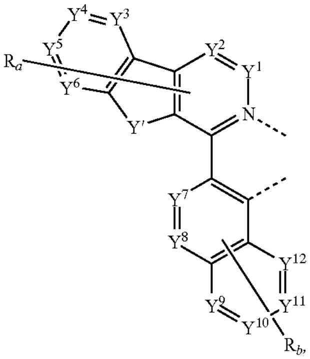
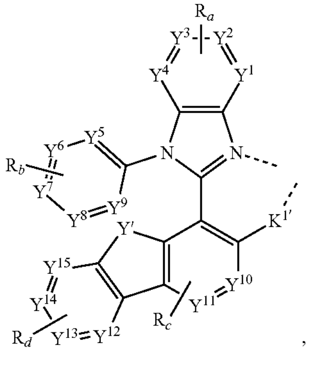
,
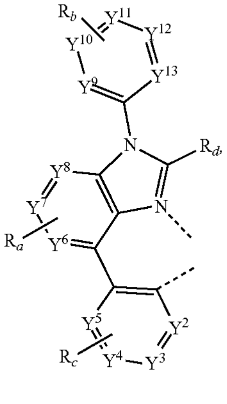
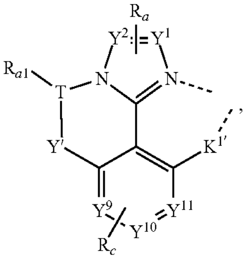
, -continued

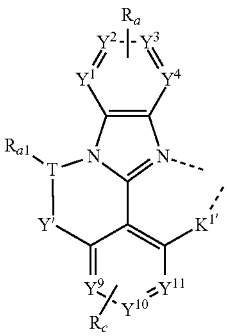

,

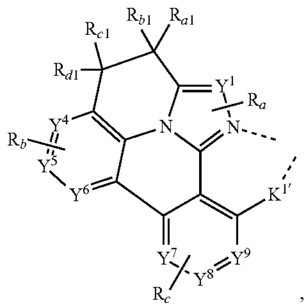

,

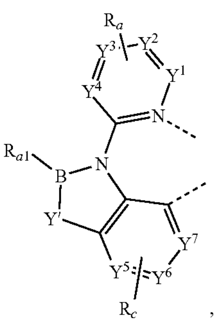

,

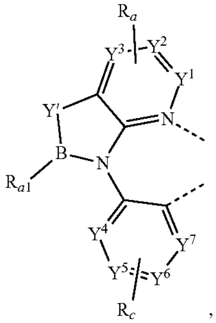

,

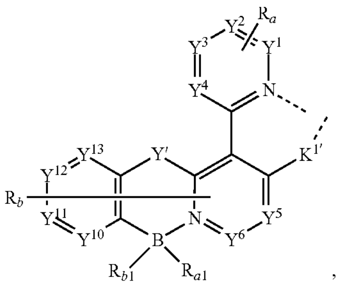

, and

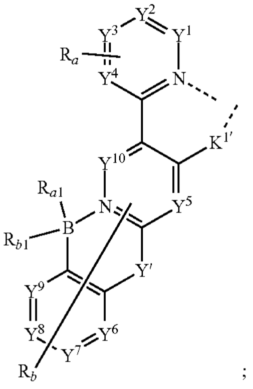

;

wherein $L^2$ and $L^3$ are independently selected from the group consisting of

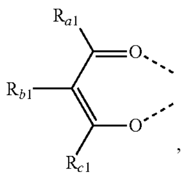

, and the structures of LIGAND LIST; wherein:

T is selected from the group consisting of B, Al, Ga, and In;

$K^{1'}$ is a direct bond or is selected from the group consisting of $NR_e$, $PR_e$, O, S, and Se;

each $Y^1$ to $Y^{13}$ are independently selected from the group consisting of carbon and nitrogen;

Y' is selected from the group consisting of $BR_e$, $NR_e$, $PR_e$, O, S, Se, C═O, S═O, $SO_2$, $CR_eR_f$, $SiR_eR_f$, and $GeR_eR_f$;

$R_e$ and $R_f$ can be fused or joined to form a ring;

each $R_a$, $R_b$, $R_c$, and $R_d$ can independently represent from mono to the maximum possible number of substitutions, or no substitution;

each $R_{a1}$, $R_{b1}$, $R_{c1}$, $R_{d1}$, $R_a$, $R_b$, $R_c$, $R_d$, $R_e$, and $R_f$ is independently a hydrogen or a substituent selected from the group consisting of the General Substituents as defined herein; and wherein any two of $R_{a1}$, $R_{b1}$, $R_{c1}$, $R_{d1}$, $R_a$, $R_b$, $R_c$, and $R_d$ can be fused or joined to form a ring or form a multidentate ligand.

In some embodiments, the metal in formula $M(L^1)_x(L^2)_y(L^3)_z$ is selected from the group consisting of Cu, Ag, or Au.

In some embodiments of the OLED, the phosphorescent material has a formula selected from the group consisting of $Ir(L_A)_3$, $Ir(L_A)(L_B)_2$, $Ir(L_A)_2(L_B)$, $Ir(L_A)_2(L_C)$, $Ir(L_A)(L_B)(L_C)$, and $Pt(L_A)(L_B)$, wherein $L_A$, $L_B$, and $L_C$ are different from each other in the Ir compounds;

wherein $L_A$ and $L_B$ can be the same or different in the Pt compounds; and wherein $L_A$ and $L_B$ can be connected to form a tetradentate ligand in the Pt compounds.

In some embodiments, phosphorescent material is selected from the group consisting of:

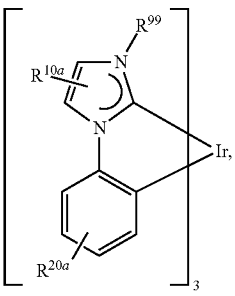

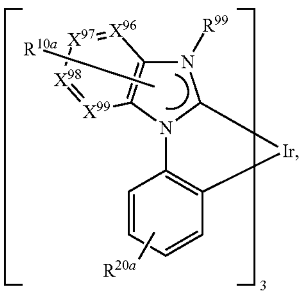

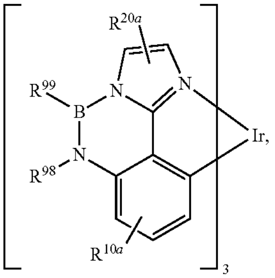

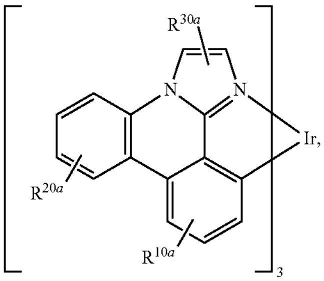

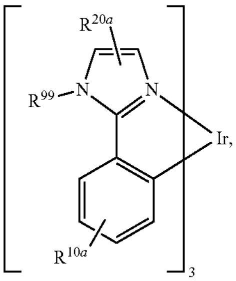

-continued
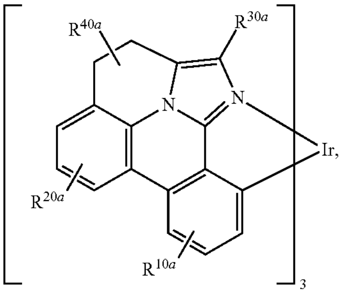
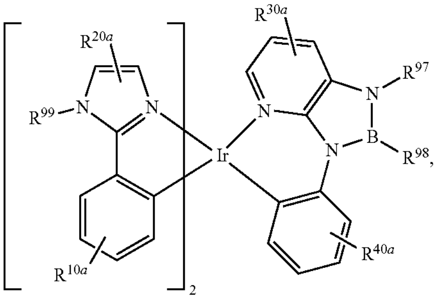
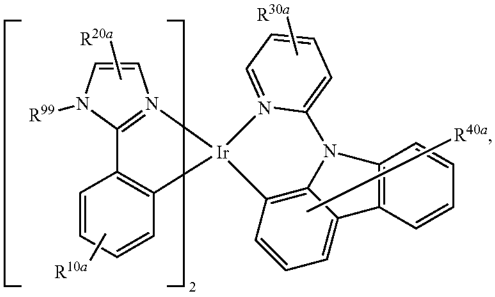
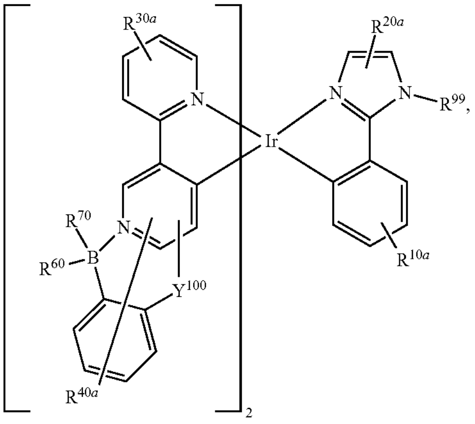
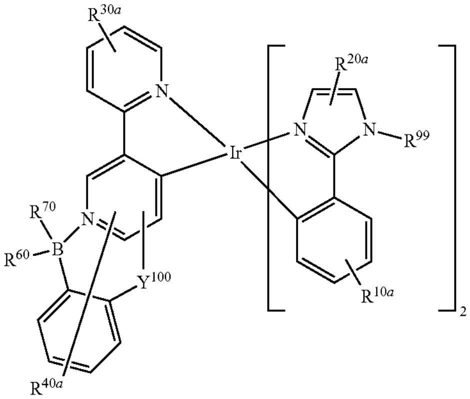
,
-continued
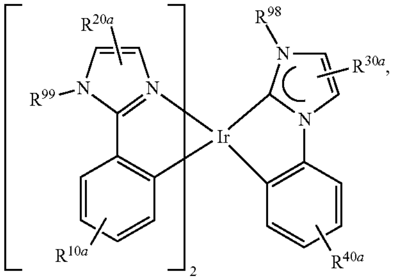
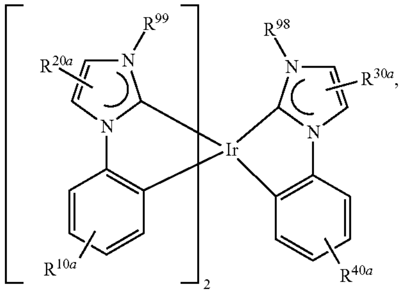
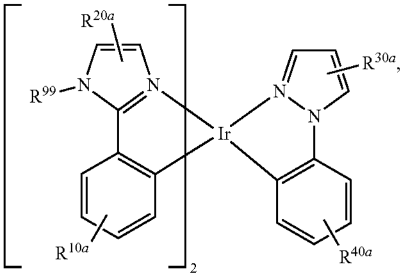
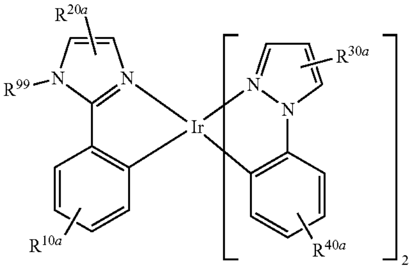
,
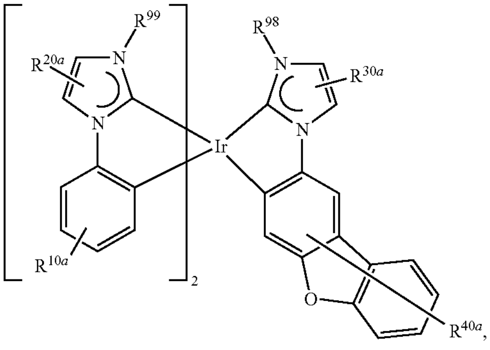

-continued
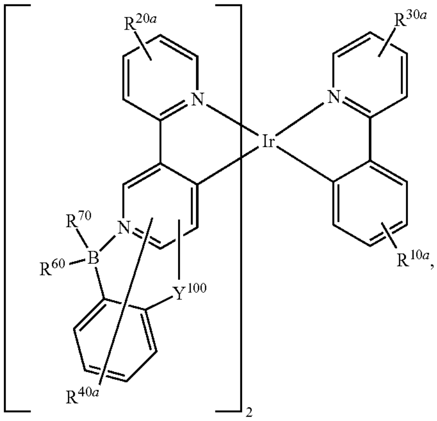
,
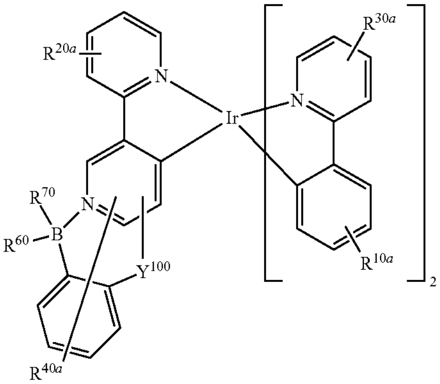
,
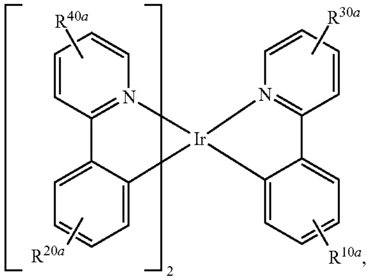
,
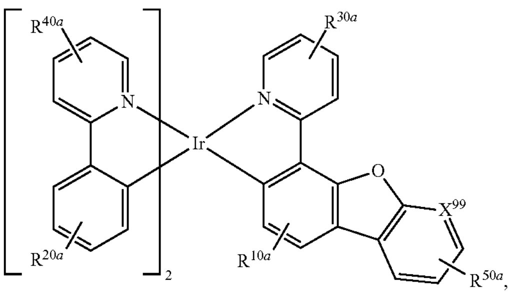
,
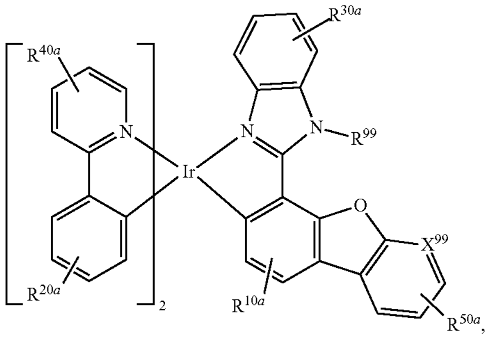
,
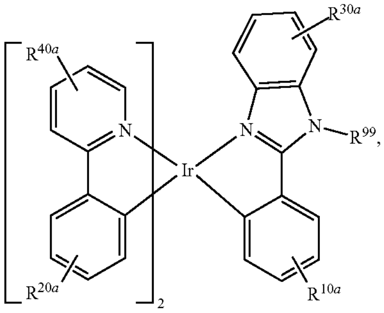
,
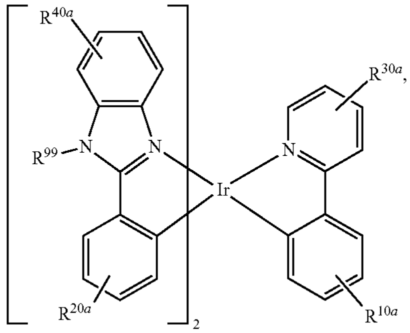
,
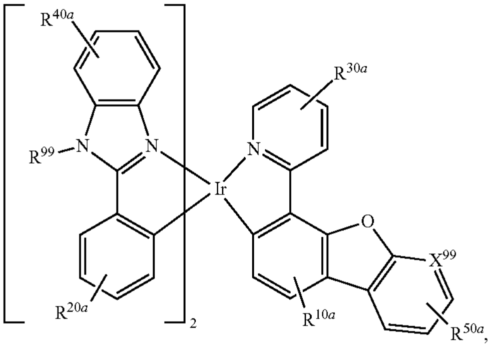
,
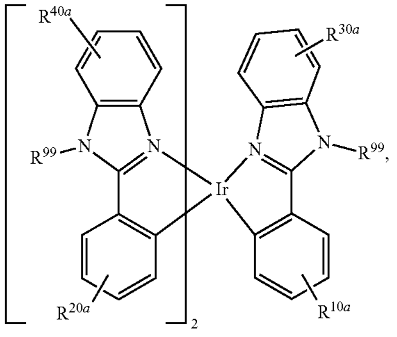
, -continued
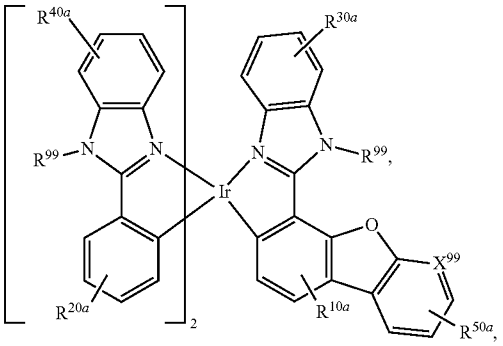
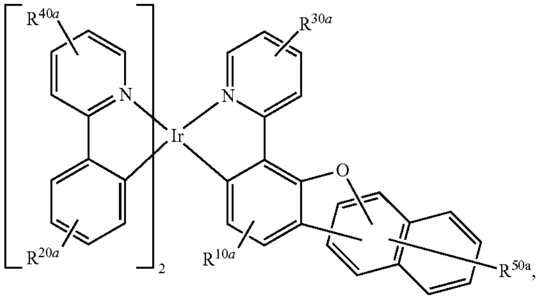
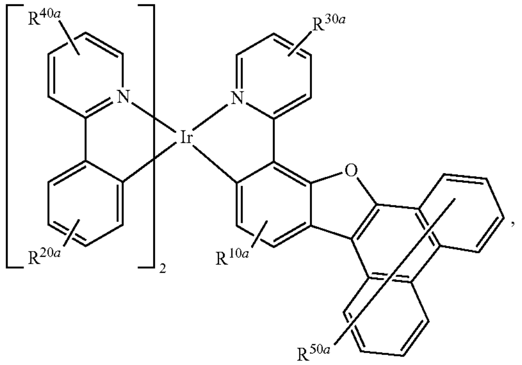
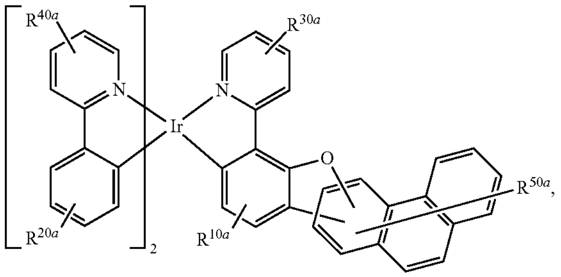
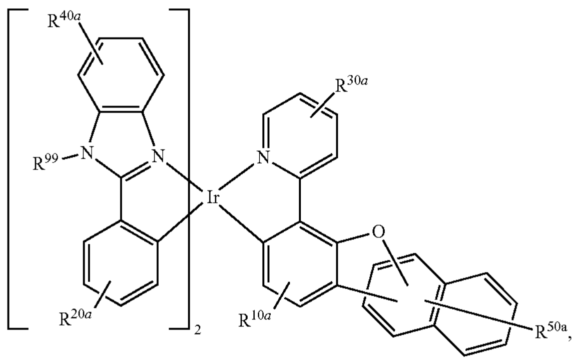
-continued
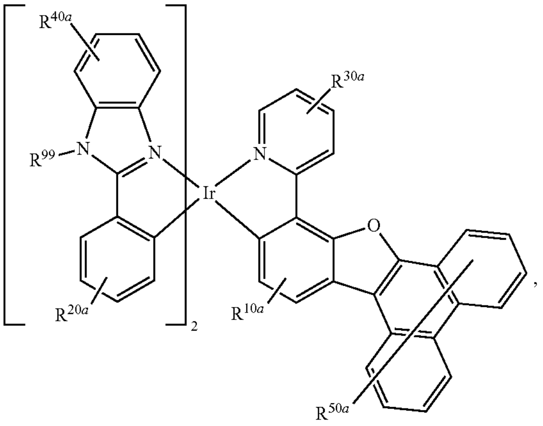
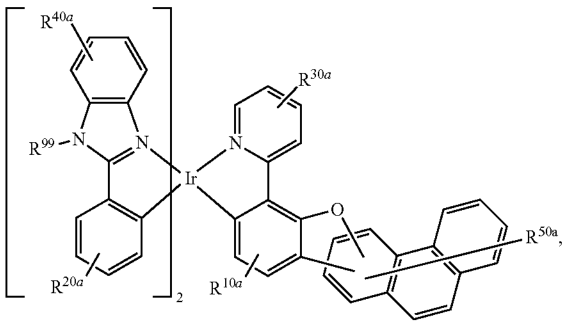
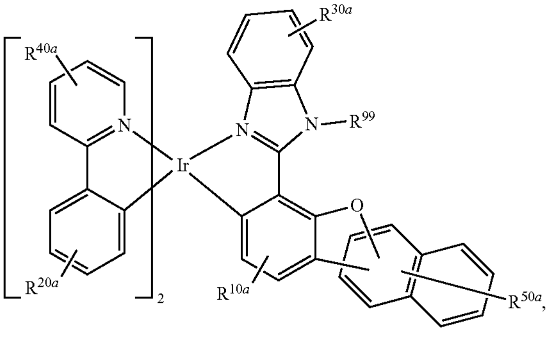
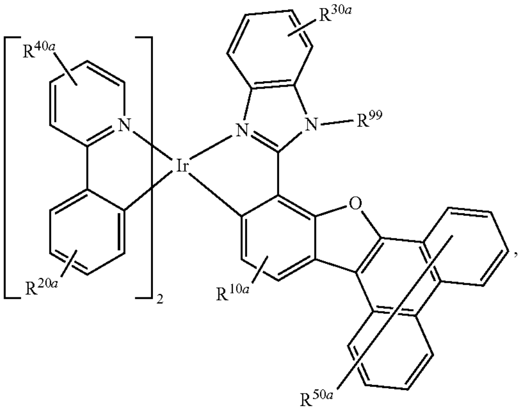

-continued
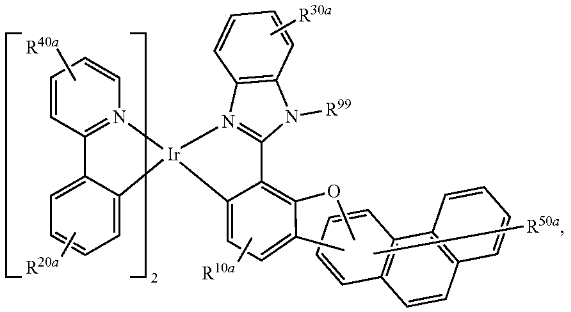
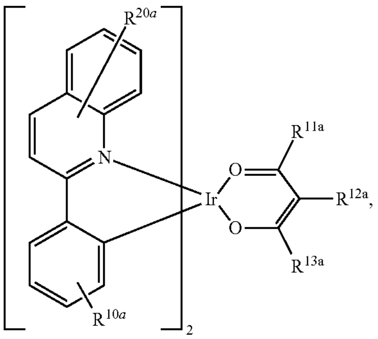
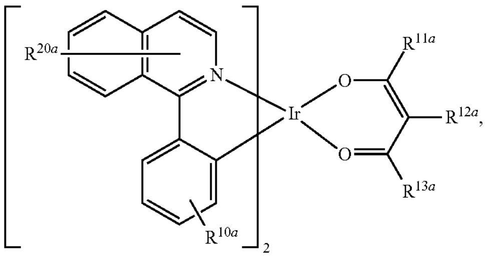
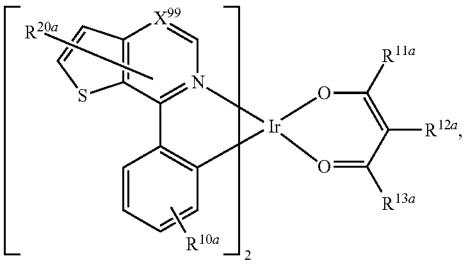
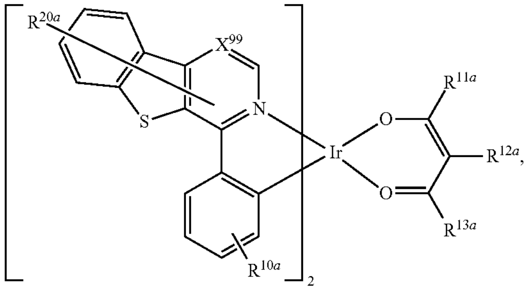
-continued
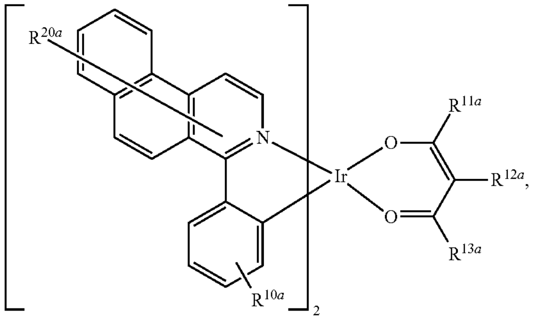
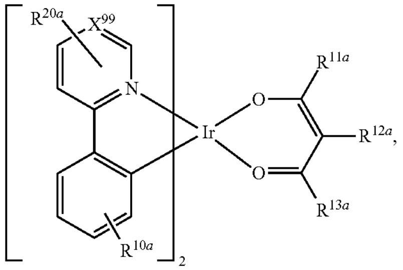
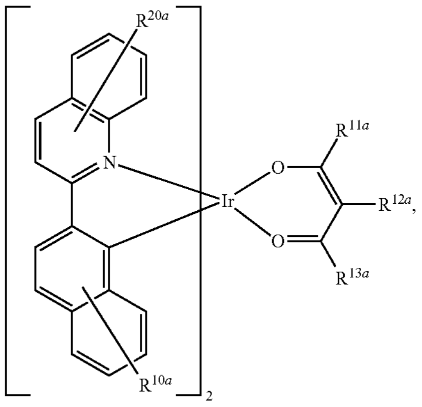
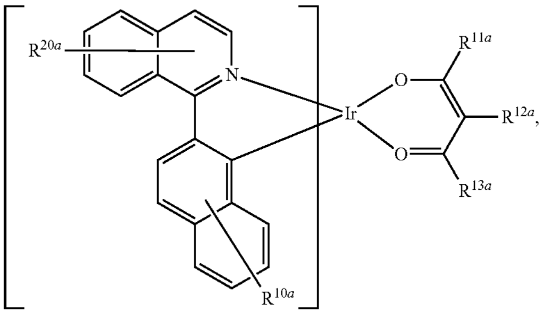
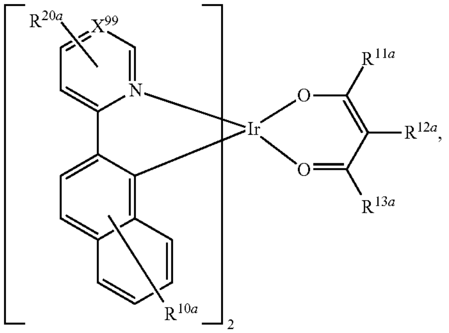

-continued
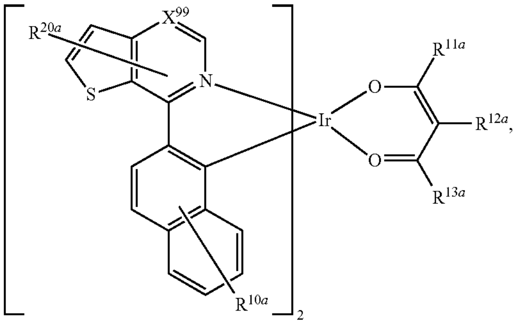
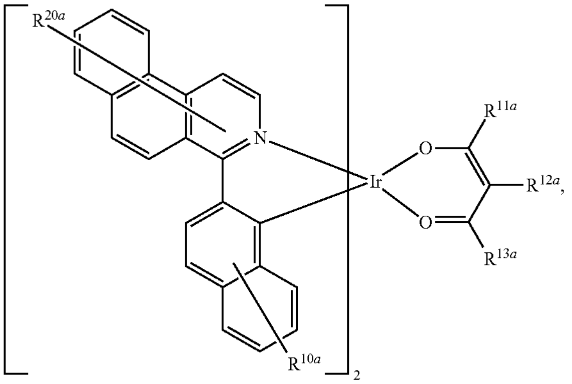
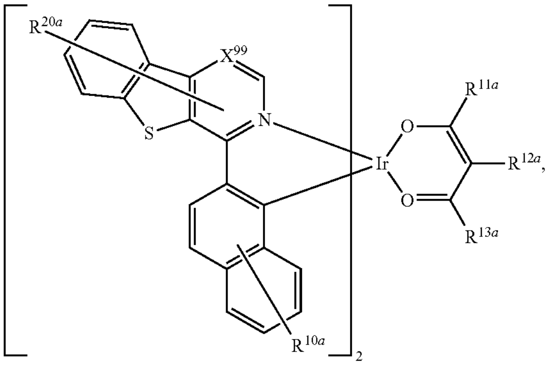
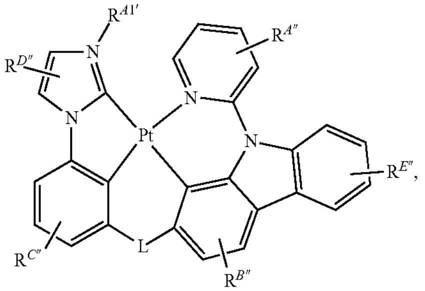
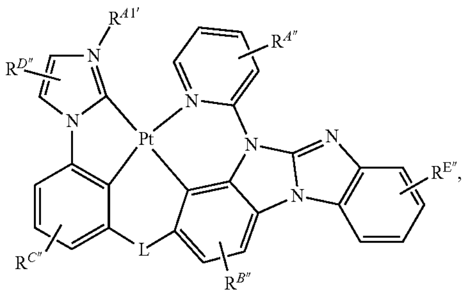
-continued
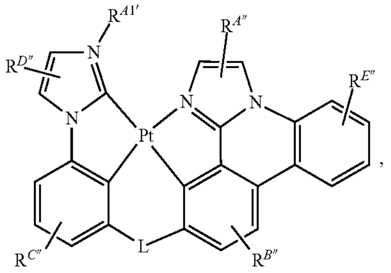
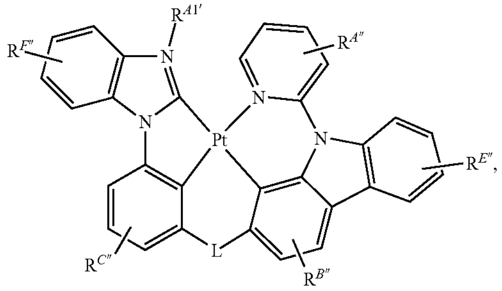
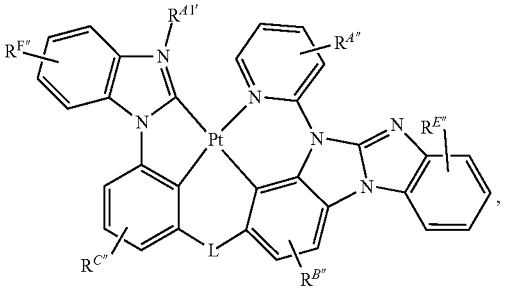
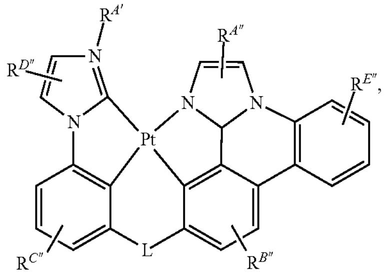
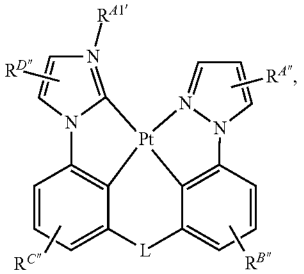
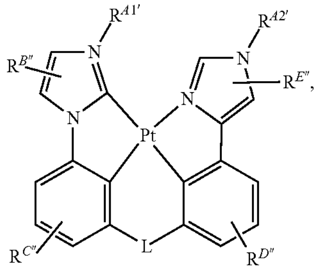

-continued
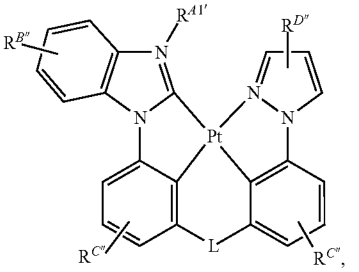
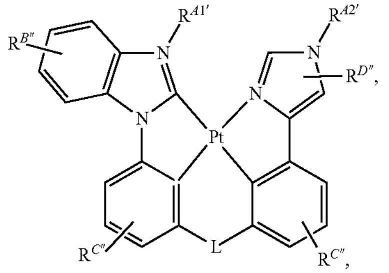
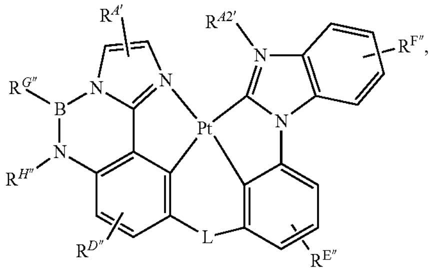
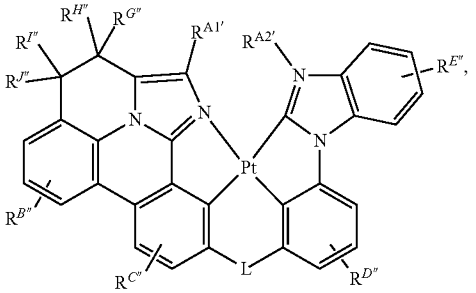
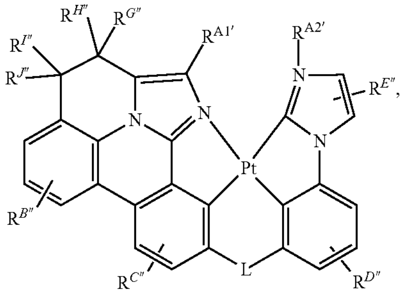
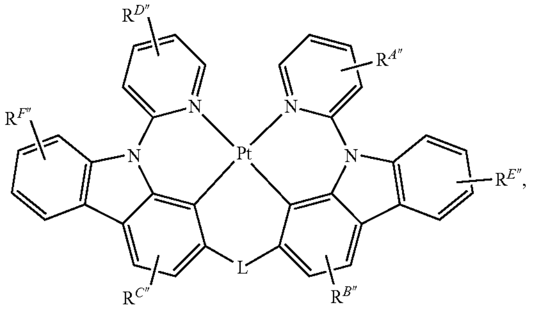
-continued
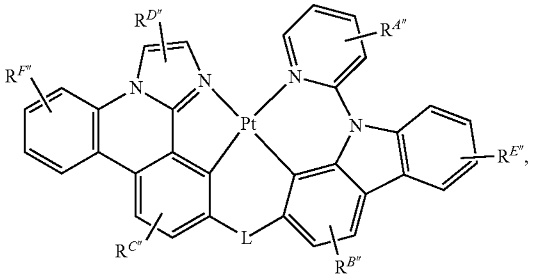
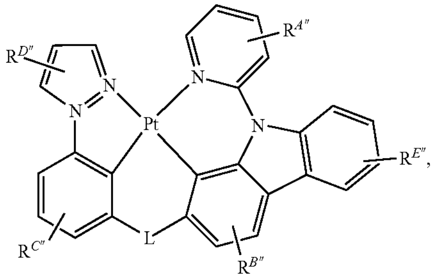
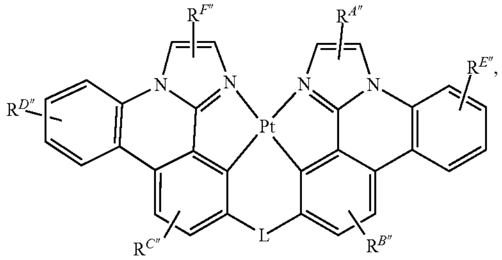
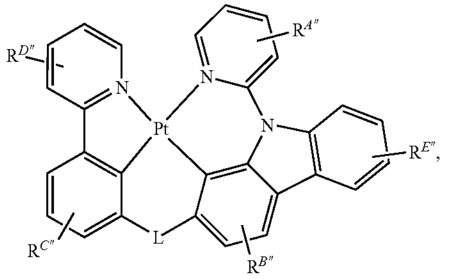
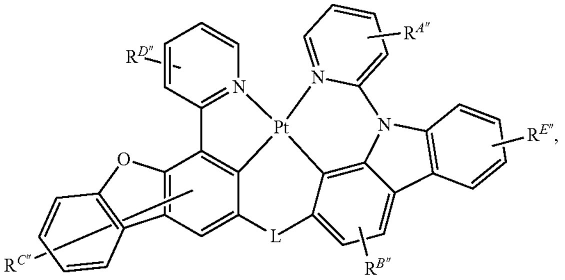
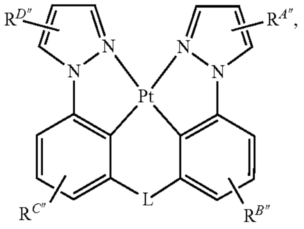

-continued
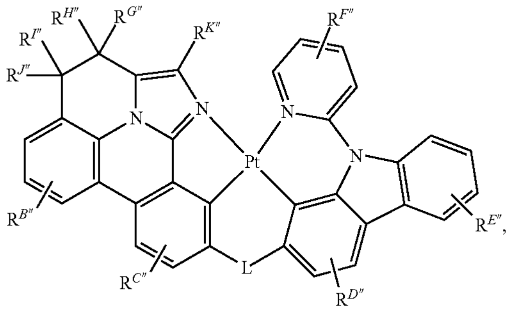
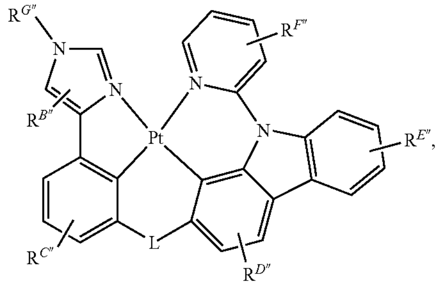
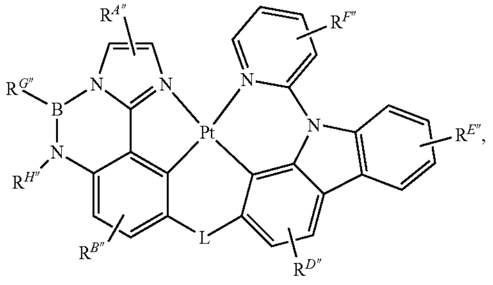
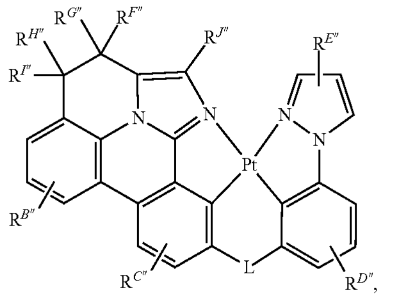
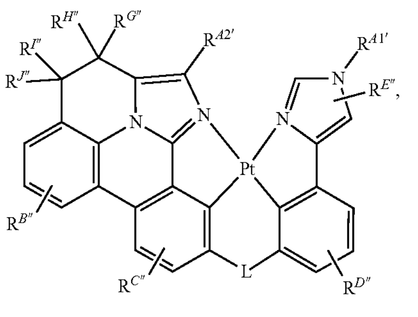
-continued
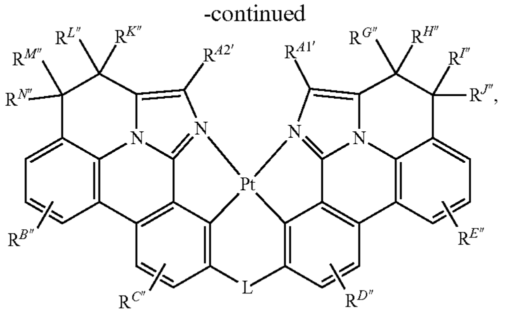
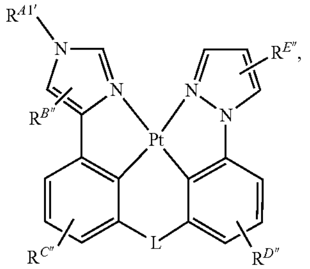
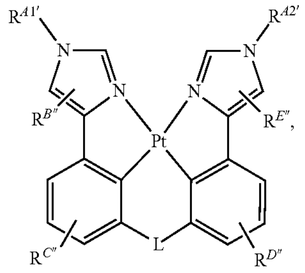
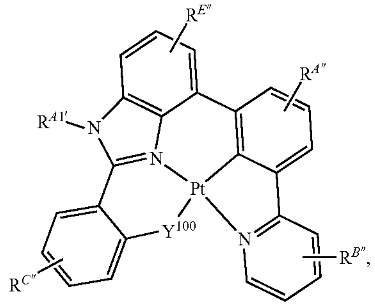
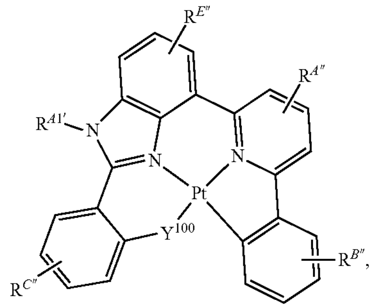
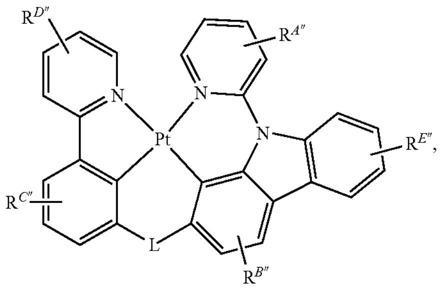

-continued
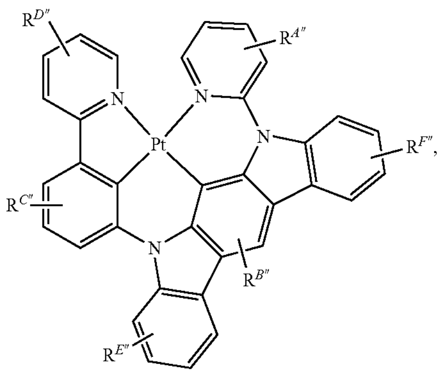
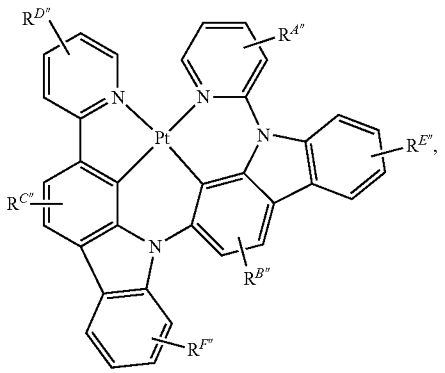
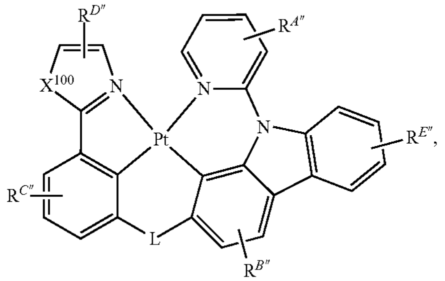
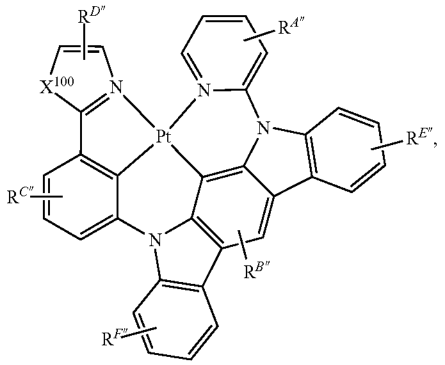
-continued
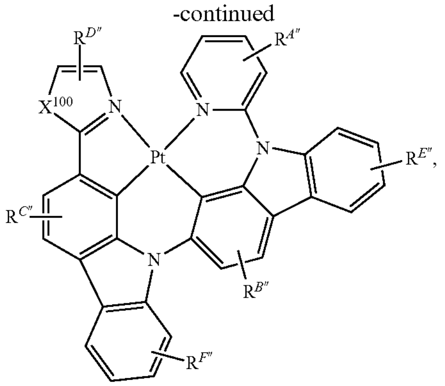
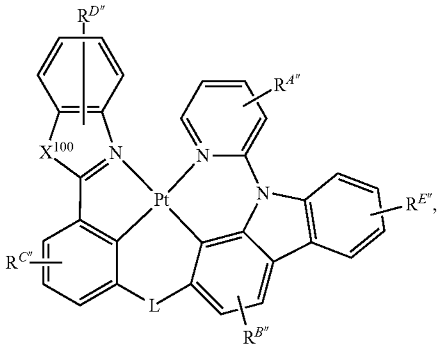
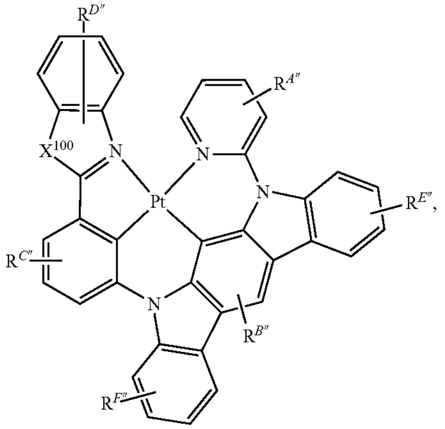
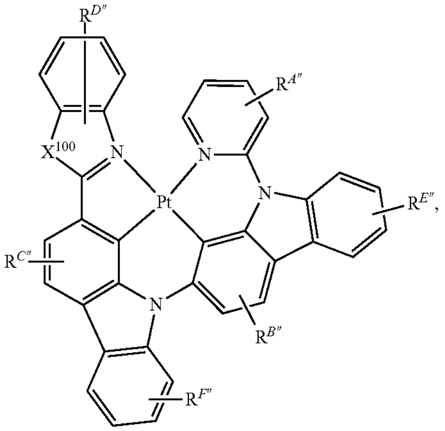

-continued
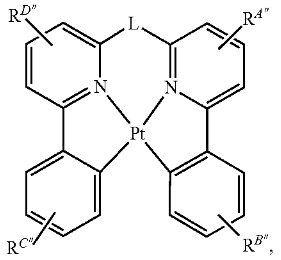
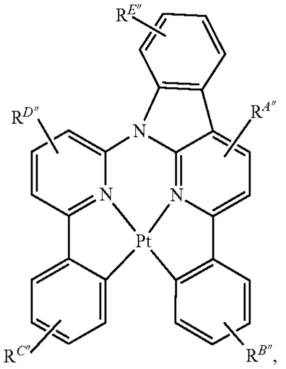
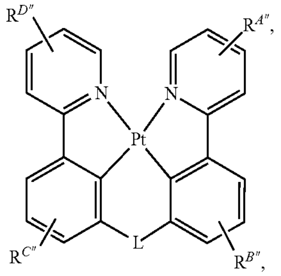
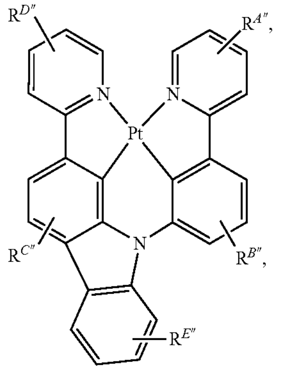
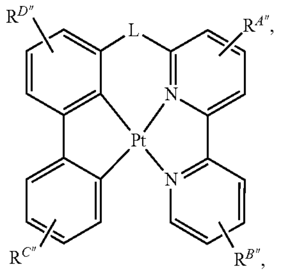
-continued
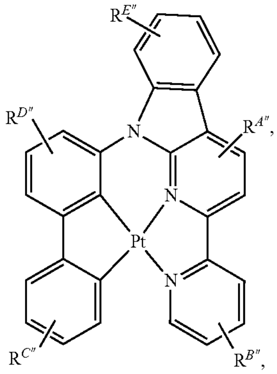
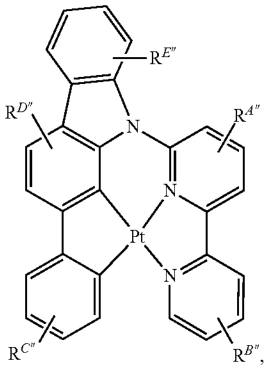
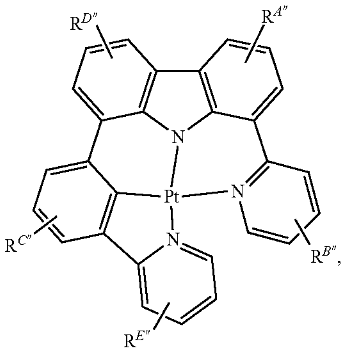
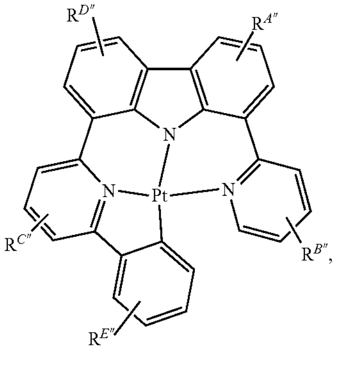

-continued
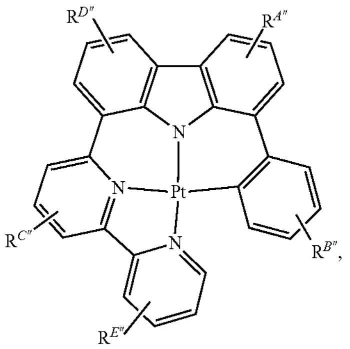
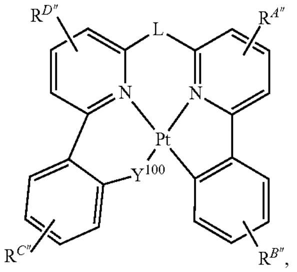
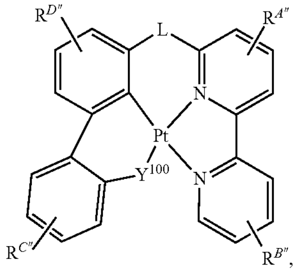
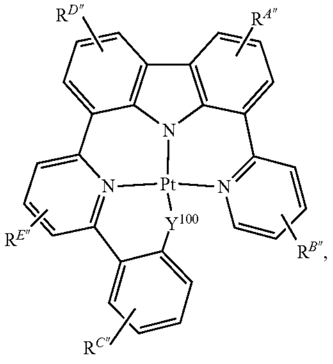
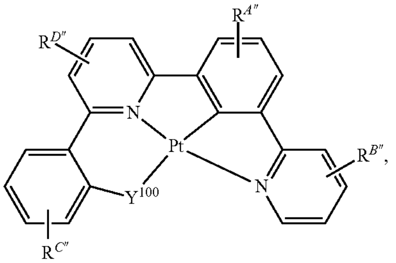
-continued
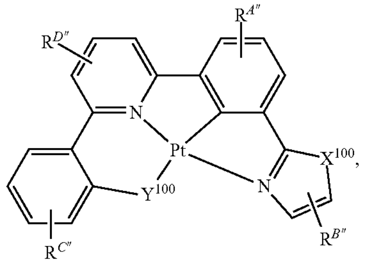
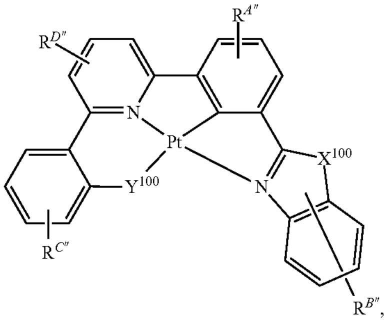
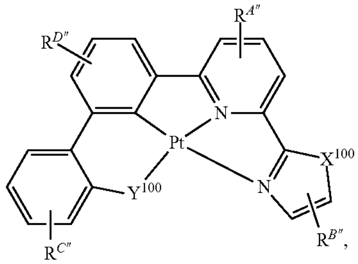
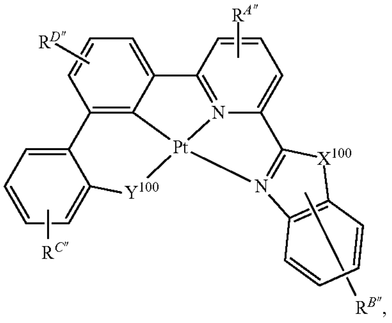
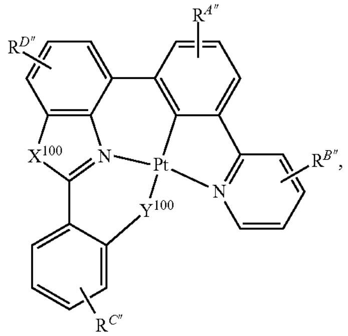
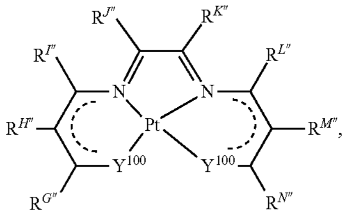

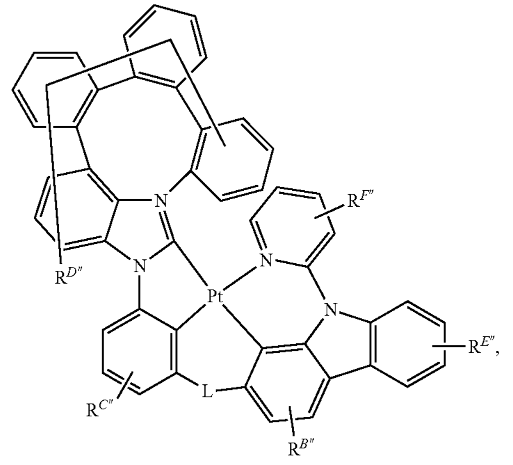
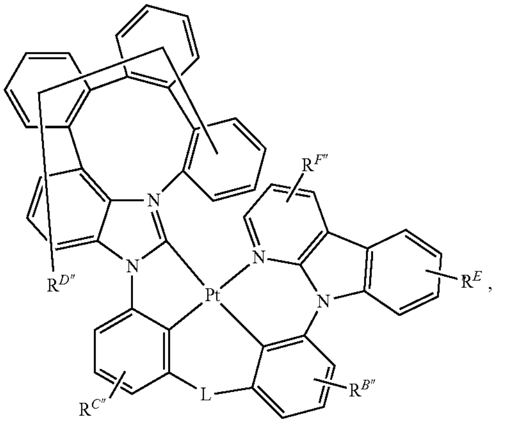
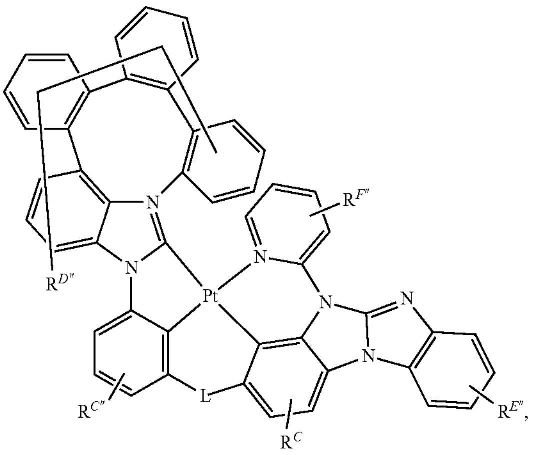
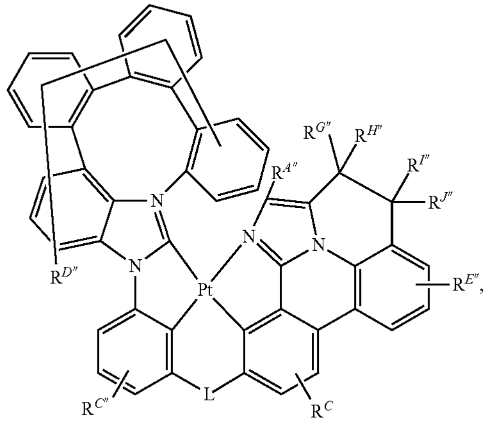
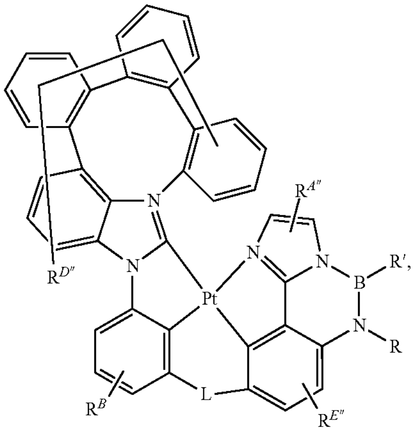
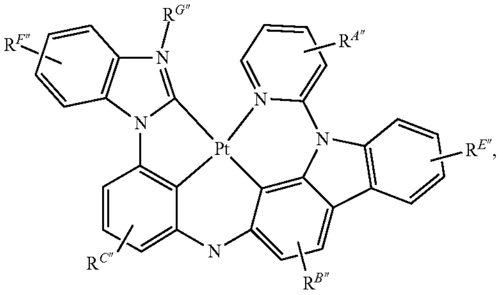
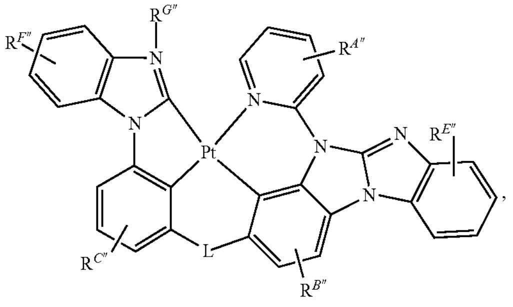
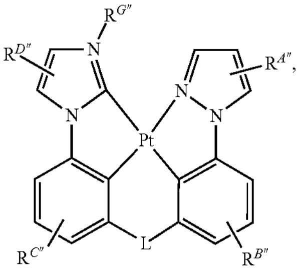

-continued

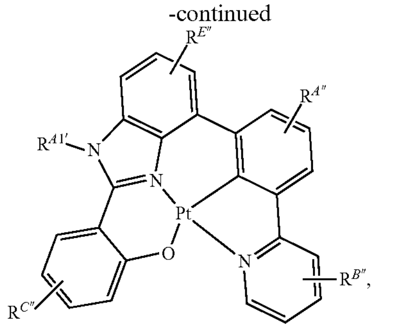

and

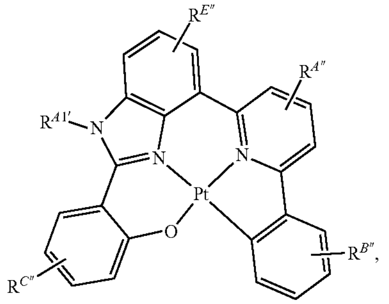

wherein:

each of $X^{96}$ to $X^{99}$ is independently C or N;

each $Y^{100}$ is independently selected from the group consisting of a NR", O, S, and Se;

L is independently selected from the group consisting of a direct bond, BR", BR"R"', NR", PR", O, S, Se, C═O, C═S, C═Se, C═NR", C═CR"R"', S═O, $SO_2$, CR", CR"R"', SiR"R"', GeR"R"', alkyl, cycloalkyl, aryl, heteroaryl, and combinations thereof;

$X^{100}$ for each occurrence is selected from the group consisting of O, S, Se, NR", and CR"R"';

each $R^{10a}$, $R^{20a}$, $R^{30a}$, $R^{40a}$, and $R^{50a}$, $R^{A''}$, $R^{B''}$, $R^{C''}$, $R^{D''}$, $R^{E''}$, and $R^{F''}$ independently represents mono-, up to the maximum substitutions, or no substitutions;

each of R, R', R", R"', $R^{10a}$, $R^{11a}$, $R^{12a}$, $R^{13a}$, $R^{20a}$, $R^{30a}$, $R^{40a}$, $R^{50a}$, $R^{60}$, $R^{70}$, $R^{97}$, $R^{98}$, $R^{99}$, $R^{A1'}$, $R^{A2'}$, $R^{A''}$, $R^{B''}$, $R^{C''}$, $R^{D''}$, $R^{E''}$, $R^{F''}$, $R^{G''}$, $R^{H''}$, $R^{I''}$, $R^{J''}$, $R^{K''}$, $R^{L''}$, $R^{M''}$, and $R^{N''}$ is independently a hydrogen or a general substituent as described herein; wherein any two substituents can be fused or joined to form a ring.

It should be understood that the metal Pt of each of the above compounds can be replaced by Pd, and those derived Pd compounds are also intended to be specifically covered.

In some embodiments of the OLED, the TADF emitter comprises at least one donor group and at least one acceptor group. In some embodiments, the TADF emitter is a metal complex. In some embodiments, the TADF emitter is a non-metal complex. In some embodiments, the TADF emitter is a Cu, Ag, or Au complex.

In some embodiments of the OLED, the TADF emitter has the formula of $M(L^5)(L^6)$, wherein M is Cu, Ag, or Au, $L^5$ and $L^6$ are different, and $L^5$ and $L^6$ are independently selected from the group consisting of:

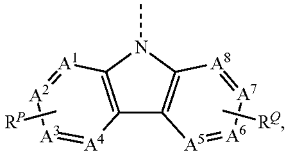

-continued

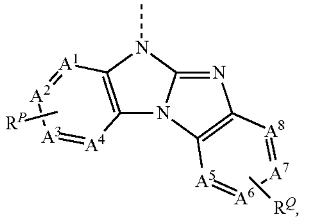

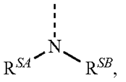

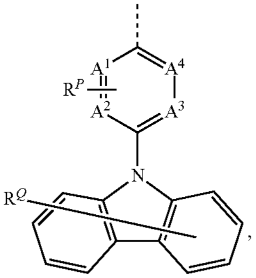

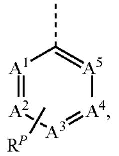

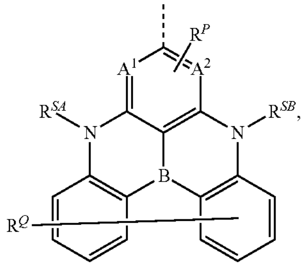

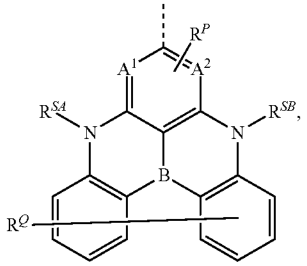

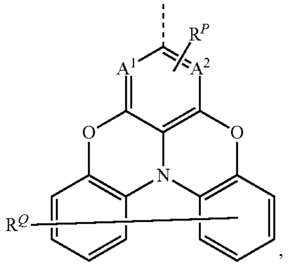

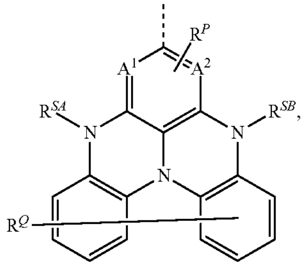

-continued

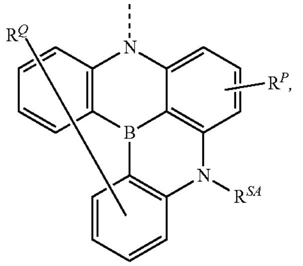

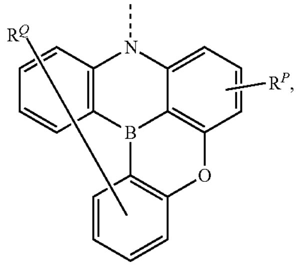

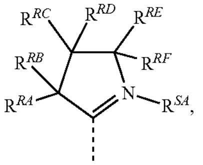

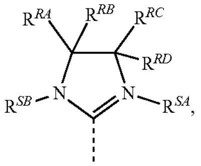

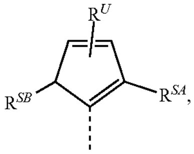

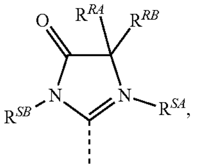

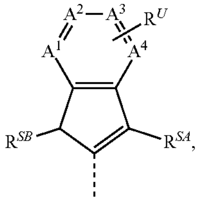

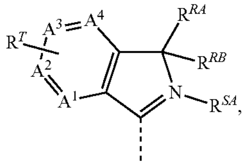

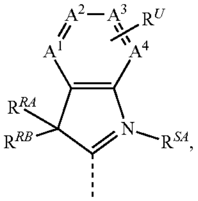

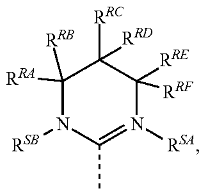

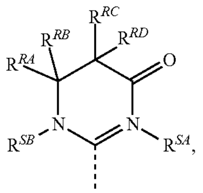

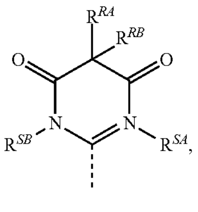

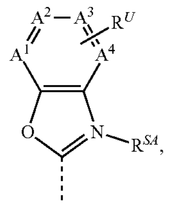

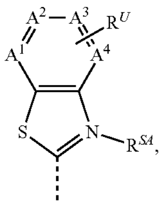

-continued

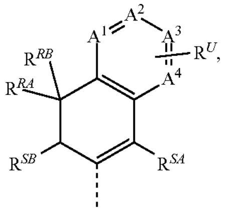

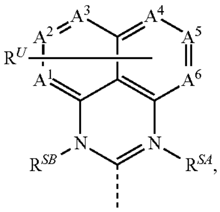

and

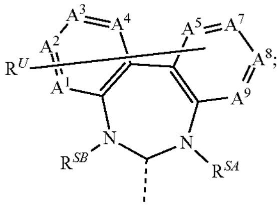

wherein $A^1$-$A^9$ are each independently selected from C or N;

wherein each $R^P$, $R^P$, $R^U$, $R^{SA}$, $R^{SB}$, $R^{RA}$, $R^{RB}$, $R^{RC}$, $R^{RD}$, $R^{RE}$, and $R^{RF}$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some embodiments of the OLED, the TADF emitter is selected from the group consisting of the structures in the following TADF LIST:

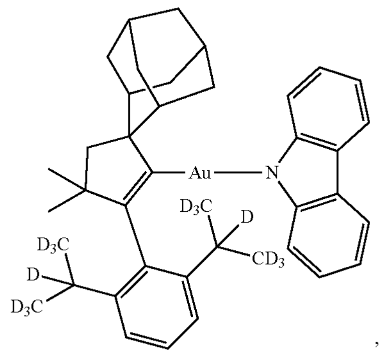

,

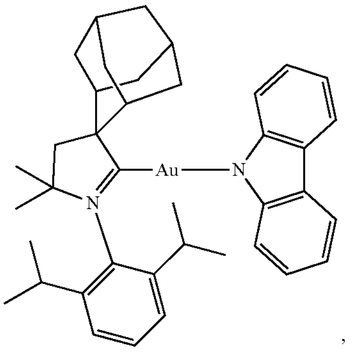

,

-continued
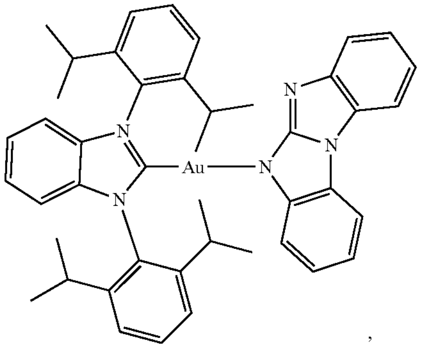
,
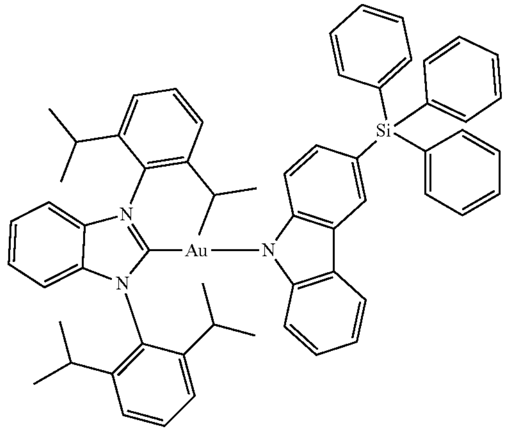
,
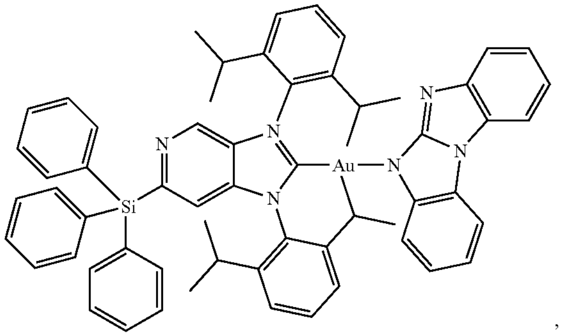
,
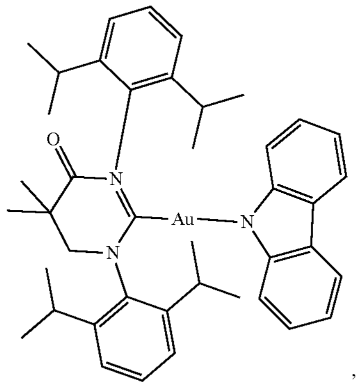
,
-continued
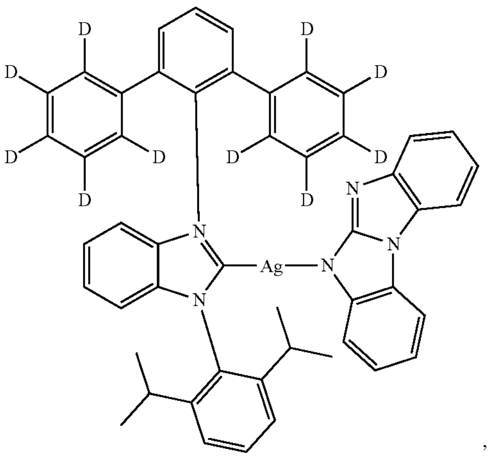
,
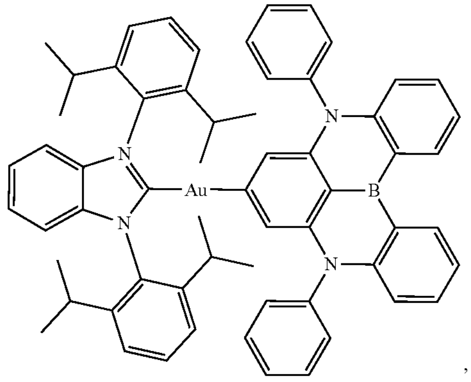
,
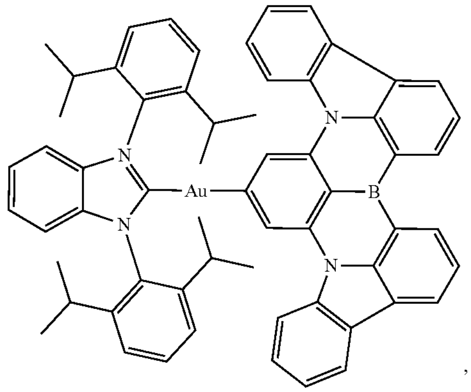
,
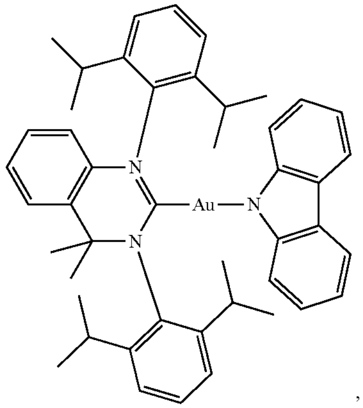
, -continued
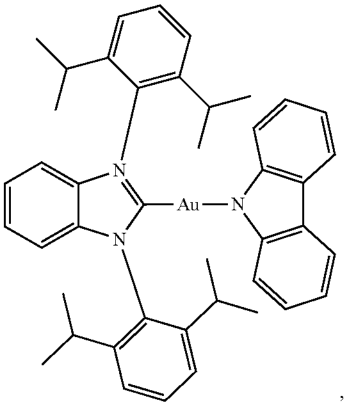
,
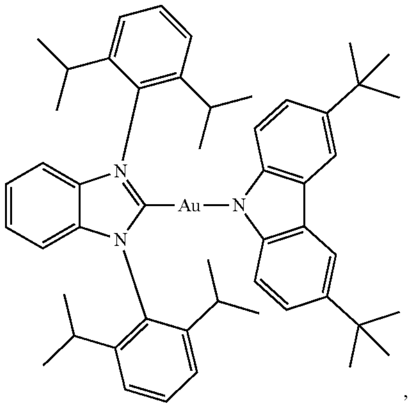
,
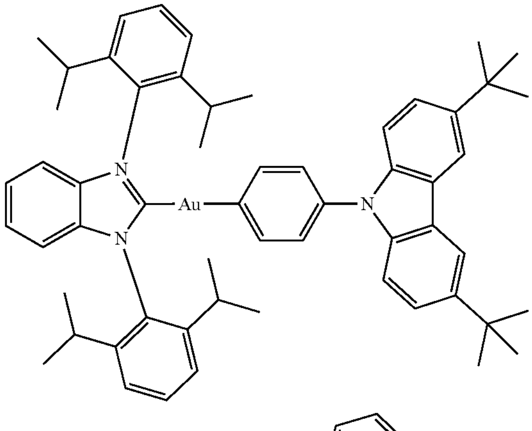
,
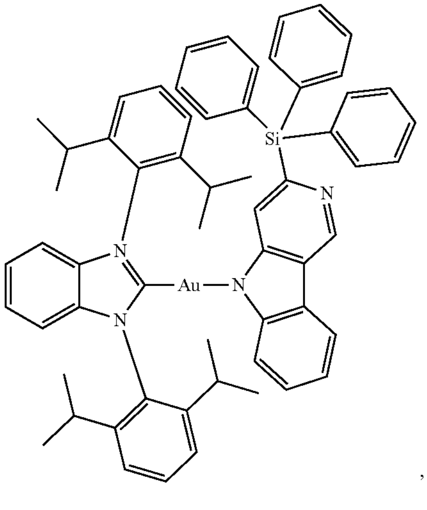
,
-continued
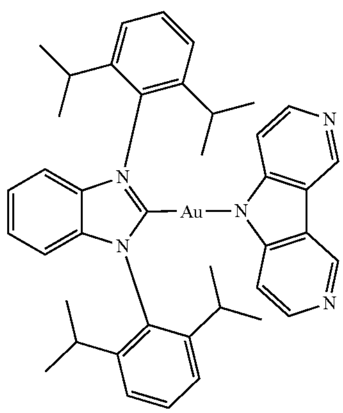
,
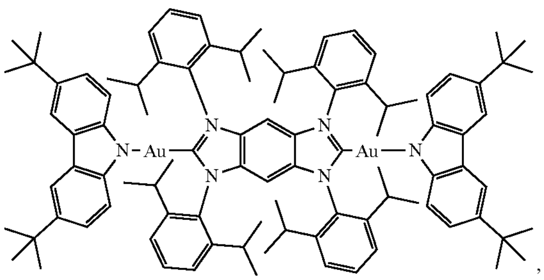
,
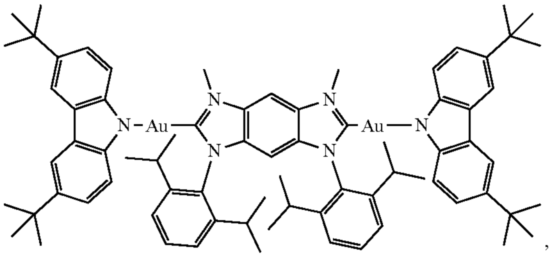
,
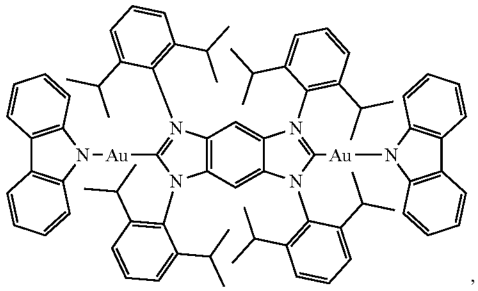
,
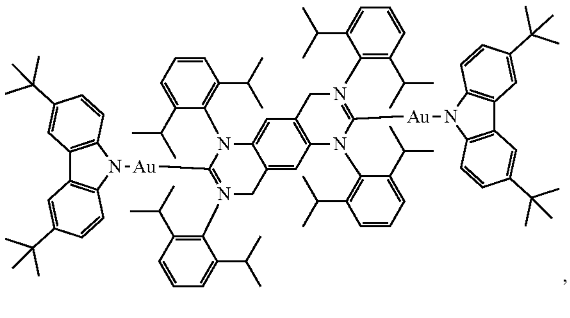
, -continued
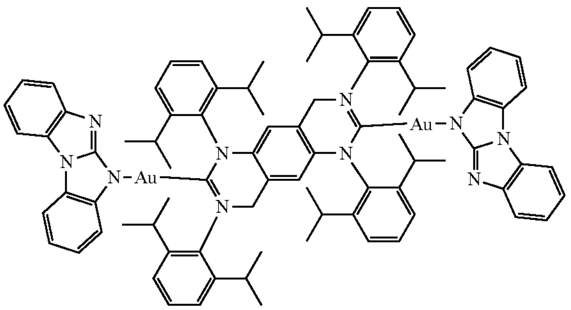
,
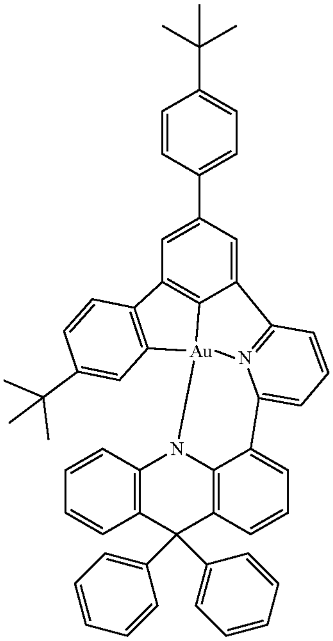
,
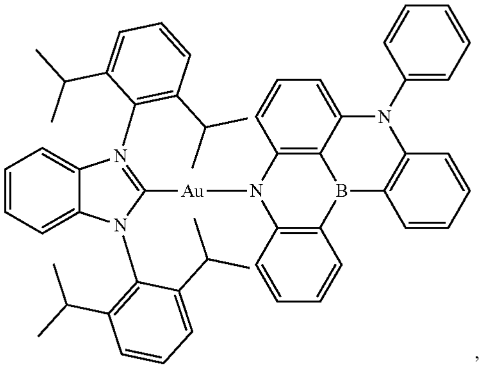
,
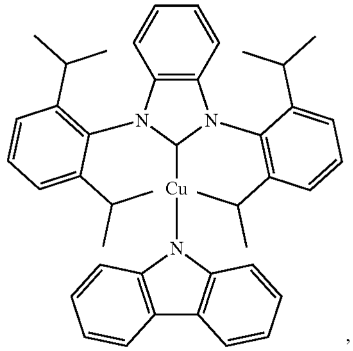
,
-continued
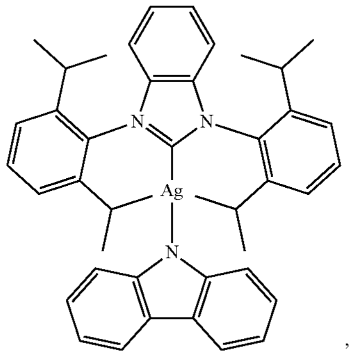
,
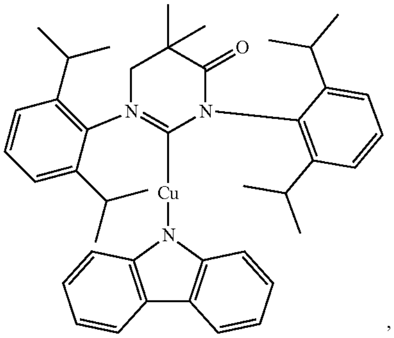
, and
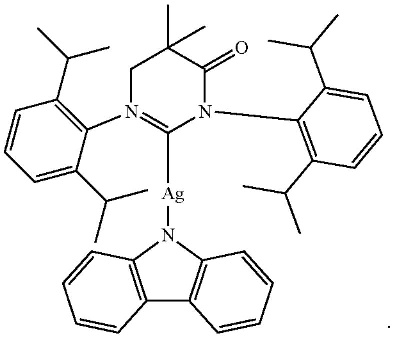
.
In some embodiments of the OLED, the TADF emitter comprises at least one of the chemical moieties selected from the group consisting of
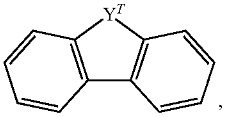
,
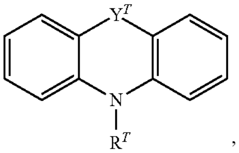
,
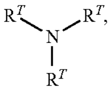
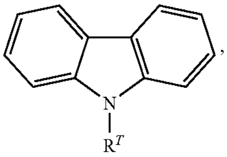
,
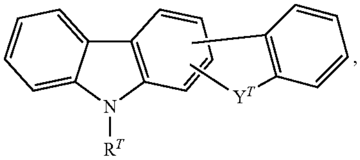
, -continued

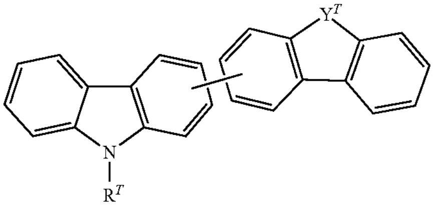

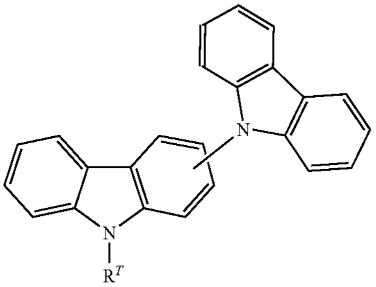

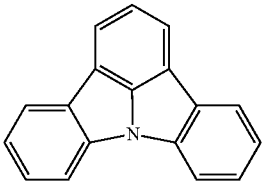

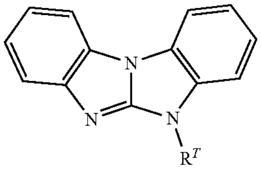

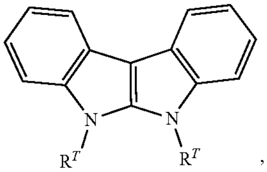

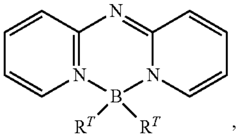

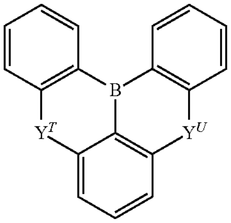

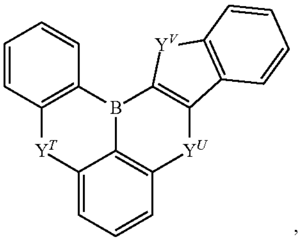

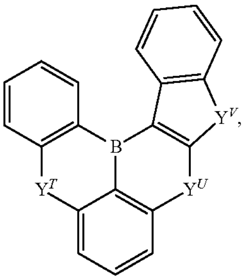

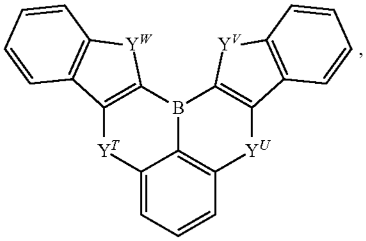

-continued

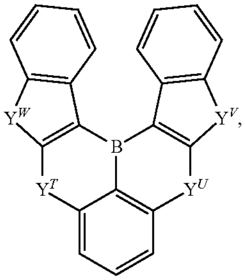

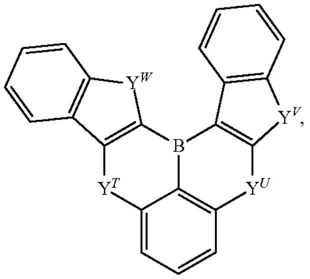

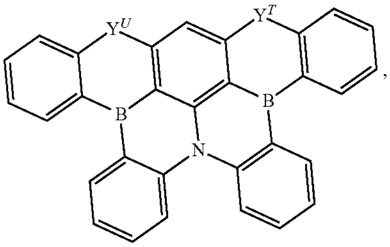

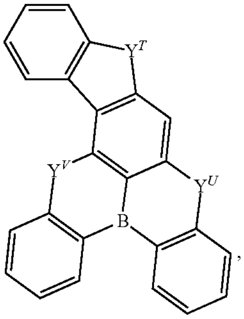

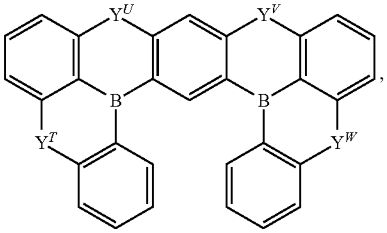

and

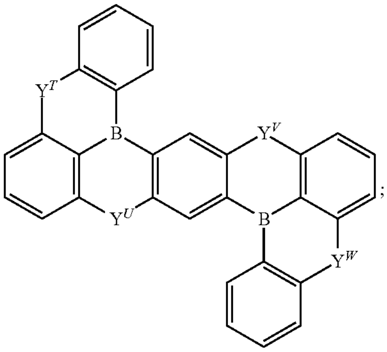

;

wherein $Y^T$, $Y^U$, $Y^V$, and $Y^W$ are each independently selected from the group consisting of BR, NR, PR, O, S, Se, C═O, S═O, $SO_2$, BRR', CRR', SiRR', and GeRR';

wherein each $R^T$ can be the same or different and each $R^T$ is independently a donor, an acceptor group, an organic linker bonded to a donor, an organic linker bonded to an acceptor group, or a terminal group selected from the group consisting of alkyl, cycloalkyl, heteroalkyl, heterocycloalkyl, arylalkyl, aryl, heteroaryl, and combinations thereof; and R, and R' are each independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some of the above embodiments, any carbon ring atoms up to maximum of a total number of three, together with their substituents, in each phenyl ring of any of above structures can be replaced with N.

In some embodiments, the TADF emitter comprises at least one of the chemical moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole.

In some embodiments, the fluorescent compound comprises at least one of the chemical moieties selected from the group consisting of:

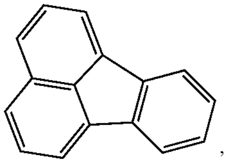
,
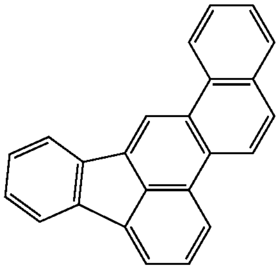
,
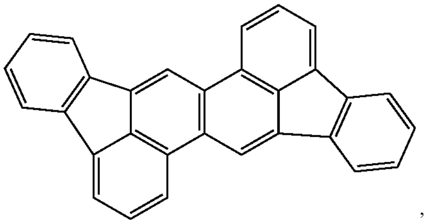
,
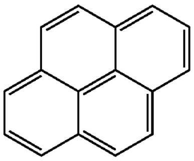
,
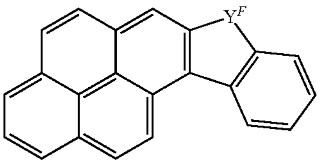
,
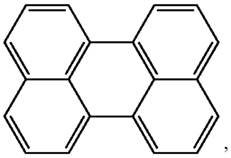
,
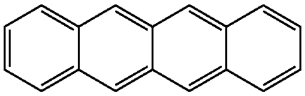
,
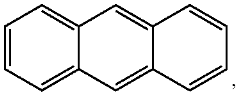
,
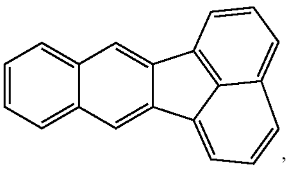
, -continued

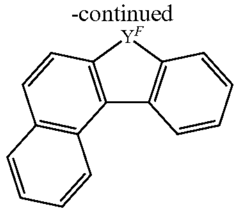
,
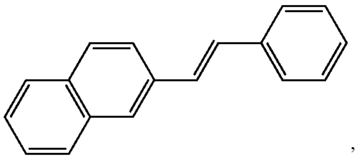
,
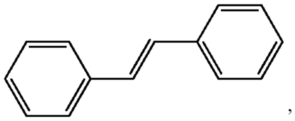
,
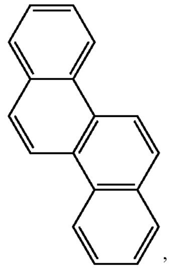
,
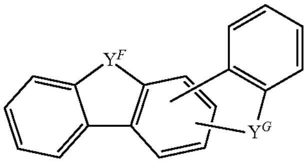
,
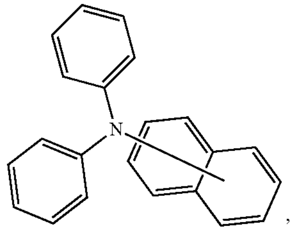
,
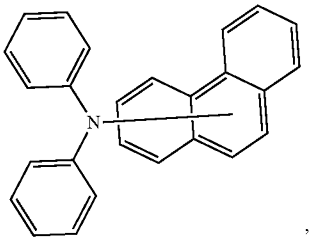
,
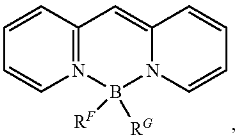
,
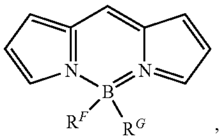
,
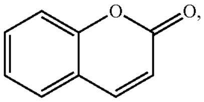
,
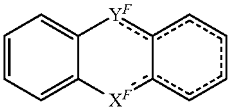
,
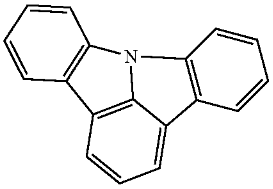
, -continued
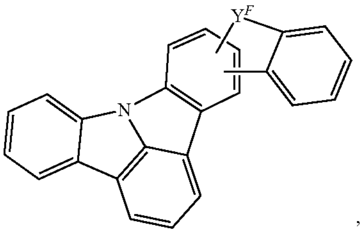
,
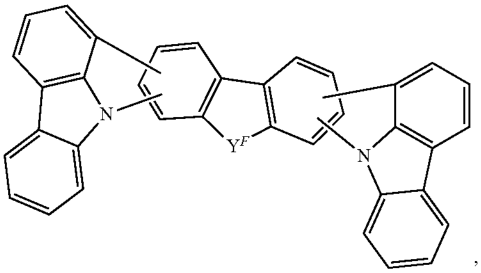
,
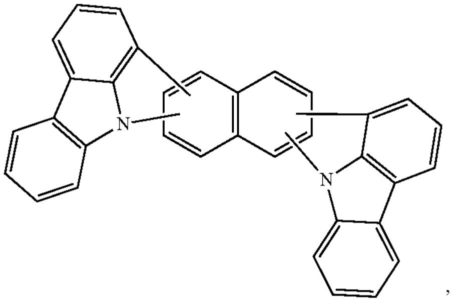
,
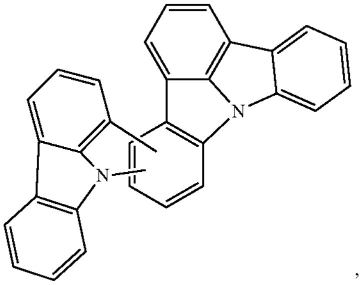
,
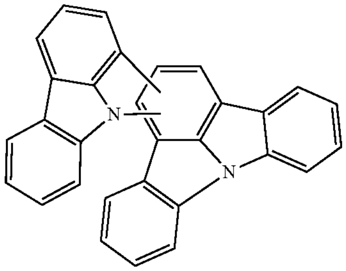
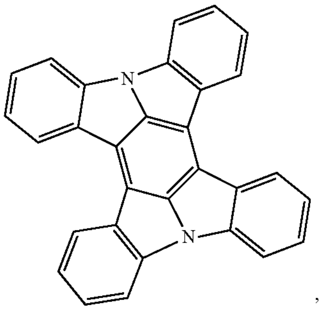
,
-continued
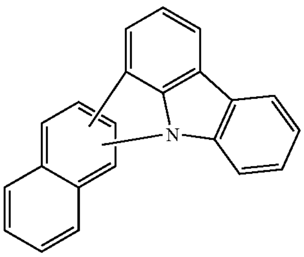
,
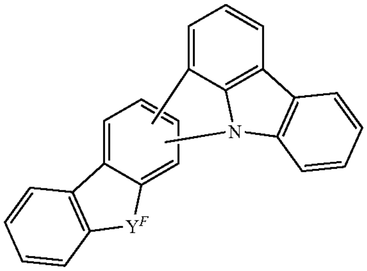
,
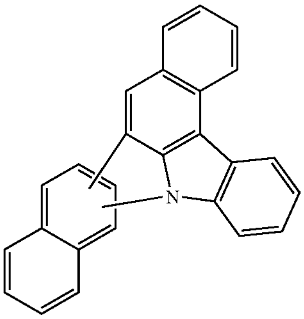
,
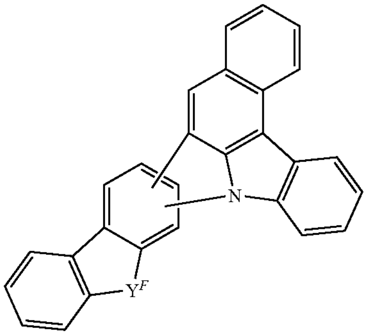
,
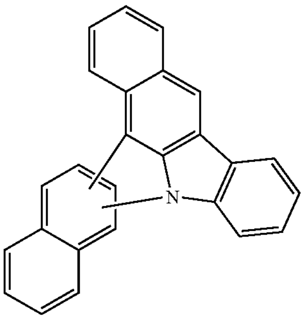
, -continued
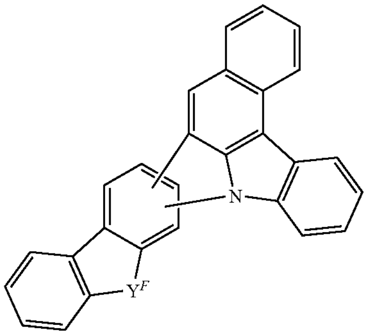
,
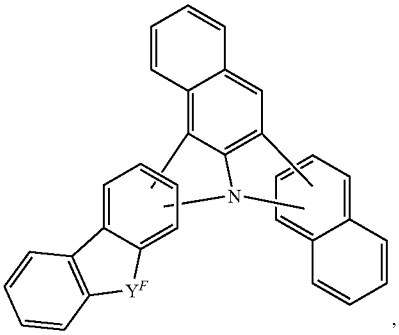
,
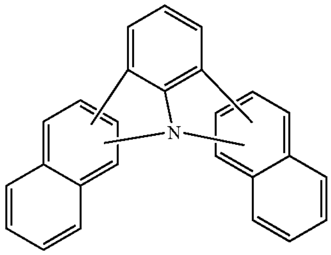
,
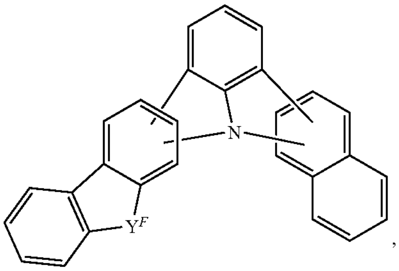
,
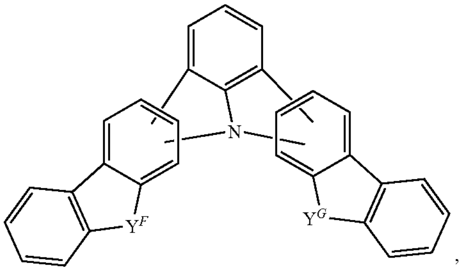
,
-continued
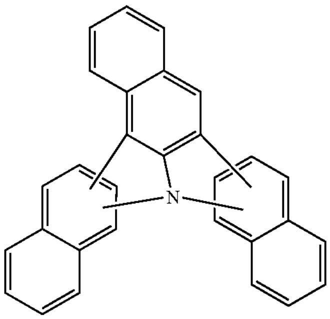
,
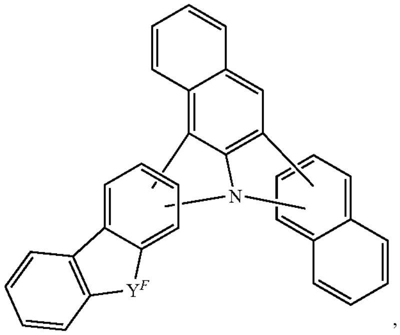
,
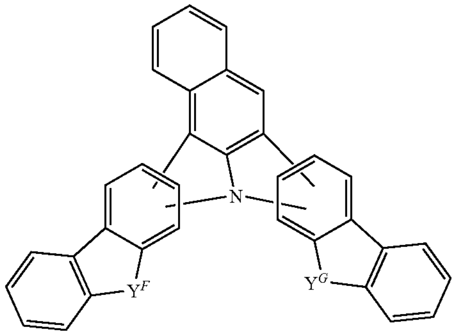
,
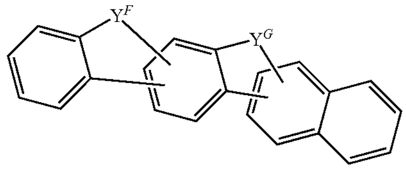
,
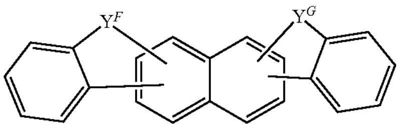
,
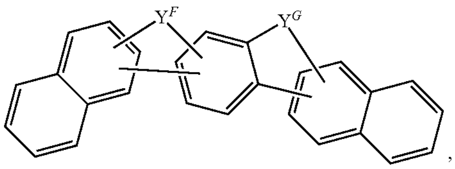
,
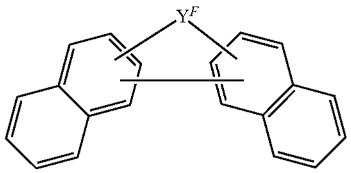
, -continued

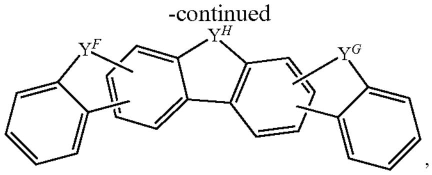

,

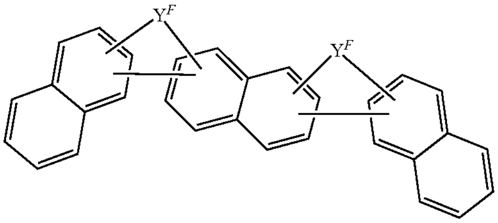

,

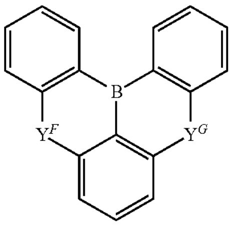

,

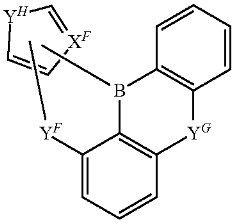

and

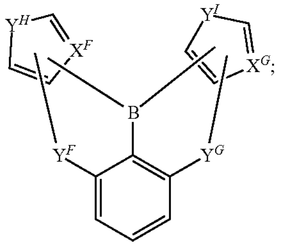

wherein $Y^F$, $Y^G$, $Y^H$ and $Y^I$ are each independently selected from the group consisting of BR, NR, PR, O, S, Se, C═O, S═O, $SO_2$, BRR', CRR', SiRR', and GeRR';

wherein $X^F$ and $Y^G$ are each independently selected from the group consisting of C and N; and wherein $R^F$, $R^G$, R, and R' are each independently a hydrogen or a substituent selected from the group consisting of the General Substituents as defined herein.

In some of the above embodiments, any carbon ring atoms up to maximum of a total number of three, together with their substituents, in each phenyl ring of any of above structures can be replaced with N.

In some embodiments of the OLED, the fluorescent compound is selected from the group consisting of:

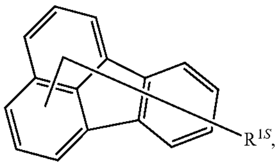

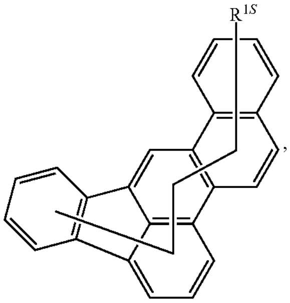

,

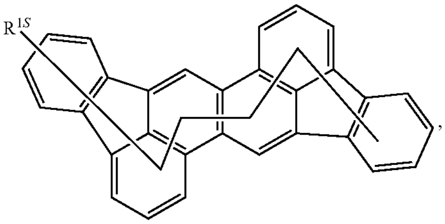

,

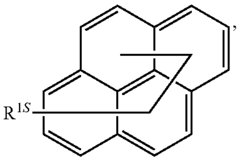

,

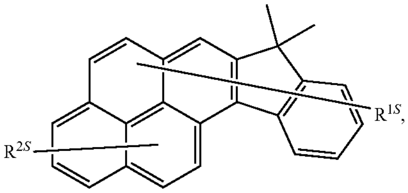

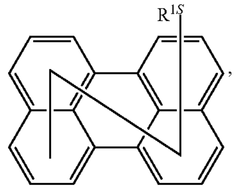

,

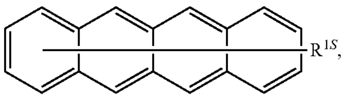

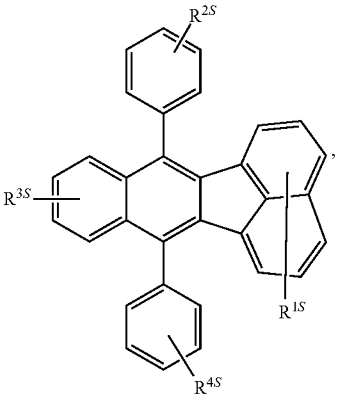

-continued
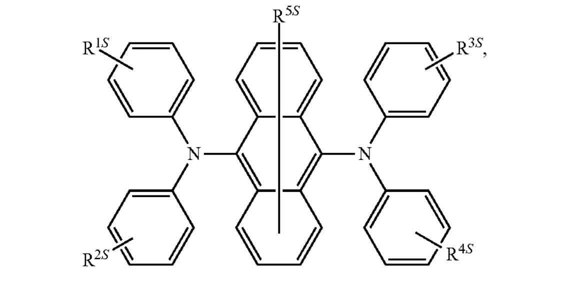
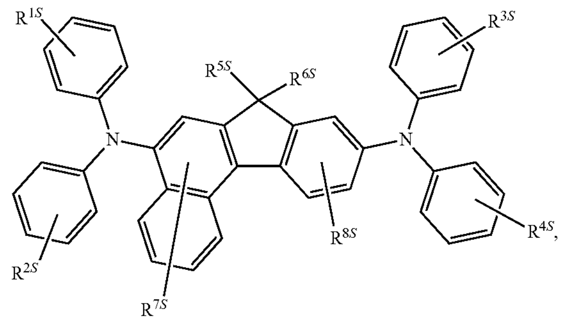
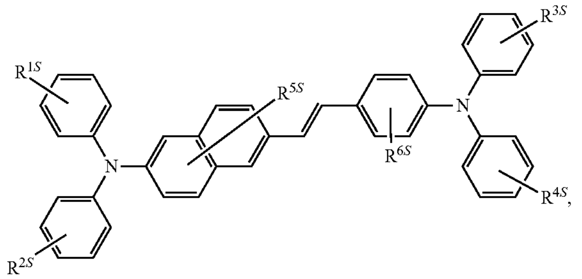
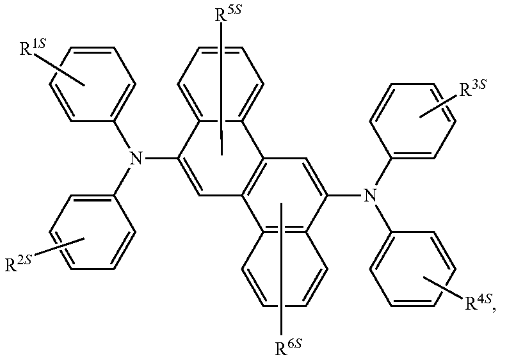
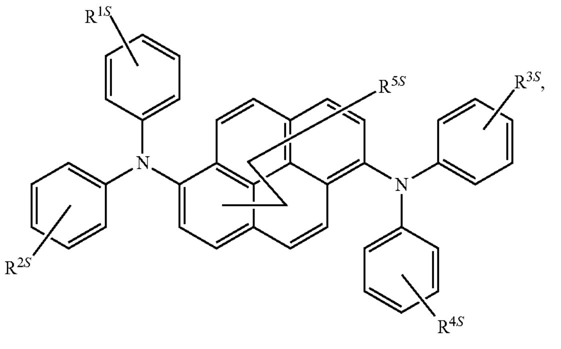
-continued
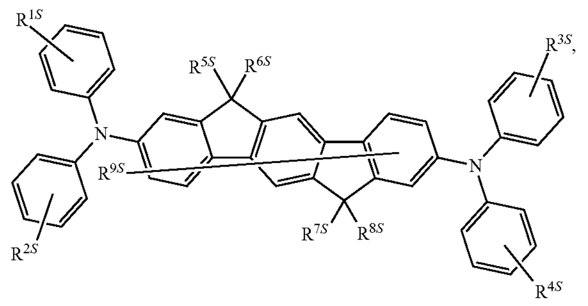
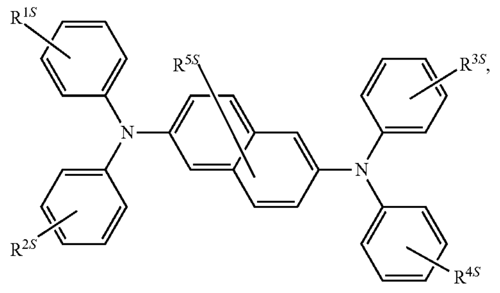
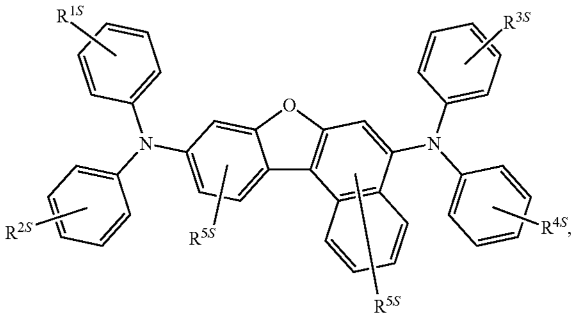
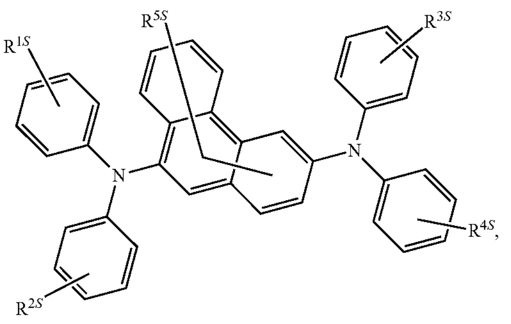
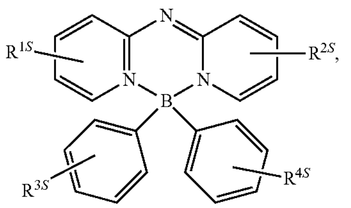
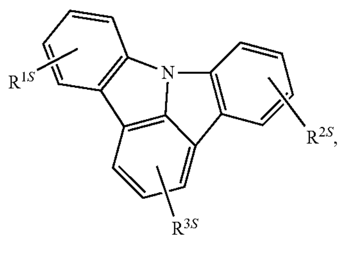

-continued
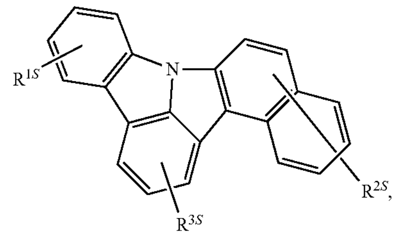
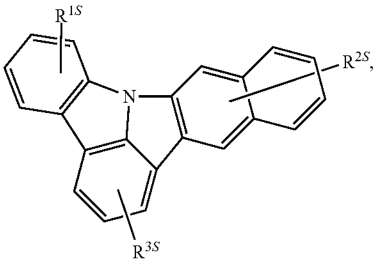
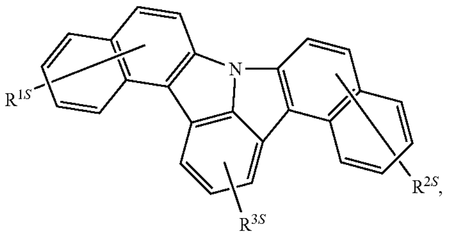
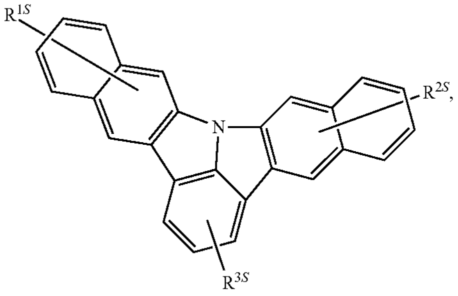
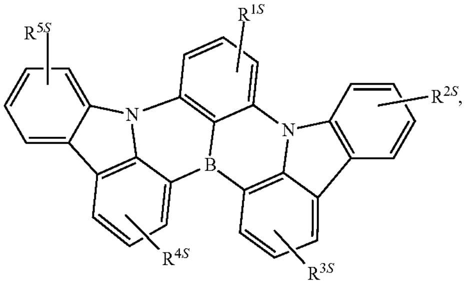
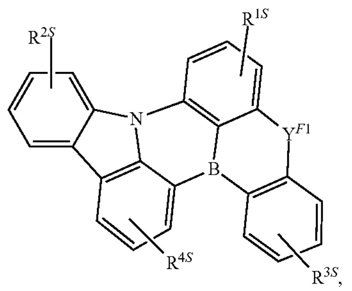
-continued
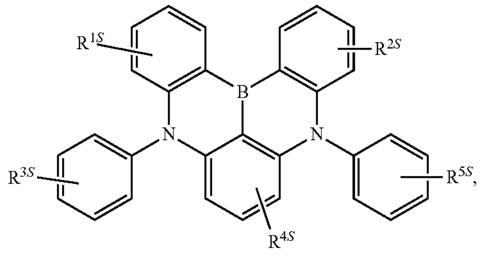
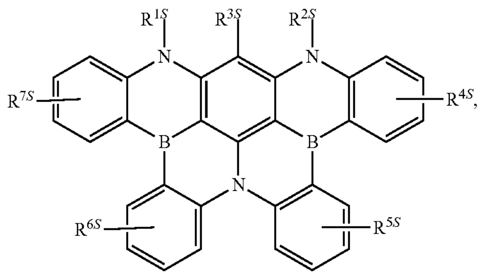
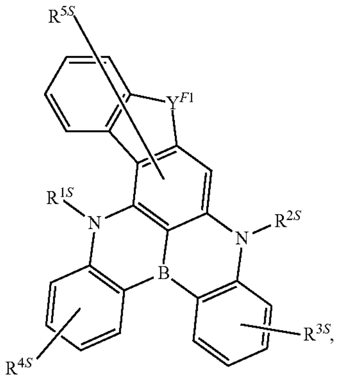
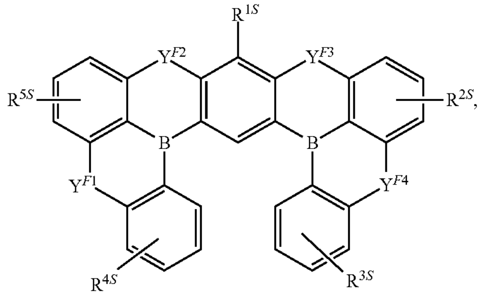
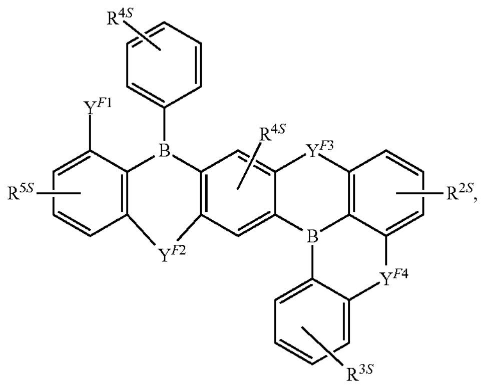

-continued
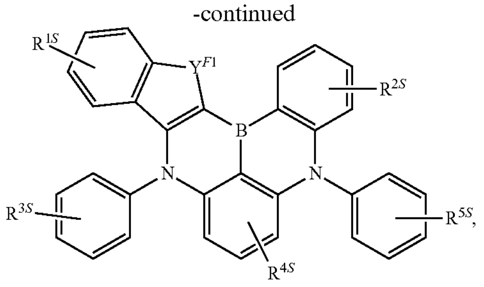
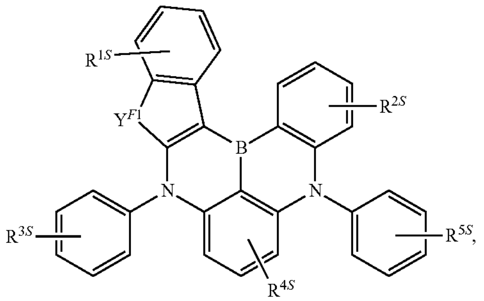
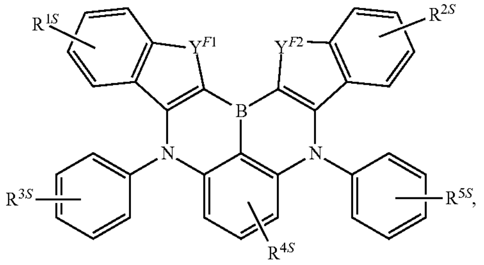
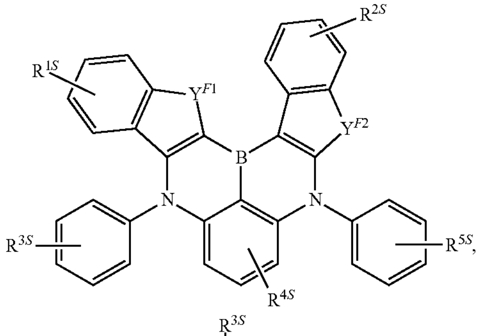
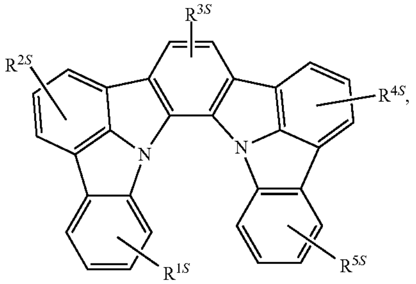
-continued
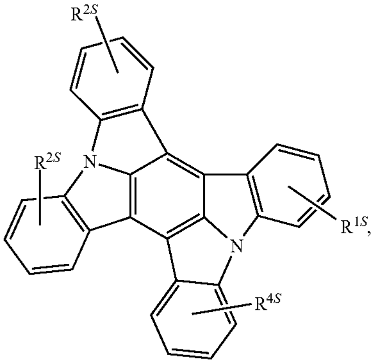
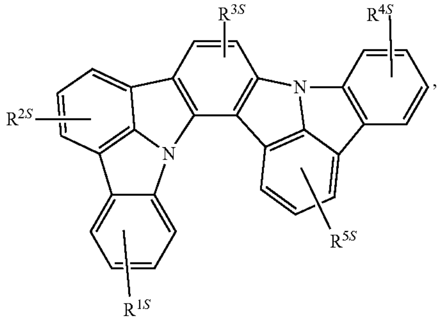
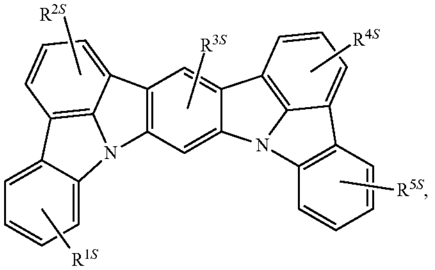
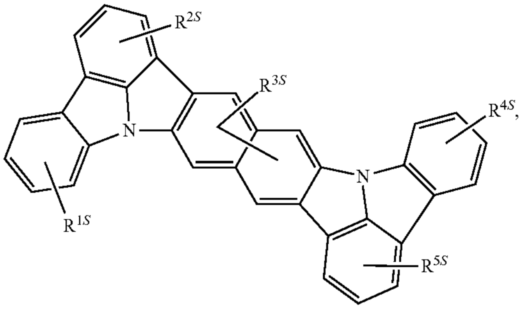
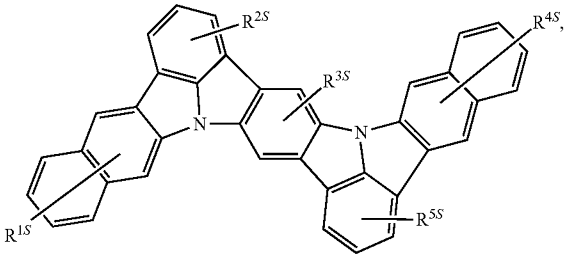
and -continued

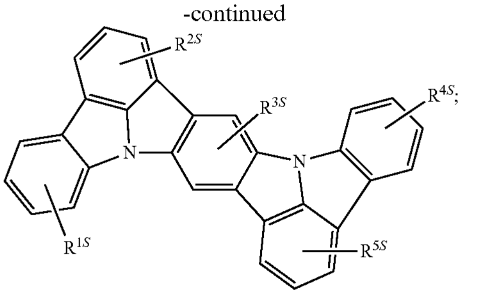

wherein $Y^{F1}$ to $Y^{F4}$ are each independently selected from O, S, and $NR^{F1}$;

wherein $R^{F1}$ and $R^{1S}$ to $R^{9S}$ each independently represents from mono to maximum possible number of substitutions, or no substitution; and wherein $R^{F1}$ and $R^{1S}$ to $R^{9S}$ are each independently a hydrogen or a substituent selected from the group consisting of the general substituents as defined herein.

In some embodiments, the emitter is selected from the group consisting of the following structures:

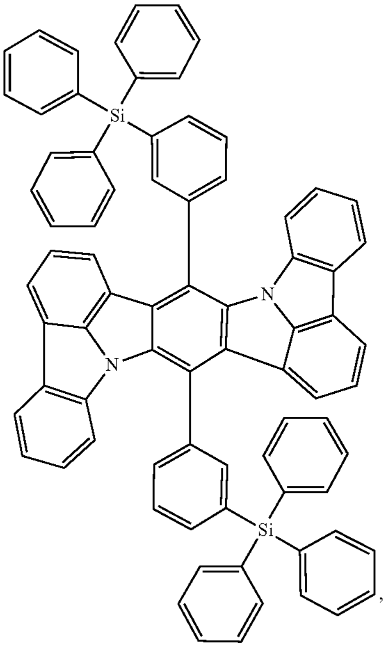

,

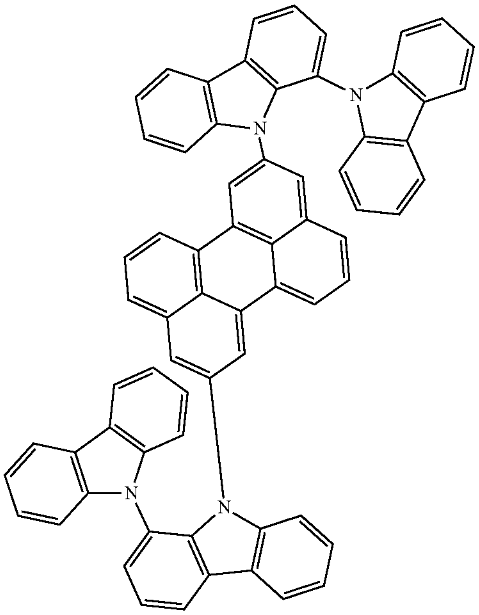

,

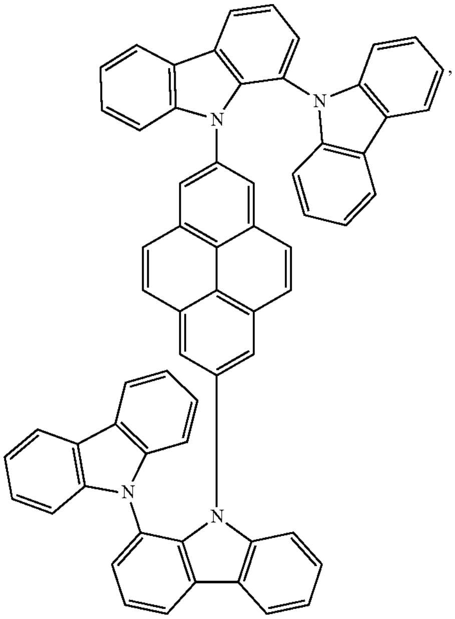

,

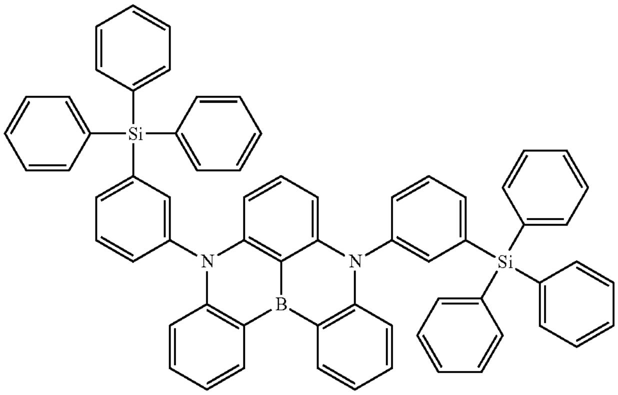

,

-continued
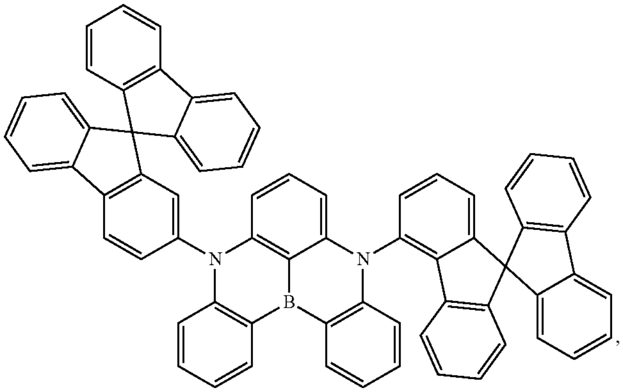
,
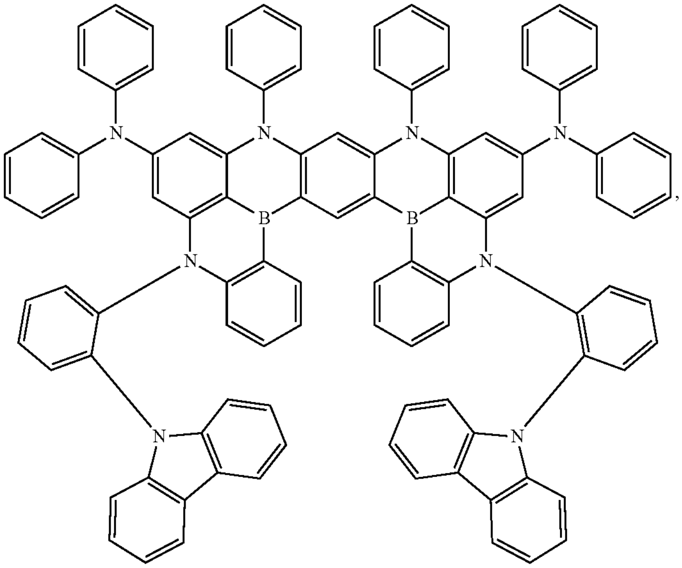
,
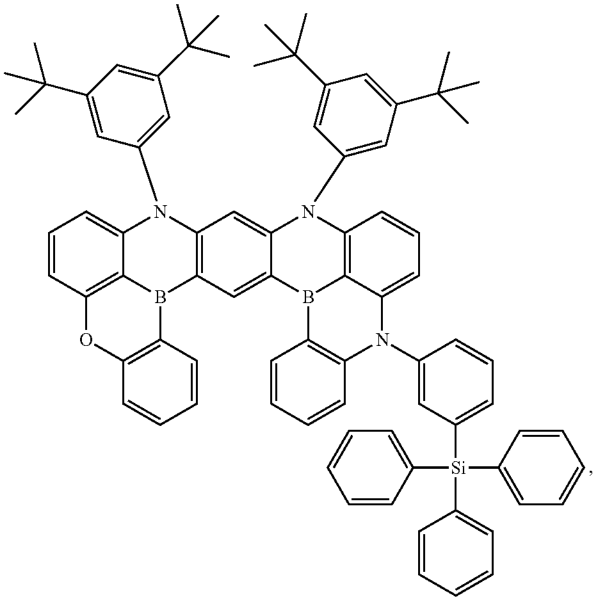
,

-continued
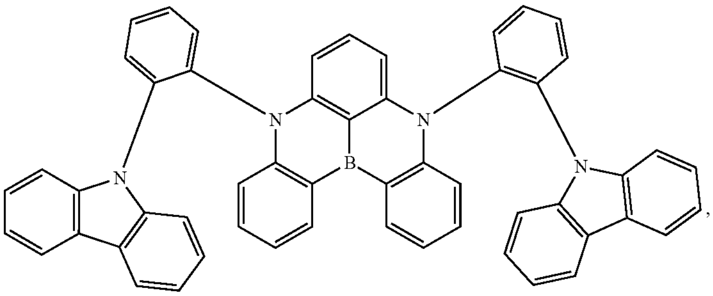,
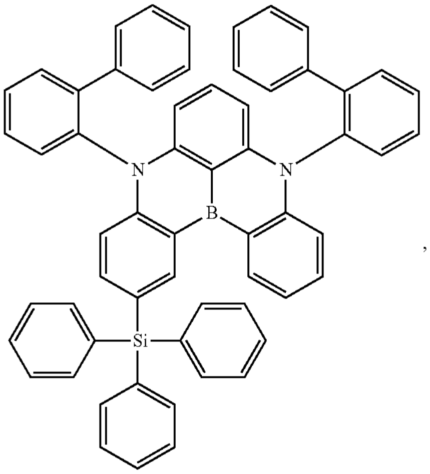,
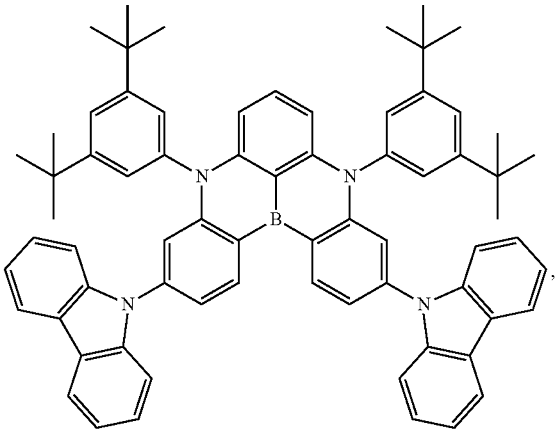,
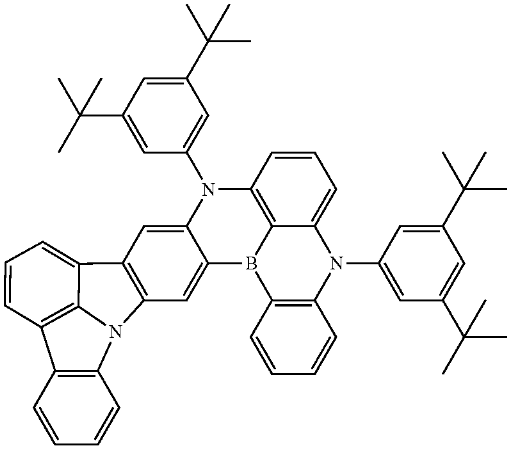,
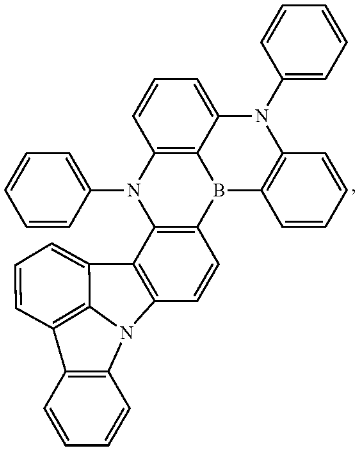,
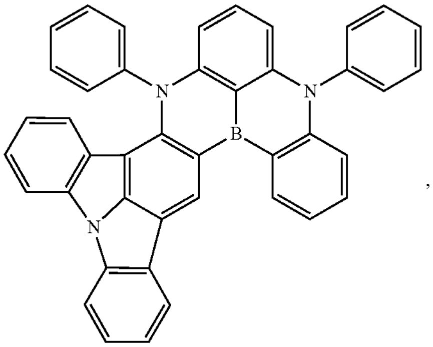,
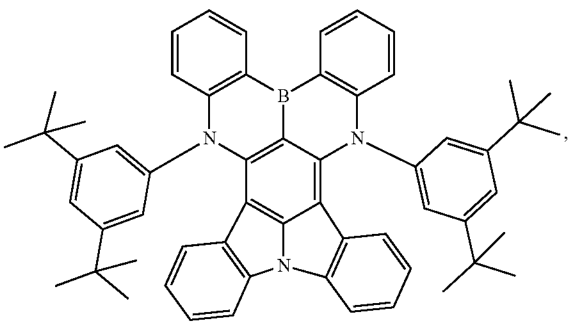,
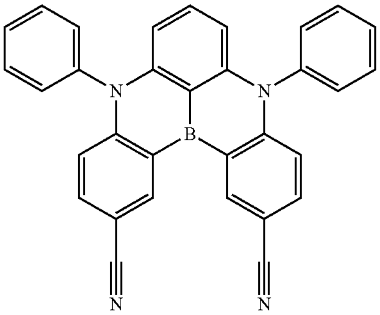, -continued
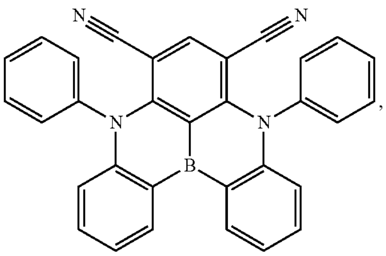
,
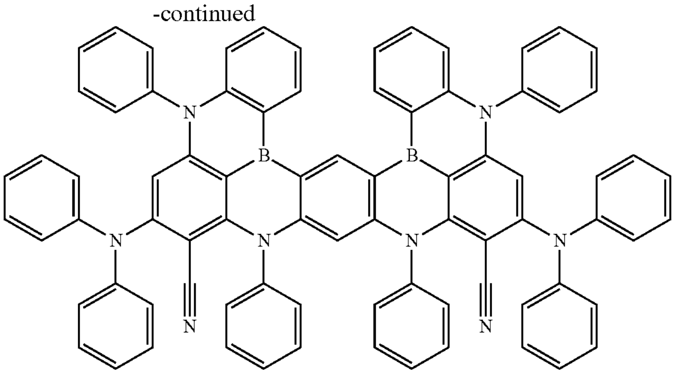
,
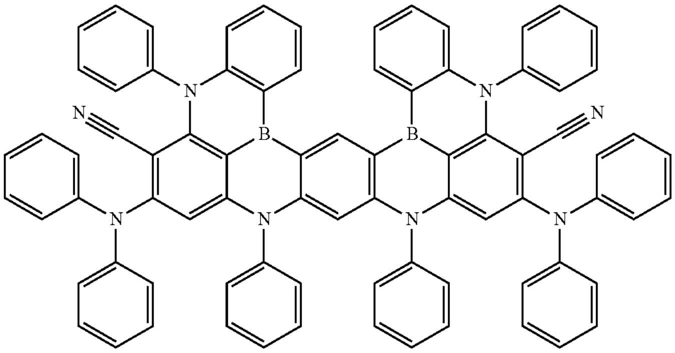
,
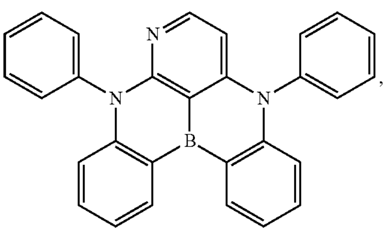
,
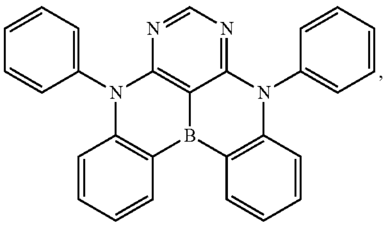
,
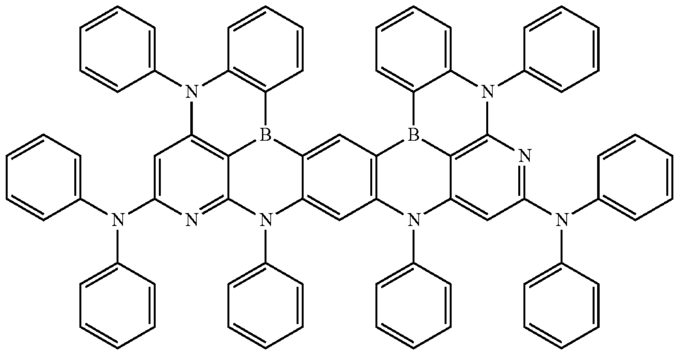
,
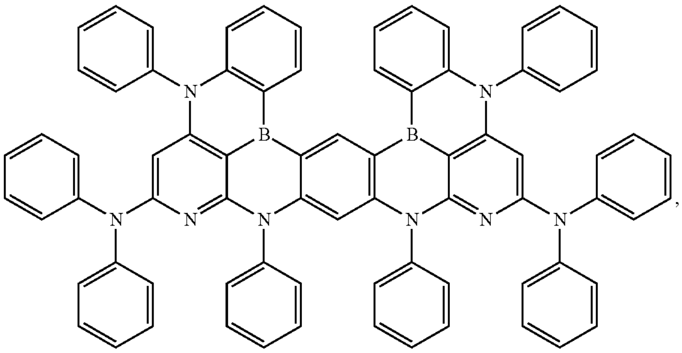
,
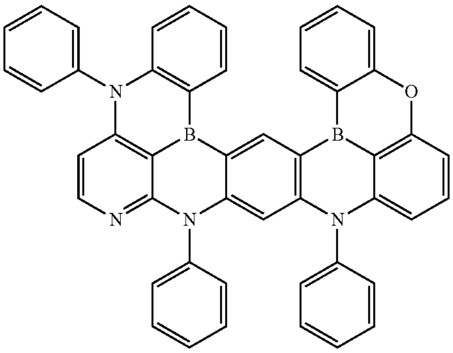
, -continued
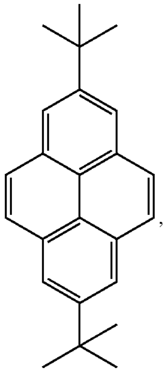,
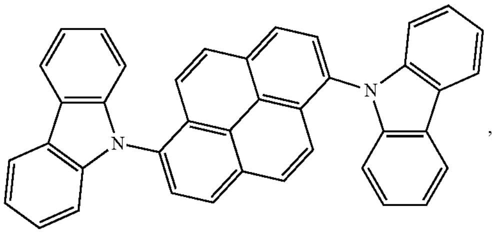,
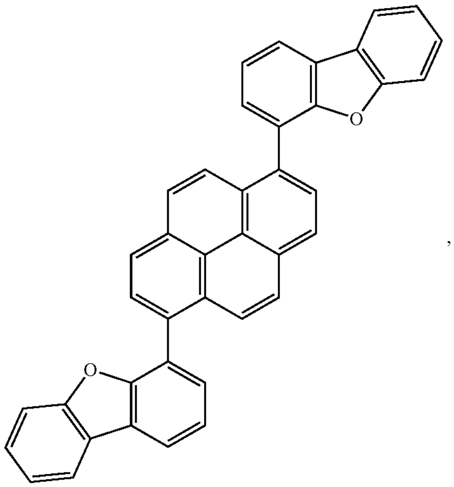,
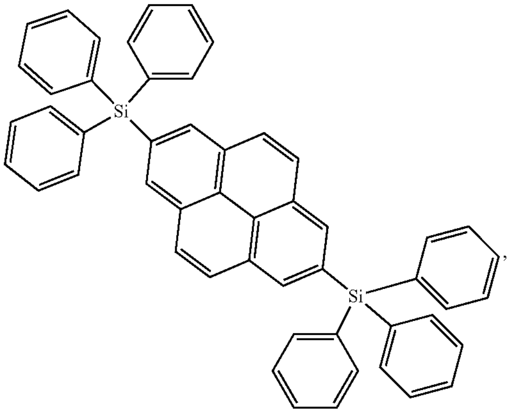,
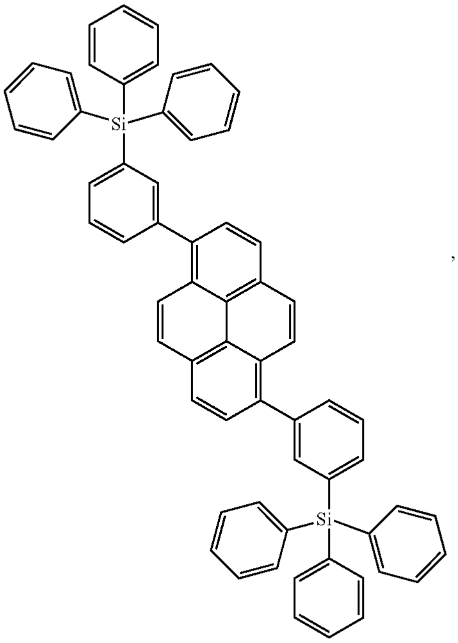,
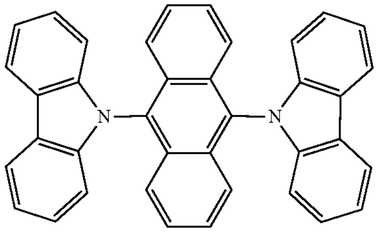,
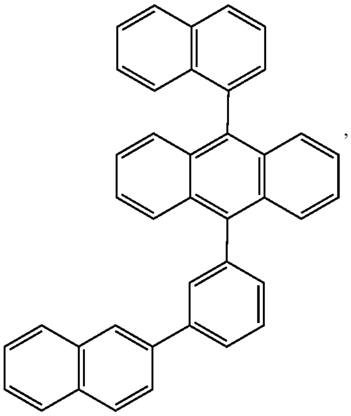,
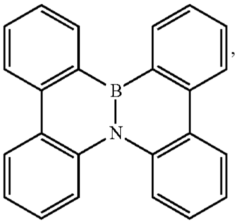, -continued
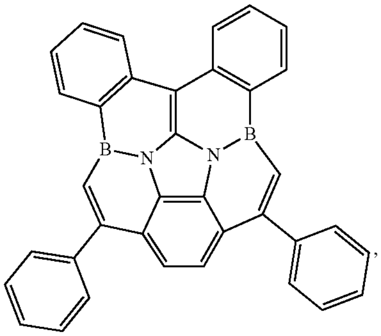,
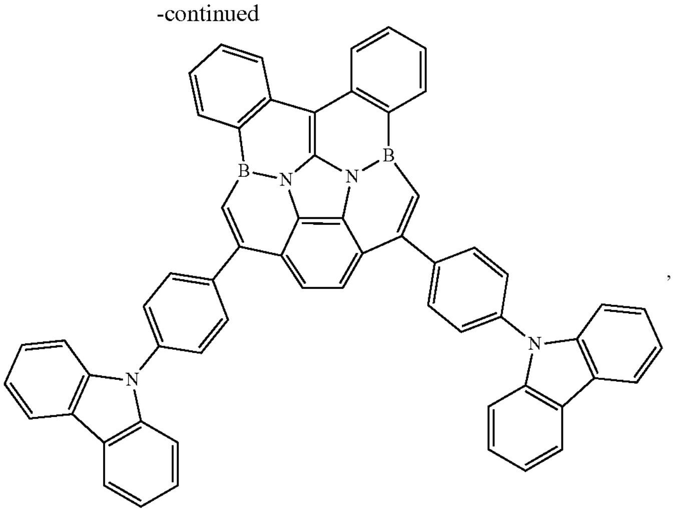,
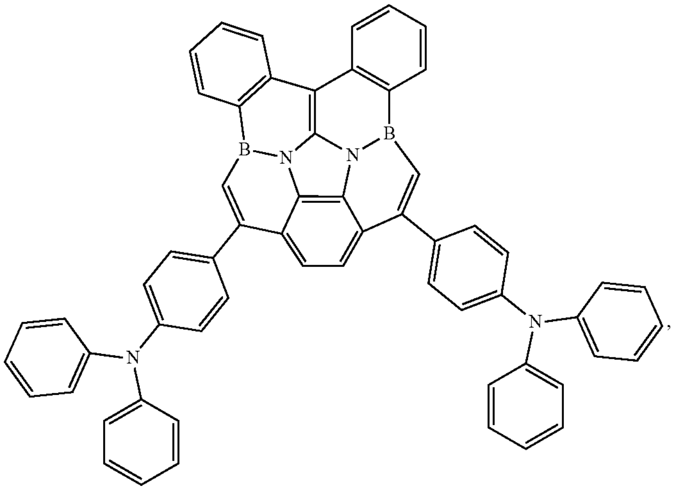,
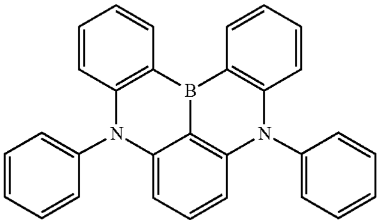,
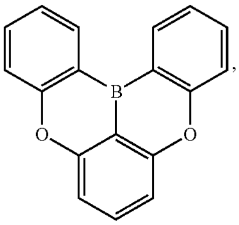,
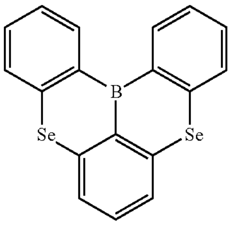,
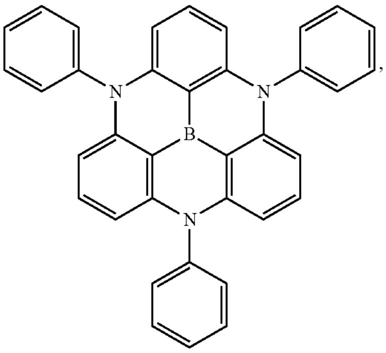, -continued
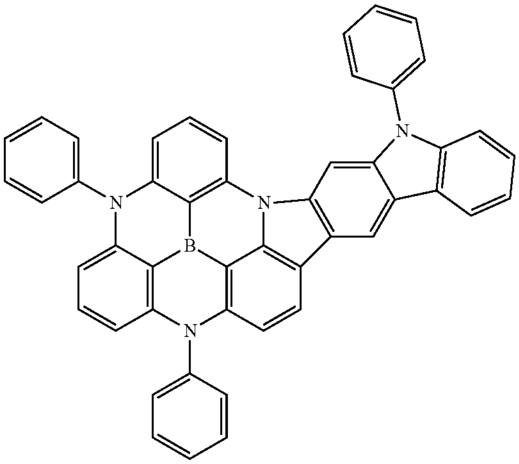
,
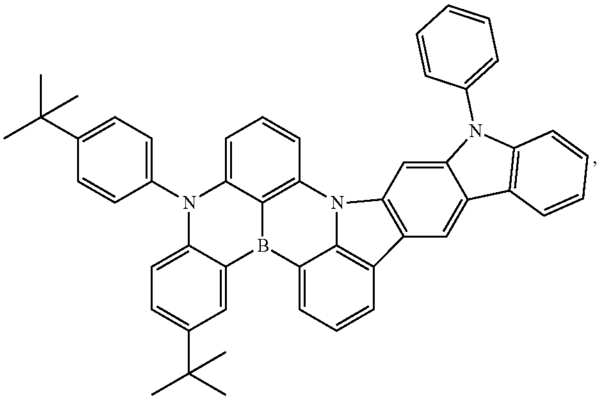
,
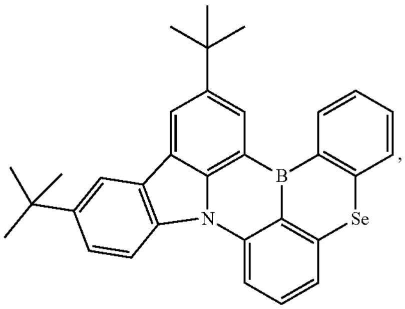
,
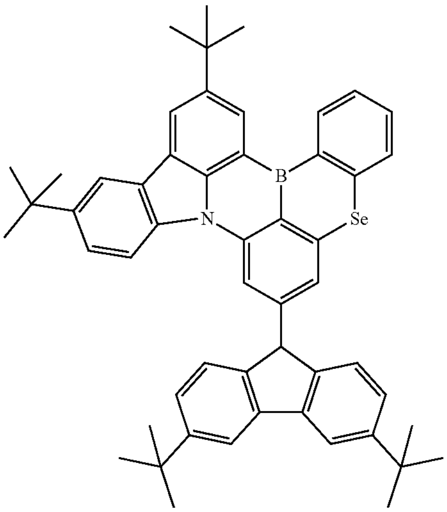
,
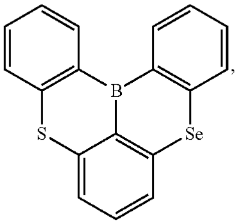
,
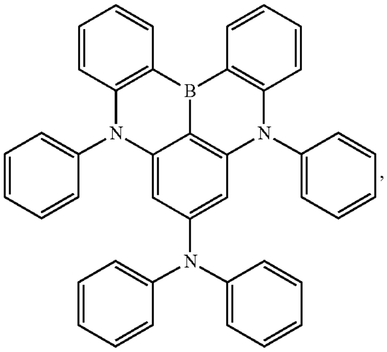
,
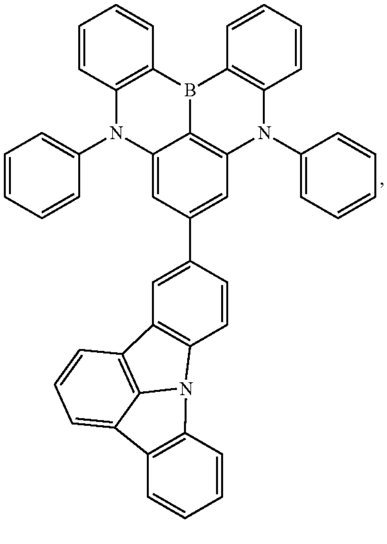
, -continued
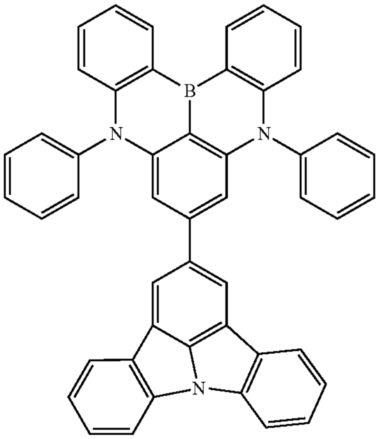
,
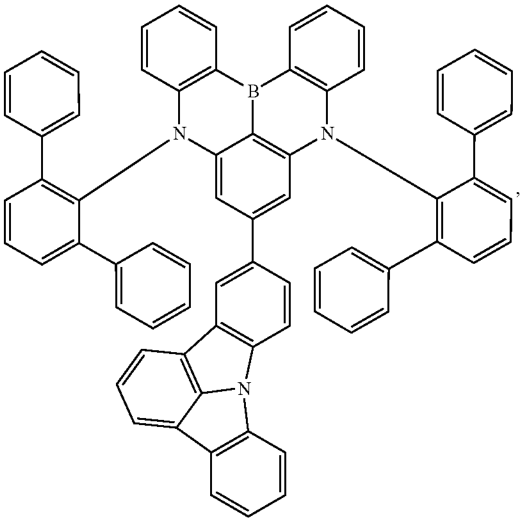
,
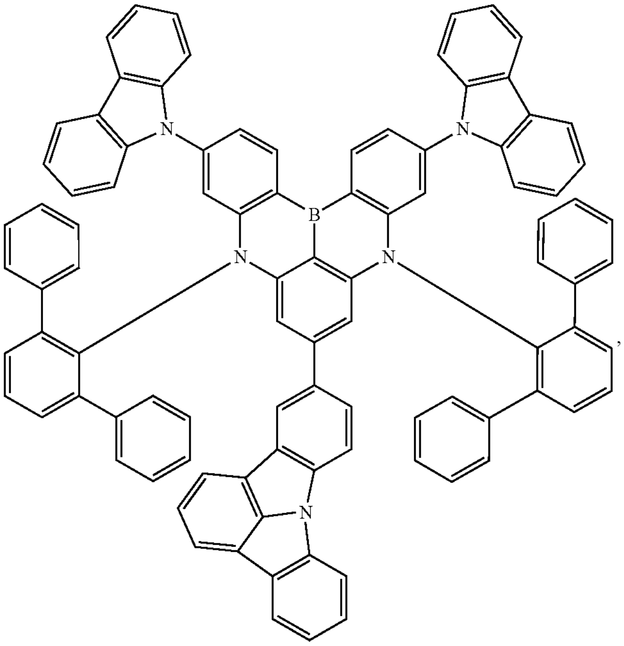
,
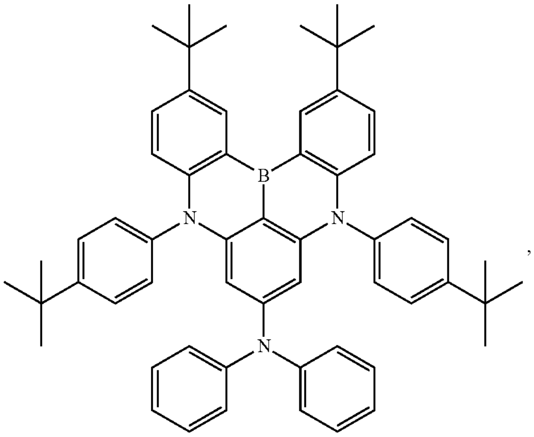
,
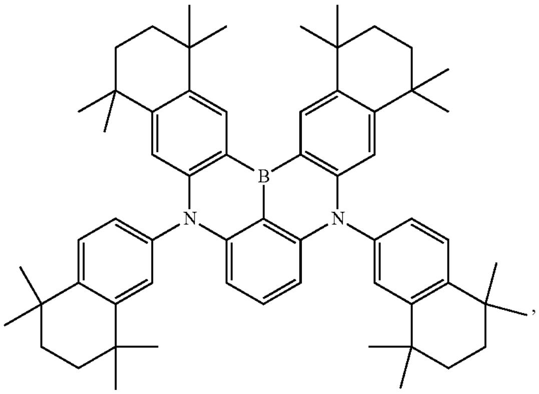
,
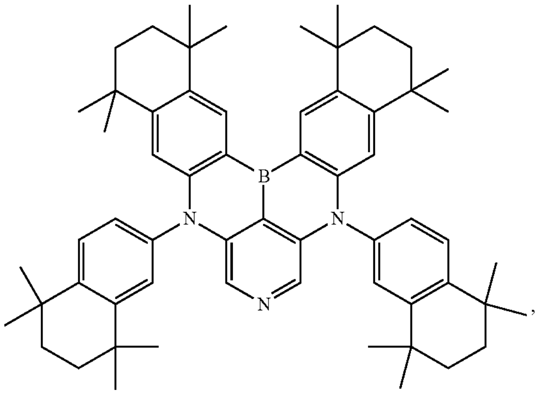
, -continued
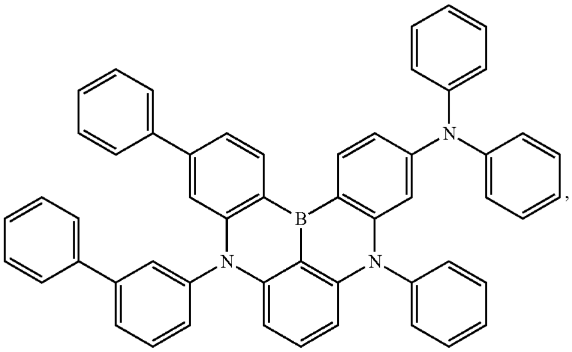
,
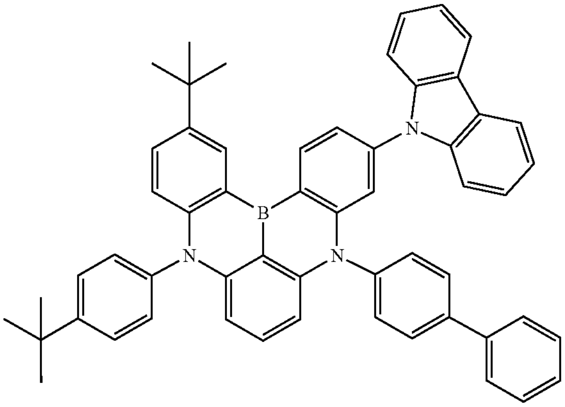
,
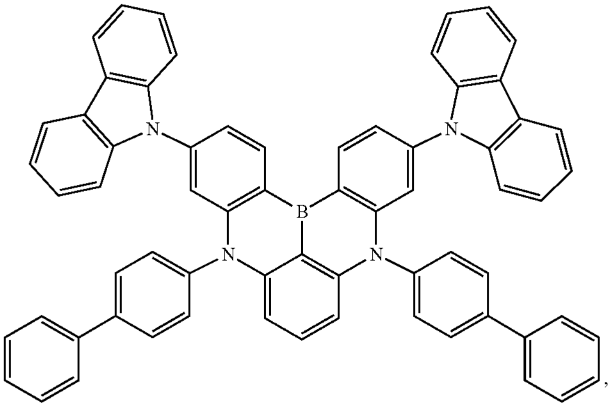
,
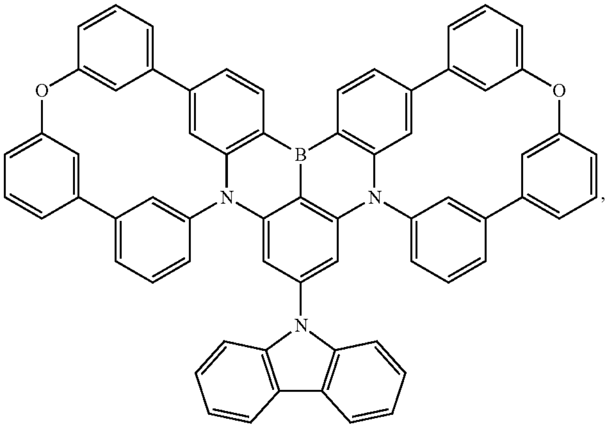
,
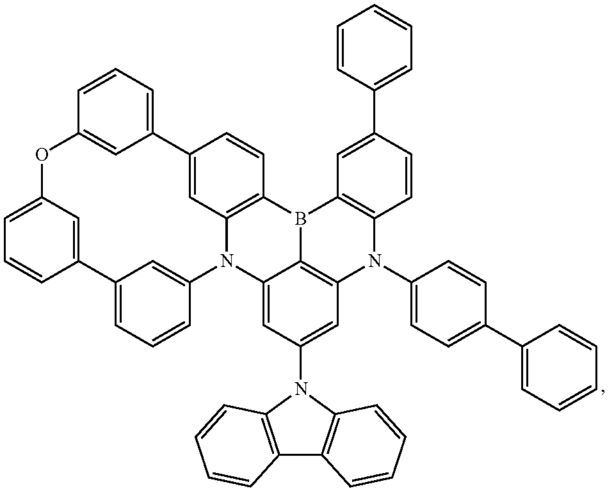
, -continued
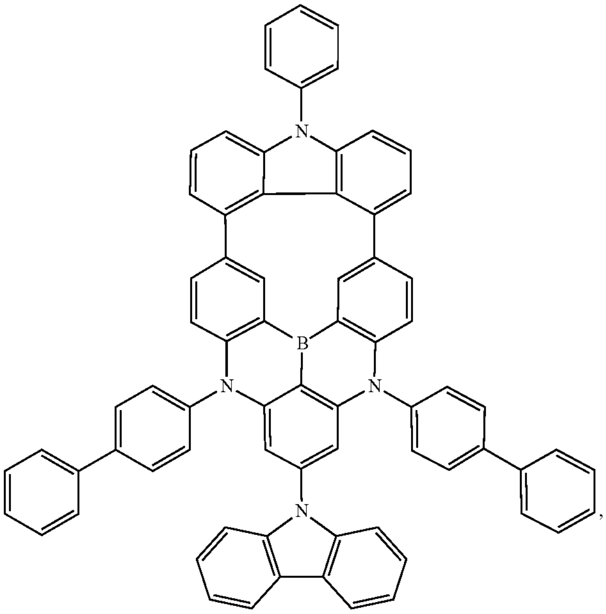
,
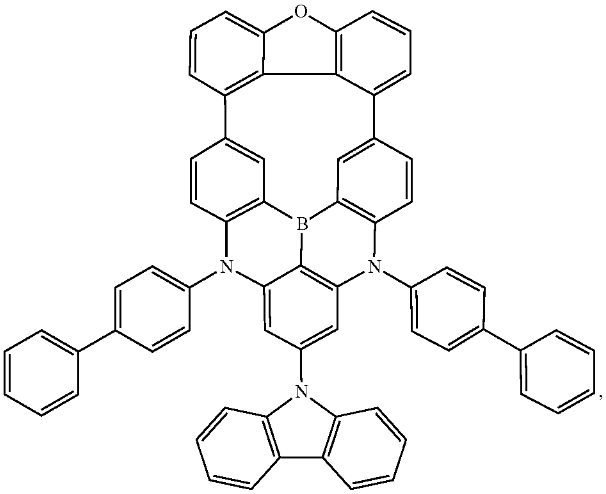
,
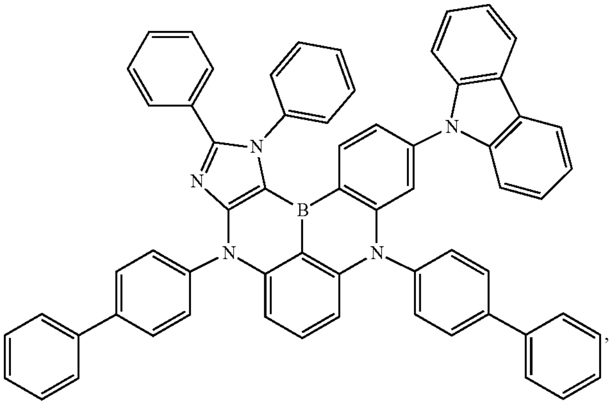
, -continued
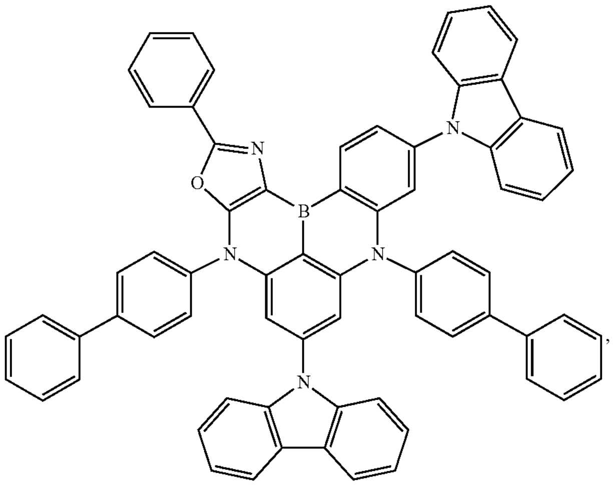,
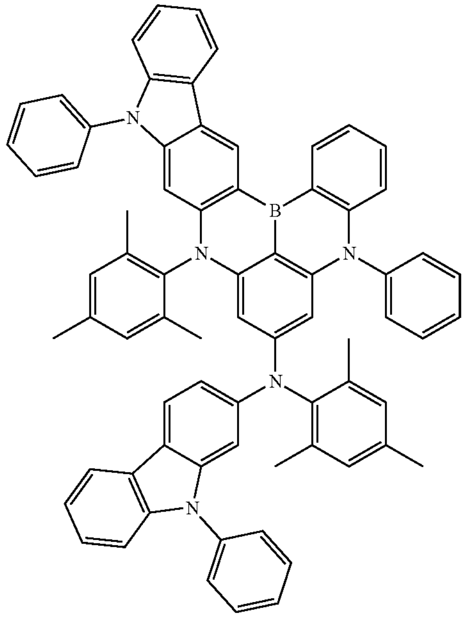,
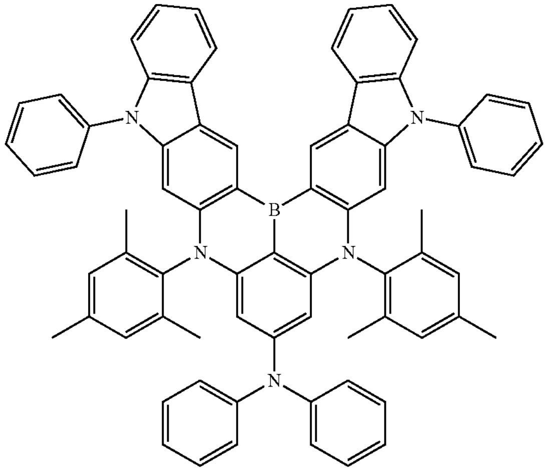,
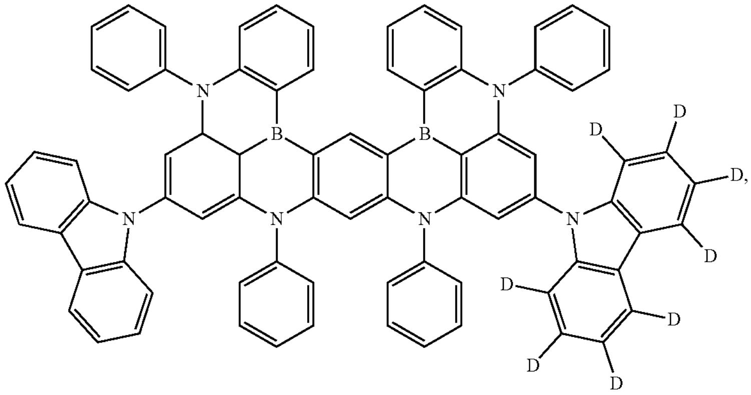, -continued
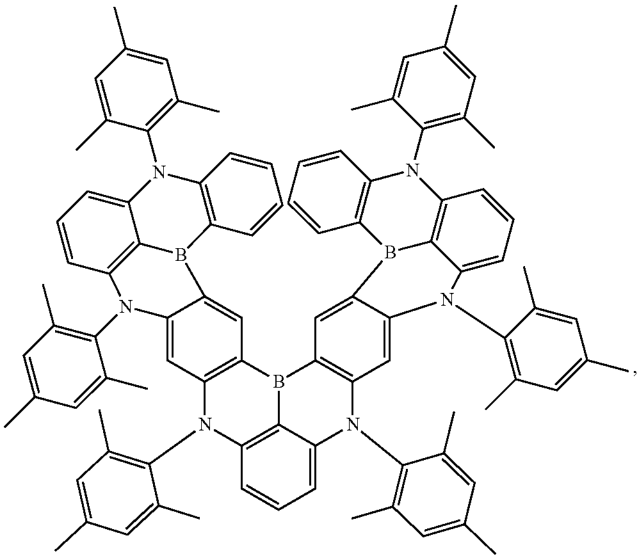
,
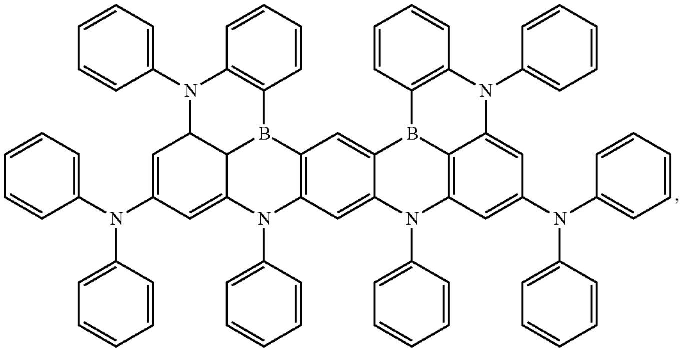
,
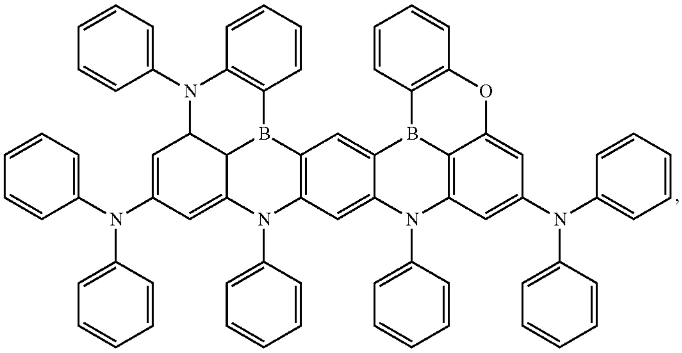
,
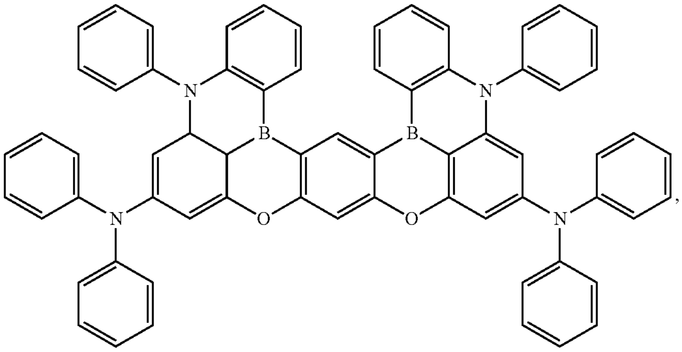
, -continued
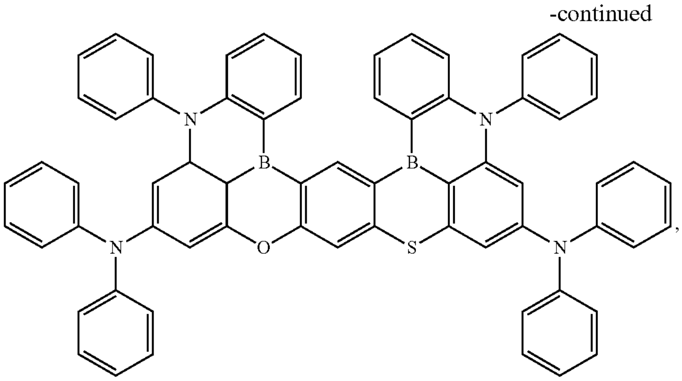
,
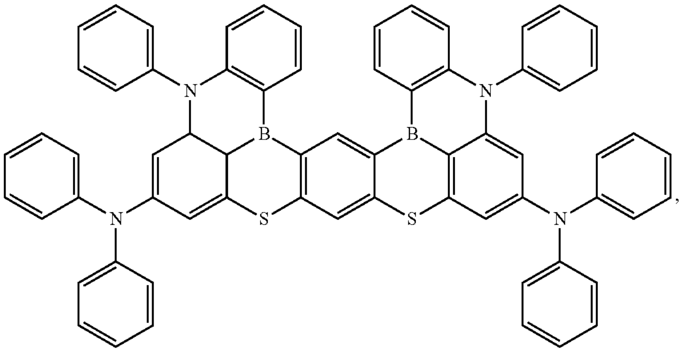
,
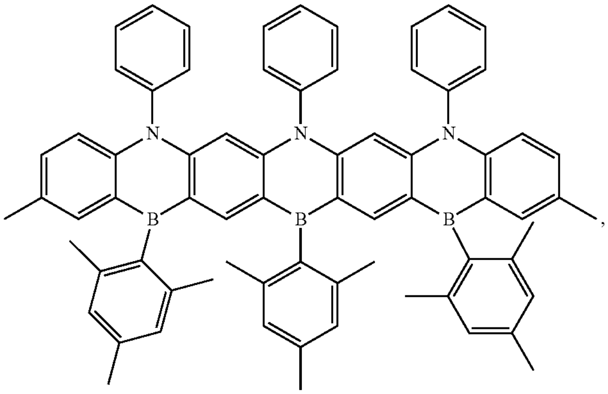
,
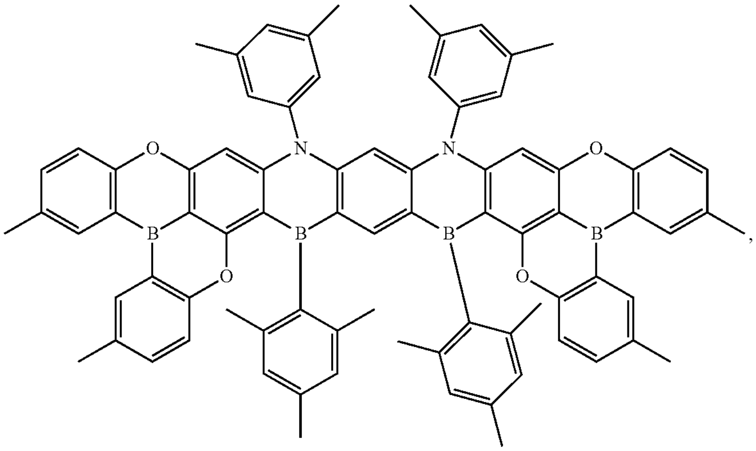
, -continued
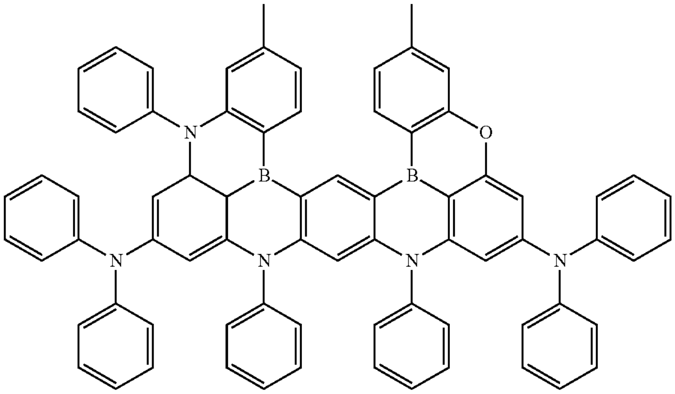
,
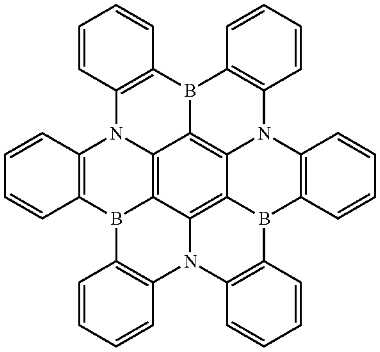
,
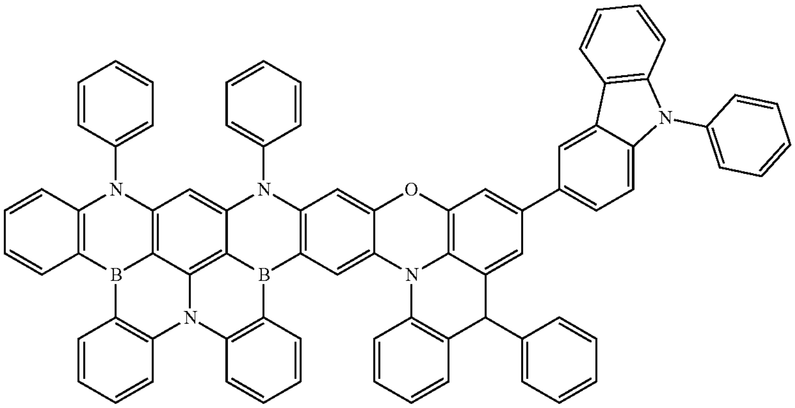
,
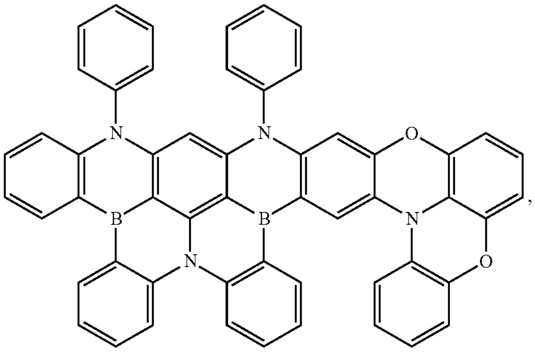
,
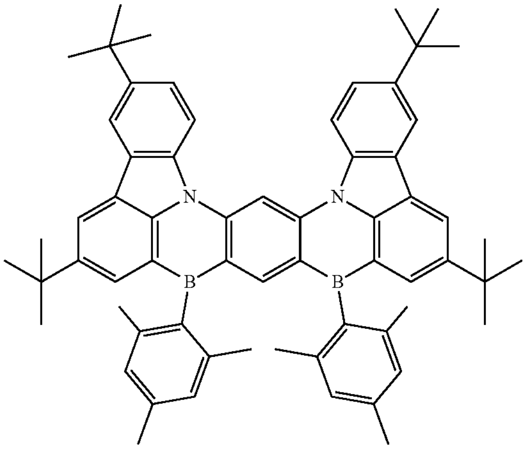
,
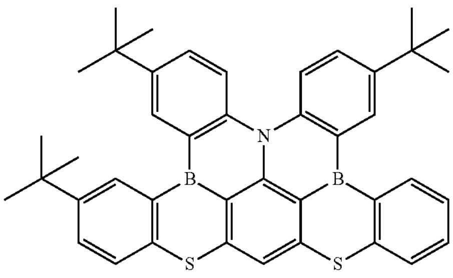
,
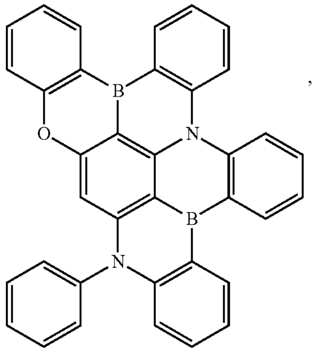
, -continued
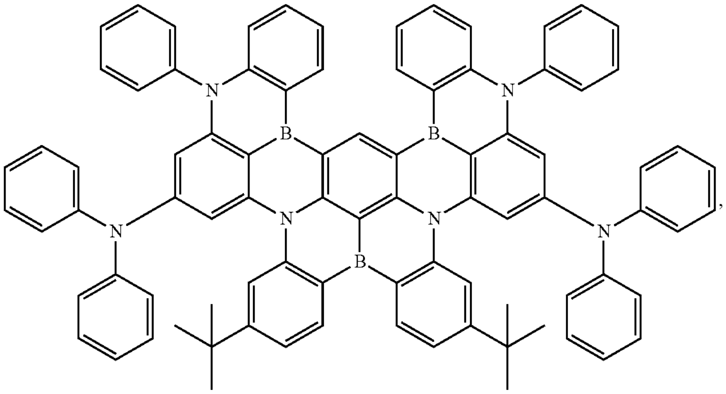,
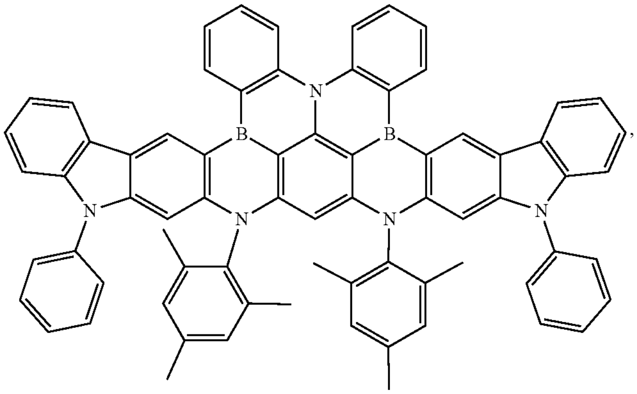,
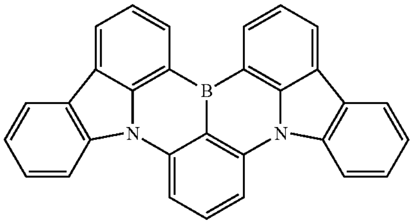,
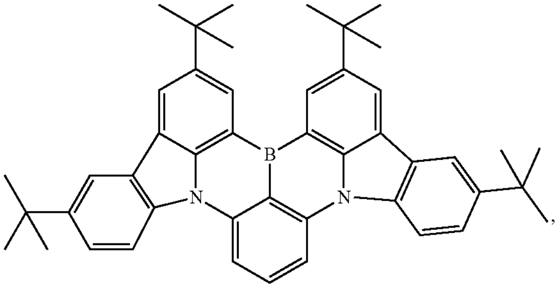,
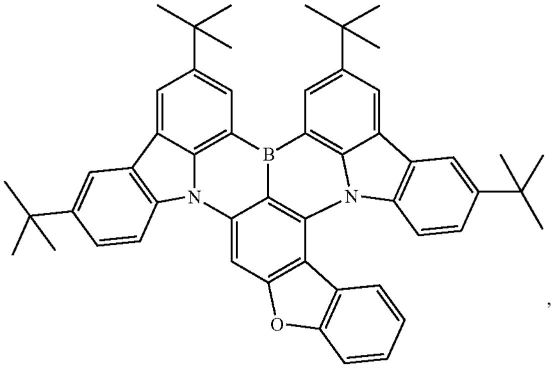,
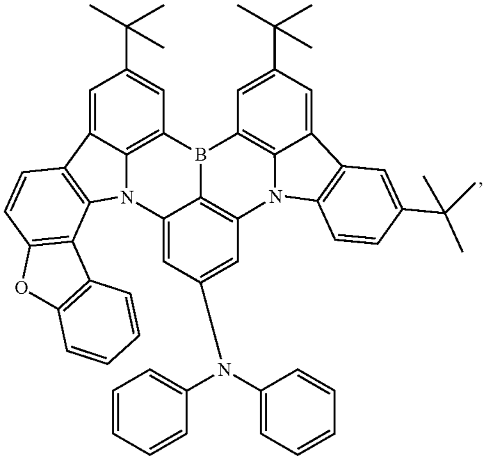,
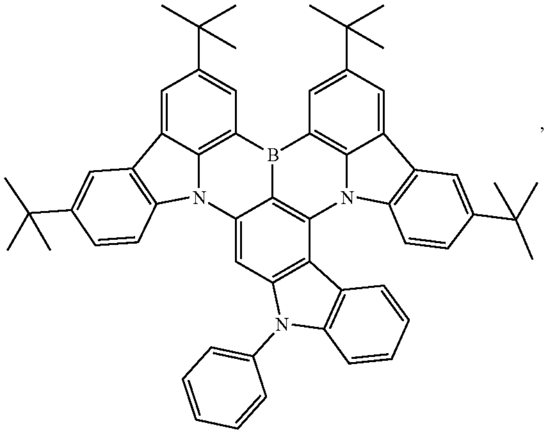, -continued
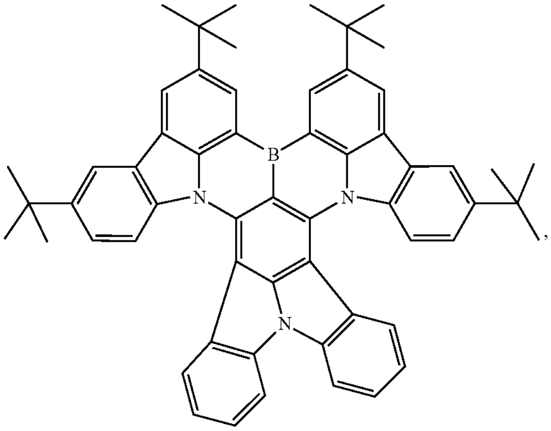
,
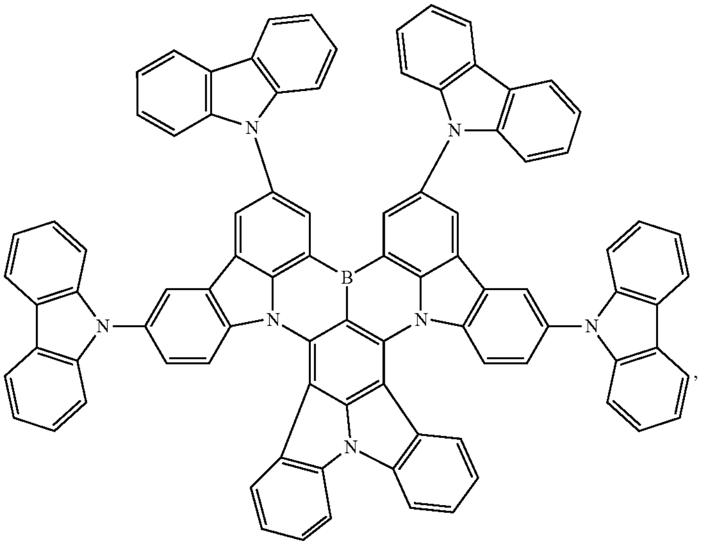
,
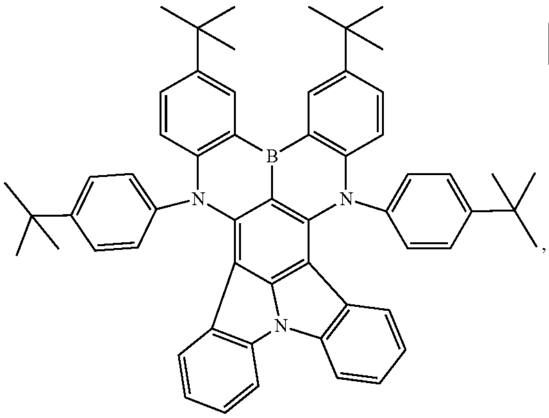
,
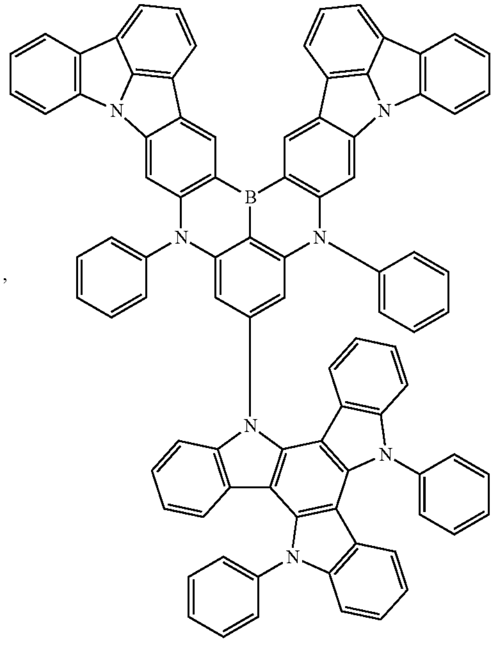
, -continued
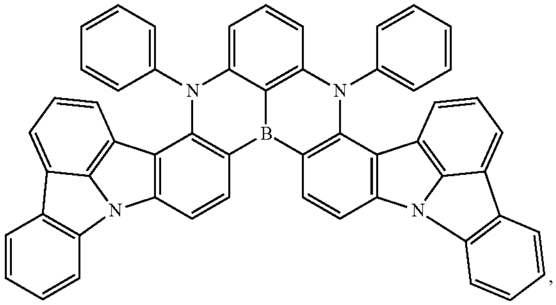,
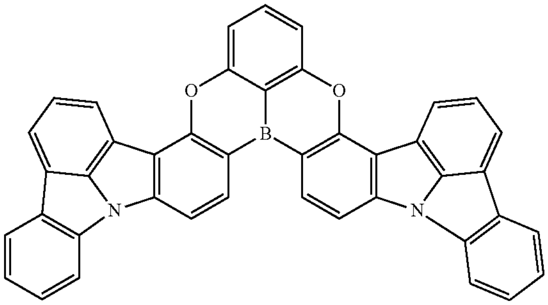,
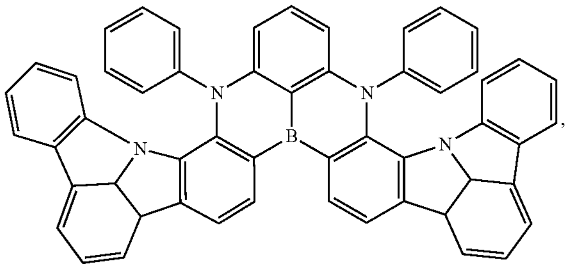,
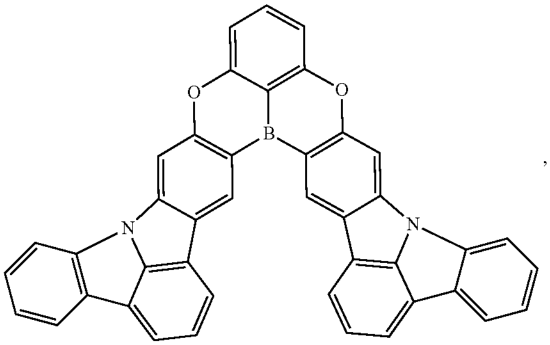,
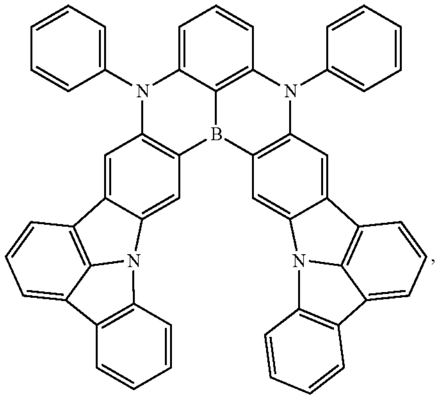,
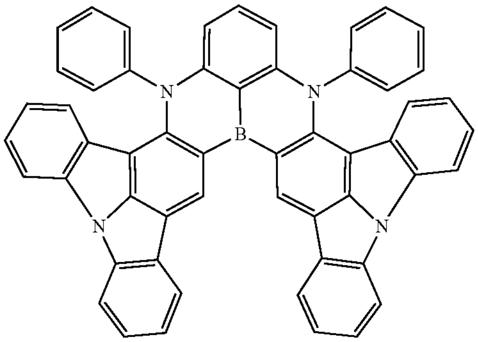,
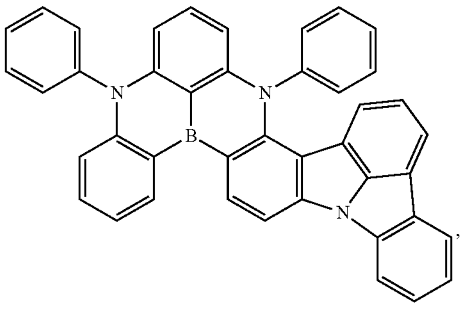,
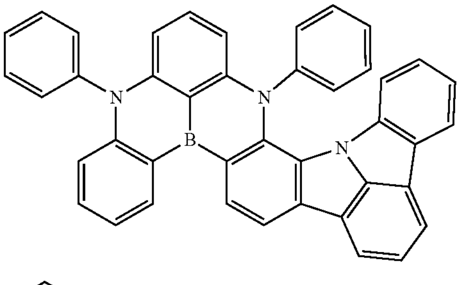,
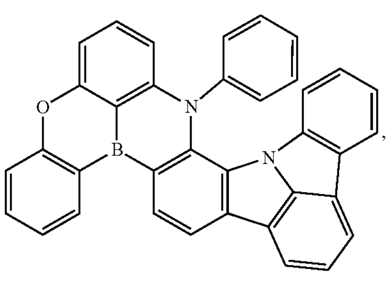,
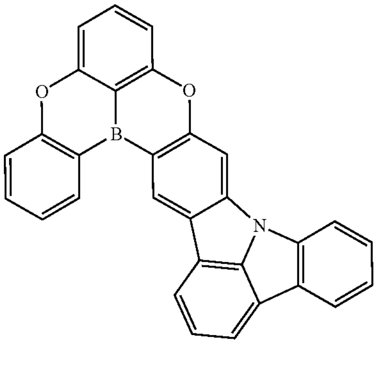, -continued
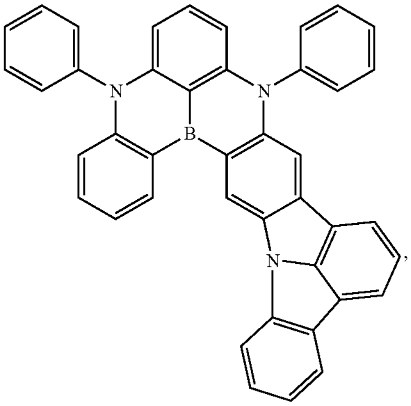,
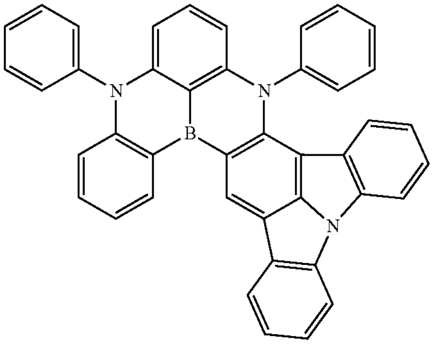,
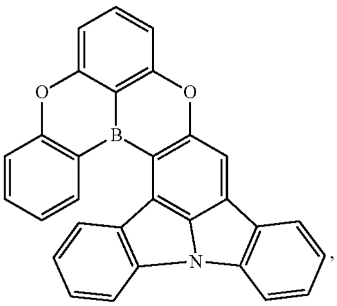,
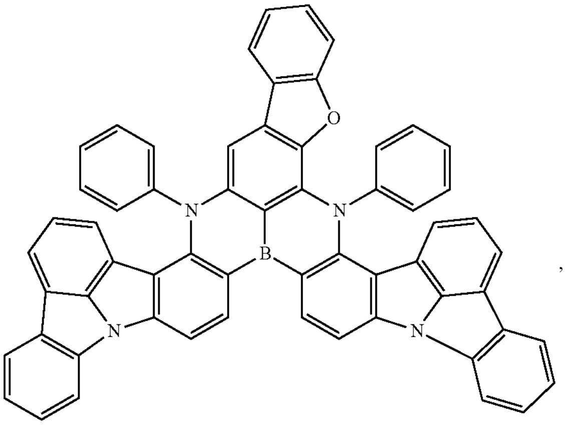,
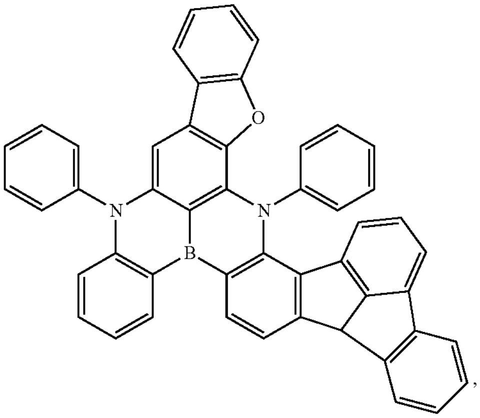,
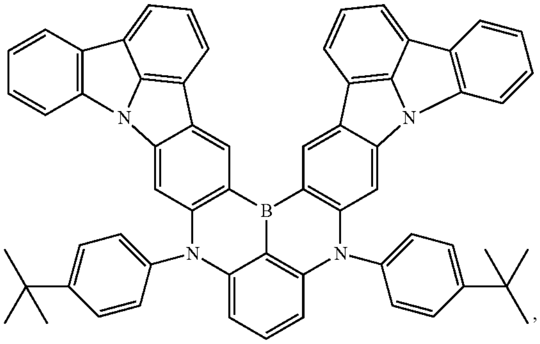, -continued
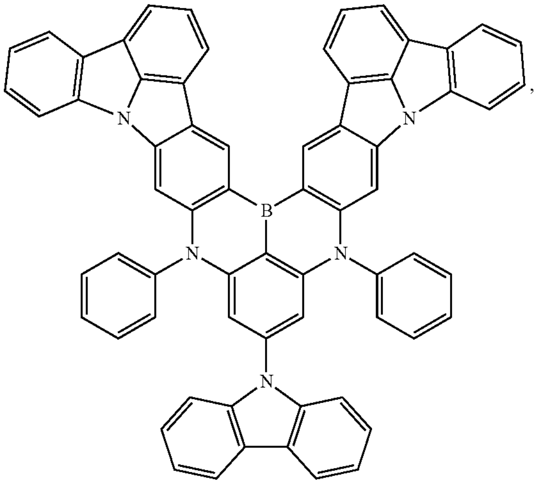
,
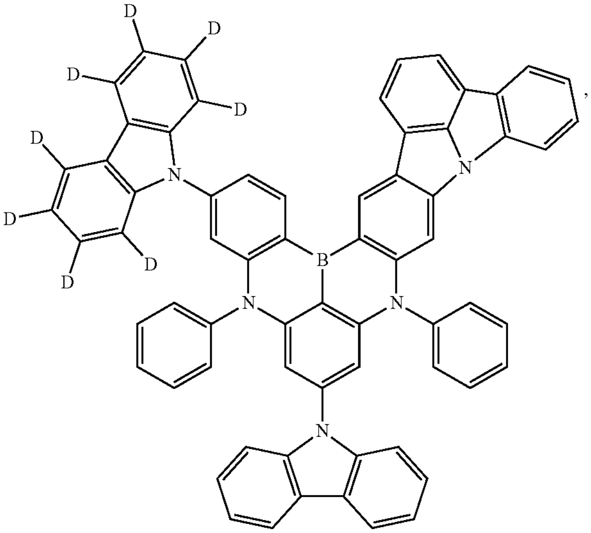
,
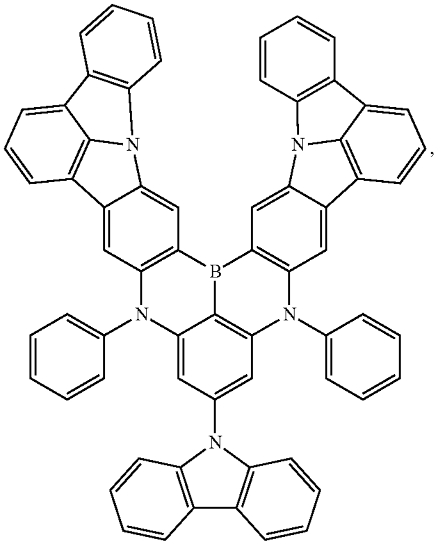
,
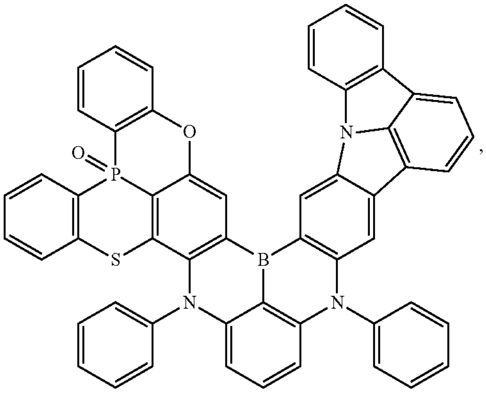
,
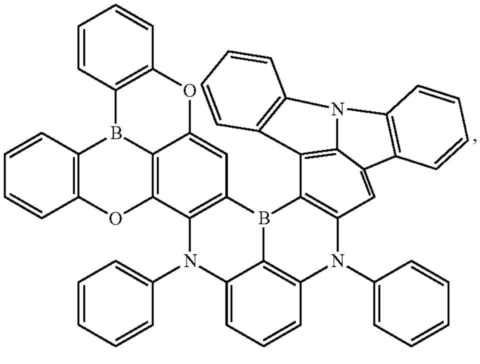
, -continued
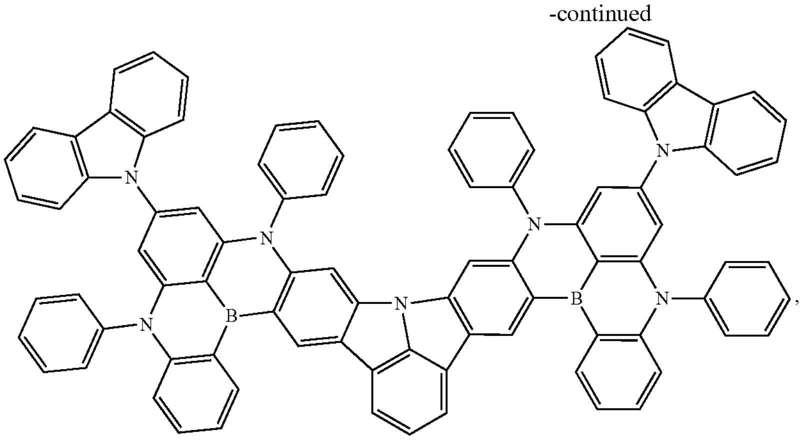
,
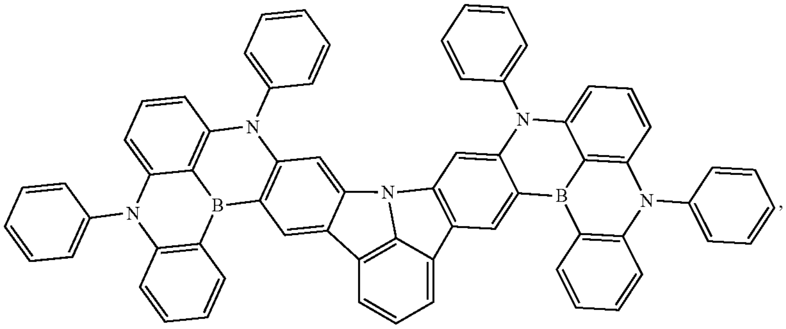
,
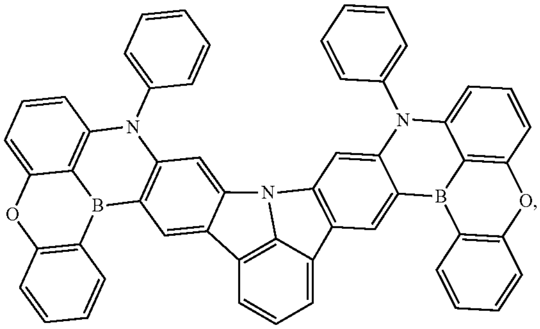
,
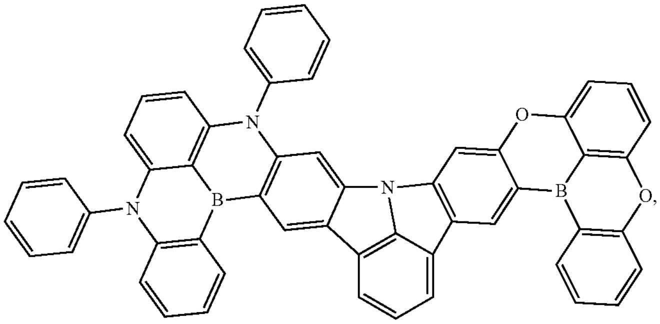
,
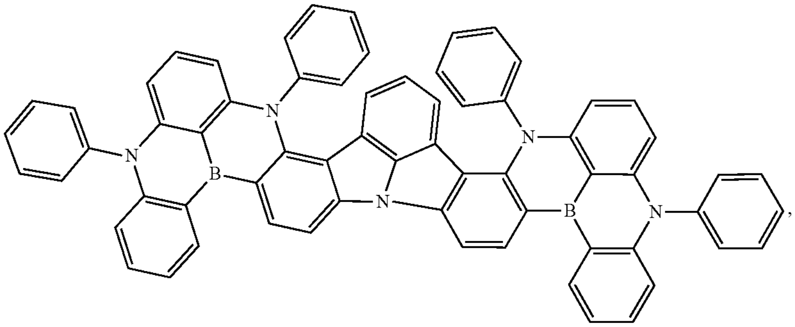
, -continued
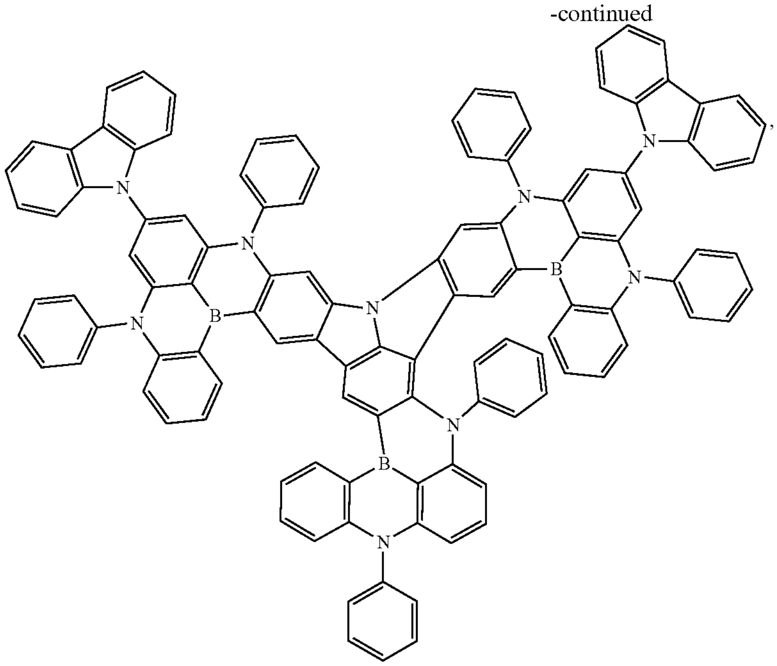
,
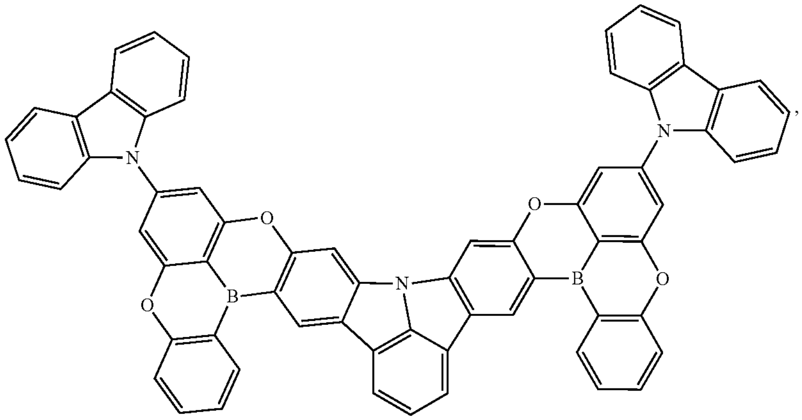
,
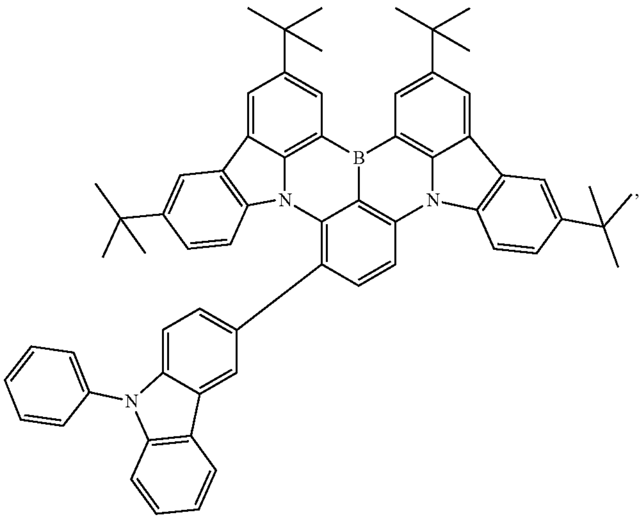
, -continued
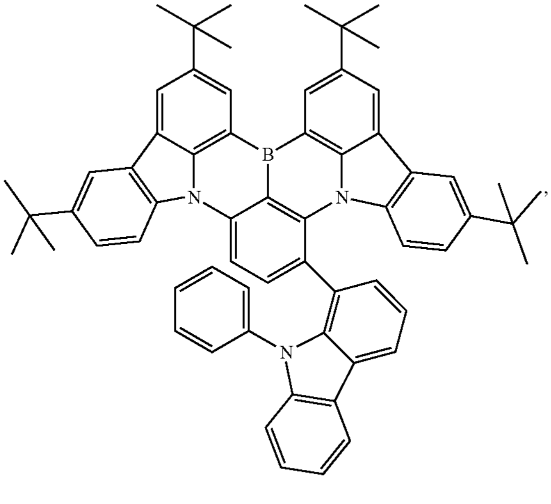
,
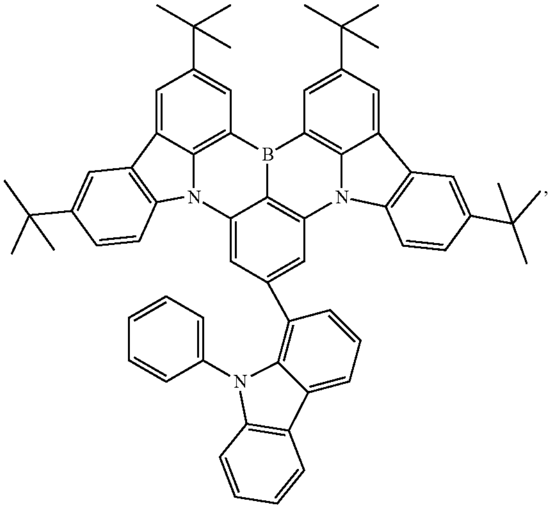
,
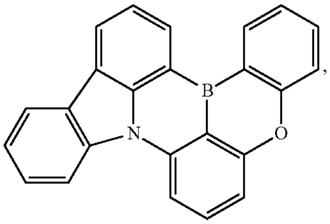
,
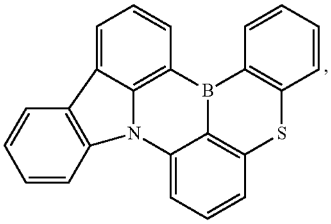
,
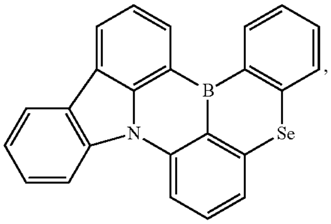
,
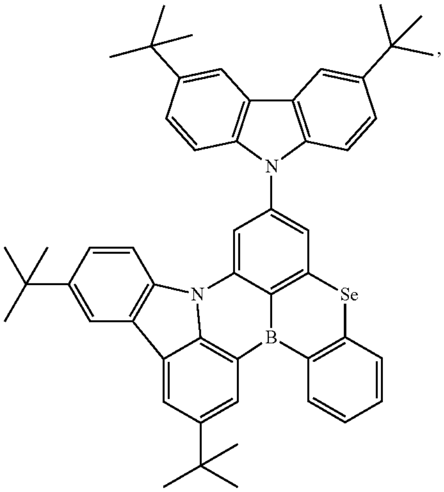
,
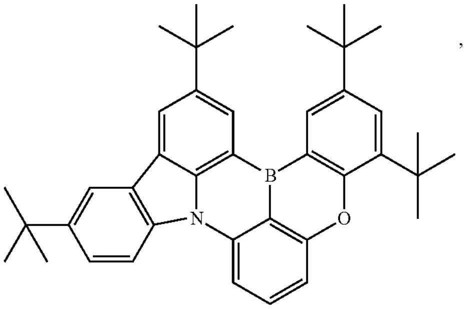
,
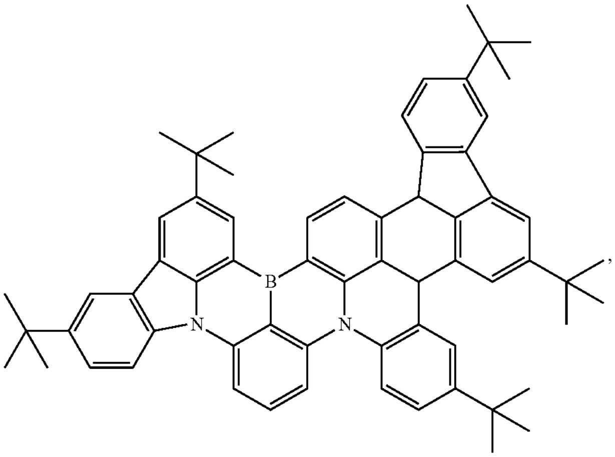
,
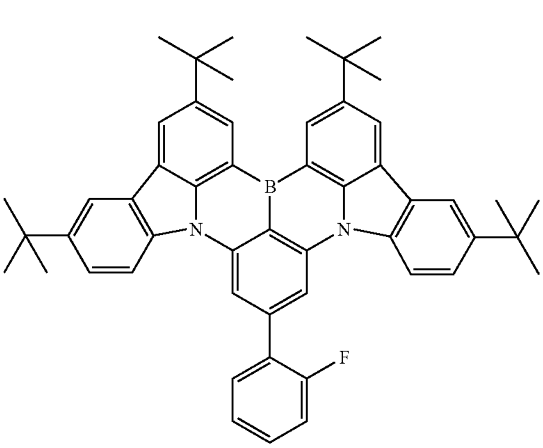
, -continued
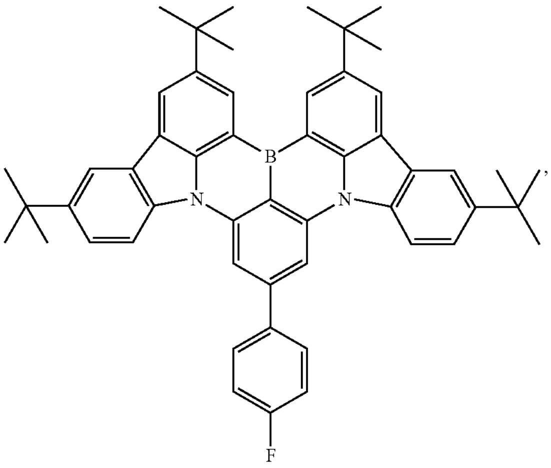
,
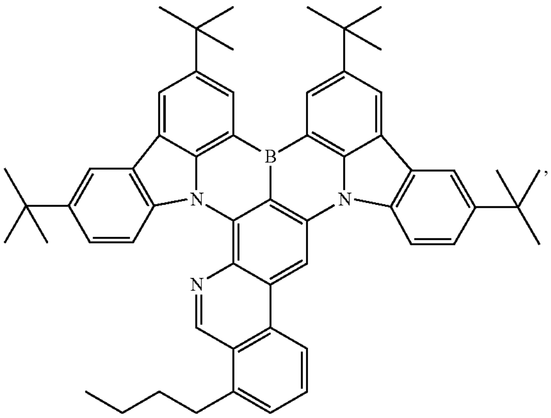
,
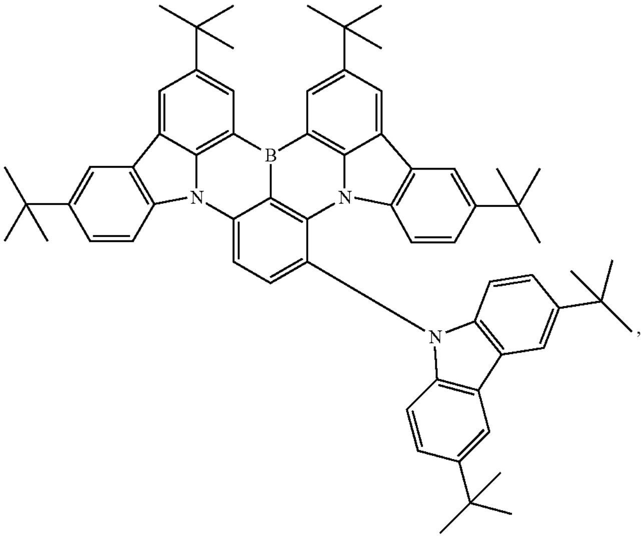
,
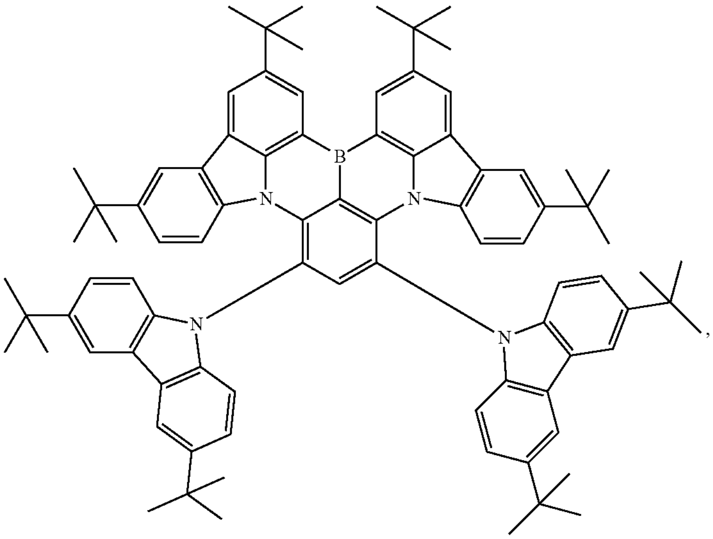
, -continued
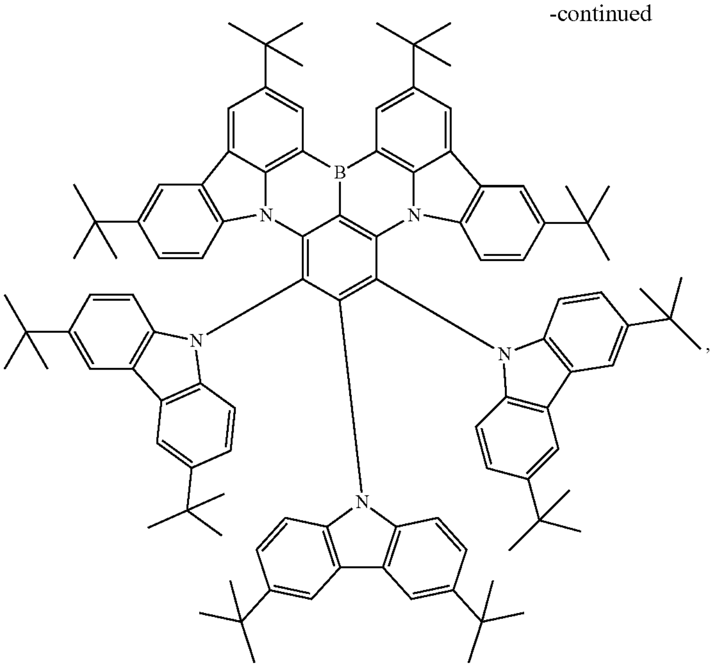
,
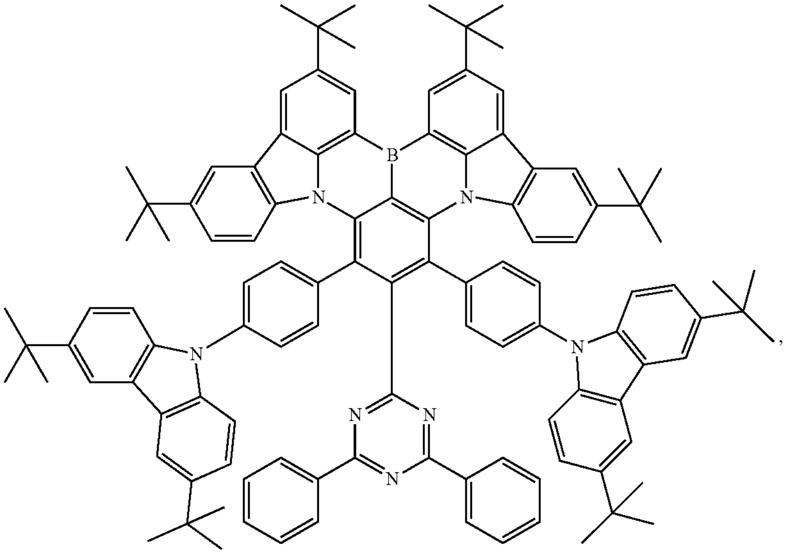
,
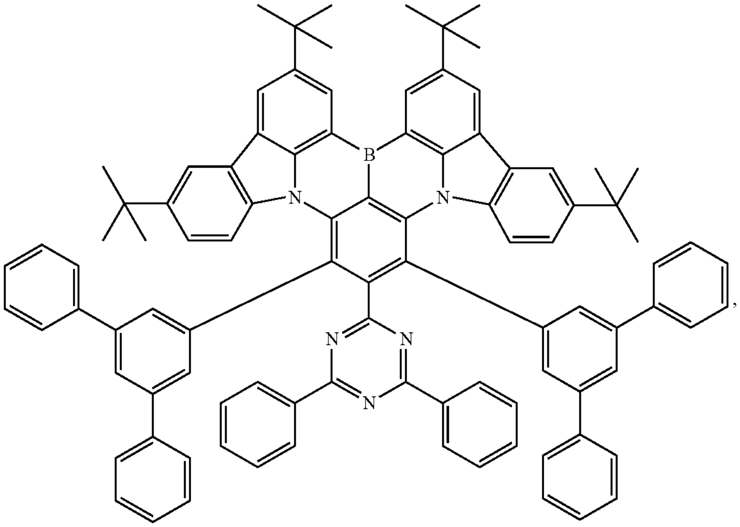
, -continued
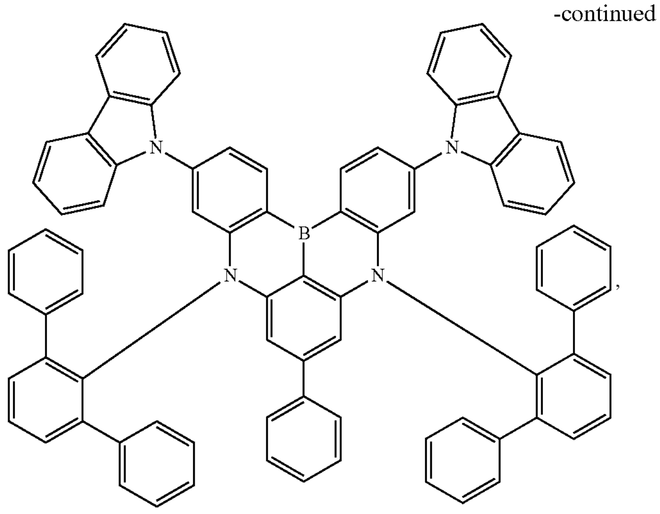
,
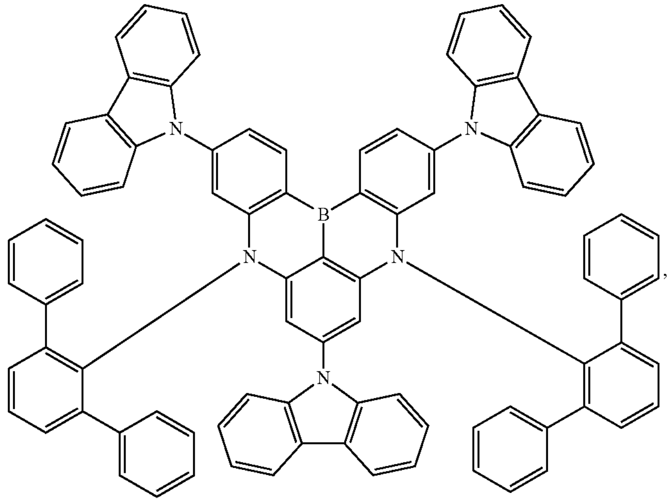
,
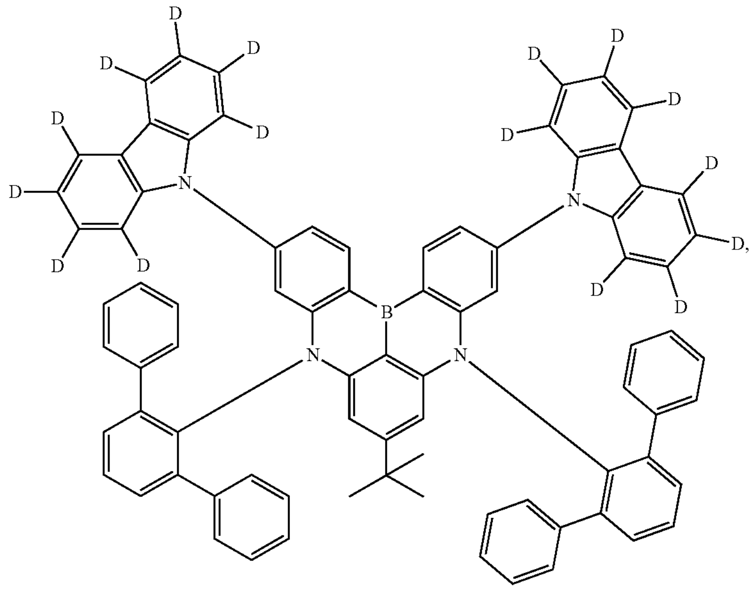
, -continued
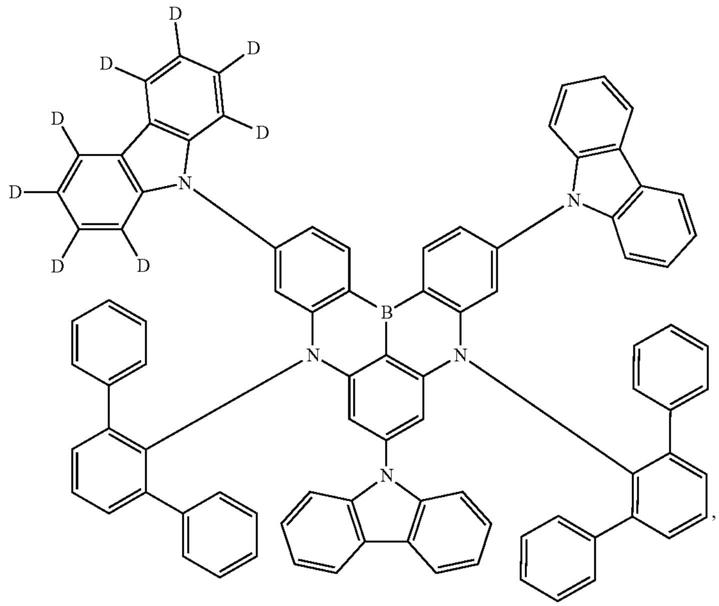
,
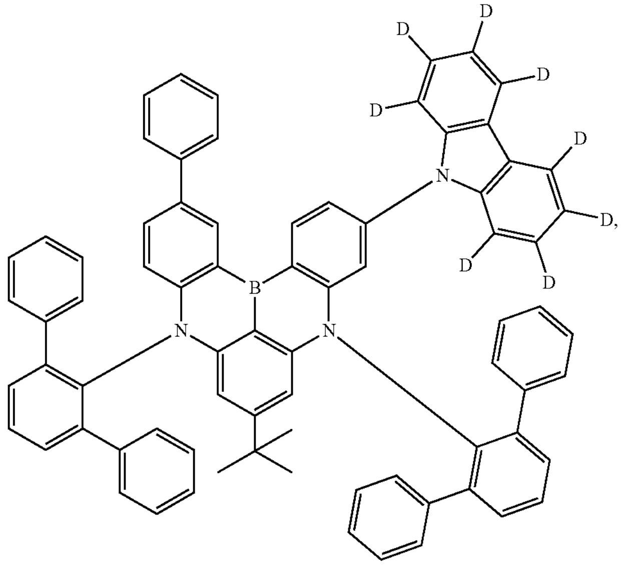
,
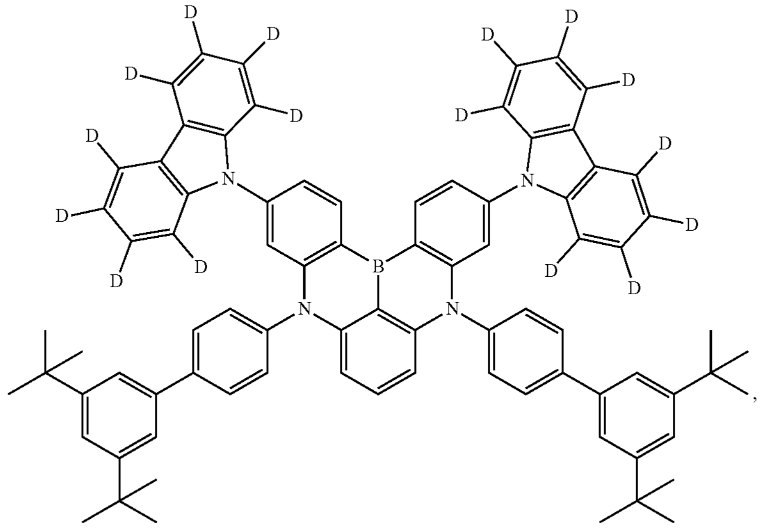
, -continued
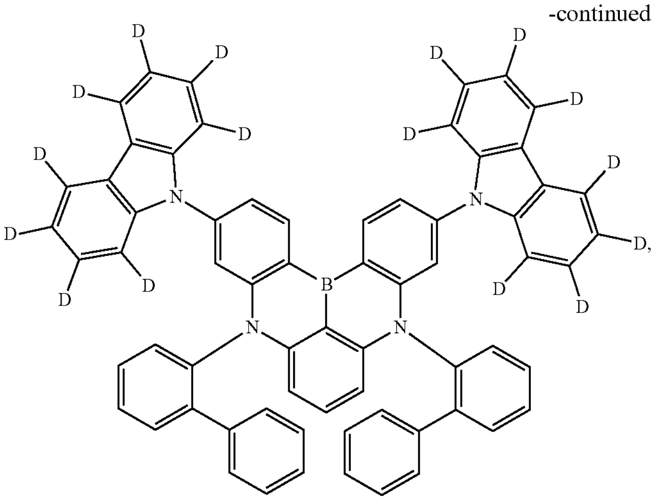
,
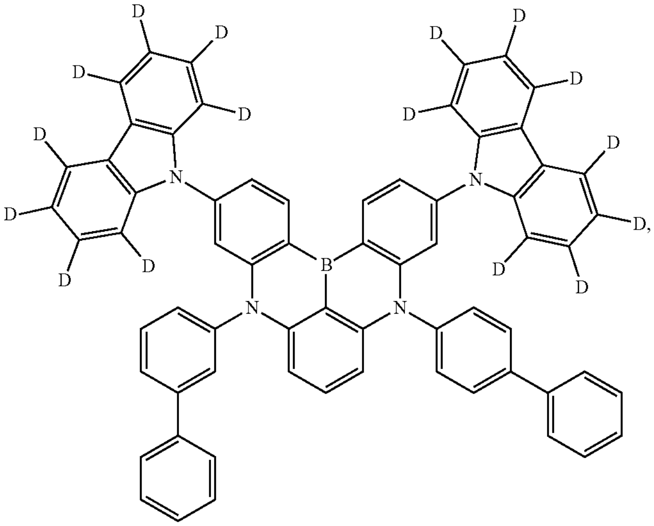
,
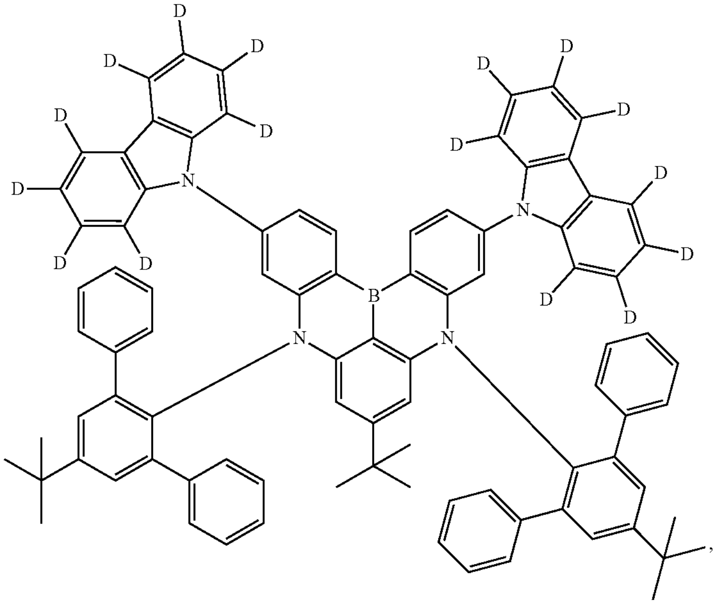
, -continued
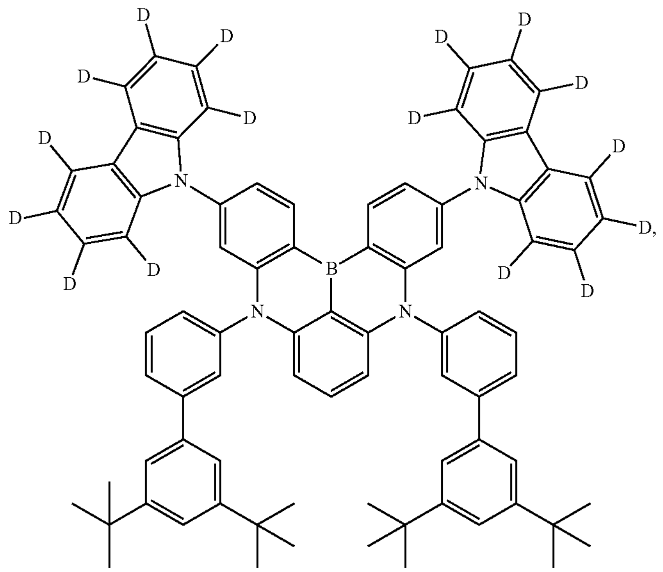
,
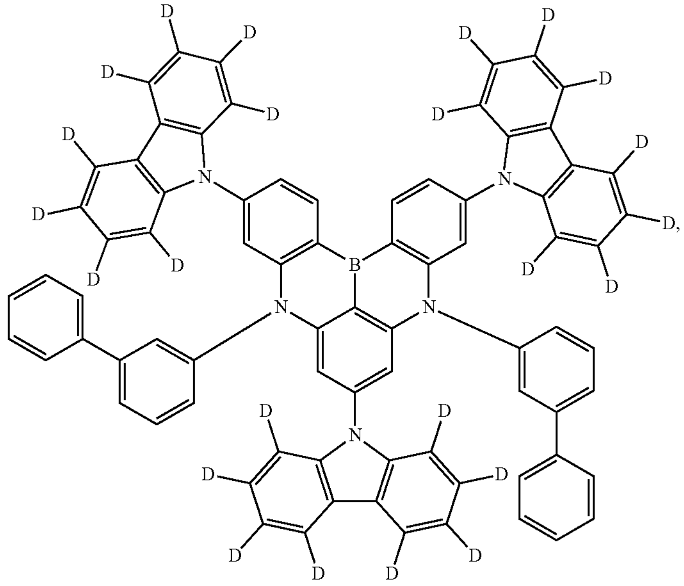
,
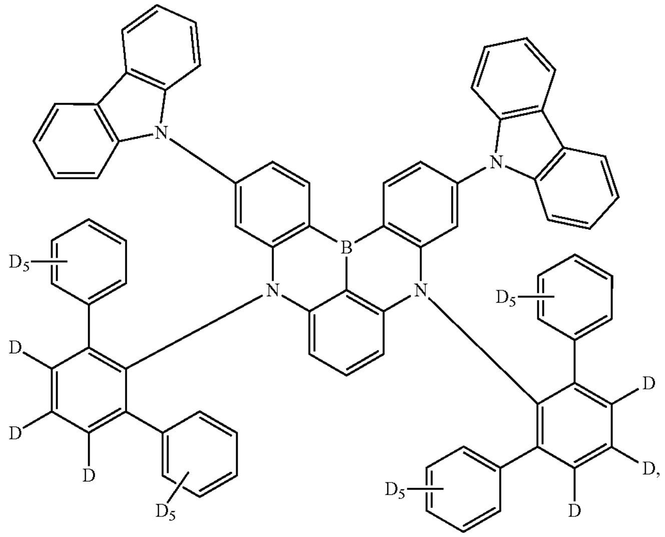
, -continued
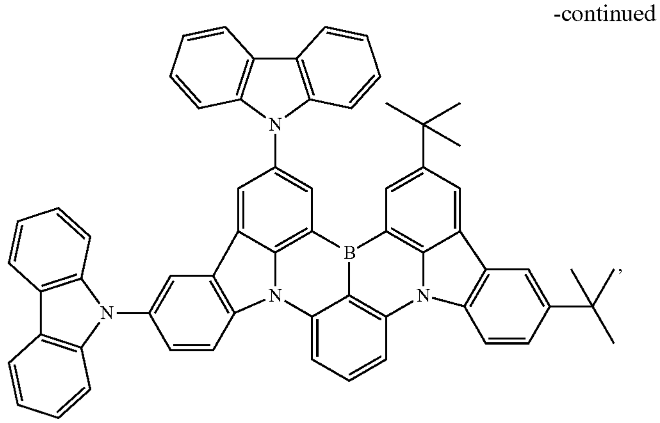
,
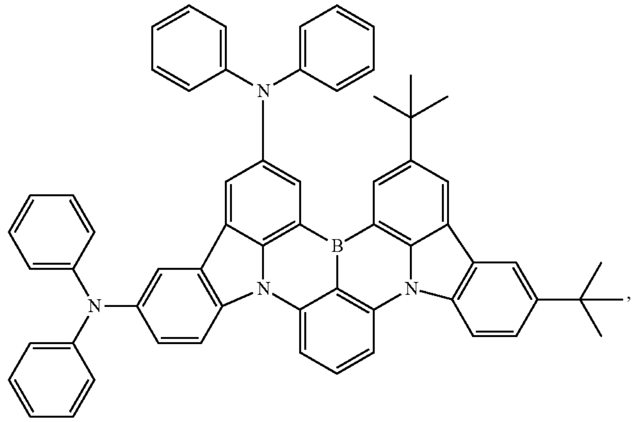
,
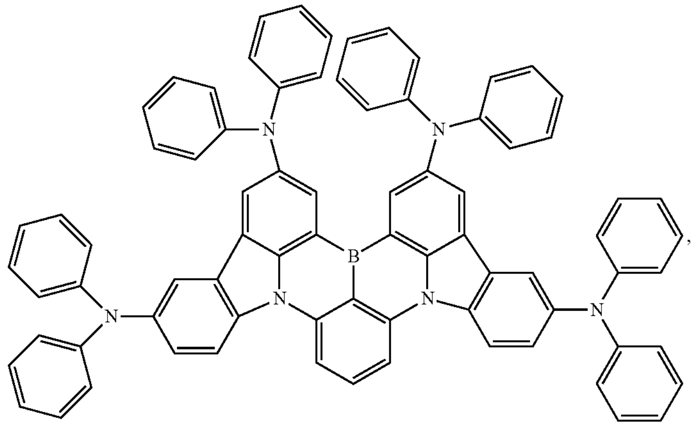
, -continued
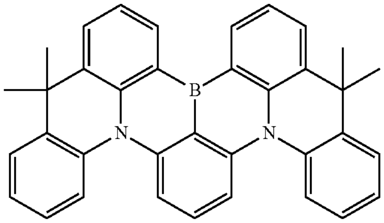,
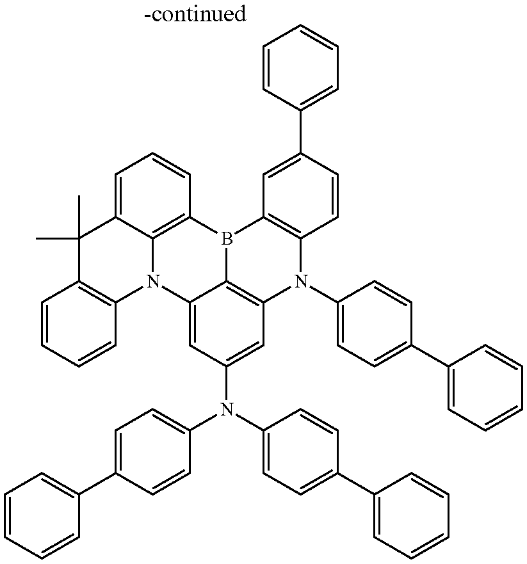,
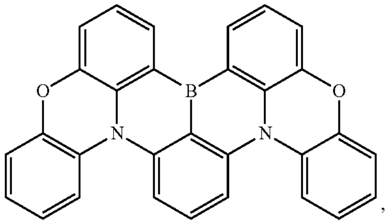,
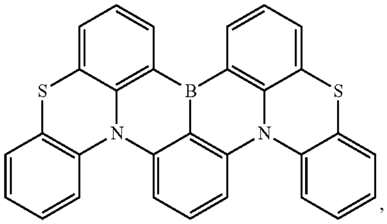,
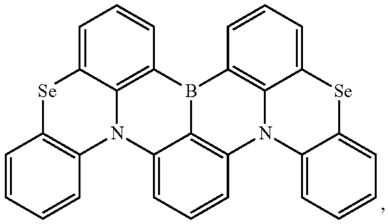,
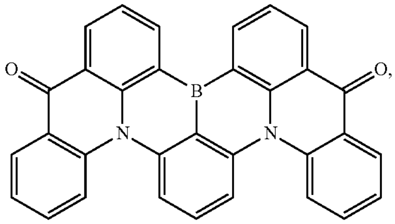,
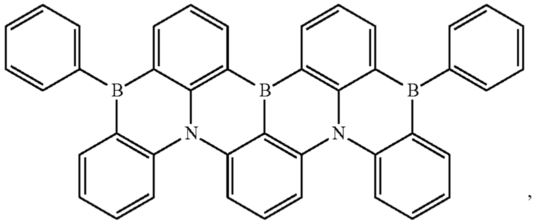,
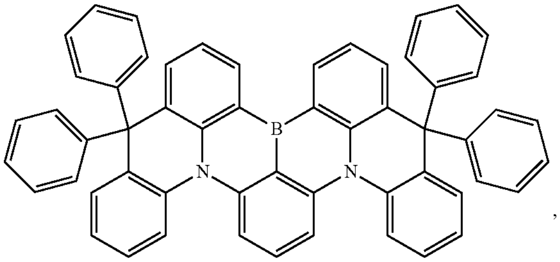,
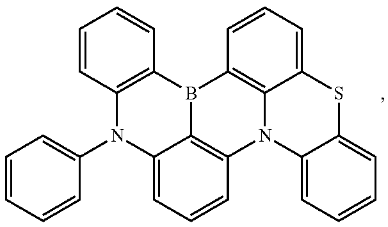,
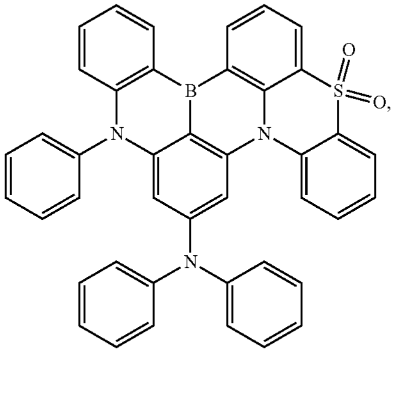, -continued
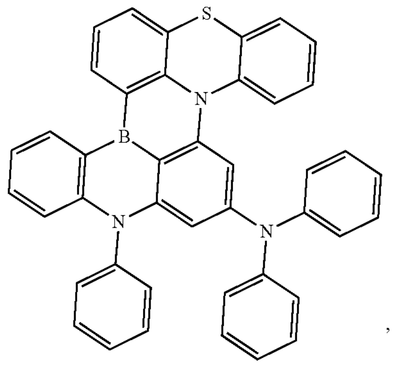
,
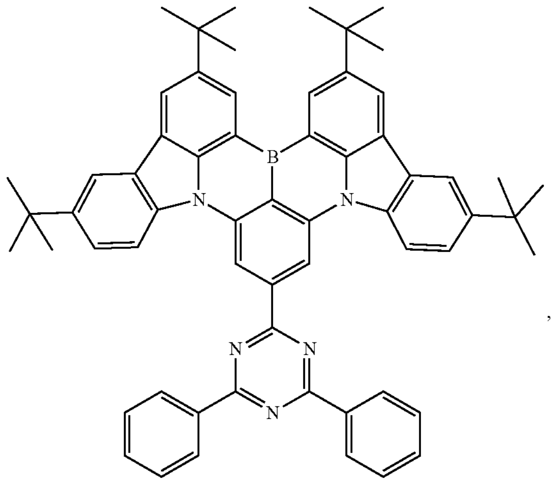
,
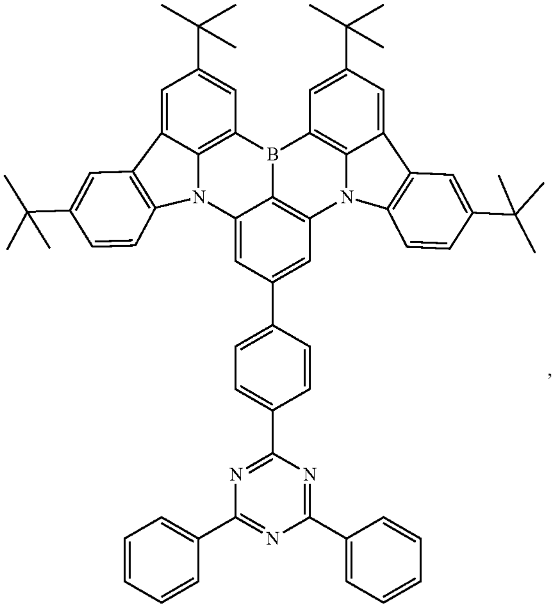
,
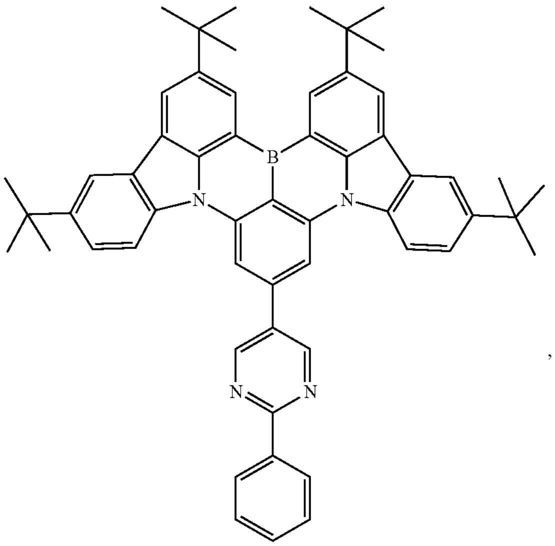
,
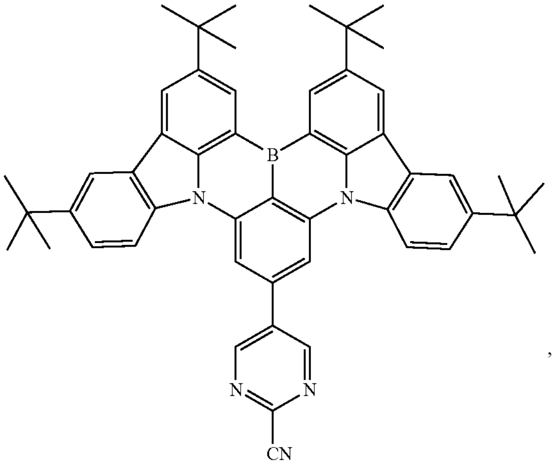
,
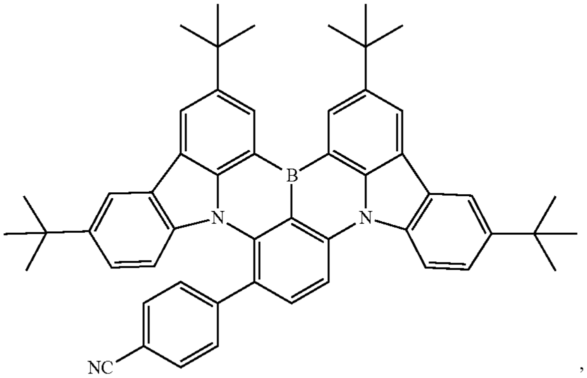
, -continued
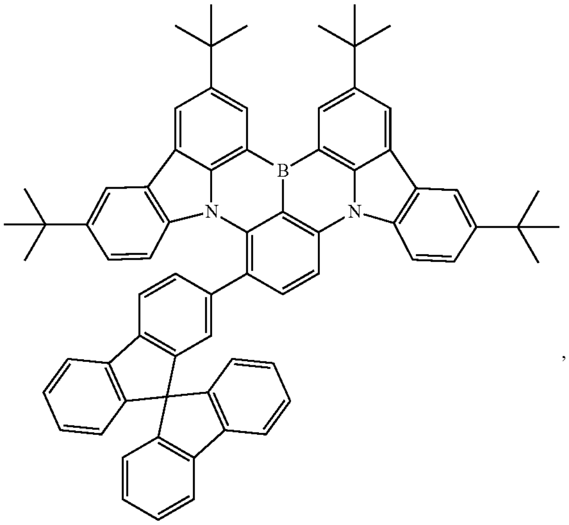
,
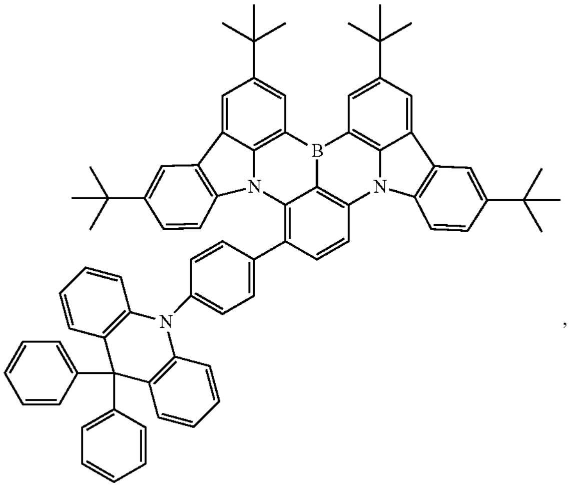
,
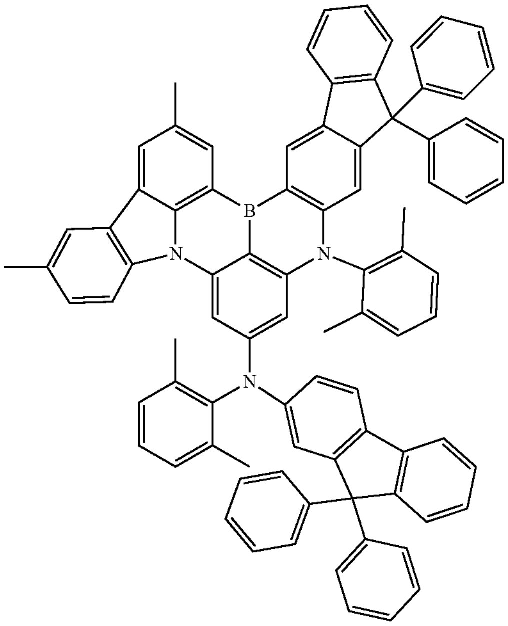
,
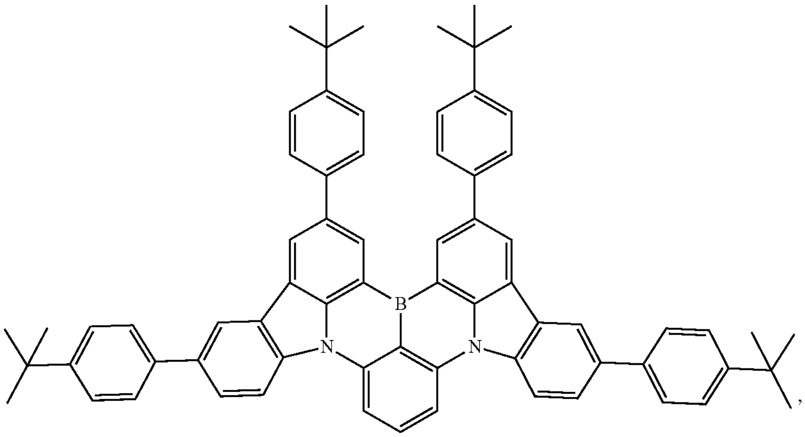
, -continued
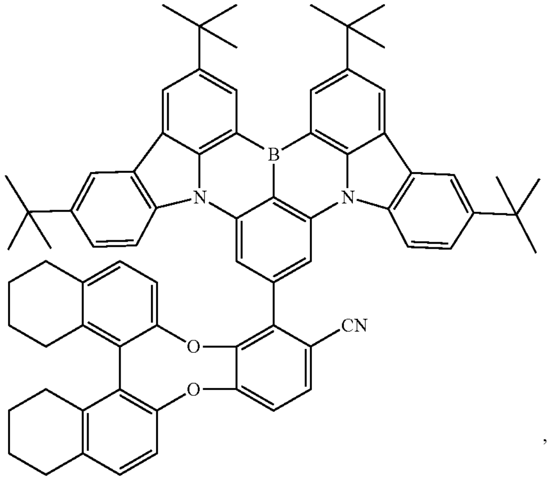
,
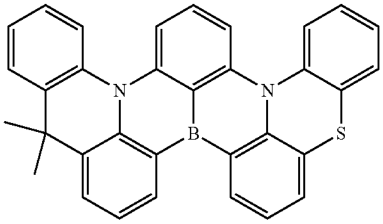
,
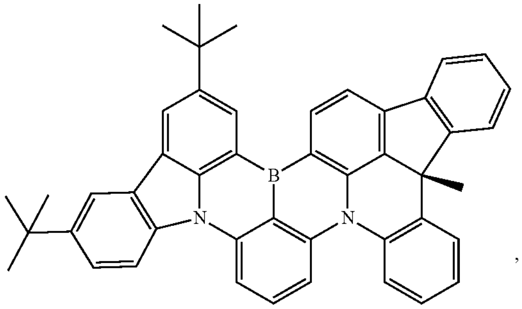
,
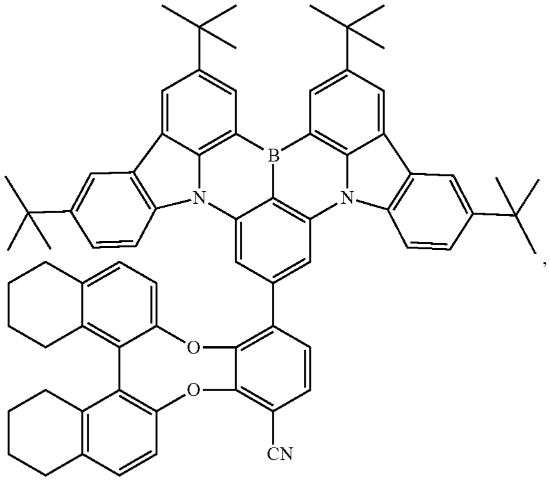
,
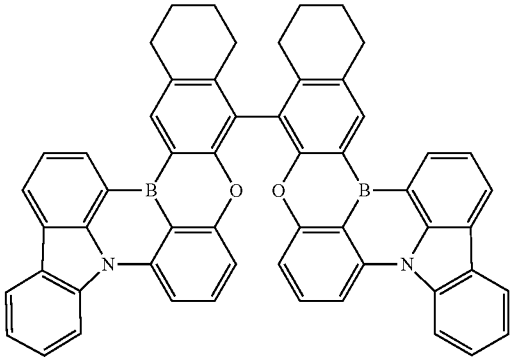
,
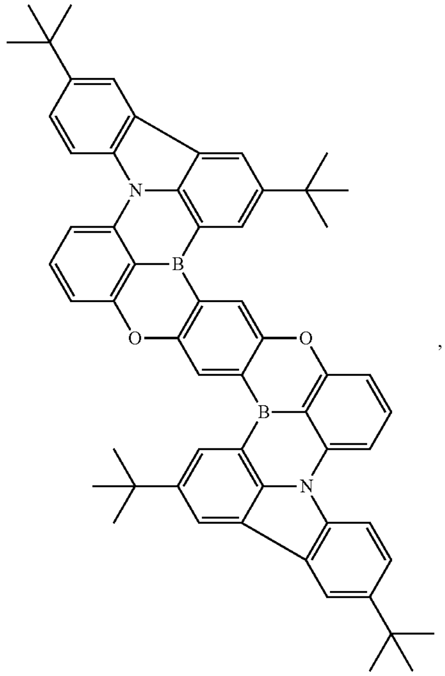
, -continued
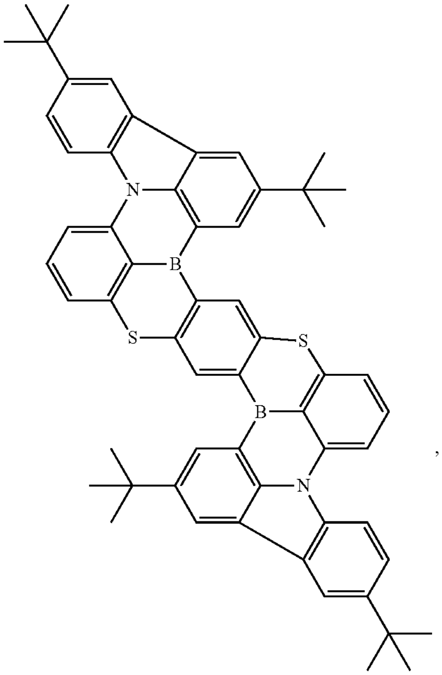
,
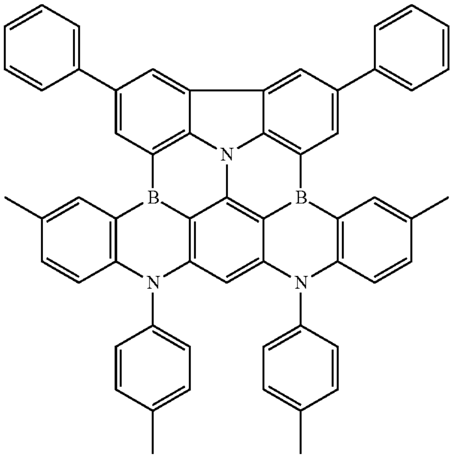
,
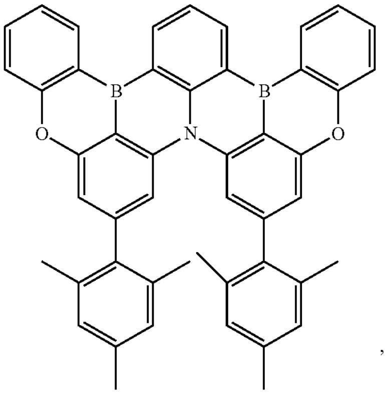
,
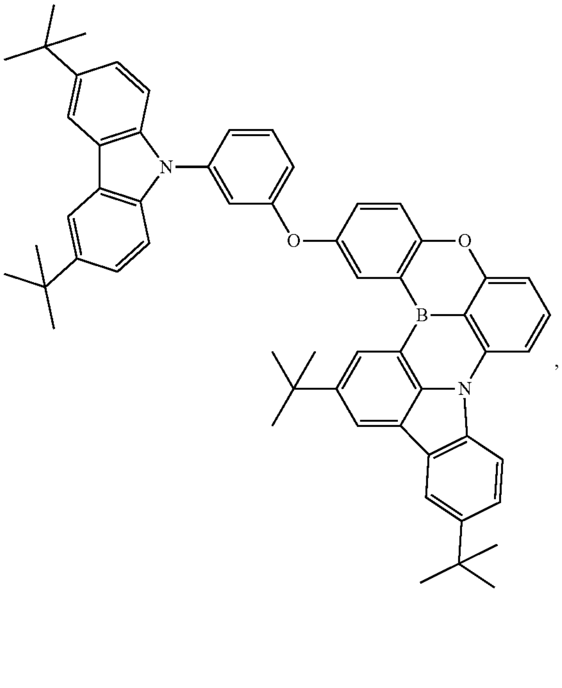
, -continued
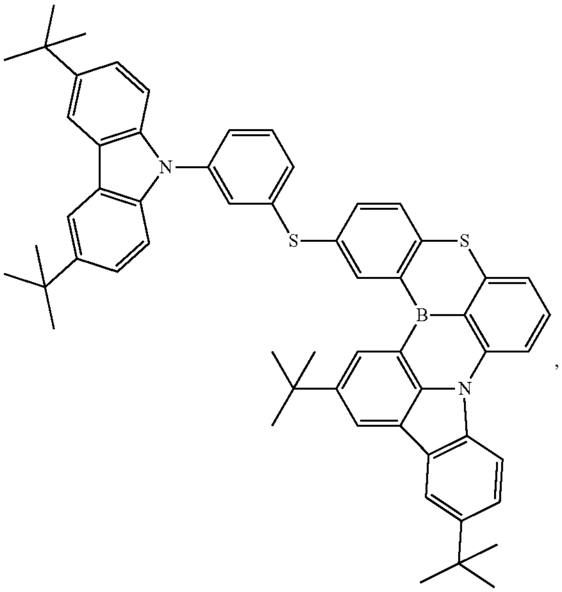
,
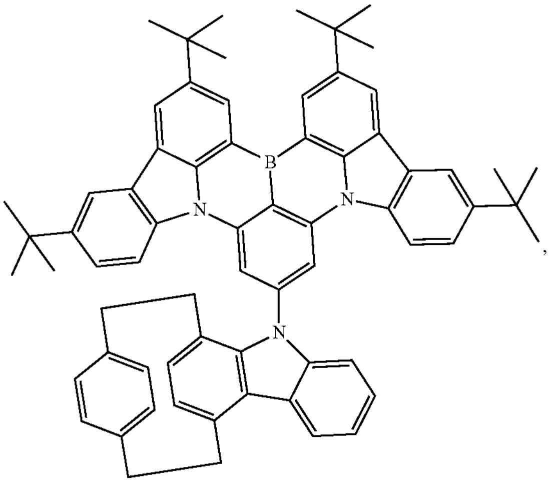
,
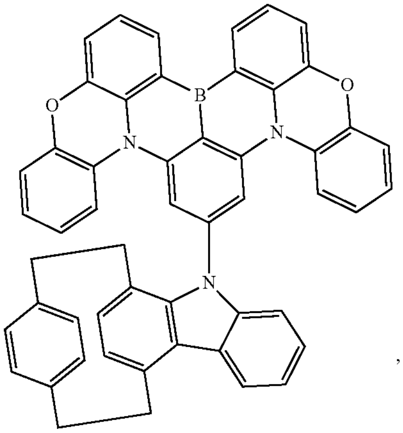
,
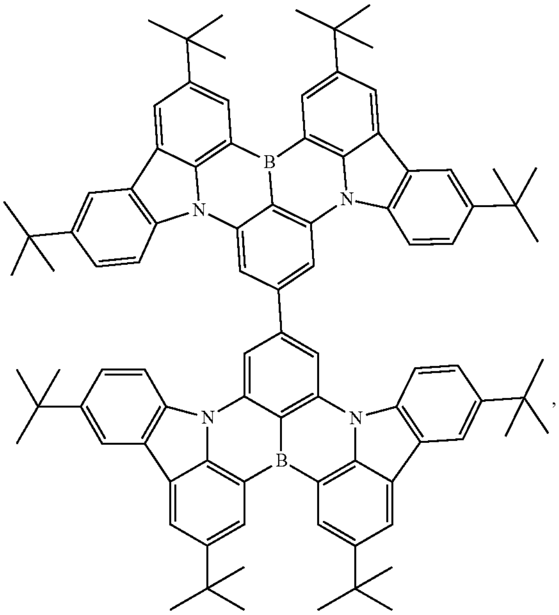
, -continued
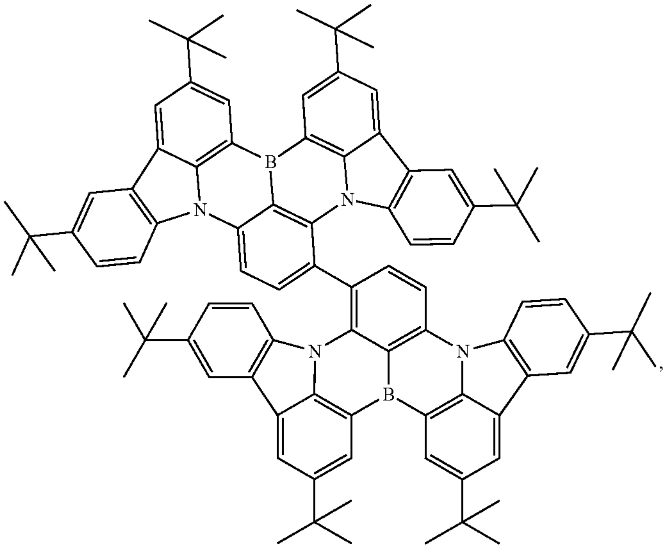
,
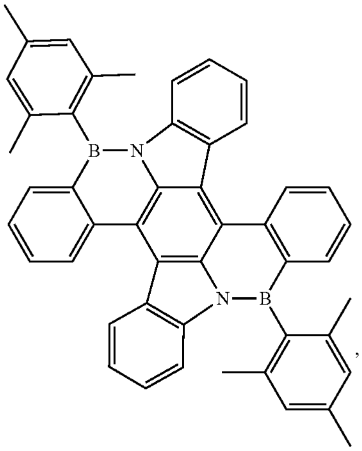
,
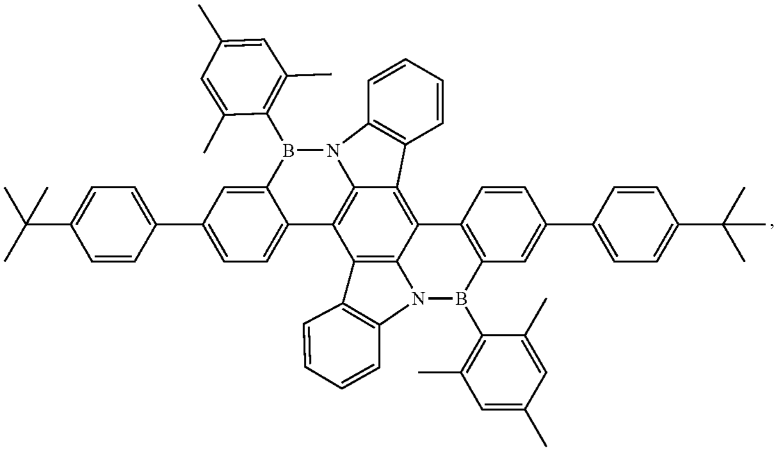
,
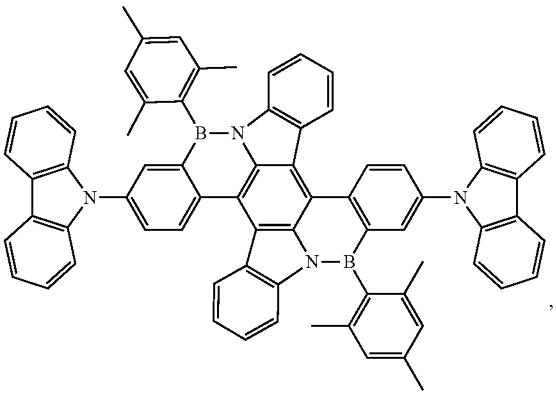
,
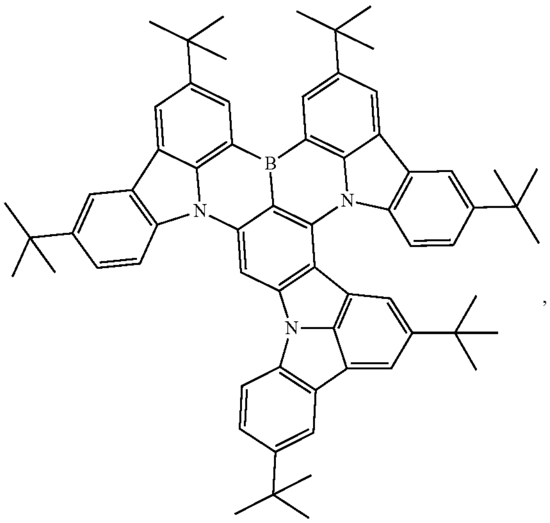
, -continued
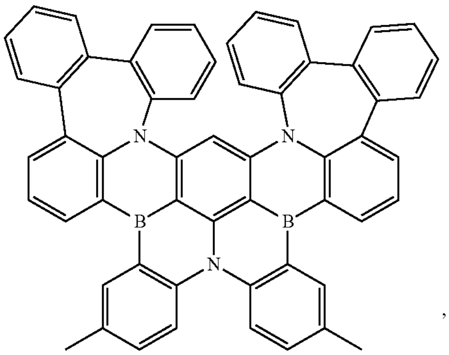
,
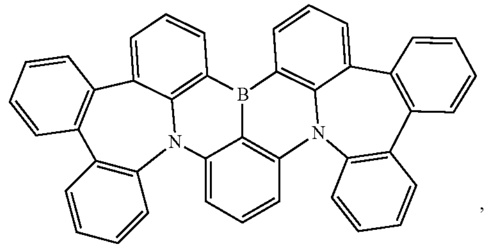
,
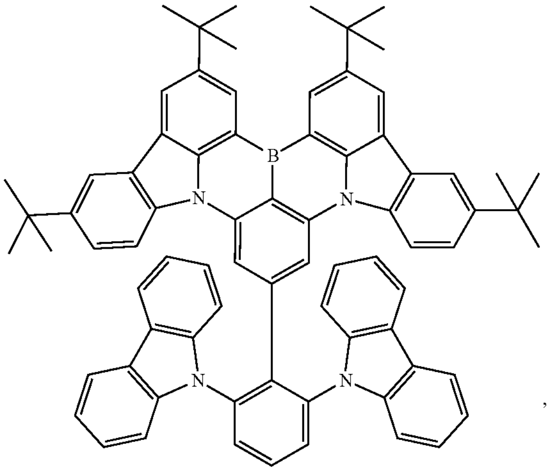
,
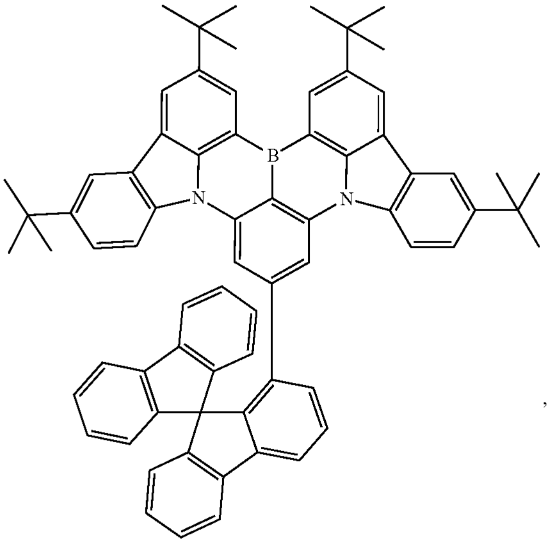
,
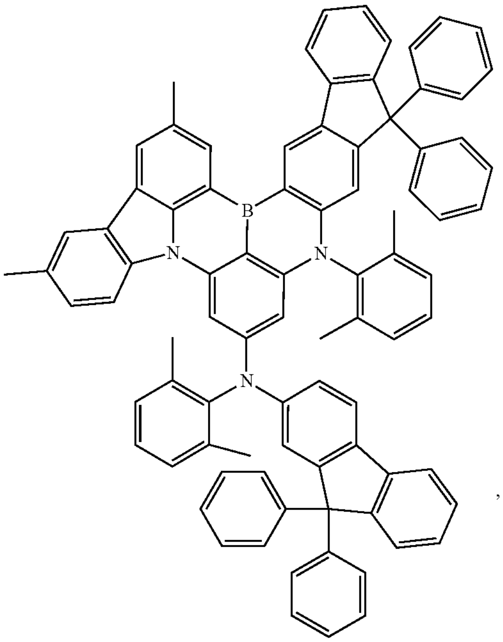
,
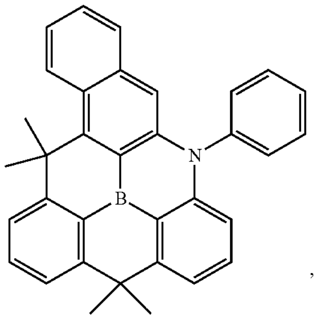
, -continued
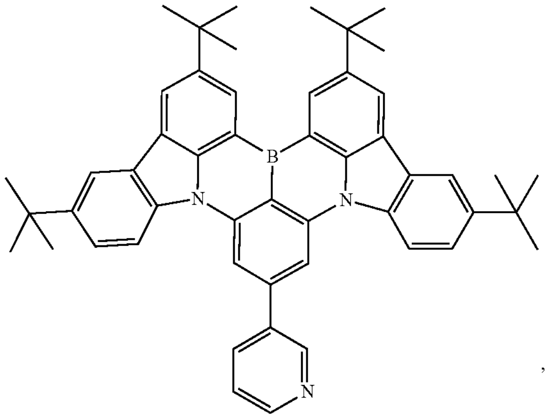
,
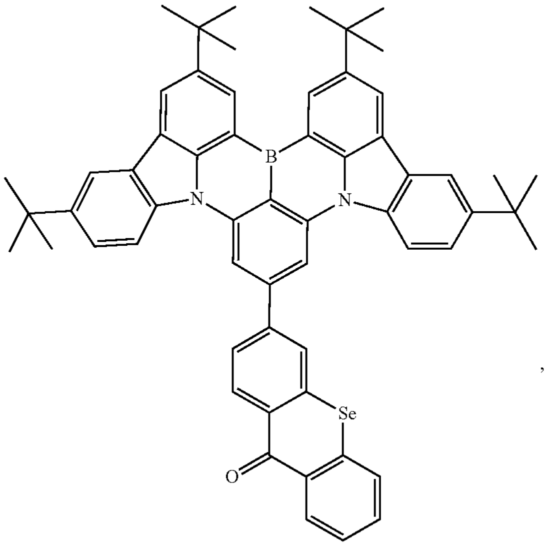
,
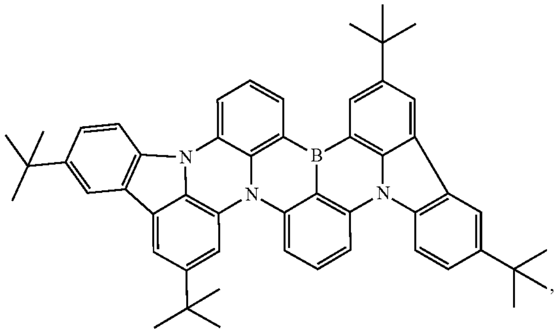
,
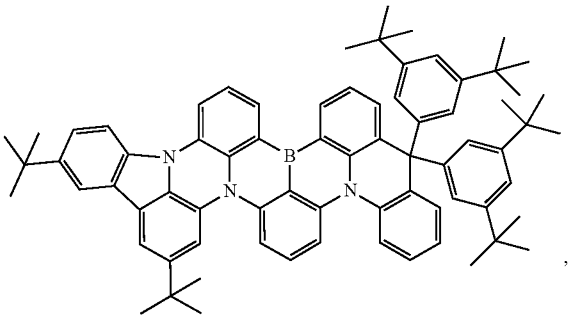
,
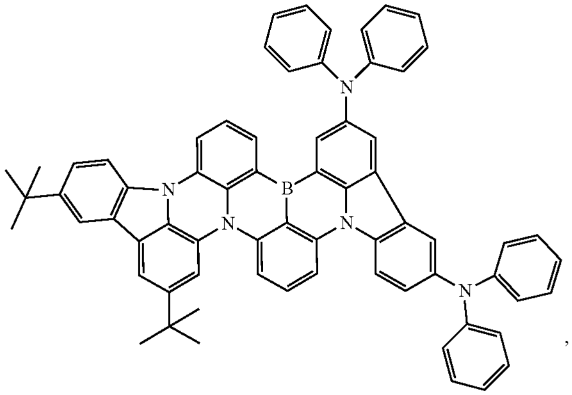
,
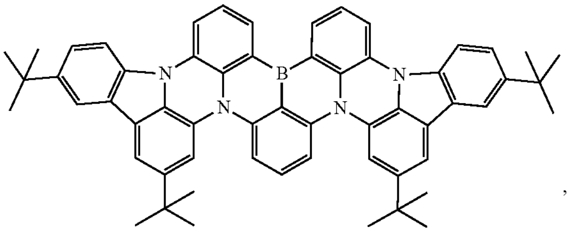
,
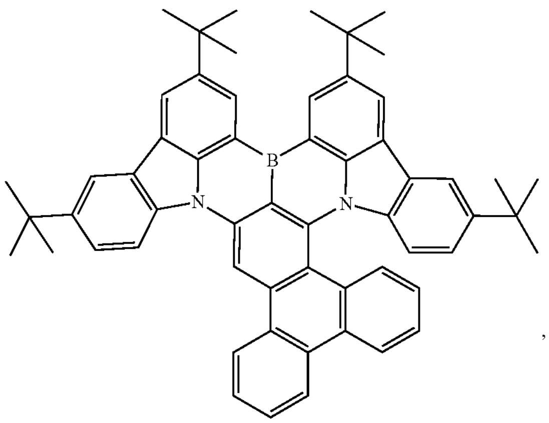
,
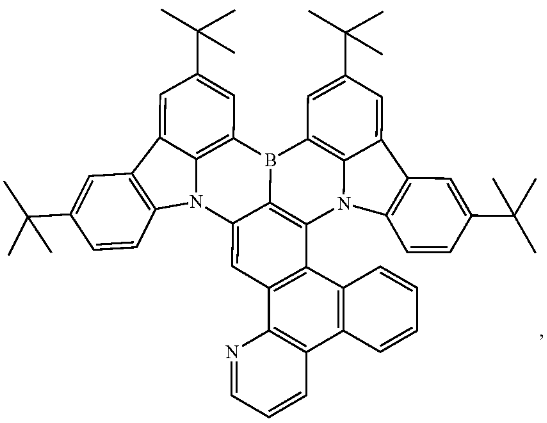
, -continued
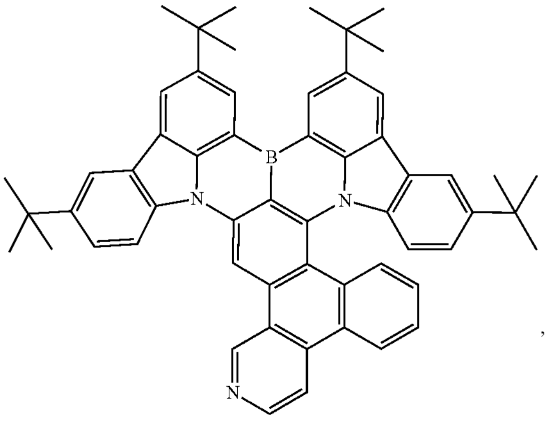
,
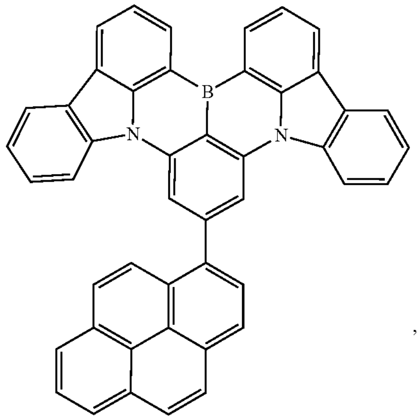
,
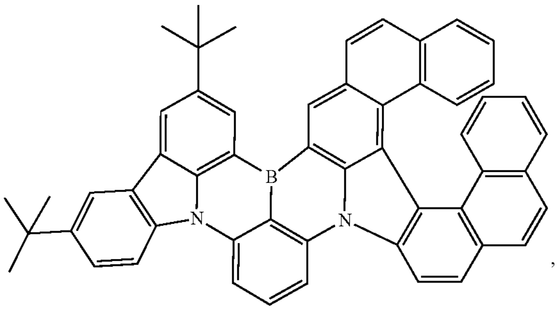
,
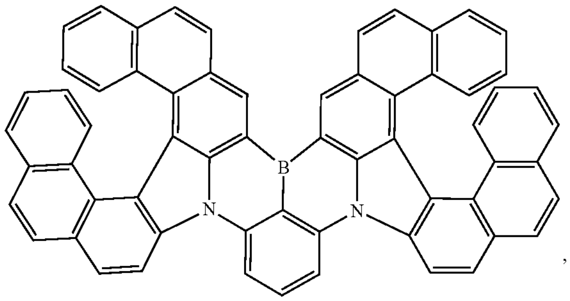
,
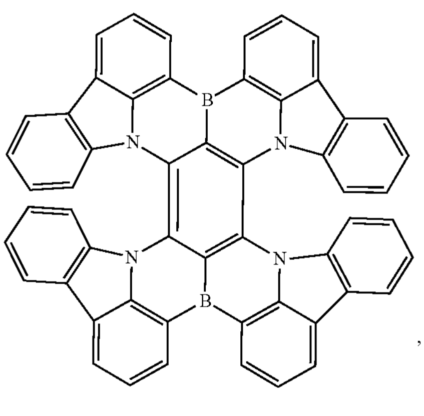
,
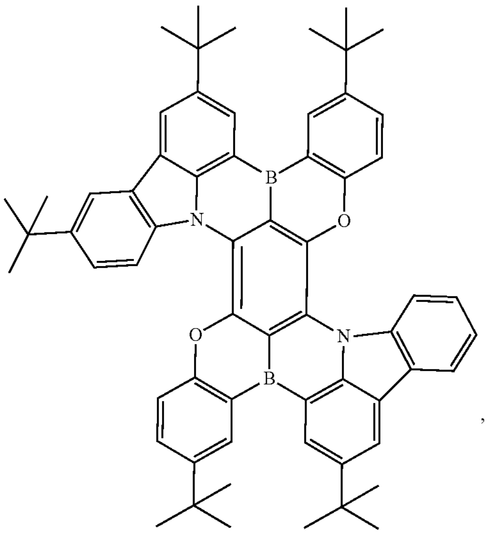
, -continued
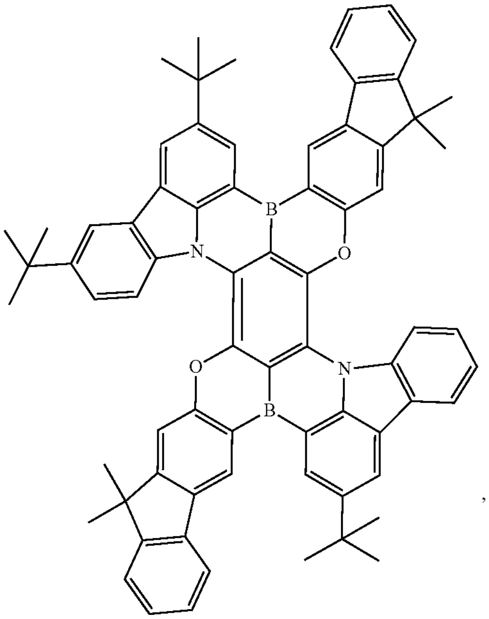
,
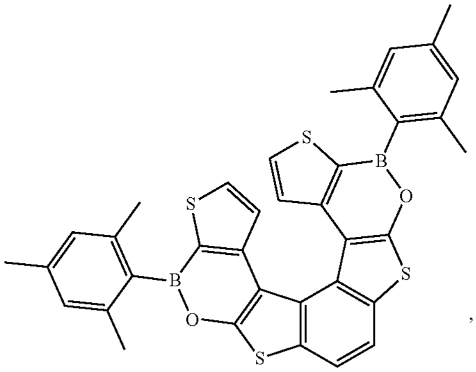
,
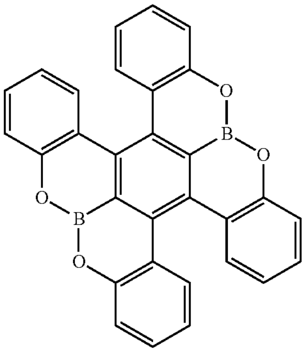
,
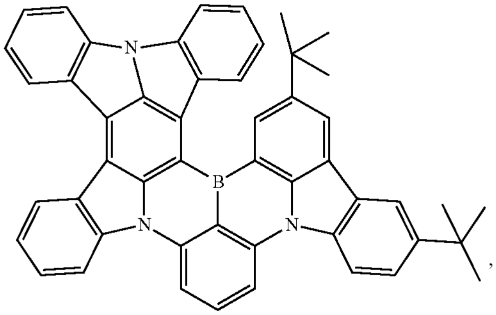
,
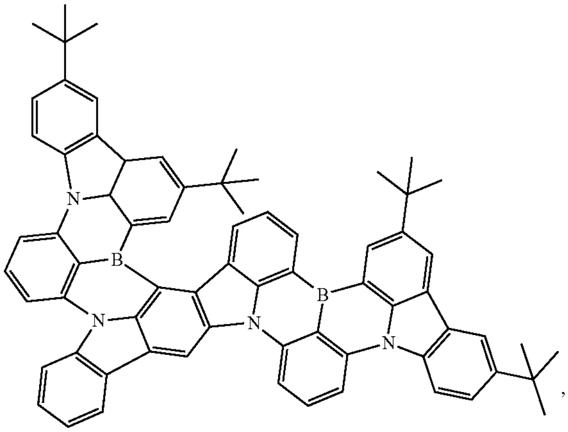
,
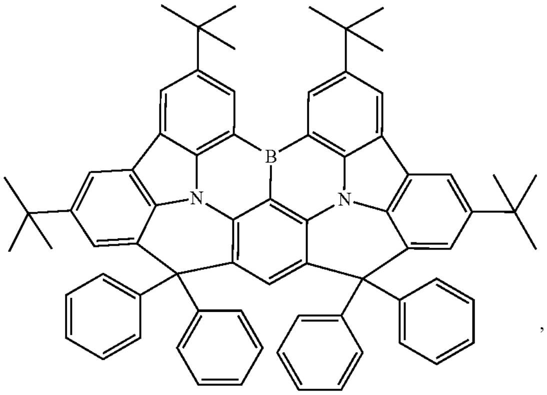
, -continued
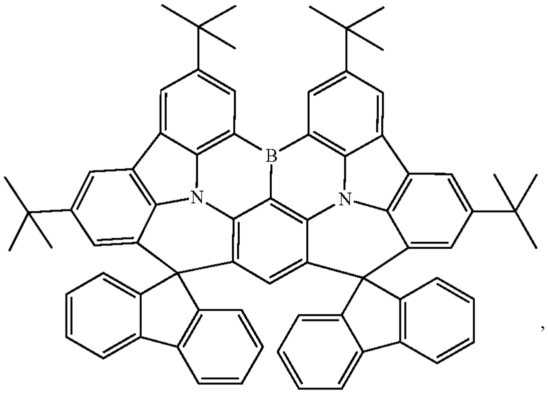
,
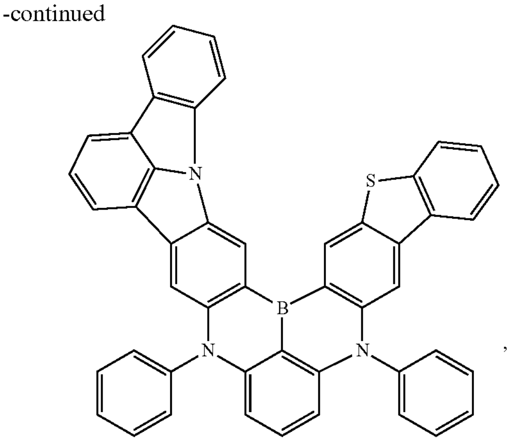
,
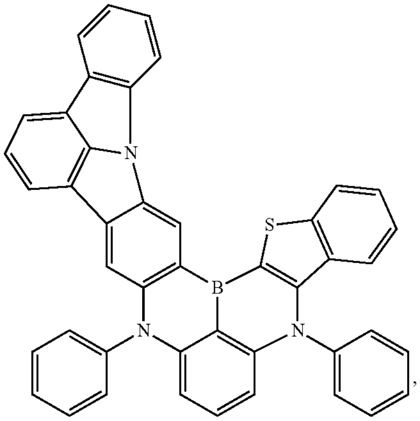
,
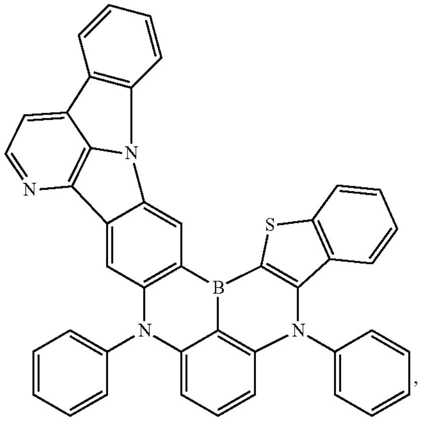
,
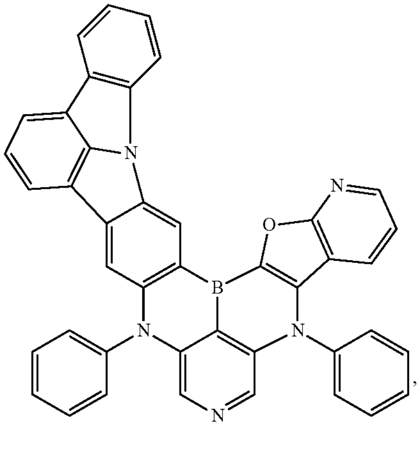
,
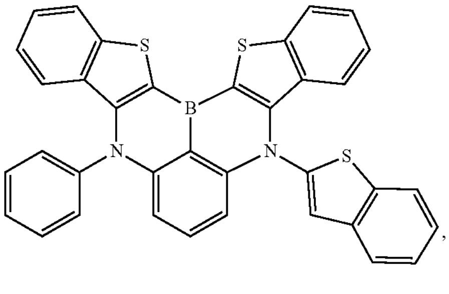
,
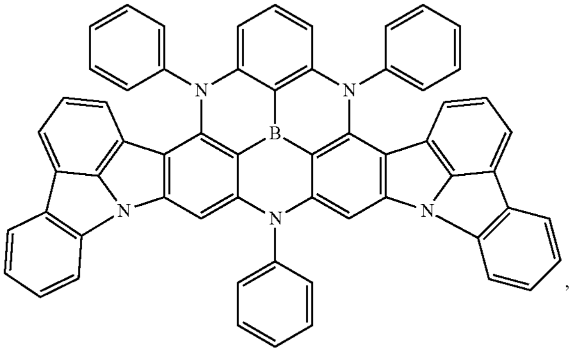
,
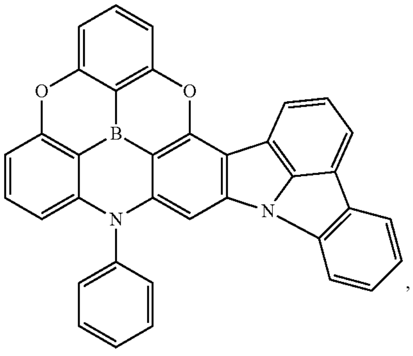
, -continued
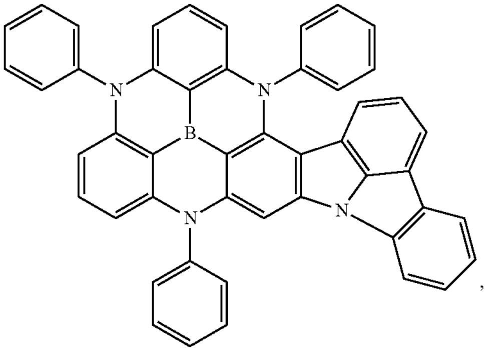
,
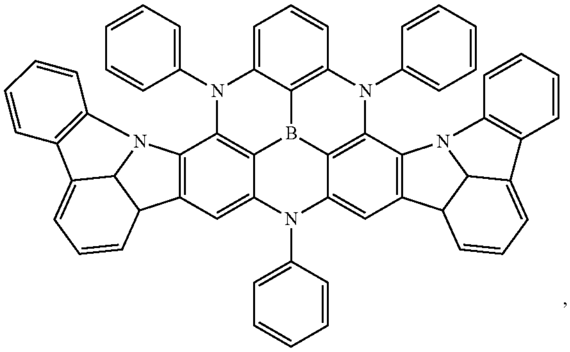
,
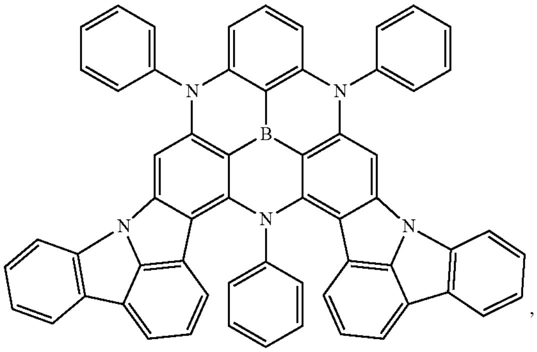
,
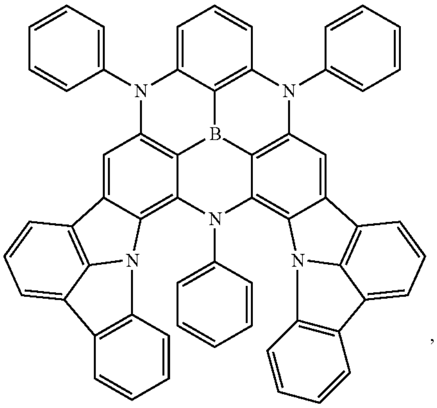
,
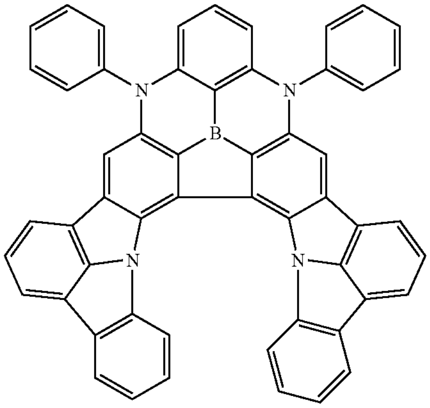
,
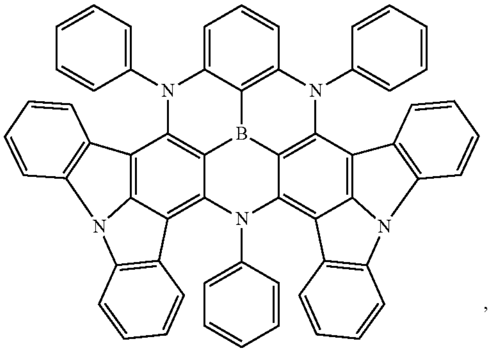
,
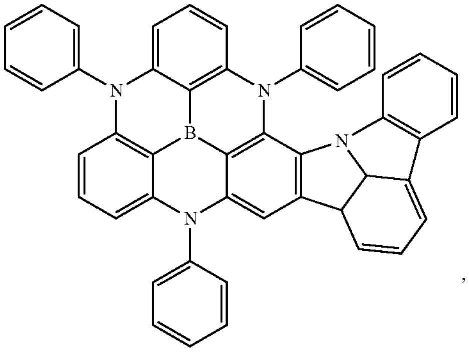
,
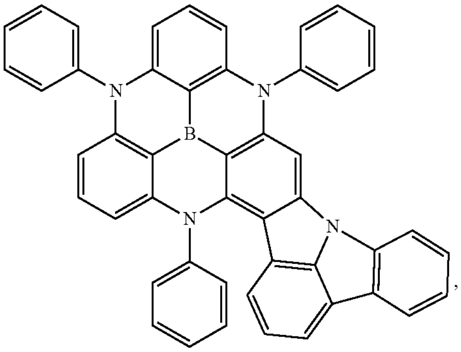
, -continued
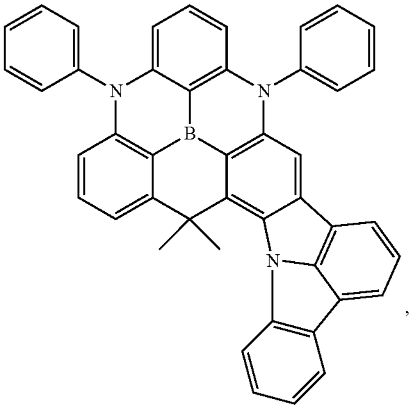
,
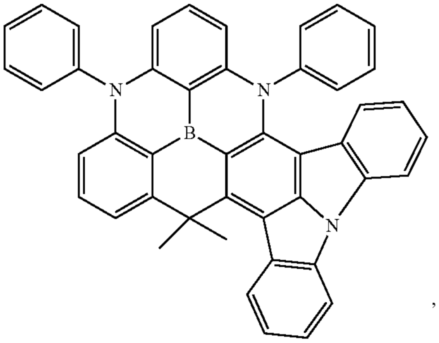
,
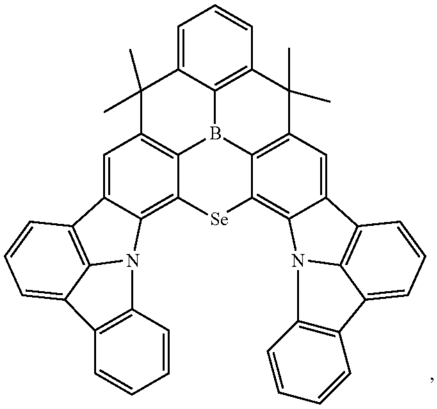
,
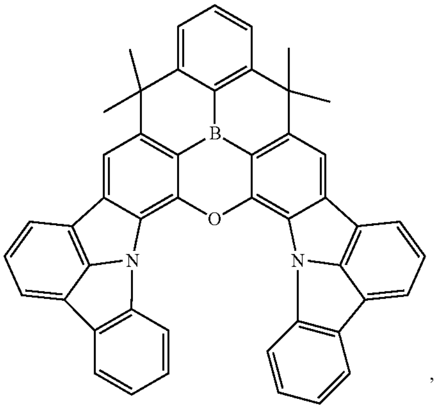
,
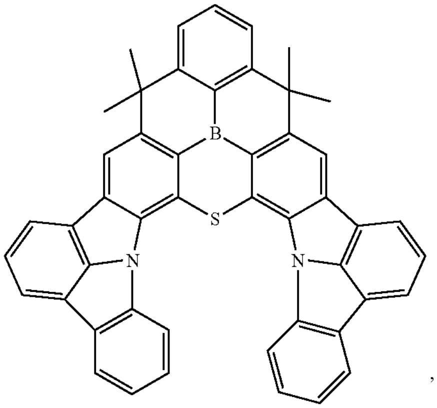
,
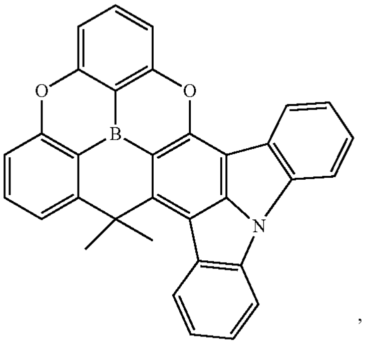
,
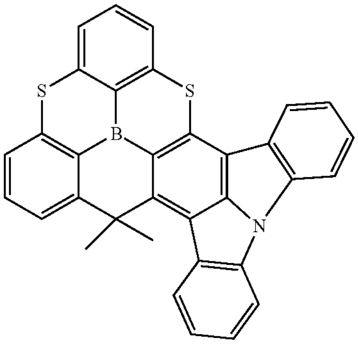
,
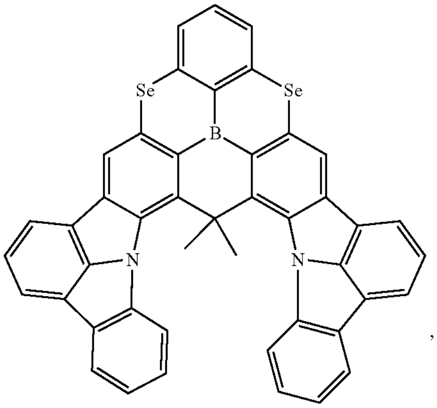
, -continued
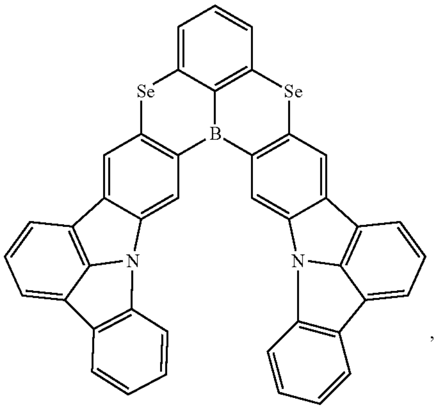
,
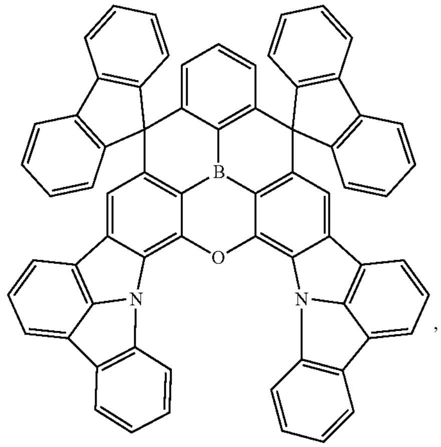
,
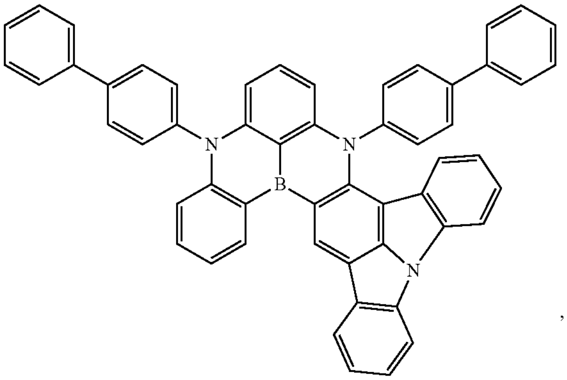
,
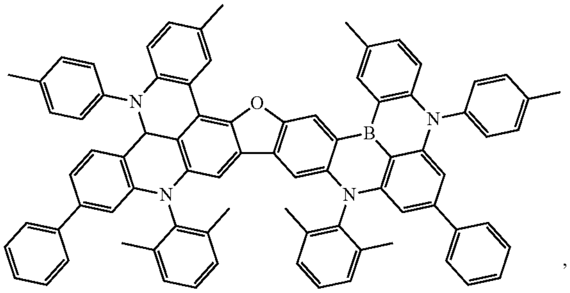
,
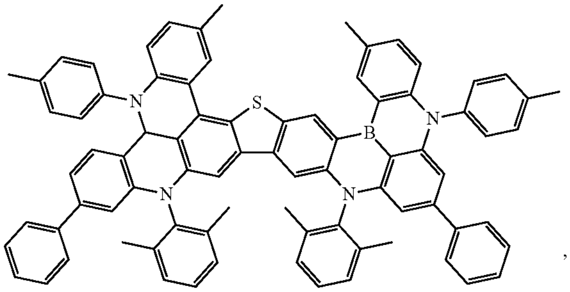
,
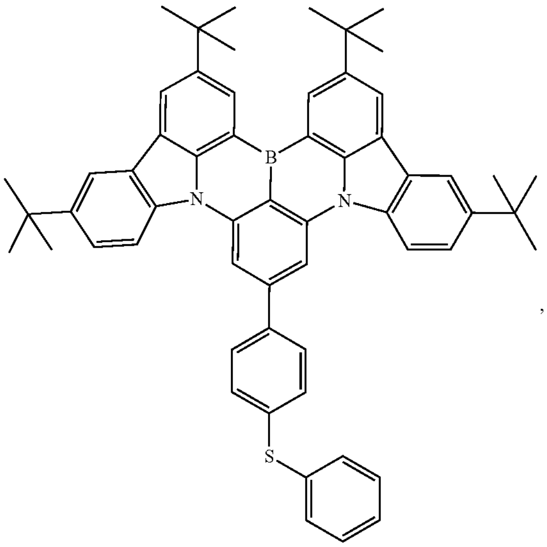
, -continued
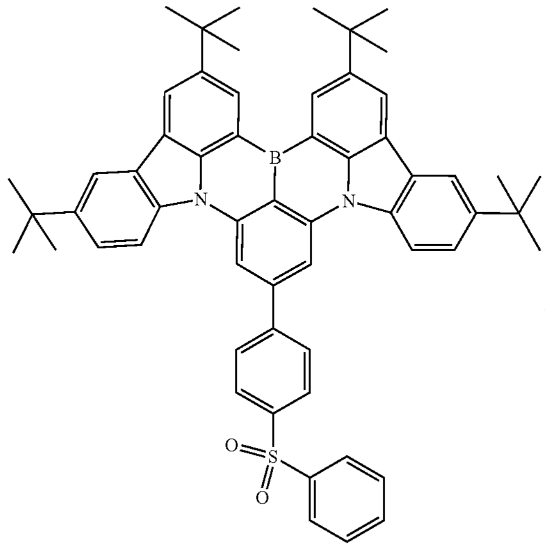
,
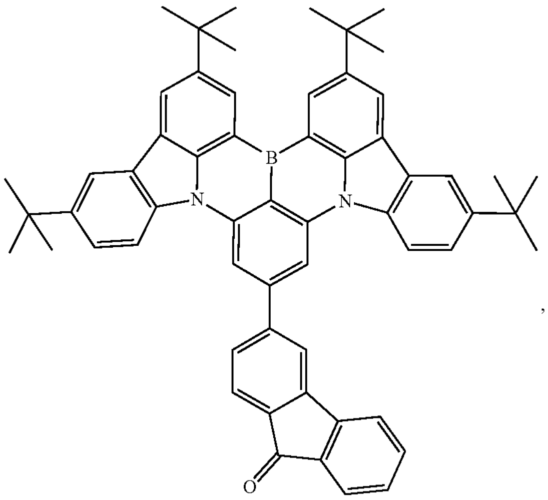
,
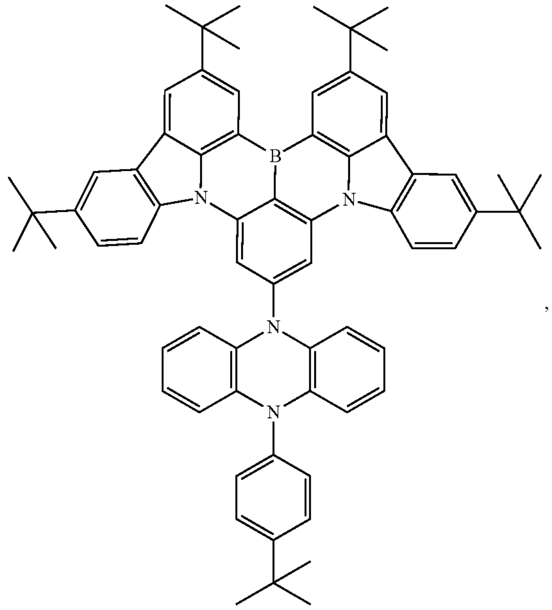
,
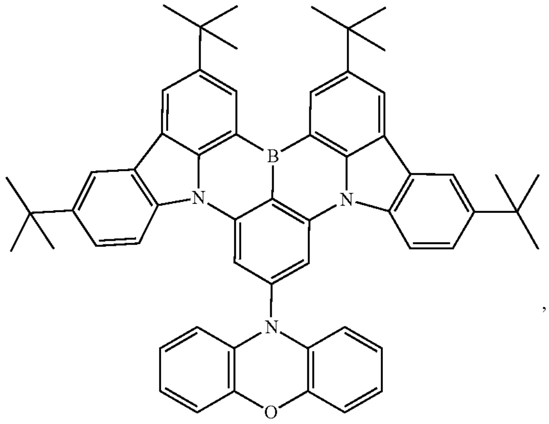
,
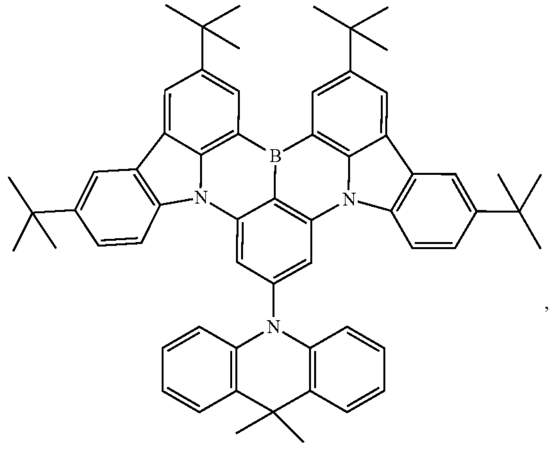
,
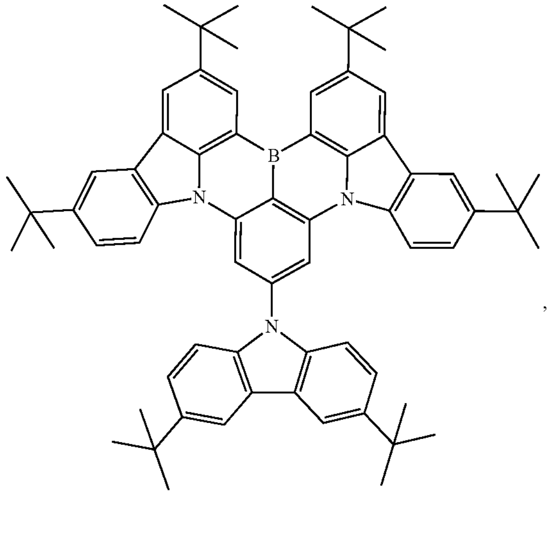
, -continued
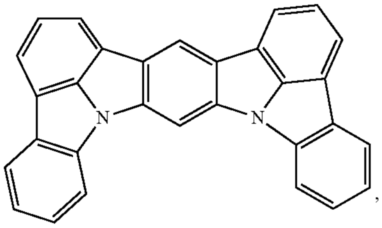
,
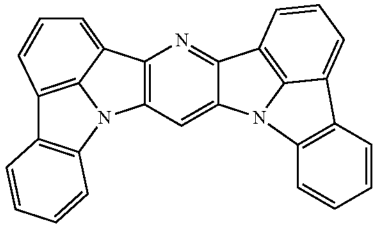
,
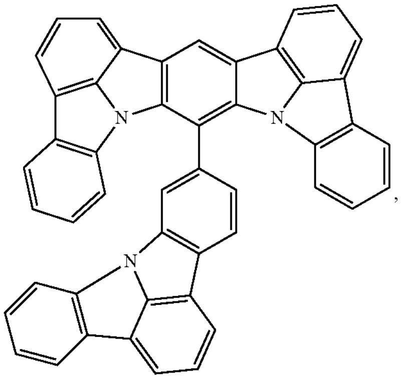
,
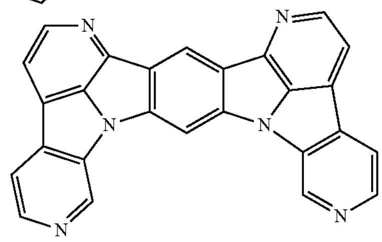
,
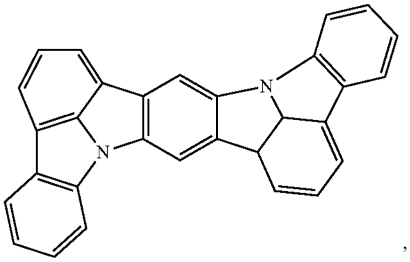
,
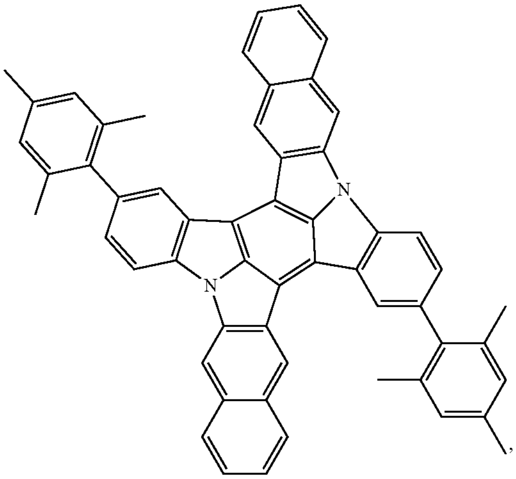
,
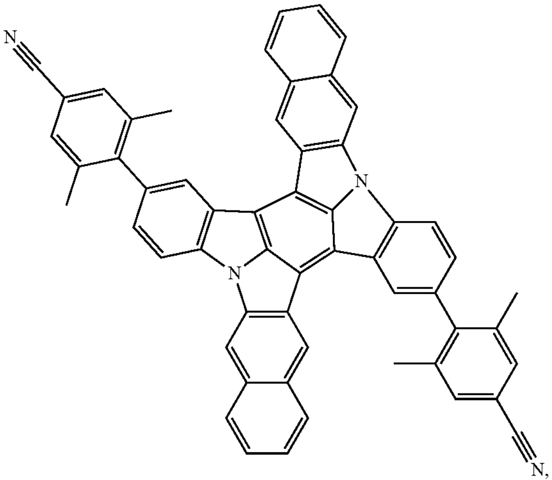
,
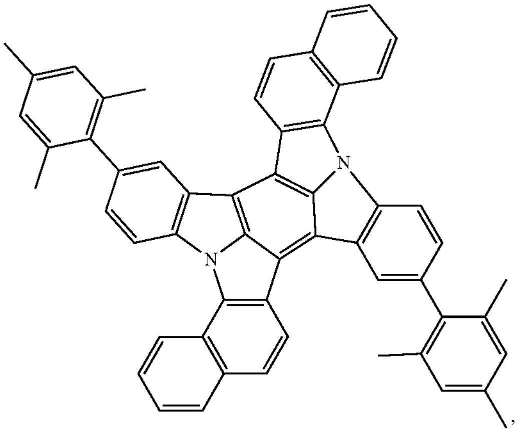
, -continued
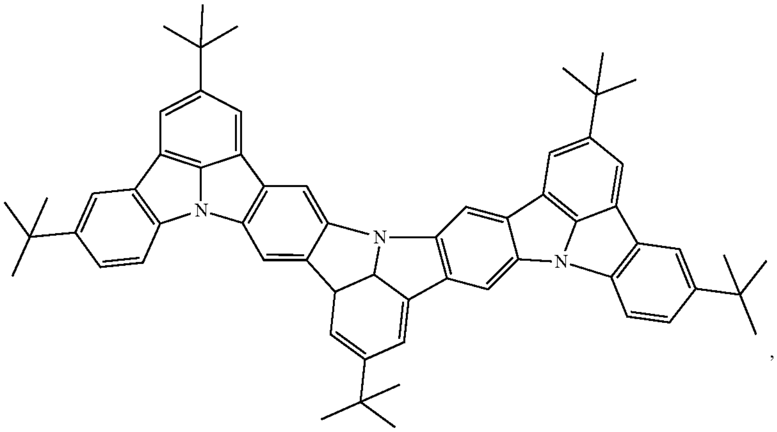
,
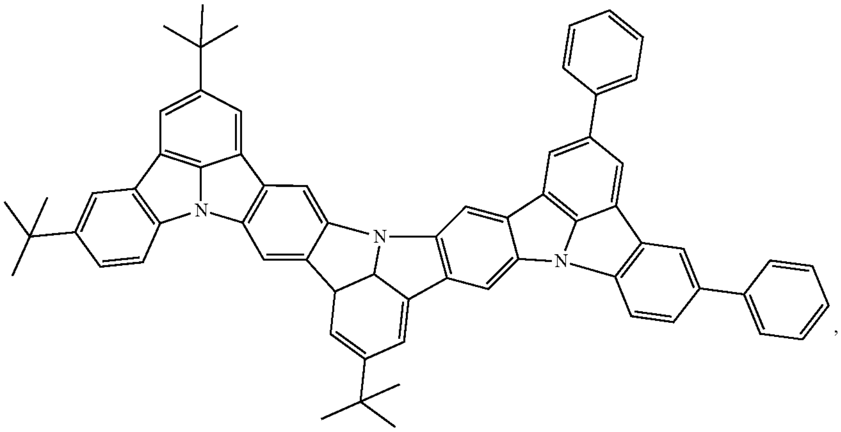
,
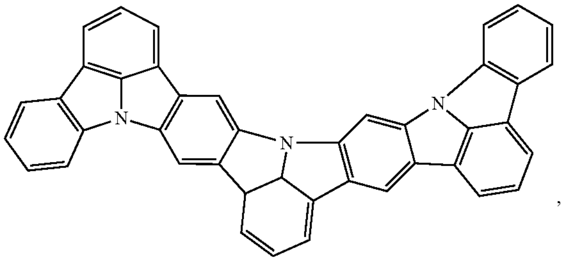
,
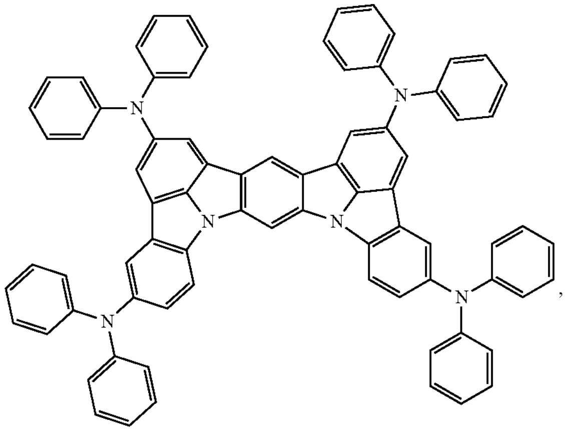
,
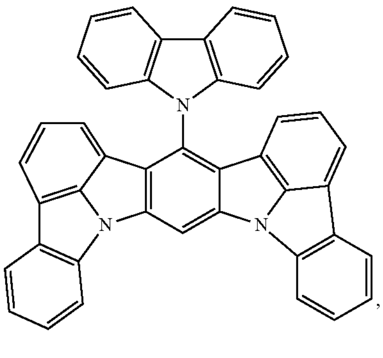
,
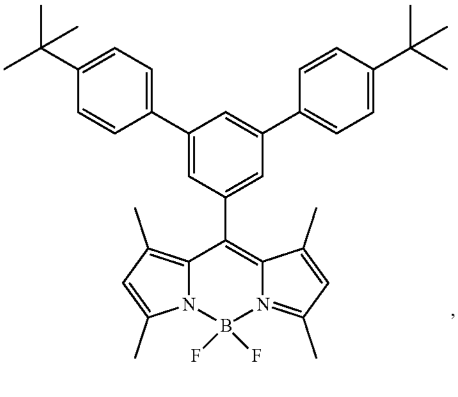
, -continued
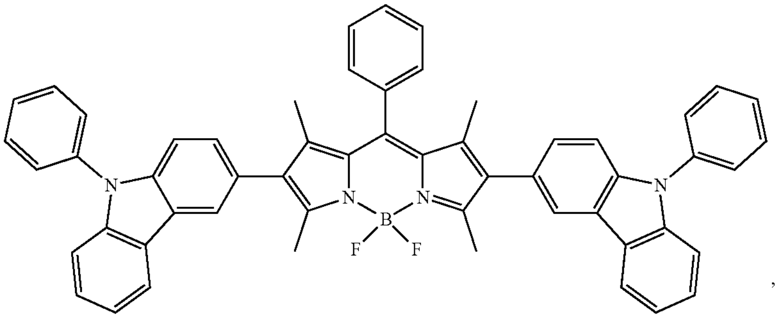
,
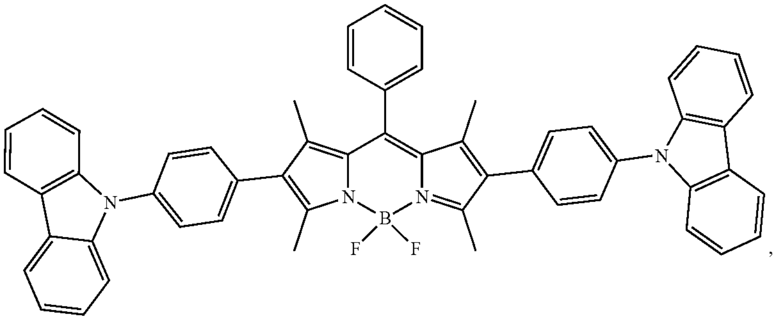
,
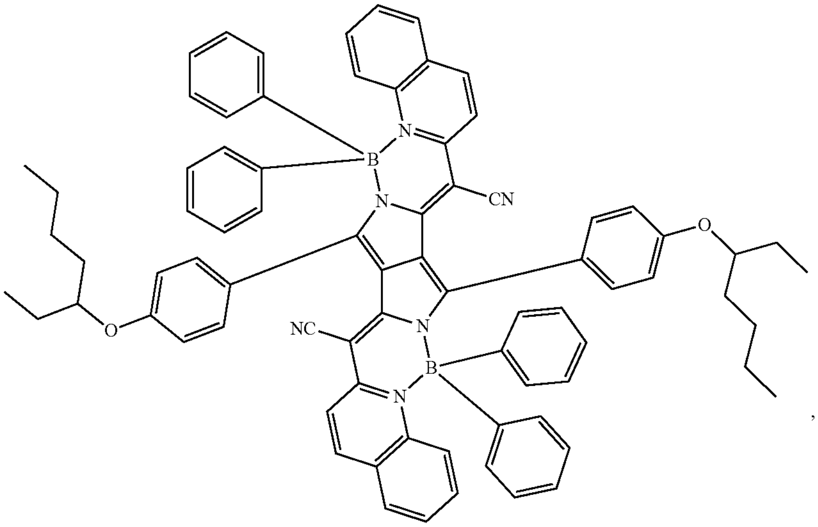
,
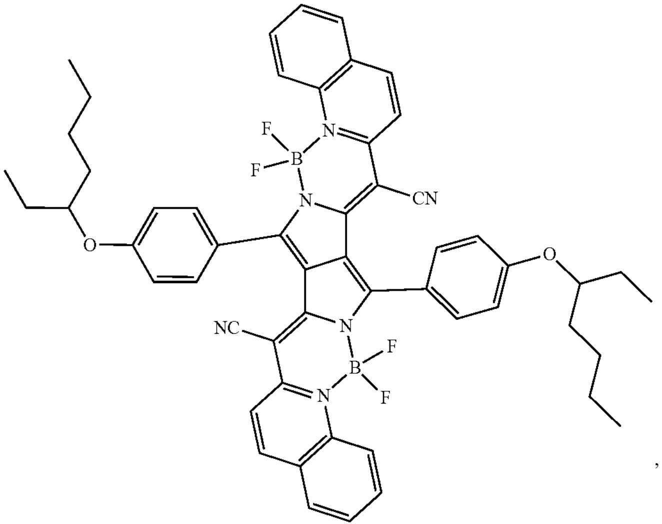
,
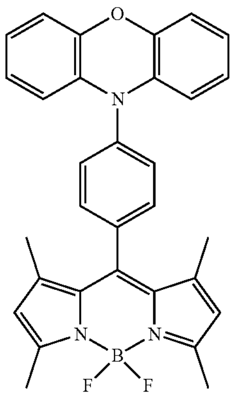
, -continued
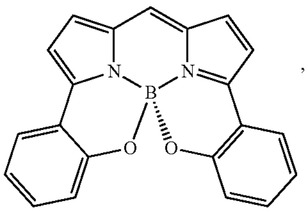
,
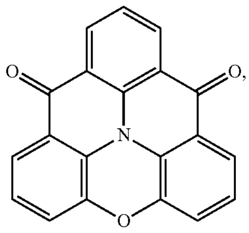
,
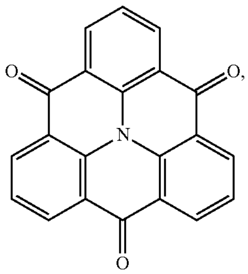
,
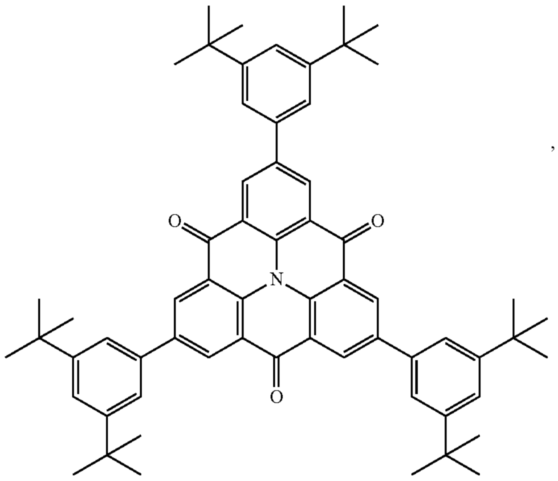
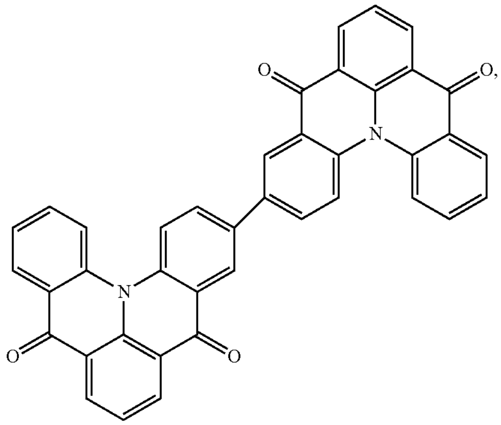
,
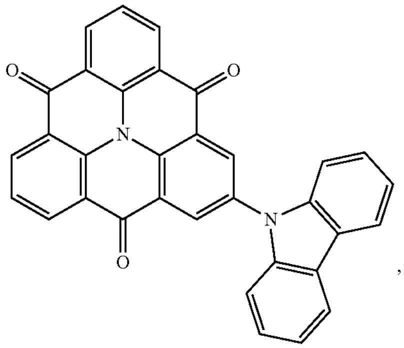
,
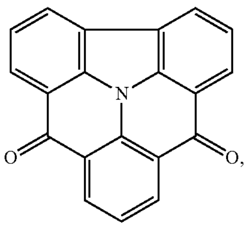
,
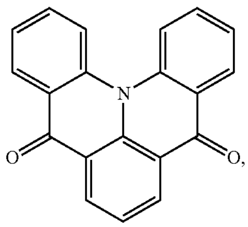
,
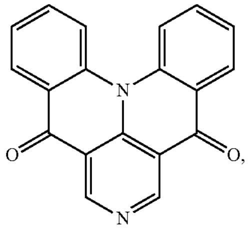
,
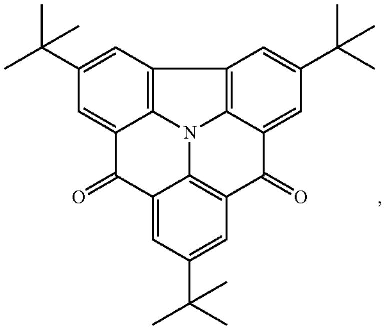
, -continued
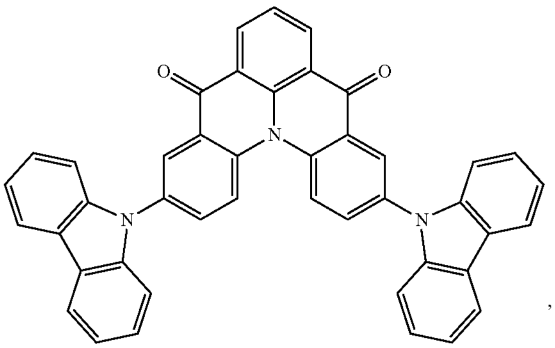
,
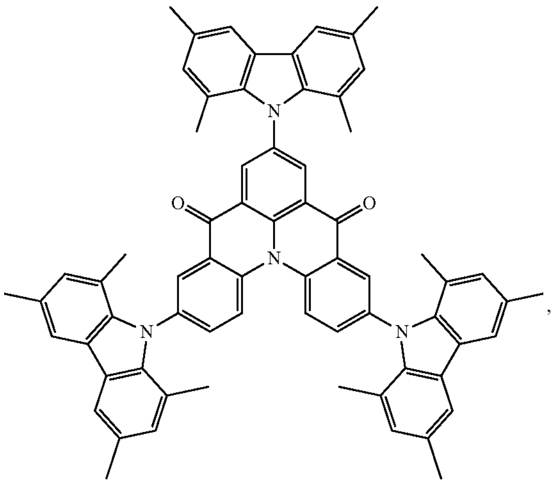
,
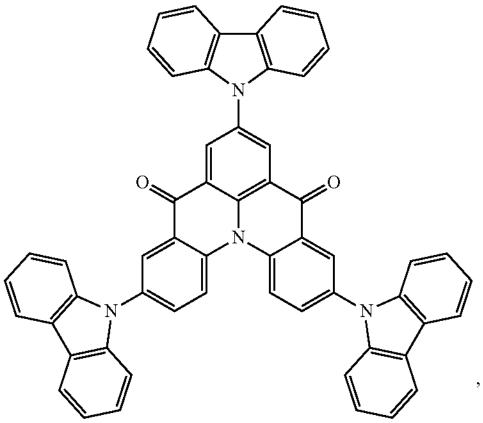
,
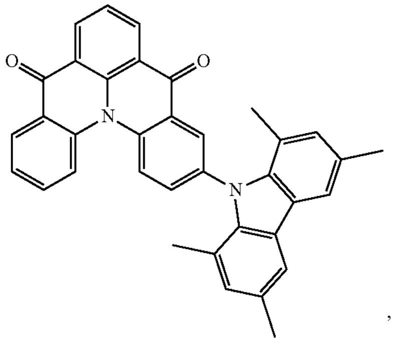
,
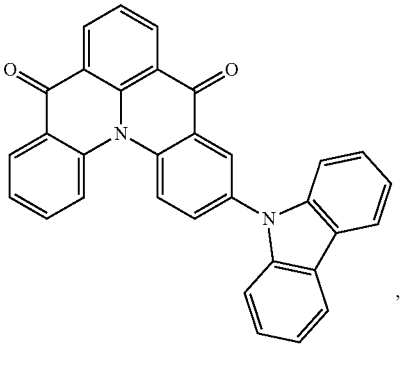
,
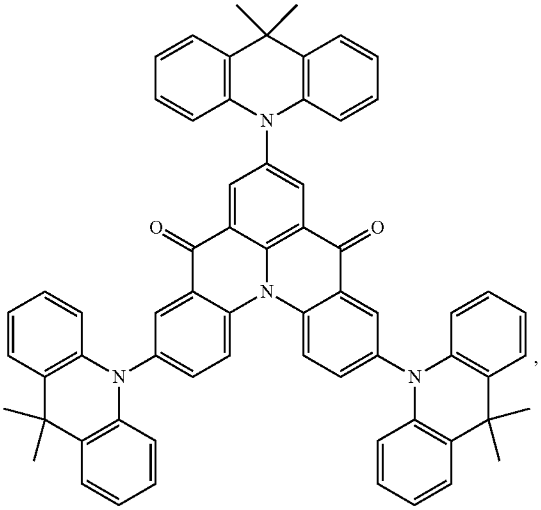
, -continued
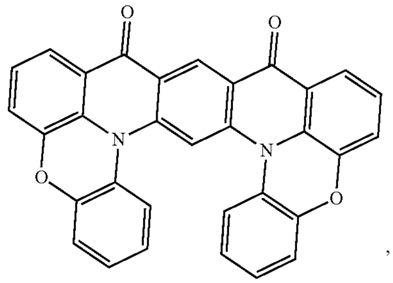
,
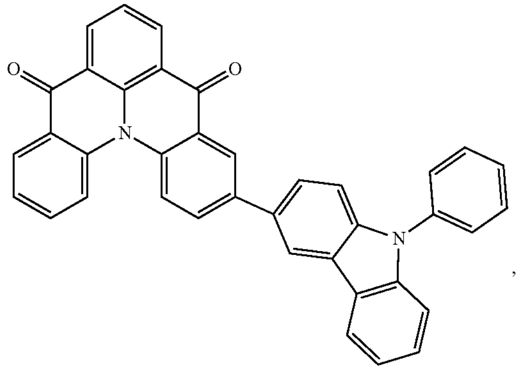
,
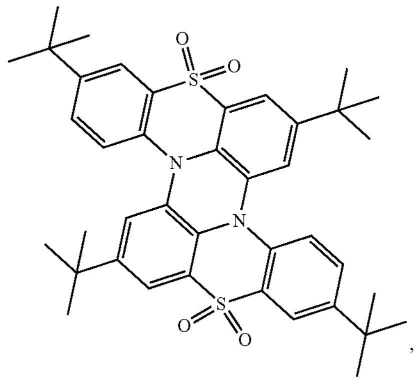
,
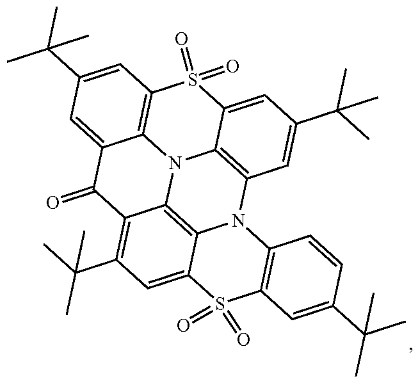
,
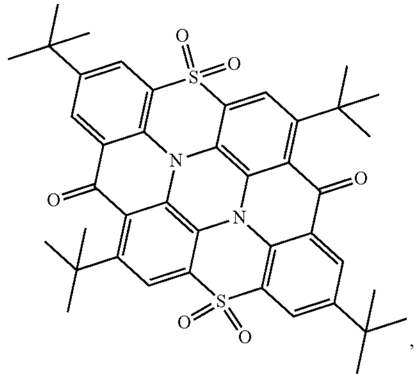
,
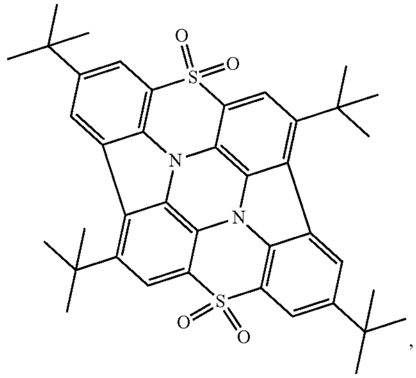
,
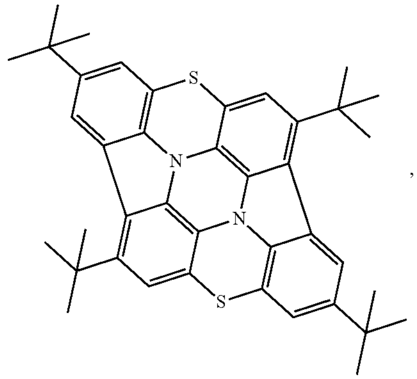
,
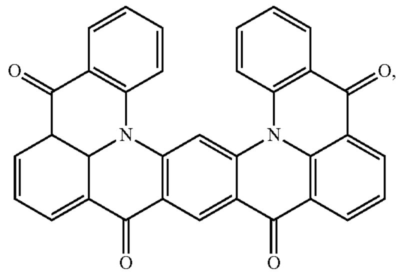
, -continued
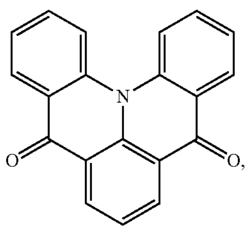
,
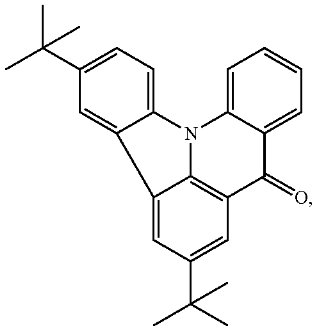
,
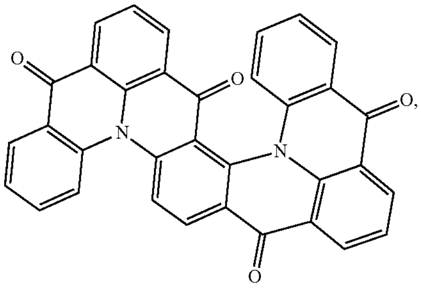
,
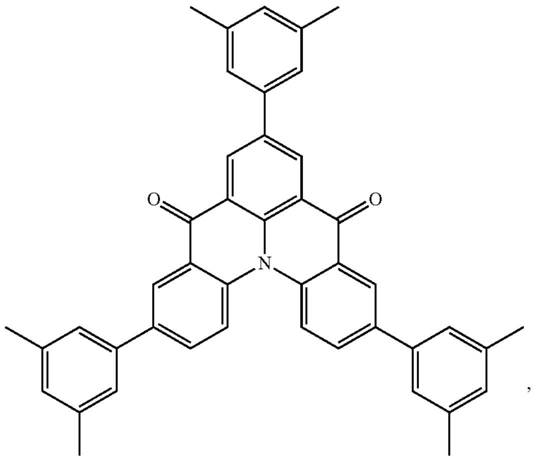
,
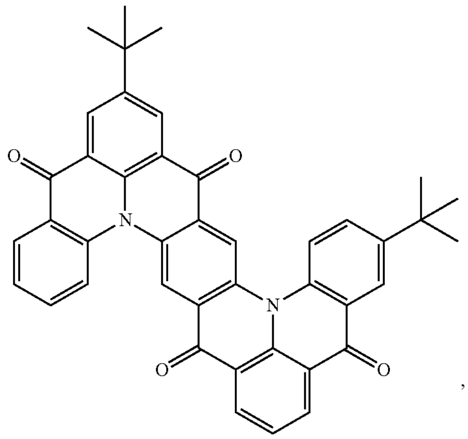
,
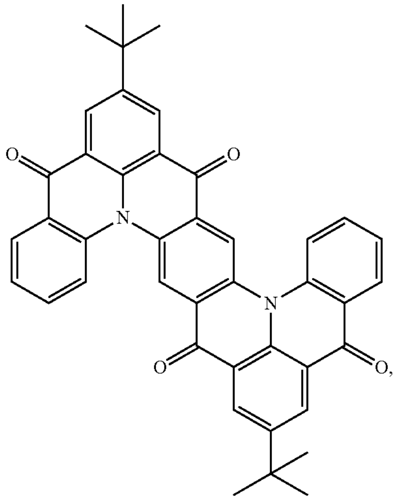
,
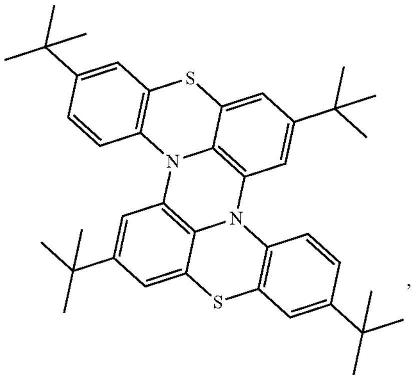
,
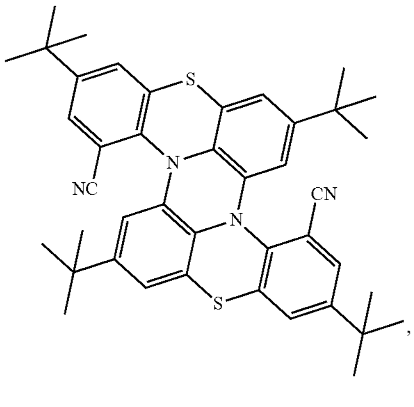
,
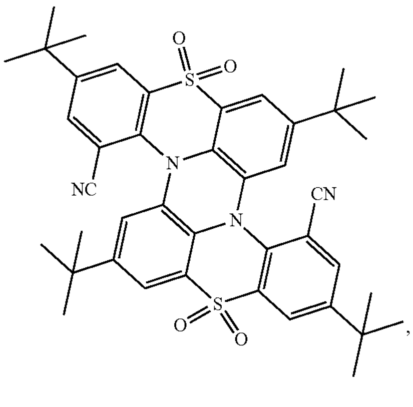
, -continued
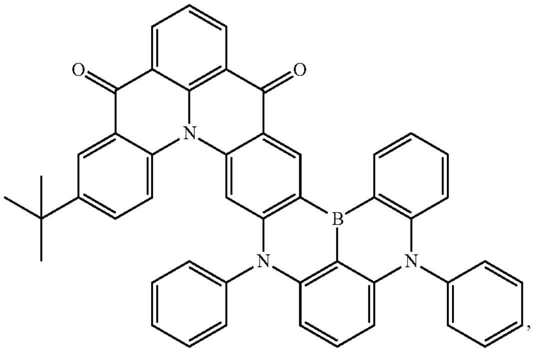,
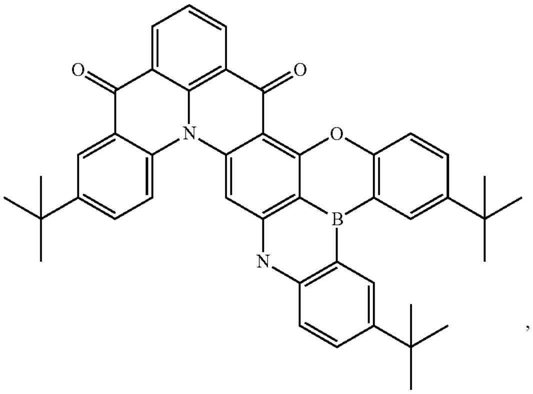,
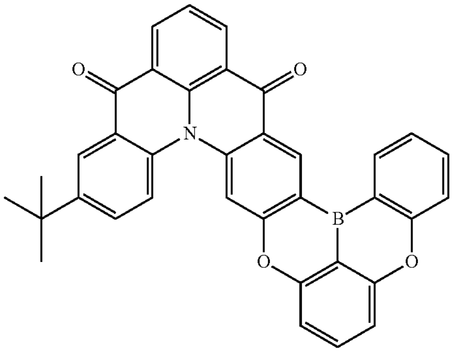,
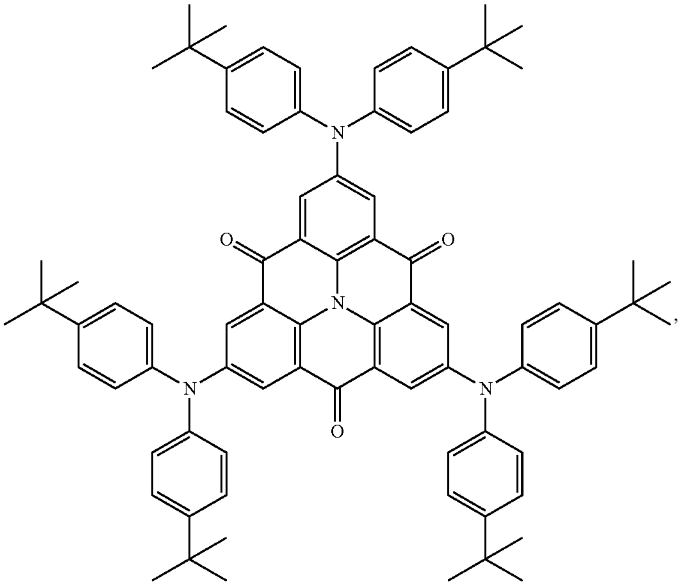,
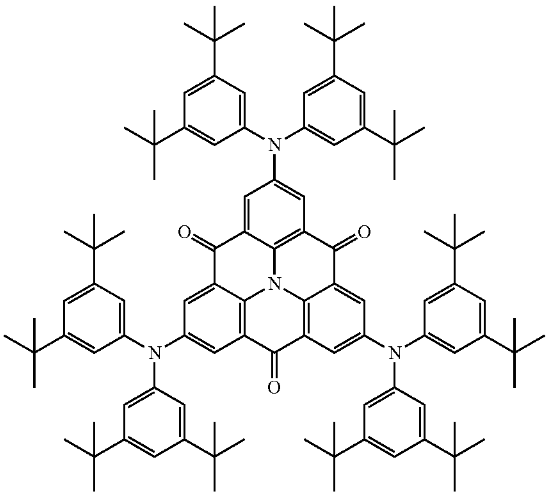,
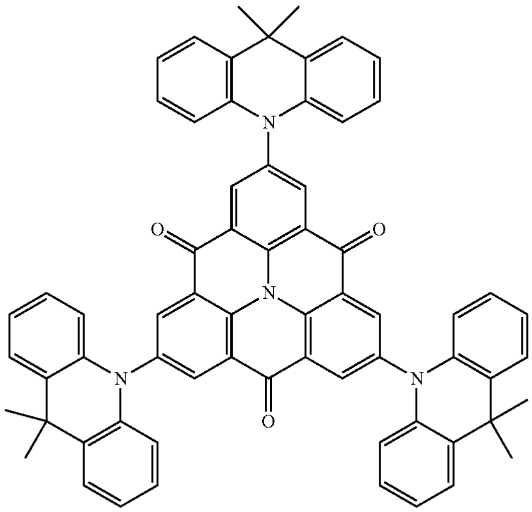, -continued

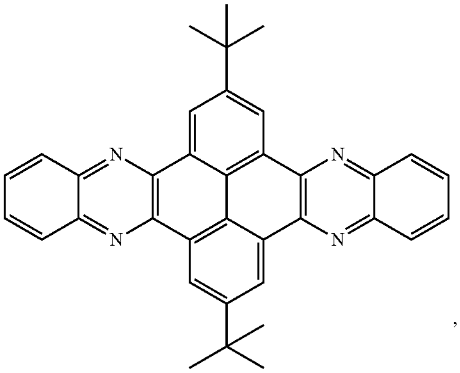

,

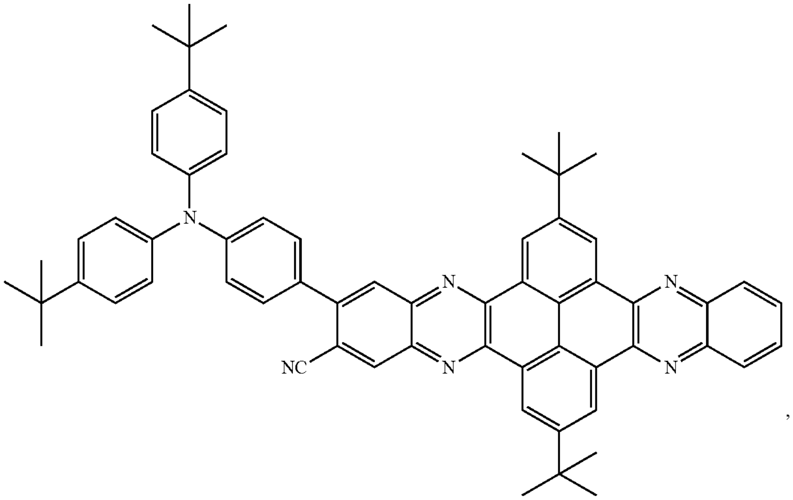

,

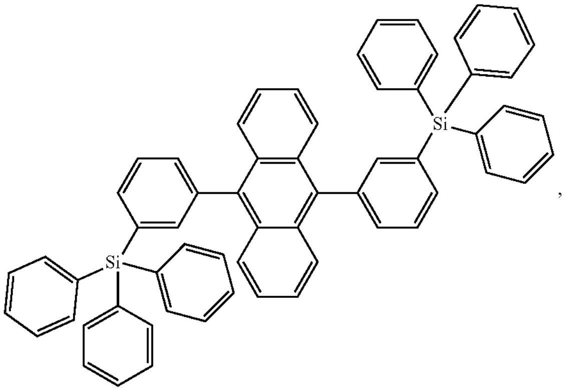

, aza-substituted variants thereof, fully or partially deuterated variants thereof, and combinations thereof.

In some of the above embodiments, any carbon ring atoms up to maximum of a total number of three, together with their substituents, in each phenyl ring of any of above structures can be replaced with N. In some embodiments, the compound may be an acceptor, and the OLED may further comprise a sensitizer selected from the group consisting of a delayed fluorescence material, a phosphorescent material, and combination thereof.

In some embodiments, the compound may be a fluorescent emitter, a delayed fluorescence material, or a component of an exciplex that is a fluorescent emitter or a delayed fluorescence material.

In yet another aspect, the OLED of the present disclosure may also comprise an emissive region containing a compound as disclosed in the above compounds section of the present disclosure. In some embodiments, the emissive layer further comprises an additional host, wherein the additional host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1{-}Ar_2$, $C_nH_{2n}{-}Ar_1$, or no substitution; wherein n is an integer from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the additional host can be selected from the HOST group 1 consisting of:
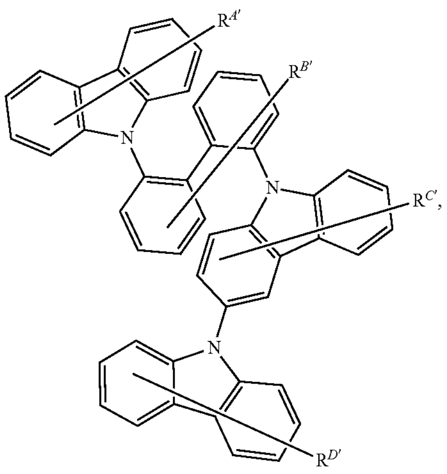
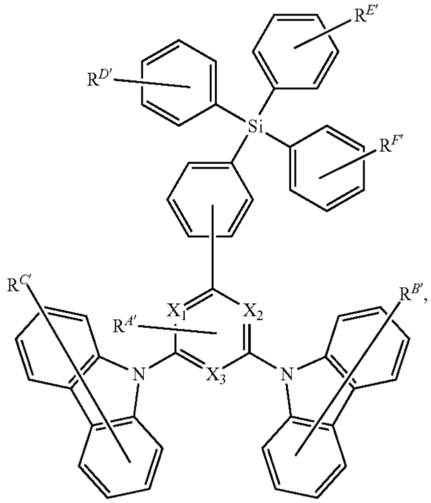
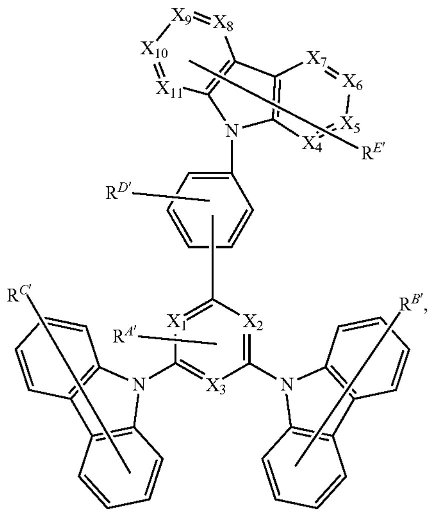
-continued
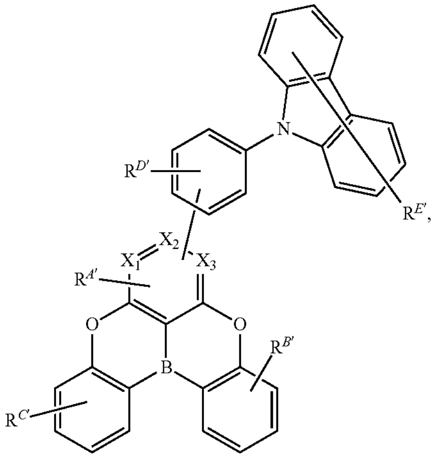
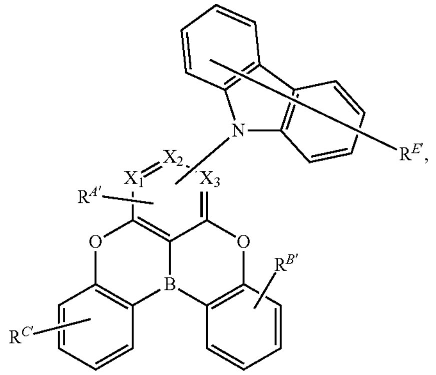
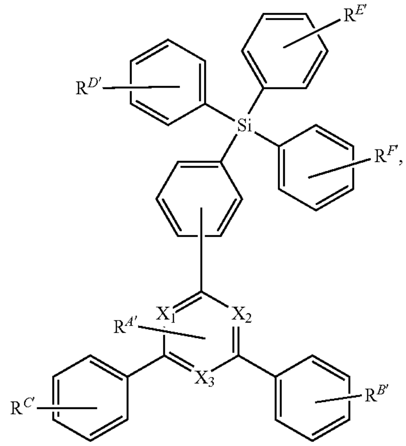
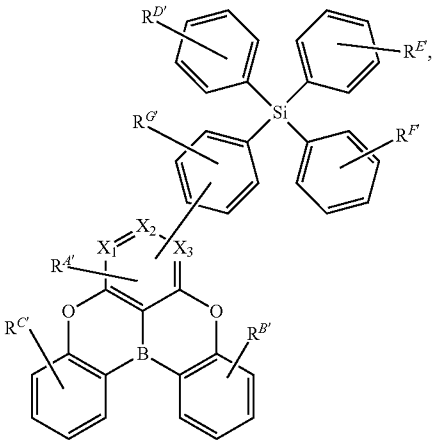

-continued
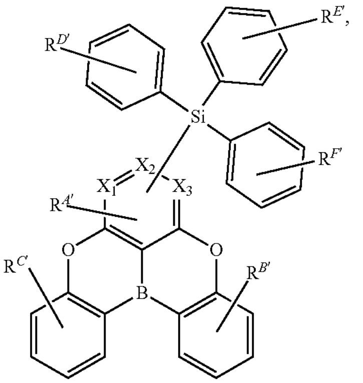
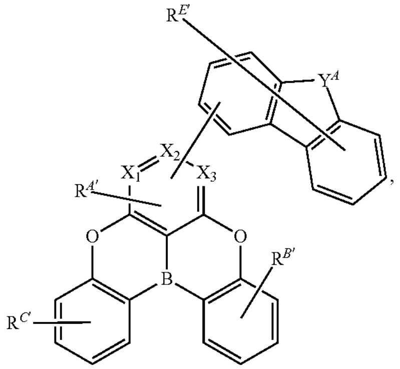
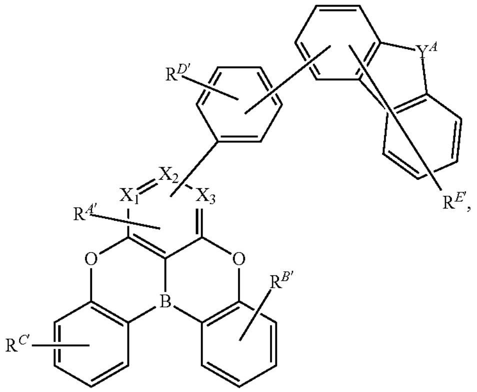
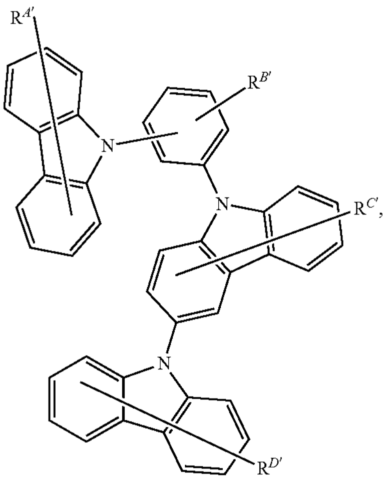
-continued
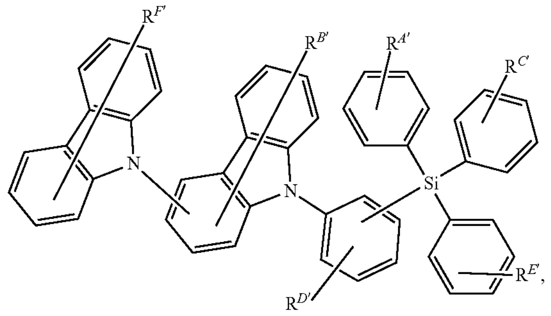
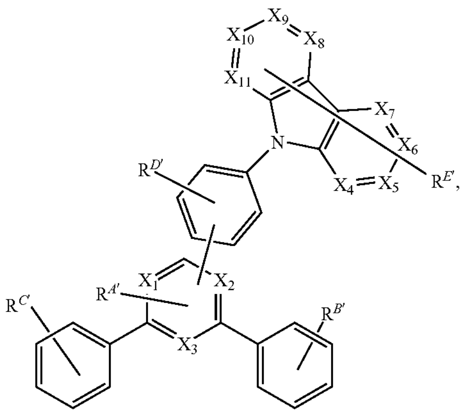
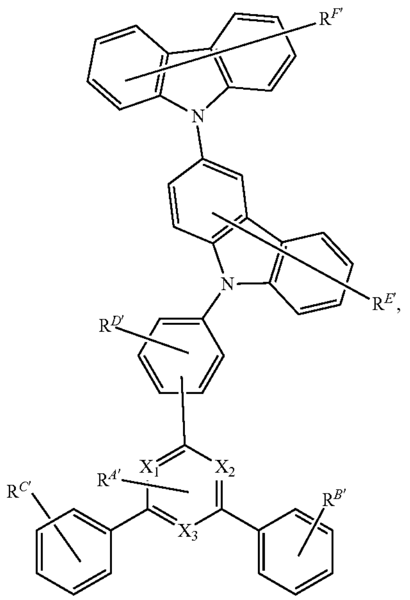

-continued
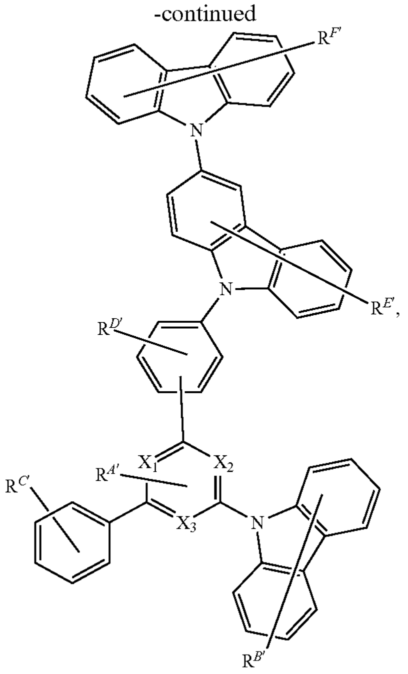
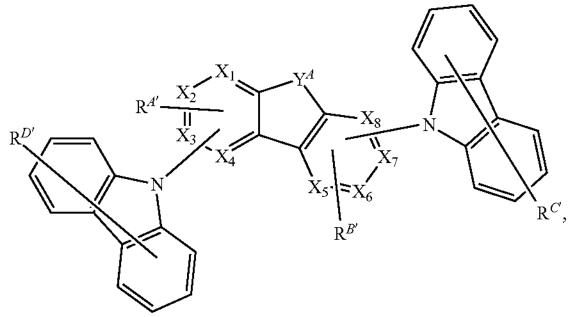
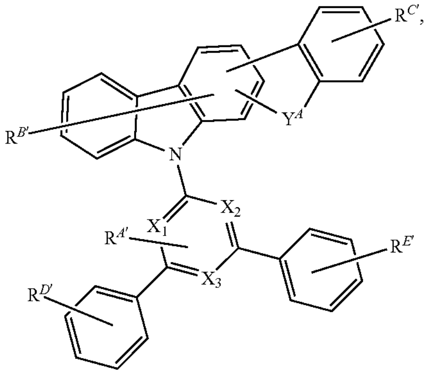
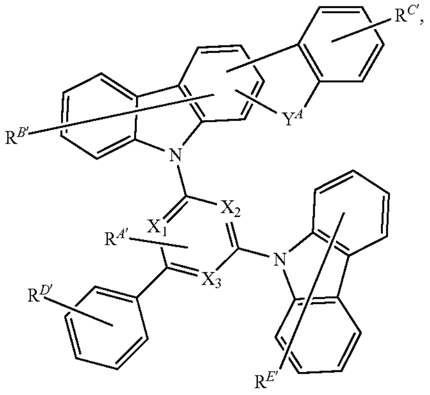
-continued
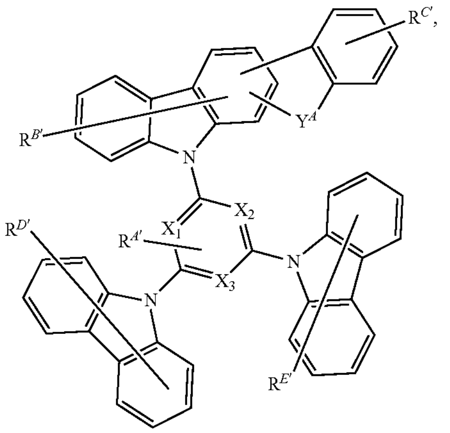
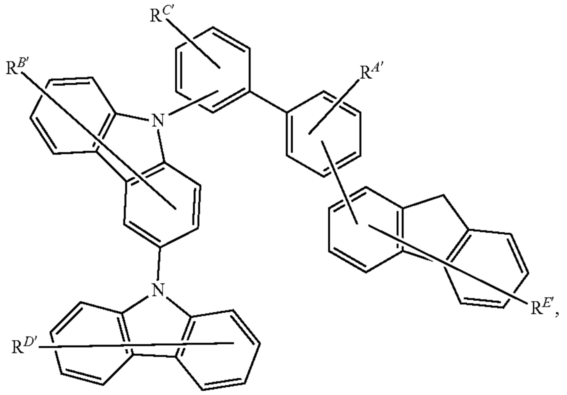
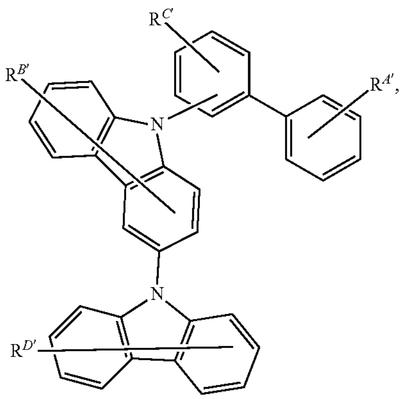

-continued
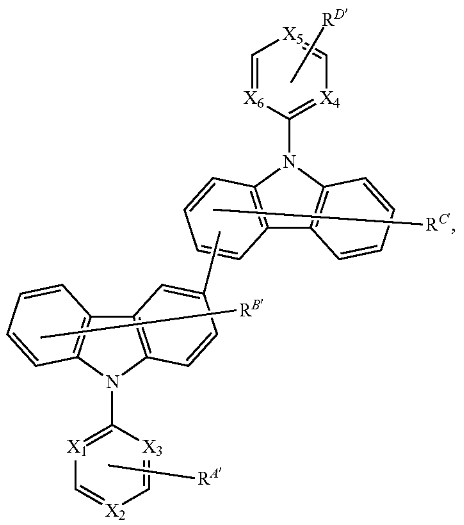
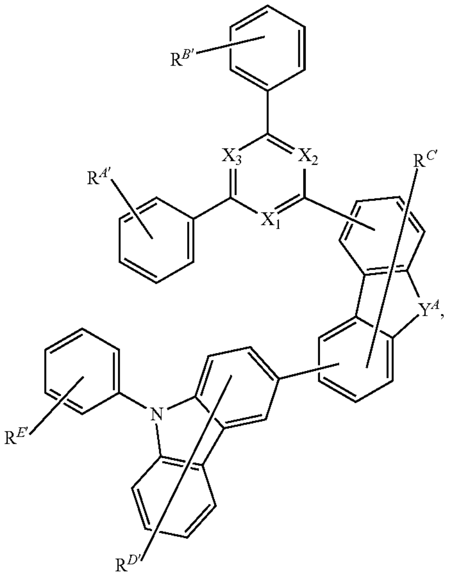
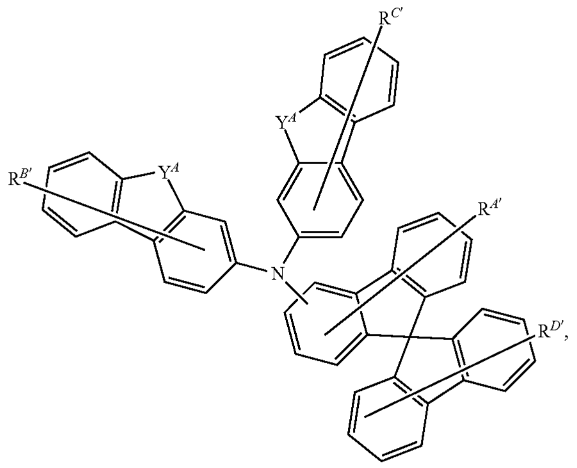
-continued
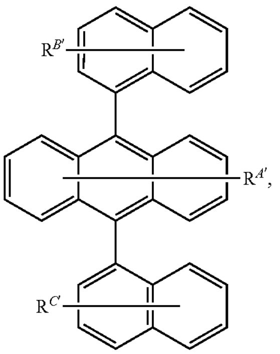
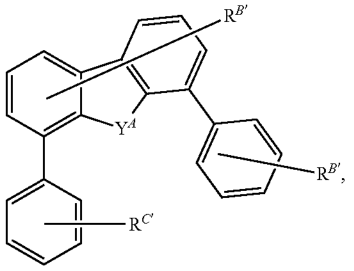
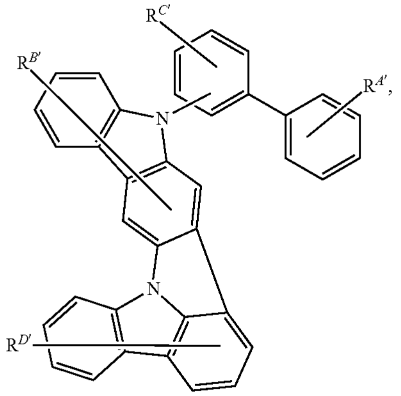
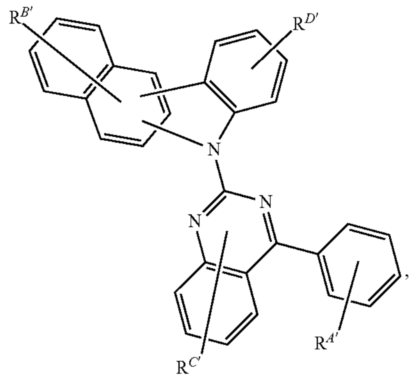

-continued
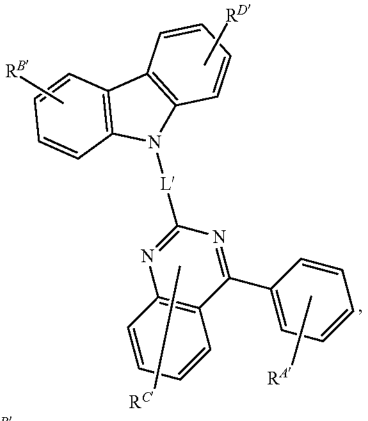
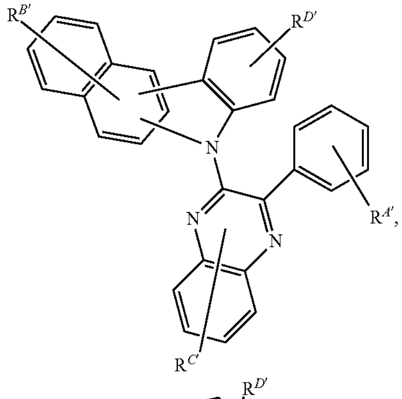
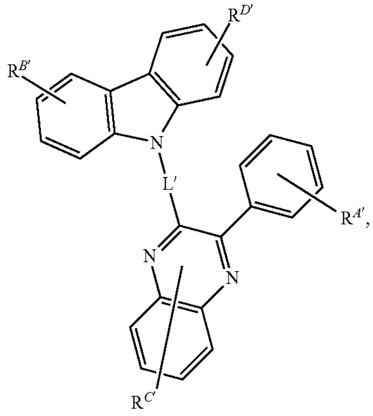
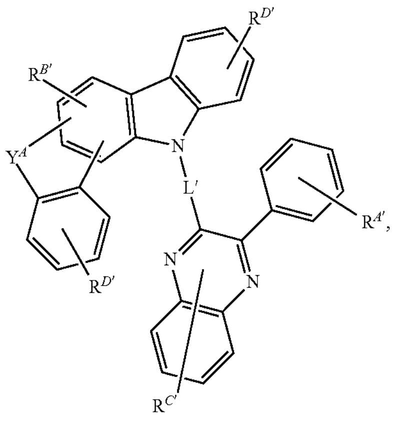
-continued
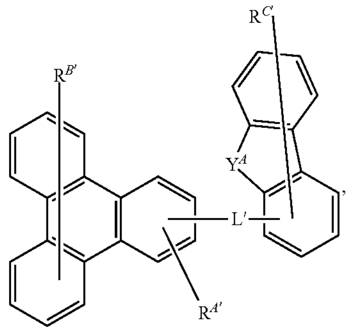
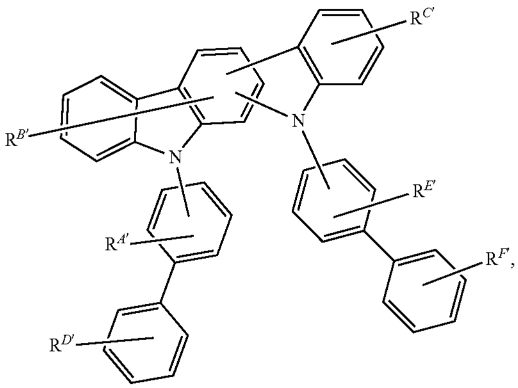
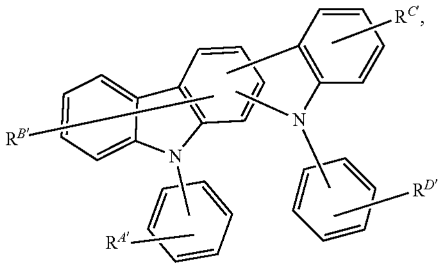
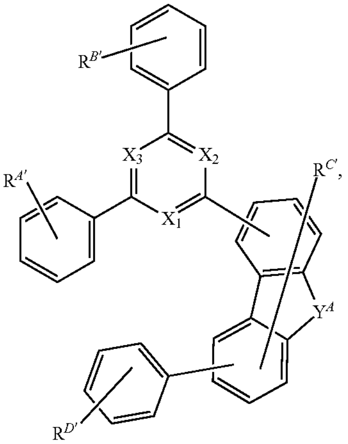

-continued
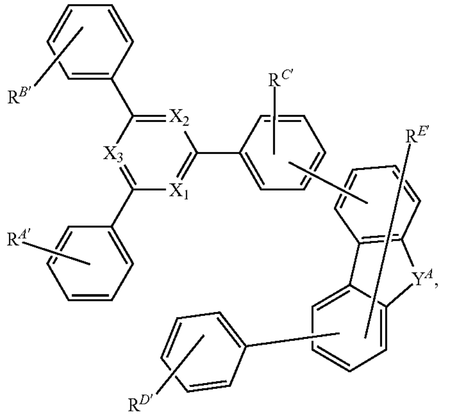
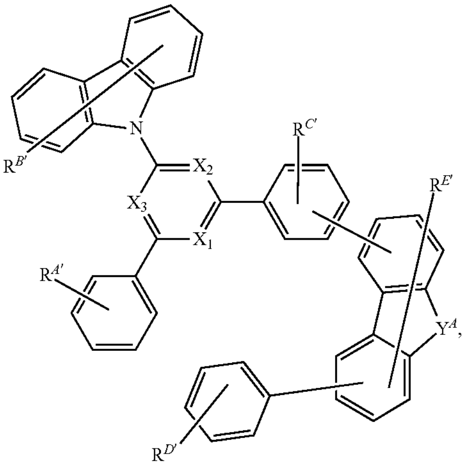
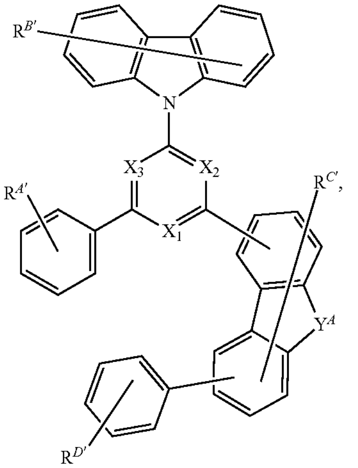
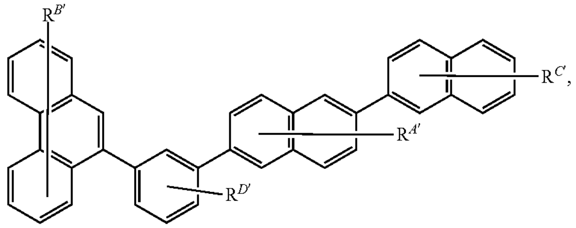
-continued
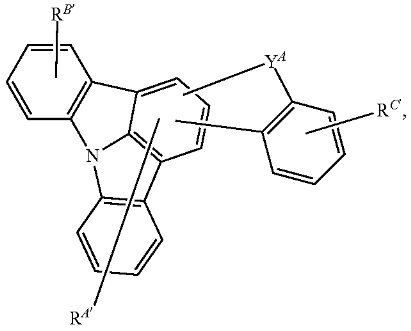
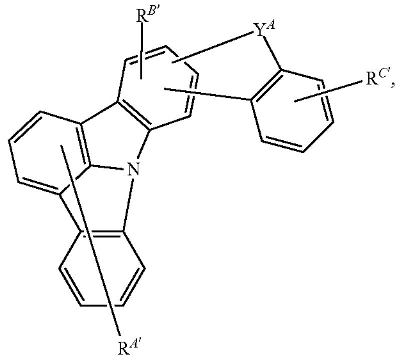
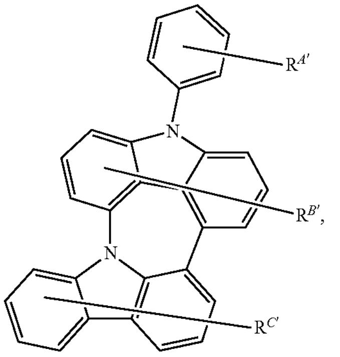
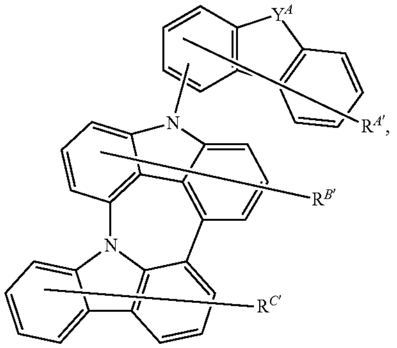

-continued
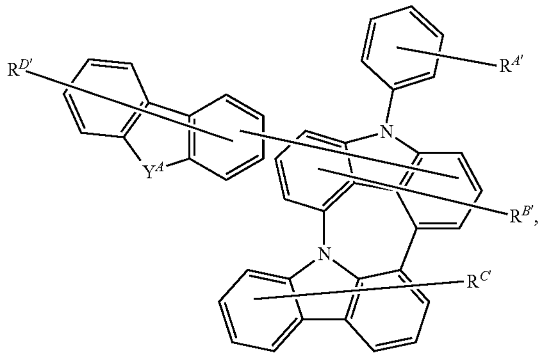
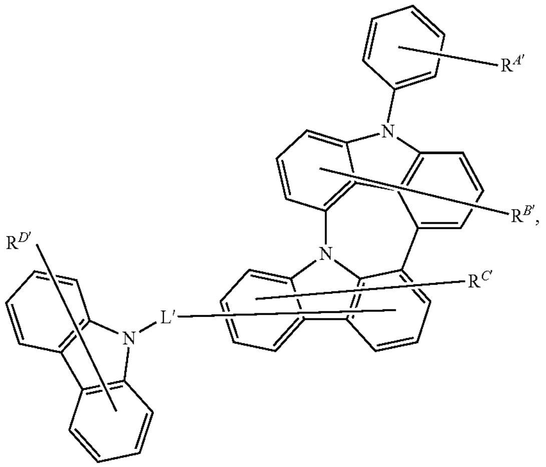
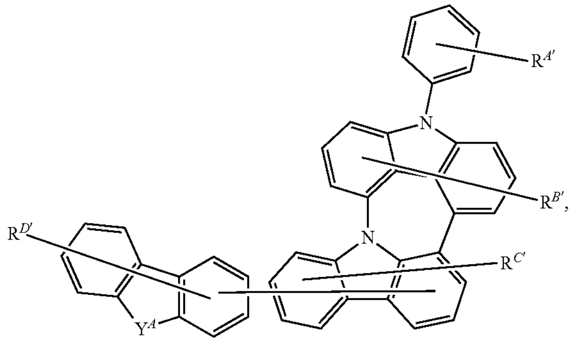
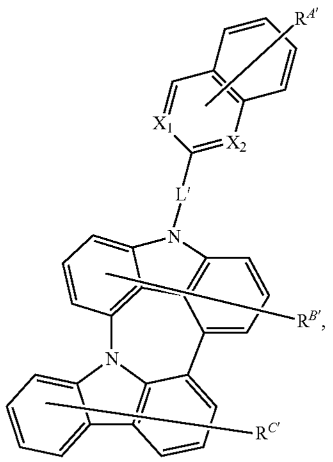
-continued
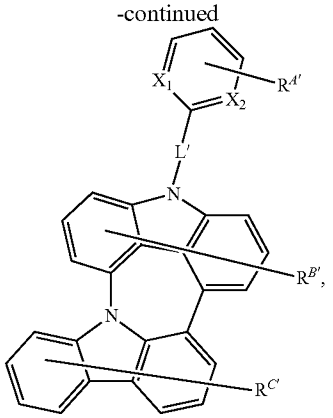
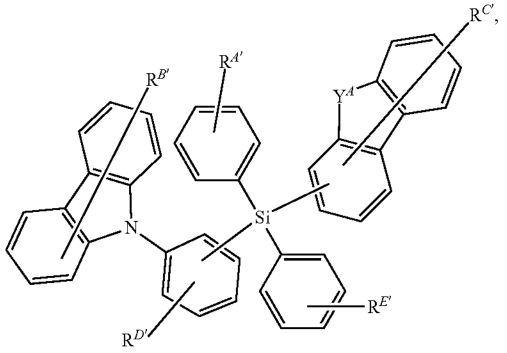
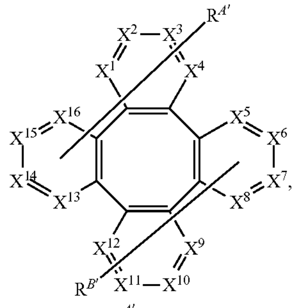
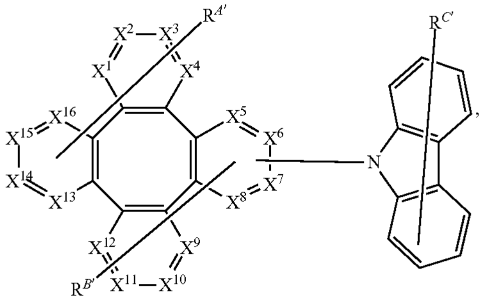
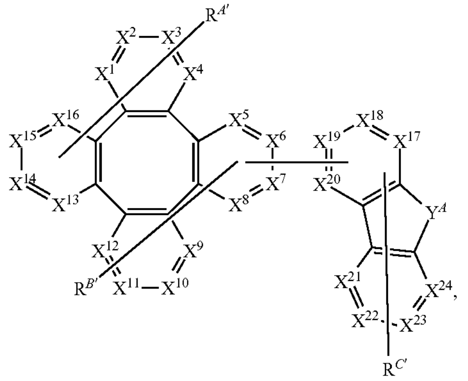

-continued
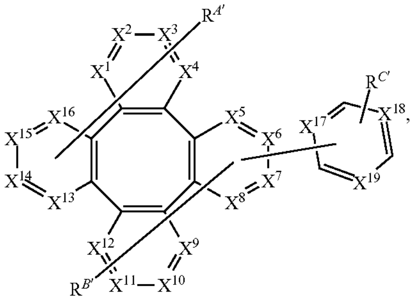
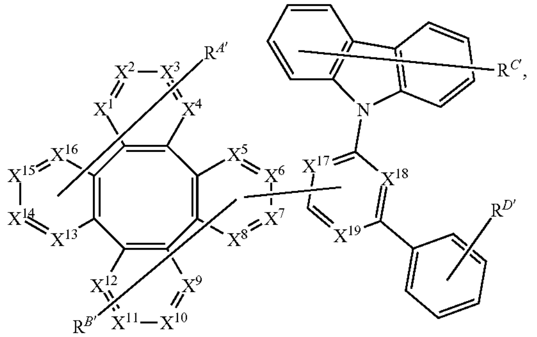
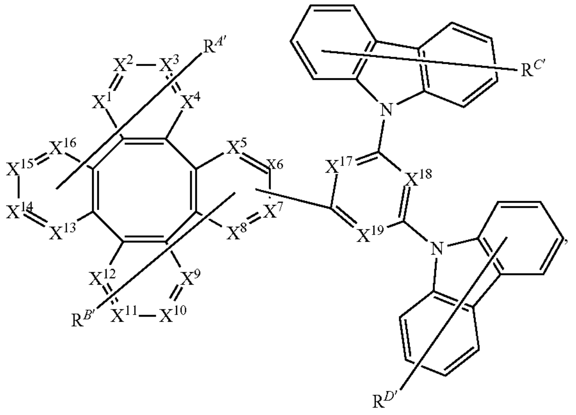
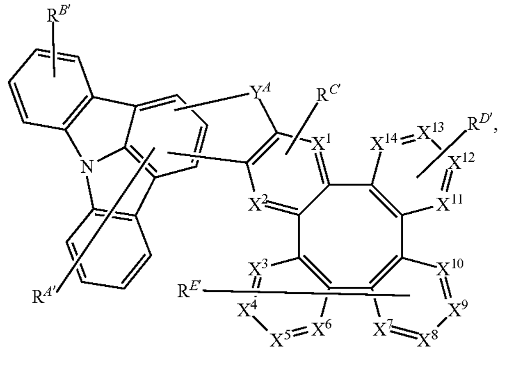
-continued
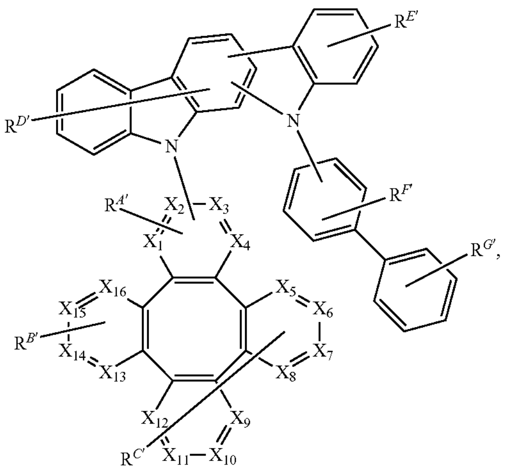
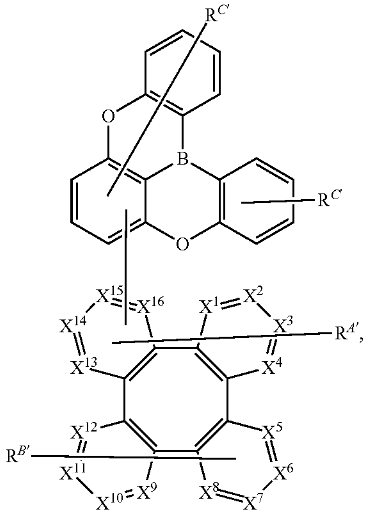
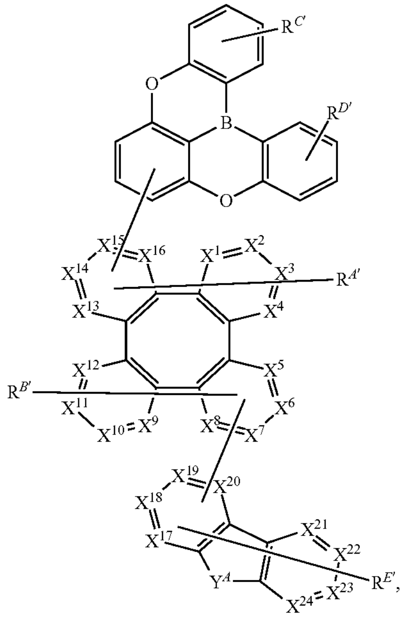

-continued

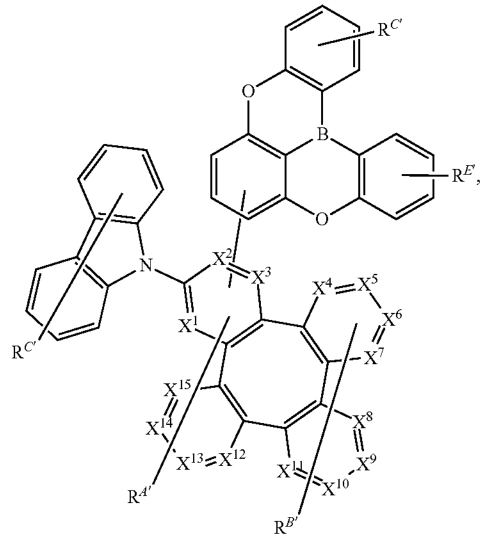

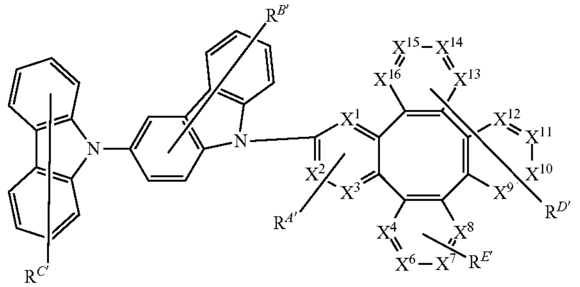

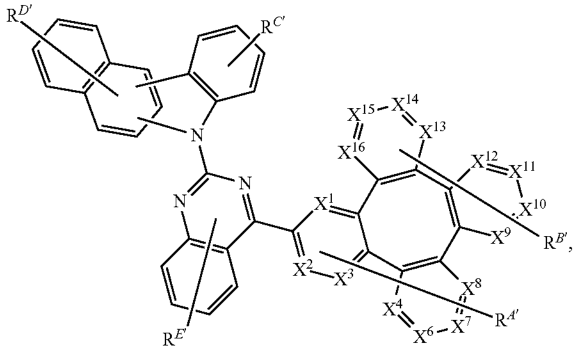

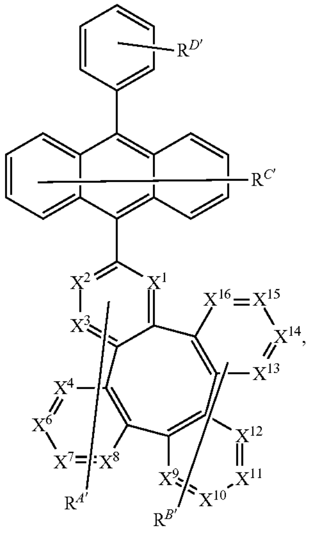

and

-continued

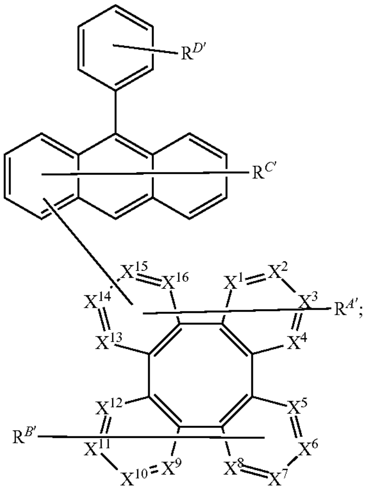

wherein:

each of $X^1$ to $X^{24}$ is independently C or N;

L' is a direct bond or an organic linker-, each $Y^A$ is independently selected from the group consisting of absent a bond, O, S, Se, CRR', SiRR', GeRR', NR, BR, BRR';

each of $R^{A'}$, $R^{B'}$, $R^{C'}$, $R^{D'}$, $R^{E'}$, $R^{F'}$, and $R^{G'}$ independently represents mono, up to the maximum substitutions, or no substitutions;

each R, R', $R^{A'}$, $R^{B'}$, $R^{C'}$, $R^{D'}$, $R^{E'}$, $R^{F'}$, and $R^{G'}$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; two adjacent of $R^{A'}$, $R^{B'}$, $R^{C'}$, $R^{D'}$, $R^{E'}$, $R^{F'}$, and $R^{G'}$ are optionally joined or fused to form a ring.

In some embodiments, the host may be selected from the HOST Group 2 consisting of:

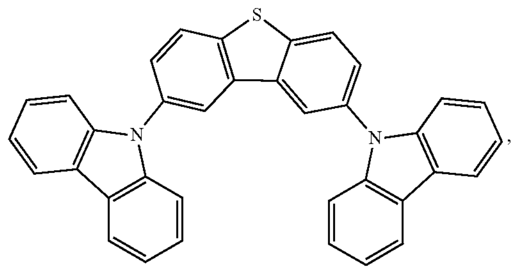
,

-continued
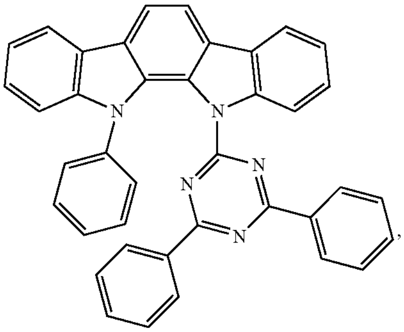
,
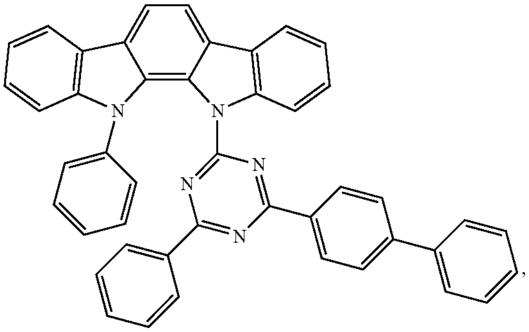
,
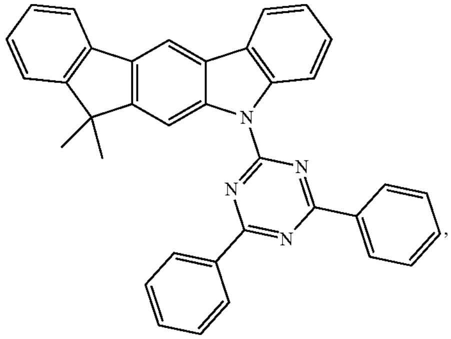
,
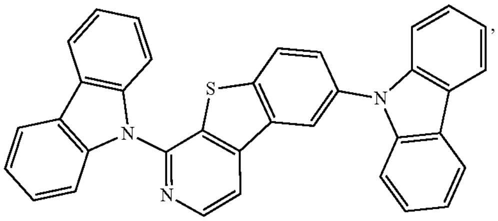
,
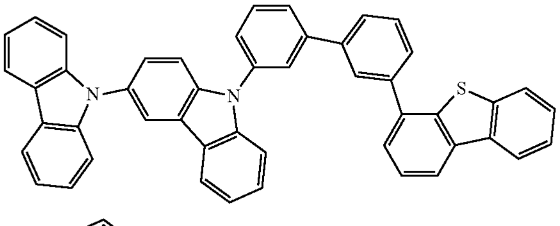
,
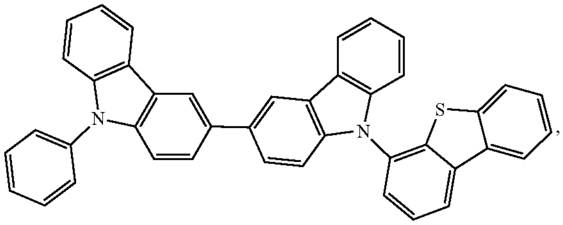
,
-continued
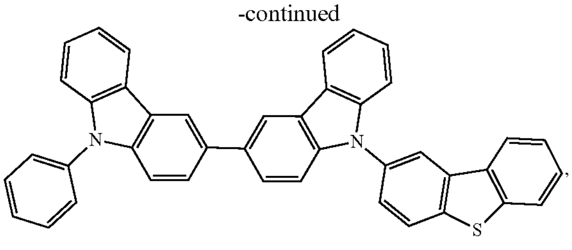
,
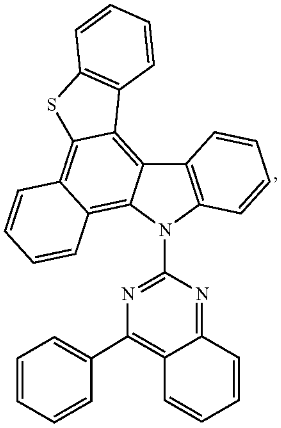
,
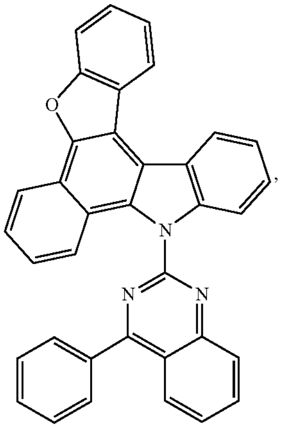
,
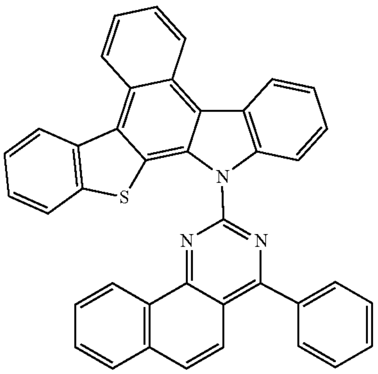
,
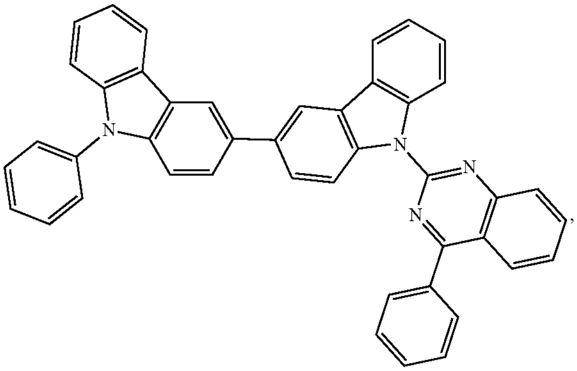
, -continued
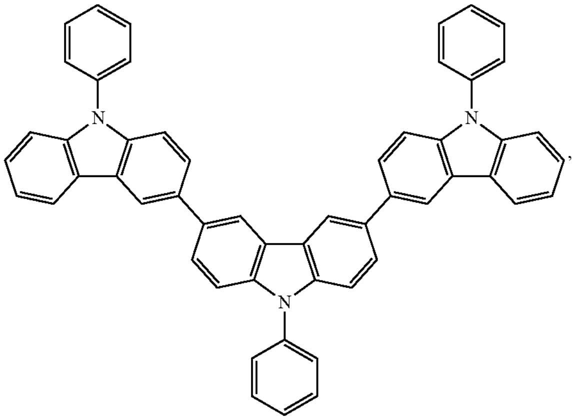
,
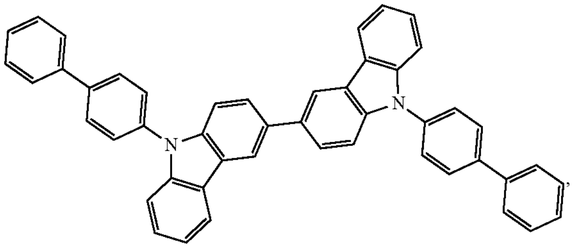
,
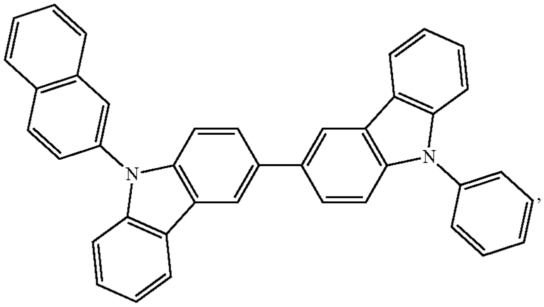
,
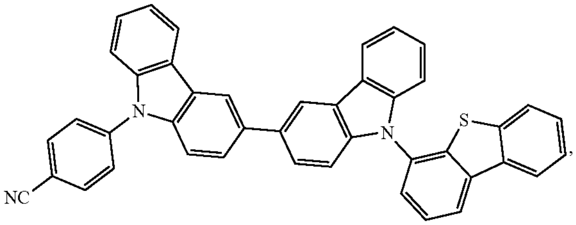
,
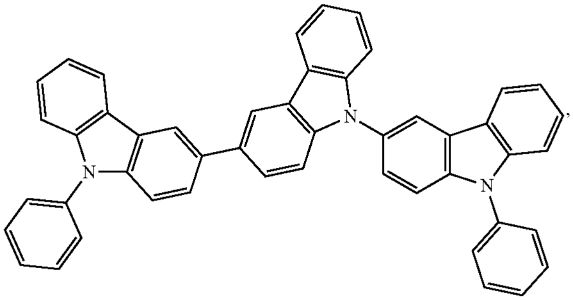
,
-continued
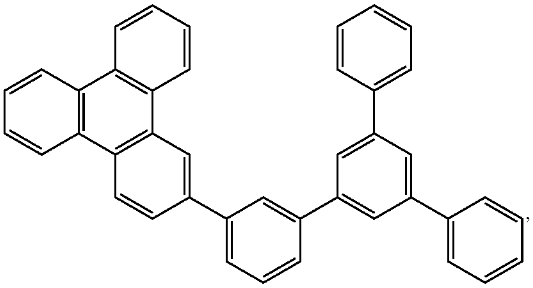
,
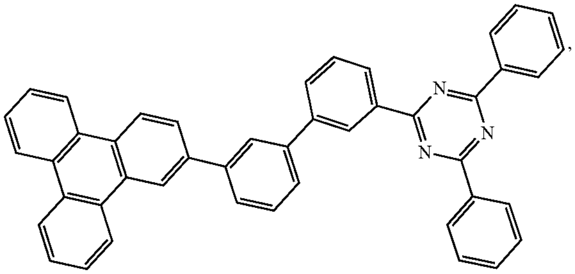
,
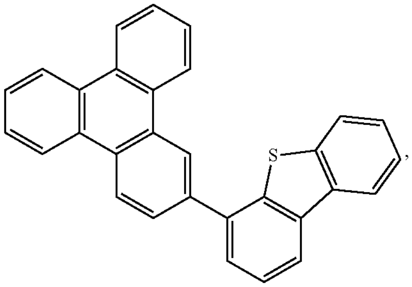
,
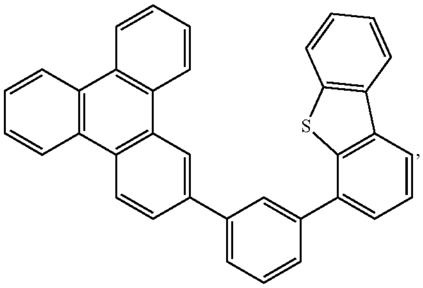
,
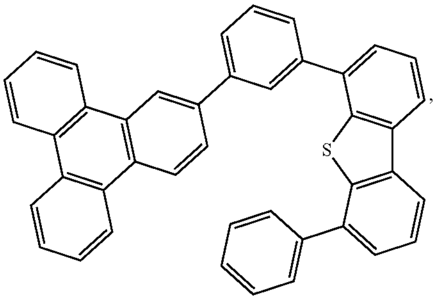
,
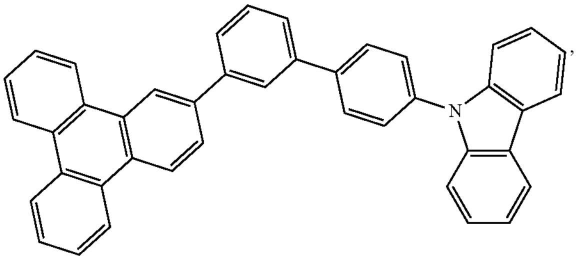
, -continued
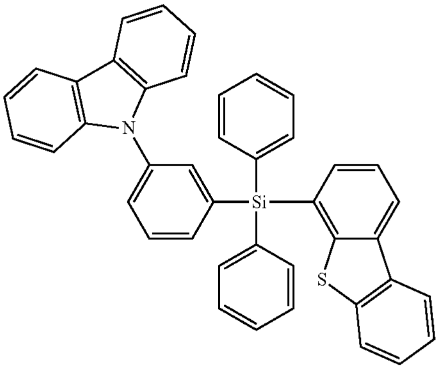
,
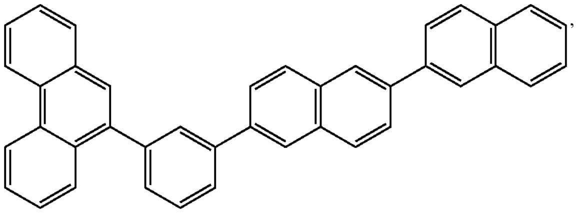
,
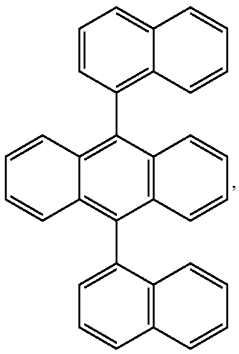
,
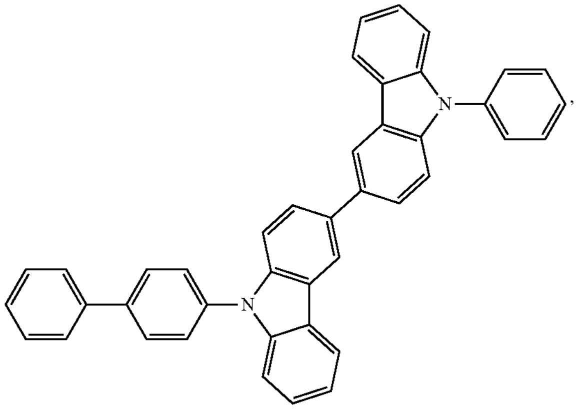
,
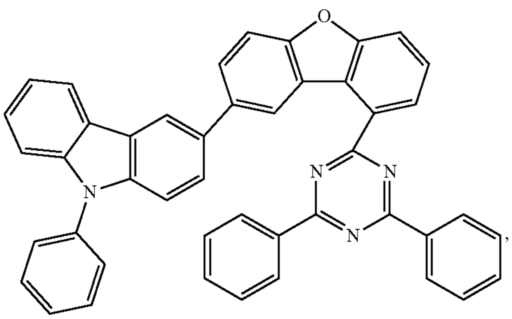
,
-continued
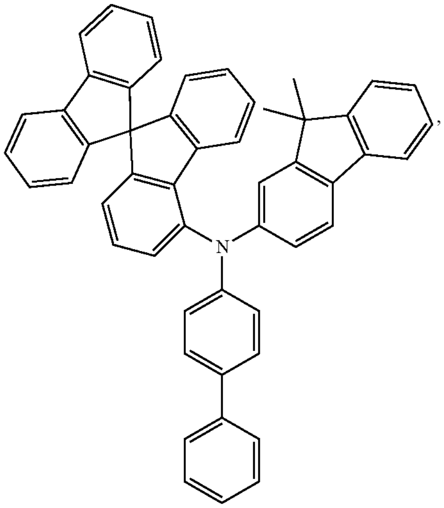
,
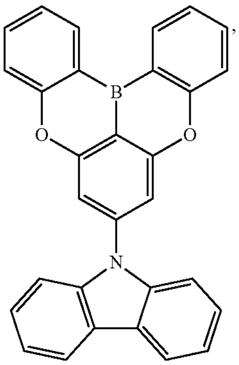
,
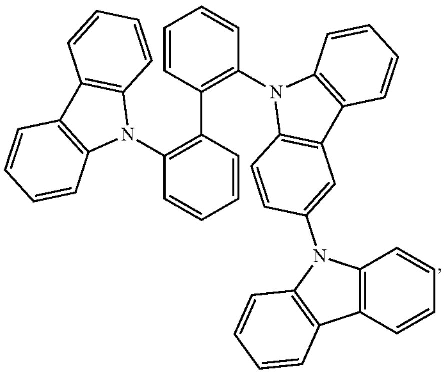
,
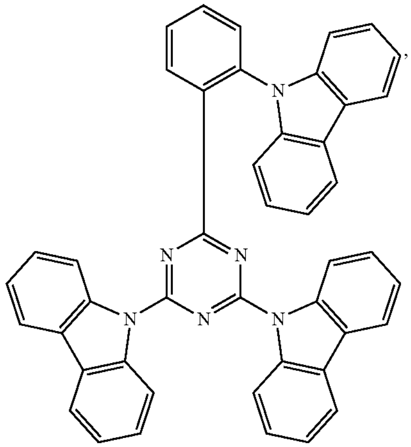
, -continued

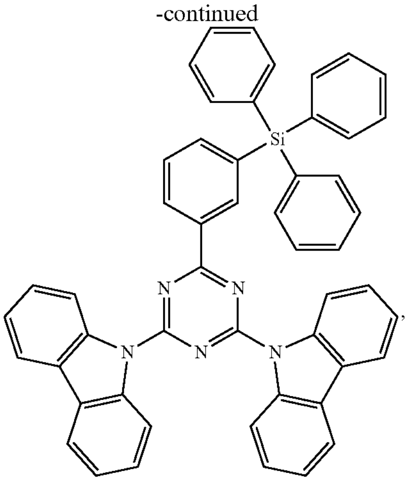

, and combinations thereof.

In some embodiments, the compound may be an acceptor, and the OLED may further comprise a sensitizer selected from the group consisting of a delayed fluorescence emitter, a phosphorescent emitter, and combination thereof.

In some embodiments, the compound may be a fluorescent emitter, a delayed fluorescence emitter, or a component of an exciplex that is a fluorescent emitter or a delayed fluorescence emitter.

In some embodiments, the compound is in ETL.

In some embodiments, the compound is in EML.

In some embodiments, the compound is in BL.

In some embodiments, the compound has |LUMO energy|<2.8 eV.

In some embodiments, the compound has |LUMO energy|<2.7 eV.

In some embodiments, the compound has |LUMO energy|<2.6 eV.

In some embodiments, the compound has |LUMO energy|<2.5 eV.

In some embodiments, the compound has |LUMO energy|<2.4 eV.

In some embodiments, the ETL further comprises a second material.

In some embodiments, the second material comprises Li, Al, Yb, Sm, Ca.

In some embodiments, the work function of the second material is ≤4.5 eV.

In some embodiments, the work function of the second material is ≤3.0 eV.

In some embodiments, the work function of the second material is ≤2.9 eV.

In some embodiments, the work function of the second material is ≤2.8 eV.

In some embodiments, the work function of the second material is ≤2.7 eV.

In some embodiments, the work function of the second material is ≤2.6 eV.

In some embodiments, the work function of the second material is ≤2.5 eV.

In some embodiments, the percentage of the second material is at least 1%, 5%, 10%, 20%, 30%, 40%, 50%, 60%, 70%, 80%, 90%, 95%, 99%.

In some embodiments, the compound has an electron reorganization energy that is ≤1.0 eV.

In some embodiments, the compound has an electron reorganization energy that is ≤0.9 eV.

In some embodiments, the compound has an electron reorganization energy that is ≤0.8 eV.

In some embodiments, the compound has an electron reorganization energy that is ≤0.7 eV.

In some embodiments, the compound has an electron reorganization energy that is ≤0.6 eV.

In some embodiments, the compound has an electron reorganization energy that is ≤0.5 eV.

In some embodiments, the compound has an electron reorganization energy that is ≤0.4 eV.

In some embodiments, the compound has an electron reorganization energy that is ≤0.3 eV.

In some embodiments, the compound has an electron reorganization energy that is ≤0.2 eV.

In some embodiments, the compound has an electron reorganization energy that is ≤0.1 eV.

In some embodiments, the compound has a triplet energy higher than 1.50 eV.

In some embodiments, the compound has a triplet energy higher than 2.00 eV.

In some embodiments, the compound has a triplet energy higher than 2.50 eV.

In some embodiments, the compound has a triplet energy higher than 2.75 eV.

In some embodiments, the compound has a triplet energy higher than 3.00 eV.

In some embodiments, the EML contains an emitter.

In some embodiments, the EML further contain a first Host.

In some embodiments, the EML further contain a second Host.

In some embodiments, the EML further contain a third Host.

In some embodiments, the hosts in the EML have triplet energies greater than 2.88 eV.

In some embodiments, the hosts in the EML have triplet energies greater than 2.50 eV.

In some embodiments, the emitter is a phosphor.

In some embodiments, the emitter is a fluorophore.

In some embodiments, the emitter is a TADF.

In some embodiments, the emitter contains a metal selected from Pt, Ir, Au, Ag, Rh, Pd, and Cu.

In some embodiments, the emissive layer emits blue light.

In some embodiments, $\lambda_{max}$ of the emitter is ≤470 nm.

In some embodiments, the emissive layer emits green light.

In some embodiments, the emissive layer emits red light.

In some embodiments, the EML contains a sensitizer.

In some embodiments, the one of the electrodes is partially transmissive.

In some embodiments, the one of the electrodes is composed of Ag.

In some embodiments, an additional layer is disposed over the second electrode.

In some embodiments, the device converts energy from the plasmonic mode to light.

In some embodiments, more than 10 percent of the emitted light is energy that was in the plasmonic mode.

In some embodiments, the EML has a minimum thickness selected from the group consisting of 50, 100, 150, 200, 250, 300, 350, 400, 450, 500, 550, 600, 650 and 700 Å.

In some embodiments, the EML has a maximum thickness selected from the group consisting of 700, 750, 800, 850, 900, 950, 1000 Å.

In some embodiments, the OLED contains a plurality of EMLs.

In some embodiments, each EML within the OLED emits only a single color.

In some embodiments, the compound is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated.

In some embodiments, the first host is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated.

In some embodiments, the second host is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated.

In some embodiments, the third host is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated.

In yet another aspect, the OLED of the present disclosure may also comprise an emissive region containing a compound as disclosed in the above compounds section of the present disclosure.

In some embodiments, the emissive region can comprise the compound as described herein.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

In some embodiments, the consumer product comprises an organic light-emitting device (OLED) having an anode; a cathode; and an organic layer disposed between the anode and the cathode, wherein the organic layer may comprise the compound as described herein.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
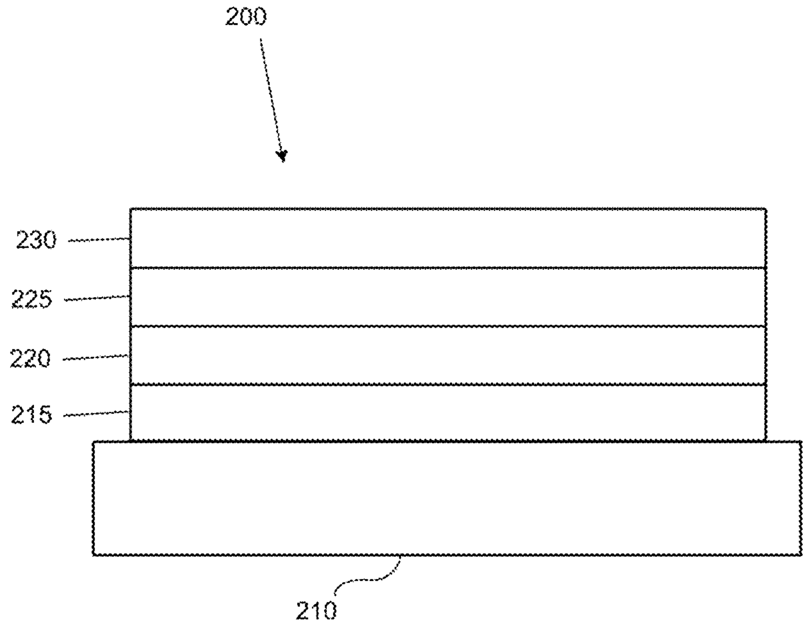
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP, also referred to as organic vapor jet deposition (OVJD)), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18° C. to 30° C., and more preferably at room temperature (20-25° C.), but could be used outside this temperature range, for example, from −40° C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as one component of an exciplex to be used as a sensitizer.

In some embodiments, the sensitizer is a single component, or one of the components to form an exciplex.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In some embodiments, the emissive layer comprises one or more quantum dots.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

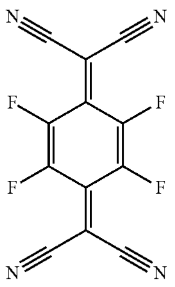
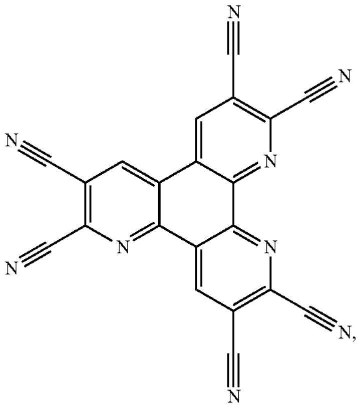
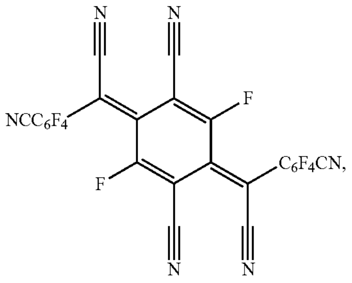
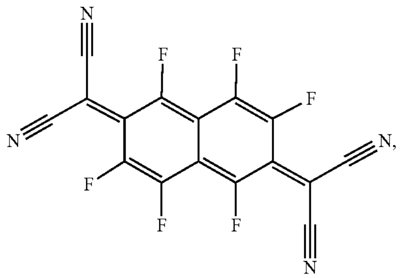
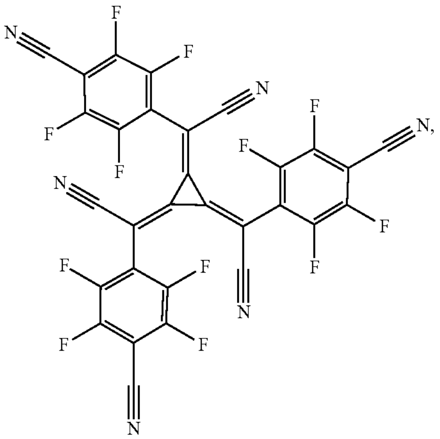
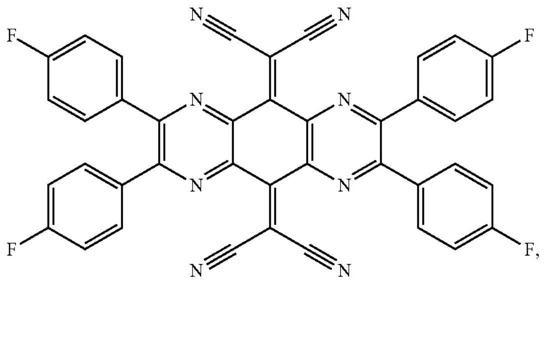
-continued
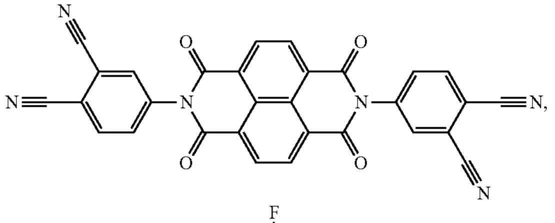
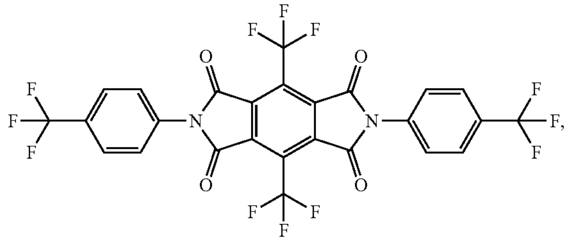
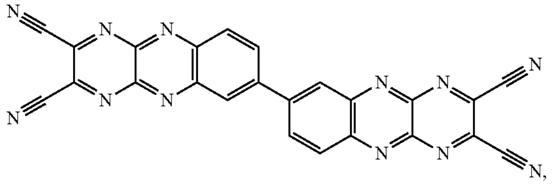
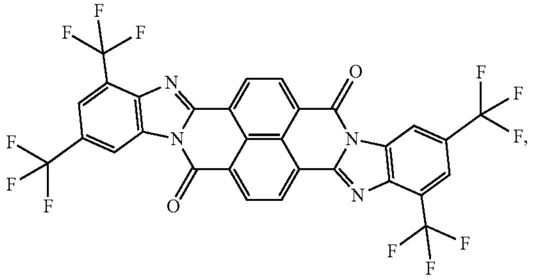
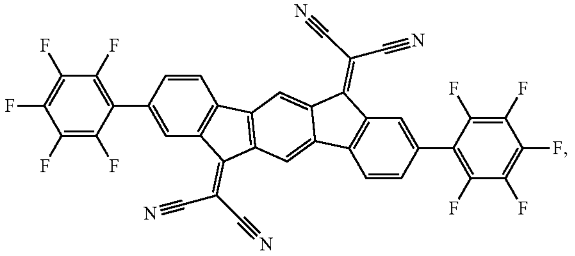
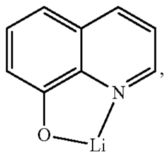
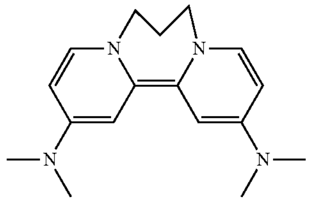
and
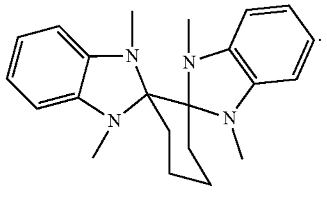
b) HIL/HTL:
A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

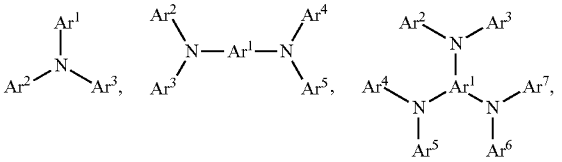

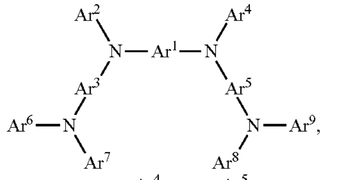

and

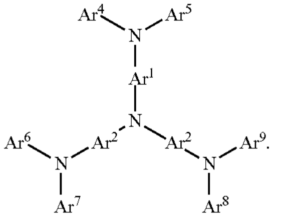

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

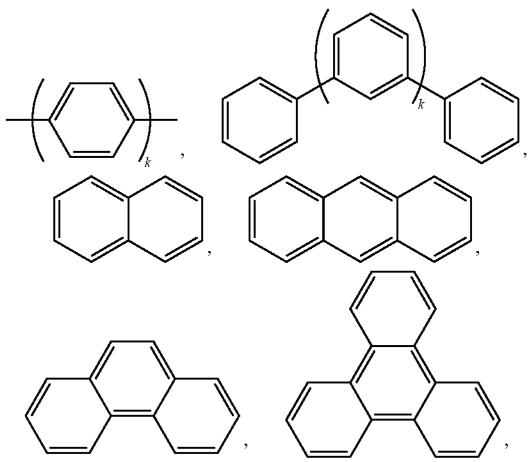

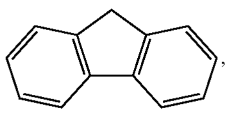

and

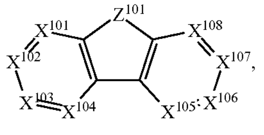

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

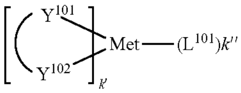

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.
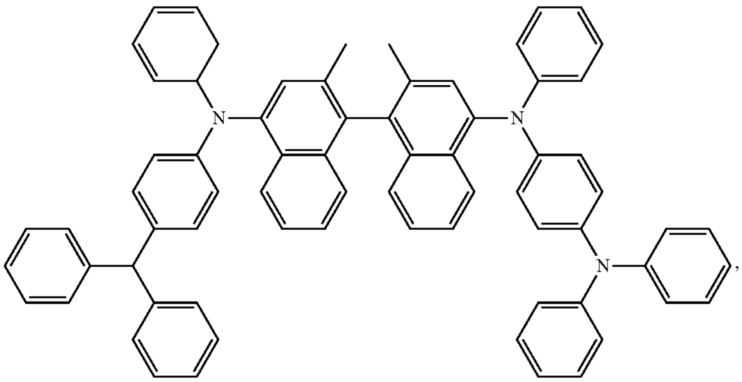
,
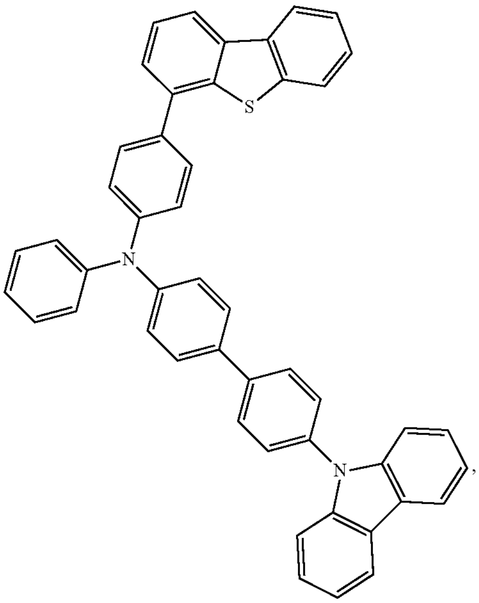
, -continued
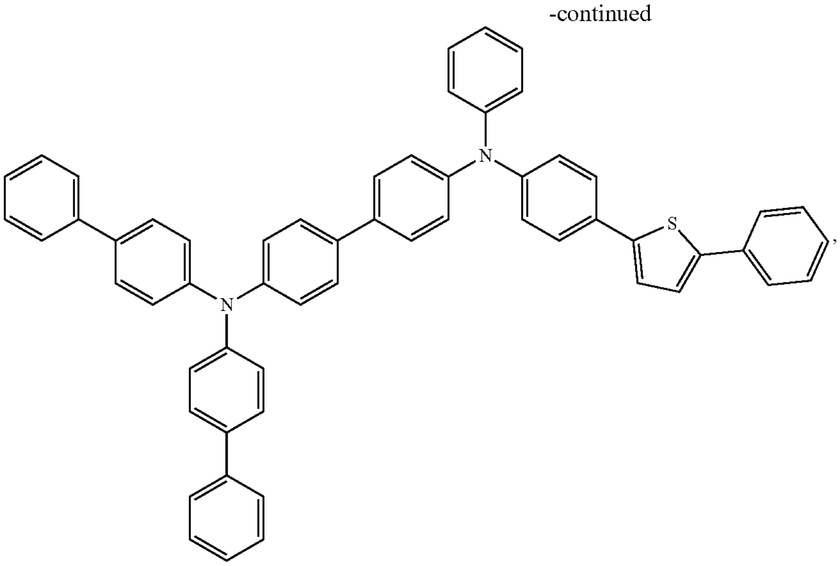
,
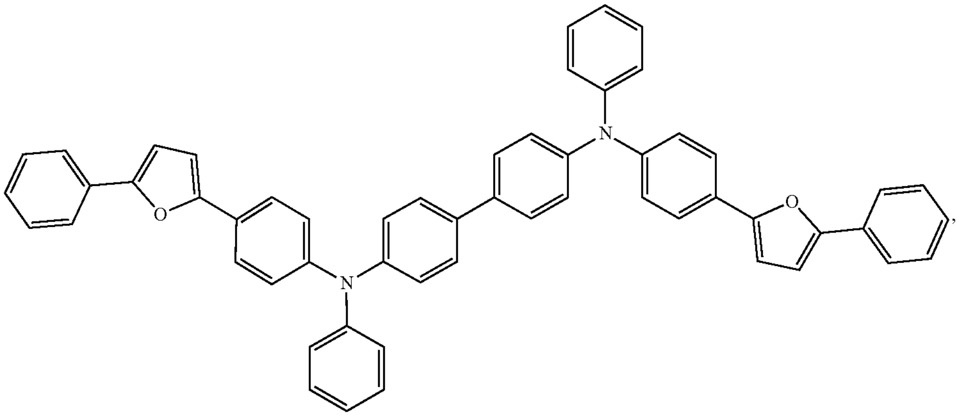
,
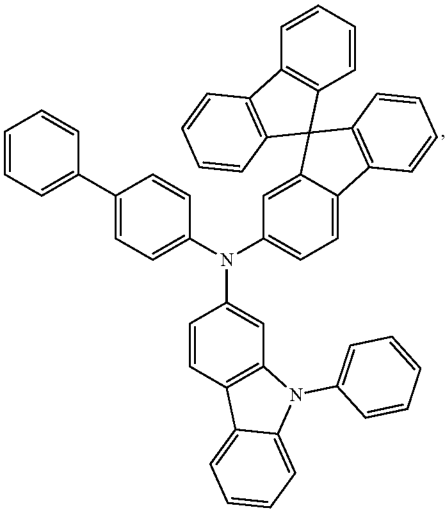
,
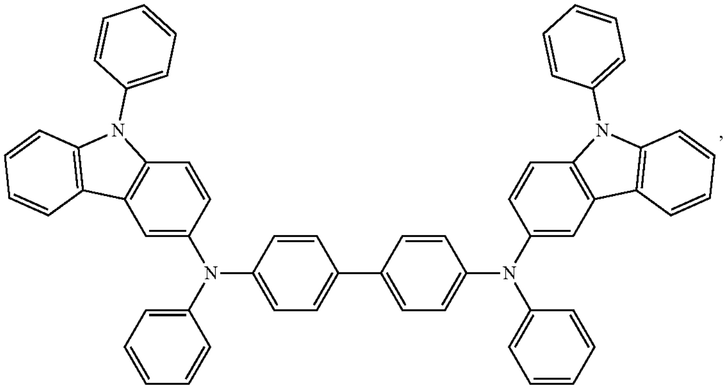
, -continued
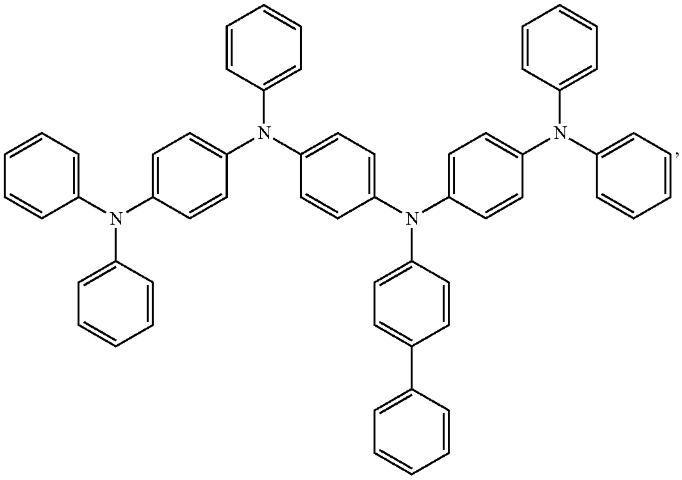
,
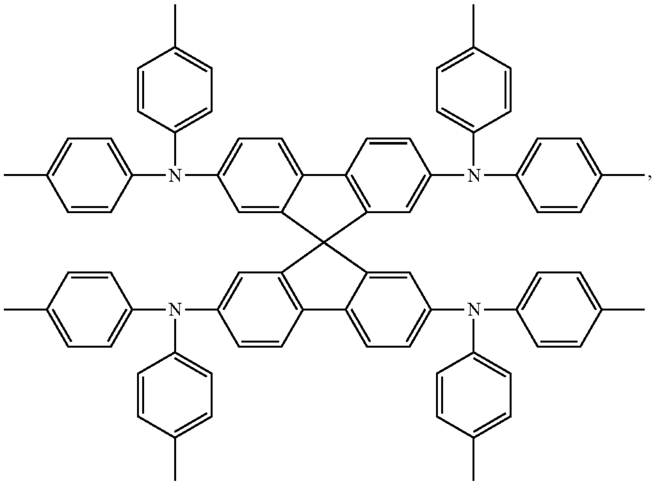
,
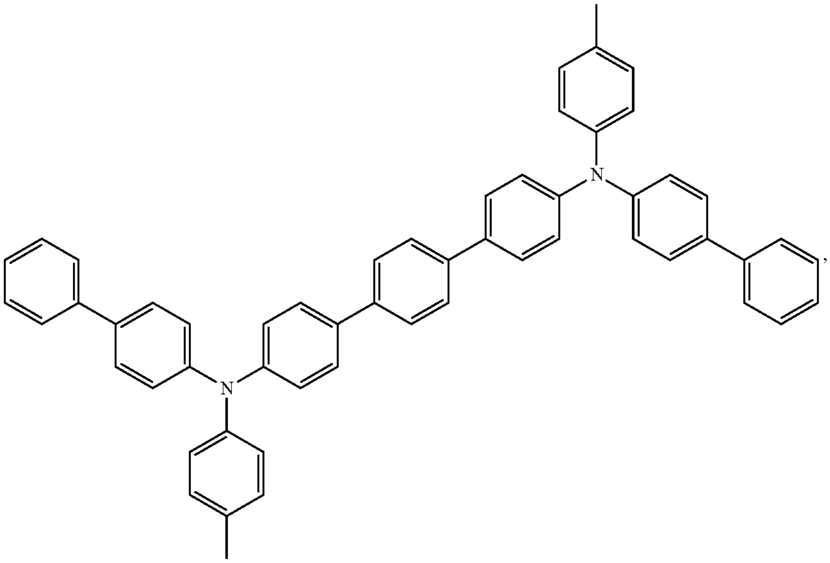
, -continued
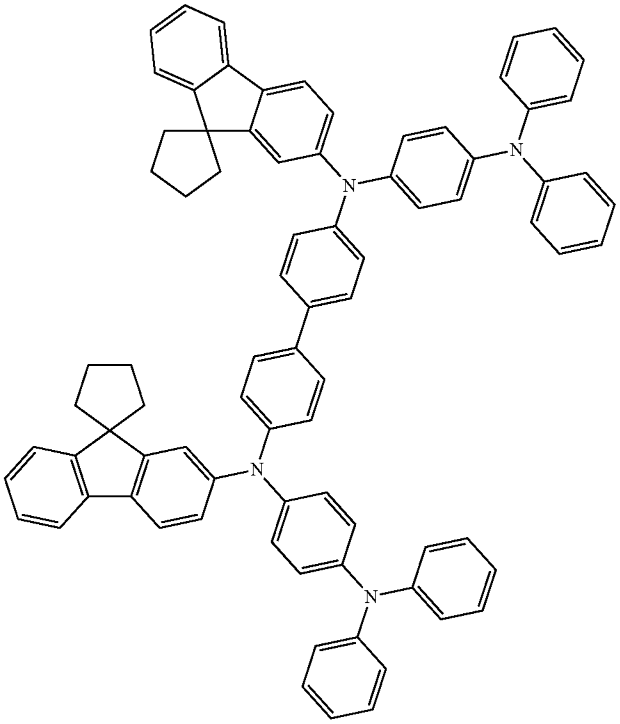
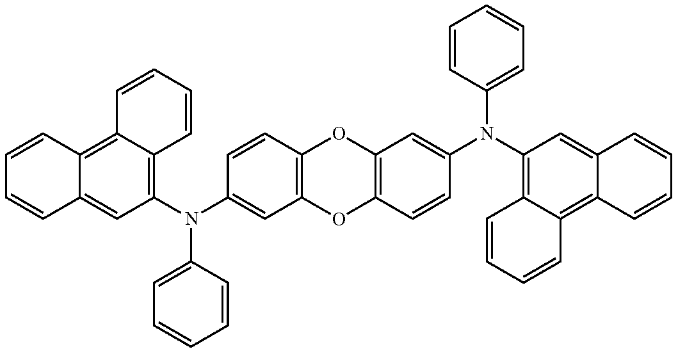
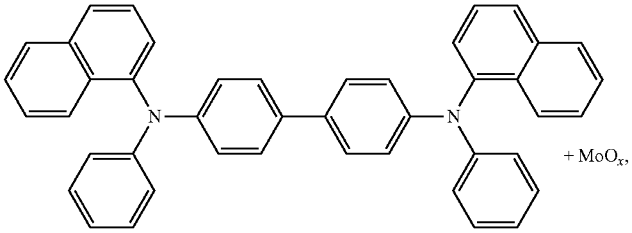
+ $MoO_x$, -continued
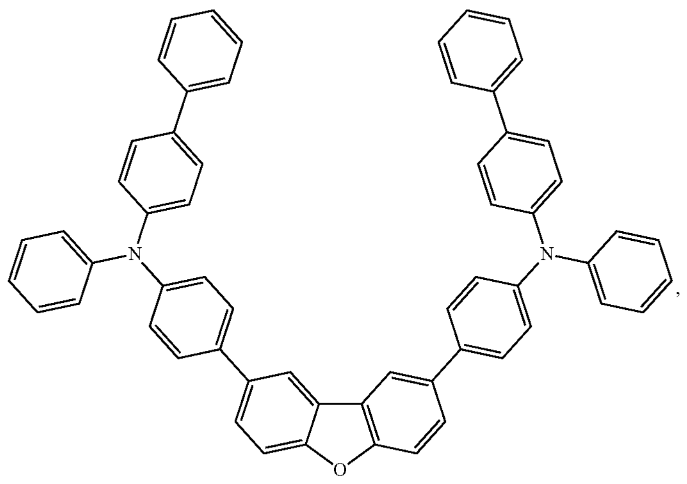
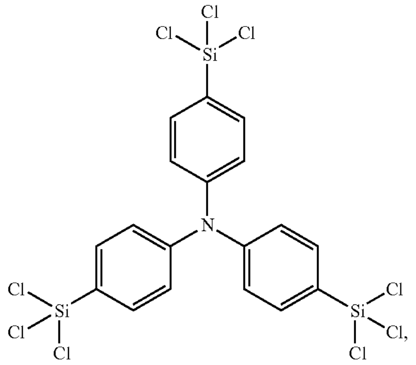
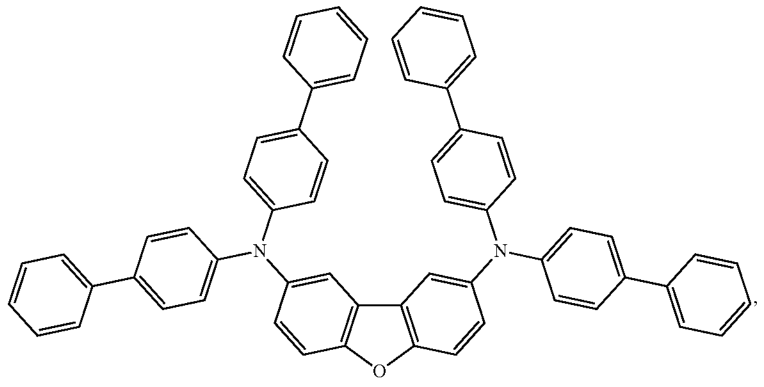
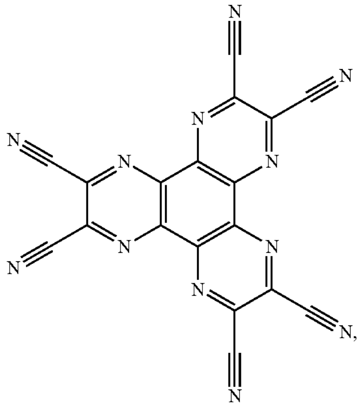
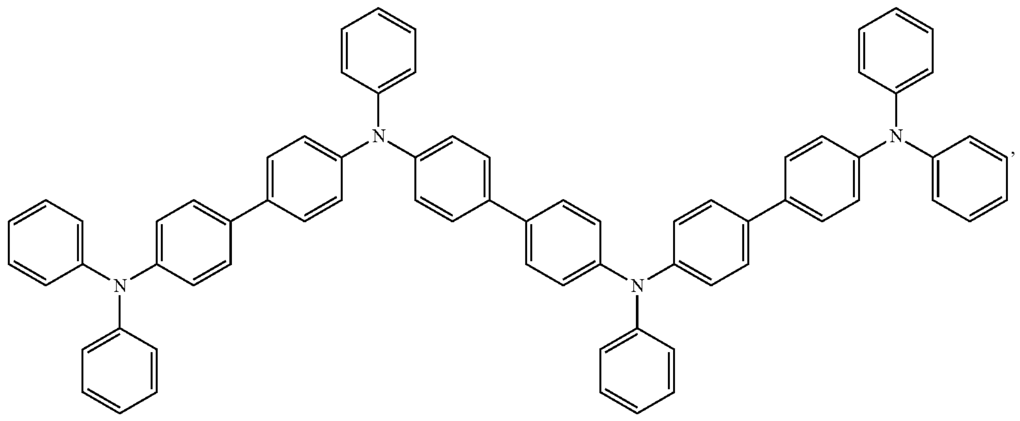

-continued
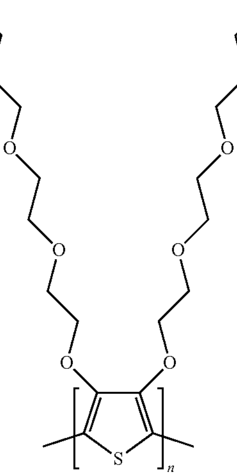
,
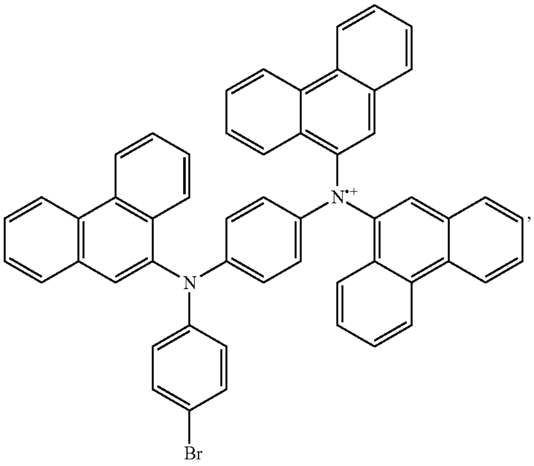
,
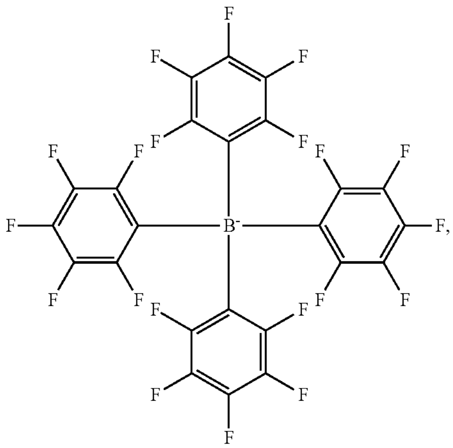
,
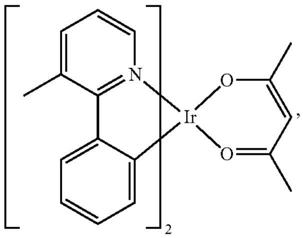
,
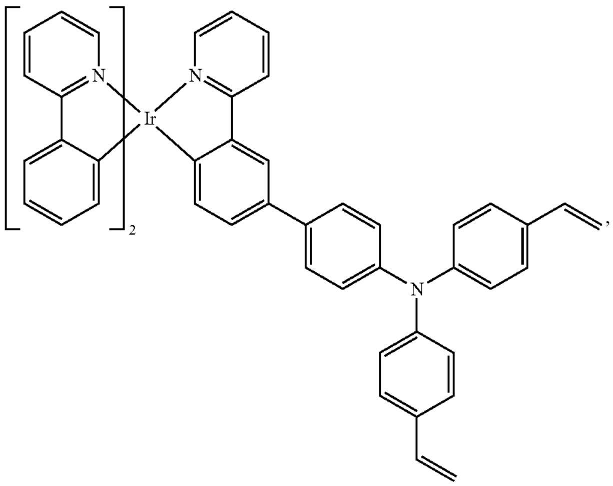
, -continued
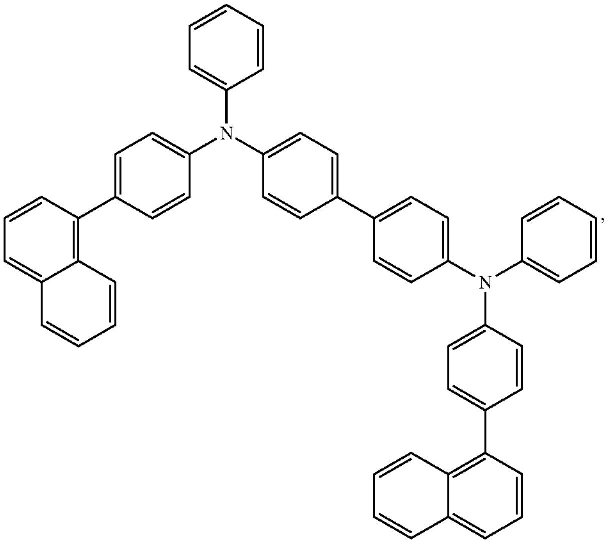
,
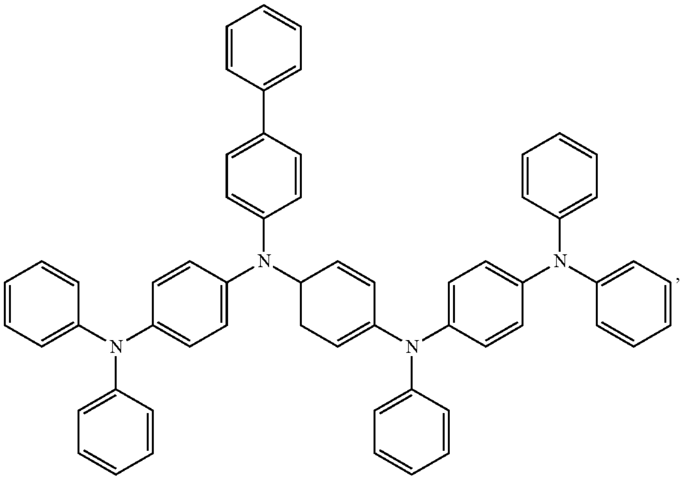
,
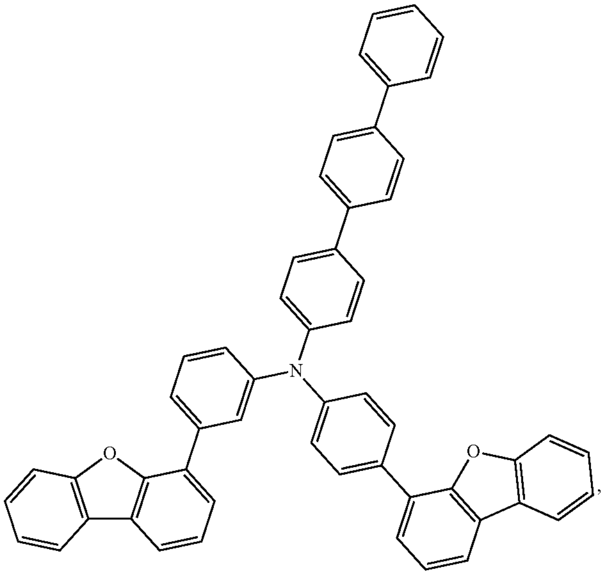
, -continued
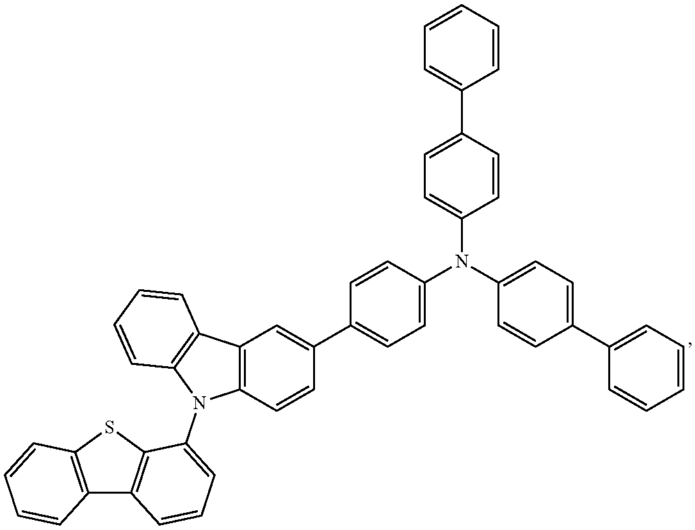
,
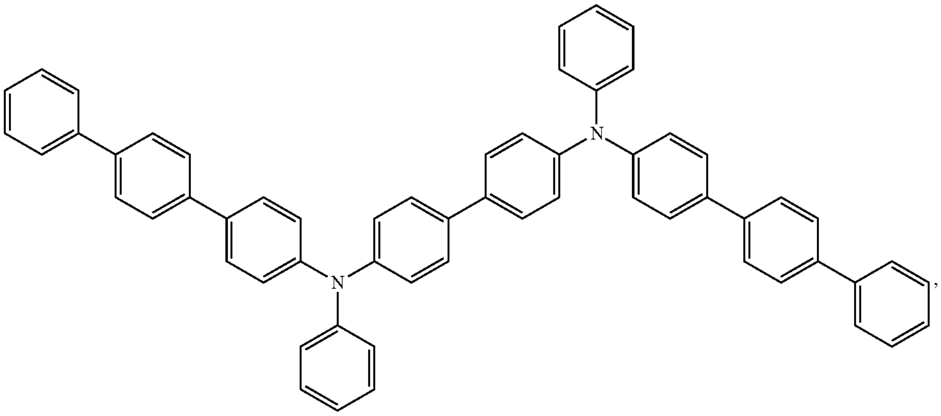
,
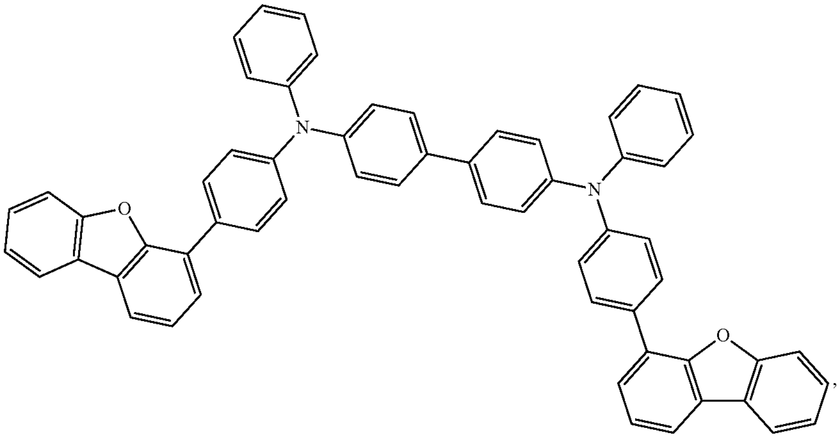
,
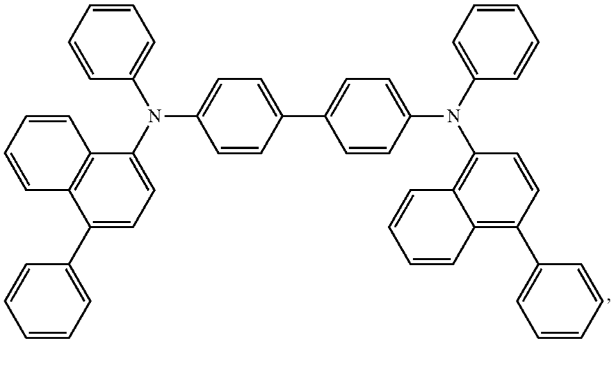
, -continued
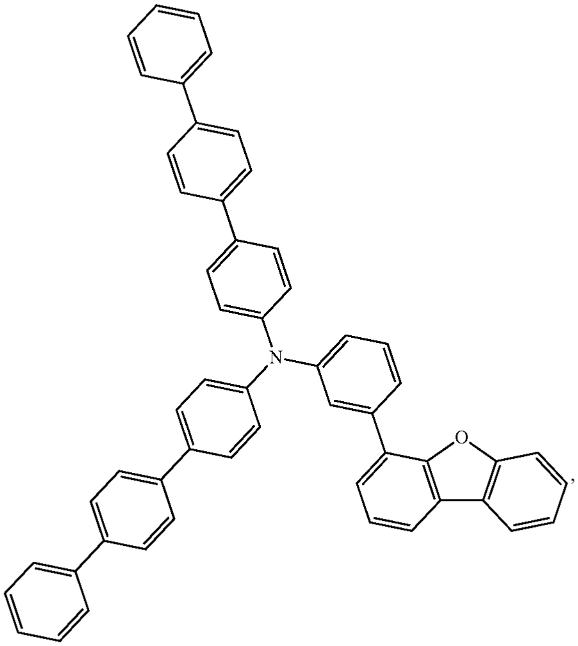,
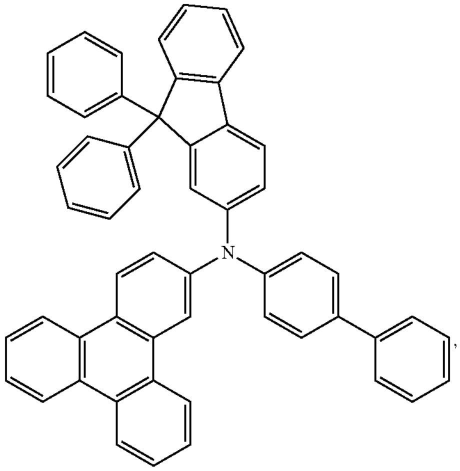,
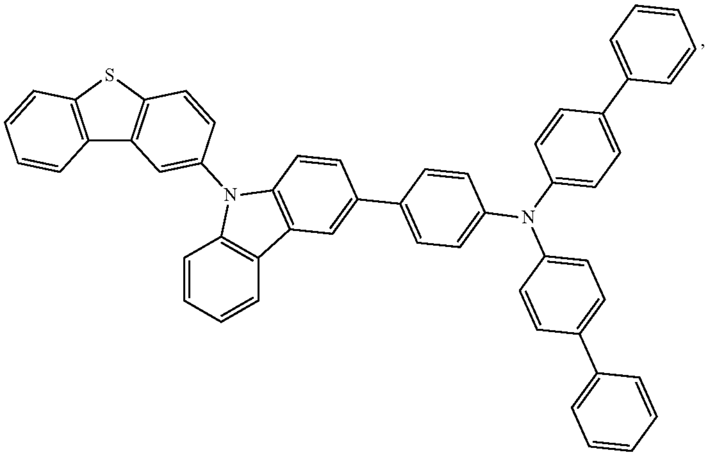,
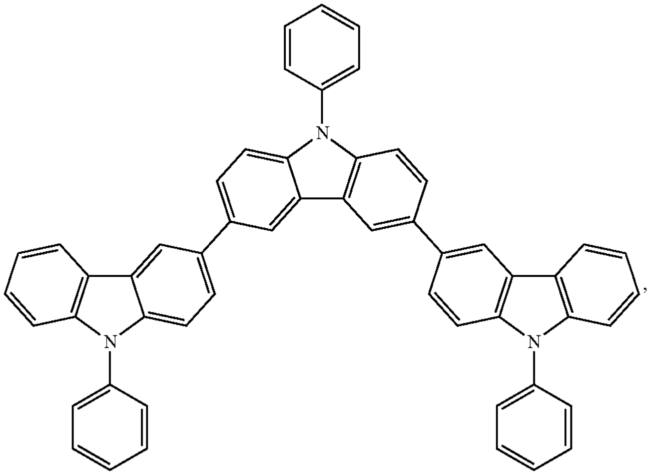,
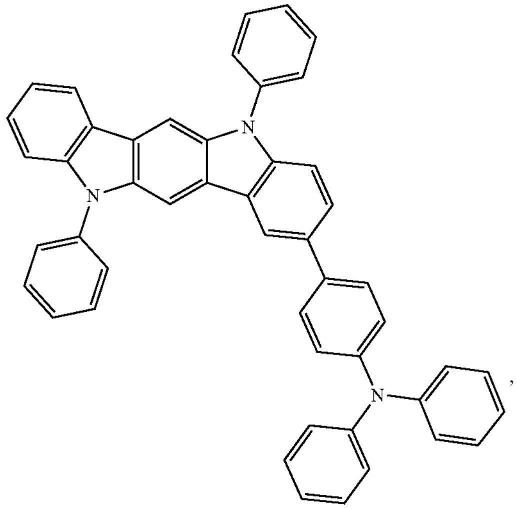, -continued
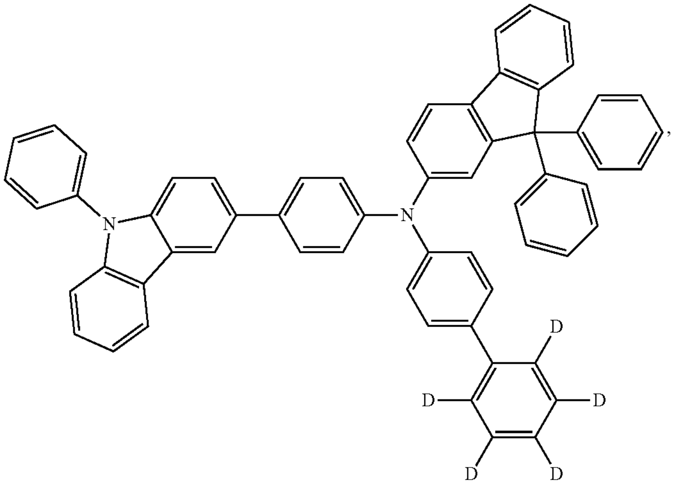
,
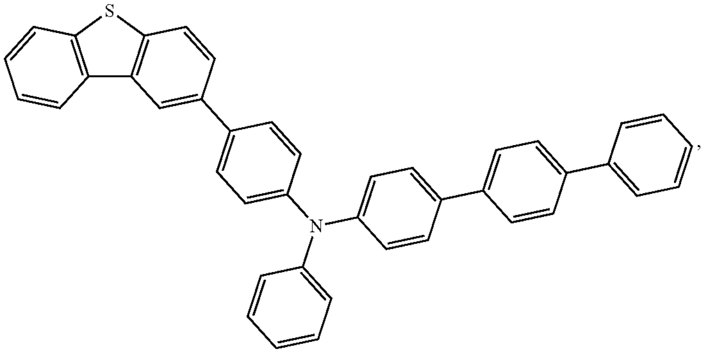
,
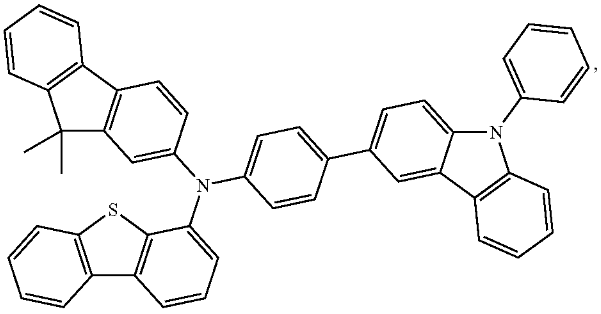
,
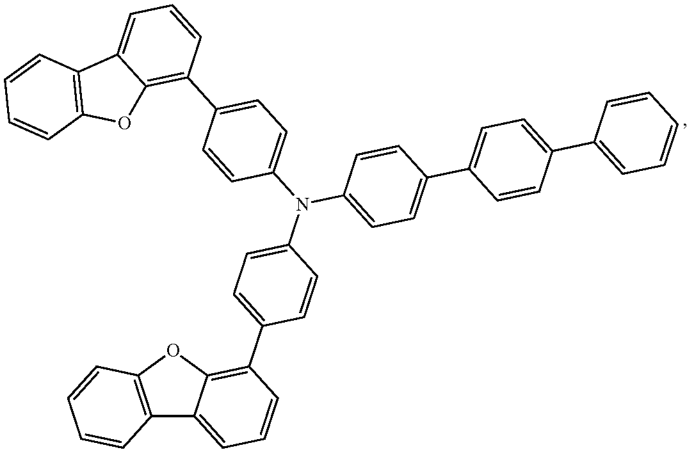
, -continued
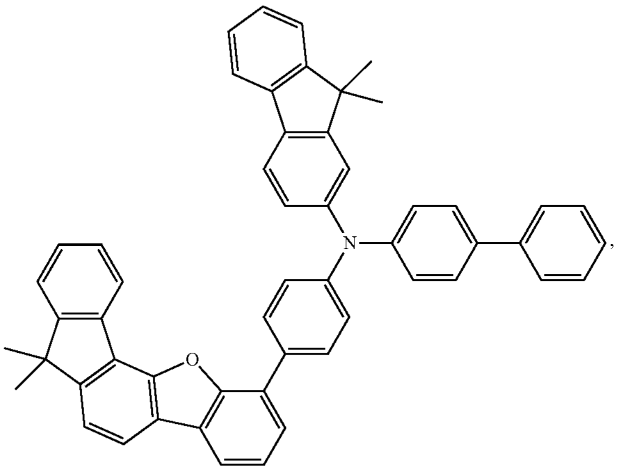,
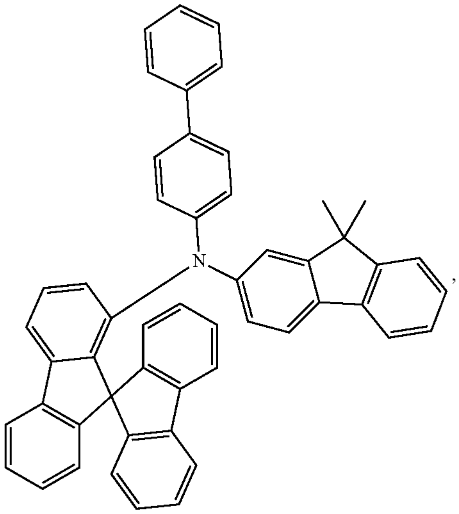,
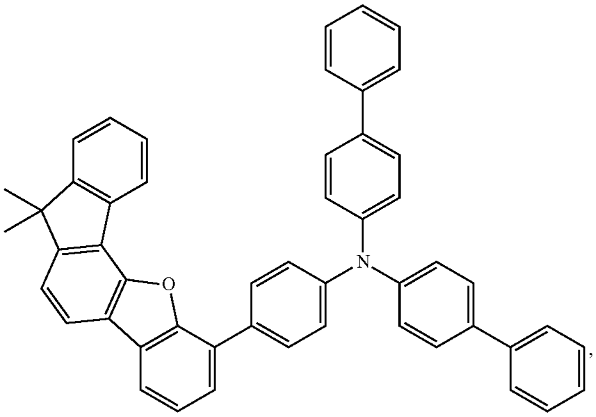,
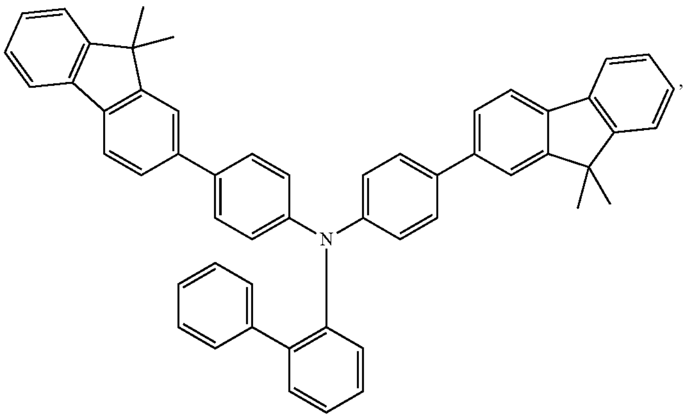, -continued
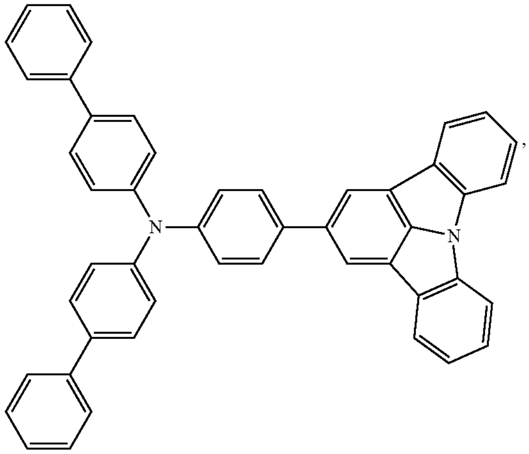
,
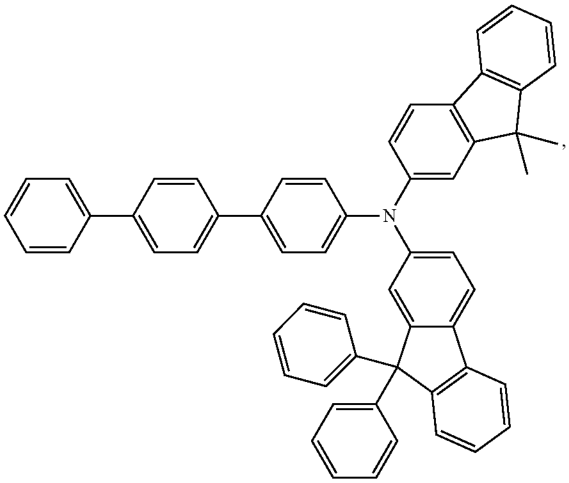
,
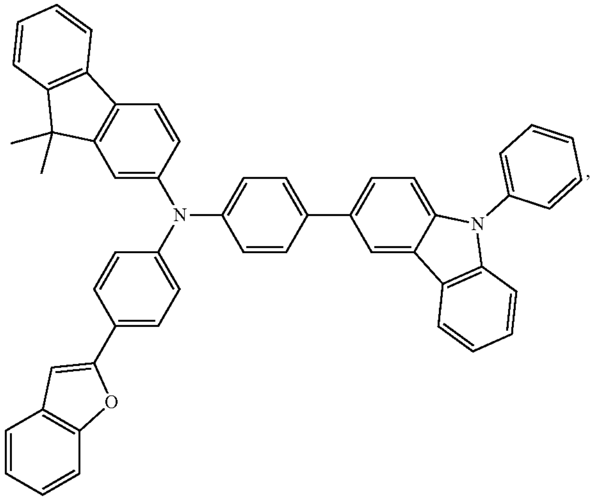
,
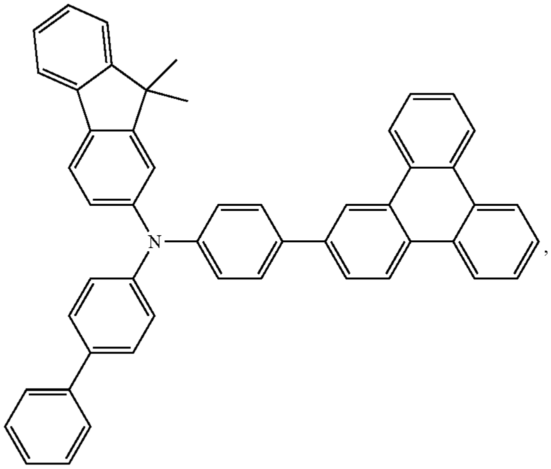
,
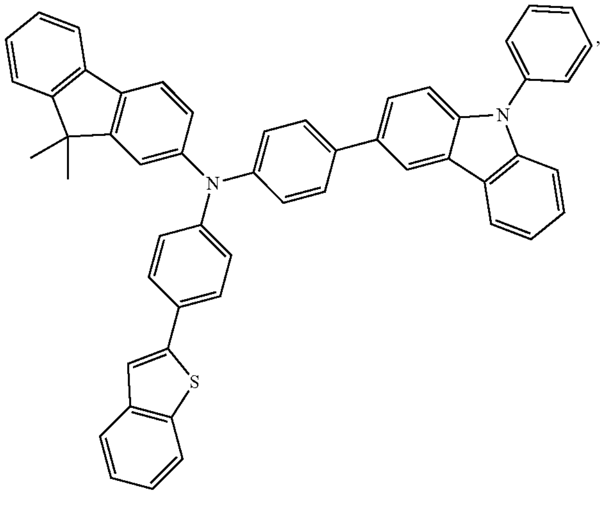
, -continued
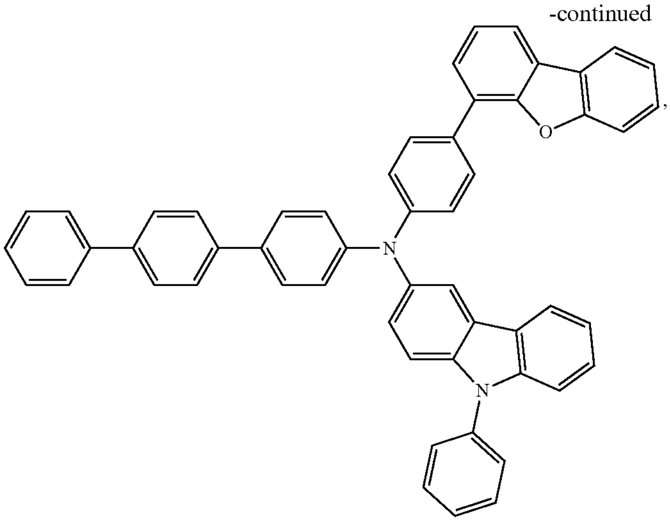
,
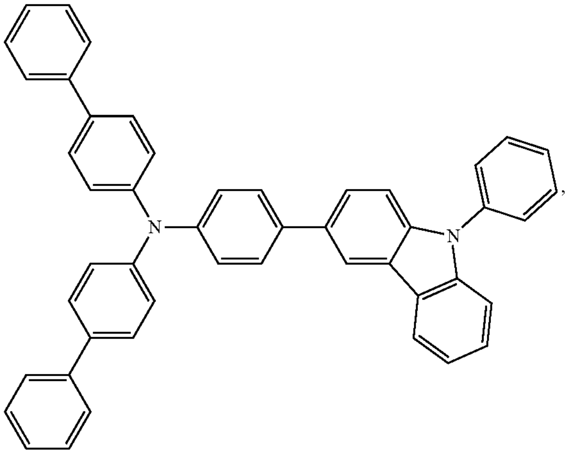
,
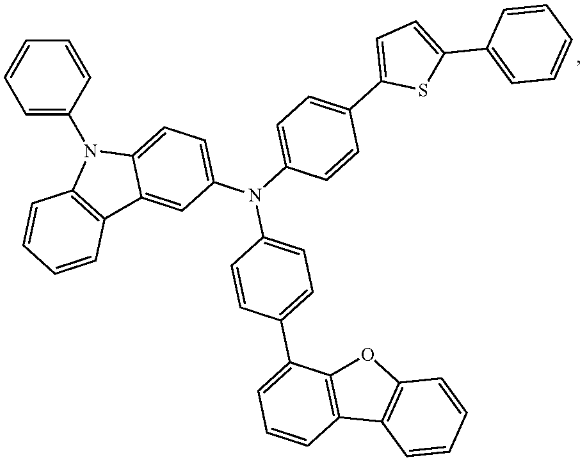
,
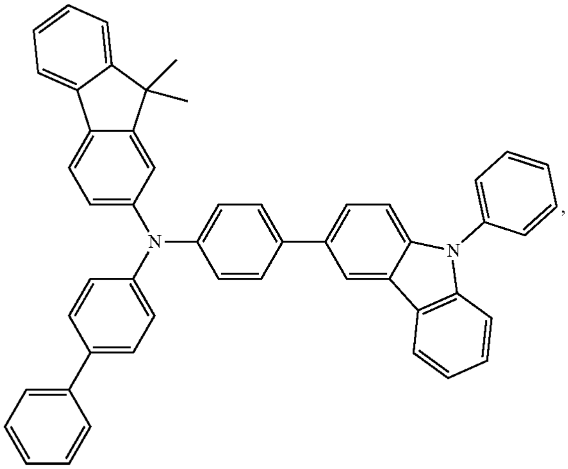
,
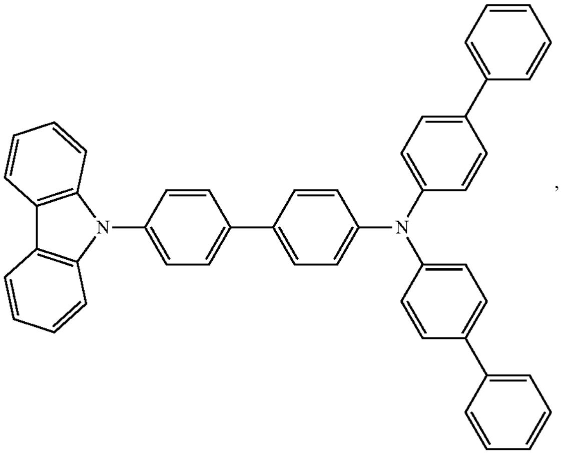
, -continued
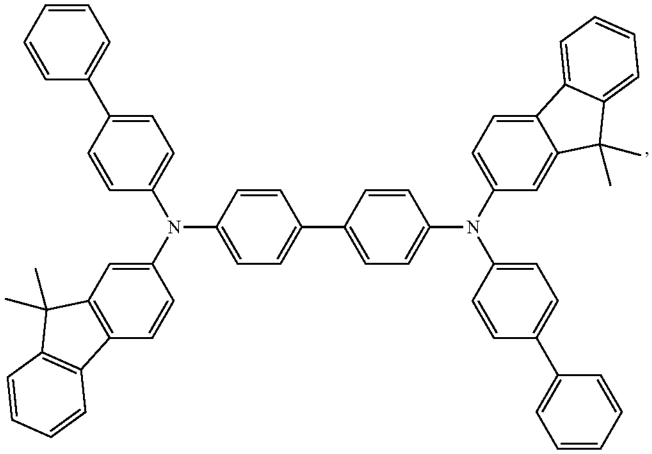
,
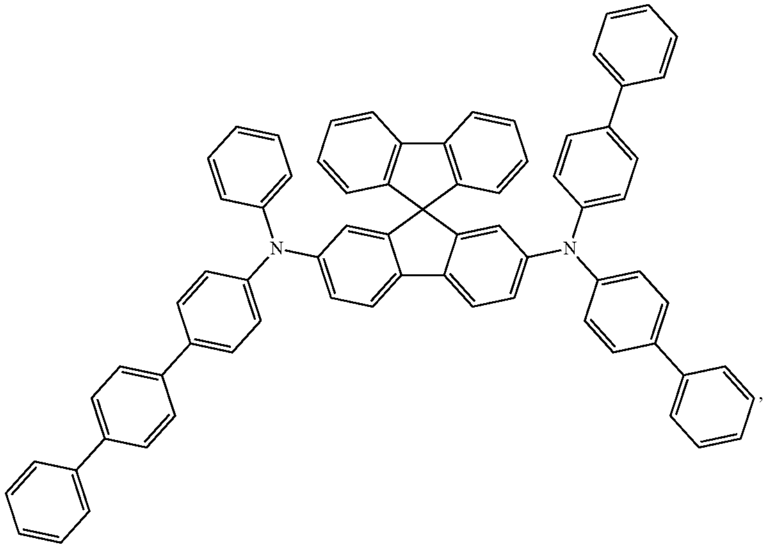
,
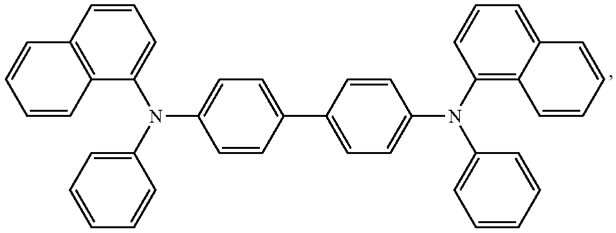
,
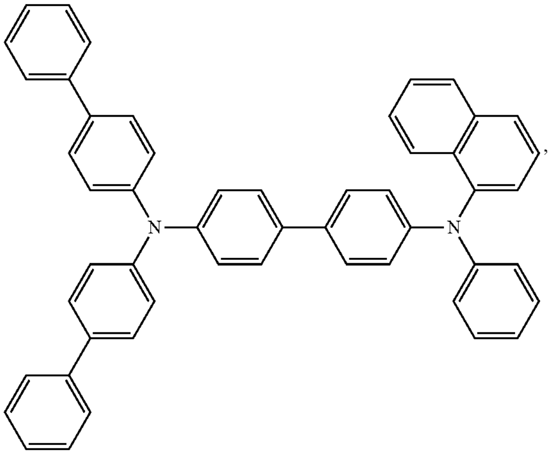
, -continued
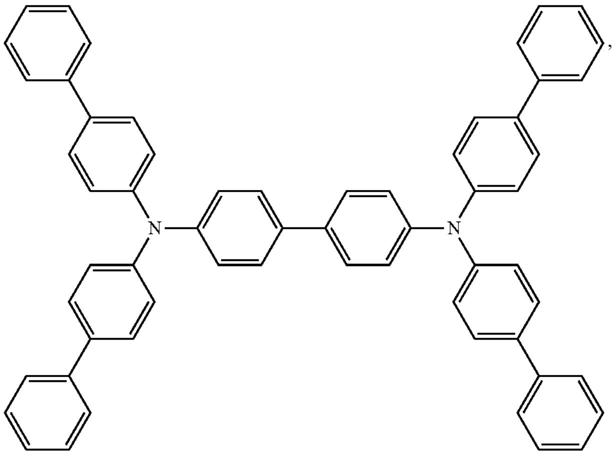
,
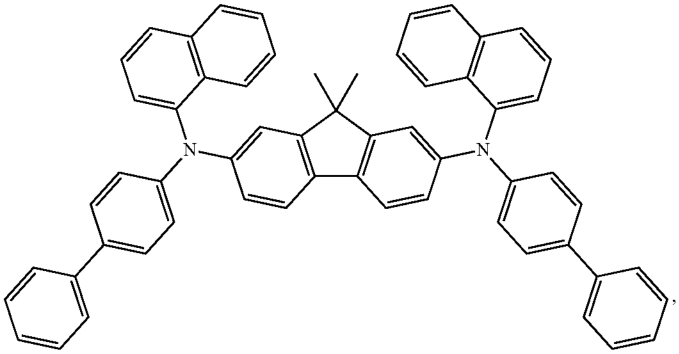
,
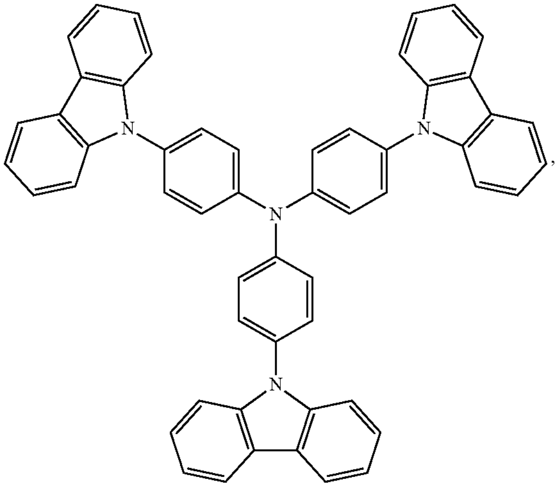
,
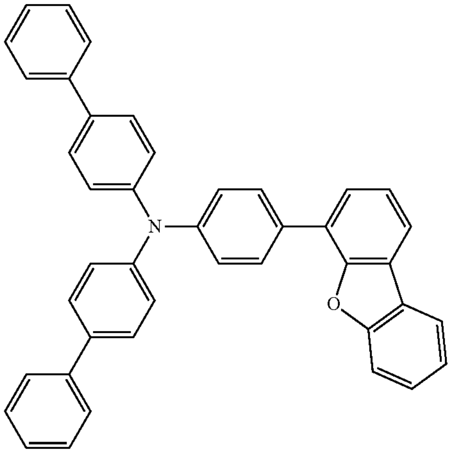
, -continued

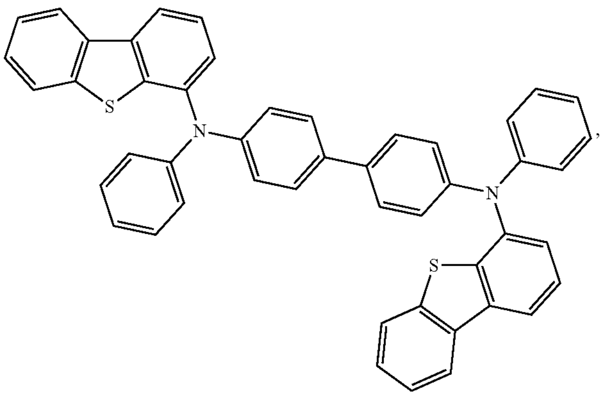

,

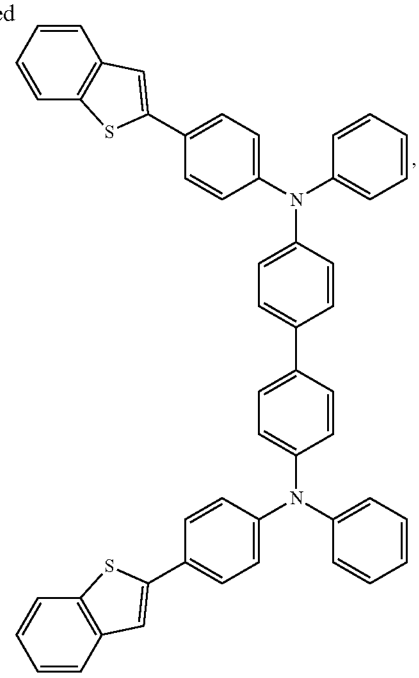

, and

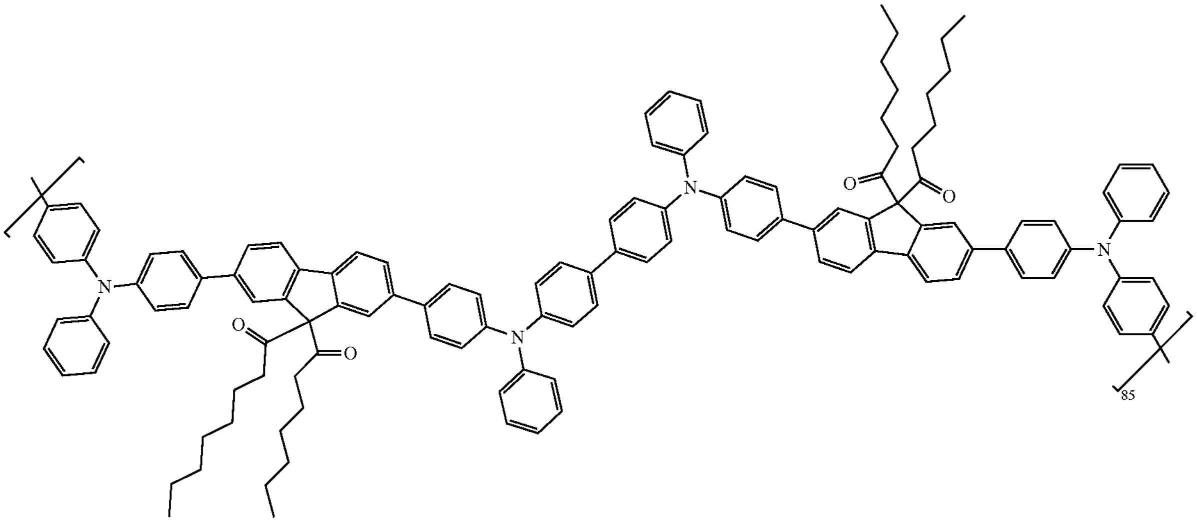

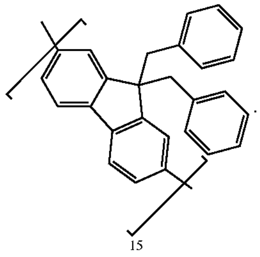

.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

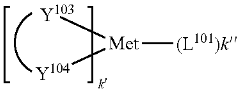

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

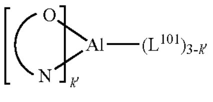
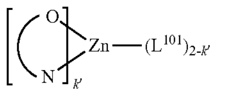

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

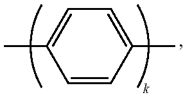,
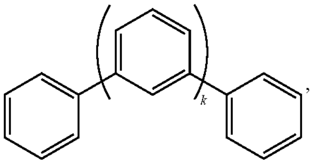,
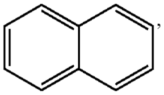,
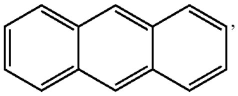,
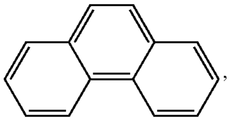,
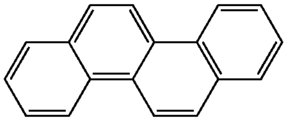,
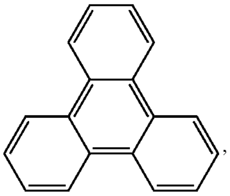,
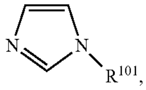,
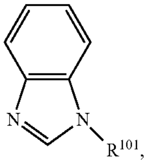,
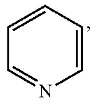,
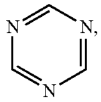,
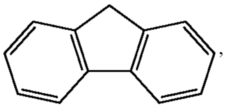,
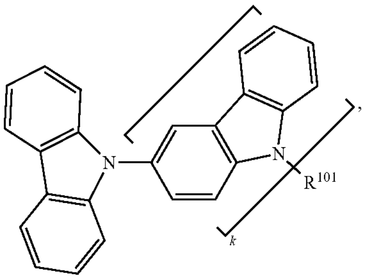,
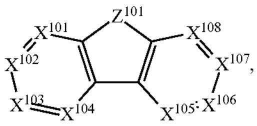,
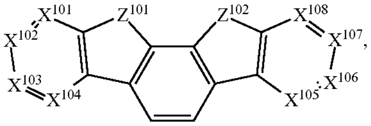,
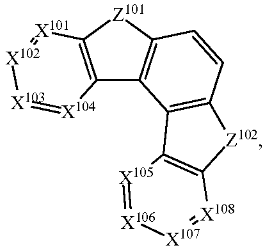, -continued

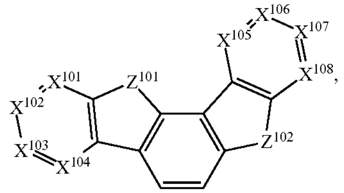

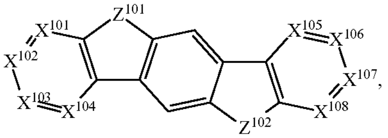

and

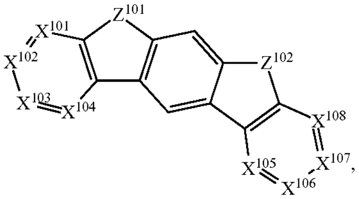

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, US7154114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

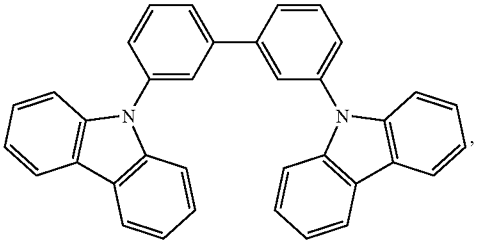

,

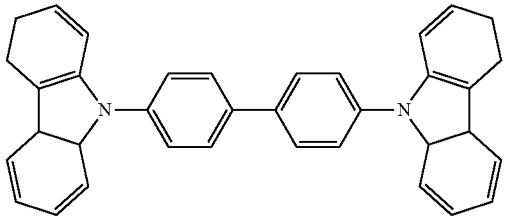

,

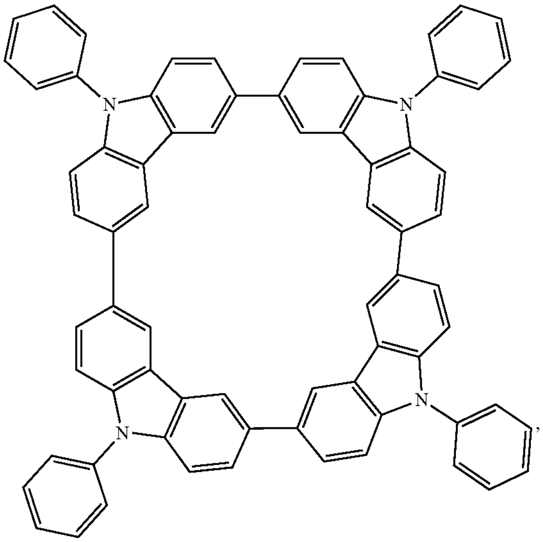

,

-continued
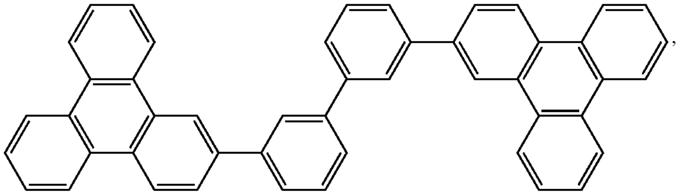,
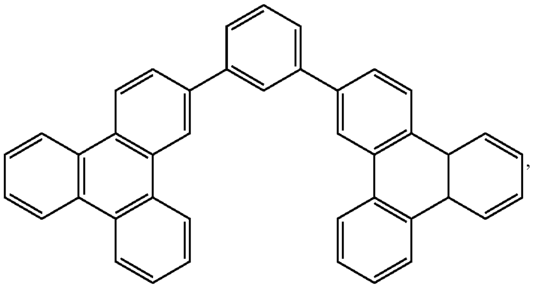,
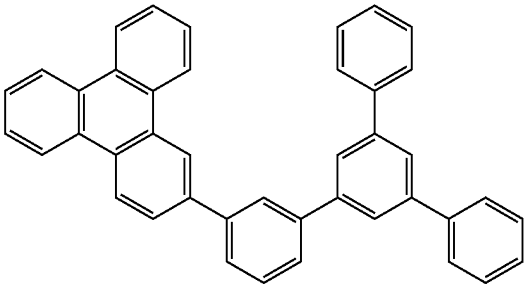,
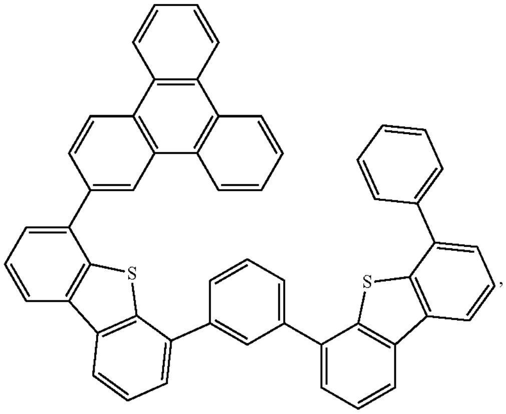,
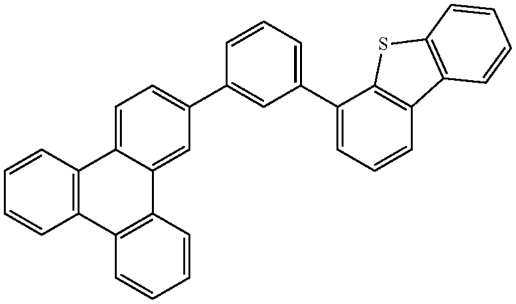,
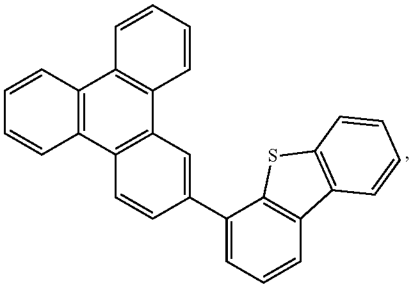,
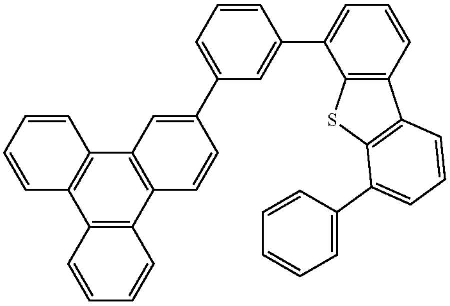,
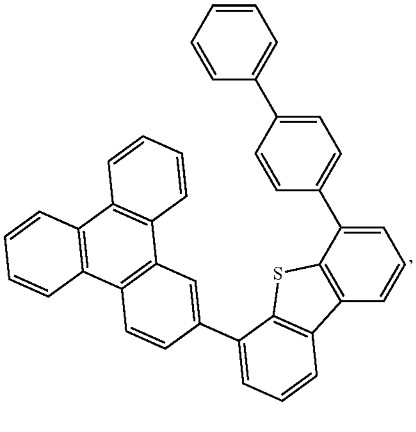,
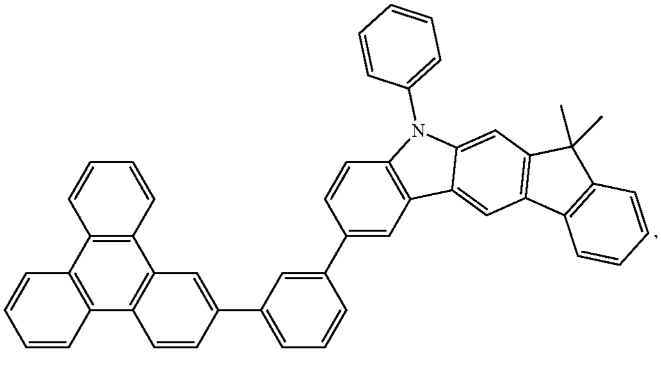, -continued
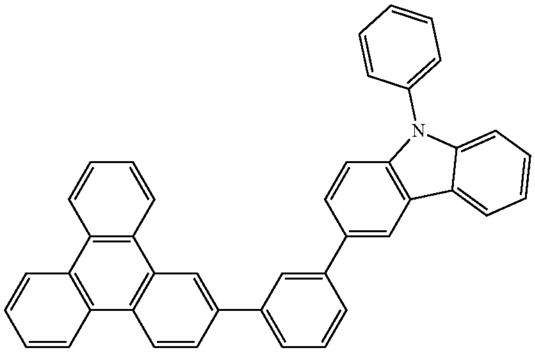
,
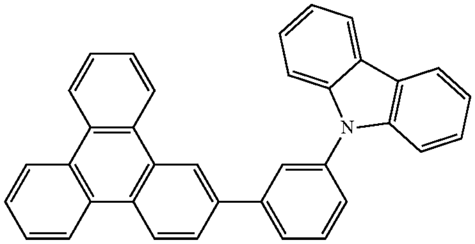
,
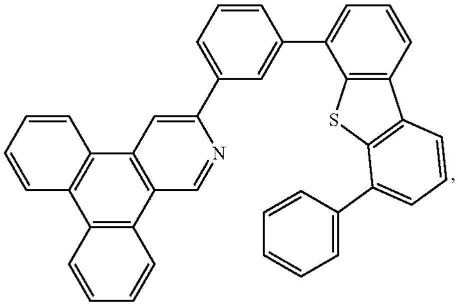
,
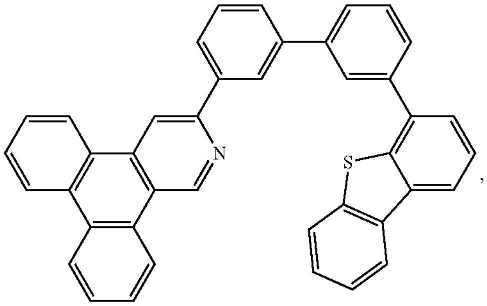
,
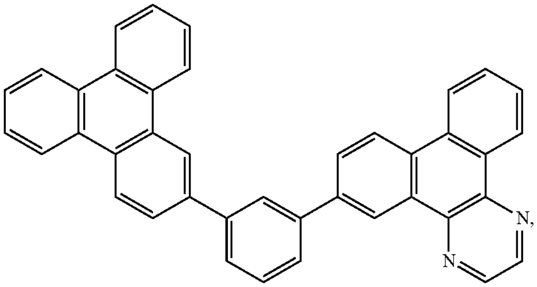
,
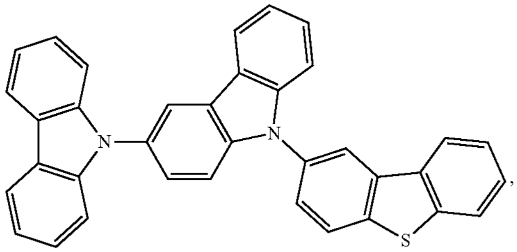
,
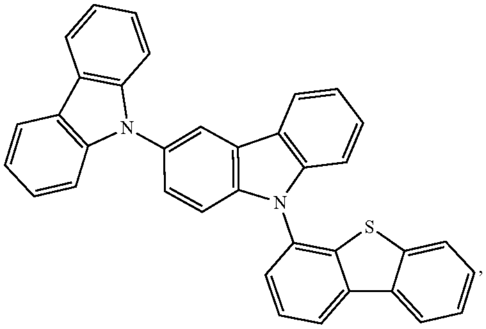
,
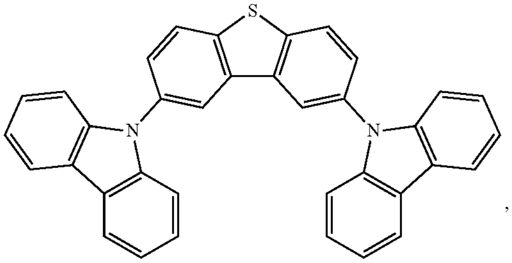
,
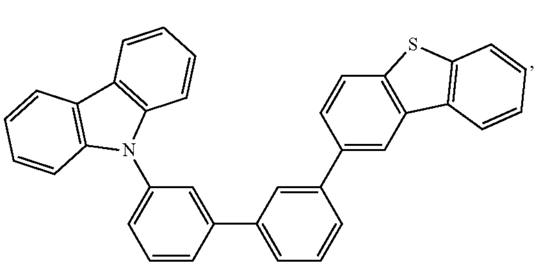
,
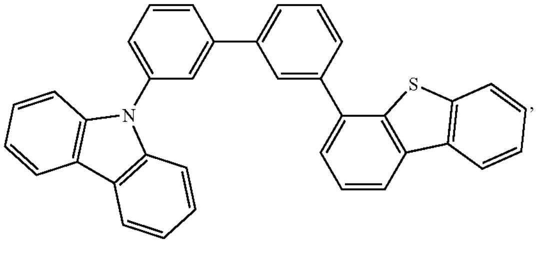
, -continued
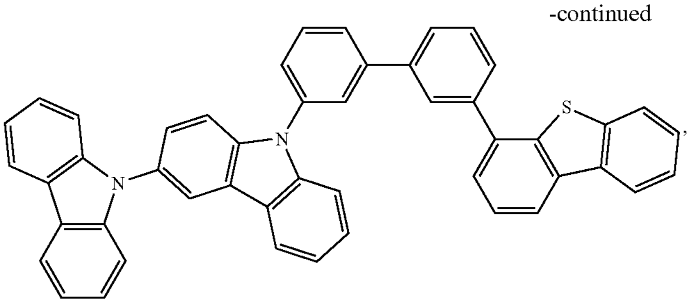
,
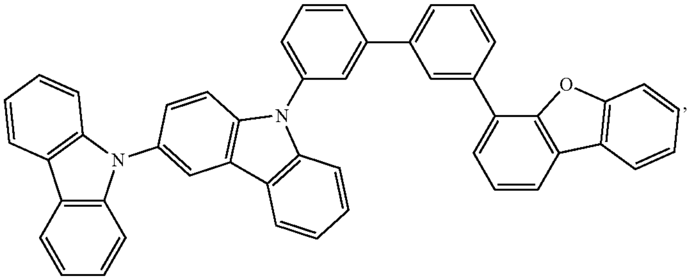
,
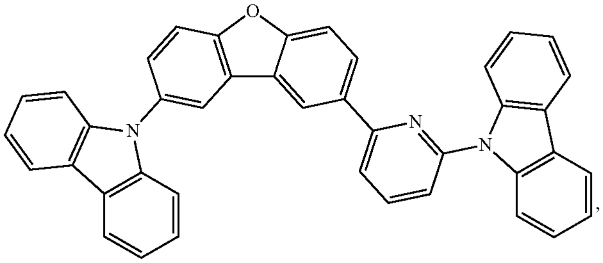
,
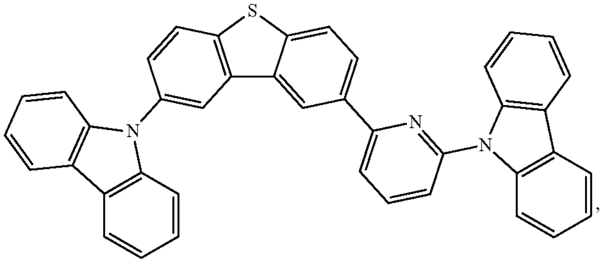
,
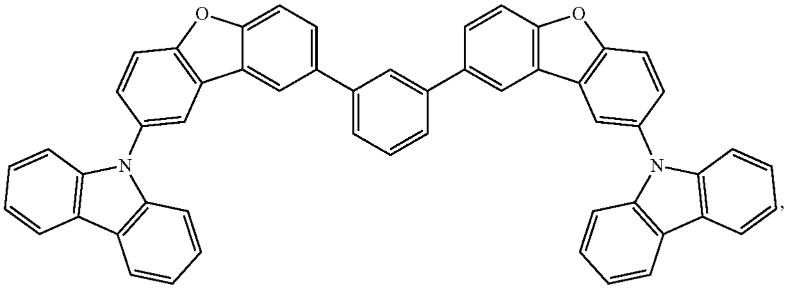
,
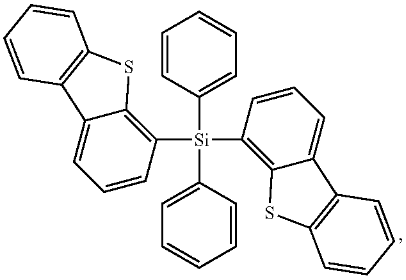
,
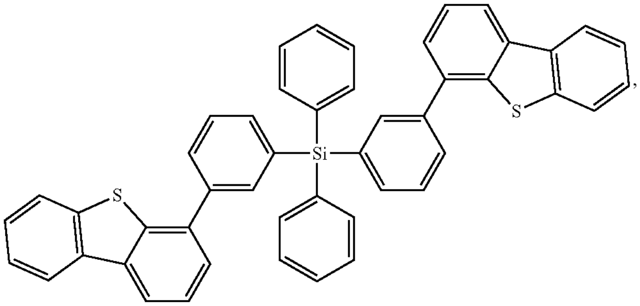
, -continued
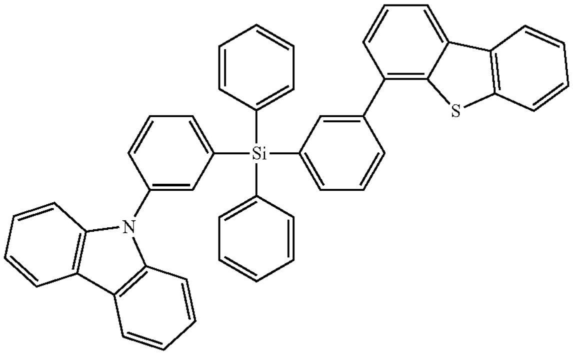
,
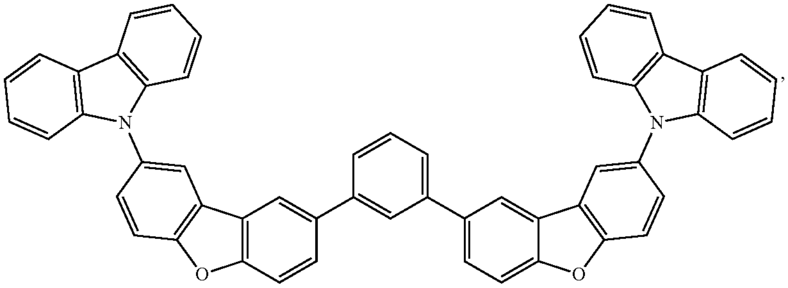
,
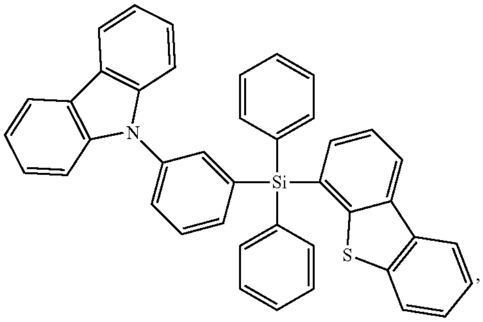
,
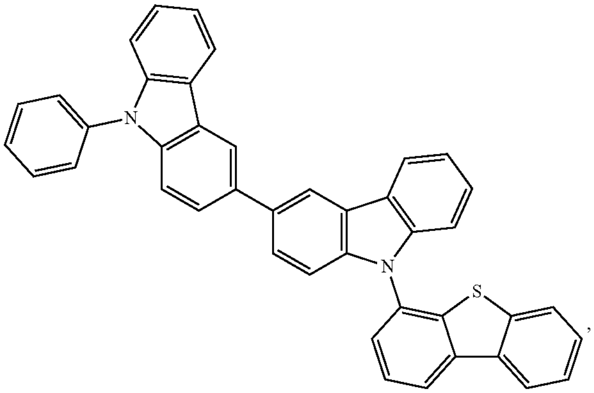
,
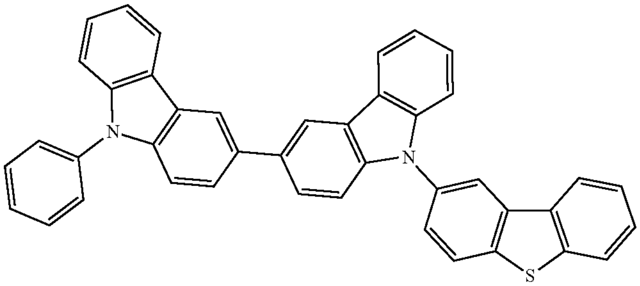
,
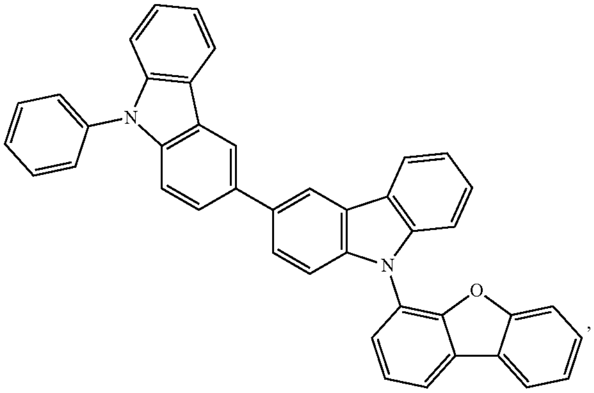
, -continued
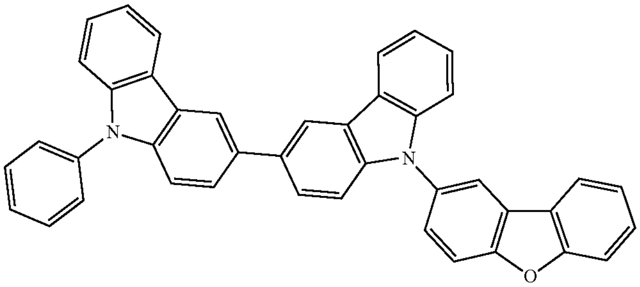
,
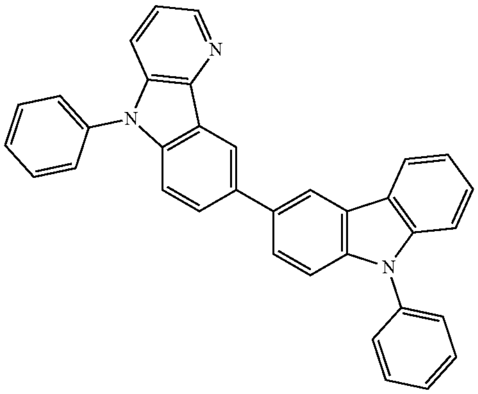
,
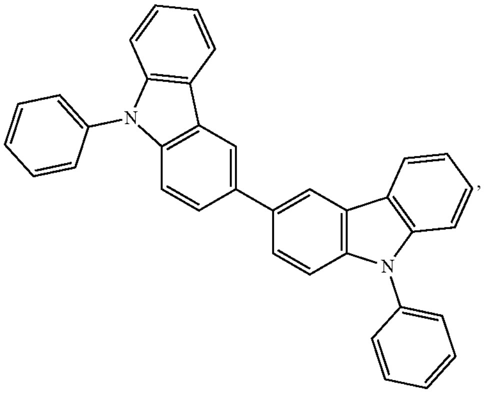
,
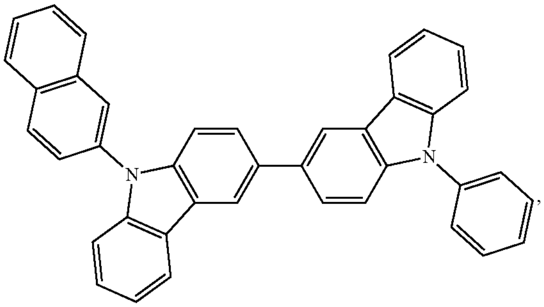
,
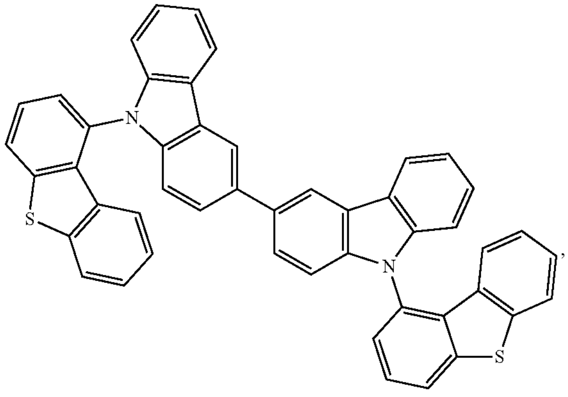
,
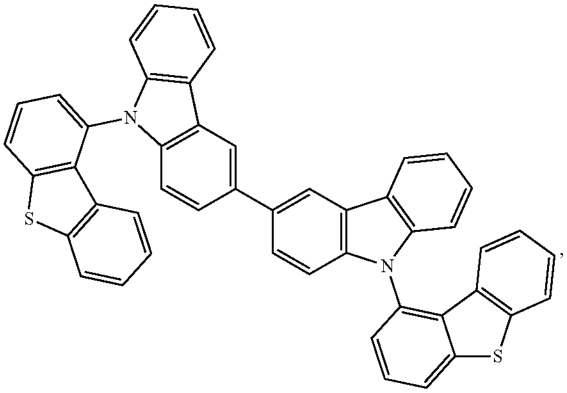
,
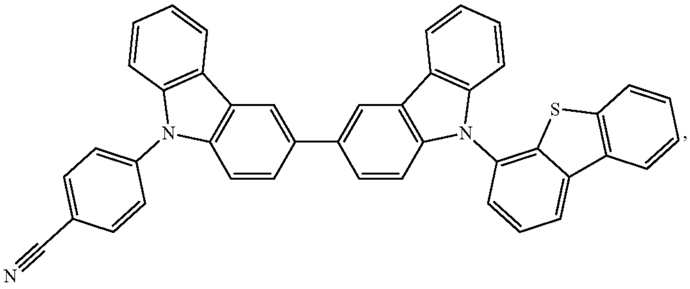
, -continued
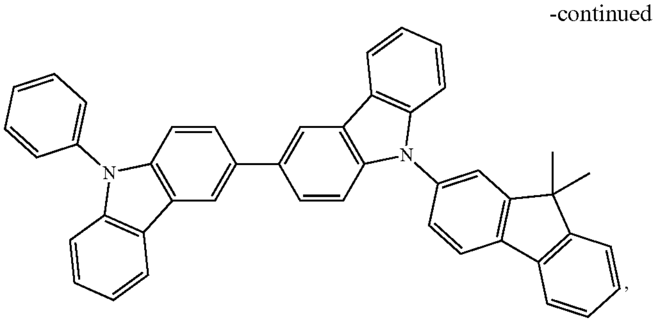
,
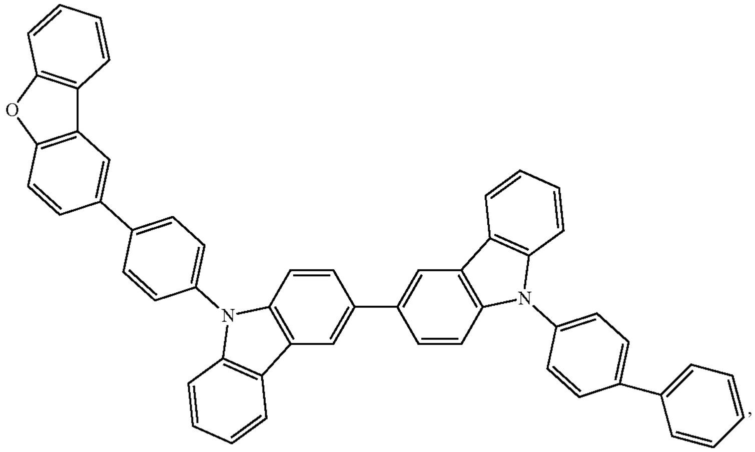
,
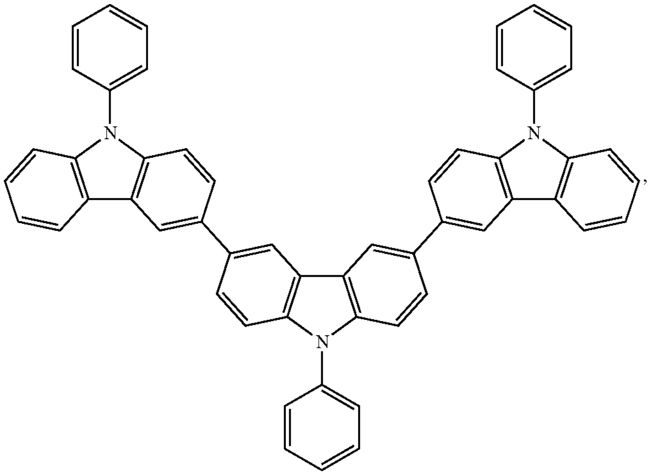
,
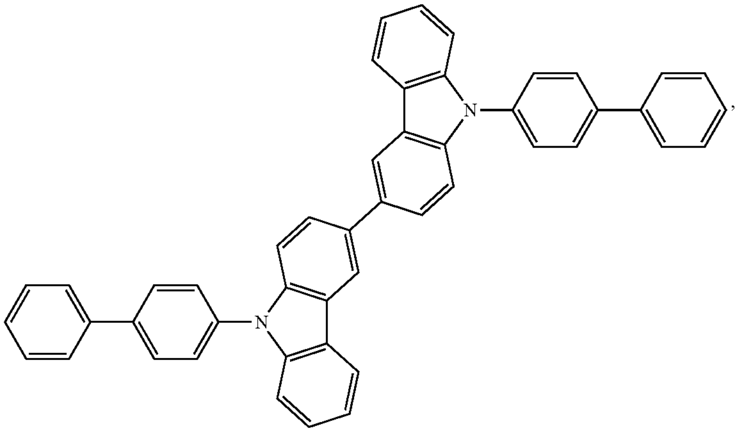
, -continued
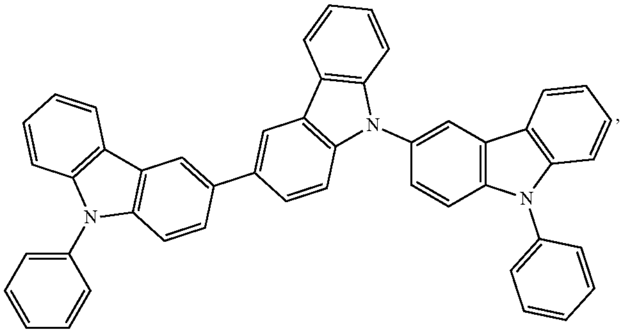
,
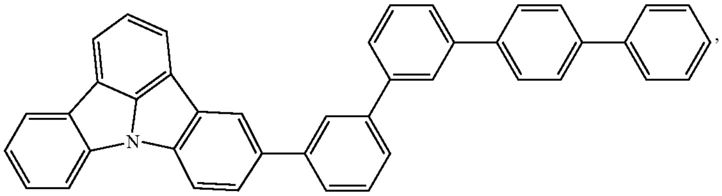
,
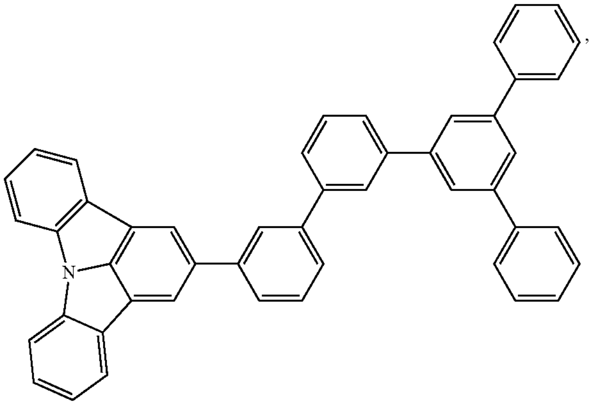
,
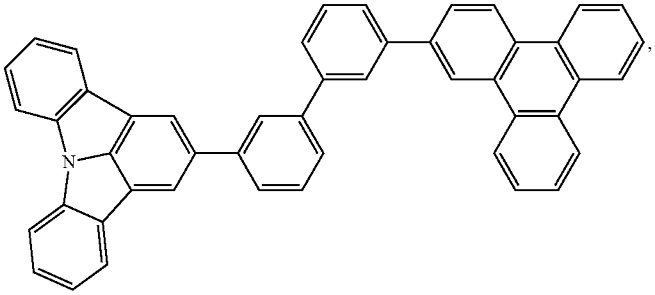
,
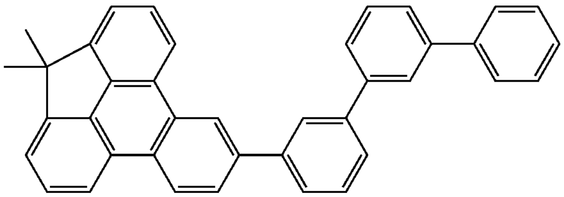
,
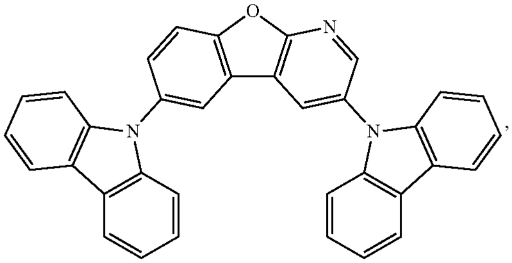
, -continued
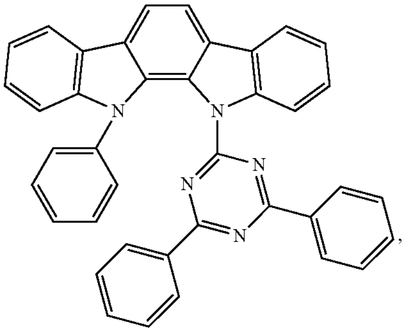,
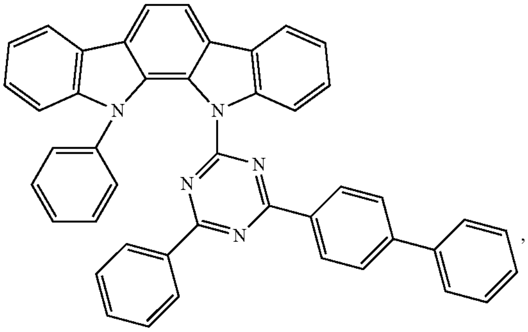,
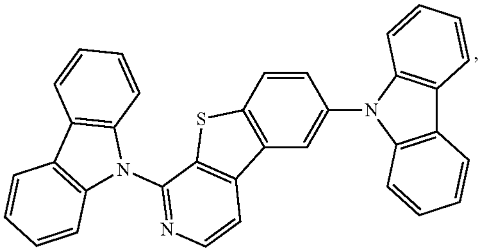,
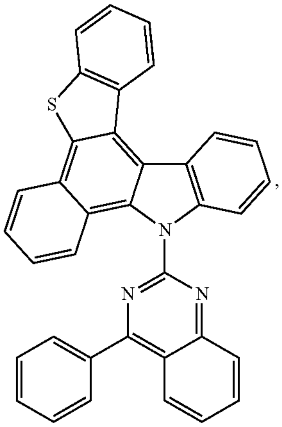,
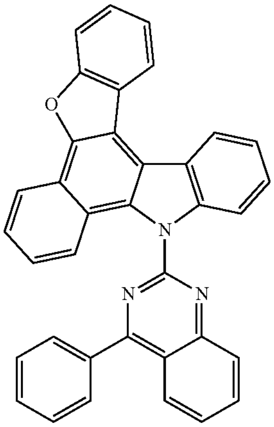,
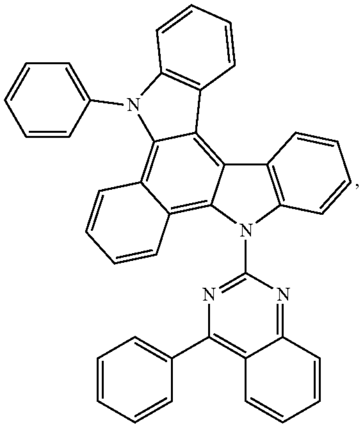,
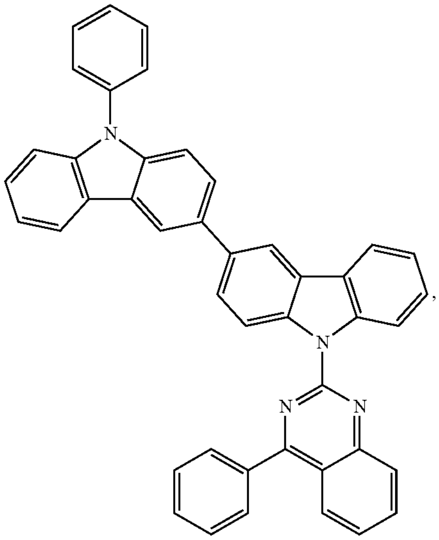,
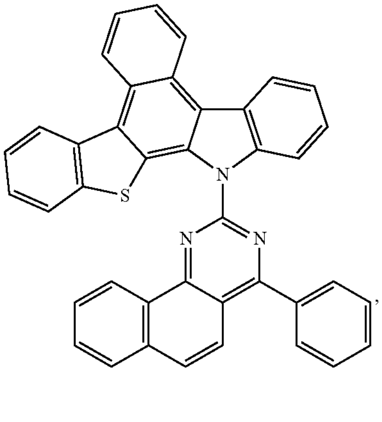,
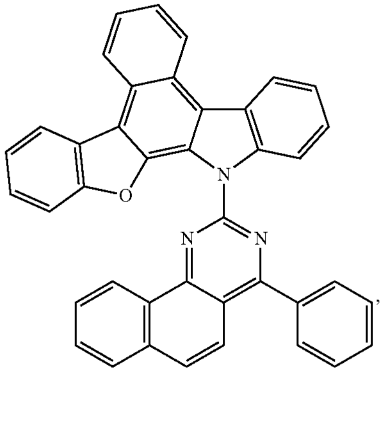, -continued
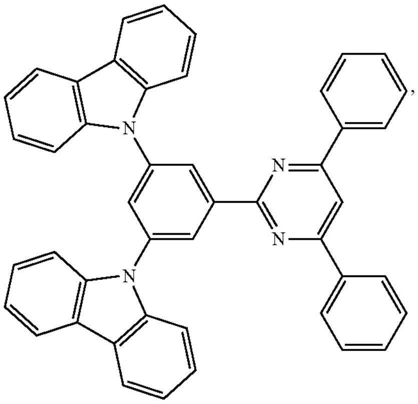
,
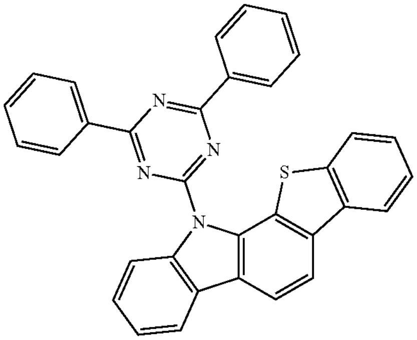
,
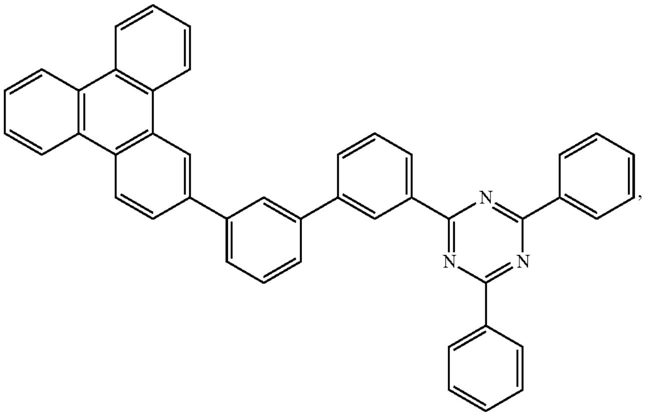
,
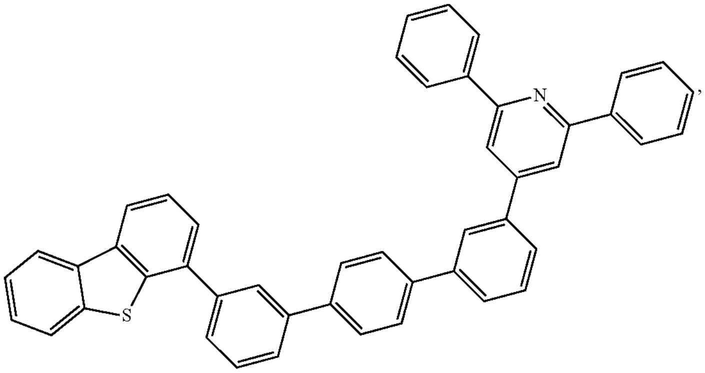
,
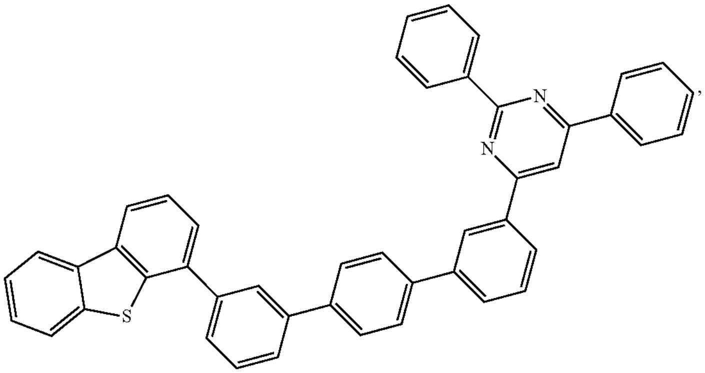
, -continued
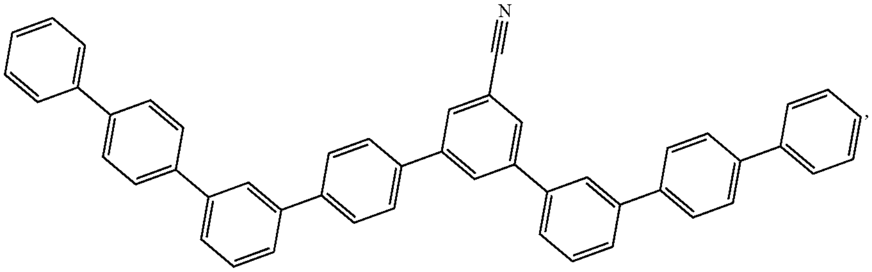,
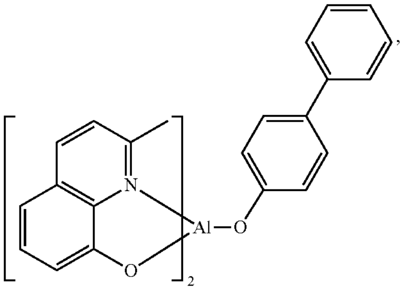,
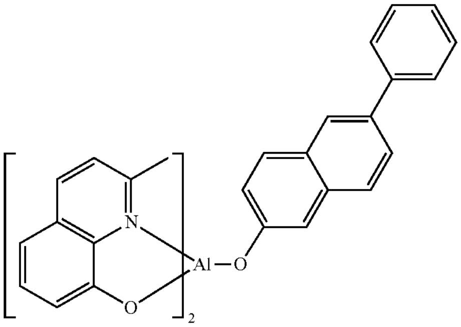,
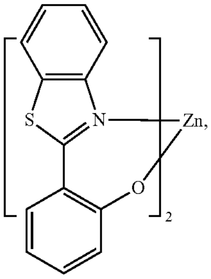
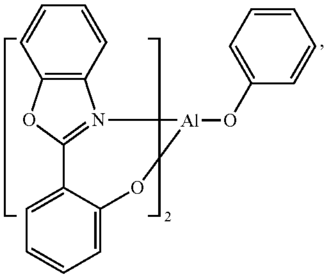,
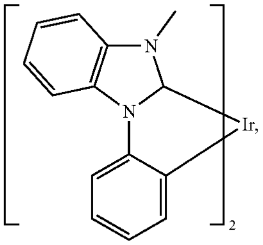
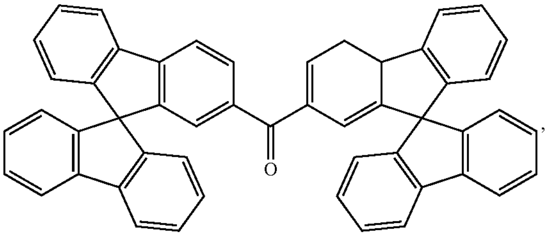,
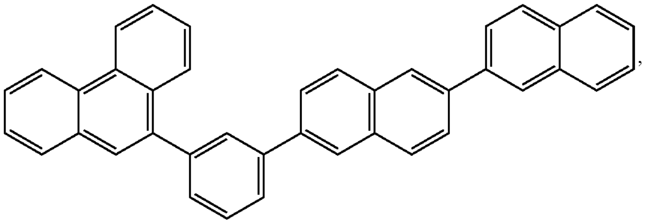,
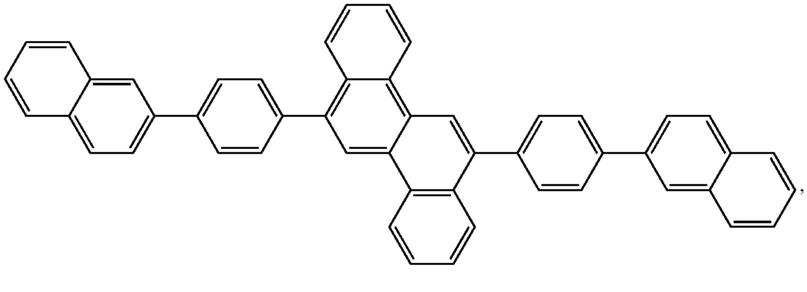, and -continued

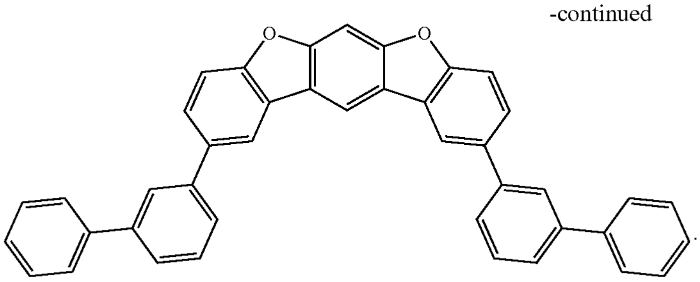

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

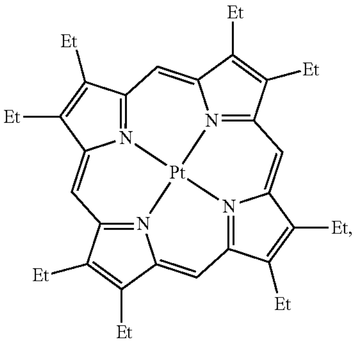

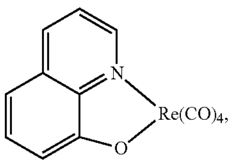

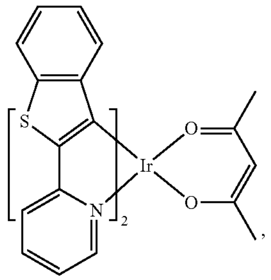

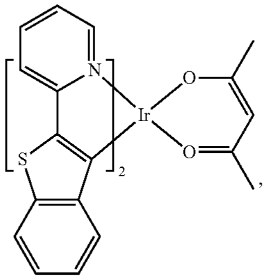

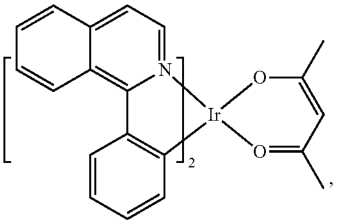

-continued
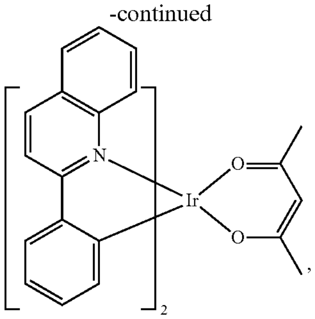
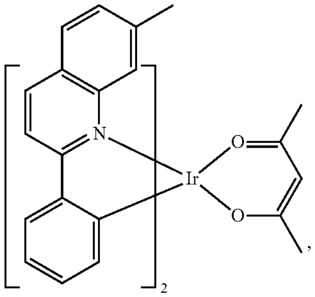
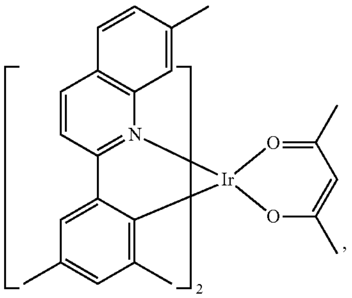
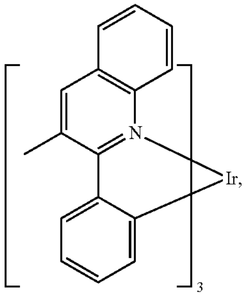
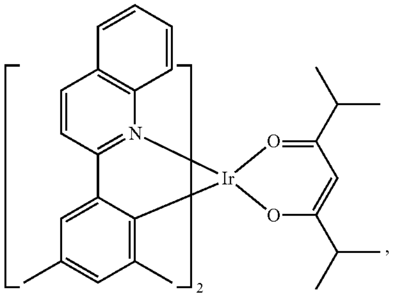
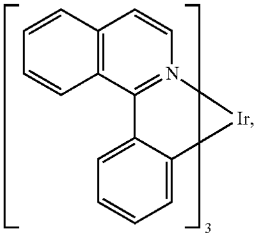
-continued
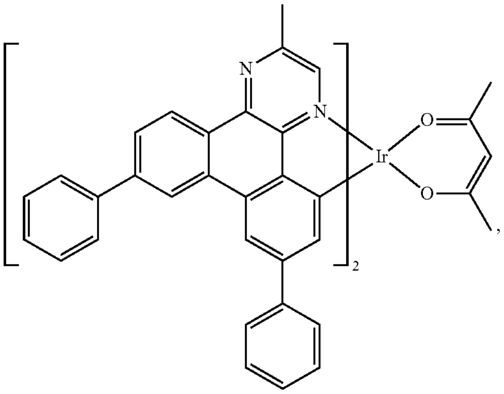
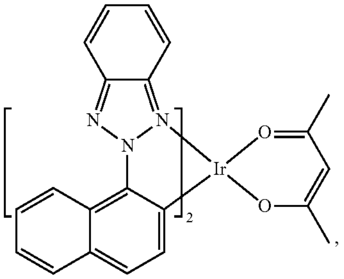
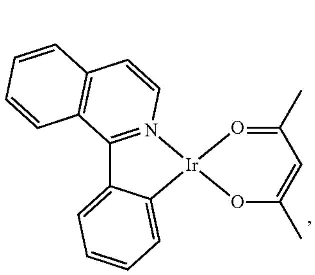
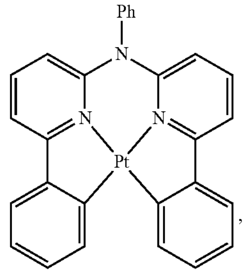
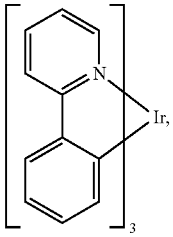
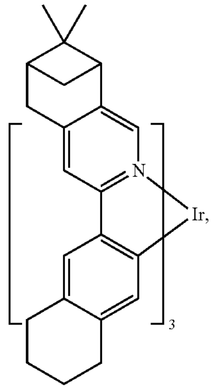
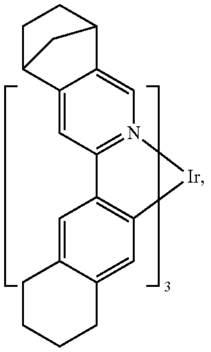

-continued
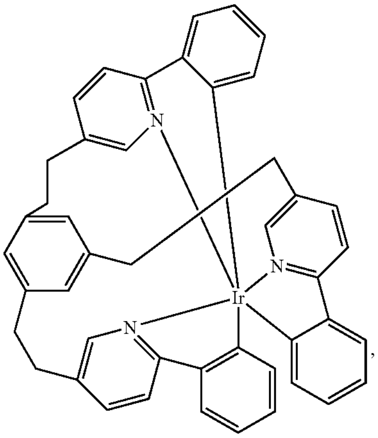
,
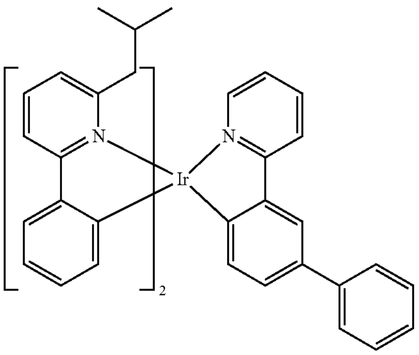
,
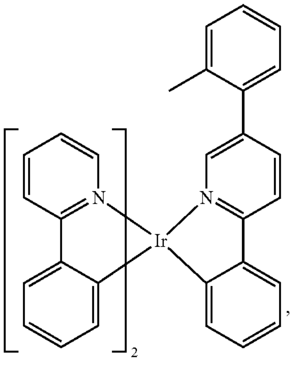
,
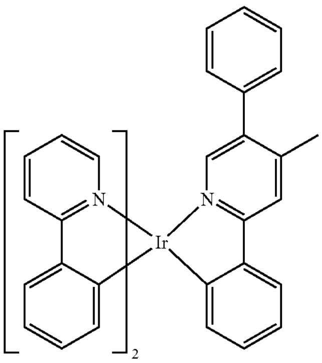
,
-continued
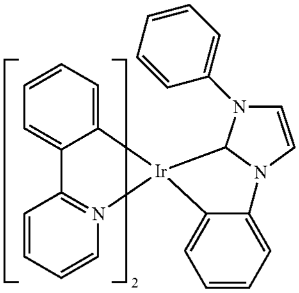
,
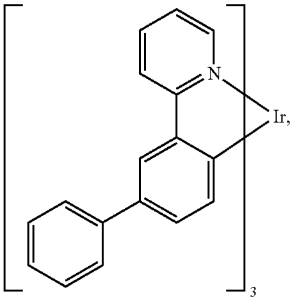
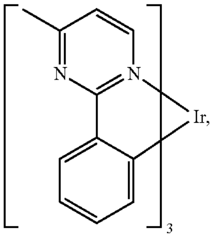
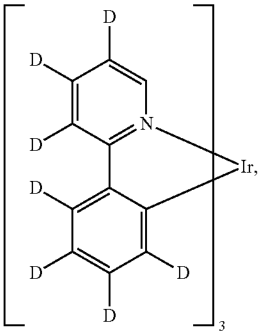
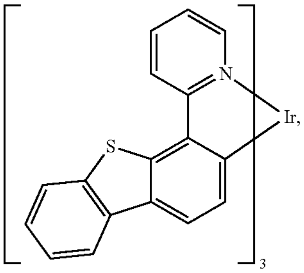
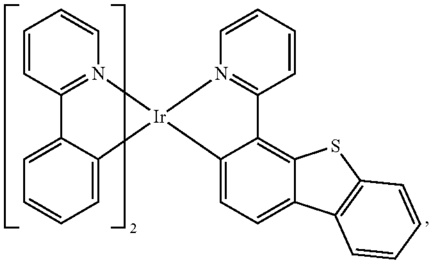
,
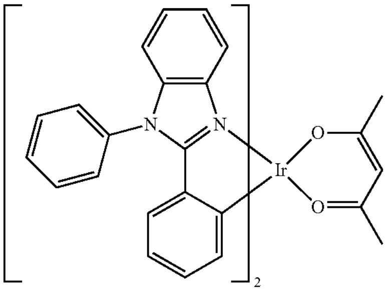
, -continued
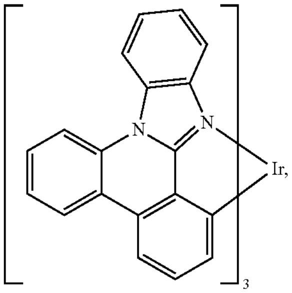
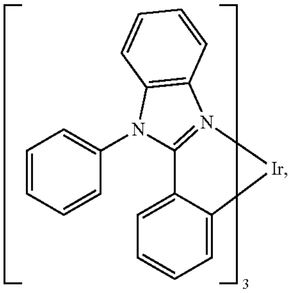
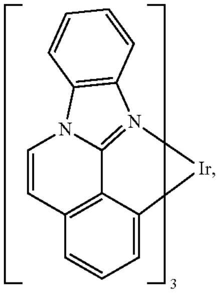
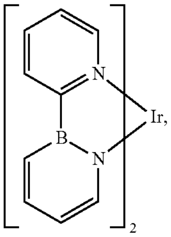
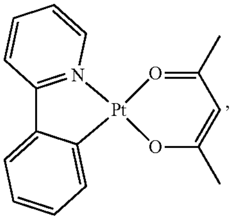
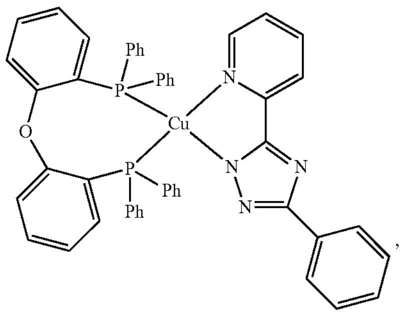
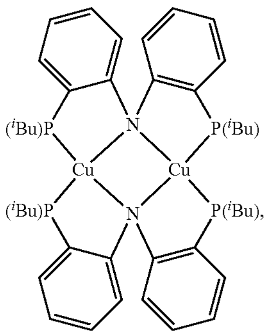
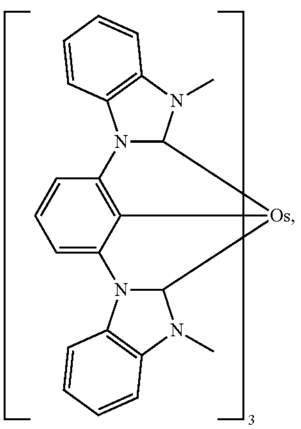
-continued
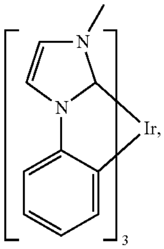
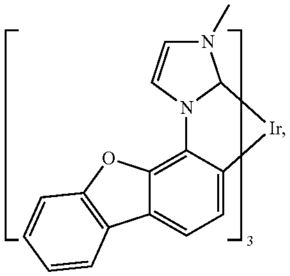
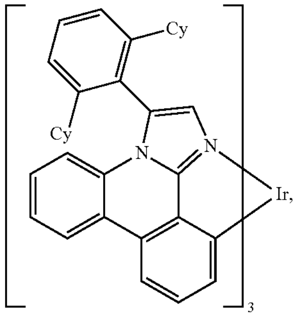
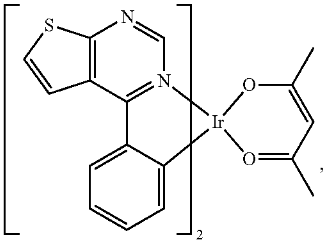
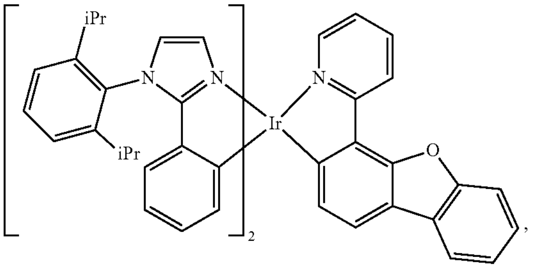
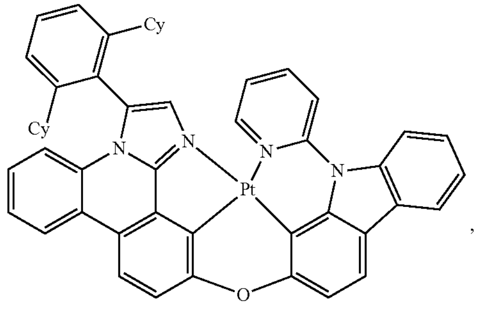

-continued
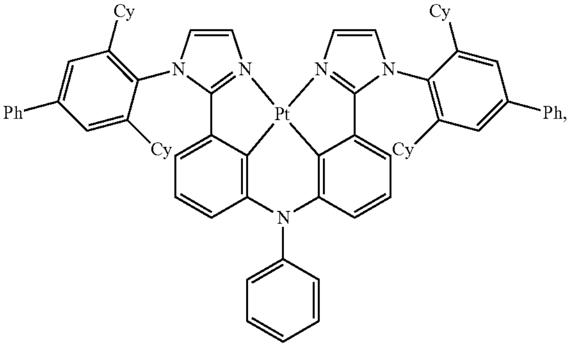
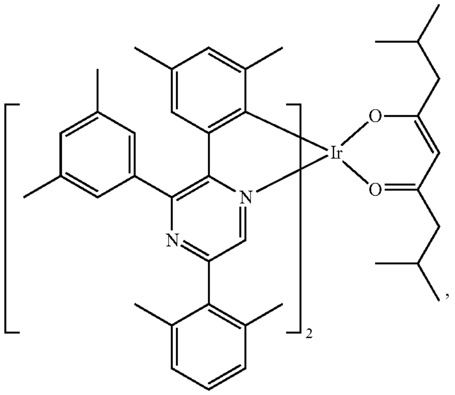
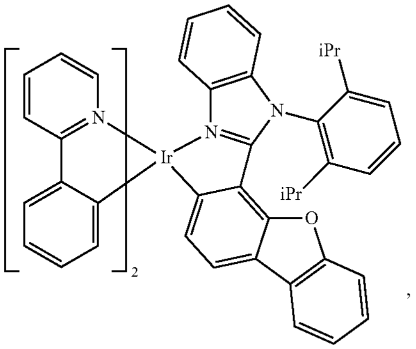
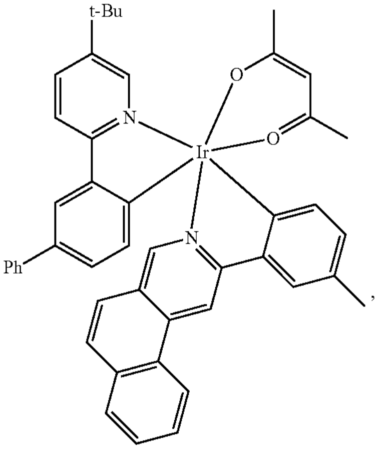
-continued
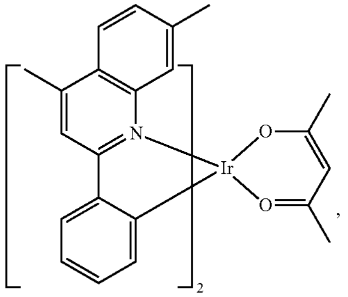
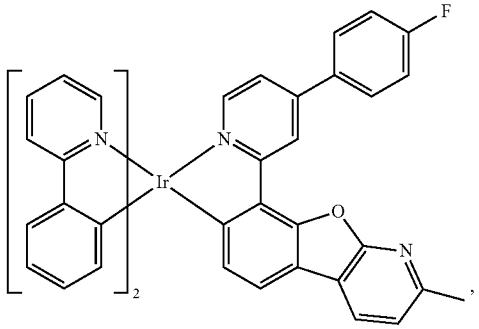
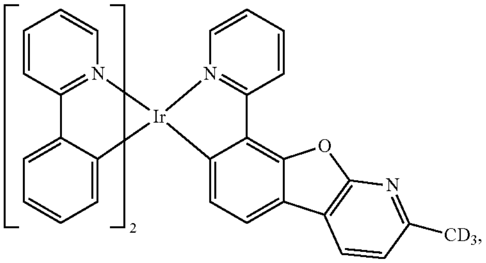
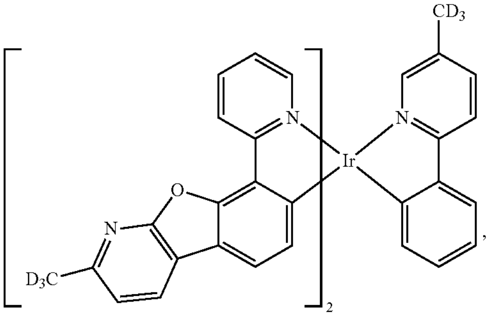
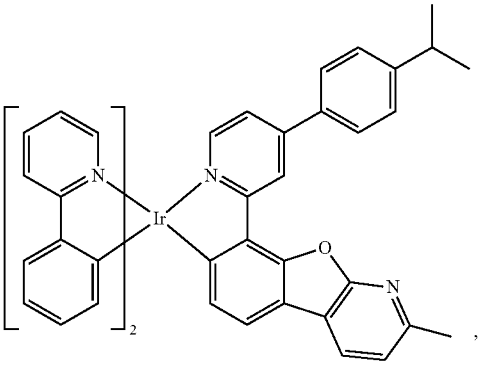

-continued
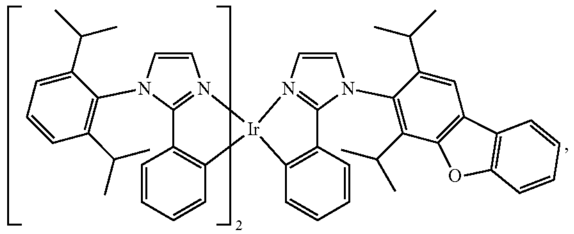
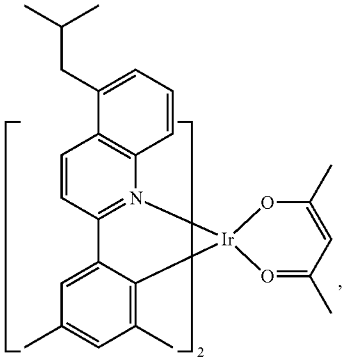
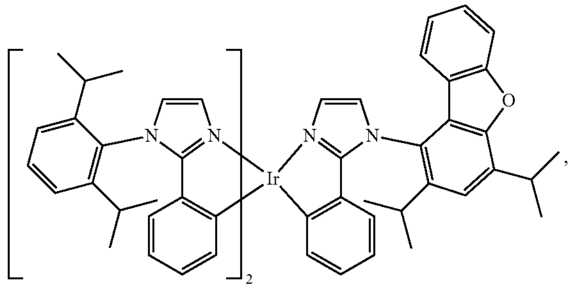
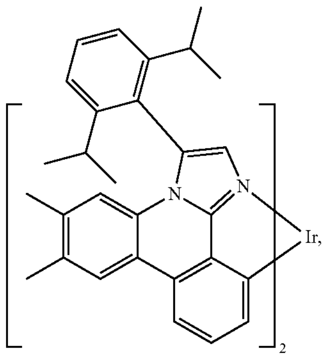
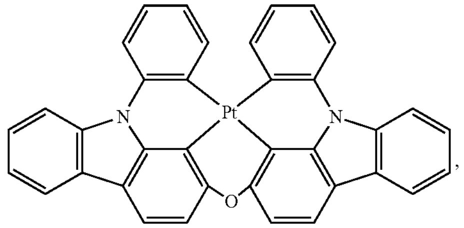
-continued
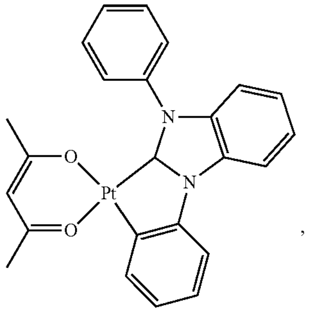
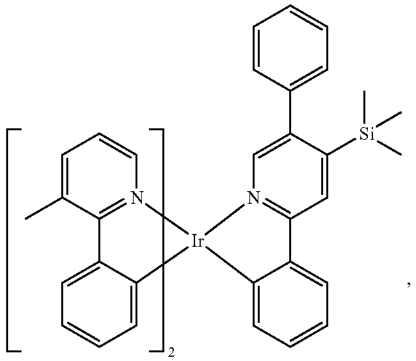
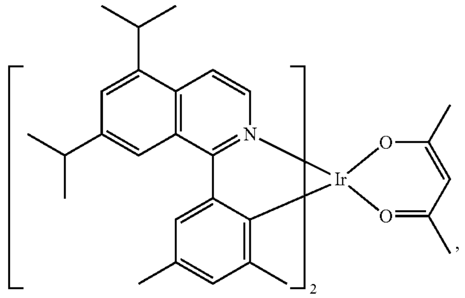
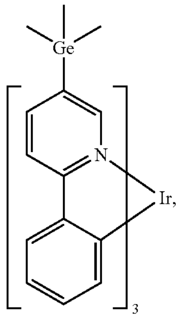
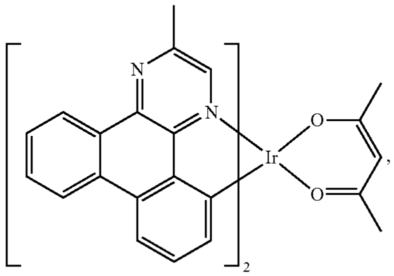
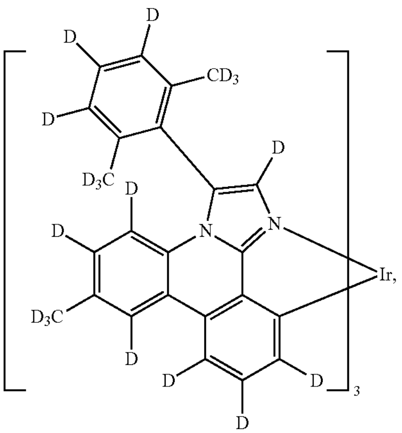

-continued
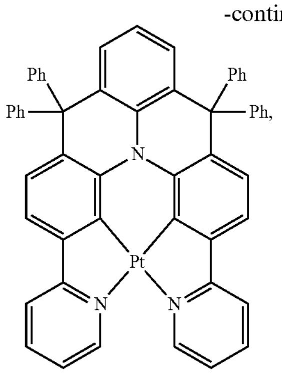
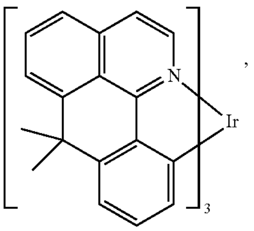
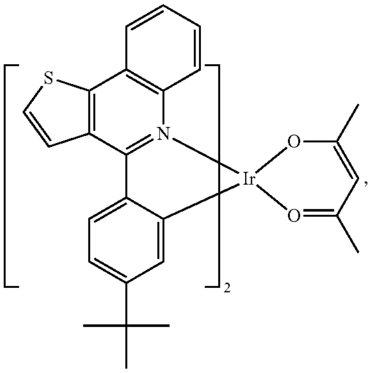
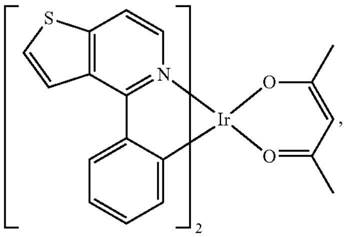
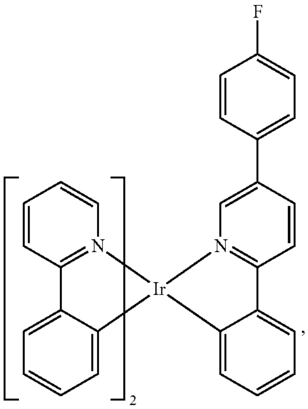
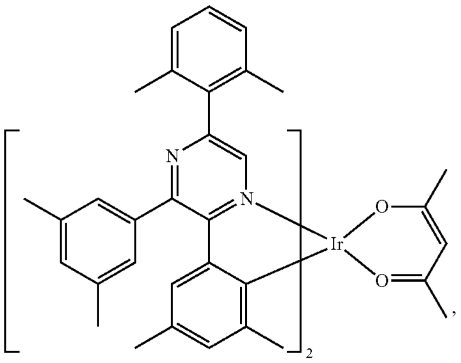
-continued
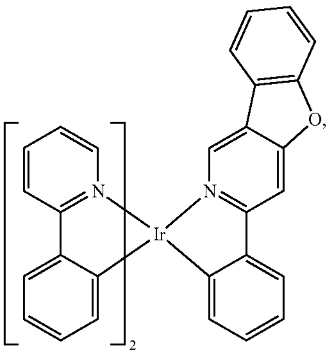
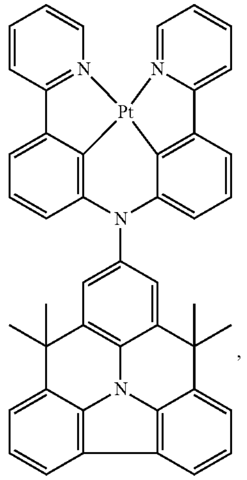
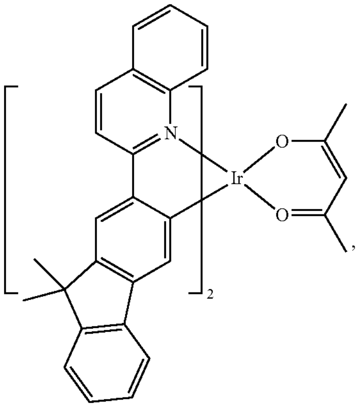
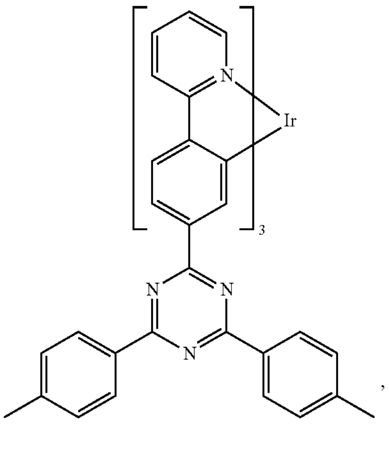

-continued
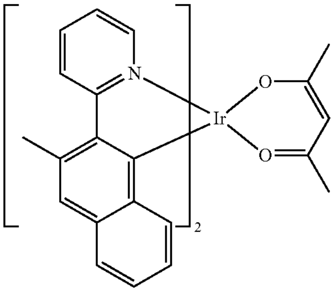
,
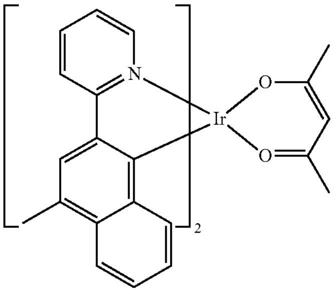
,
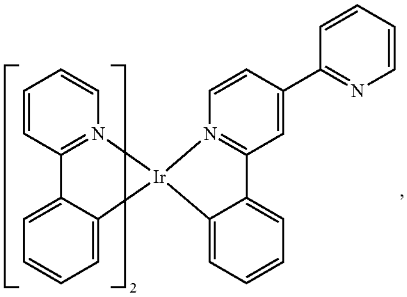
,
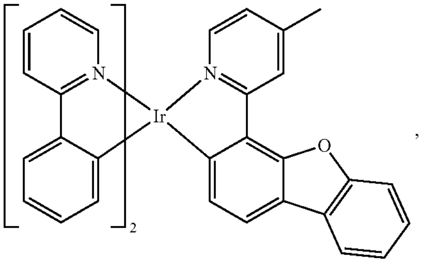
,
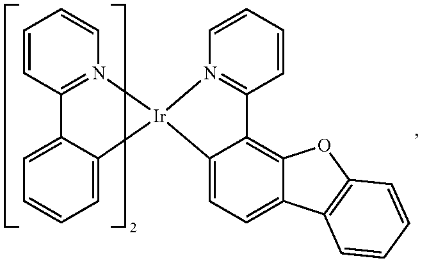
,
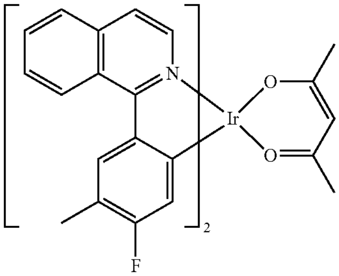
,
-continued
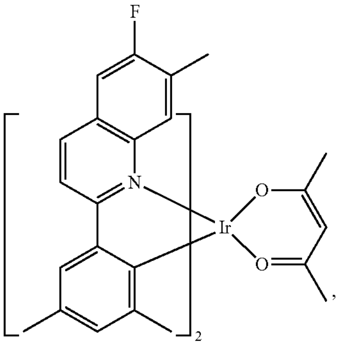
,
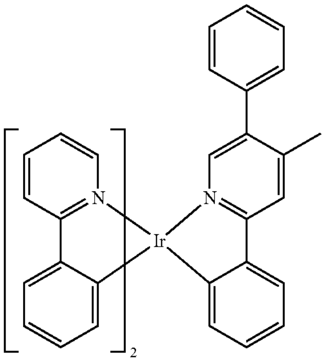
,
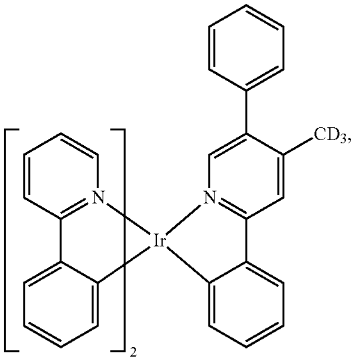
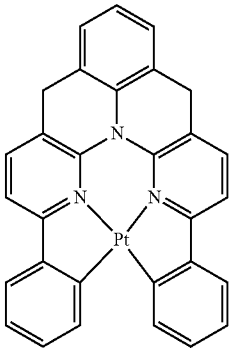
, -continued
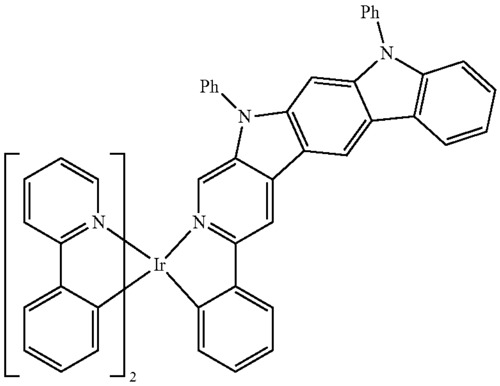
,
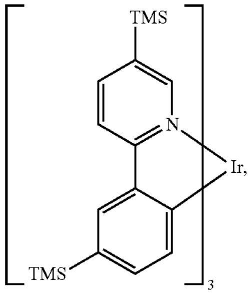
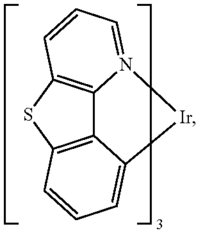
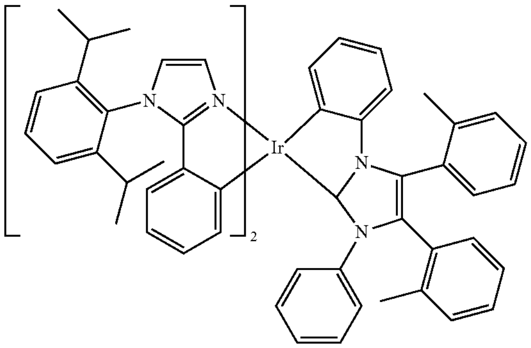
,
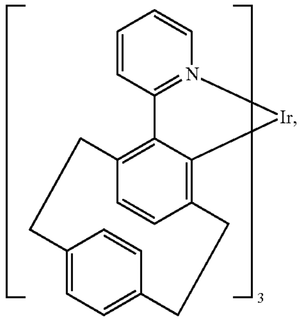
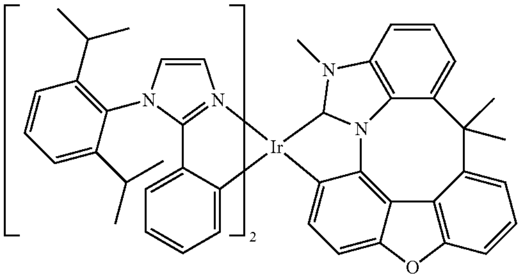
,
-continued
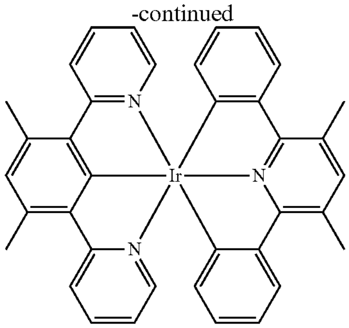
,
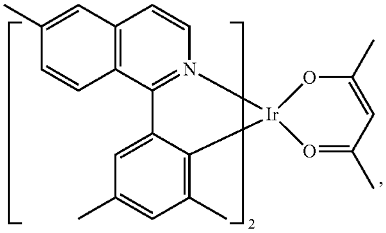
,
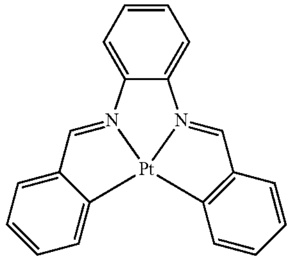
,
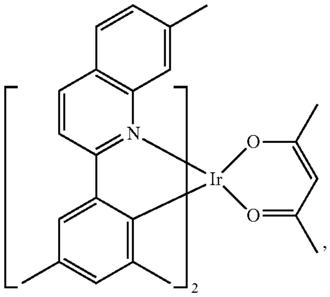
,
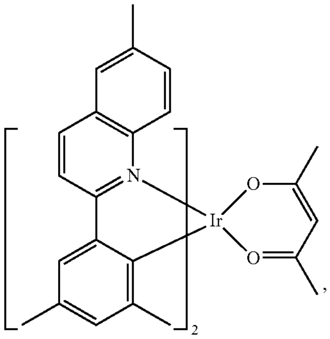
,
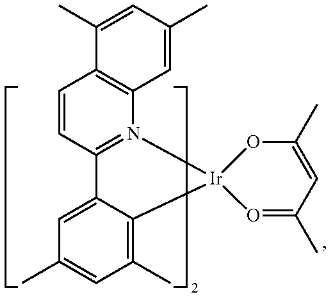
, -continued
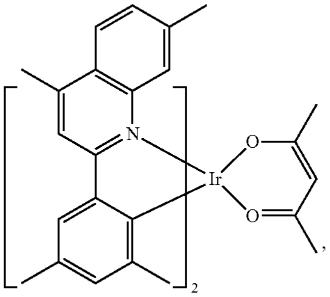
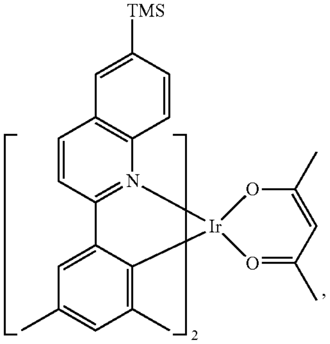
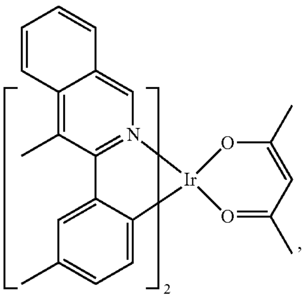
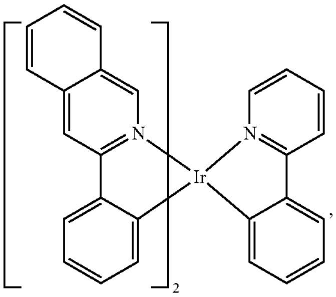
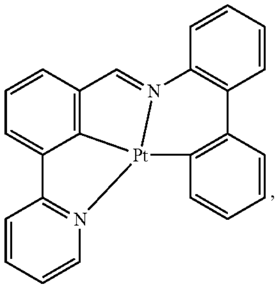
-continued
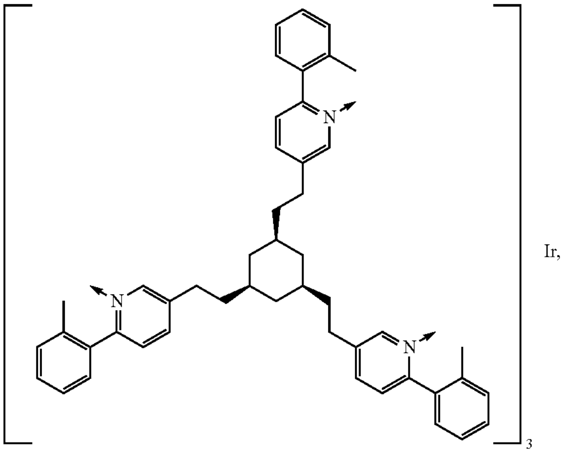
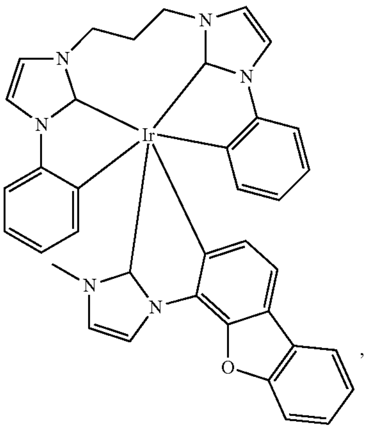
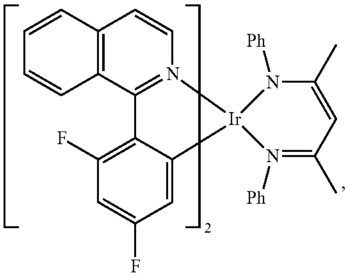
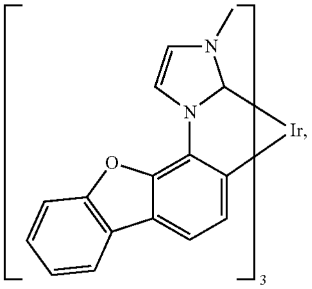

-continued
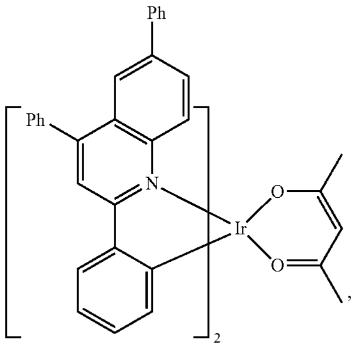
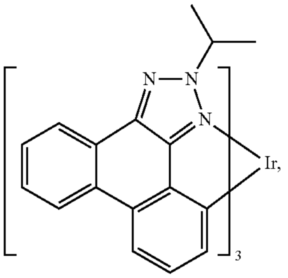
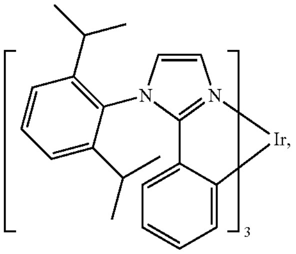
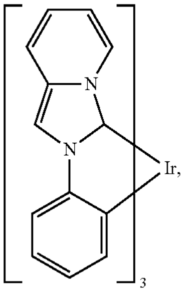
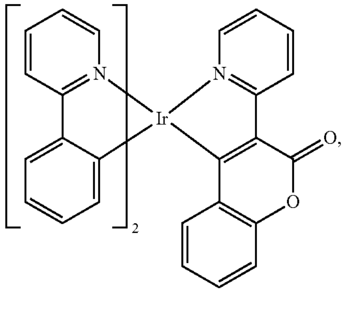
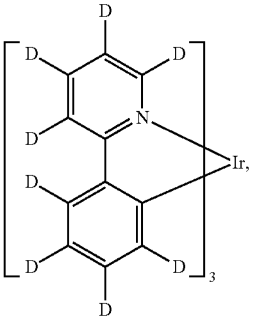
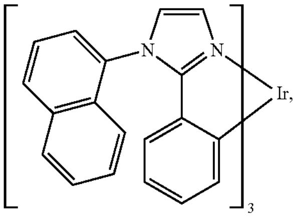
-continued
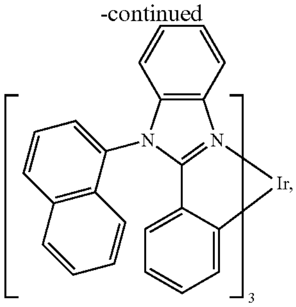
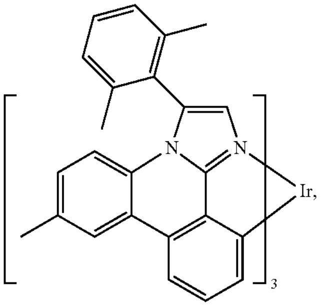
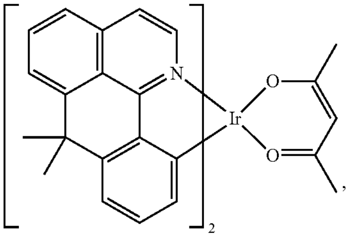
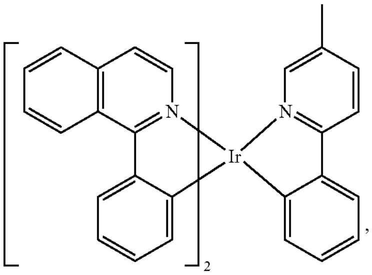
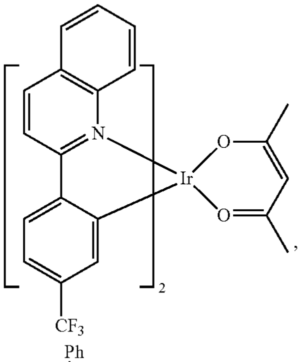
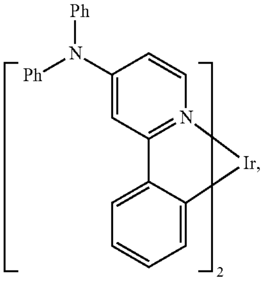
and -continued

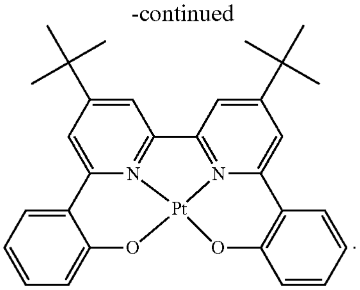

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

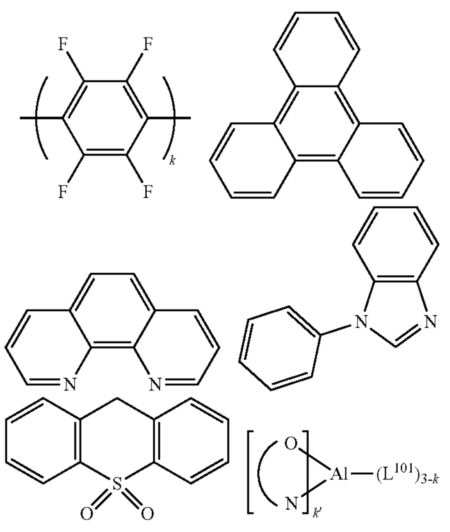

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

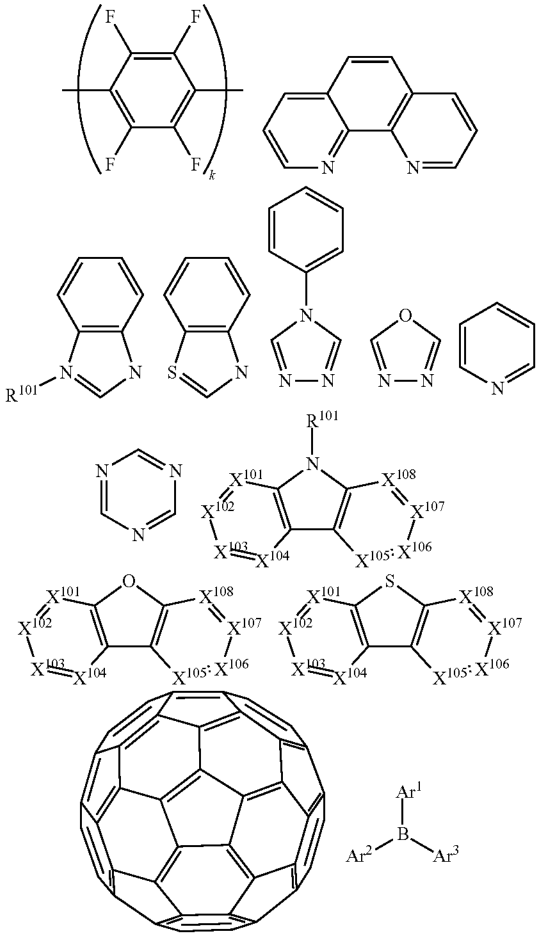

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

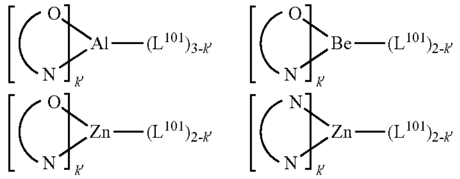

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,
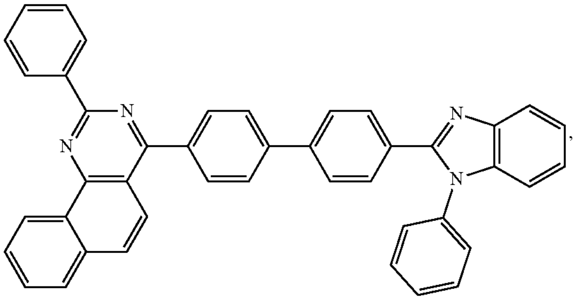
,
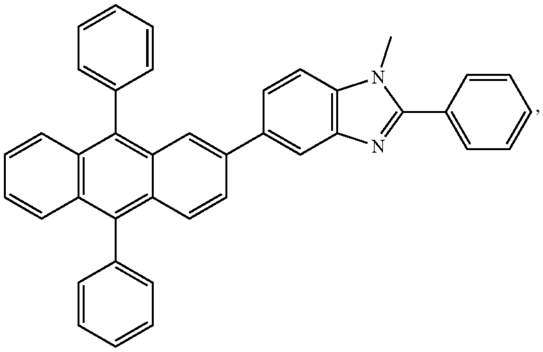
,
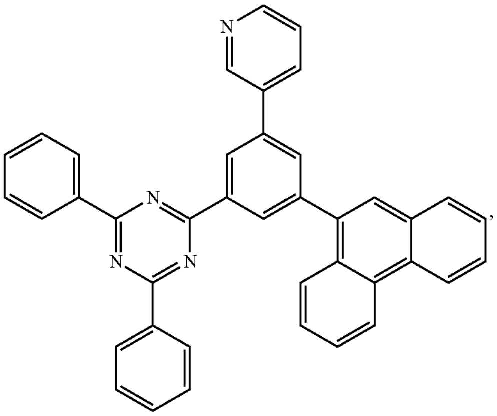
,
-continued
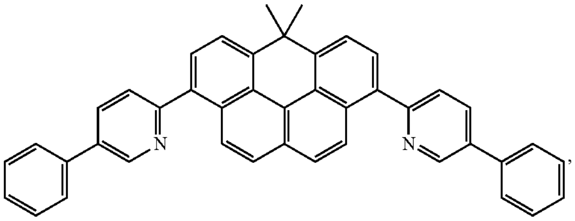
,
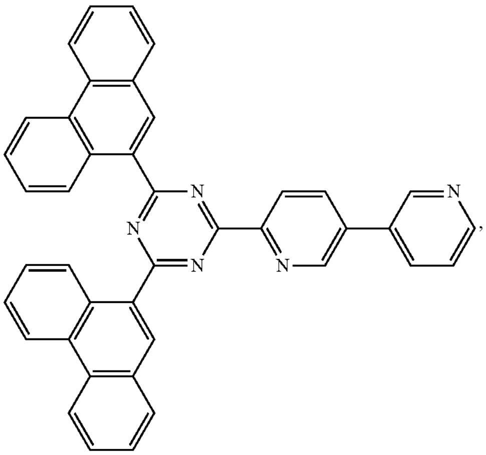
,
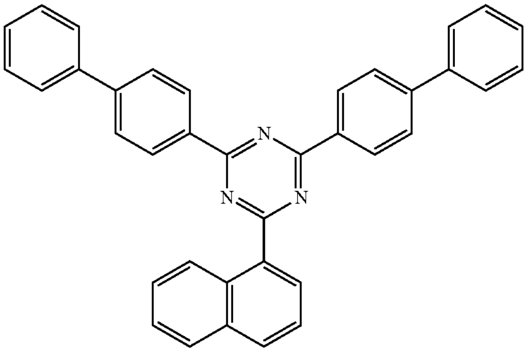
,
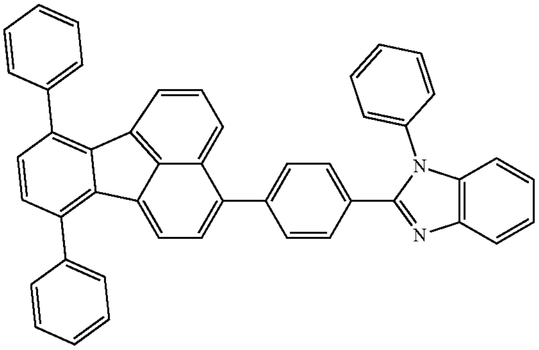
,
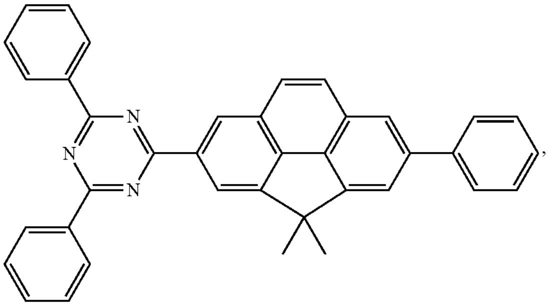
, -continued
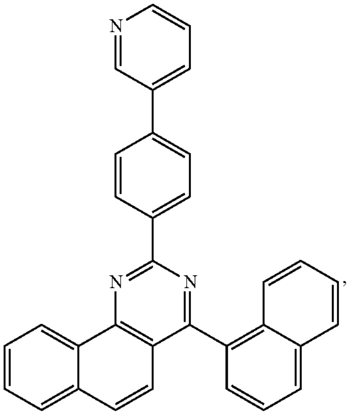
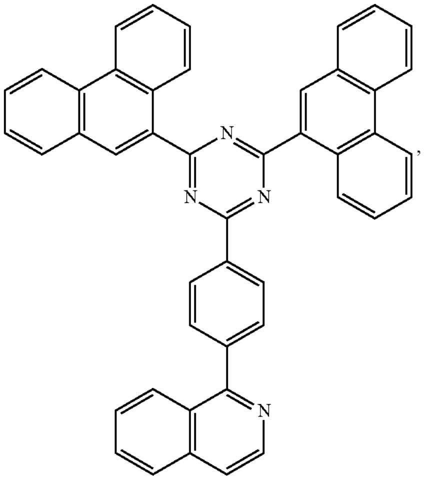
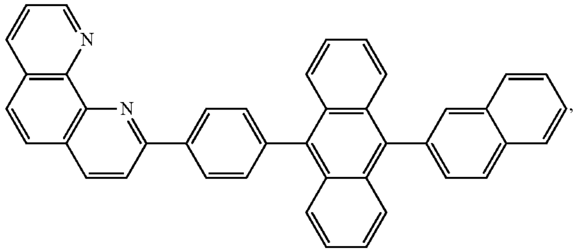
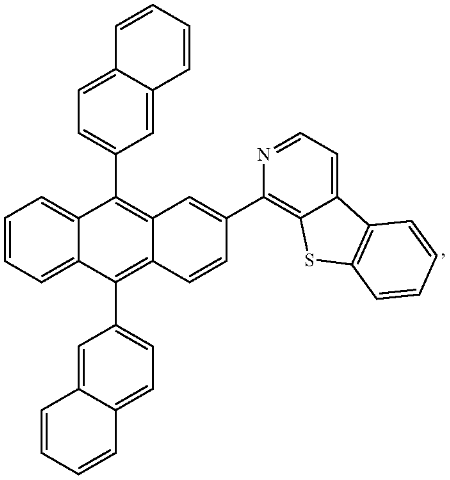
-continued
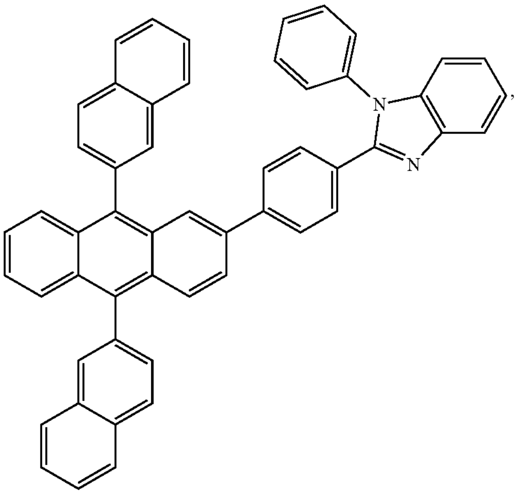
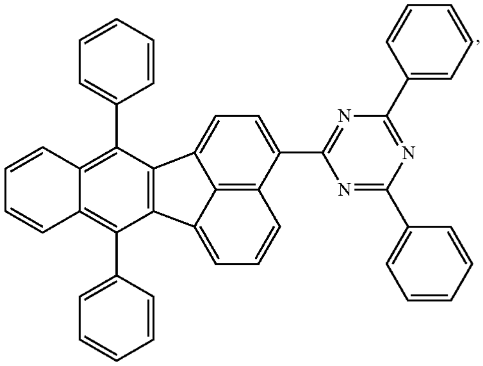
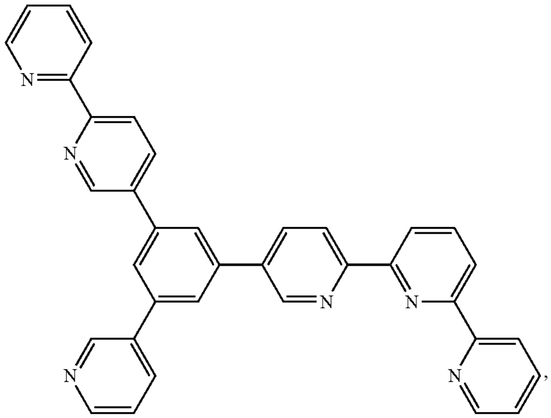

-continued
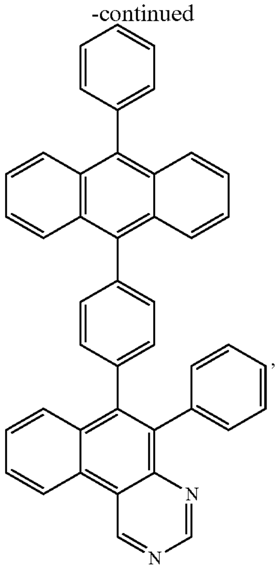
,
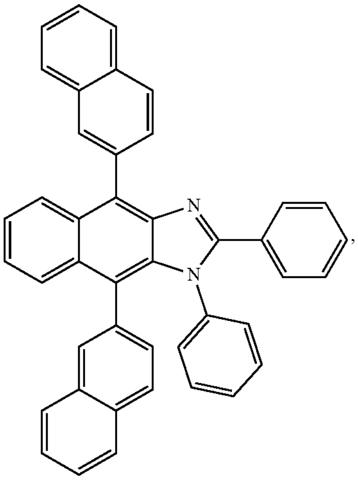
,
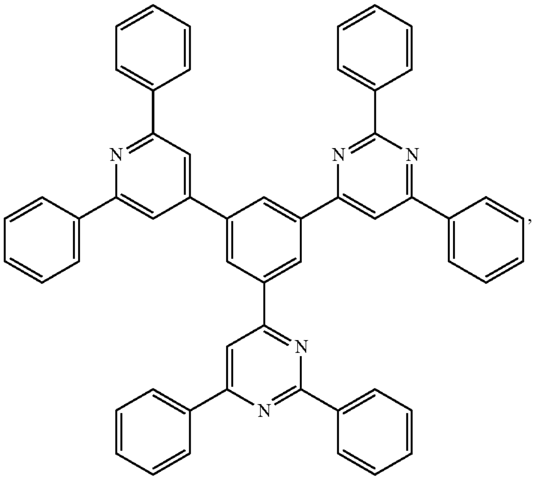
,
-continued
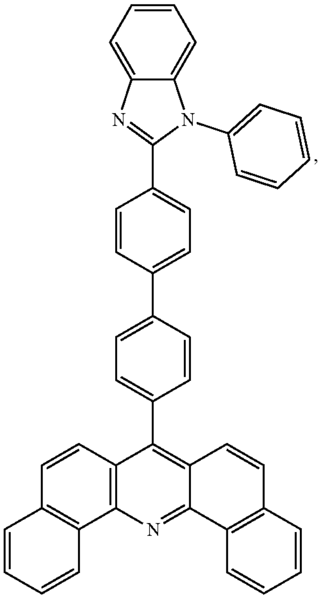
,
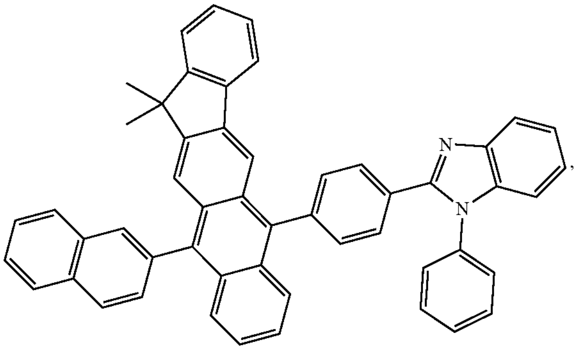
,
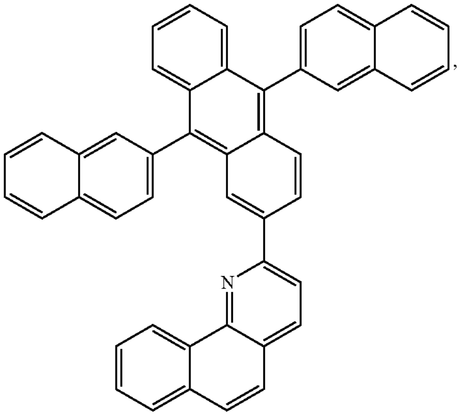
,
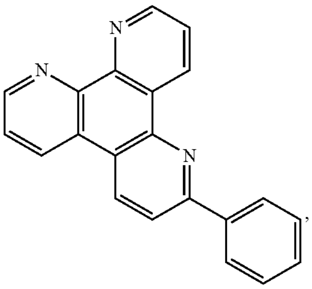
, -continued
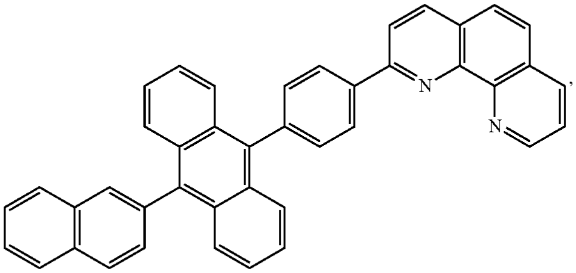,
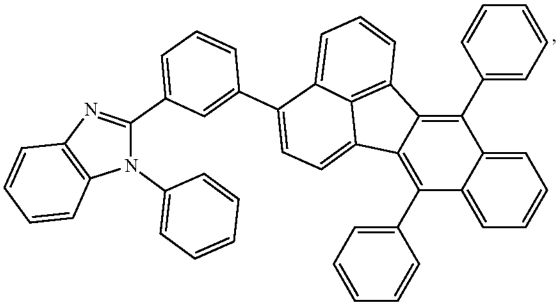,
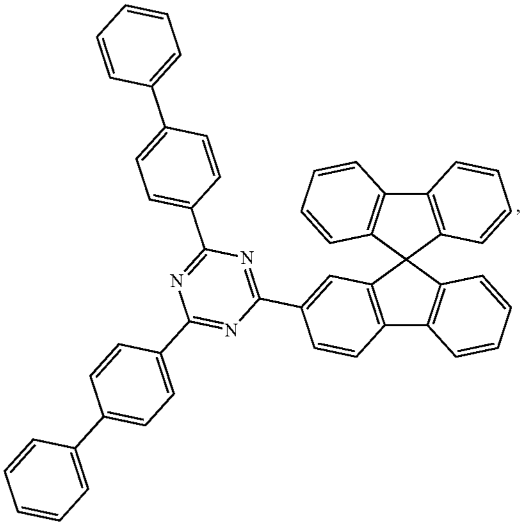,
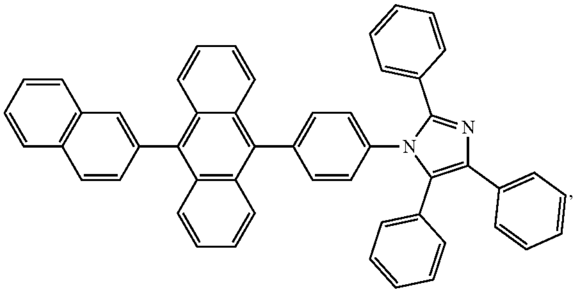,
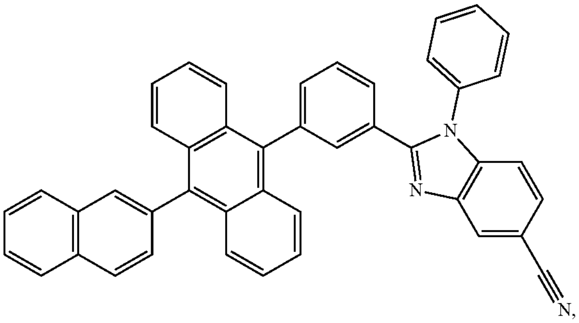,
-continued
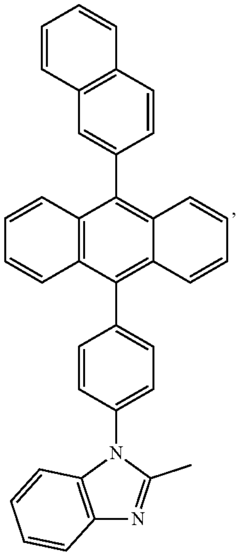,
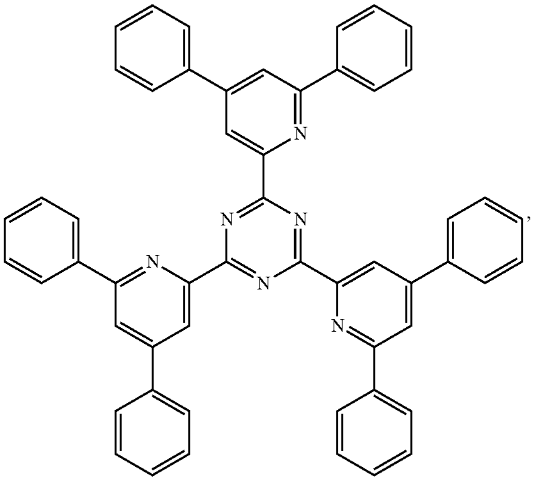,
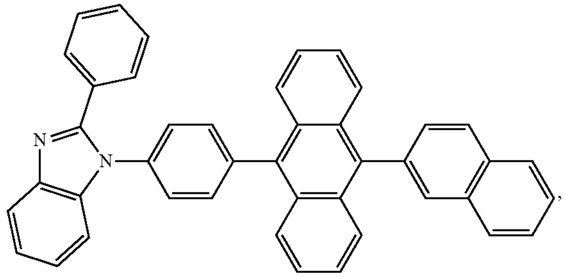,
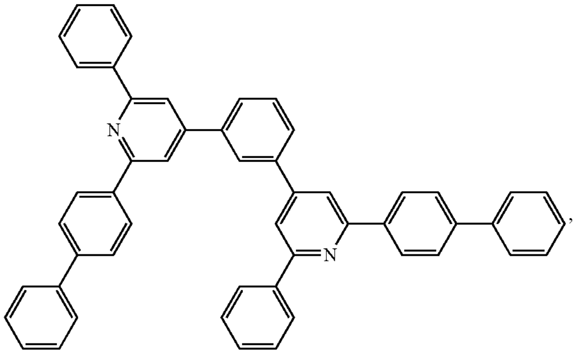, -continued

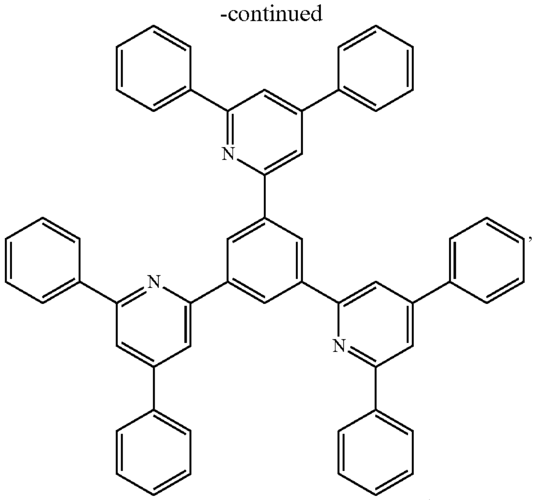

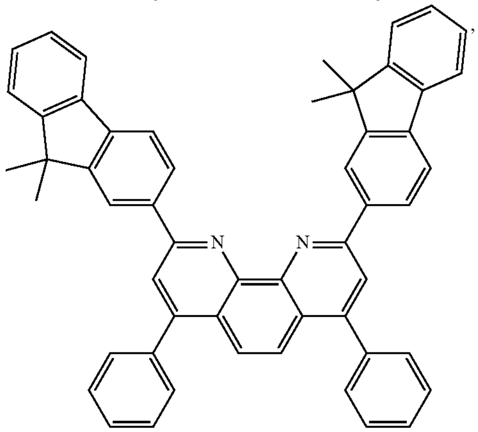

and

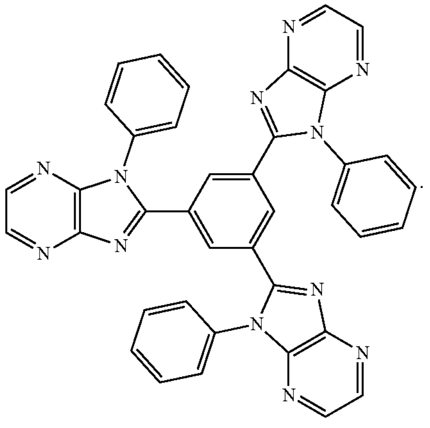

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. The minimum amount of hydrogen of the compound being deuterated is selected from the group consisting of 30%, 40%, 50%, 60%, 70%, 80%, 90%, 95%, 99%, and 100%. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

E. Experimental Section

Synthesis of ETL1

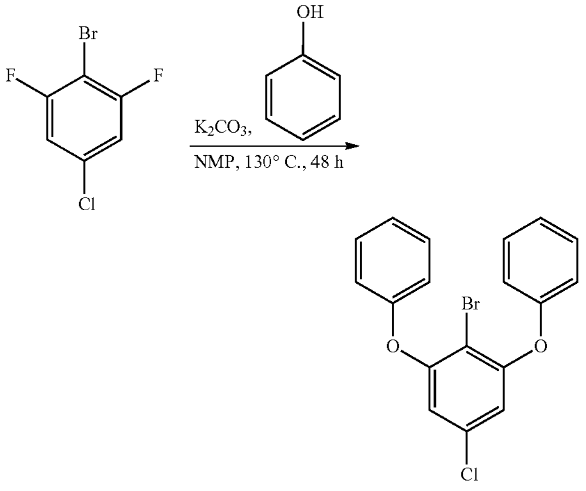

((2-bromo-5-chloro-1,3-phenylene)bis(oxy))dibenzene

To a round bottom flask was added 2-bromo-5-chloro-1,3-difluorobenzene (25.0 g, 110 mmol, 1.0 eq) and 250 ml of NMP. To this, phenol (41.38 g, 440 mmol, 4.0 eq) and potassium carbonate (60.77 g, 440 mmol, 4.0 eq) were added at room temperature. The reaction mixture was heated to 130° C. and allowed to stir for 48 hours. The reaction was cooled to room temperature and was put in an ice bath. With stirring, 250 mL of water was added over a period of 30 minutes causing a white precipitate to appear. The whole reaction mixture was then filtered through a sintered funnel to collect a colorless solid. The solid was re-crystallised in ethyl acetate (70 mL) by heating to 80° C., then the mixture was allowed to cool to 50° C. and aged at that temperature for 3 hours. The mixture was then cooled to room temperature and the white crystalline solid was filtered off. This procedure was repeated on the mother liquor, collectively giving a colorless crystalline ((2-bromo-5-chloro-1,3-phenylene)bis(oxy))dibenzene, 26.0 g (63% yield). $^1$H-NMR (396 MHz, CHLOROFORM-D) δ 7.50 (t, J=11.8 Hz, 4H), 7.35 (d, J=23.0 Hz, 2H), 7.20 (s, 4H), 6.74 (s, 2H).

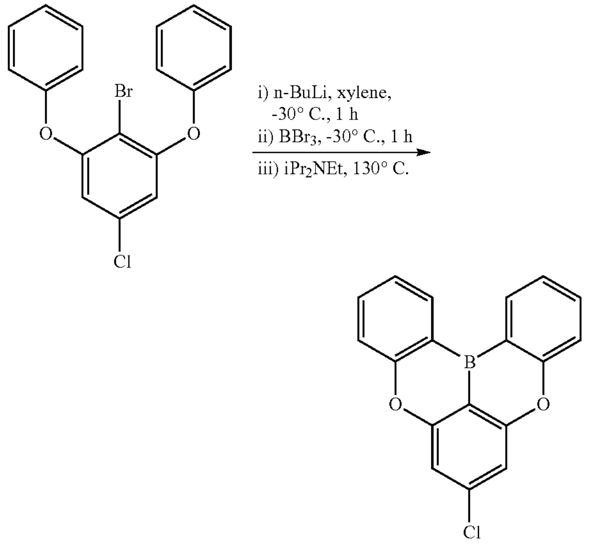

7-chloro-5,9-dioxa-13b-boranaphtho[3,2,1-de]anthracene ((2-bromo-5-chloro-1,3-phenylene)bis(oxy))dibenzene (6.00 g, 1.0 eq, 15.97 mmol) in a 250 mL RBF was put under a nitrogen atmosphere by Schlenk technique 3-5 times before then being diluted with xylene (90 mL, 15 volumes) via syringe, giving a translucent pale yellow solution. The mixture was cooled to −35° C. via an acetone bath sustained by a chiller. At temperature, $^n$BuLi in hexane (8.67 mL, 2.21 M, 1.2 eq, 19.17 mmol) was added slowly to the solution via syringe. The mixture was allowed to warm up to room temperature then stirred for 1 hour. The mixture was cooled to −40° C., then neat $BBr_3$ (~5 g, ~1.92 mL, 1.3 eq, 19.97 mmol) was added dropwise via syringe. After full addition, the mixture was allowed to warm up to room temperature then stirred for a 1 hour. The mixture was cooled down to −5° C., diisopropylethylamine (5.56 mL, 2.0 eq, 31.94 mmol) was added to the mixture dropwise via syringe. The mixture was heated to 130° C. for 3 hours. The mixture was cooled to 0° C. then quenched with saturated NaOAc solution (60 mL, 10 volumes). The precipitation was collected by suction-filtration, which was then washed with water (60 mL, 10 volumes), methanol (60 mL, 10 volumes), and heptane (60 mL, 10 volumes), to yield 7-chloro-5,9-dioxa-13b-boranaphtho[3,2,1-de]anthracene as a white fluffy solid (1.81 g, 96% purity, 35.9% yield). $^1$H-NMR (396 MHz, CHLOROFORM-D) δ 8.70 (d, J=7.9 Hz, 2H), 7.75 (t, J=7.9 Hz, 2H), 7.56 (d, J=8.5 Hz, 2H), 7.43 (t, J=7.3 Hz, 2H), 7.28 (s, 2H).

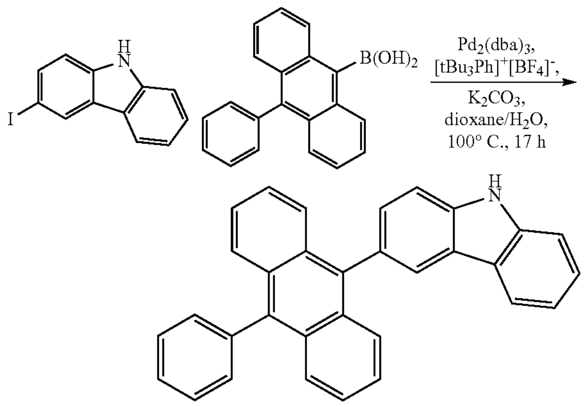

3-(10-phenylanthracen-9-yl)-9H-carbazole

In a 500 mL round bottomed flask, a solution of potassium carbonate (14.15 g, 103 mmol, 3 equiv) in dioxane (180 mL) and water (50 mL) was degassed for 30 minutes by bubbling through with nitrogen. To this (10-phenylanthracen-9-yl) boronic acid (15.3 g, 51.2 mmol, 1.5 eq), 3-iodo-9H-carbazole (10.0 g, 34.1 mmol, 1.0 eq), $Pd_2(dba)_3$ (0.63 g, 0.683 mmol, 0.025 eq) and tri-tert-butylphosphonium tetrafluoroborate (0.5 g, 171 mmol) were added and degassed for another 15 minutes. Finally, the round bottom flask was applied vacuum and charged with nitrogen three times and this reaction mixture was then heated to 90° C. for two days. The reaction mixture was allowed to cool to room temperature and then the whole mixture was filtered using a sintered funnel. The solids were transferred to a 500 mL beaker and methanol (300 mL) was added and stirred at room temperature for 30 minutes. The solids were then filtered off and further washed with diethyl ether (10 mL). Analysis of this solid showed ~10% of 3-iodo-9H-carbazole remaining giving 10.5 g (73% yield) of 3-(10-phenylanthracen-9-yl)-9H-carbazole. $^1$H-NMR (396 MHz, CHLOROFORM-D) δ 8.29 (s, 1H), 8.18 (s, 1H) 8.03 (d, 1H), 7.77 (d, 2H), 7.71 (dd, 2H), 7.58-7.68 (m, 3H), 7.43-7.58 (m, 6H) 7.27-7.37 (m, 4H), 7.20-7.28 (m, 1H) ppm.

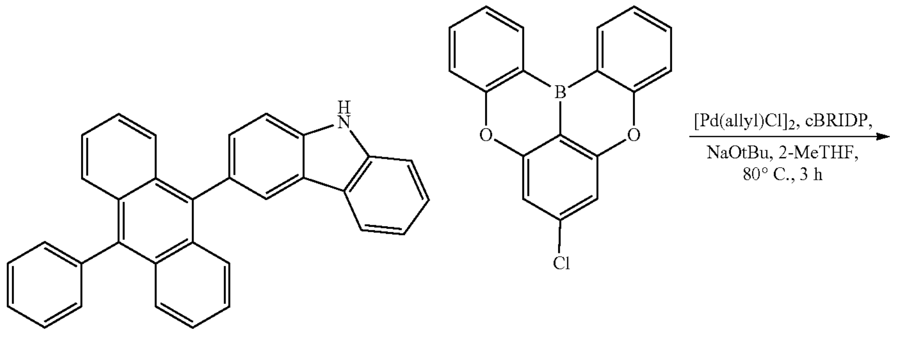

-continued

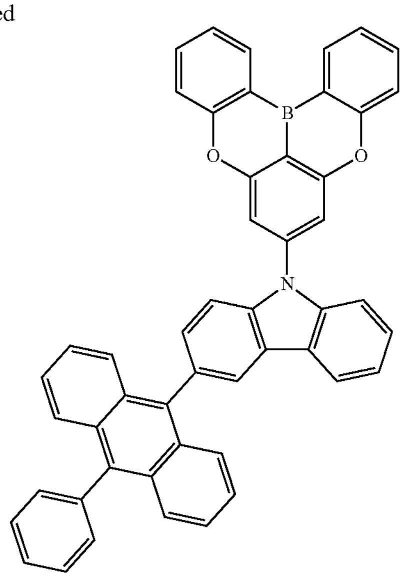

9-(5,9-dioxa-13b-boranaphtho[3,2,1-de]anthracen-7-yl)-3-(10-phenylanthracen-9-yl)-9H-carbazole 3-(10-phenylanthracen-9-yl)-9H-carbazole (4.75 g, 1.0 eq, 11.32 mmol), 7-chloro-5,9-dioxa-13b-boranaphtho[3,2,1-de]anthracene (4.31 g, 1.25 eq, 14.15 mmol) and sodium tert-butoxide (3.26 g, 3 eq, 33.97 mmol) in a 1 L three-necked round bottom flask fitted with a condenser was put under a nitrogen atmosphere by Schlenk technique 3-5 times before then being diluted with degassed 2-MeTHF (228 mL, 48 volumes) via syringe. Separately, allylpalladium(II) chloride dimer (103.57 mg, 2.5 mol %, 0.28 mmol) and cBRIDP (399.10 mg, 10 mol %, 1.13 mmol) in a 25 mL round bottom flask was put under a nitrogen atmosphere by Schlenk technique 3-5 times, before then being diluted with degassed 2-MeTHF (4.75 mL, 1 volume) via syringe. The catalyst solution was cannulated into the reactant's solution, rinsing with degassed 2-MeTHF (2×2.40 mL, 1 volume total). The mixture was heated to 80° C. for 3 hours. The mixture was allowed to cool to room temperature then quenched with saturated aqueous $NH_4Cl$ solution (50 mL, 10 volumes) and stirred for 30 minutes. The biphasic solution was separated, with the aqueous back extracted with EtOAc (2×50 mL, 20 volumes total). Combined organics were washed with brine (2×50 mL, 20 volumes total), dried with $Na_2SO_4$, filtered, and concentrated to dryness to afford a beige powder (9.27 g, 84.2% purity, quantitative crude).

The material was then purified by a combination of trituration in methyl-tertbutyl ether and flash column chromatography followed by heptane and dichloromethane trituration to yield a 1$^{st}$ batch of 2.25 g (99.6% purity) or desired product. The combined mother liquors from dcm trituration of the 1$^{st}$ batch were then added dropwise to heptane, resulting in precipitation. This precipitate was collected by vacuum filtration, washing further with heptane to yield a 2$^{nd}$ batch of 1.43 g (98.0% purity) of desired product. During filtration, more precipitation occurred in the mother liquor. This precipitate was collected separately by vacuum filtration to yield a 3$^{rd}$ batch of 1.51 g (98.4% purity) of desired product.

The three batches were combined in a 1 L round bottom flask with toluene (500 mL) and pyridine (27 mL) and heated to 100° C. The mixture was allowed to cool slightly then filtered through filter paper by hot gravity filtration. The resulting homogeneous solution was concentrated to dryness then re-suspended in 300 mL of toluene and heated to 100° C. under nitrogen atmosphere until homogeneous. The solution was then cooled to room temperature, concentrated to approximately 100 mL total volume, then allowed to set at room temperature until solids precipitated. This precipitate was collected by vacuum filtration. The filter cake was then transferred to a 250 mL round bottom flask and suspended in 100 mL of diethyl ether and stirred for 1 h, then again collected by vacuum filtration and dried in a vacuum oven, ultimately yielding 3.32 g of 9-(5,9-dioxa-13b-boranaphtho[3,2,1-de]anthracen-7-yl)-3-(10-phenylanthracen-9-yl)-9H-carbazole at 98.84% purity. $^1$H-NMR (396 MHz, CHLOROFORM-D) δ 8.78 (d, J=6.1 Hz, 2H), 8.30 (s, 1H), 8.14 (d, J=7.9 Hz, 1H), 7.95 (d, J=8.5 Hz, 1H), 7.85-7.72 (m, 7H), 7.66-7.57 (m, 8H), 7.55-7.51 (m, 3H), 7.47 (t, J=7.3 Hz, 2H), 7.38-7.33 (m, 5H).

Materials in the Devices:

Compound 1

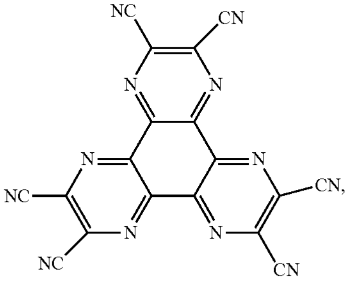

-continued

Compound 2

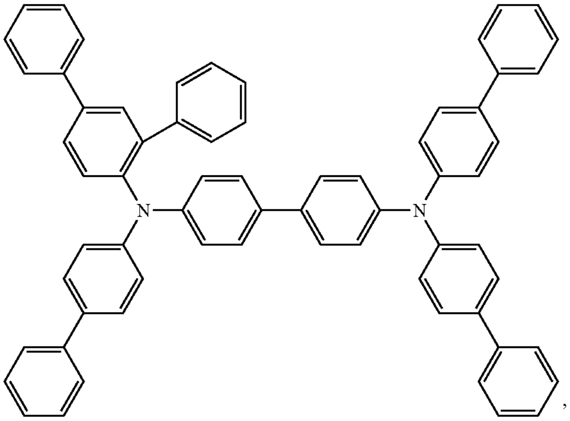

,

Compound 3

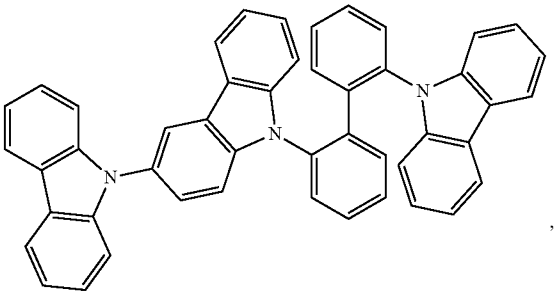

,

Compound 4

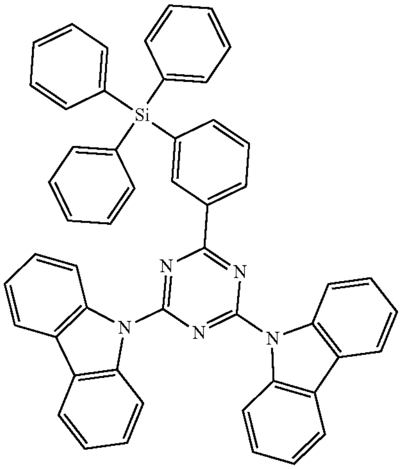

,

-continued

Compound 5

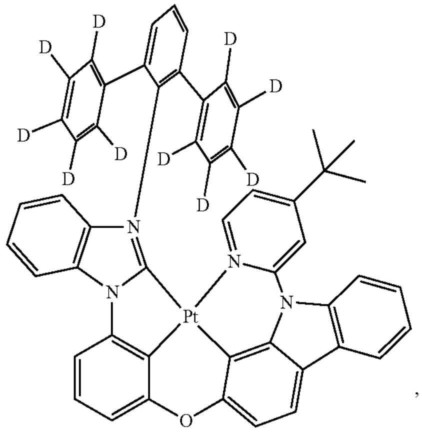

,

Compound 6

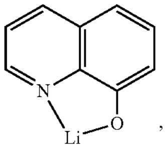

, and

ETL1

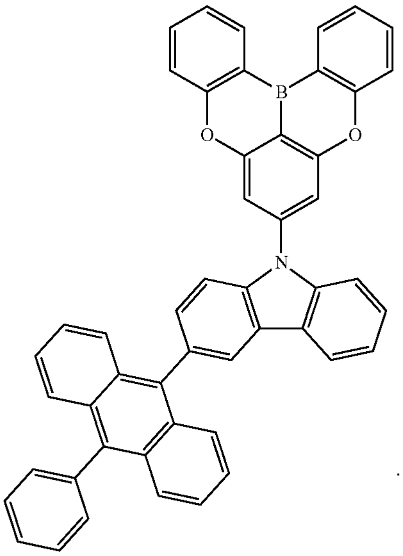

.

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

The devices in Tables 1 were fabricated in high vacuum ($<10^{-7}$ Torr) by thermal evaporation. The anode electrode was 750 Å of indium tin oxide (ITO). The device example had organic layers consisting of, sequentially, from the ITO surface, 100 Å of Compound 1 (HIL), 250 Å of Compound 2 (HTL), 50 Å of Compound 3 (EBL), 300 Å of Compound 3 doped with 50% of Compound 4 and 12% of Compound 5 (EML), 50 Å of Compound 4 (BL), 300 Å of Compound 5 doped with 60% of ETL1, 10 Å of (EIL) followed by 1,000 Å of Al (Cathode). All devices were encapsulated with a glass lid sealed with an epoxy resin in a nitrogen glove box (<1 ppm of $H_2O$ and $O_2$) immediately after fabrication with a moisture getter incorporated inside the package. Doping percentages are in volume percent.

TABLE 1

| Spectral information, EQE, and voltage of OLEDs made with ETL1 | | | | | | |
|---|---|---|---|---|---|---|
| | | Spectral | | | At 10 mA/cm$^2$ | |
| | | 1931 CIE | | $\lambda_{max}$ | Voltage | EQE |
| Device | EIL | x | y | [nm] | [V] | [%] |
| Device 1 | Compound 6 | 0.140 | 0.184 | 463 | 4.7 | 16.4 |
| Device 2 | Yb | 0.140 | 0.182 | 463 | 4.0 | 16.3 |

Device 1 and 2 are the first examples of an OLED featuring a compound like ETL1 in them. The color, efficiency, and voltage of the OLED devices is representative of what state of the art blue PHOLED materials can achieve. Device 1 results in a higher operating voltage compared to Device 2 because of the larger energetic mismatch between the energy of the LUMO of ETL1 and Liq creating a larger electron injection barrier with the high work function Liq. This operating voltage can be reduced when Yb is used as the injection layer in Device 2 without sacrificing any other device metrics. This is because Yb is a lower work function material that reduces the electron injection barrier into the ETL containing ETL1.

These results support that ETL1 can be utilized as a co-dopant in the ETL of an OLED and is useful when utilized with lower work function EIL materials like Yb.

TABLE 2

| DFT calculated energy levels. | | | | | | |
|---|---|---|---|---|---|---|
| Inventive Compound | Structure | Exp $T_1$ (nm) | $T_1$ (nm) | $S_1$ (nm) | HOMO (eV) | LUMO (eV) |
| Inventive Compound 1 ETL1 | 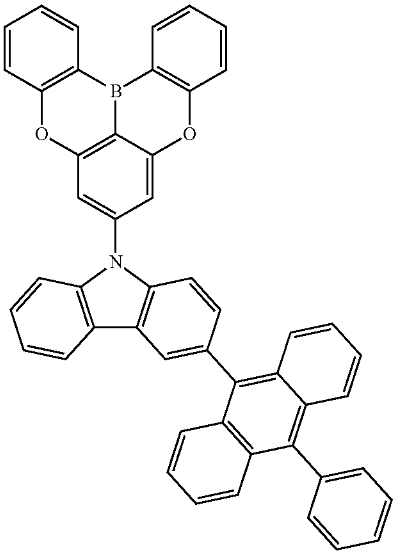 [SMILES: c1ccc(-c2c3ccccc3c(-c3ccc4c(c3)c3ccccc3n4-c3cc4c5c(c3)Oc3ccccc3B5c3ccccc3O4)c3ccccc23)cc1] | 439 | 714 | 406 | −5.25 | −1.94 |
| Inventive Compound 2 | 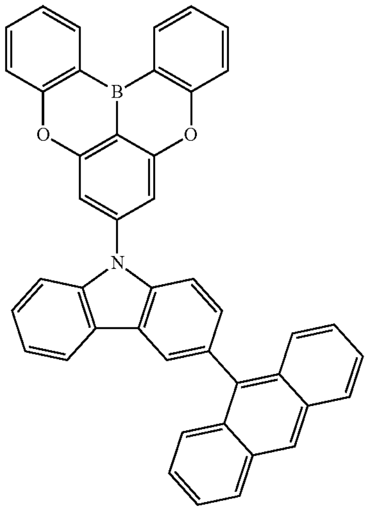 [SMILES: c1ccc2c(c1)Oc1cc(-n3c4ccccc4c4cc(-c5c6ccccc6cc6ccccc56)ccc43)cc3c1B2c1ccccc1O3] | | 701 | 401 | −5.27 | −1.89 |

TABLE 2-continued
DFT calculated energy levels.
| Inventive Compound | Structure | Exp $T_1$ (nm) | $T_1$ (nm) | $S_1$ (nm) | HOMO (eV) | LUMO (eV) |
|---|---|---|---|---|---|---|
| Inventive Compound 3 | 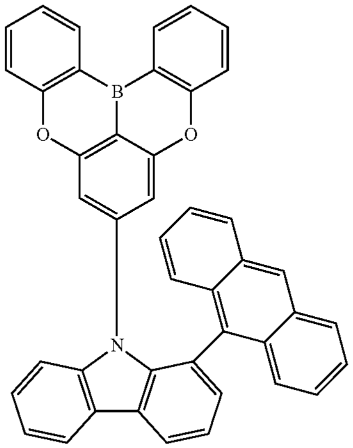 [SMILES: c1ccc2c(c1)Oc1cc(-n3c4ccccc4c4cccc(-c5c6ccccc6cc6ccccc56)c43)cc3c1B2c1ccccc1O3] | | 707 | 424 | −5.29 | −1.88 |
| Inventive Compound 4 | 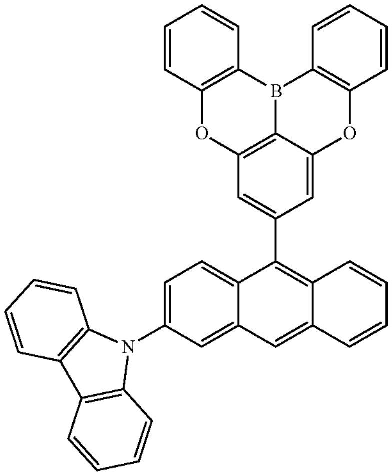 [SMILES: c1ccc2c(c1)Oc1cc(-c3c4ccccc4cc4cc(-n5c6ccccc6c6ccccc65)ccc34)cc3c1B2c1ccccc1O3] | | 707 | 421 | −5.32 | −1.95 |
| Inventive Compound 5 | 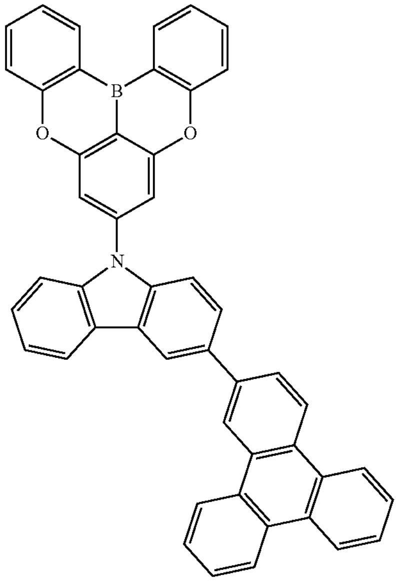 [SMILES: c1ccc2c(c1)Oc1cc(-n3c4ccccc4c4cc(-c5ccc6c7ccccc7c7ccccc7c6c5)ccc43)cc3c1B2c1ccccc1O3] | | 451 | 397 | −5.44 | −1.89 |

TABLE 2-continued
| DFT calculated energy levels. | | | | | | |
|---|---|---|---|---|---|---|
| Inventive Compound | Structure | Exp $T_1$ (nm) | $T_1$ (nm) | $S_1$ (nm) | HOMO (eV) | LUMO (eV) |
| Inventive Compound 6 | 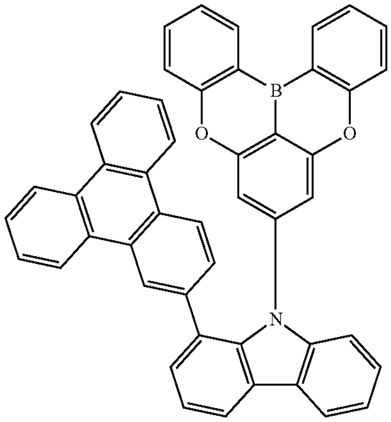 [SMILES: c1ccc2c(c1)Oc1cc(-n3c4ccccc4c4cccc(-c5ccc6c7ccccc7c7ccccc7c6c5)c43)cc3c1B2c1ccccc1O3] | | 443 | 387 | −5.55 | −1.87 |
| Inventive Compound 7 | 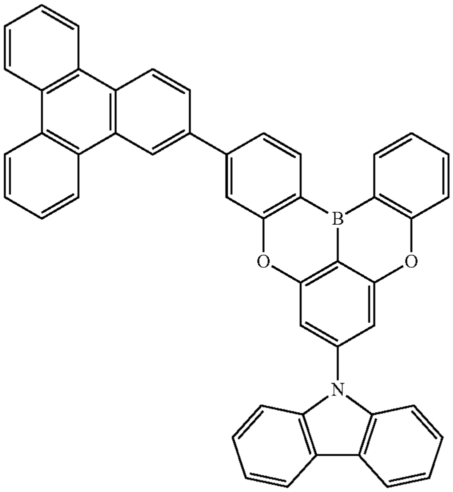 [SMILES: c1ccc2c(c1)Oc1cc(-n3c4ccccc4c4ccccc43)cc3c1B2c1ccc(-c2ccc4c5ccccc5c5ccccc5c4c2)cc1O3] | | 458 | 396 | −5.58 | −2.00 |
| Inventive Compound 8 | 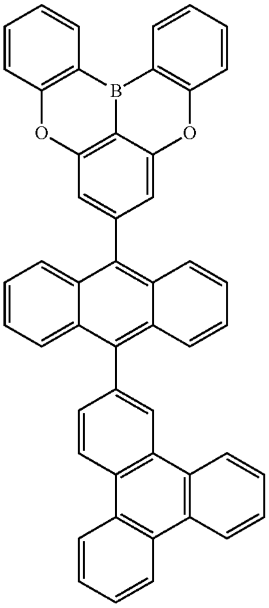 [SMILES: c1ccc2c(c1)Oc1cc(-c3c4ccccc4c(-c4ccc5c6ccccc6c6ccccc6c5c4)c4ccccc34)cc3c1B2c1ccccc1O3] | | 714 | 405 | −5.34 | −1.86 |

TABLE 2-continued
DFT calculated energy levels.
| Inventive Compound | Structure | Exp $T_1$ (nm) | $T_1$ (nm) | $S_1$ (nm) | HOMO (eV) | LUMO (eV) |
|---|---|---|---|---|---|---|
| Inventive Compound 9 | 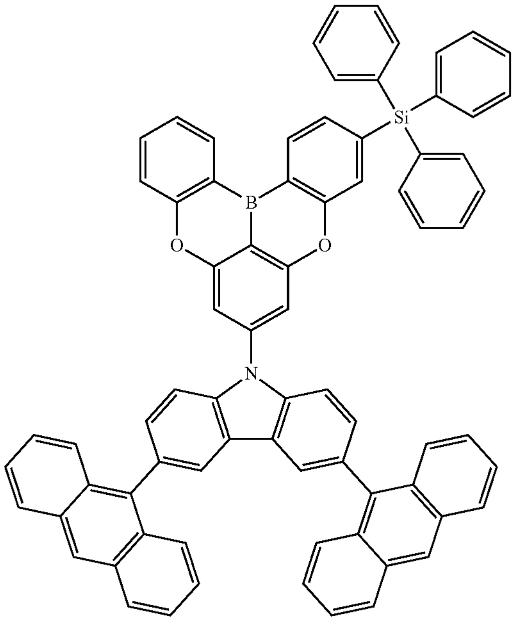 [SMILES: c1ccc([Si](c2ccccc2)(c2ccccc2)c2ccc3c(c2)Oc2cc(-n4c5ccc(-c6c7ccccc7cc7ccccc67)cc5c5cc(-c6c7ccccc7cc7ccccc67)ccc54)cc4c2B3c2ccccc2O4)cc1] | | 701 | 412 | −5.26 | −1.97 |
| Inventive Compound 10 | 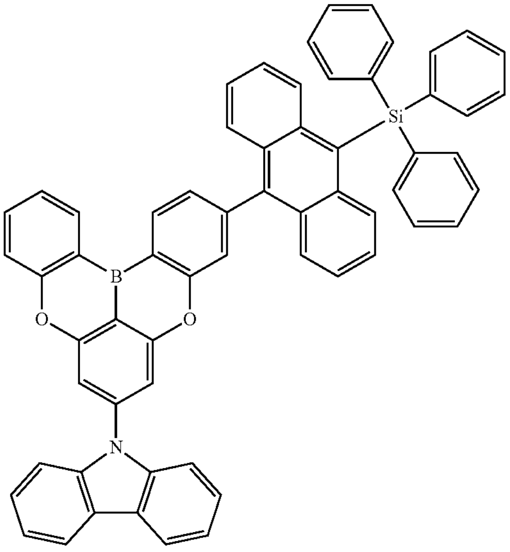 [SMILES: c1ccc([Si](c2ccccc2)(c2ccccc2)c2c3ccccc3c(-c3ccc4c(c3)Oc3cc(-n5c6ccccc6c6ccccc65)cc5c3B4c3ccccc3O5)c3ccccc23)cc1] | | 726 | 413 | −5.38 | −1.97 |

The computed data in Table 2 were calculated using density functional theory (DFT) using Gaussian 16, Revision B.01, time-dependent density functional theory (TDDFT) at the ground state geometries, with the B3LYP functional employing a 6-31G* basis set and THF solvent. Electron reorganization energies shown in Table 3 were calculated using Q-Chem version 5.4.1 with the B3LYP functional employing a LACVP* basis set.

As shown in Table 3, ETL has a low calculated electron reorganization energy which should lead to large electron mobility.

TABLE 3

DFT calculated electron reorganization energies.

| Inventive Compound | Structure | Electron Reorganization Energy (eV) |
|---|---|---|
| Inventive Compound 1 ETL1 | 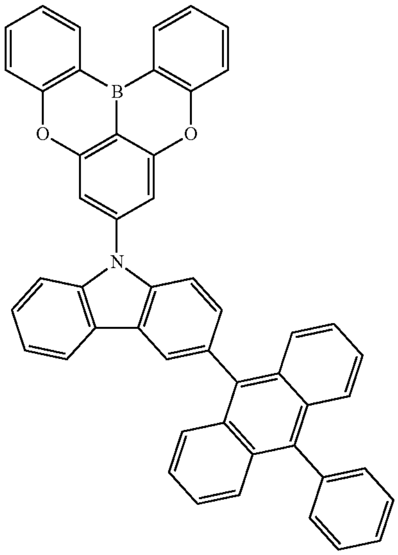 [SMILES: c1ccc(-c2c3ccccc3c(-c3ccc4c(c3)c3ccccc3n4-c3cc4c5c(c3)Oc3ccccc3B5c3ccccc3O4)c3ccccc23)cc1] | 0.094 |

The calculations obtained with the above-identified DFT functional set and basis set are theoretical. Computational composite protocols, such as Gaussian with the CEP-31G basis set used herein, rely on the assumption that electronic effects are additive and, therefore, larger basis sets can be used to extrapolate to the complete basis set (CBS) limit. However, when the goal of a study is to understand variations in HOMO, LUMO, $S_1$, $T_1$, bond dissociation energies, etc. over a series of structurally-related compounds, the additive effects are expected to be similar. Accordingly, while absolute errors from using the B3LYP may be significant compared to other computational methods, the relative differences between the HOMO, LUMO, Si, $T_1$, and bond dissociation energy values calculated with B3LYP protocol are expected to reproduce experiment quite well. See, e.g., Hong et al., *Chem. Mater.* 2016, 28, 5791-98, 5792-93 and Supplemental Information (discussing the reliability of DFT calculations in the context of OLED materials). Moreover, with respect to iridium or platinum complexes that are useful in the OLED art, the data obtained from DFT calculations correlates very well to actual experimental data. See Tavasli et al., *J. Mater. Chem.* 2012, 22, 6419-29, 6422 (Table 3) (showing DFT calculations closely correlating with actual data for a variety of emissive complexes); Morello, G. R., *J. Mol. Model.* 2017, 23:174 (studying of a variety of DFT functional sets and basis sets and concluding the combination of B3LYP and CEP-31G is particularly accurate for emissive complexes).

What is claimed is:

1. A compound comprising at least one $W^1$, one $W^2$, and one $W^3$;

wherein $W^1$ is a structure of Formula I:

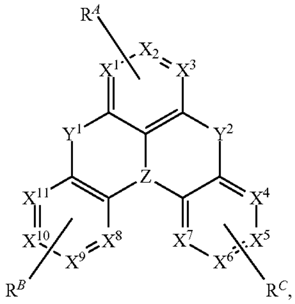

wherein $X^1$-$X^{11}$ are each independently C or N;

wherein $Y^1$ and $Y^2$ are each independently selected from the group consisting of BR, BRR', NR, PR, P(O)R, O, S, Se, C═O, C═S, C═Se, C═NR, C═CRR', S═O, $SO_2$, CR, CRR', SiRR', and GeRR';

wherein Z is selected from the group consisting of B, Al, Ga, PO, and N;

wherein $W^2$ is a structure of Formula II:

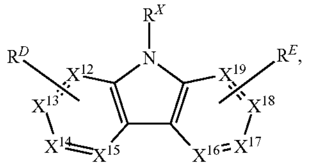

wherein $X^{12}$-$X^{19}$ are each independently C or N;

wherein $W^3$ is a structure of Formula III or Formula IV:

Formula III

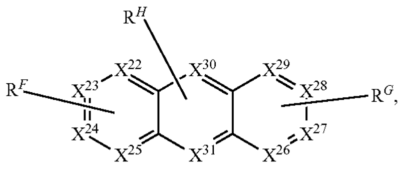

wherein $X^{22}$-$X^{31}$ are each independently C or N;

Formula IV

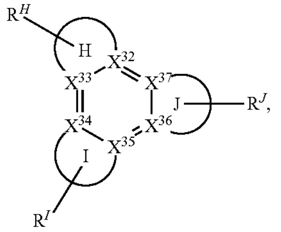

wherein $X^{32}$-$X^{37}$ are each independently C or N;

wherein $R^A$, $R^B$, $R^C$, $R^D$, $R^E$, $R^F$, $R^G$, $R^H$, $R^I$, $R^J$, and $R^K$ each independently represent mono to the maximum amount of substitution, or no substitution;

wherein each R, R', $R^A$, $R^B$, $R^C$, $R^D$, $R^E$, $R^F$, $R^G$, $R^H$, $R^I$, $R^J$, $R^K$, and $R^X$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein moieties I, J and K are each independently a monocyclic or fused polycyclic ring system comprised of one or more 5-membered or 6-membered carbocyclic or heterocyclic rings;

wherein any two substituents may be joined or fused to form a ring; and wherein in at least one $W^2$, no two or more $R^D$ or no two or more $R^E$ substituents are joined to form a ring;

wherein at least one $W^2$ does not have R joined to $R^D$ or $R^E$ to form a ring; and with the proviso that that the compound does not comprise one of the following structures:

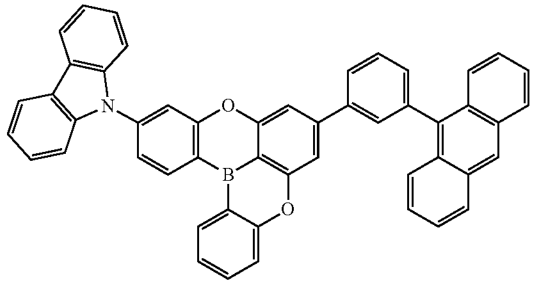

,

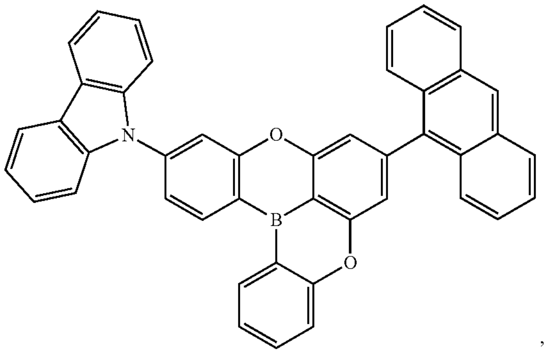

,

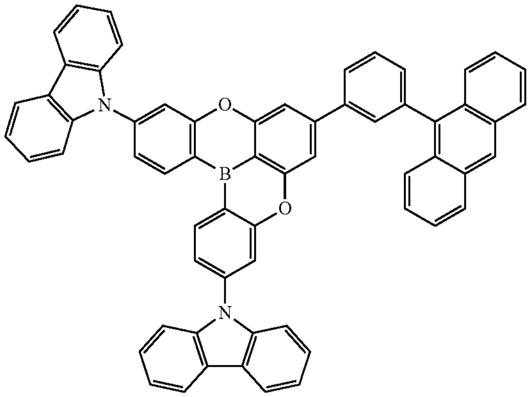

, or

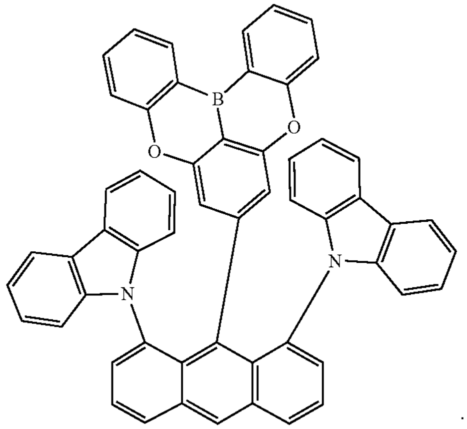

.

2. The compound of claim 1, wherein each R, $R^A$, $R^B$, $R^C$, $R^D$, $R^E$, $R^F$, $R^G$, $R^H$, $R^I$, $R^J$, and $R^K$ is independently a hydrogen or a substituent selected from the group consisting of deuterium, fluorine, alkyl, cycloalkyl, heteroalkyl, alkoxy, aryloxy, amino, silyl, boryl, germyl, alkenyl, cycloalkenyl, heteroalkenyl, aryl, heteroaryl, nitrile, isonitrile, sulfanyl, and combinations thereof.

3. The compound of claim 1, wherein all of $X^1$-$X^{11}$ are C or wherein at least one of $X^1$-$X^{11}$ is N; and/or wherein Z is B, Al, or N; and/or wherein at least one of $Y^1$ and $Y^2$ is O, S, or Se; and/or wherein all of $X^{12}$-$X^{19}$ are C or at least one of $X^{12}$-$X^{19}$ is N.

4. The compound of claim 1, wherein the compound comprises at least one $W^3$ which has a structure of Formula III; and/or wherein all of $X^{22}$-$X^{31}$ are C or at least one of $X^{22}$-$X^{31}$ is N.

5. The compound of claim 1, wherein the compound comprises at least one $W^3$ which has a structure of Formula IV; and/or wherein all of $X^{32}$-$X^{37}$ are C or at least one of $X^{32}$-$X^{37}$ is N; and/or wherein at least one of moieties I, J, and K comprises a 6-membered aromatic ring; and/or wherein at least one of moieties I, J, and K comprises a 5-membered aromatic ring.

6. The compound of claim 1, wherein the compound comprises at least one $W^3$ which has a structure of Formula IV, and wherein all of moieties I, J, and K are 6-membered aromatic carbocyclic rings.

7. The compound of claim 1, wherein the compound comprises at least two carbazole groups; and/or wherein the compound comprises a structure of Formula III and a structure of Formula IV.

8. The compound of claim 1, wherein the compound is selected from the group consisting of:

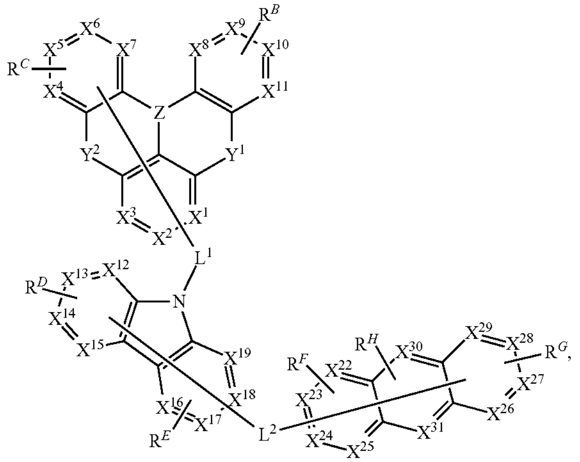

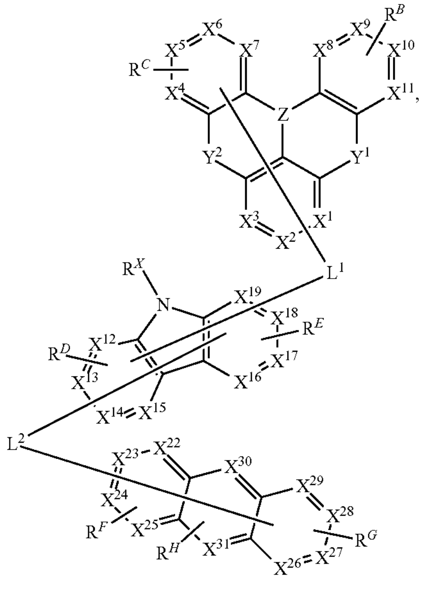

-continued

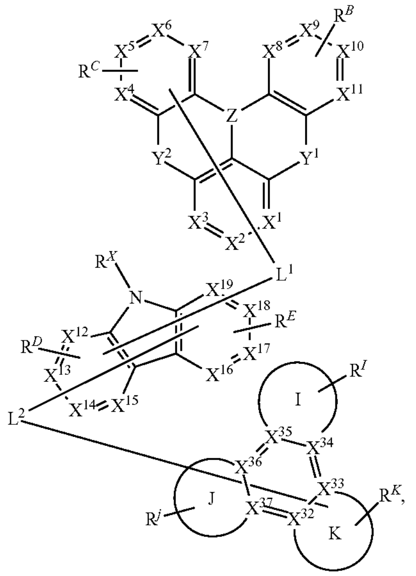

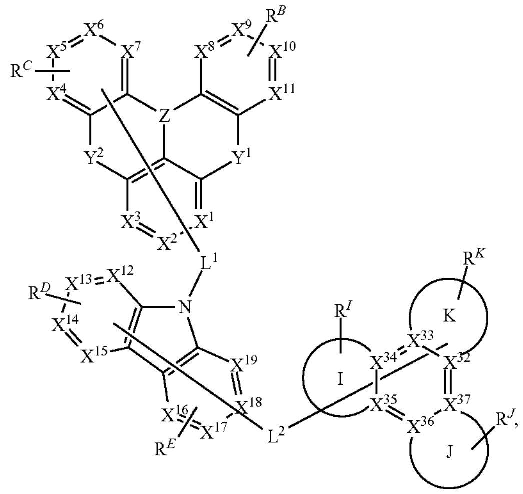

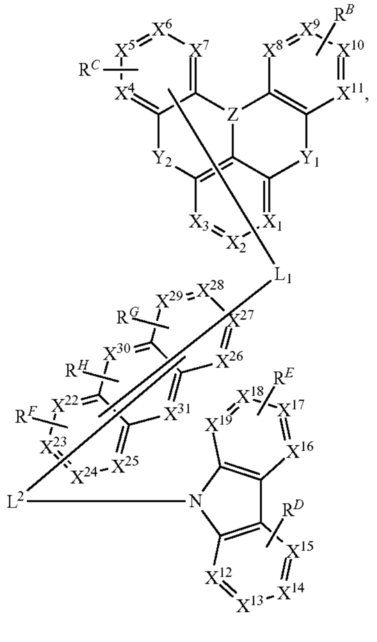

-continued
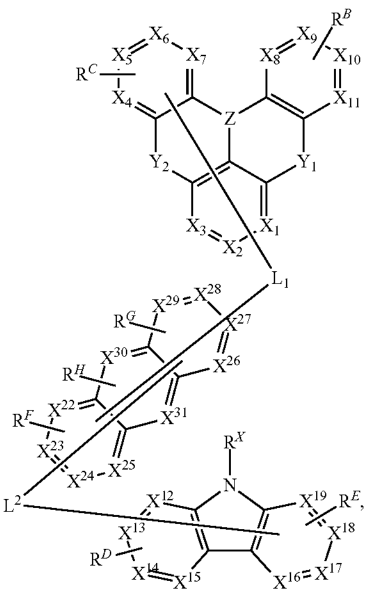
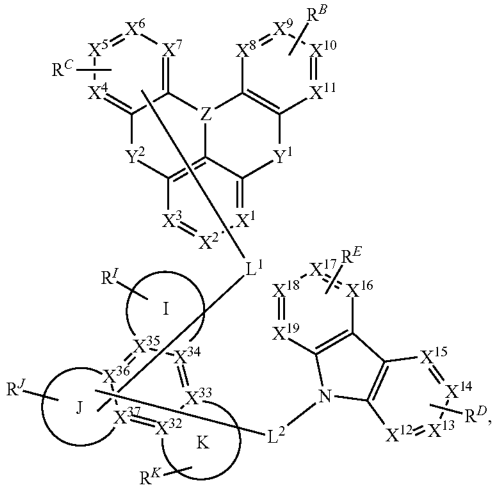
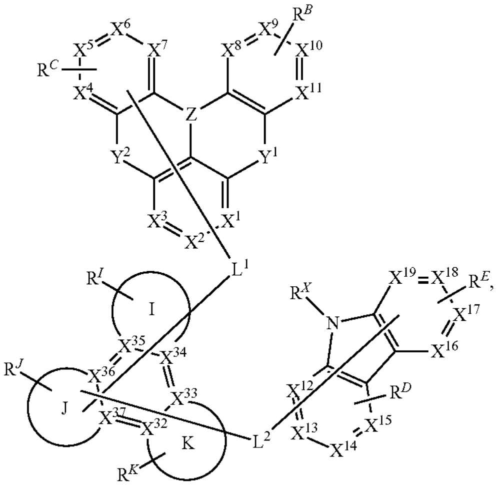
-continued
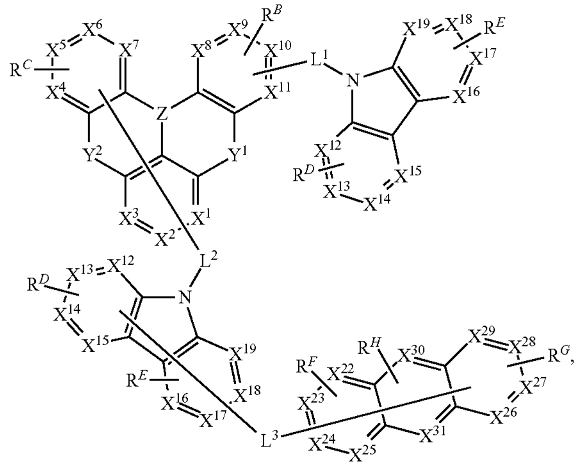
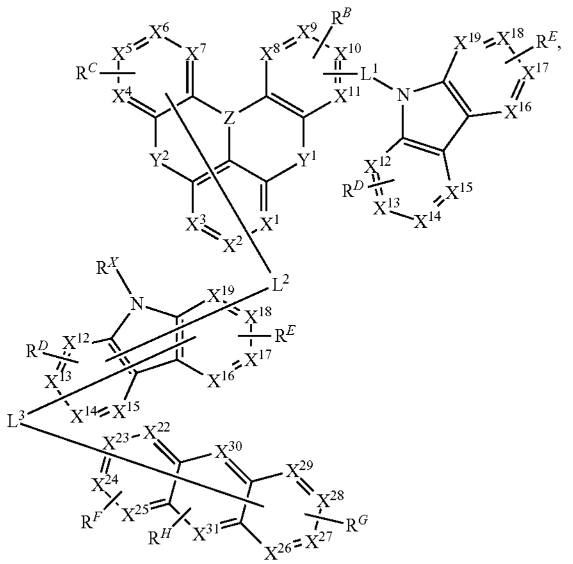
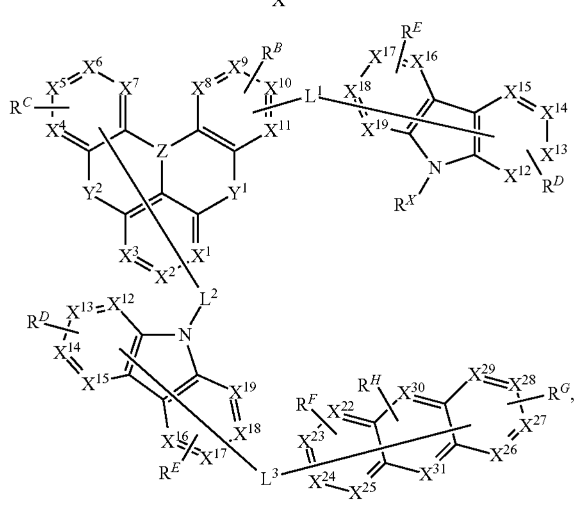

-continued
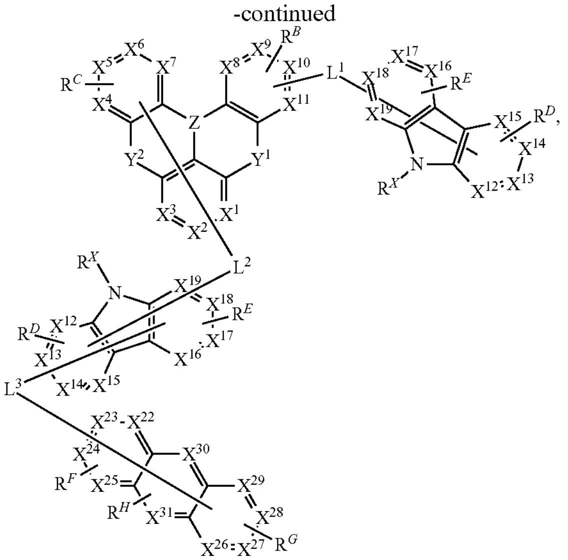
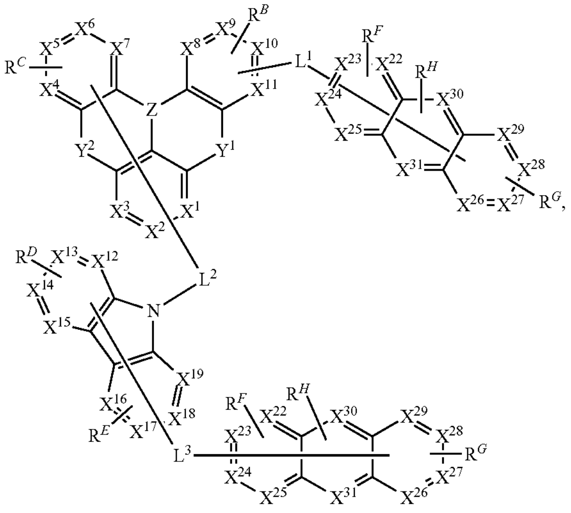
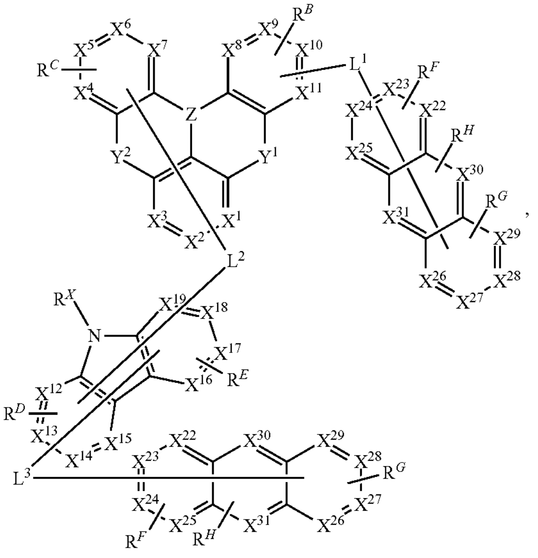
-continued
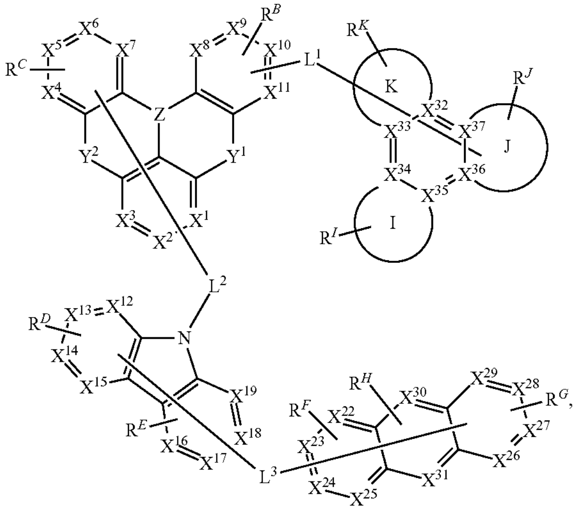
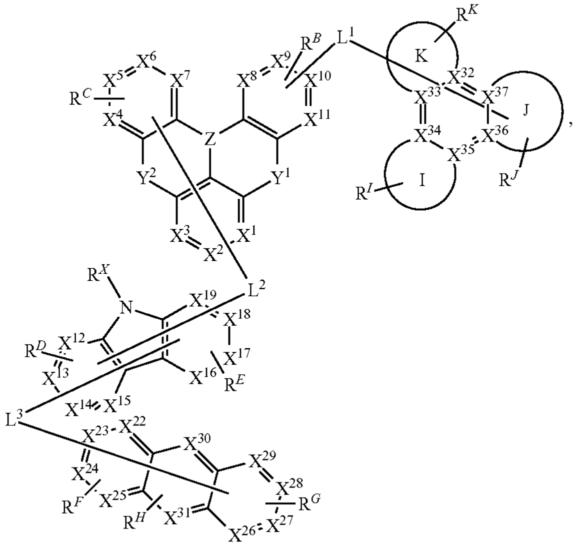
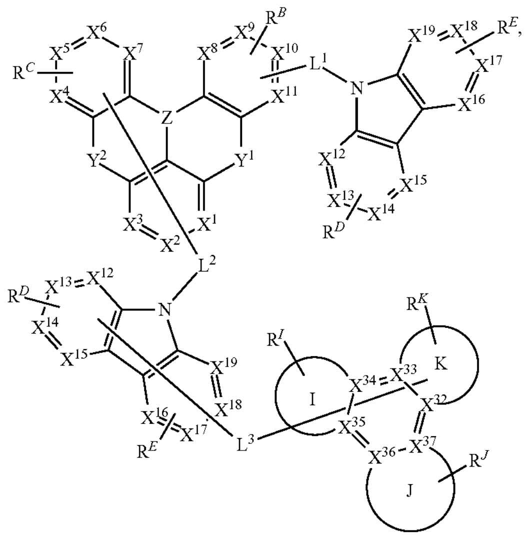

-continued
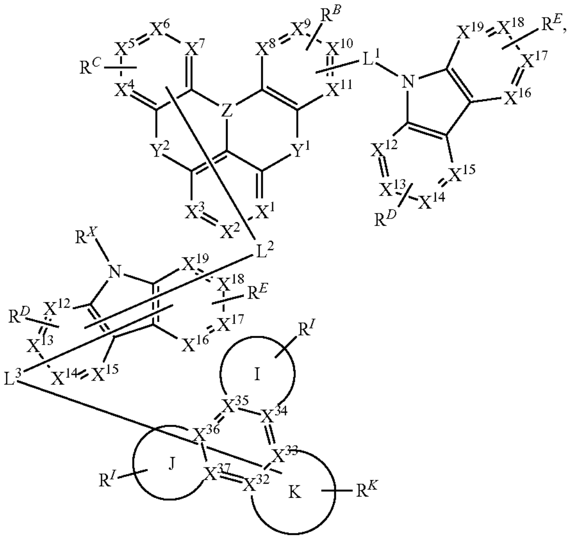
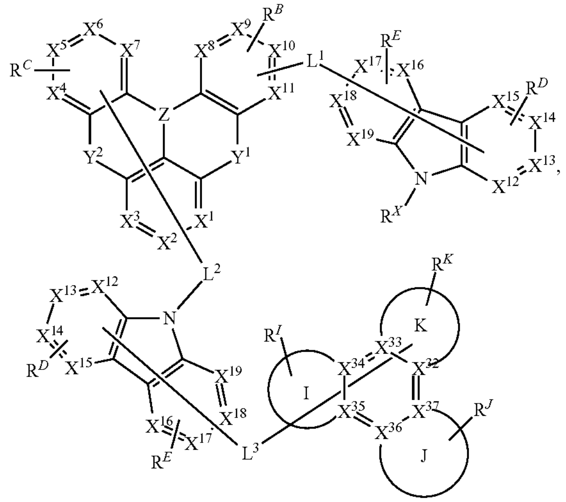
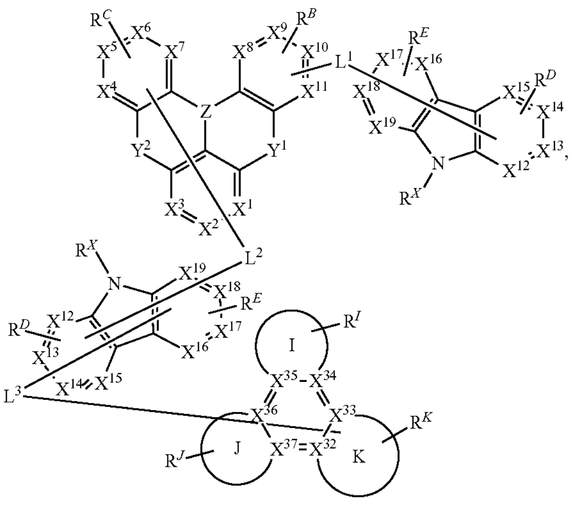
-continued
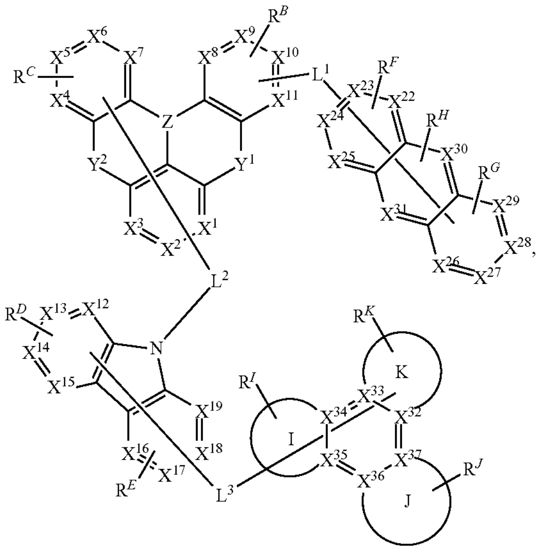
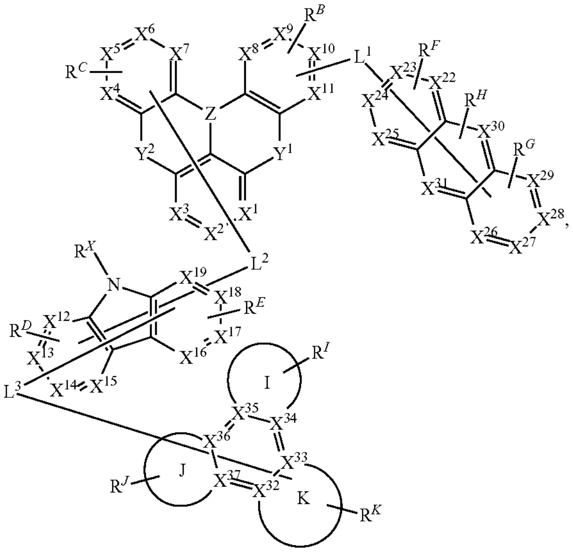
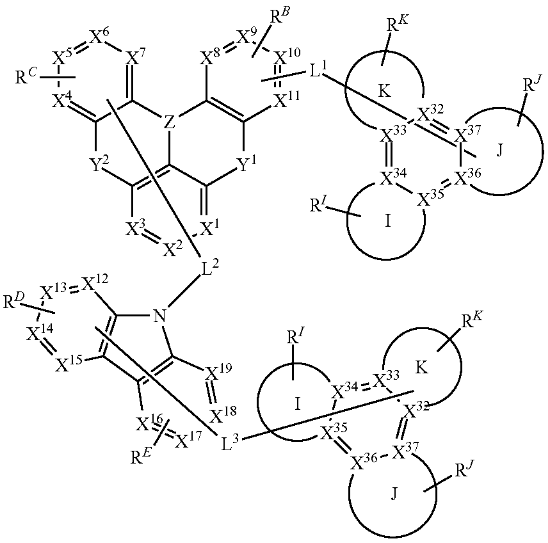
, -continued
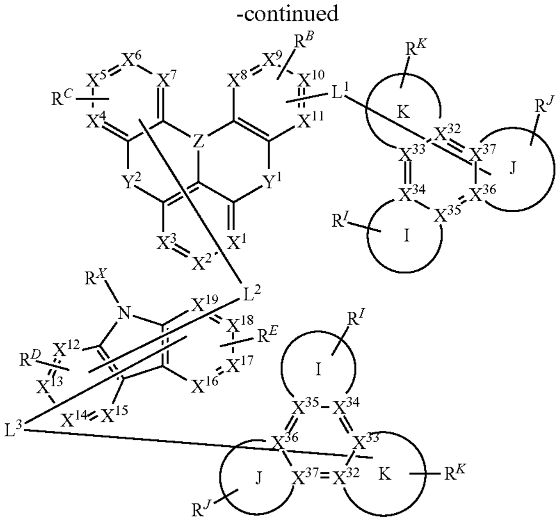
,
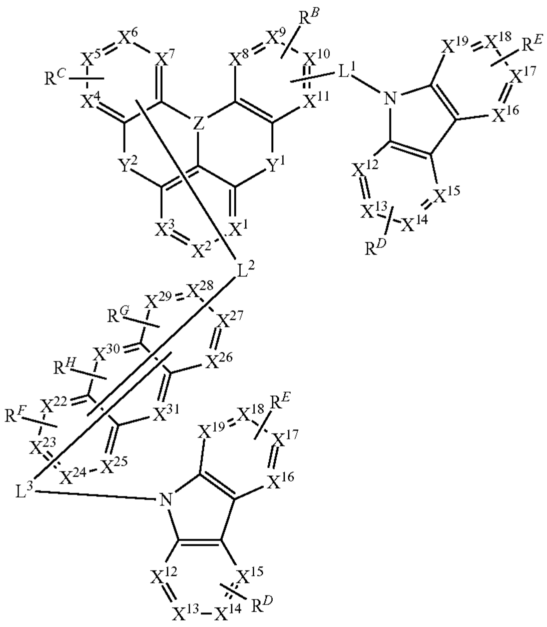
,
-continued
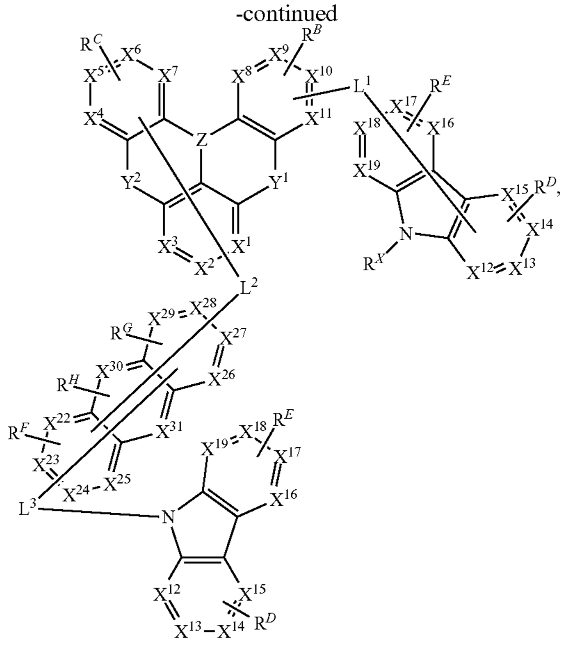
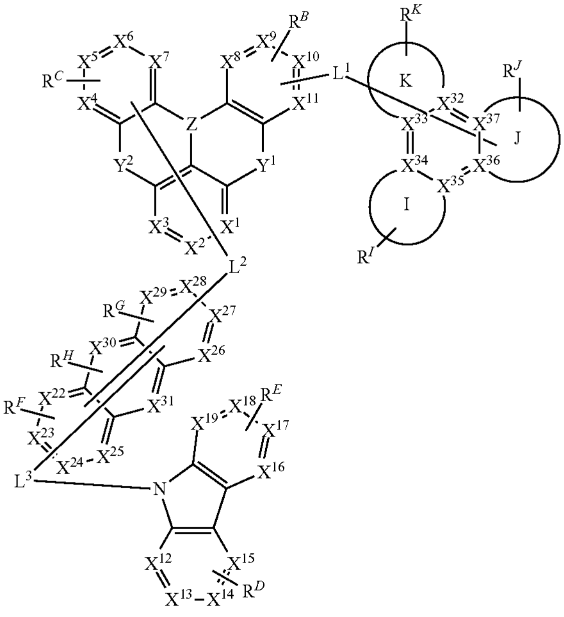
, -continued
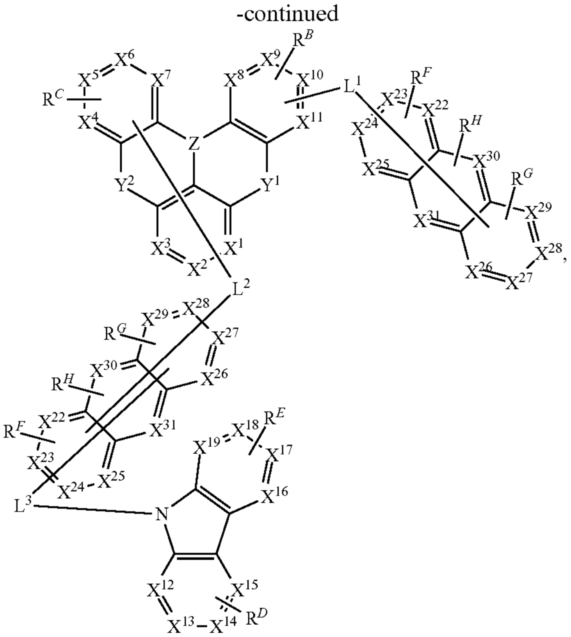
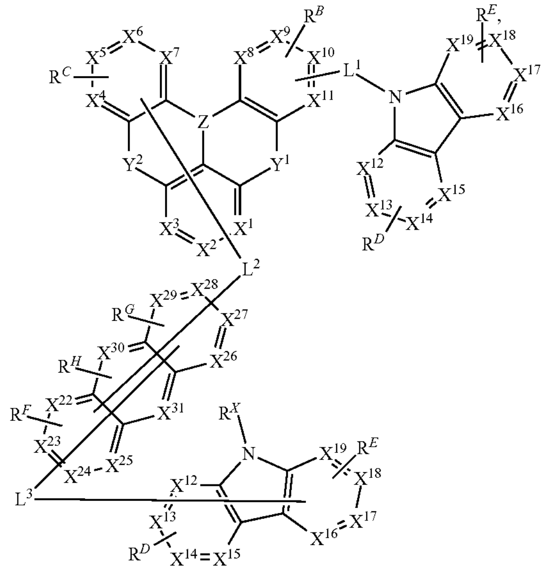
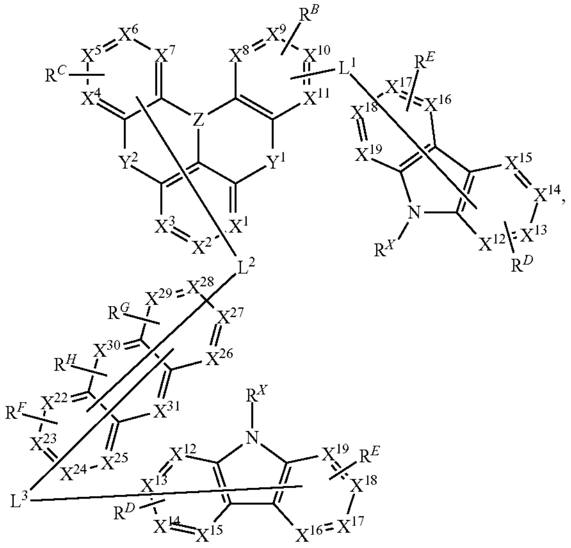
-continued
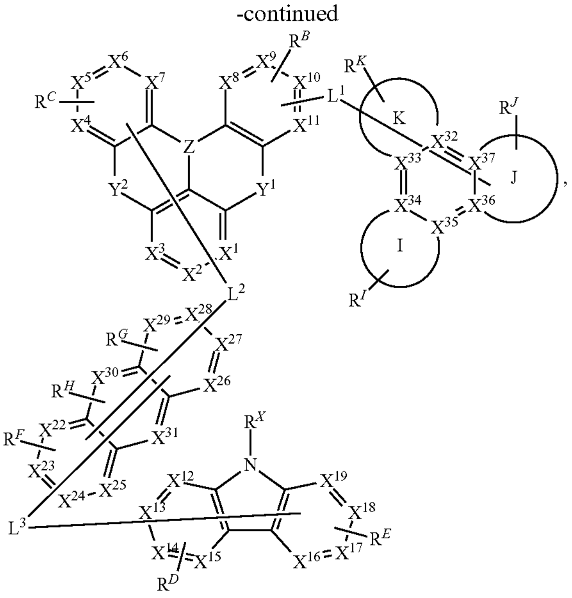
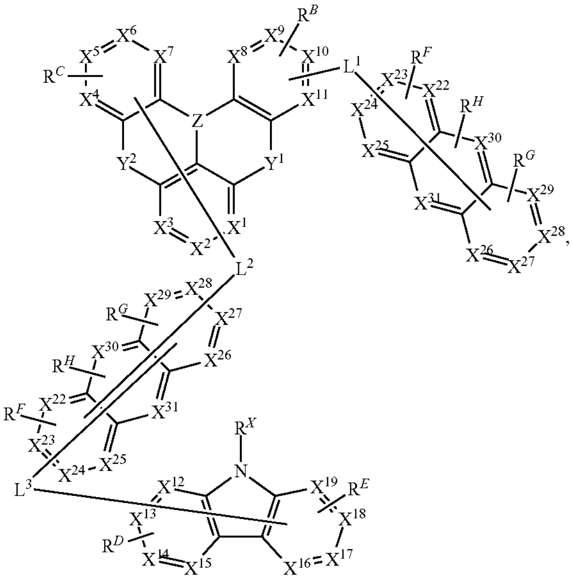

-continued
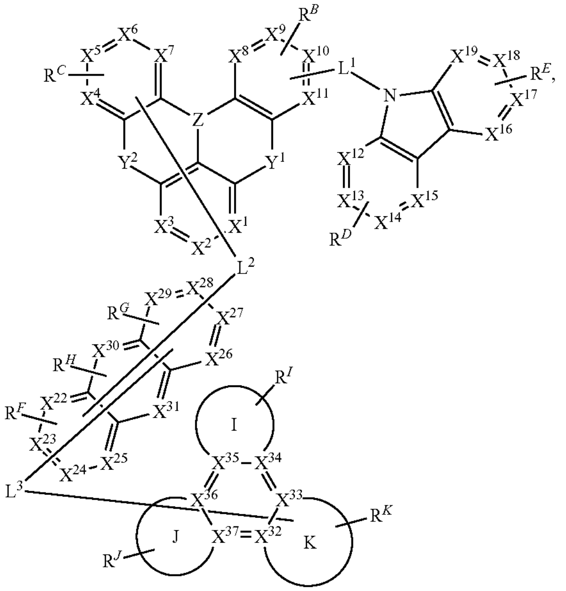
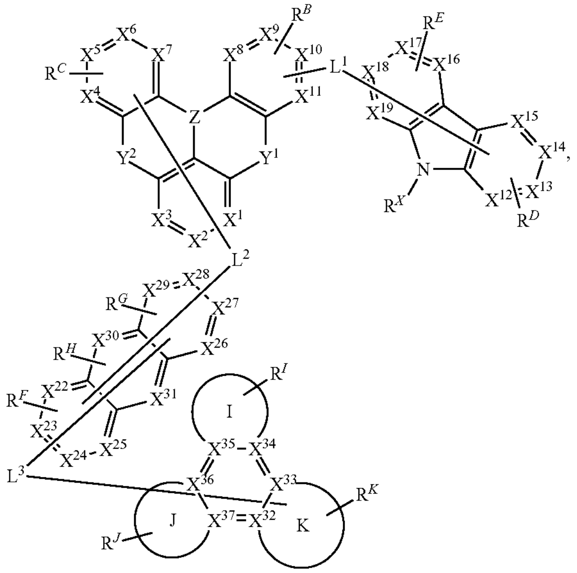
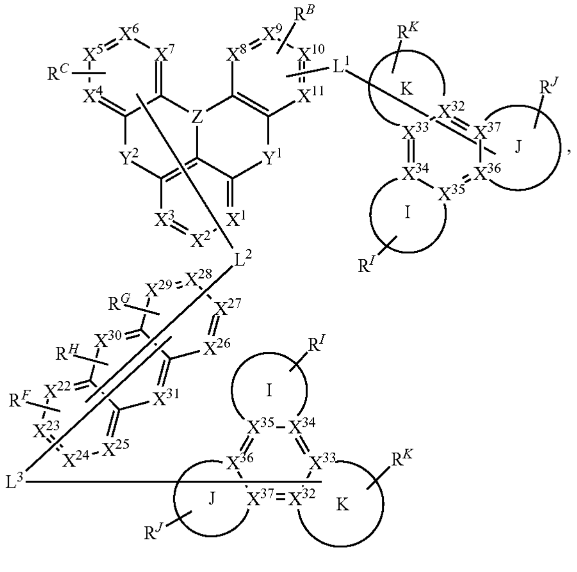
-continued
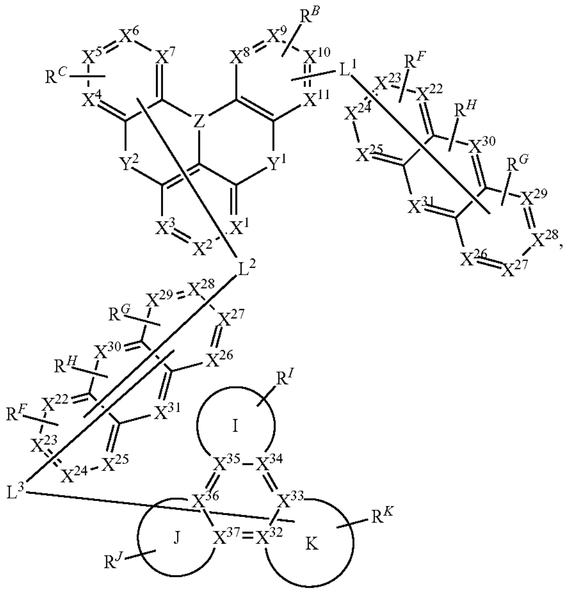
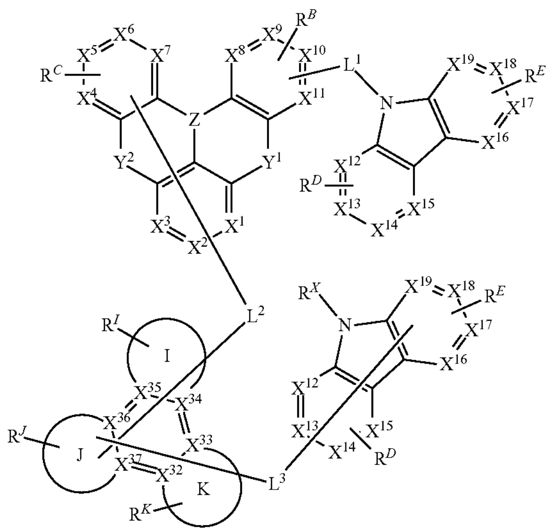
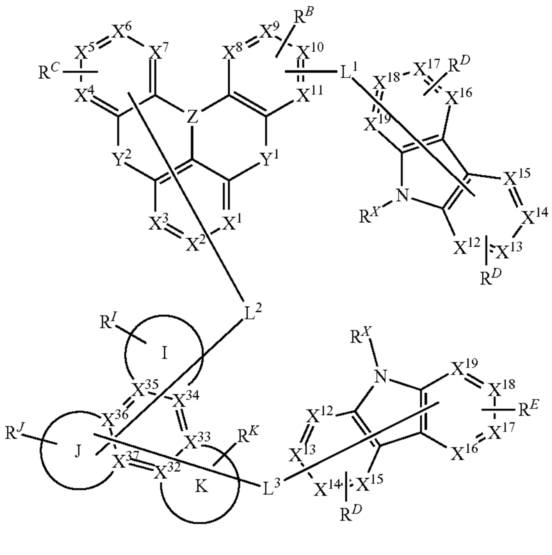

-continued
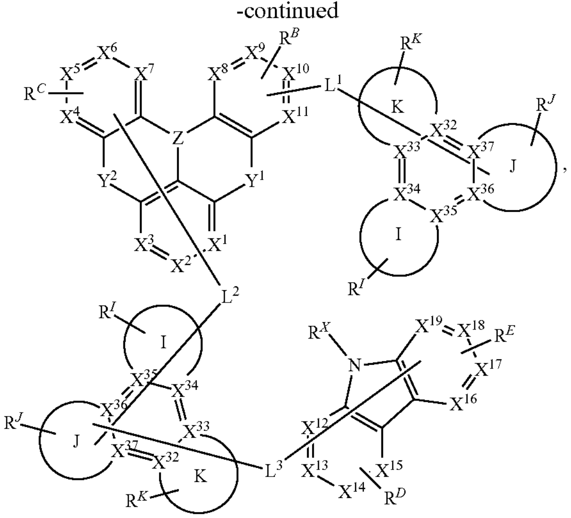
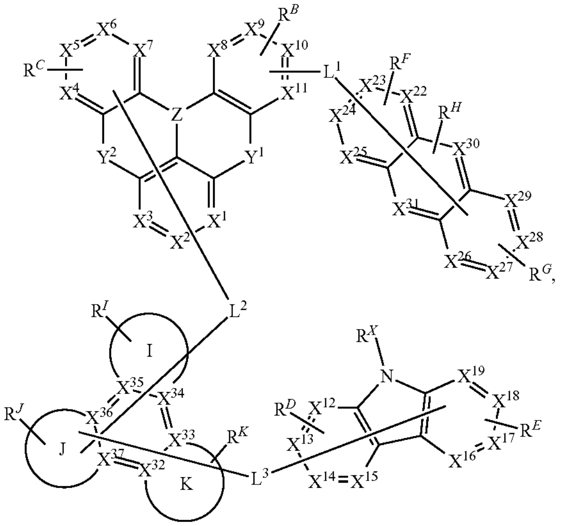
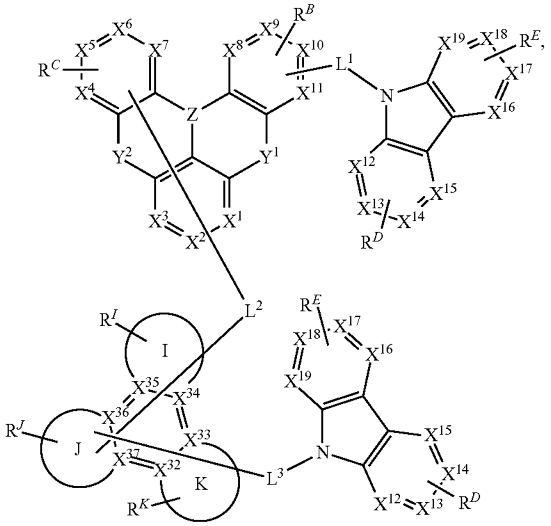
-continued
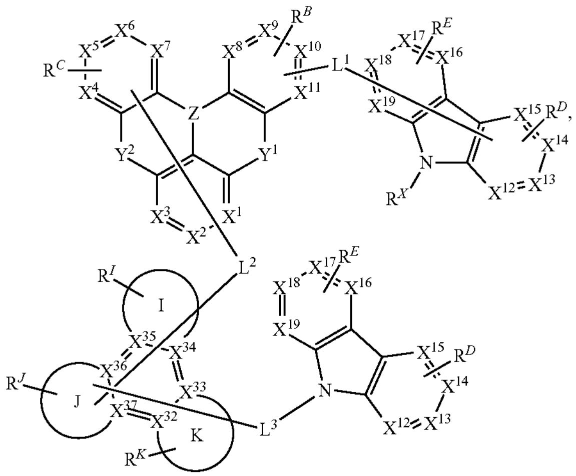
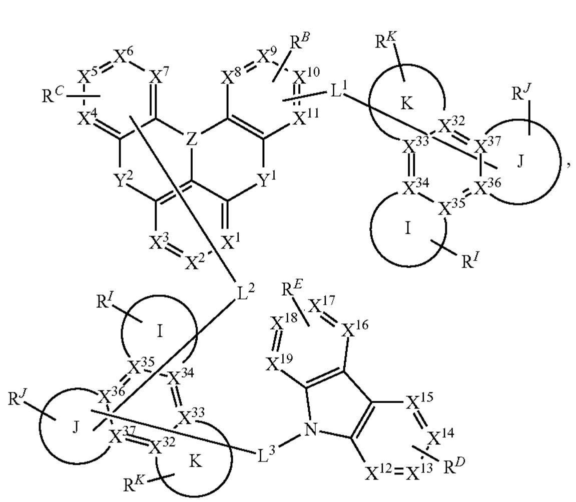

-continued

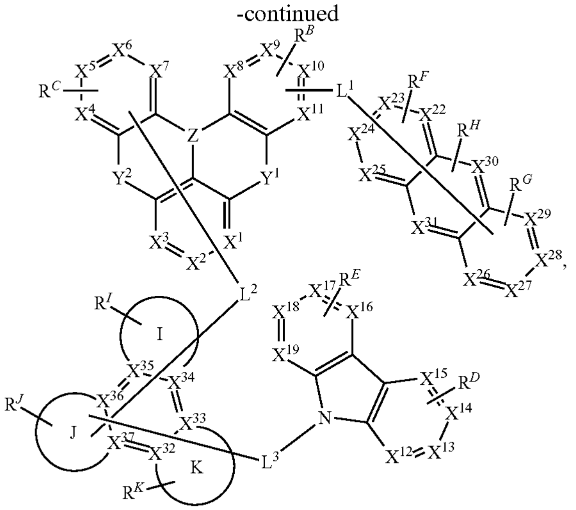

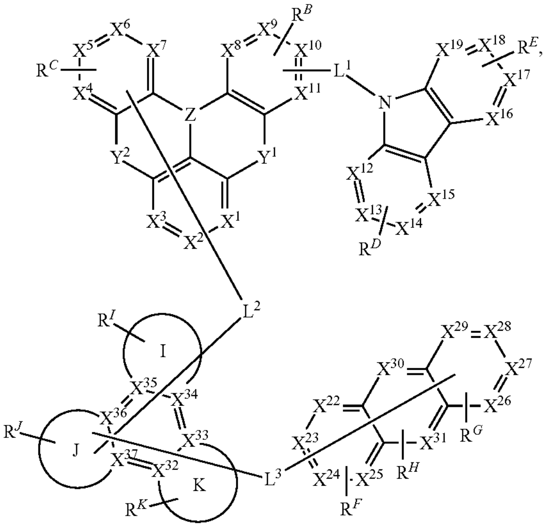

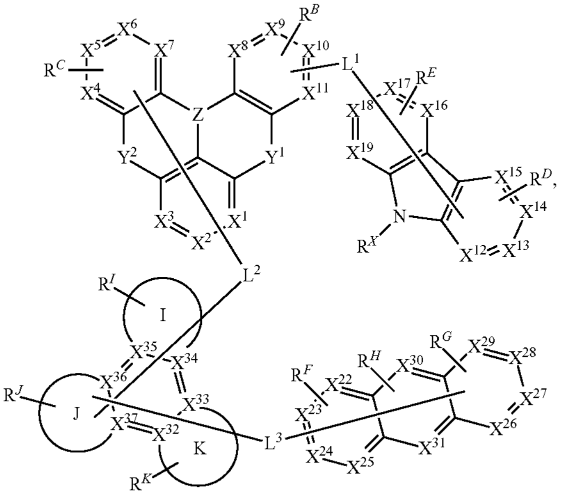

-continued

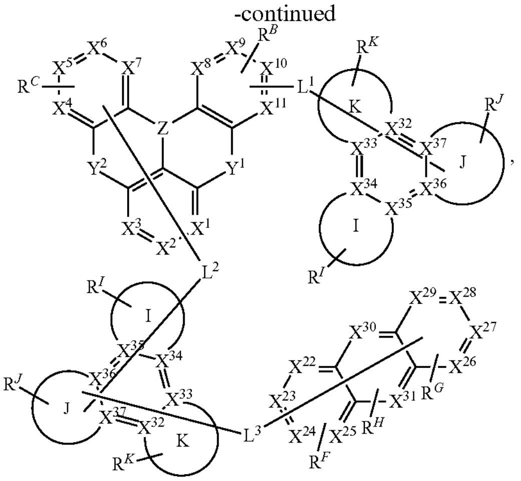

, and

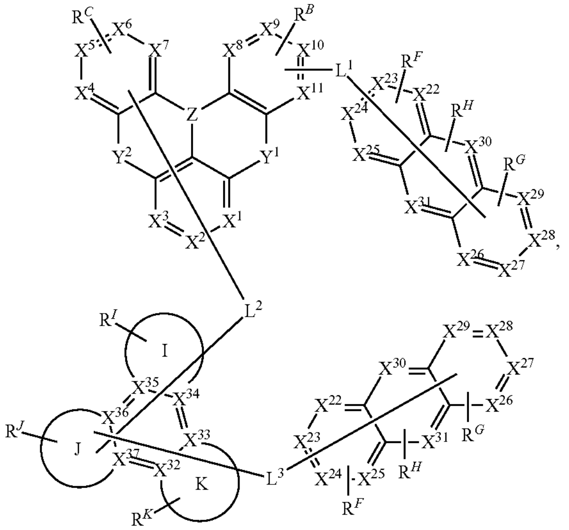

wherein each of $L^1$, $L^2$, and $L^3$ is independently selected from the group consisting of a direct bond, BR, BRR', NR, PR, P(O)R, O, S, Se, C═O, C═S, C═Se, C═NR, C═CRR', S═O, $SO_2$, CR, CRR', SiRR', and GeRR';

the remaining variables are the same as previously defined; and any two substituents can be joined or fused to form a ring.

9. The compound of claim 1, wherein the compound is selected from the group consisting of:

| Compound | Structure of compound |
|---|---|
| Compound 1-(RL)(RM)(RN)(RO), wherein Compound 1-(R1)(R1)(R1)(R1) to Compound 1-(R141)(R141)(R141)(R141), have the structure | 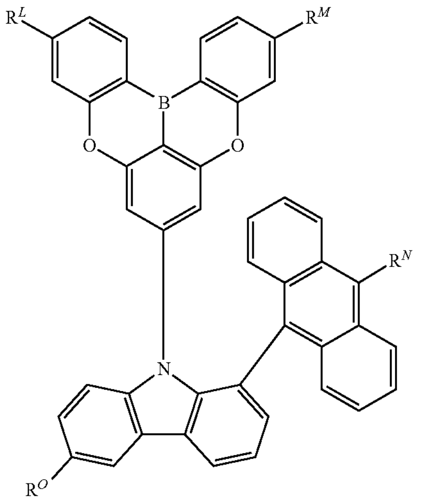 |
| Compound 2-(RL)(RM)(RN)(RO), wherein Compound 2-(R1)(R1)(R1)(R1) to Compound 2-(R141)(R141)(R141)(R141), have the structure | 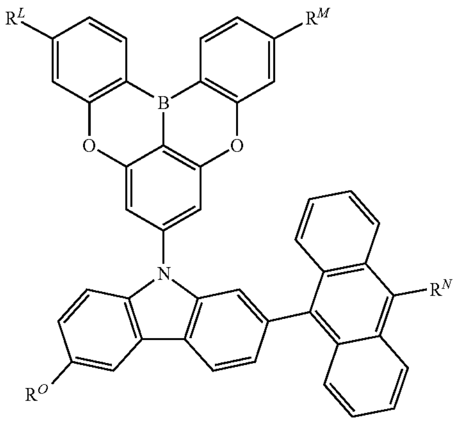 |
| Compound 3-(RL)(RM)(RN)(RO), wherein Compound 3-(R1)(R1)(R1)(R1) to Compound 3-(R141)(R141)(R141)(R141), have the structure | 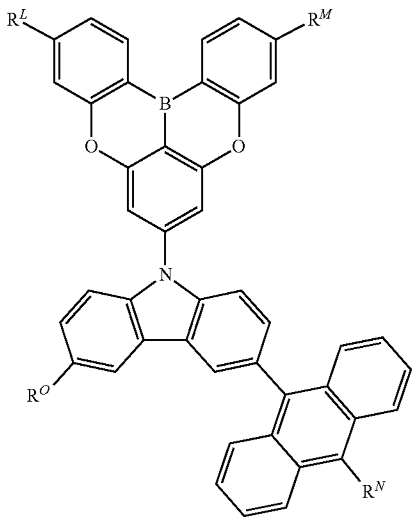 |

-continued
| Compound | Structure of compound |
| --- | --- |
| Compound 4-(RL)(RM)(RN)(RO), wherein Compound 4-(R1)(R1)(R1)(R1) to Compound 4-(R141)(R141)(R141)(R141), have the structure | 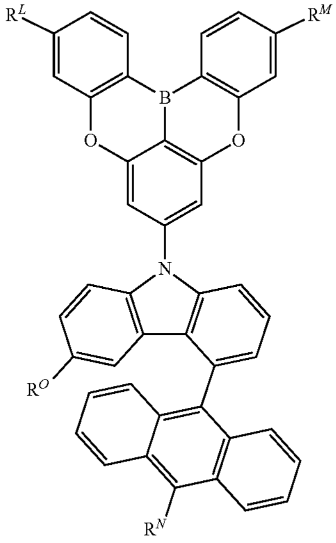 |
| Compound 5-(RL)(RM)(RN)(RO), wherein Compound 5-(R1)(R1)(R1)(R1) to Compound 5-(R141)(R141)(R141)(R141), have the structure | 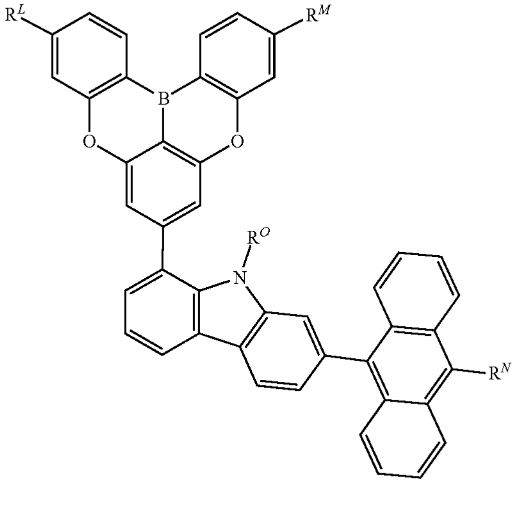 |

-continued
| Compound | Structure of compound |
| --- | --- |
| Compound 6-(RL)(RM)(RN)(RO), wherein Compound 6-(R1)(R1)(R1)(R1) to Compound 6-(R141)(R141)(R141)(R141), have the structure | 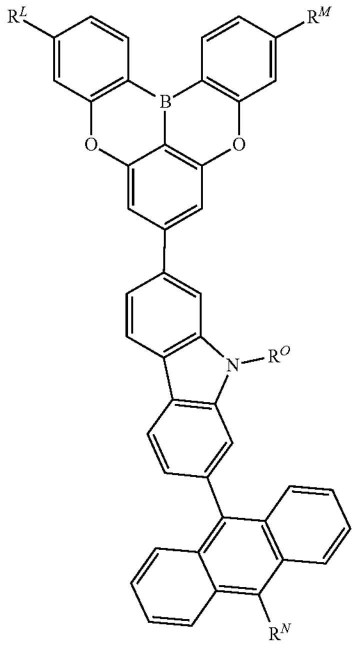 |
| Compound 7-(RL)(RM)(RN)(RO), wherein Compound 7-(R1)(R1)(R1)(R1) to Compound 7-(R141)(R141)(R141)(R141), have the structure | 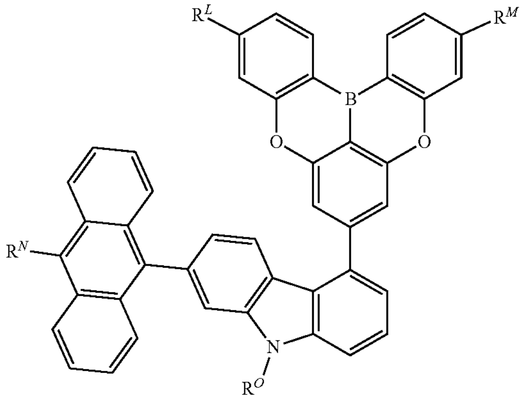 |

-continued
| Compound | Structure of compound |
| --- | --- |
| Compound 8-(RL)(RM)(RN)(RO), wherein Compound 8-(R1)(R1)(R1)(R1) to Compound 8-(R141)(R141)(R141)(R141), have the structure | 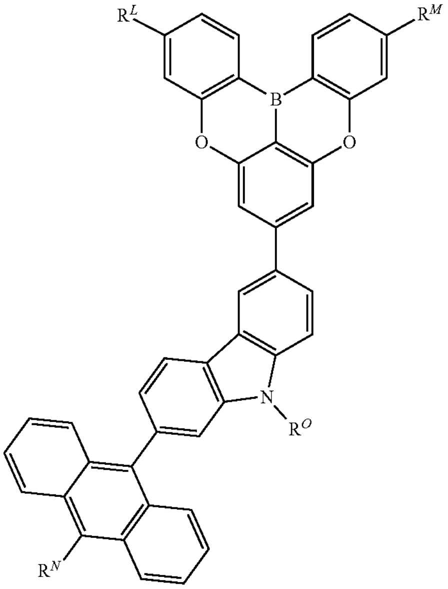 |
| Compound 9-(RL)(RM)(RN)(RO), wherein Compound 9-(R1)(R1)(R1)(R1) to Compound 9-(R141)(R141)(R141)(R141), have the structure | 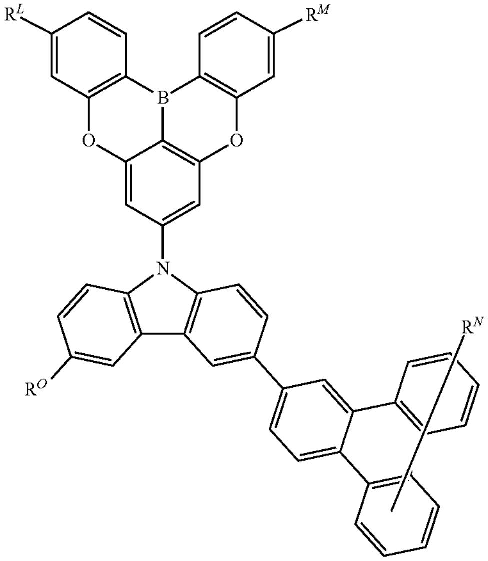 |

-continued
| Compound | Structure of compound |
| --- | --- |
| Compound 10-(RL)(RM)(RN)(RO), wherein Compound 10-(R1)(R1)(R1)(R1) to Compound 10-(R141)(R141)(R141)(R141), have the structure | 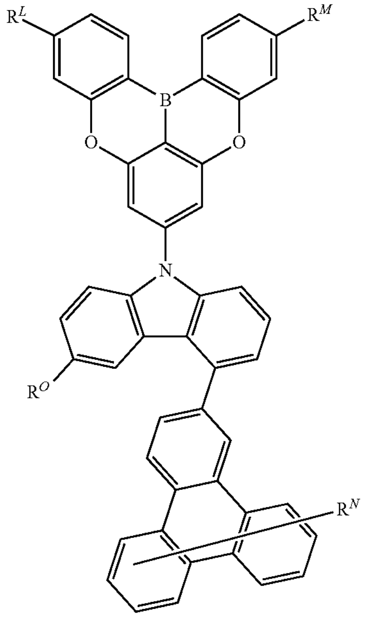 |
| Compound 11-(RL)(RM)(RN)(RO), wherein Compound 11-(R1)(R1)(R1)(R1) to Compound 11-(R141)(R141)(R141)(R141), have the structure | 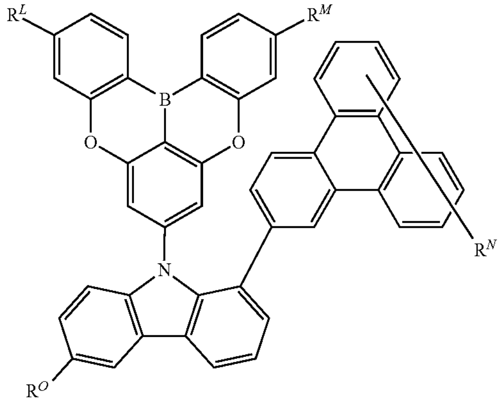 |
| Compound 12-(RL)(RM)(RN)(RO), wherein Compound 12-(R1)(R1)(R1)(R1) to Compound 12-(R141)(R141)(R141)(R141), have the structure | 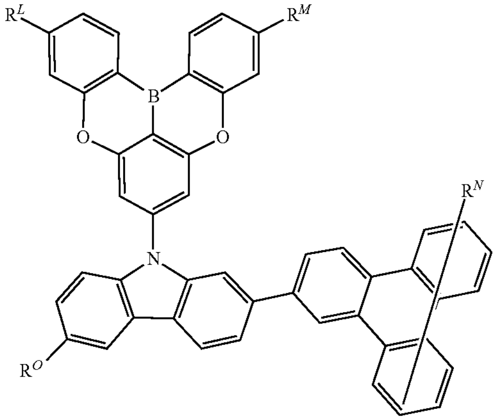 |

-continued
| Compound | Structure of compound |
| --- | --- |
| Compound 13-(RL)(RM)(RN)(RO), wherein Compound 13-(R1)(R1)(R1)(R1) to Compound 13-(R141)(R141)(R141)(R141), have the structure | 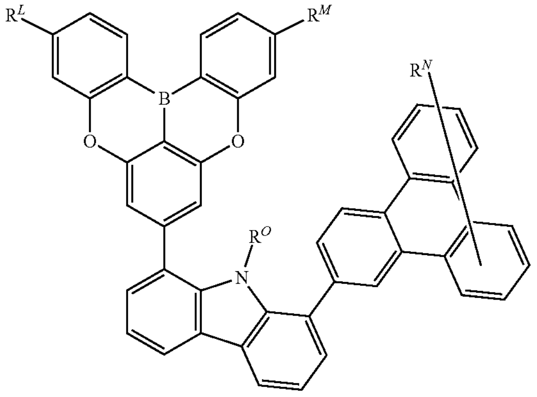 |
| Compound 14-(RL)(RM)(RN)(RO), wherein Compound 14-(R1)(R1)(R1)(R1) to Compound 14-(R141)(R141)(R141)(R141), have the structure | 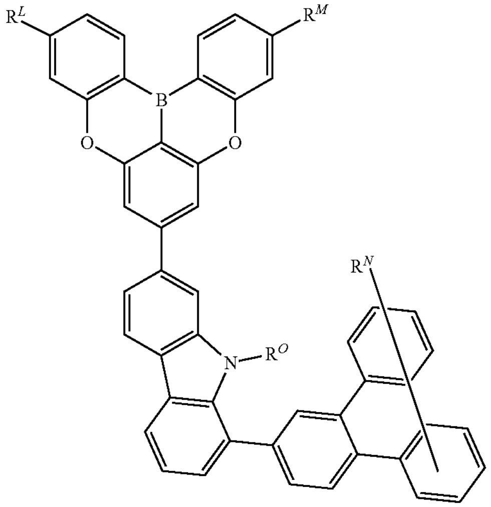 |
| Compound 15-(RL)(RM)(RN)(RO), wherein Compound 15-(R1)(R1)(R1)(R1) to Compound 15-(R141)(R141)(R141)(R141), have the structure | 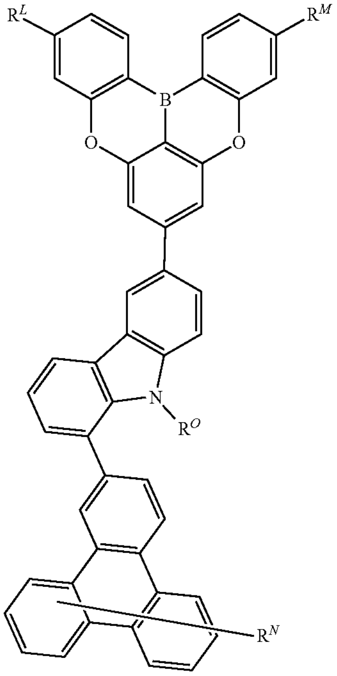 |

-continued
| Compound | Structure of compound |
| --- | --- |
| Compound 16-(RL)(RM)(RN)(RO), wherein Compound 16-(R1)(R1)(R1)(R1) to Compound 16-(R141)(R141)(R141)(R141), have the structure | 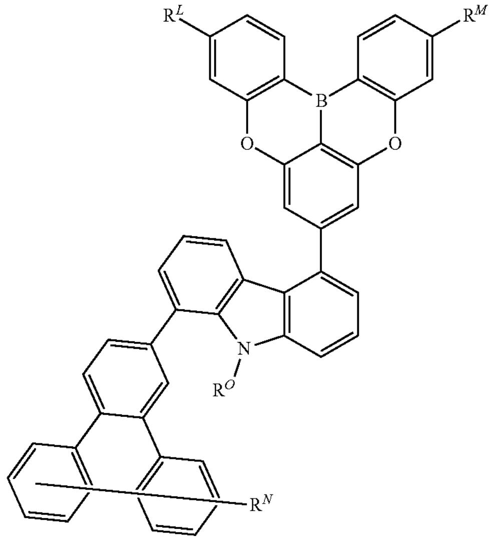 |
| Compound 17-(RL)(RM)(RN)(RO), wherein Compound 17-(R1)(R1)(R1)(R1) to Compound 17-(R141)(R141)(R141)(R141), have the structure | 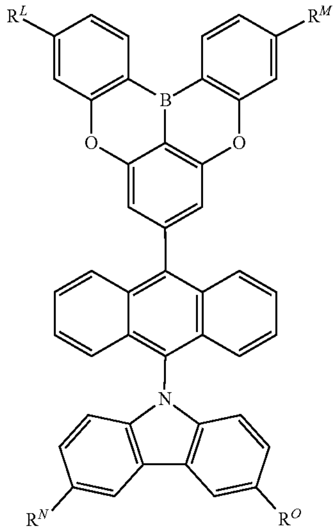 |
| Compound 18-(RL)(RM)(RN)(RO), wherein Compound 18-(R1)(R1)(R1)(R1) to Compound 18-(R141)(R141)(R141)(R141), have the structure | 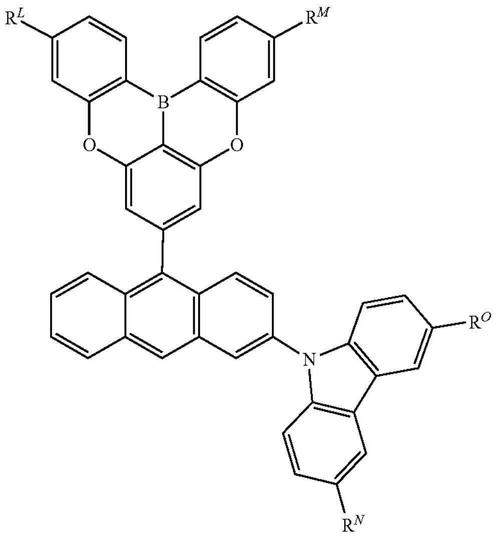 |

-continued
| Compound | Structure of compound |
|---|---|
| Compound 19-(RL)(RM)(RN)(RO), wherein Compound 19-(R1)(R1)(R1)(R1) to Compound 19-(R141)(R141)(R141)(R141), have the structure | 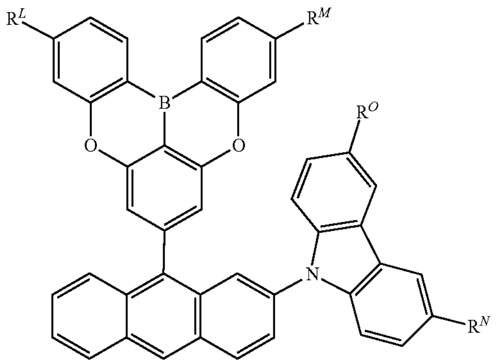 |
| Compound 20-(RL)(RM)(RN)(RO), wherein Compound 20-(R1)(R1)(R1)(R1) to Compound 20-(R141)(R141)(R141)(R141), have the structure | 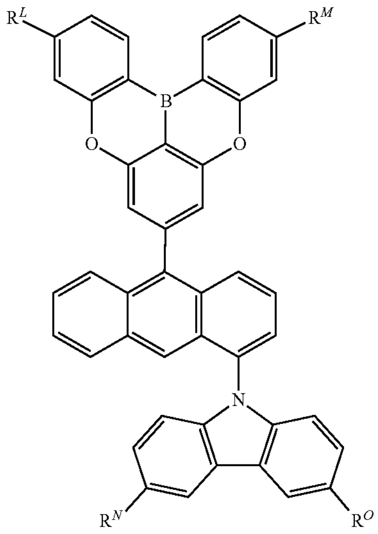 |
| Compound 21-(RL)(RM)(RN)(RO), wherein Compound 21-(R1)(R1)(R1)(R1) to Compound 21-(R141)(R141)(R141)(R141), have the structure | 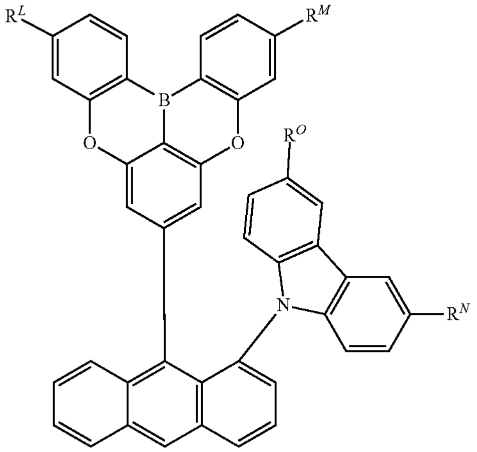 |

-continued
| Compound | Structure of compound |
|---|---|
| Compound 22-(RL)(RM)(RN)(RO), wherein Compound 22-(R1)(R1)(R1)(R1) to Compound 22-(R141)(R141)(R141)(R141), have the structure | 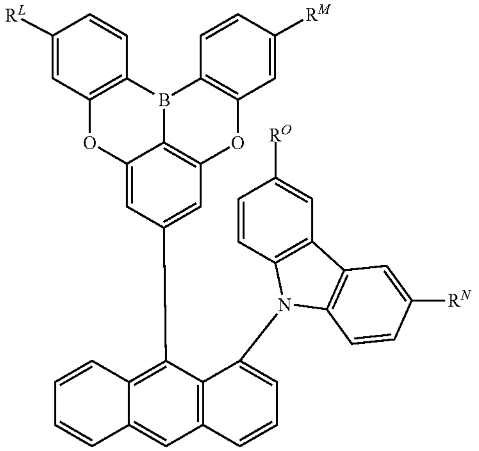 |
| Compound 23-(RL)(RM)(RN)(RO), wherein Compound 23-(R1)(R1)(R1)(R1) to Compound 23-(R141)(R141)(R141)(R141), have the structure | 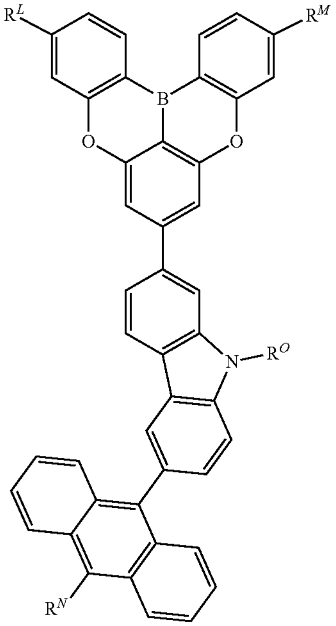 |
| Compound 24-(RL)(RM)(RN)(RO), wherein Compound 24-(R1)(R1)(R1)(R1) to Compound 24-(R141)(R141)(R141)(R141), have the structure | 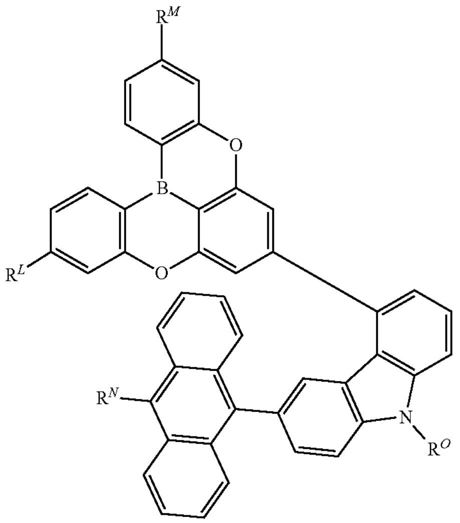 |

-continued
| Compound | Structure of compound |
|---|---|
| Compound 25-(RL)(RM)(RN)(RO), wherein Compound 25-(R1)(R1)(R1)(R1) to Compound 25-(R141)(R141)(R141)(R141), have the structure | 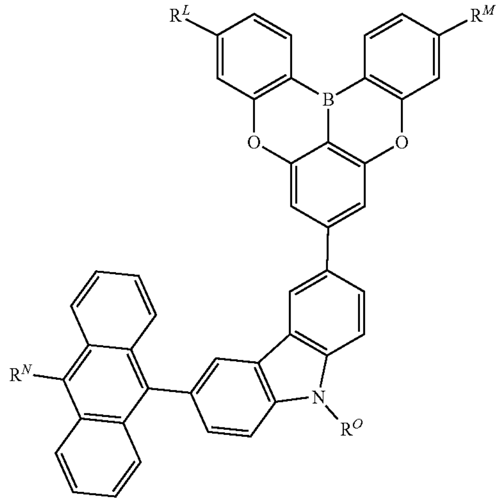 |
| Compound 26-(RL)(RM)(RN)(RO), wherein Compound 26-(R1)(R1)(R1)(R1) to Compound 26-(R141)(R141)(R141)(R141), have the structure | 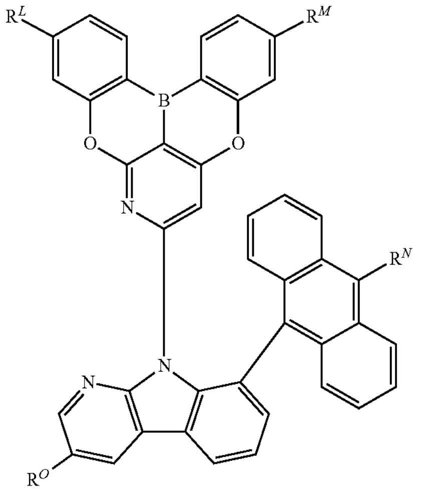 |
| Compound 27-(RL)(RM)(RN)(RO), wherein Compound 27-(R1)(R1)(R1)(R1) to Compound 27-(R141)(R141)(R141)(R141), have the structure | 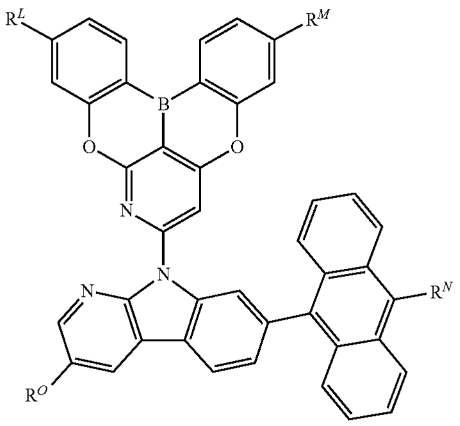 |

-continued
| Compound | Structure of compound |
|---|---|
| Compound 28-(RL)(RM)(RN)(RO), wherein Compound 28-(R1)(R1)(R1)(R1) to Compound 28-(R141)(R141)(R141)(R141), have the structure | 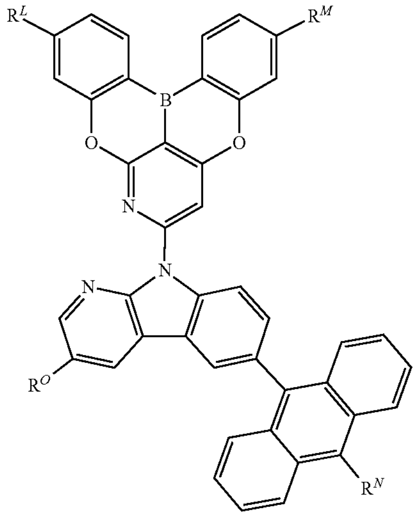 |
| Compound 29-(RL)(RM)(RN)(RO), wherein Compound 29-(R1)(R1)(R1)(R1) to Compound 29-(R141)(R141)(R141)(R141), have the structure | 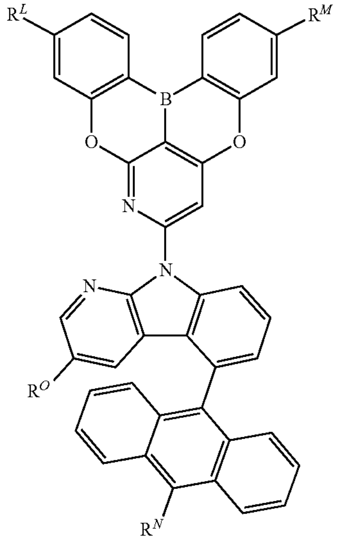 |
| Compound 30-(RL)(RM)(RN)(RO), wherein Compound 30-(R1)(R1)(R1)(R1) to Compound 30-(R141)(R141)(R141)(R141), have the structure | 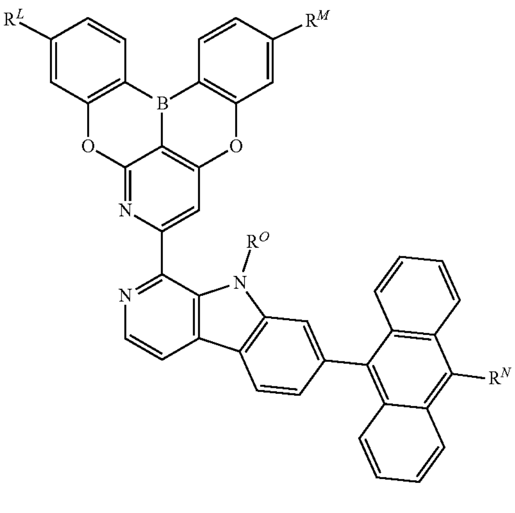 |

-continued
| Compound | Structure of compound |
| --- | --- |
| Compound 31-(RL)(RM)(RN)(RO), wherein Compound 31-(R1)(R1)(R1)(R1) to Compound 31-(R141)(R141)(R141)(R141), have the structure | 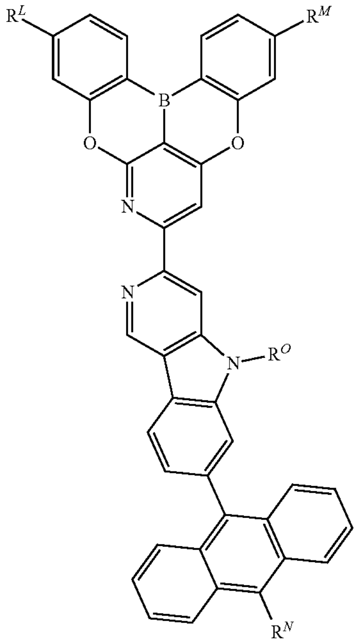 |
| Compound 32-(RL)(RM)(RN)(RO), wherein Compound 32-(R1)(R1)(R1)(R1) to Compound 32-(R141)(R141)(R141)(R141), have the structure | 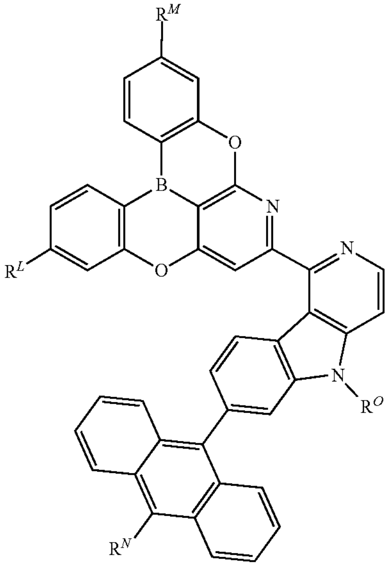 |

-continued
| Compound | Structure of compound |
| --- | --- |
| Compound 33-(RL)(RM)(RN)(RO), wherein Compound 33-(R1)(R1)(R1)(R1) to Compound 33-(R141)(R141)(R141)(R141), have the structure | 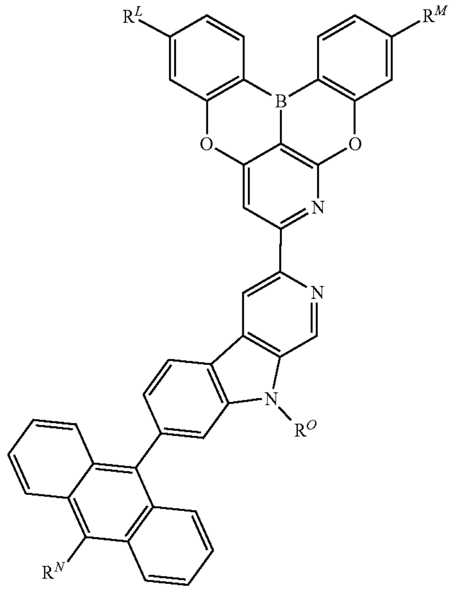 |
| Compound 34-(RL)(RM)(RN)(RO), wherein Compound 34-(R1)(R1)(R1)(R1) to Compound 34-(R141)(R141)(R141)(R141), have the structure | 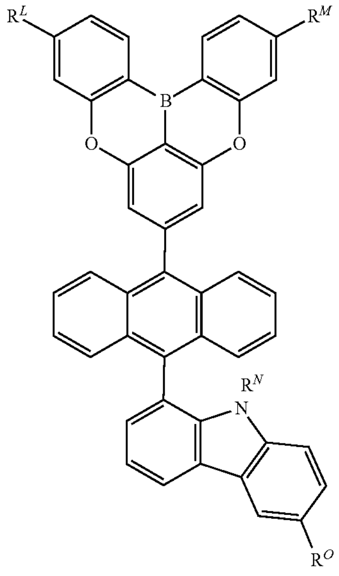 |

-continued
| Compound | Structure of compound |
| --- | --- |
| Compound 35-(RL)(RM)(RN)(RO), wherein Compound 35-(R1)(R1)(R1)(R1) to Compound 35-(R141)(R141)(R141)(R141), have the structure | 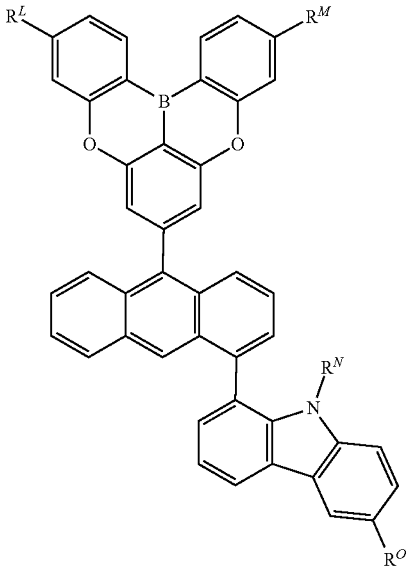 |
| Compound 36-(RL)(RM)(RN)(RO), wherein Compound 36-(R1)(R1)(R1)(R1) to Compound 36-(R141)(R141)(R141)(R141), have the structure | 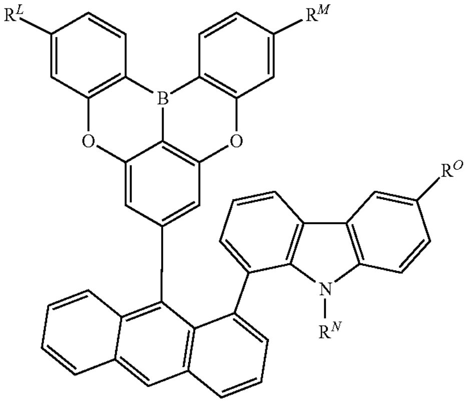 |
| Compound 37-(RL)(RM)(RN)(RO), wherein Compound 37-(R1)(R1)(R1)(R1) to Compound 37-(R141)(R141)(R141)(R141), have the structure | 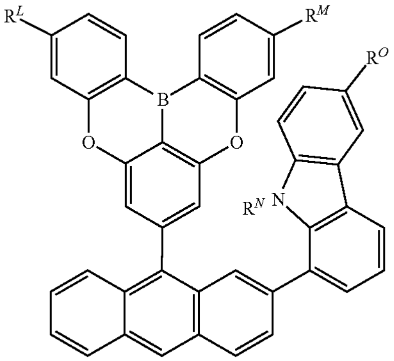 |

-continued
| Compound | Structure of compound |
| --- | --- |
| Compound 38-(RL)(RM)(RN)(RO), wherein Compound 38-(R1)(R1)(R1)(R1) to Compound 38-(R141)(R141)(R141)(R141), have the structure | 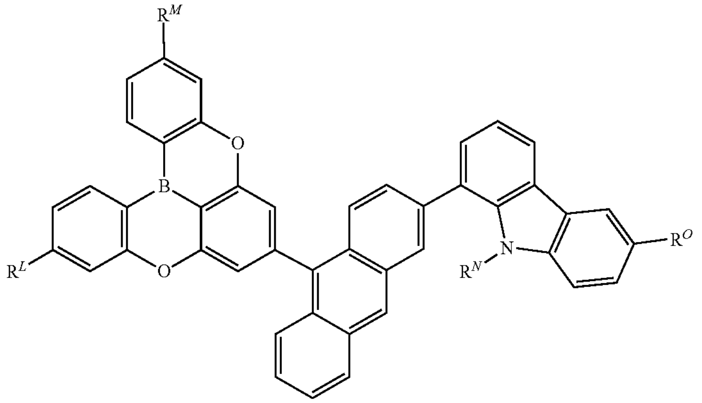 |
| Compound 39-(RL)(RM)(RN)(RO), wherein Compound 39-(R1)(R1)(R1)(R1) to Compound 39-(R141)(R141)(R141)(R141), have the structure | 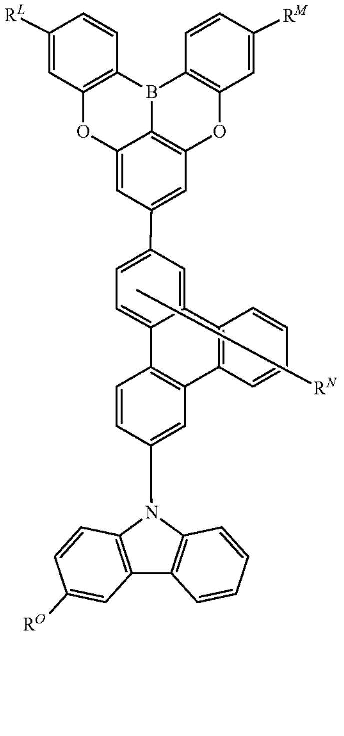 |

-continued
| Compound | Structure of compound |
| --- | --- |
| Compound 40-(RL)(RM)(RN)(RO), wherein Compound 40-(R1)(R1)(R1)(R1) to Compound 40-(R141)(R141)(R141)(R141), have the structure | 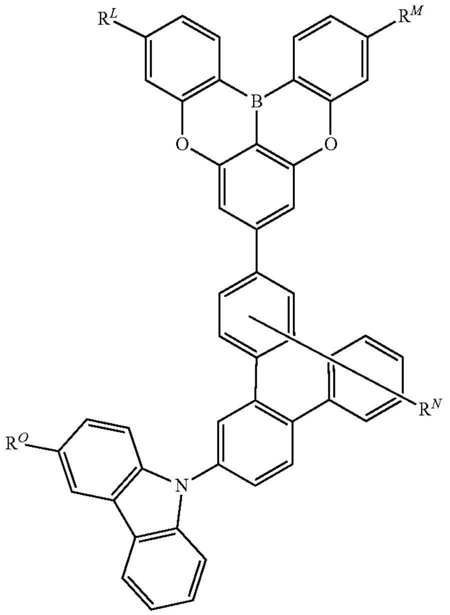 |
| Compound 41-(RL)(RM)(RN)(RO), wherein Compound 41-(R1)(R1)(R1)(R1) to Compound 41-(R141)(R141)(R141)(R141), have the structure | 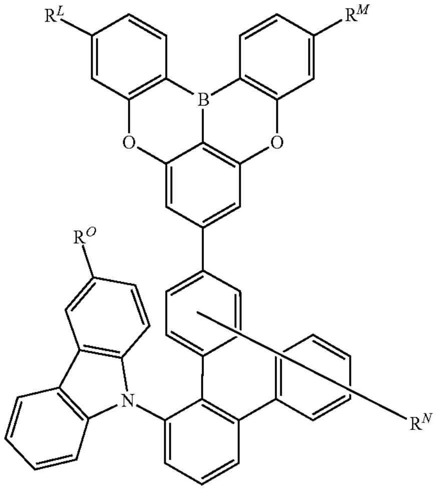 |

-continued
| Compound | Structure of compound |
|---|---|
| Compound 42-(RL)(RM)(RN)(RO), wherein Compound 42-(R1)(R1)(R1)(R1) to Compound 42-(R141)(R141)(R141)(R141), have the structure | 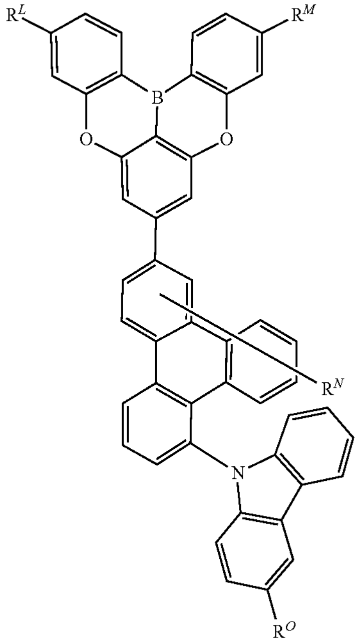 |
| Compound 43-(RL)(RM)(RN)(RO), wherein Compound 43-(R1)(R1)(R1)(R1) to Compound 43-(R141)(R141)(R141)(R141), have the structure | 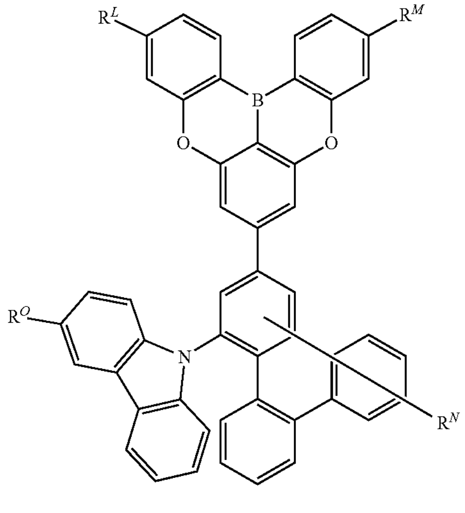 |

-continued
| Compound | Structure of compound |
| --- | --- |
| Compound 44-(RL)(RM)(RN)(RO), wherein Compound 44-(R1)(R1)(R1)(R1) to Compound 44-(R141)(R141)(R141)(R141), have the structure | 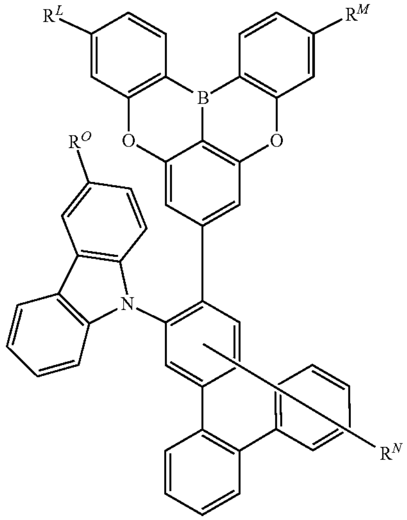 |
| Compound 45-(RL)(RM)(RN)(RO), wherein Compound 45-(R1)(R1)(R1)(R1) to Compound 45-(R141)(R141)(R141)(R141), have the structure | 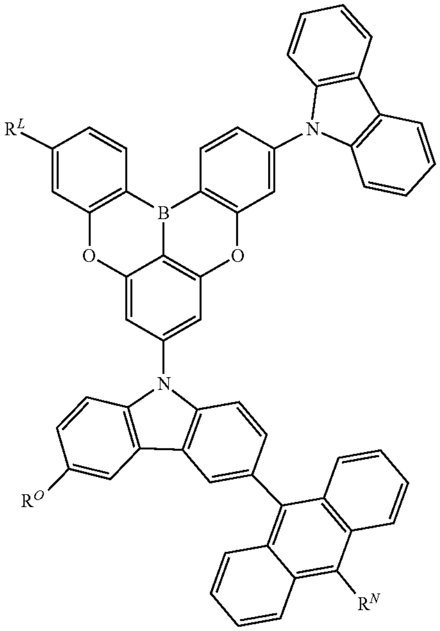 |

-continued
| Compound | Structure of compound |
| --- | --- |
| Compound 46-(RL)(RM)(RN)(RO), wherein Compound 46-(R1)(R1)(R1)(R1) to Compound 46-(R141)(R141)(R141)(R141), have the structure | 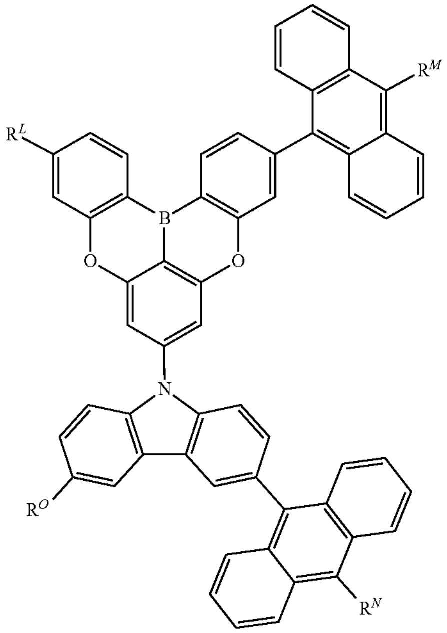 |
| Compound 47-(RL)(RM)(RN)(RO), wherein Compound 47-(R1)(R1)(R1)(R1) to Compound 47-(R141)(R141)(R141)(R141), have the structure | 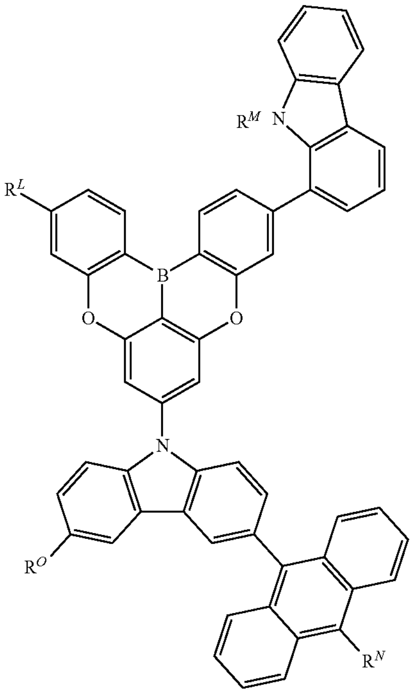 |

-continued
| Compound | Structure of compound |
| --- | --- |
| Compound 48-(RL)(RM)(RN)(RO), wherein Compound 48-(R1)(R1)(R1)(R1) to Compound 48-(R141)(R141)(R141)(R141), have the structure | 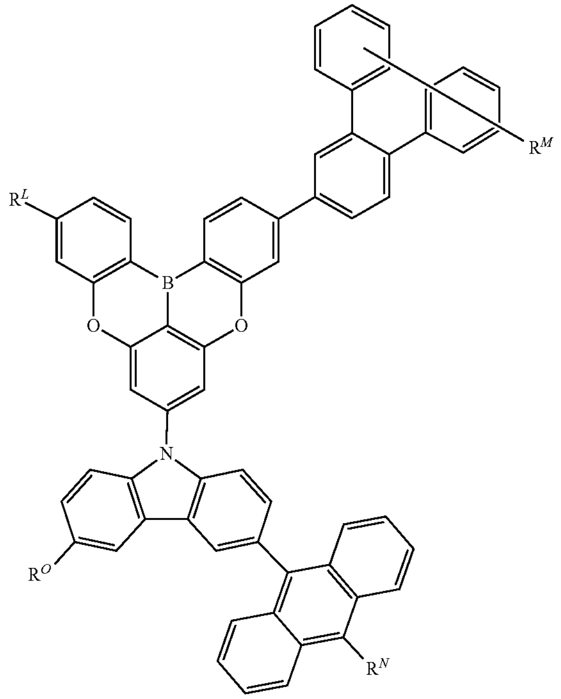 |
| Compound 49-(RL)(RM)(RN)(RO), wherein Compound 49-(R1)(R1)(R1)(R1) to Compound 49-(R141)(R141)(R141)(R141), have the structure | 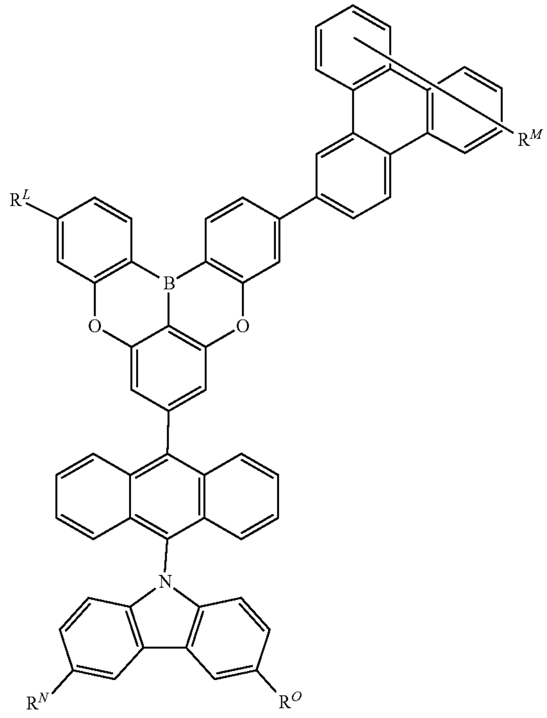 |

-continued
| Compound | Structure of compound |
|---|---|
| Compound 50-(RL)(RM)(RN)(RO), wherein Compound 50-(R1)(R1)(R1)(R1) to Compound 50-(R141)(R141)(R141)(R141), have the structure | 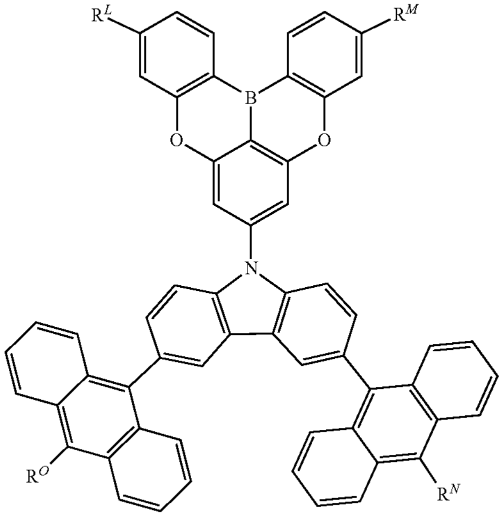 |
| Compound 51-(RL)(RM)(RN)(RO), wherein Compound 51-(R1)(R1)(R1)(R1) to Compound 51-(R141)(R141)(R141)(R141), have the structure | 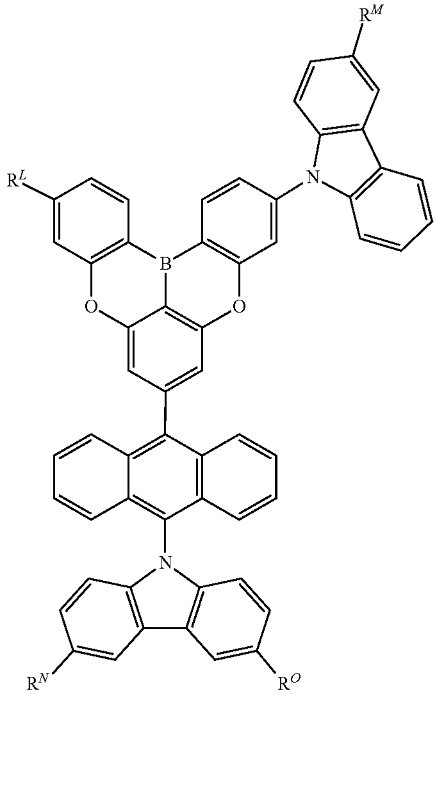 |

-continued
| Compound | Structure of compound |
| --- | --- |
| Compound 52-(RL)(RM)(RN)(RO), wherein Compound 52-(R1)(R1)(R1)(R1) to Compound 52-(R141)(R141)(R141)(R141), have the structure | 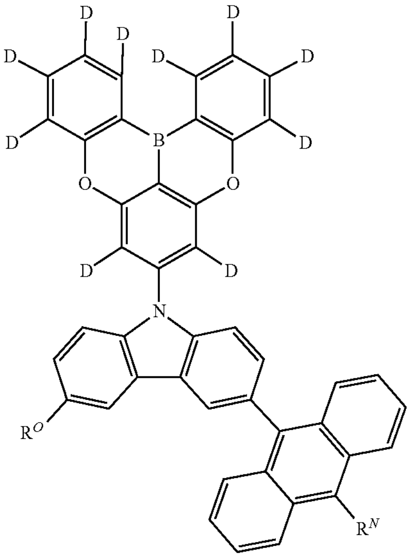 |
| Compound 53-(RL)(RM)(RN)(RO), wherein Compound 53-(R1)(R1)(R1)(R1) to Compound 53-(R141)(R141)(R141)(R141), have the structure | 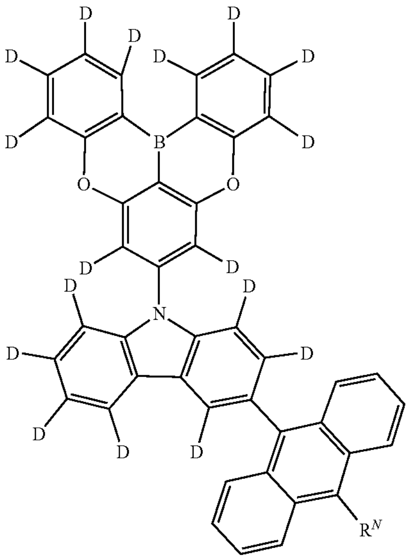 |

-continued
| Compound | Structure of compound |
|---|---|
| Compound 54-(RL)(RM)(RN)(RO), wherein Compound 54-(R1)(R1)(R1)(R1) to Compound 54-(R141)(R141)(R141)(R141), have the structure | 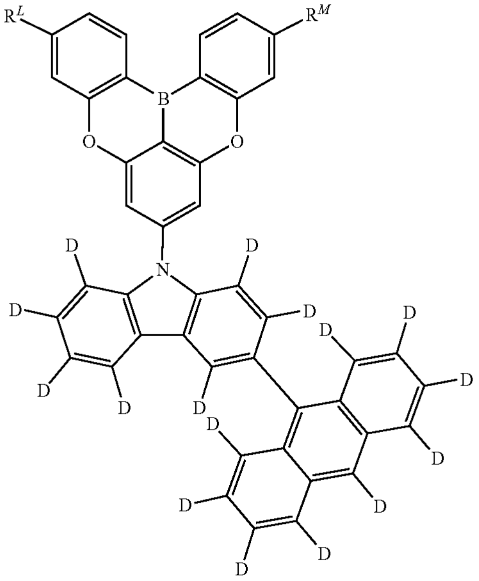 |
| Compound 55-(RL)(RM)(RN)(RO), wherein Compound 55-(R1)(R1)(R1)(R1) to Compound 55-(R141)(R141)(R141)(R141), have the structure | 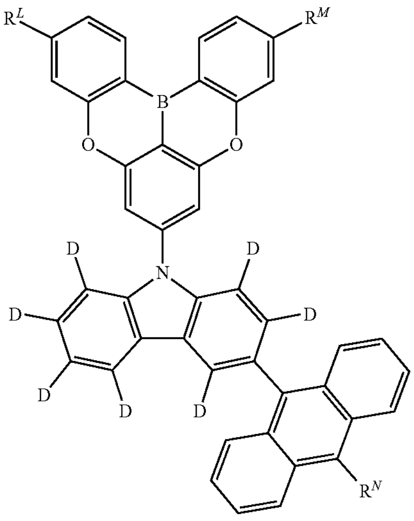 |

-continued
| Compound | Structure of compound |
|---|---|
| Compound 56-(RL)(RM)(RN)(RO), wherein Compound 56-(R1)(R1)(R1)(R1) to Compound 56-(R141)(R141)(R141)(R141), have the structure | 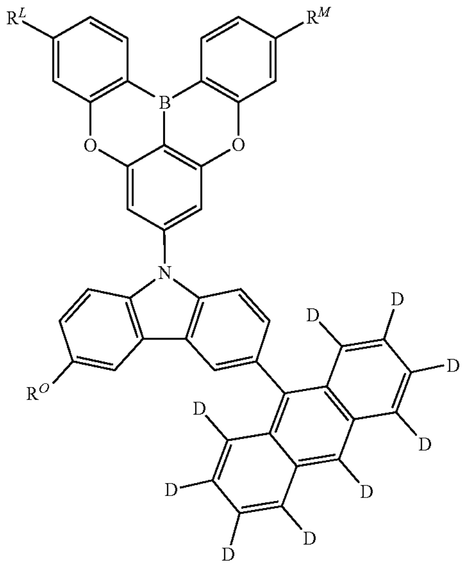 |
| Compound 57-(RZ)(RM)(RN)(RO), wherein Compound 57-(R1)(R1)(R1)(R1) to Compound 57-(R141)(R141)(R141)(R141), have the structure | 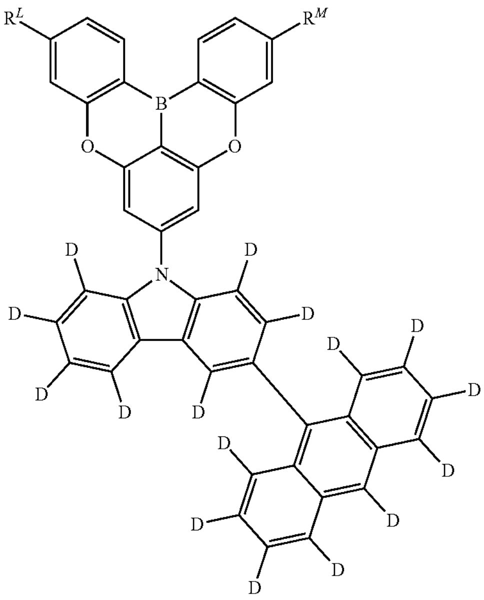 |

-continued
| Compound | Structure of compound |
|---|---|
| Compound 58-(RL)(RM)(RN)(RO), wherein Compound 58-(R1)(R1)(R1)(R1) to Compound 58-(R141)(R141)(R141)(R141), have the structure | 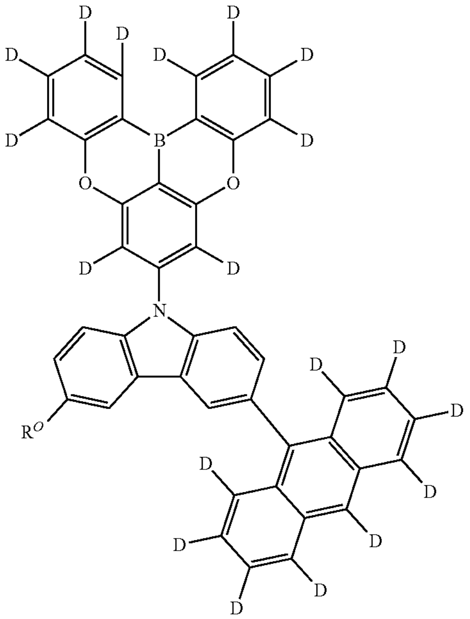 |
| Compound 59-(RL)(RM)(RN)(RO), wherein Compound 59-(R1)(R1)(R1)(R1) to Compound 59-(R141)(R141)(R141)(R141), have the structure | 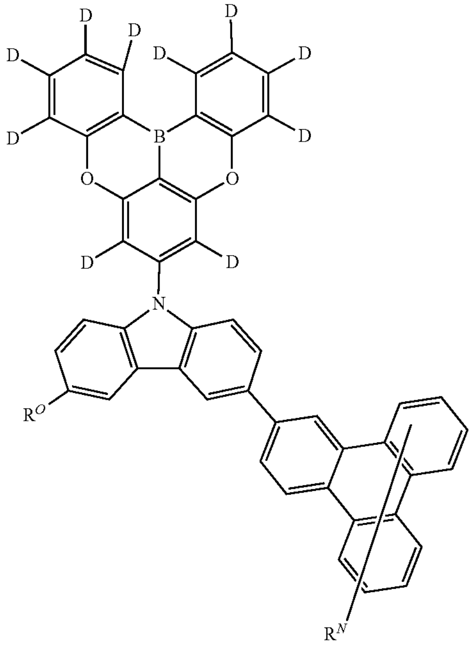 |

-continued
| Compound | Structure of compound |
| --- | --- |
| Compound 60-(RL)(RM)(RN)(RO), wherein Compound 60-(R1)(R1)(R1)(R1) to Compound 60-(R141)(R141)(R141)(R141), have the structure | 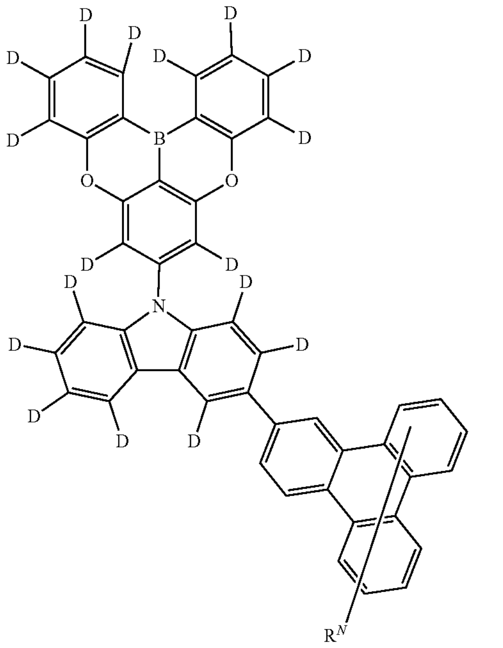 |
| Compound 61-(RL)(RM)(RN)(RO), wherein Compound 61-(R1)(R1)(R1)(R1) to Compound 61-(R141)(R141)(R141)(R141), have the structure | 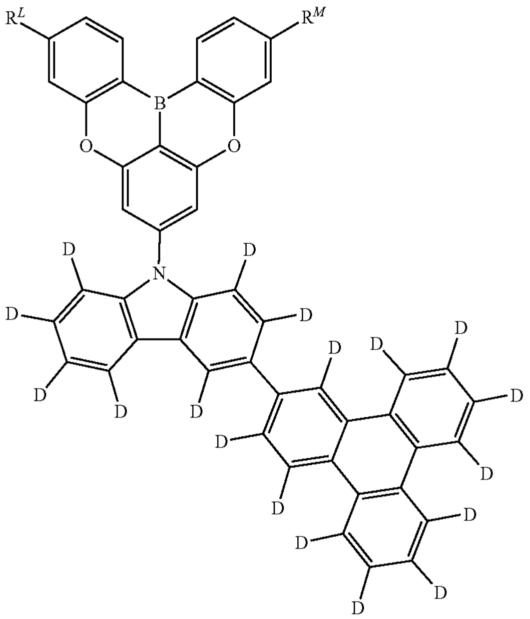 |

-continued
| Compound | Structure of compound |
| --- | --- |
| Compound 62-(RL)(RM)(RN)(RO), wherein Compound 62-(R1)(R1)(R1)(R1) to Compound 62-(R141)(R141)(R141)(R141), have the structure | 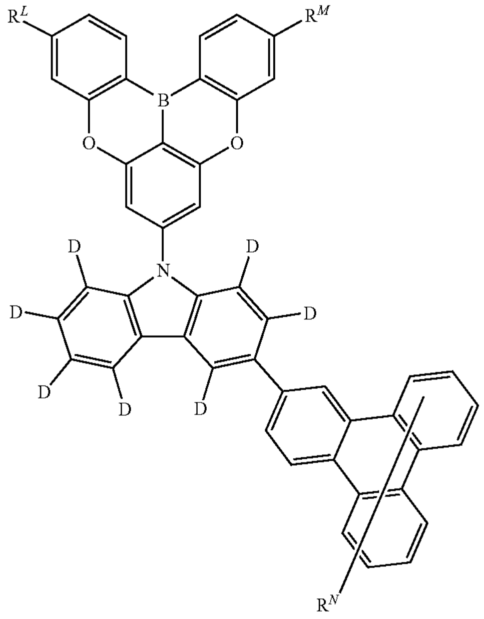 |
| Compound 63-(RL)(RM)(RN)(RO), wherein Compound 63-(R1)(R1)(R1)(R1) to Compound 63-(R141)(R141)(R141)(R141), have the structure | 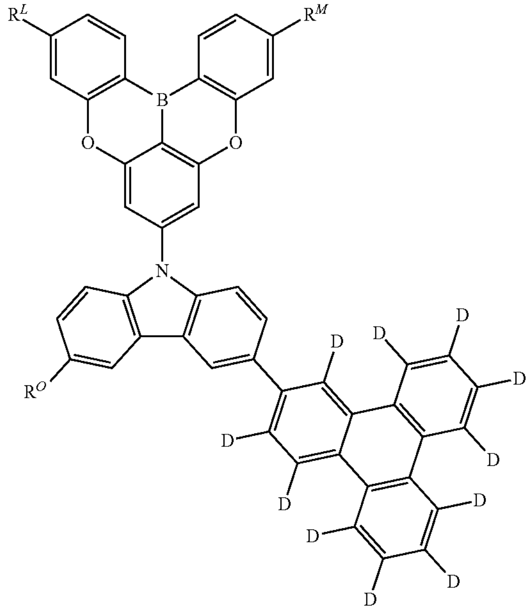 |

-continued
| Compound | Structure of compound |
| --- | --- |
| Compound 65-(RL)(RM)(RN)(RO), wherein Compound 65-(R1)(R1)(R1)(R1) to Compound 65-(R141)(R141)(R141)(R141), have the structure | 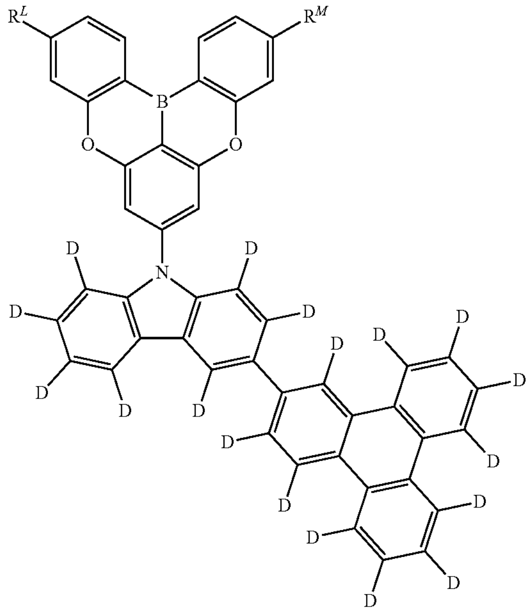 |
| Compound 66-(RL)(RM)(RN)(RO), wherein Compound 66-(R1)(R1)(R1)(R1) to Compound 66-(R141)(R141)(R141)(R141), have the structure | 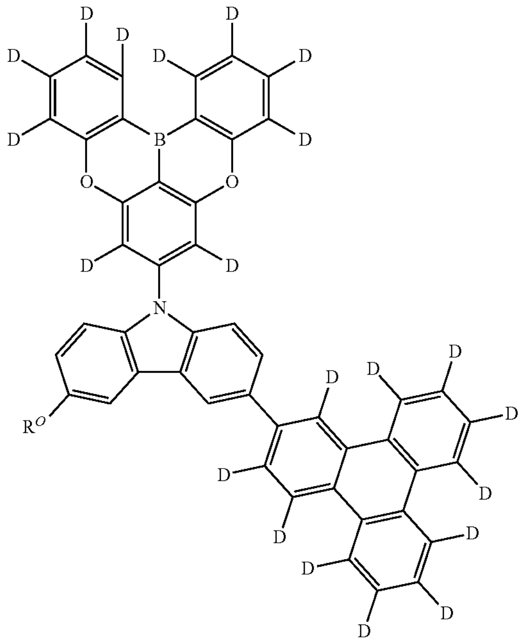 |

wherein i, j, k, and l are each independently an integer from 1 to 141, and,
wherein R1 to R141 are defined in the following LIST:
| Structure | |
|---|---|
| 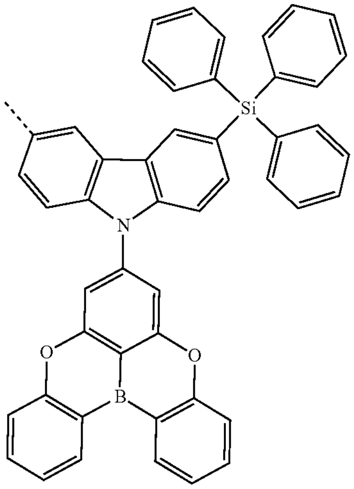 | R1 |
| 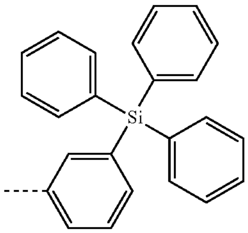 | R2 |
| 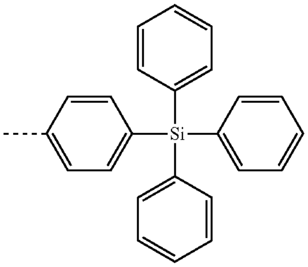 | R3 |
| 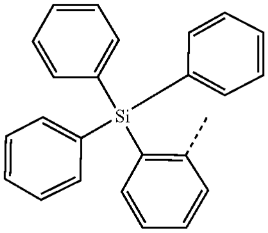 | R4 |
| 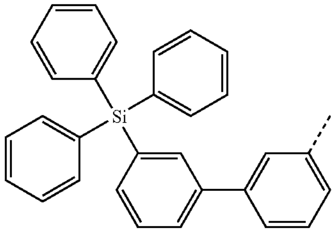 | R5 |
-continued
| Structure | |
|---|---|
| 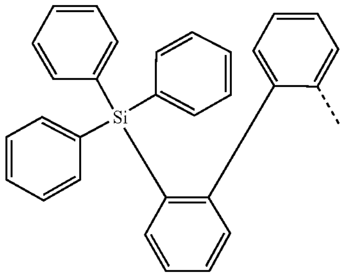 | R6 |
| 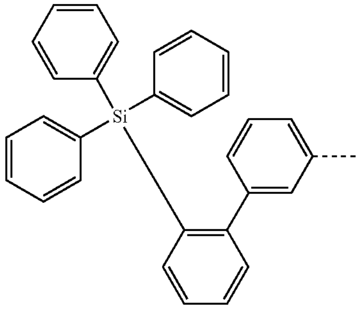 | R7 |
| 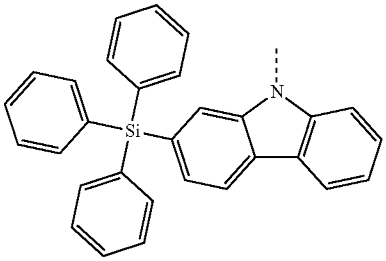 | R8 |
| 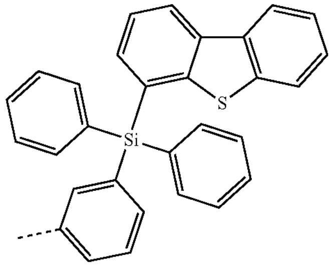 | R9 |
| 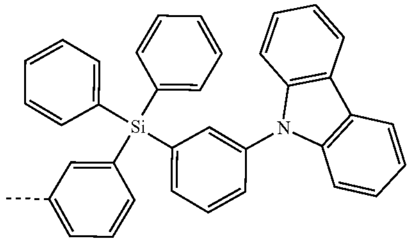 | R10 |

-continued
| Structure |
|---|
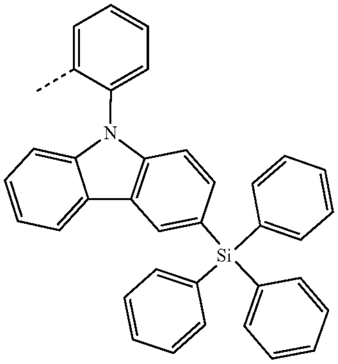
R11
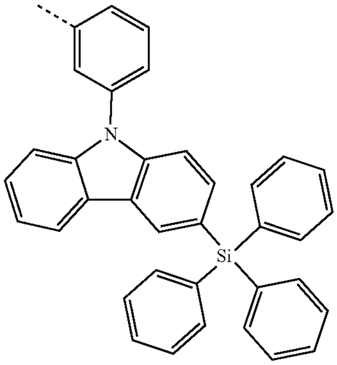
R12
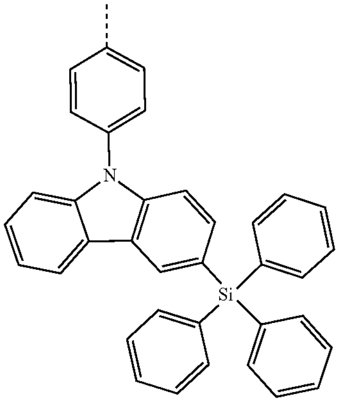
R13
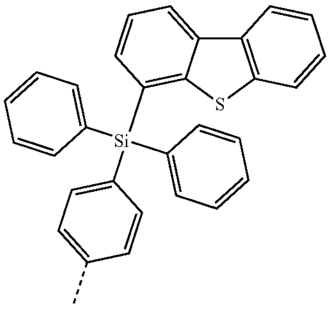
R14
-continued
| Structure |
|---|
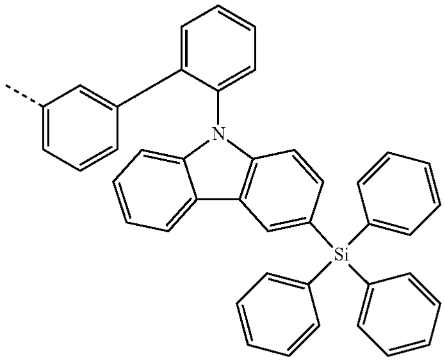
R15
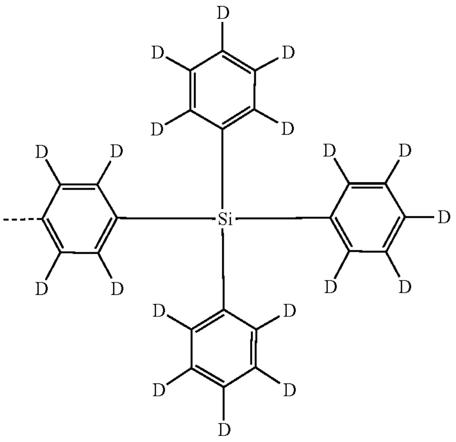
R16
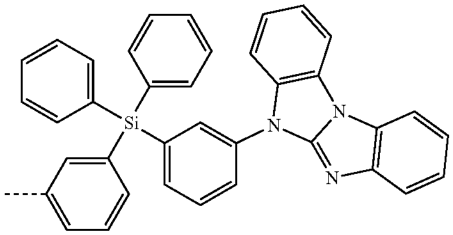
R17
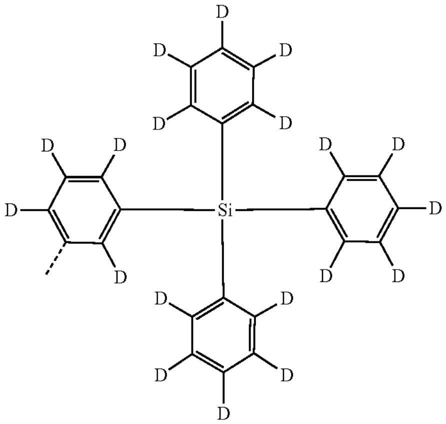
R18

-continued
| Structure |
|---|
| 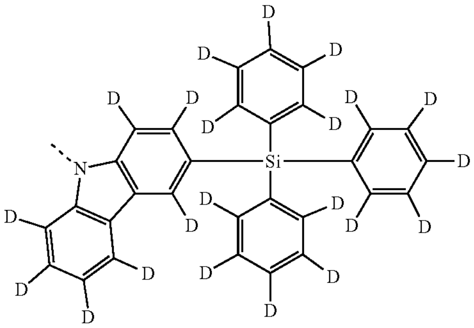 R19 |
| 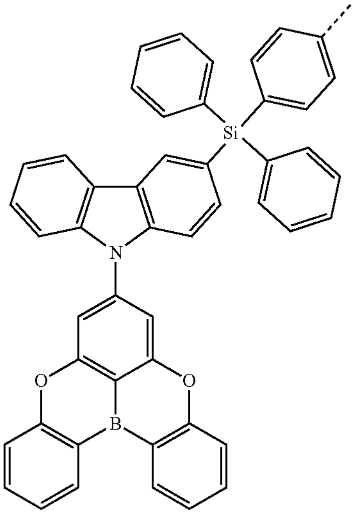 R20 |
| 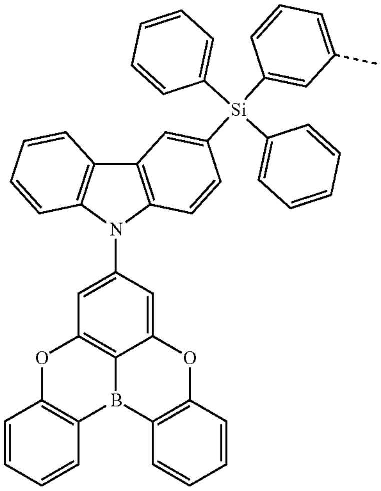 R21 |
-continued
| Structure |
|---|
| 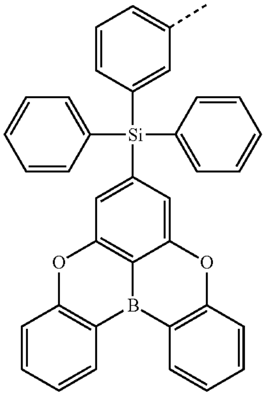 R22 |
| 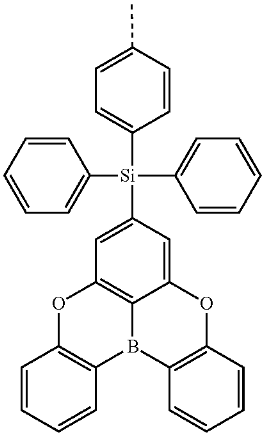 R23 |
| 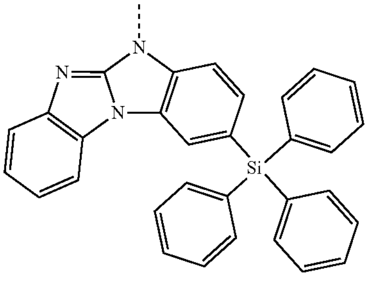 R24 |
| 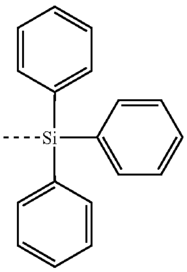 R25 |

-continued
| Structure | |
|---|---|
| 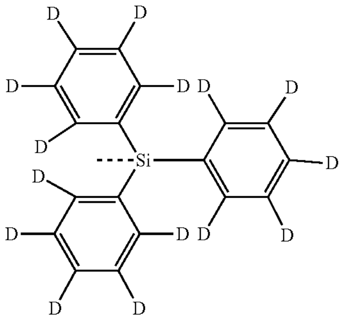 | R26 |
| 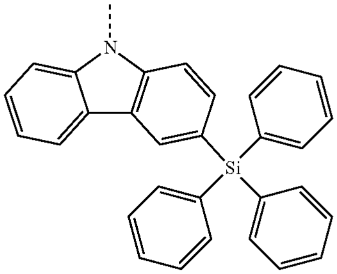 | R27 |
| 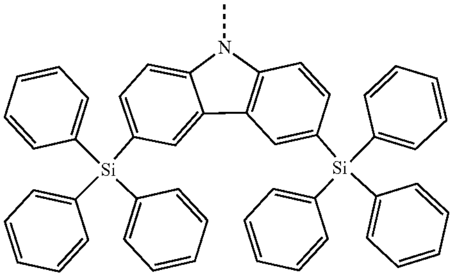 | R28 |
| 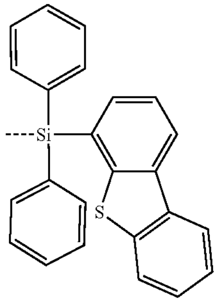 | R29 |
| 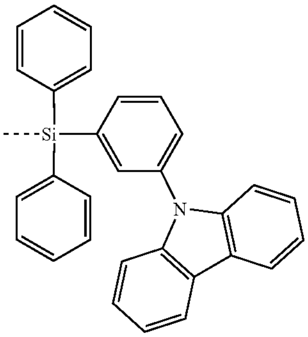 | R30 |
-continued
| Structure | |
|---|---|
| 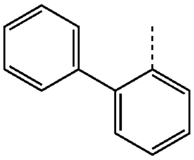 | R31 |
| 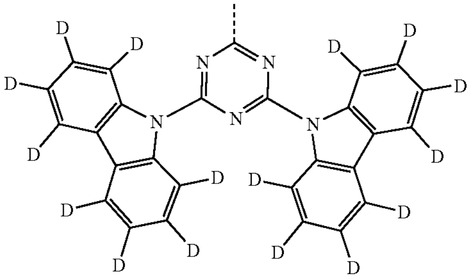 | R32 |
| 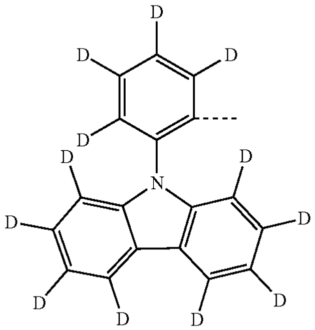 | R33 |
| 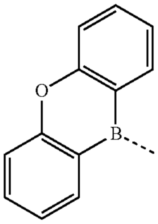 | R34 |
| 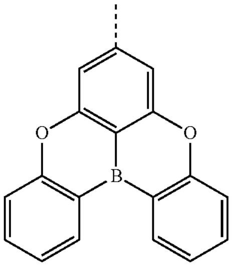 | R35 |
| 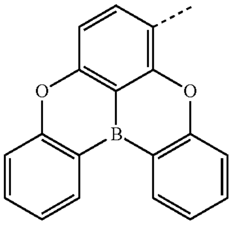 | R36 |

-continued
| Structure |  |
|---|---|
| 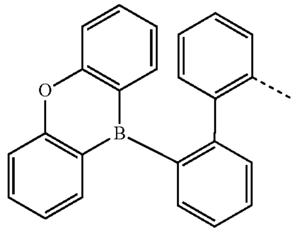 | R37 |
| 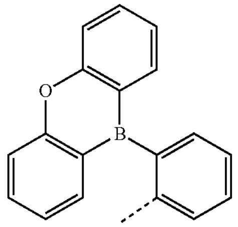 | R38 |
| 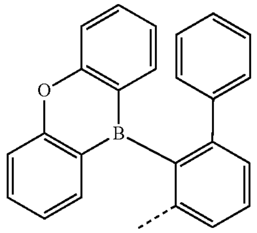 | R39 |
| 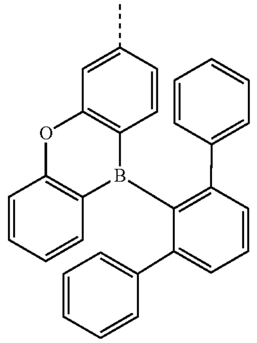 | R40 |
| 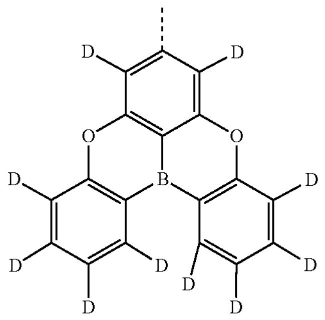 | R41 |
-continued
| Structure |  |
|---|---|
| 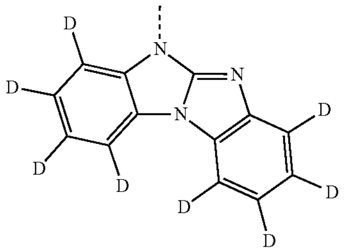 | R42 |
| 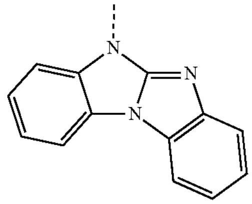 | R43 |
| 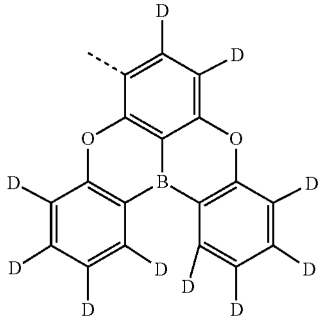 | R44 |
| 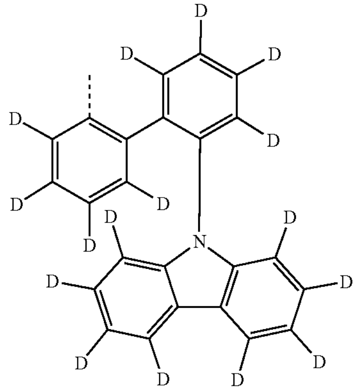 | R45 |
| 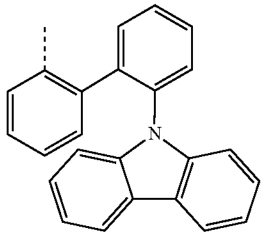 | R46 |

-continued
| Structure |
|---|
| 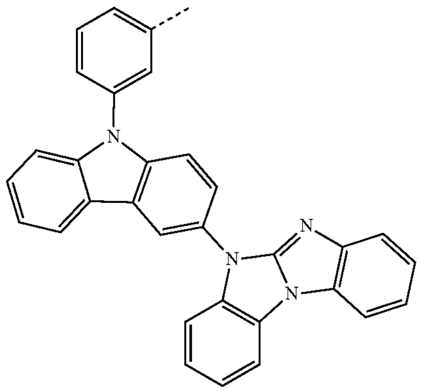 R47 |
| 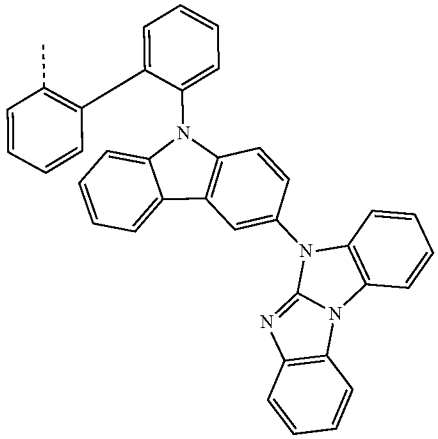 R48 |
| 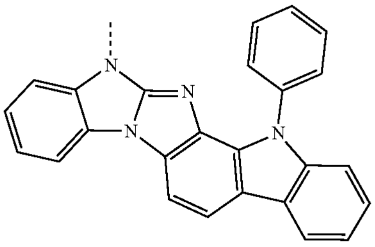 R49 |
| 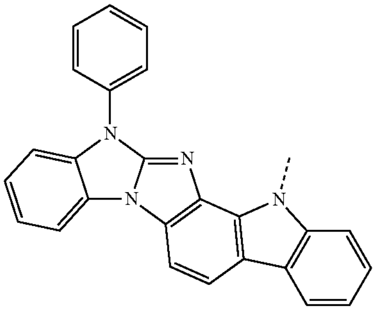 R50 |
-continued
| Structure |
|---|
| 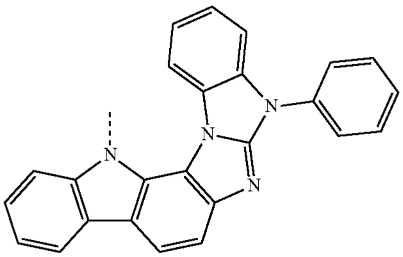 R51 |
| 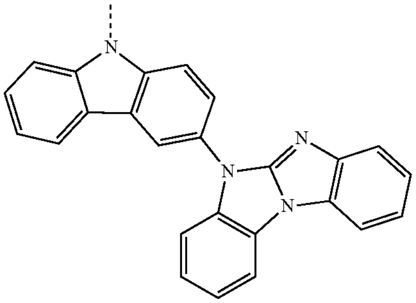 R52 |
| 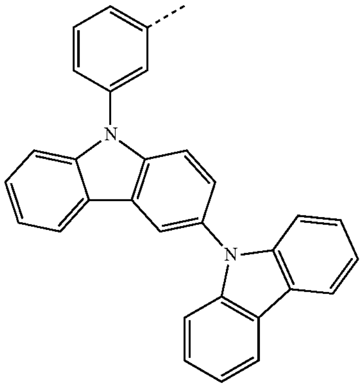 R53 |
| 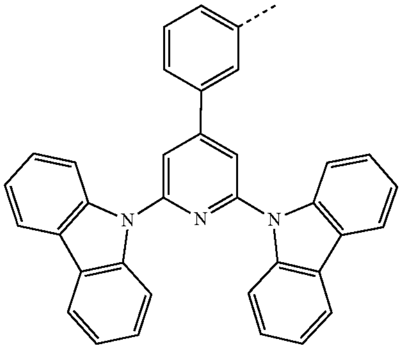 R54 |

-continued
| Structure | |
|---|---|
| 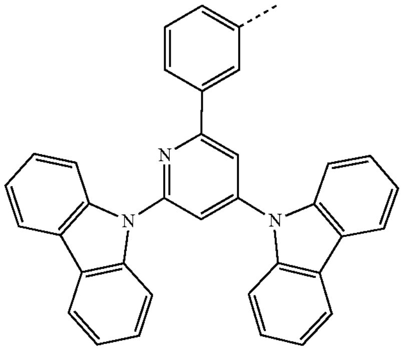 | R55 |
| 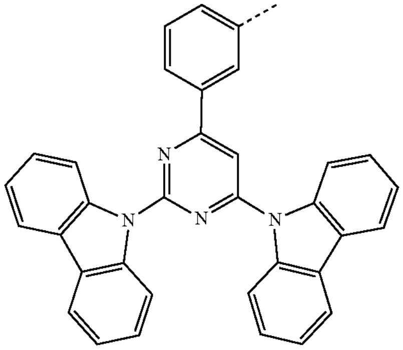 | R56 |
| 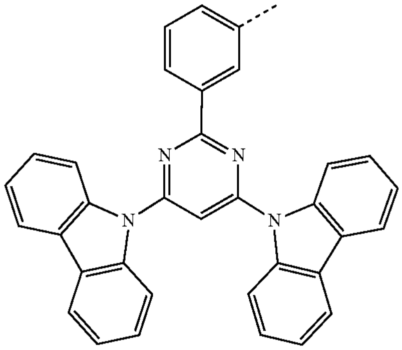 | R57 |
| 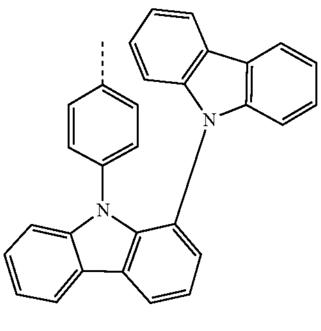 | R58 |
-continued
| Structure | |
|---|---|
| 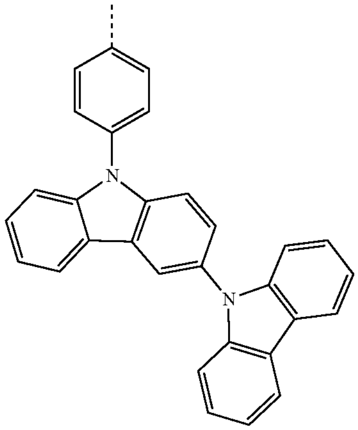 | R59 |
| 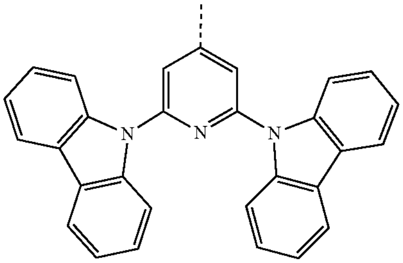 | R60 |
| 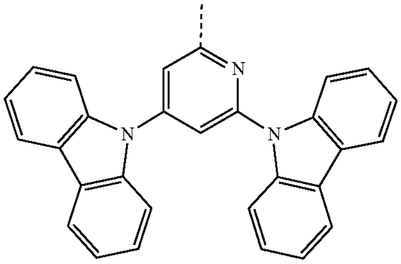 | R61 |
| 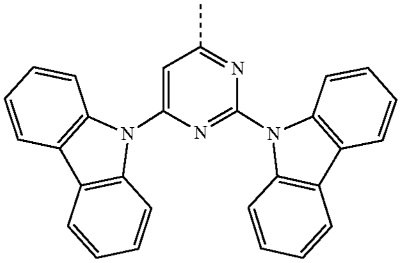 | R62 |
| 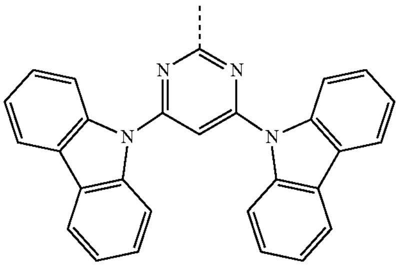 | R63 |

-continued
| Structure | |
|---|---|
| 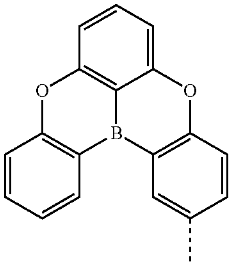 | R64 |
| 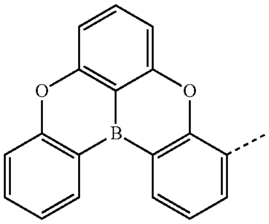 | R65 |
| 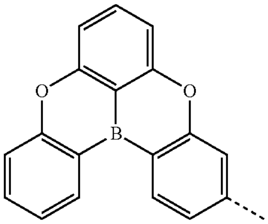 | R66 |
| 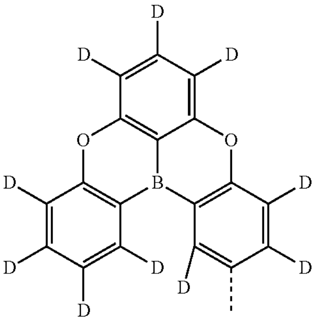 | R67 |
| 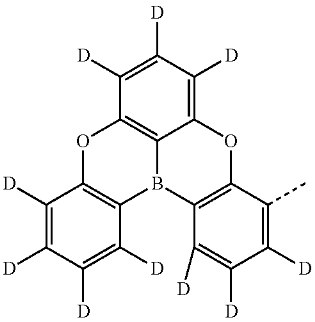 | R68 |
-continued
| Structure | |
|---|---|
| 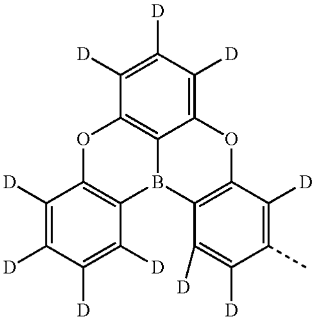 | R69 |
| 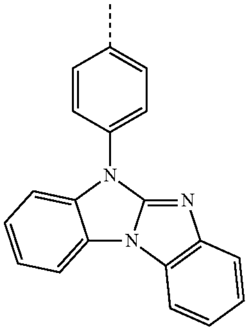 | R70 |
| 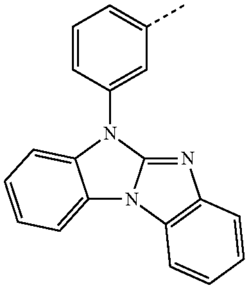 | R71 |
| 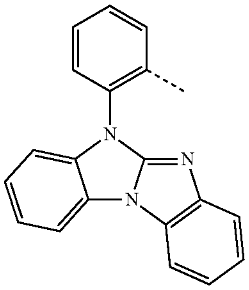 | R72 |
| 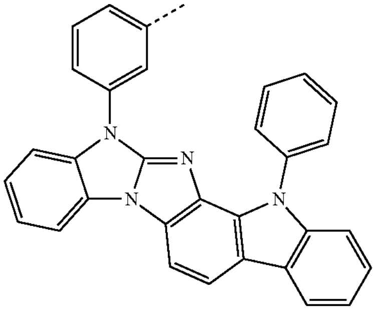 | R73 |

-continued
Structure
R74
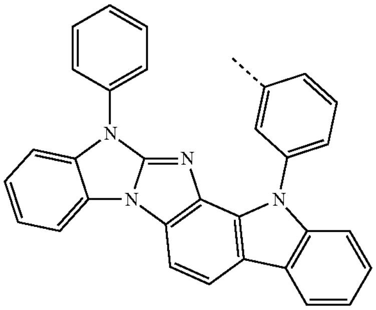
R75
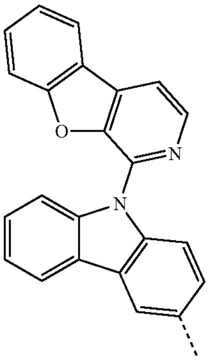
R76
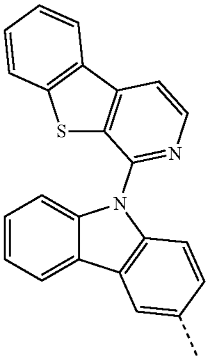
R77
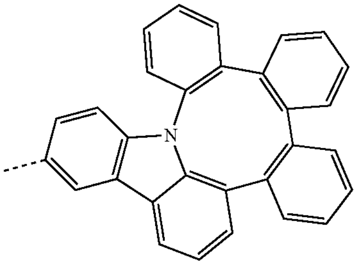
-continued
Structure
R78
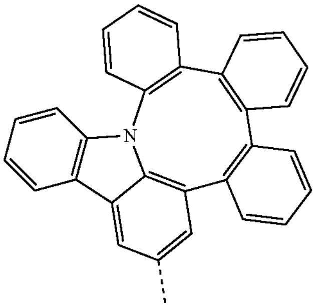
R79
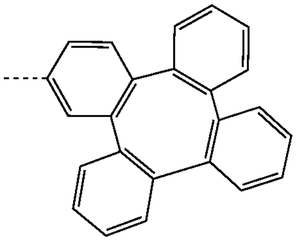
R80
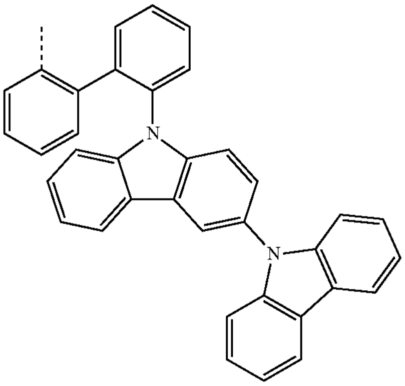
R81
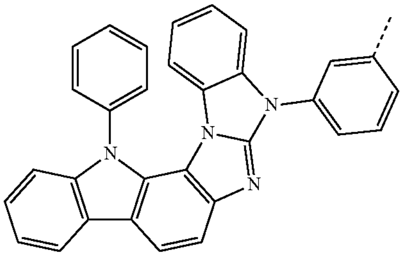
R82
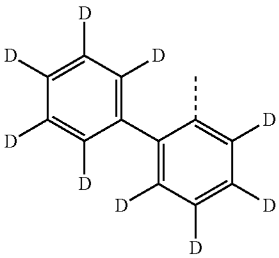

-continued
| Structure | |
|---|---|
| 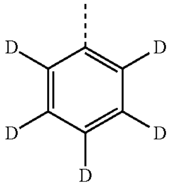 | R83 |
| 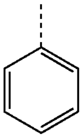 | R84 |
| 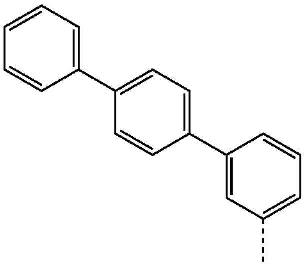 | R85 |
| 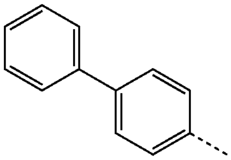 | R86 |
| 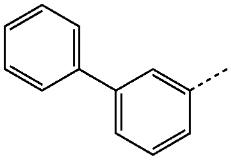 | R87 |
| 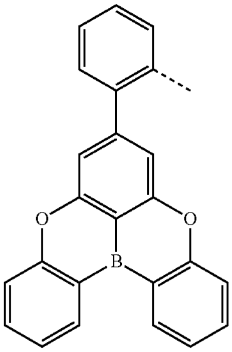 | R88 |
-continued
| Structure | |
|---|---|
| 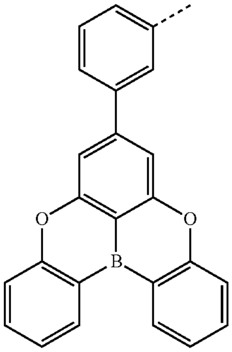 | R89 |
| 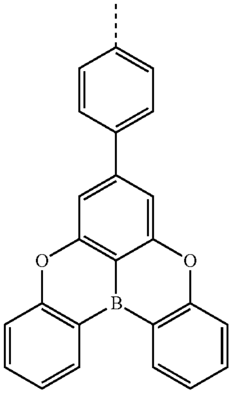 | R90 |
| 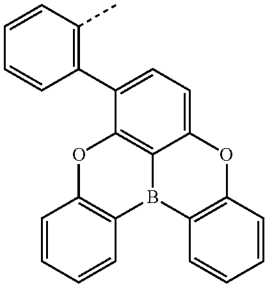 | R91 |
| 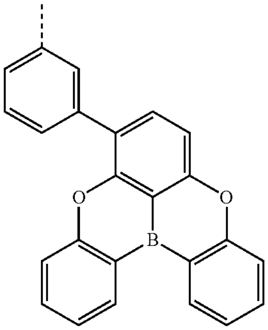 | R92 |

-continued
| Structure | |
|---|---|
| 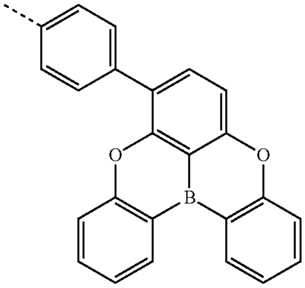 | R93 |
| 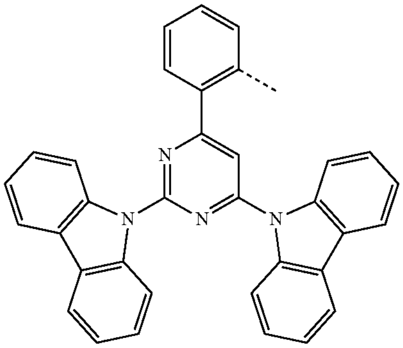 | R94 |
| 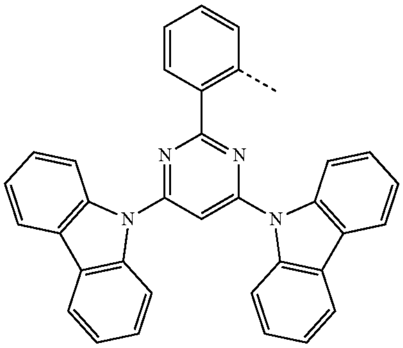 | R95 |
| 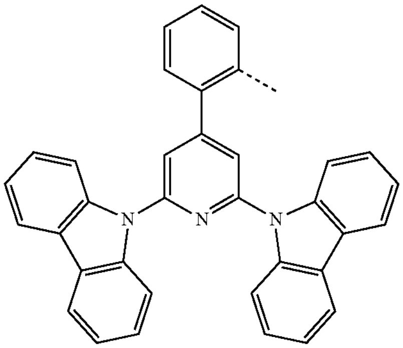 | R96 |
| 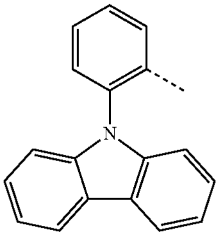 | R97 |
-continued
| Structure | |
|---|---|
| 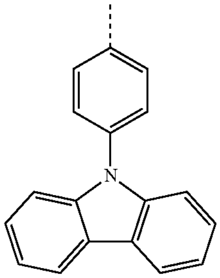 | R98 |
| 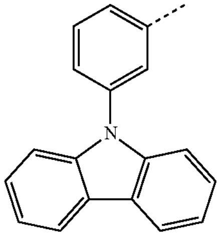 | R99 |
| 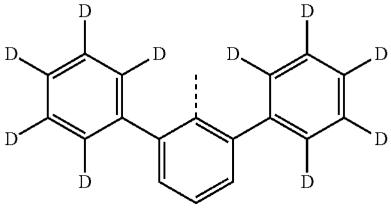 | R100 |
| 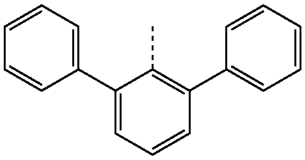 | R101 |
| 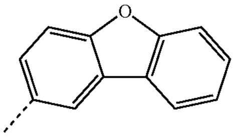 | R102 |
| 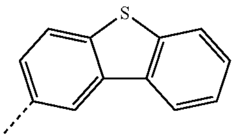 | R103 |
| 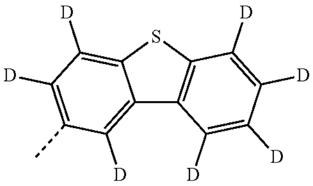 | R104 |
| 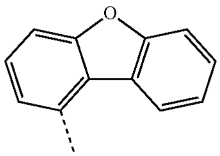 | R105 |

-continued
| Structure | |
|---|---|
| 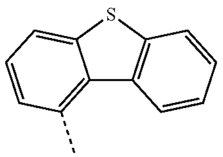 | R106 |
| 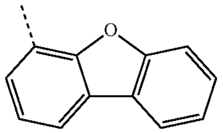 | R107 |
| 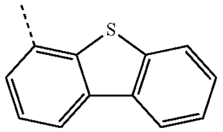 | R108 |
| 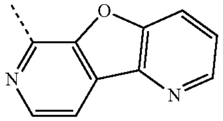 | R109 |
| 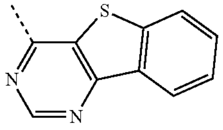 | R110 |
| 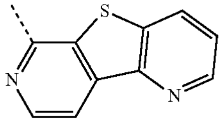 | R111 |
| 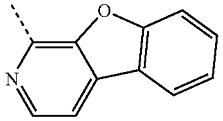 | R112 |
| 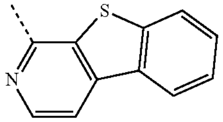 | R113 |
| 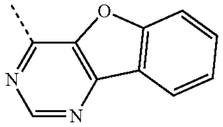 | R114 |
| 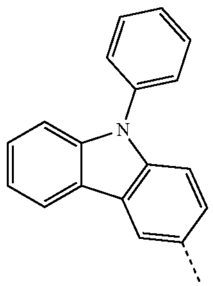 | R115 |
-continued
| Structure | |
|---|---|
| 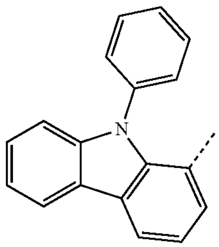 | R116 |
| 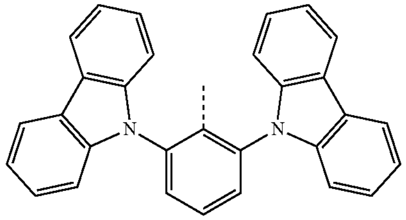 | R117 |
| 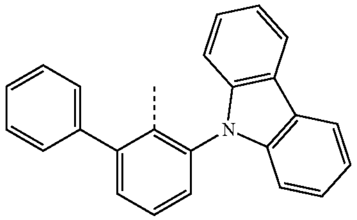 | R118 |
| 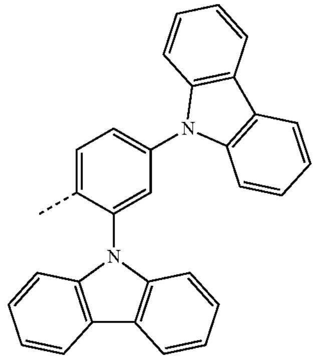 | R119 |
| 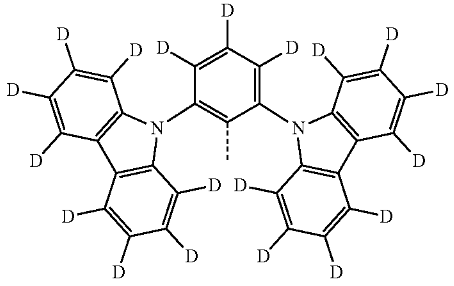 | R120 |

-continued
| Structure | |
|---|---|
| 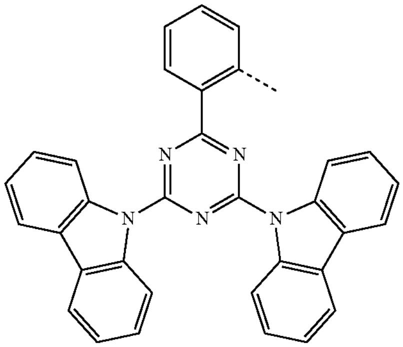 | R121 |
| 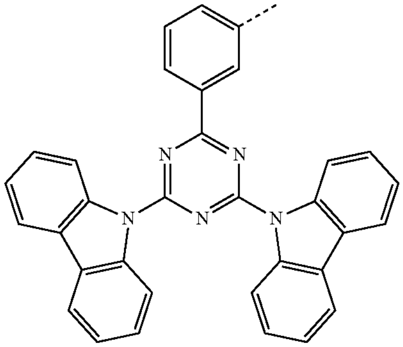 | R122 |
| 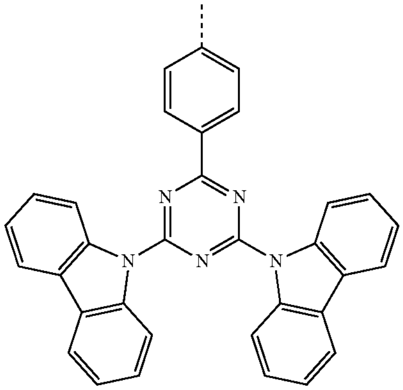 | R123 |
| 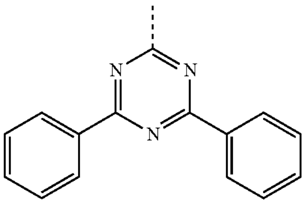 | R124 |
| 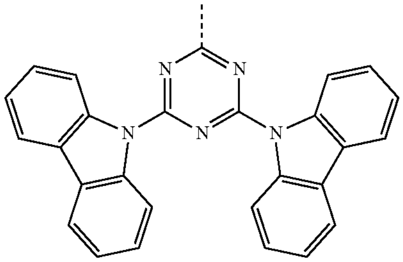 | R125 |
-continued
| Structure | |
|---|---|
| 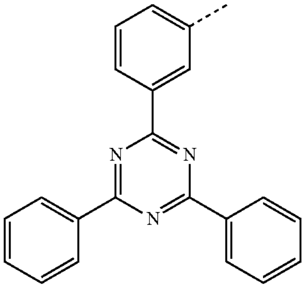 | R126 |
| 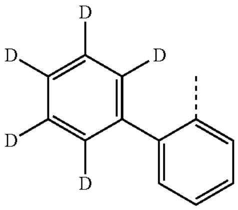 | R127 |
| 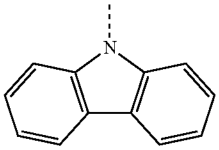 | R128 |
| 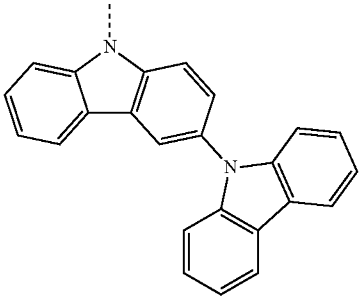 | R129 |
| 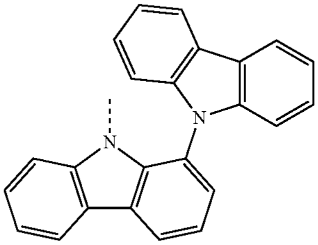 | R130 |
| 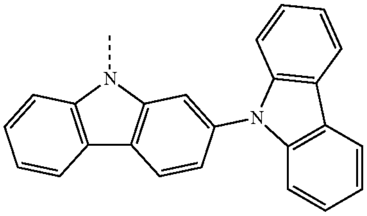 | R131 |

-continued
| Structure | |
|---|---|
| 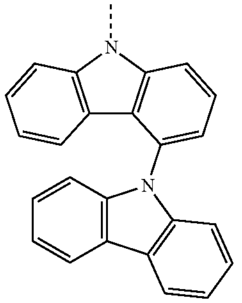 | R132 |
| 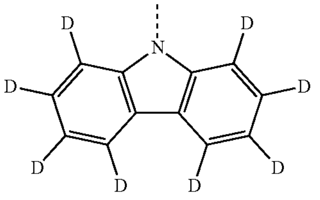 | R133 |
| 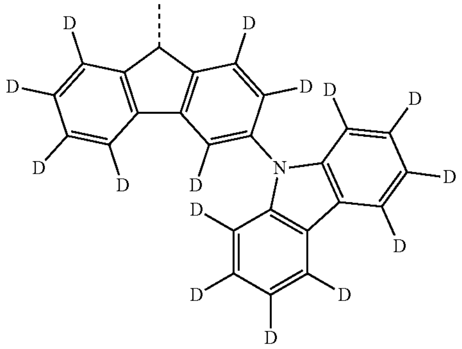 [SMILES: [2H]c1c([2H])c([2H])c2c(c1[2H])-c1c([2H])c(-n3c4c([2H])c([2H])c([2H])c([2H])c4c4c([2H])c([2H])c([2H])c([2H])c43)c([2H])c([2H])c1[C@H]2C] | R134 |
| 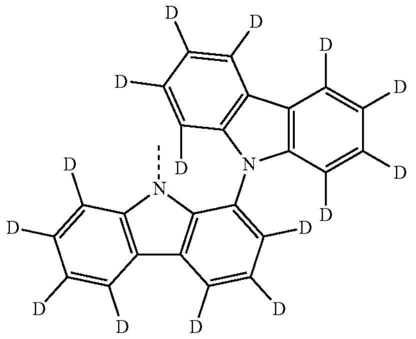 | R135 |
| 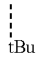 | R136 |
| 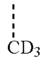 | R137 |
|  | R138 |
| 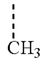 | R139 |
-continued
| Structure | |
|---|---|
|  | R140 |
| 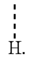 | R141 |
10. The compound of claim 1, wherein the compound is selected from the group consisting of:
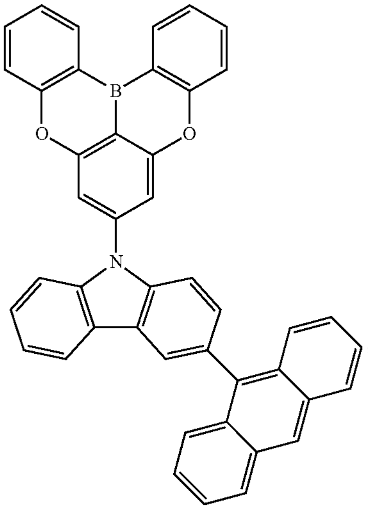
,
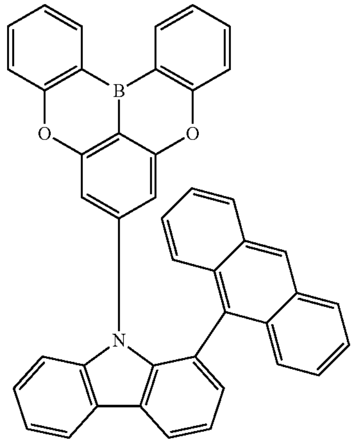
,
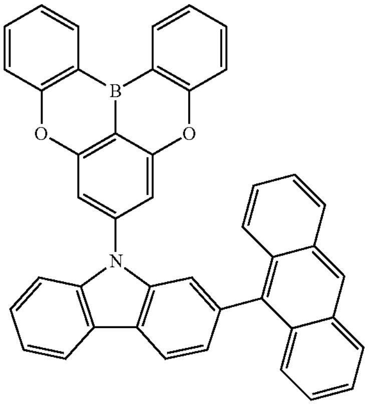
, -continued
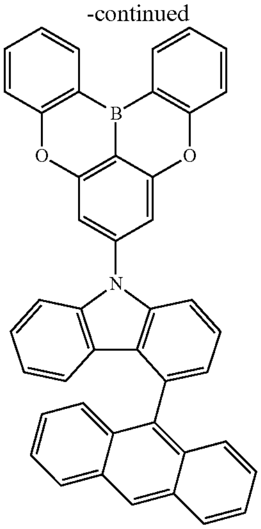
,
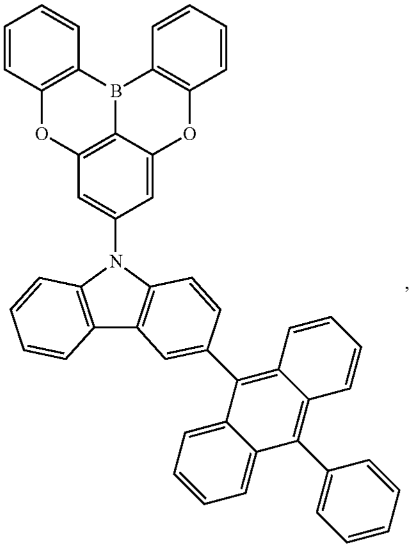
,
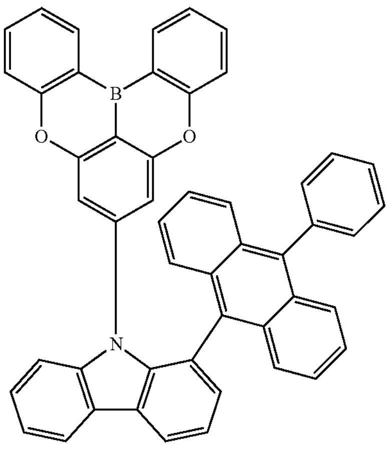
,
-continued
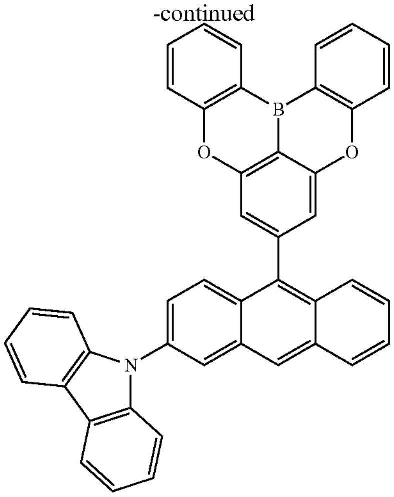
,
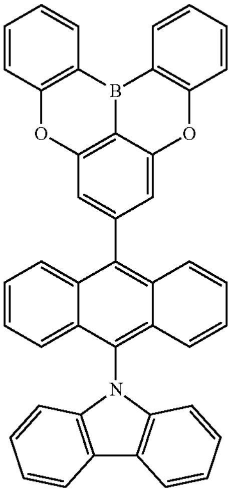
,
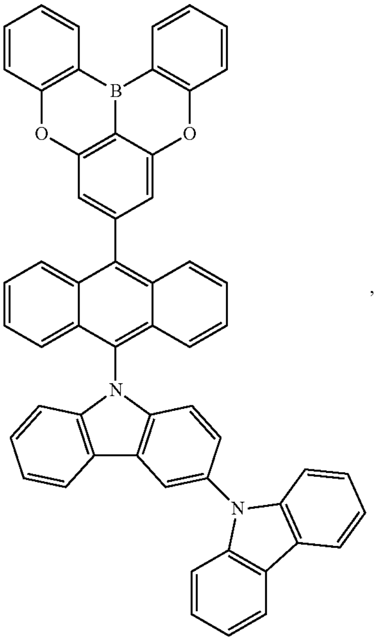
, -continued
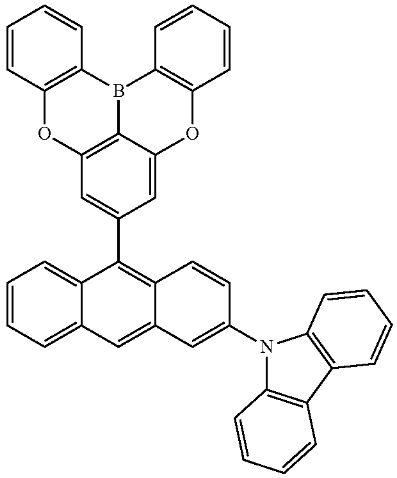
,
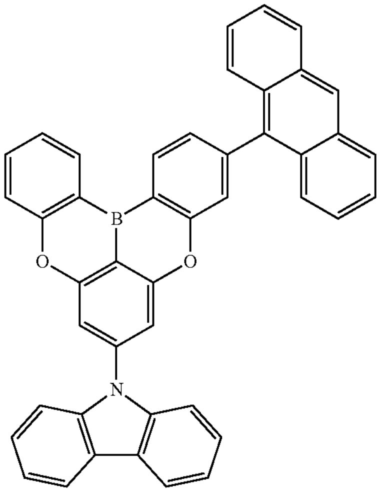
,
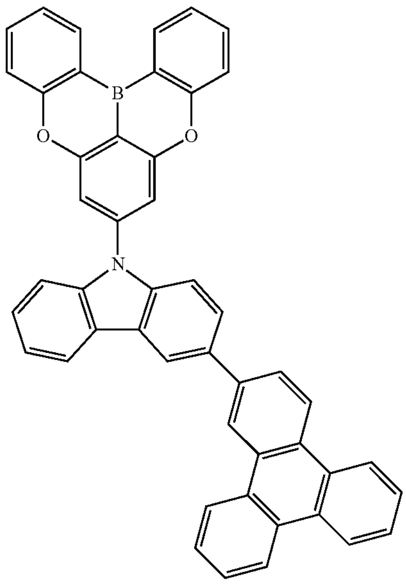
,
-continued
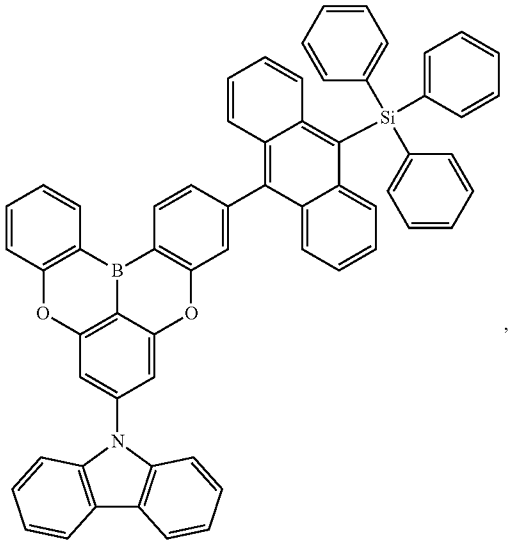
,
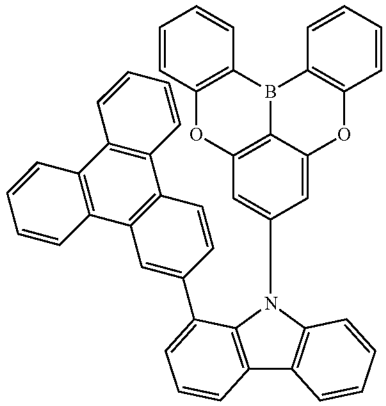
,
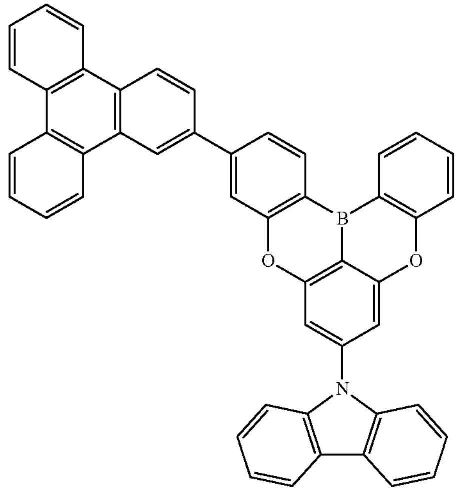
, -continued
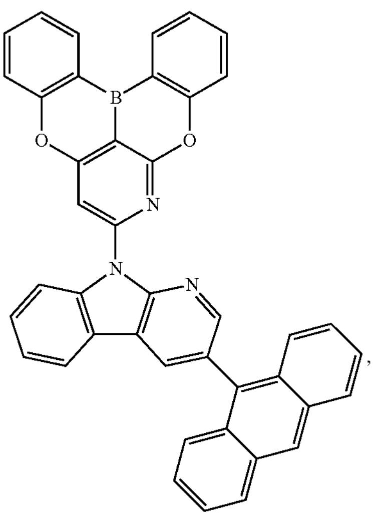
,
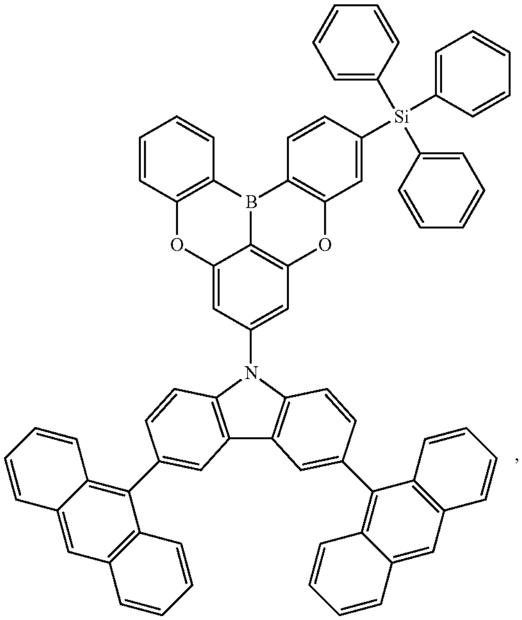
,
-continued
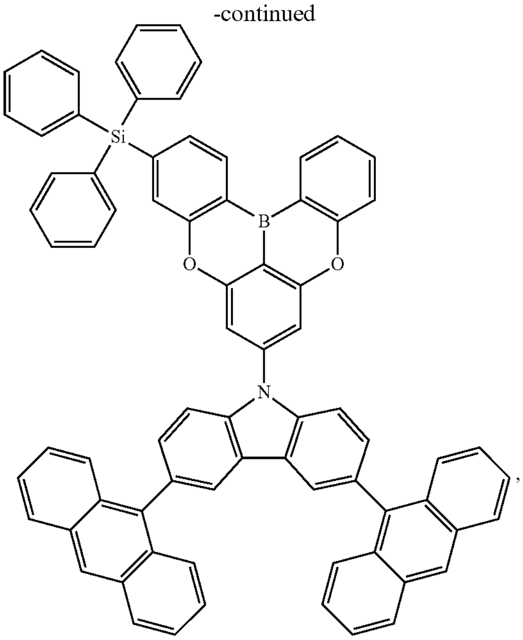
,
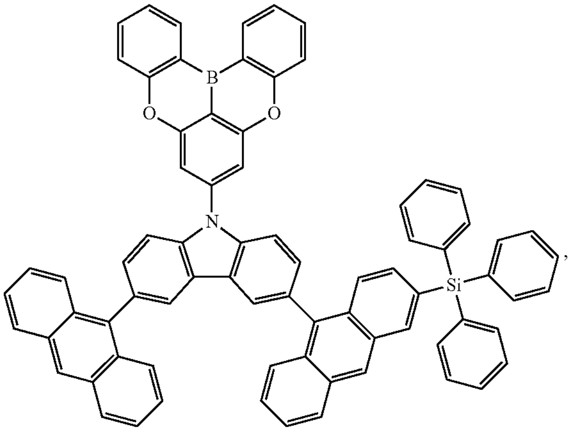
,
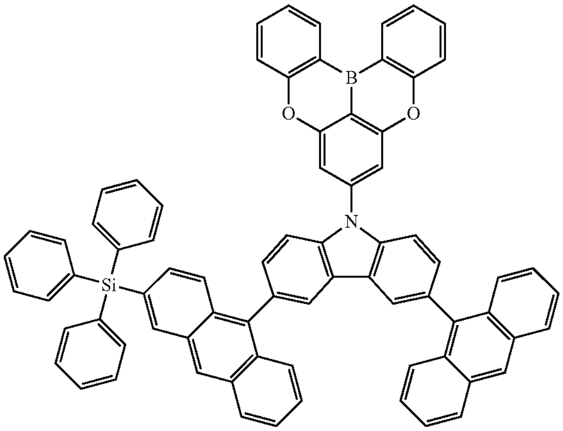
, -continued
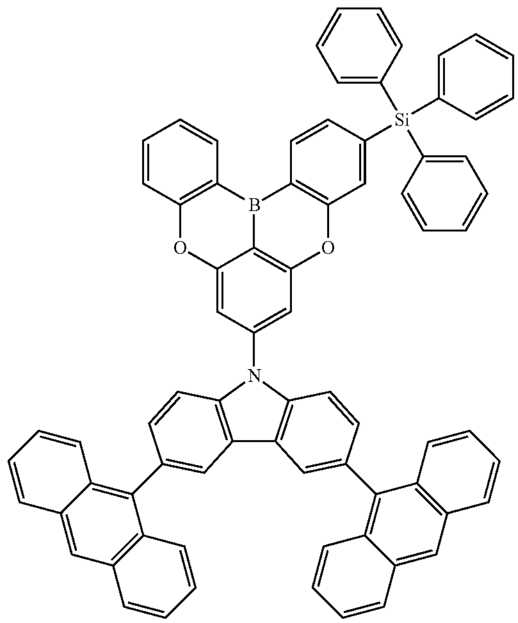
,
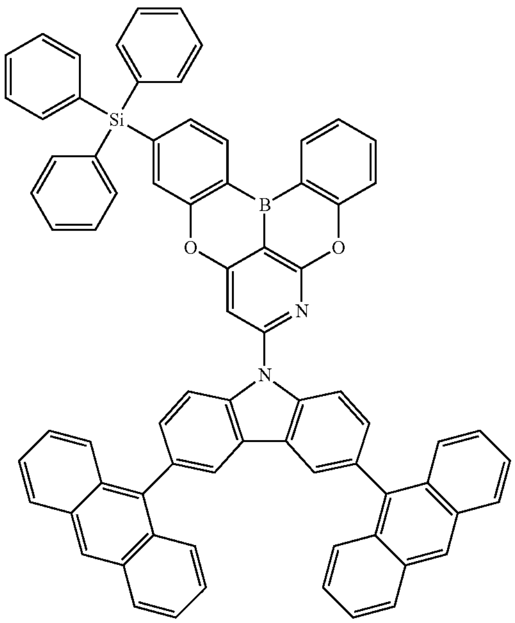
,
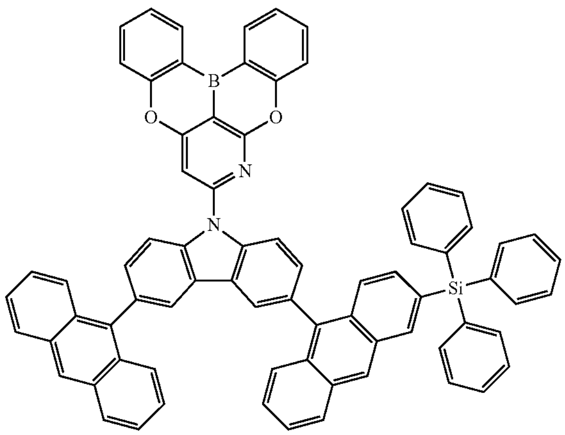
,
-continued
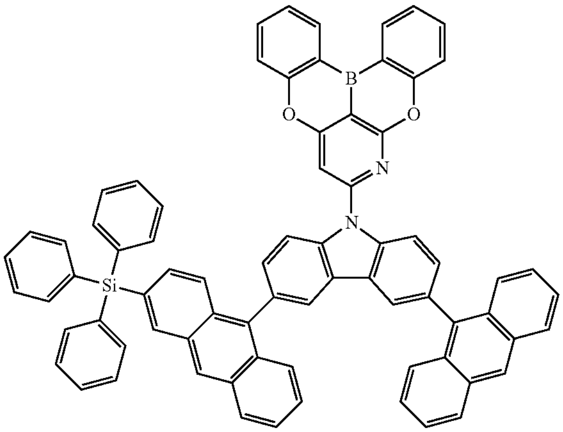
,
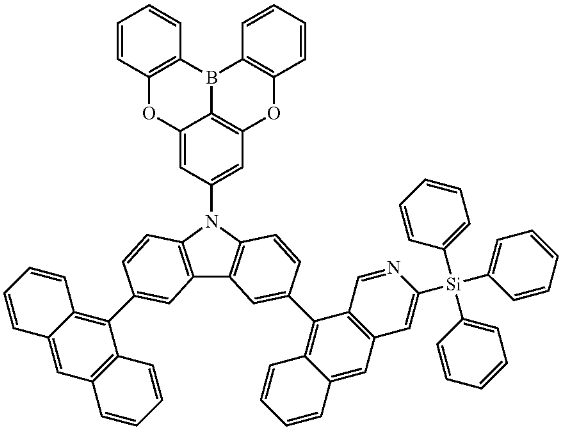
,
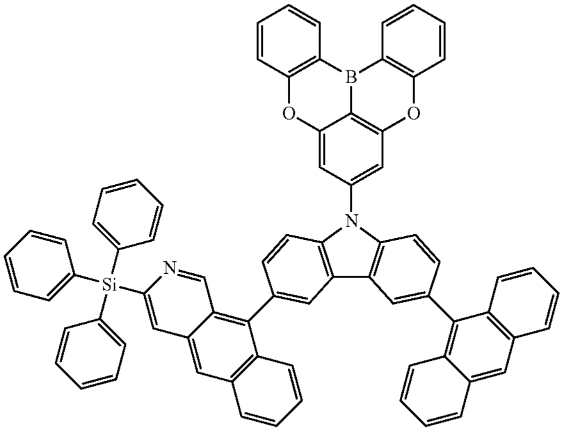
,
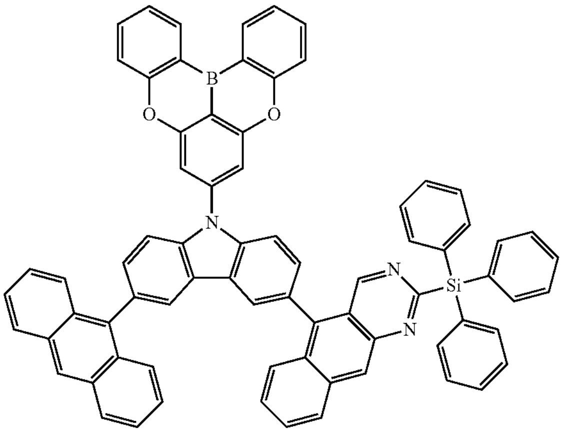
, -continued
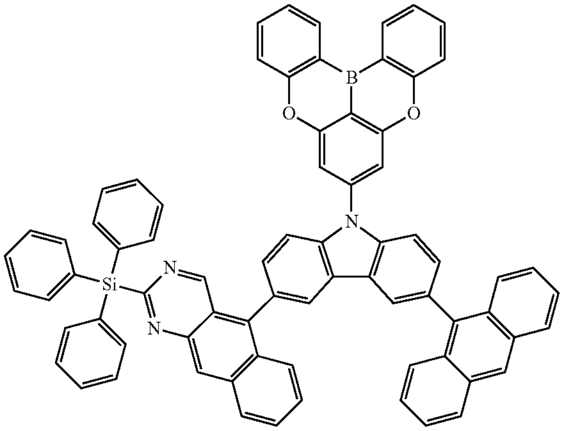
,
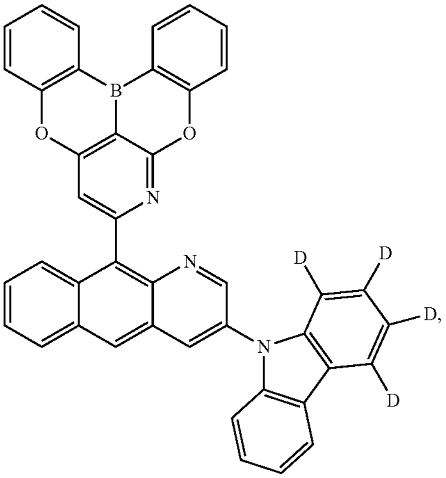
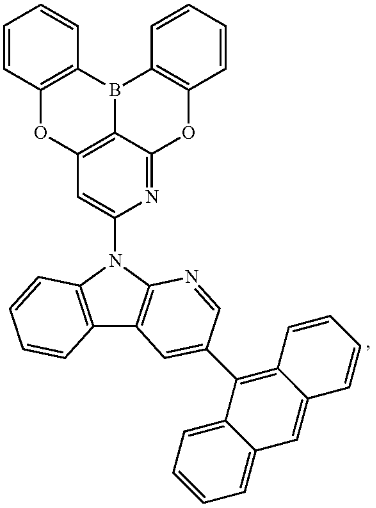
-continued
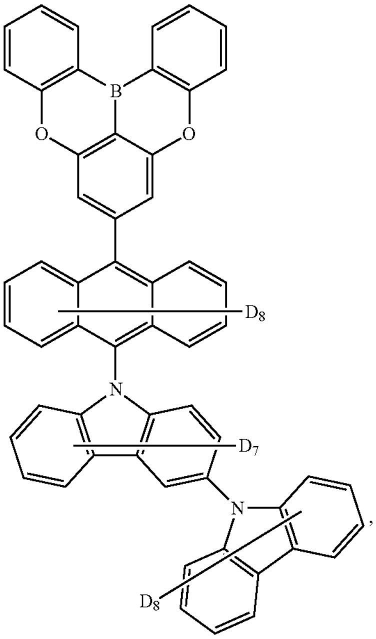
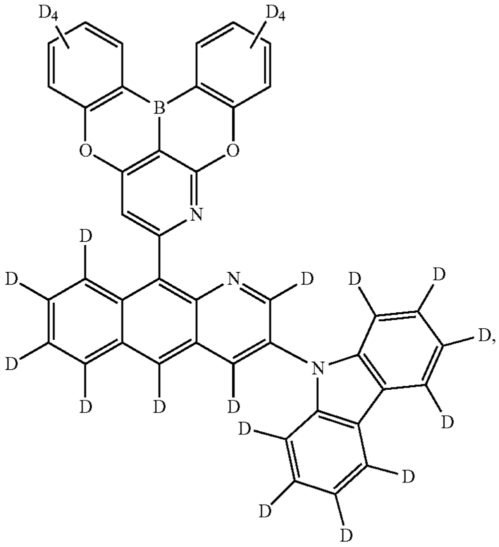
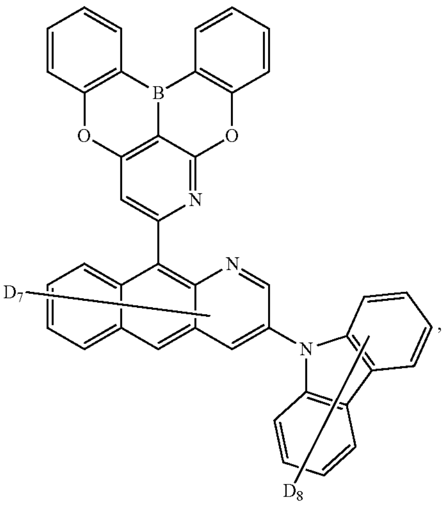

-continued
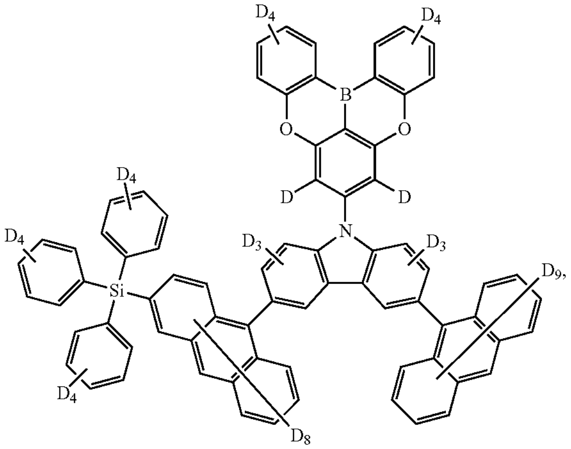
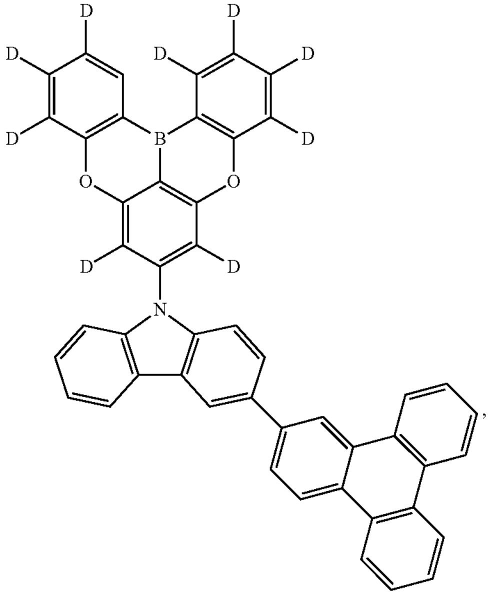
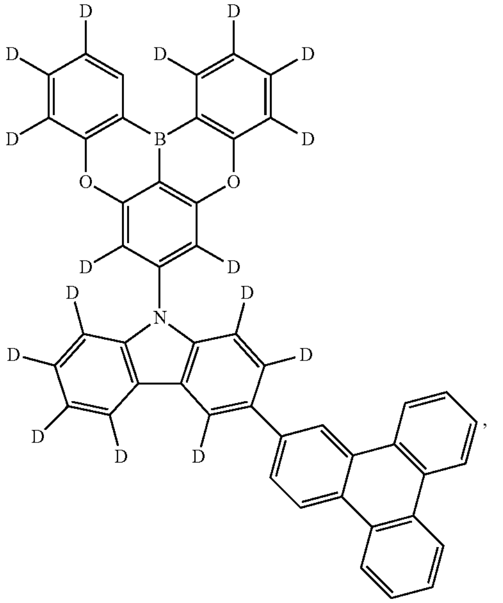
-continued
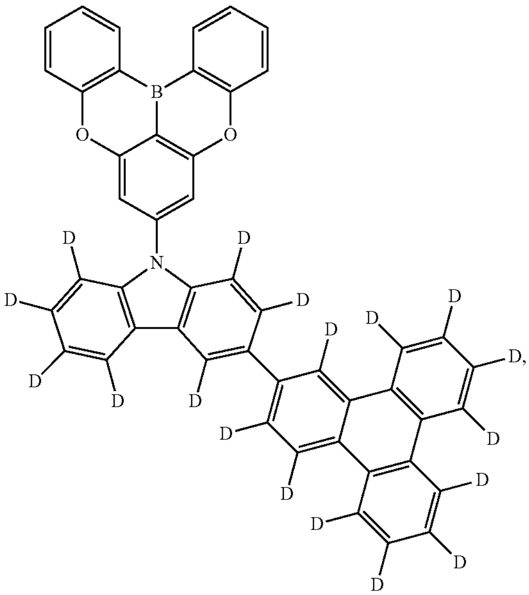
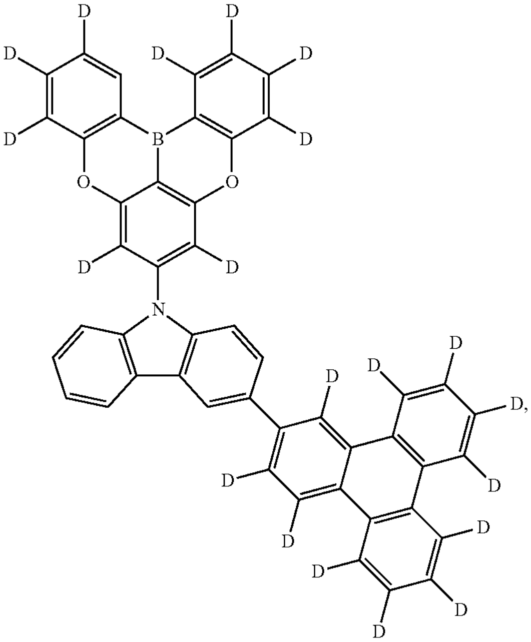

-continued
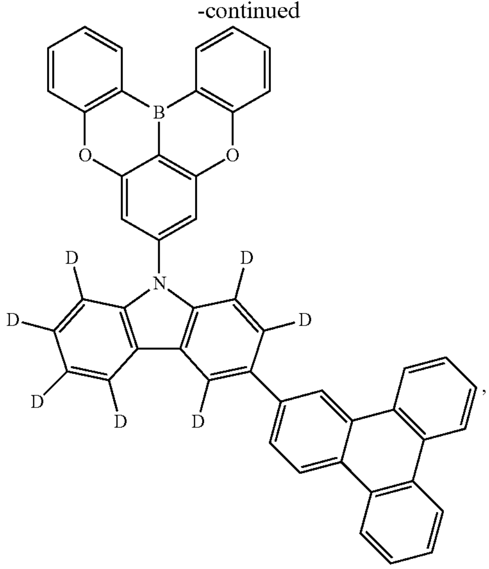
,
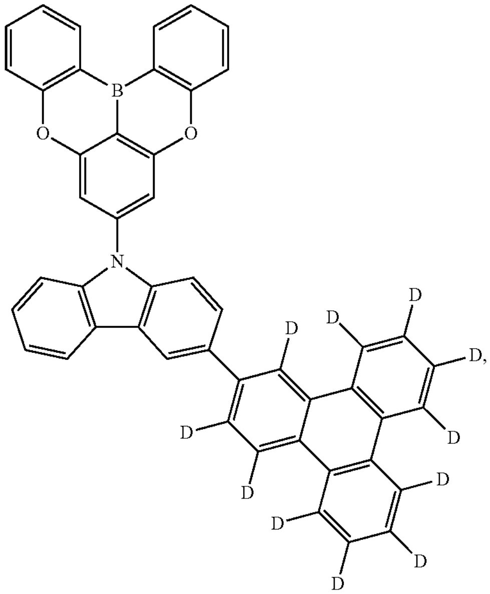
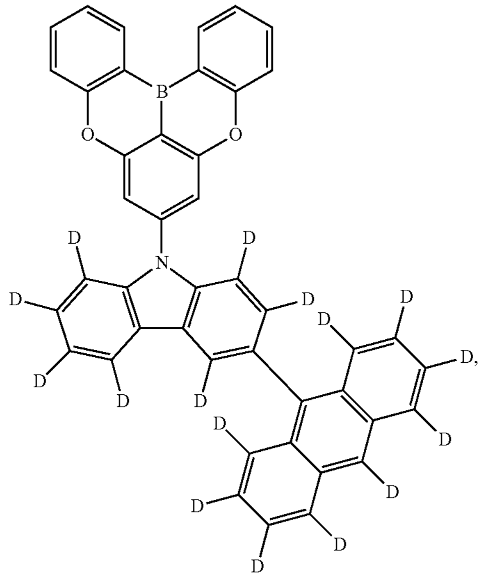
-continued
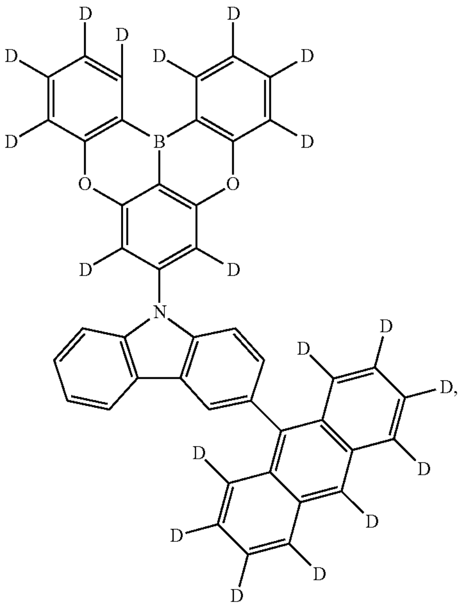
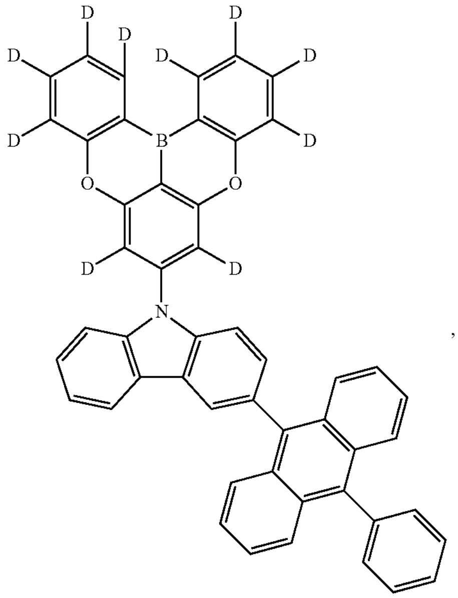
, -continued

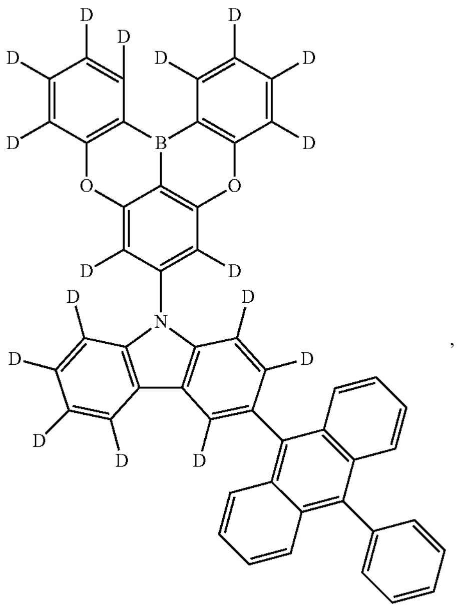

,

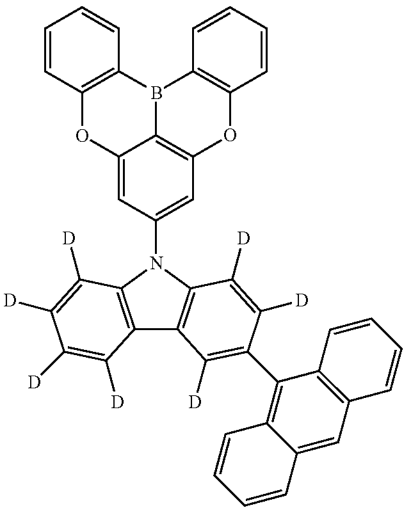

, and

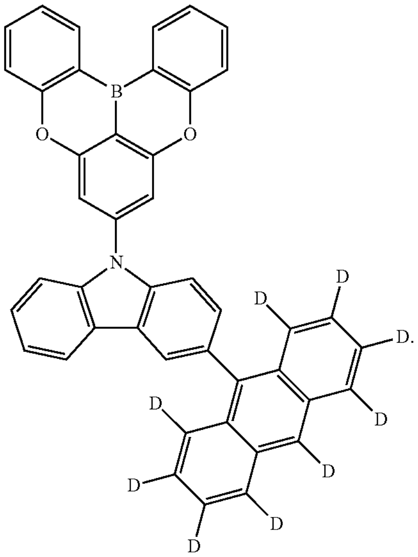

.

11. An organic light emitting device (OLED) comprising:

an anode;

a cathode; and an organic layer disposed between the anode and the cathode, wherein the organic layer comprises a compound comprising at least one $W^1$, one $W^2$, and one $W^3$;

wherein $W^1$ is a structure of Formula I:

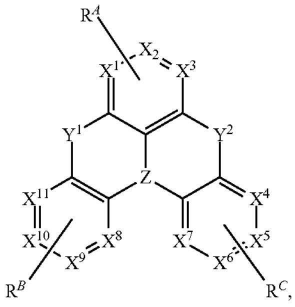

, wherein $X^1$-$X^{11}$ are each independently C or N;

wherein $Y^1$ and $Y^2$ are each independently selected from the group consisting of BR, BRR', NR, PR, P(O)R, O, S, Se, C═O, C═S, C═Se, C═NR, C═CRR', S═O, $SO_2$, CR, CRR', SiRR', and GeRR';

wherein Z is selected from the group consisting of B, Al, Ga, PO, and N;

wherein $W^2$ is a structure of Formula II:

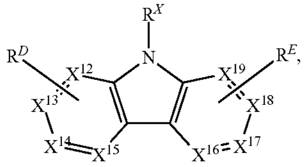

, wherein $X^{12}$-$X^{19}$ are each independently C or N;

wherein $W^3$ is a structure of Formula III or Formula IV:

Formula III

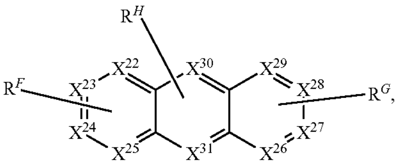

, wherein $X^{22}$-$X^{31}$ are each independently C or N;

Formula IV

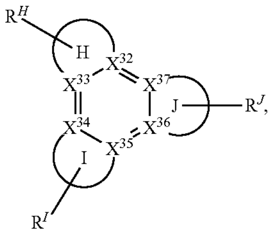

, wherein $X^{32}$-$X^{37}$ are each independently C or N;

wherein $R^A$, $R^B$, $R^C$, $R^D$, $R^E$, $R^F$, $R^G$, $R^H$, $R^I$, $R^J$, and $R^K$ each independently represent mono to the maximum amount of substitution, or no substitution;

wherein each R, R', $R^A$, $R^B$, $R^C$, $R^D$, $R^E$, $R^F$, $R^G$, $R^H$, $R^I$, $R^J$, $R^K$, and $R^X$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein moieties I, J and K are each independently a monocyclic or fused polycyclic ring system comprised of one or more 5-membered or 6-membered carbocyclic or heterocyclic rings;

wherein any two substituents may be joined or fused to form a ring; and wherein in at least one $W^2$, no two or more $R^D$ or no two or more $R^E$ substituents are joined to form a ring;

wherein at least one $W^2$ does not have R joined to $R^D$ or $R^E$ to form a ring; and with the proviso that that the compound does not comprise one of the following structures:

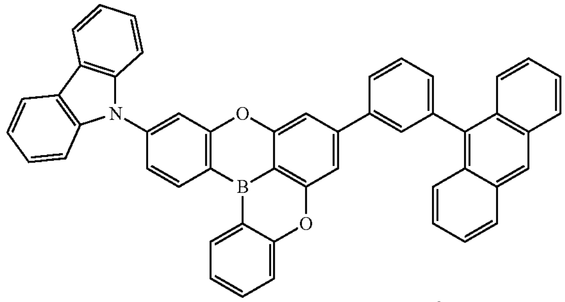

,

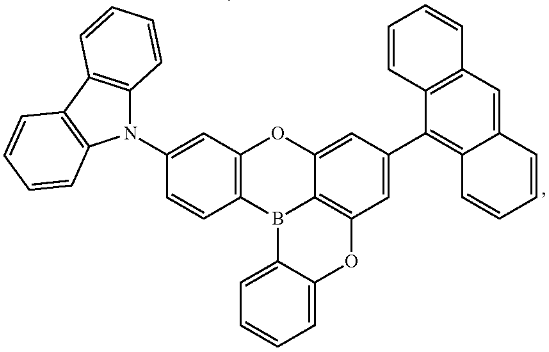

,

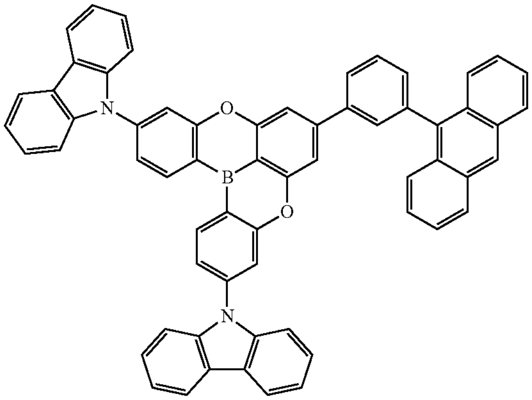

, or

-continued

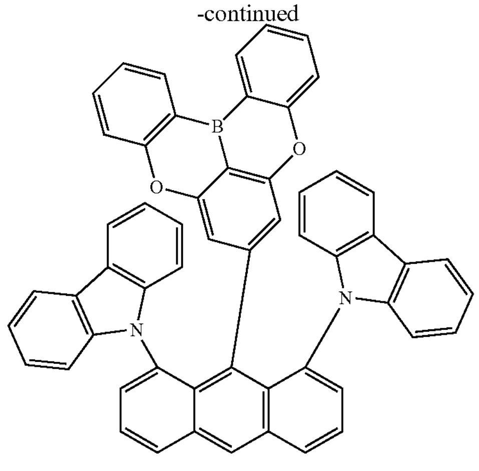

.

12. A consumer product comprising an organic light-emitting device (OLED) according to claim 11.

13. The OLED of claim 11, wherein the organic layer is an emissive layer and the compound is an emissive dopant or a non-emissive dopant; and/or wherein the organic layer is selected from the group consisting of HIL, HTL, EBL, EML, HBL, ETL, and EIL.

14. The OLED of claim 11, wherein the compound is a host, and the organic layer is an emissive layer that comprises a phosphorescent material.

15. The OLED of claim 11, wherein the compound is an acceptor, and the OLED further comprises a sensitizer selected from the group consisting of a delayed fluorescence emitter, a phosphorescent material, and combination thereof.

16. The OLED of claim 11, wherein the compound is a host and the OLED comprises an acceptor that is an emitter and a sensitizer selected from the group consisting of a delayed fluorescence material, a phosphorescent material, and combination thereof; wherein the sensitizer transfers energy to the acceptor.

17. The OLED of claim 11, wherein the compound is a fluorescent emitter, a delayed fluorescence emitter, or a component of an exciplex that is a fluorescent emitter or a delayed fluorescence emitter; and/or wherein the compound has |LUMO energy|<2.8 eV; and/or wherein the compound has an electron reorganization energy that is ≤0.3 eV.

18. The OLED of claim 11, wherein the EML contains an emitter; and/or wherein the EML further contain a first Host; and/or wherein the EML further contains a second Host; and/or wherein the EML further contain a third Host; and/or wherein the emitter is a phosphor, fluorophore, or a TADF.

19. The OLED of claim 11, wherein the compound is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated; and/or wherein the first host is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated; and/or wherein the second host is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated; and/or wherein the third host is at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated.

20. A consumer product comprising an organic light-emitting device (OLED) comprising:

an anode;

a cathode; and an organic layer disposed between the anode and the cathode, wherein the organic layer comprises a compound comprising at least one $W^1$, one $W^2$, and one $W^3$;

wherein $W^1$ is a structure of Formula I:

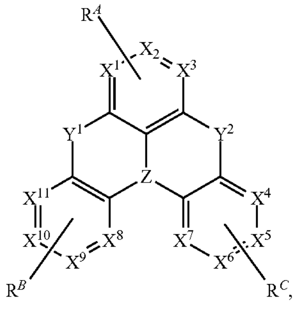

wherein $X^1$-$X^{11}$ are each independently C or N;

wherein $Y^1$ and $Y^2$ are each independently selected from the group consisting of BR, BRR', NR, PR, P(O)R, O, S, Se, C=O, C=S, C=Se, C=NR, C=CRR', S=O, $SO_2$, CR, CRR', SiRR', and GeRR';

wherein Z is selected from the group consisting of B, Al, Ga, PO, and N;

wherein $W^2$ is a structure of Formula II:

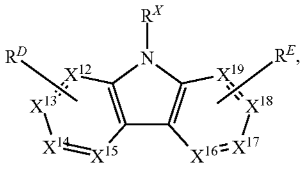

wherein $X^{12}$-$X^{19}$ are each independently C or N;

wherein $W^3$ is a structure of Formula III or Formula IV:

Formula III

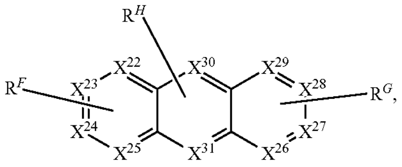

wherein $X^{22}$-$X^{31}$ are each independently C or N;

Formula IV

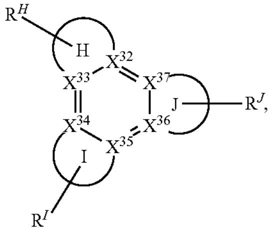

wherein $X^{32}$-$X^{37}$ are each independently C or N;

wherein $R^A$, $R^B$, $R^C$, $R^D$, $R^E$, $R^F$, $R^G$, $R^H$, $R^I$, $R^J$, and $R^K$ each independently represent mono to the maximum amount of substitution, or no substitution;

wherein each R, R', $R^A$, $R^B$, $R^C$, $R^D$, $R^E$, $R^F$, $R^G$, $R^H$, $R^I$, $R^J$, $R^K$, and $R^X$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein moieties I, J and K are each independently a monocyclic or fused polycyclic ring system comprised of one or more 5-membered or 6-membered carbocyclic or heterocyclic rings;

wherein any two substituents may be joined or fused to form a ring; and wherein in at least one $W^2$, no two or more $R^D$ or no two or more $R^E$ substituents are joined to form a ring;

wherein at least one $W^2$ does not have R joined to $R^D$ or $R^E$ to form a ring; and with the proviso that that the compound does not comprise one of the following structures:
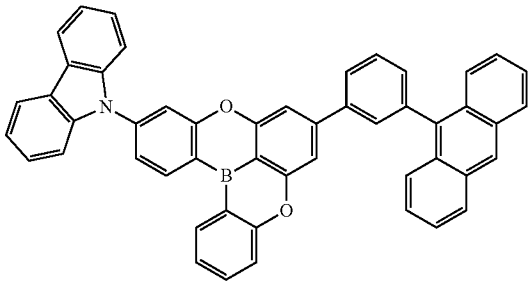
,
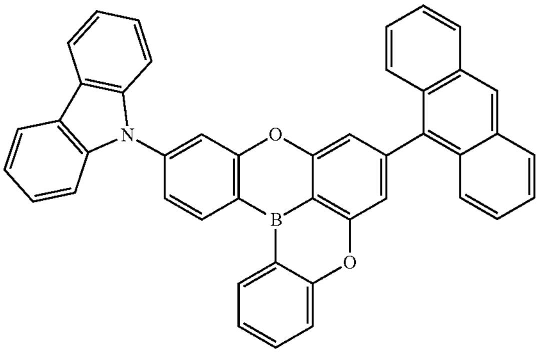
,
-continued
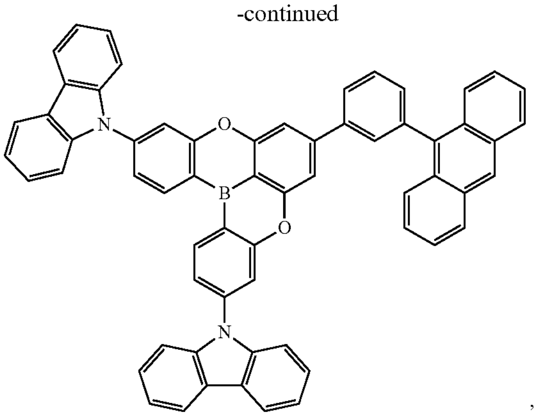
, or
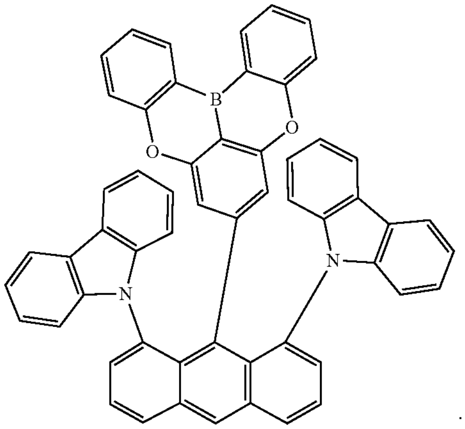
.
* * * * *